US008890126B2

(12) United States Patent
Ryu et al.

(10) Patent No.: US 8,890,126 B2
(45) Date of Patent: Nov. 18, 2014

(54) COMPOUND FOR OPTOELECTRONIC DEVICE, ORGANIC LIGHT EMITTING DIODE INCLUDING THE SAME, AND DISPLAY INCLUDING THE ORGANIC LIGHT EMITTING DIODE

(71) Applicants: Dong-Wan Ryu, Uiwang-si (KR); Sung-Hyun Jung, Uiwang-si (KR); Dal-Ho Huh, Uiwang-si (KR); Kyoung-Mi Lee, Uiwang-si (KR); Nam-Heon Lee, Uiwang-si (KR); Mi-Young Chae, Uiwang-si (KR)

(72) Inventors: Dong-Wan Ryu, Uiwang-si (KR); Sung-Hyun Jung, Uiwang-si (KR); Dal-Ho Huh, Uiwang-si (KR); Kyoung-Mi Lee, Uiwang-si (KR); Nam-Heon Lee, Uiwang-si (KR); Mi-Young Chae, Uiwang-si (KR)

(73) Assignee: Cheil Industries, Inc., Gumi-si, Kyeongsangbuk-do (KR)

( * ) Notice: Subject to any disclaimer, the term of this patent is extended or adjusted under 35 U.S.C. 154(b) by 68 days.

(21) Appl. No.: 13/658,081

(22) Filed: Oct. 23, 2012

(65) Prior Publication Data

US 2013/0105771 A1 May 2, 2013

Related U.S. Application Data

(63) Continuation of application No. PCT/KR2011/003003, filed on Apr. 25, 2011.

(60) Provisional application No. 61/344,433, filed on Jul. 22, 2010.

(30) Foreign Application Priority Data

Apr. 23, 2010 (KR) ........................ 10-2010-0038169

(51) Int. Cl.
*H01L 35/24* (2006.01)

(52) U.S. Cl.
USPC .................................... 257/40; 257/E51.001

(58) Field of Classification Search
USPC ............................................ 257/40, E51.001
See application file for complete search history.

(56) References Cited

U.S. PATENT DOCUMENTS 7,737,627 B2 6/2010 Hwang et al.
7,998,596 B2 8/2011 Yabunouchi et al.

(Continued)

FOREIGN PATENT DOCUMENTS

CN 102224150 A 10/2011
CN 102482215 A 5/2012

(Continued)

OTHER PUBLICATIONS

Baldo, M. A., et al., "Very high-efficiency green organic light-emitting devices based on electrophosphorescence," *Applied Physics Letters*, vol. 75, No. 1, Jul. 5, 1999, pp. 4-6.

(Continued)

*Primary Examiner* — Anthony Ho
(74) *Attorney, Agent, or Firm* — Lee & Morse, P.C.

(57) ABSTRACT

A compound for an optoelectronic device, an organic light emitting diode, and a display device, the compound for an optoelectronic device being represented by the following Chemical Formula 1:

[Chemical Formula 1]

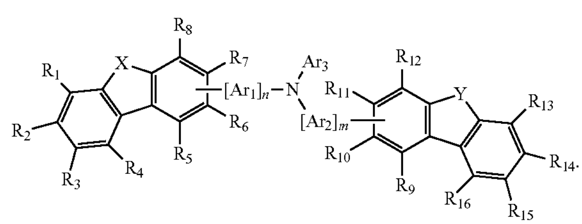

20 Claims, 14 Drawing Sheets

(56) References Cited

U.S. PATENT DOCUMENTS

| | | | |
|---|---|---|---|
| 2007/0278938 | A1 | 12/2007 | Yabunouchi et al. |
| 2008/0124572 | A1 | 5/2008 | Mizuki et al. |
| 2009/0066235 | A1 | 3/2009 | Yabunouchi et al. |
| 2010/0244008 | A1 | 9/2010 | Lee et al. |
| 2011/0127495 | A1 | 6/2011 | Hong et al. |

FOREIGN PATENT DOCUMENTS

| | | | |
|---|---|---|---|
| CN | 102596907 | A | 7/2012 |
| EP | 1 862 524 | A1 | 12/2007 |
| EP | 2 011 790 | A1 | 1/2009 |
| EP | 2 085 382 | A1 | 8/2009 |
| EP | 2 085 382 | A4 | 4/2010 |
| EP | 2 177 516 | A1 | 4/2010 |
| EP | 2 011 790 | A4 | 8/2010 |
| JP | 2009-170817 | A | 7/2009 |
| KR | 10-2005-0097670 | A | 10/2005 |
| KR | 10-2007-0114562 | A | 12/2007 |
| KR | 10-2008-0112325 | A | 12/2008 |
| KR | 10-2009-0035729 | A | 4/2009 |
| KR | 10-2009-0048299 | A | 5/2009 |
| KR | 10-2009-0051140 | A | 5/2009 |
| KR | 10-2009-0051141 | A | 5/2009 |
| KR | 10-2010-0017154 | A | 2/2010 |
| KR | 10-2010-0038193 | A | 4/2010 |
| WO | WO-2007-125714 | A1 | 11/2007 |
| WO | WO 2007/125714 | A1 | 11/2007 |
| WO | WO-2008-062636 | A1 | 5/2008 |
| WO | WO 2008/062636 | A1 | 5/2008 |
| WO | WO 2009/020095 | A1 | 2/2009 |
| WO | WO-2009-020095 | A1 | 2/2009 |
| WO | WO-2009-145016 | A1 | 3/2009 |

OTHER PUBLICATIONS

O'Brien, D. F., et al., "Improved energy transfer in electrophosphorescent devices," *Applied Physics Letters*, vol. 74, No. 3, Jan. 18, 1999, pp. 442-444.

Tang, C. W., et al., "Organic electroluminescent diodes," *Applied Physics Letters*, vol. 51, No. 12, Sep. 21, 1987, pp. 913-915.

International Search Report issued in corresponding application, PCT/KR2011/003003, dated Feb. 6, 2012.

Search Report mailed Jan. 30, 2014 in corresponding Chinese Patent Application No. 2011800205665.

USPTO Action mailed Jun. 11, 2014, in U.S. Appl. No. 13/691,872.

COMPOUND FOR OPTOELECTRONIC DEVICE, ORGANIC LIGHT EMITTING DIODE INCLUDING THE SAME, AND DISPLAY INCLUDING THE ORGANIC LIGHT EMITTING DIODE

CROSS-REFERENCE TO RELATED APPLICATIONS

This application is a continuation of pending International Application No. PCT/KR2011/003003, entitled "COMPOUND FOR OPTOELECTRONIC DEVICE, ORGANIC LIGHT EMITTING DIODE INCLUDING THE SAME AND DISPLAY INCLUDING THE ORGANIC LIGHT EMITTING DIODE," which was filed on Apr. 25, 2011, the entire contents of which are hereby incorporated by reference.

This application claims priority to and the benefit of Korean Patent Application No. 10-2010-0038169 filed in the Korean Intellectual Property Office on Apr. 23, 2010, the entire contents of which are incorporated herein by reference.

The present application is also related to U.S. Provisional Application No. 61/344,433, filed on Jul. 22, 2010, and entitled: "COMPOUND FOR OPTOELECTRONIC DEVICE, ORGANIC LIGHT EMITTING DIODE INCLUDING THE SAME AND DISPLAY INCLUDING THE ORGANIC LIGHT EMITTING DIODE," which is incorporated herein by reference in its entirety.

BACKGROUND

1. Field

Embodiments relate to a compound for an optoelectronic device, an organic light emitting diode including the same, and a display including the organic light emitting diode.

2. Description of the Related Art

A photoelectric device is, in a broad sense, a device for transforming photo-energy to electrical energy, or conversely, a device for transforming electrical energy to photo-energy.

An organic photoelectric device may be classified as follows in accordance with its driving principles. One type of organic photoelectric device is an electron device driven as follows: excitons are generated in an organic material layer by photons from an external light source; the excitons are separated to electrons and holes; and the electrons and holes are transferred to different electrodes from each other as a current source (voltage source).

Another type of organic photoelectric device is an electron device driven as follows: a voltage or a current is applied to at least two electrodes to inject holes and/or electrons into an organic material semiconductor positioned at an interface of the electrodes; and then the device is driven by the injected electrons and holes.

As examples, the organic photoelectric device may include an organic light emitting diode (OLED), an organic solar cell, an organic photo-conductor drum, an organic transistor, an organic memory device, etc., that uses a hole injecting or transporting material, an electron injecting or transporting material, or a light emitting material.

For example, an organic light emitting diode (OLED) has recently drawn attention due to an increase in demand for flat panel displays. In general, organic light emission may refer to transformation of electrical energy to photo-energy.

The organic light emitting diode may transform electrical energy into light by applying current to an organic light emitting material. The organic light emitting diode may have a structure in which a functional organic material layer is interposed between an anode and a cathode. The organic material layer may include multiple layers including different materials from each other, e.g., a hole injection layer (HIL), a hole transport layer (HTL), an emission layer, an electron transport layer (ETL), and an electron injection layer (EIL), in order to help improve efficiency and stability of an organic light emitting diode.

In such an organic light emitting diode, when a voltage is applied between an anode and a cathode, holes from the anode and electrons from the cathode may be injected to an organic material layer. The generated excitons may generate light having certain wavelengths while shifting to a ground state.

Recently, it is has become known that a phosphorescent light emitting material may be used for a light emitting material of an organic light emitting diode, in addition to the fluorescent light emitting material. Such a phosphorescent material may emit lights by transiting the electrons from a ground state to an exited state, non-radiance transiting of a singlet exciton to a triplet exciton through intersystem crossing, and transiting a triplet exciton to a ground state to emit light.

SUMMARY

Embodiments are directed to a compound for an optoelectronic device, an organic light emitting diode including the same, and a display including the organic light emitting diode.

The embodiments may be realized by providing a compound for an optoelectronic device, the compound being represented by the following Chemical Formula 1:

[Chemical Formula 1]

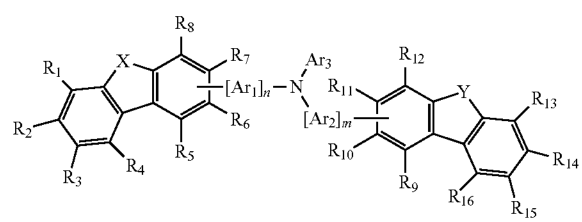

wherein in Chemical Formula 1, $R_1$ to $R_{16}$ are each independently selected from the group of hydrogen, deuterium, a single bond, a halogen, a cyano group, a hydroxyl group, an amino group, a substituted or unsubstituted C1 to C20 amine group, a nitro group, a carboxyl group, a ferrocenyl group, a substituted or unsubstituted C1 to C20 alkyl group, a substituted or unsubstituted C6 to C30 aryl group, a substituted or unsubstituted C2 to C30 heteroaryl group, a substituted or unsubstituted C1 to C20 alkoxy group, a substituted or unsubstituted C6 to C20 aryloxy group, a substituted or unsubstituted C3 to C40 silyloxy group, a substituted or unsubstituted C1 to C20 acyl group, a substituted or unsubstituted C2 to C20 alkoxycarbonyl group, a substituted or unsubstituted C2 to C20 acyloxy group, a substituted or unsubstituted C2 to C20 acylamino group, a substituted or unsubstituted C2 to C20 alkoxycarbonyl amino group, a substituted or unsubstituted C7 to C20 aryloxycarbonyl amino group, a substituted or unsubstituted C1 to C20 sulfamoyl amino group, a substituted or unsubstituted C1 to C20 sulfonyl group, a substituted or unsubstituted C1 to C20 alkylthiol group, a substituted or unsubstituted C6 to C20 arylthiol group, a substituted or unsubstituted C1 to C20 heterocyclothiol group, a substituted or unsubstituted C1 to C20 ureide group, and a substituted or unsubstituted C3 to C40 silyl group, at least one of $R_1$ to $R_8$ represents a bond with $Ar_1$, at least one of $R_9$ to $R^{16}$ represents a bond with $Ar_2$ or the central N atom of Chemical Formula 1, at least one of $R_1$ to $R_8$ is bound to $Ar_1$ through a sigma bond, or at least one of $R_9$ to $R_{16}$ is bound to $Ar_2$ or the central N atom of Chemical Formula 1 through a sigma bond, X is selected from $NR_{17}$, O, S, and $SO_2$ (O═S═O), wherein $R_{17}$ is a substituted or unsubstituted C1 to C20 alkyl group, a substituted or unsubstituted C6 to C30 aryl group, or a substituted or unsubstituted C2 to C30 heteroaryl group, Y is selected from O, S, and $SO_2$ (O═S═O), $Ar_1$ and $Ar_2$ are each independently a substituted or unsubstituted C6 to C30 aryl group or a substituted or unsubstituted C2 to C30 heteroaryl group, n is an integer ranging from 1 to 4, m is an integer ranging from 0 to 4, and $Ar_3$ is a substituted or unsubstituted C6 to C30 aryl group or a substituted or unsubstituted C2 to C30 heteroaryl group, provided that $Ar_3$ is not a substituted or unsubstituted carbazolyl group, a substituted or unsubstituted dibenzofuranyl group, or a substituted or unsubstituted dibenzothiophenyl group, and when X is $NR_{17}$, $Ar_3$ is not a fluorenyl group.

X may be selected from $NR_{17}$, O, S, and $SO_2$ (O═S═O), wherein $R_{17}$ is a substituted or unsubstituted C1 to C20 alkyl group, a substituted or unsubstituted C6 to C30 aryl group, or a substituted or unsubstituted C2 to C30 heteroaryl group, and the "substituted" aryl group or heteroaryl group refers to one substituted with at least one substituent selected from deuterium, a halogen, a cyano group, hydroxy group, an amino group, a substituted or unsubstituted C1 to C20 amine group, a nitro group, a substituted or unsubstituted C1 to C20 alkyl group, a substituted or unsubstituted C1 to C20 alkoxy group, a substituted or unsubstituted C3 to C40 silyl group, and a combination thereof.

The compound may be represented by one of the following Chemical Formulae 2 to 7:

[Chemical Formula 2]

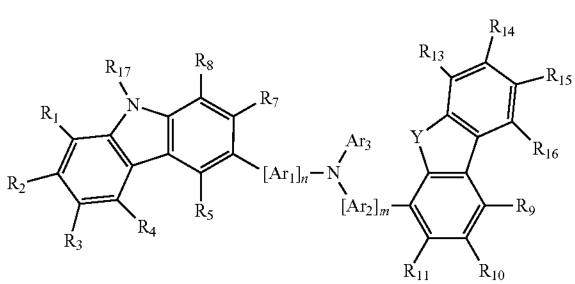

[Chemical Formula 3]

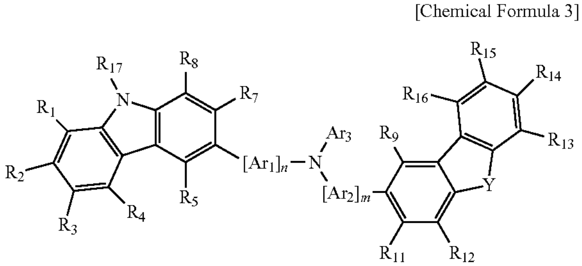

-continued

[Chemical Formula 4]

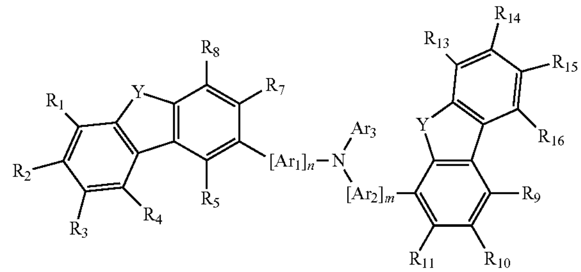

[Chemical Formula 5]

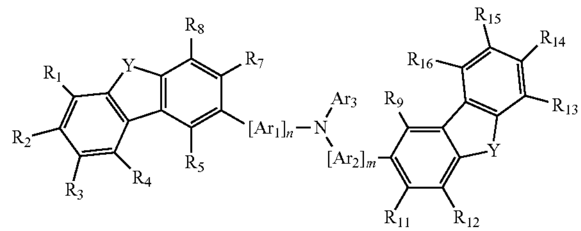

[Chemical Formula 6]

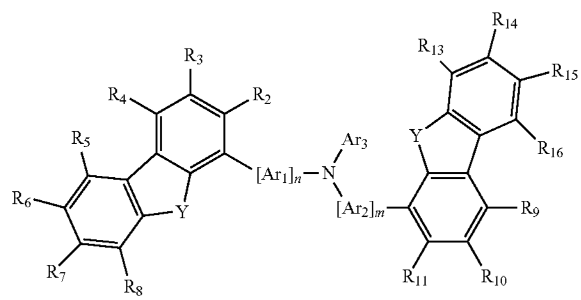

[Chemical Formula 7]

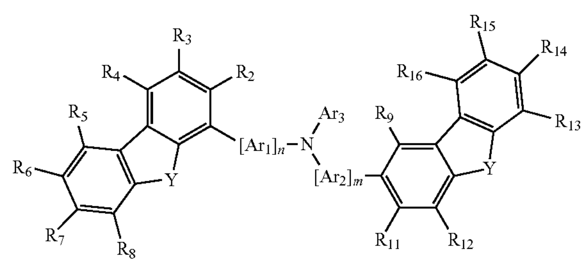

wherein in Chemical Formulae 2 to 7, $R_1$ to $R_{16}$ are each independently selected from the group of hydrogen, deuterium, a halogen, a cyano group, a hydroxyl group, an amino group, a substituted or unsubstituted C1 to C20 amine group, a nitro group, a carboxyl group, a ferrocenyl group, a substituted or unsubstituted C1 to C20 alkyl group, a substituted or unsubstituted C6 to C30 aryl group, a substituted or unsubstituted C2 to C30 heteroaryl group, a substituted or unsubstituted C1 to C20 alkoxy group, a substituted or unsubstituted C6 to C20 aryloxy group, a substituted or unsubstituted C3 to C40 silyloxy group, a substituted or unsubstituted C1 to C20 acyl group, a substituted or unsubstituted C2 to C20 alkoxycarbonyl group, a substituted or unsubstituted C2 to C20 acyloxy group, a substituted or unsubstituted C2 to C20 acylamino group, a substituted or unsubstituted C2 to C20 alkoxycarbonyl amino group, a substituted or unsubstituted C7 to C20 aryloxycarbonyl amino group, a substituted or unsubstituted C1 to C20 sulfamoyl amino group, a substituted or unsubstituted C1 to C20 sulfonyl group, a substituted or unsubstituted C1 to C20 alkylthiol group, a substituted or unsubstituted C6 to C20 arylthiol group, a substituted or unsubstituted C1 to C20 heterocyclothiol group, a substituted or unsubstituted C1 to C20 ureide group, and a substituted or unsubstituted C3 to C40 silyl group, $R_{17}$ is a substituted or unsubstituted C1 to C20 alkyl group, a substituted or unsubstituted C6 to C30 aryl group, or a substituted or unsubstituted C2 to C30 heteroaryl group, Y is selected from O, S, and $SO_2$ (O═S═O), $Ar_1$ and $Ar_2$ are each independently a substituted or unsubstituted C6 to C30 aryl group or a substituted or unsubstituted C2 to C30 heteroaryl group, n is an integer ranging from 1 to 4, m is an integer ranging from 0 to 4, and $Ar_3$ is a substituted or unsubstituted C6 to C30 aryl group or a substituted or unsubstituted C2 to C30 heteroaryl group, provided that $Ar_3$ is not a substituted or unsubstituted carbazolyl group, a substituted or unsubstituted dibenzofuranyl group, or a substituted or unsubstituted dibenzothiophenyl group.

The compound may be represented by one of the following Chemical Formulae 8 and 9:

[Chemical Formula 8]

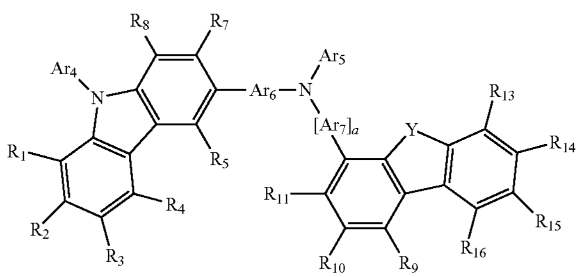

[Chemical Formula 9]

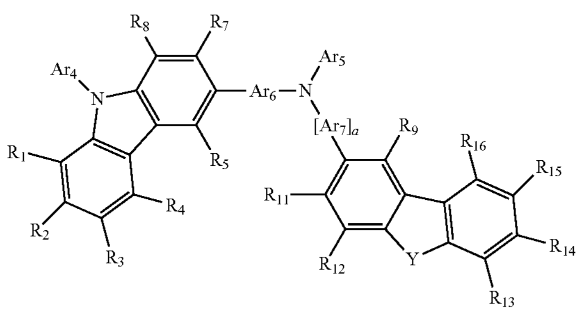

wherein in Chemical Formulae 8 and 9, $Ar_4$ and $Ar_5$ are each independently selected from the group of substituents represented by the following Chemical Formulae 10 to 18,

[Chemical Formula 10]

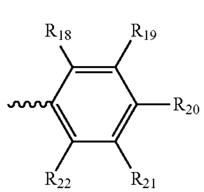

-continued

[Chemical Formula 11]

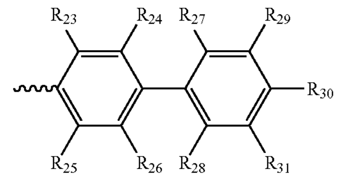

[Chemical Formula 12]

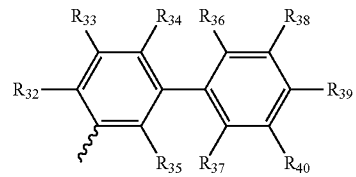

[Chemical Formula 13]

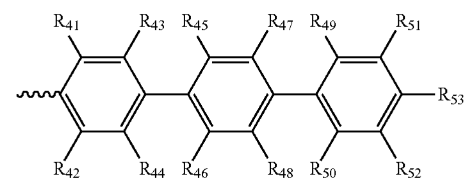

[Chemical Formula 14]

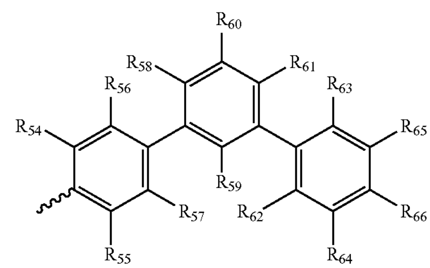

[Chemical Formula 15]

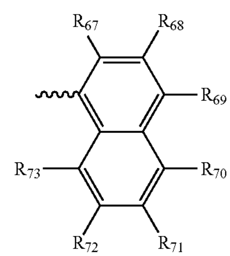

[Chemical Formula 16]

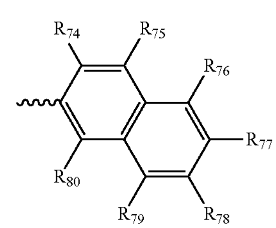

[Chemical Formula 17]

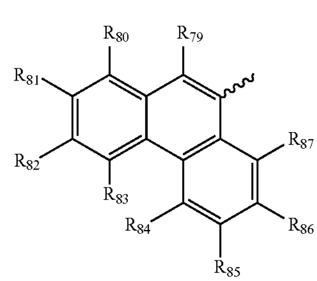

-continued

[Chemical Formula 18]

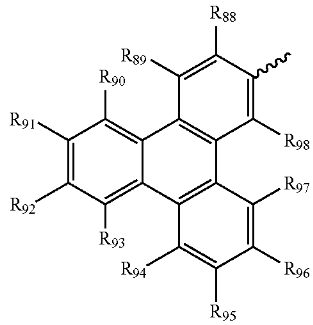

$R_1$ to $R_5$, $R_7$ to $R_{16}$, and $R_{18}$ to $R_{98}$ are each independently selected from the group of hydrogen, deuterium, a halogen, a cyano group, a hydroxyl group, an amino group, a substituted or unsubstituted C1 to C20 amine group, a nitro group, a substituted or unsubstituted C1 to C20 alkyl group, a substituted or unsubstituted C1 to C20 alkoxy group, or a substituted or unsubstituted C3 to C40 silyl group, $Ar_6$ and $Ar_7$ are each independently a substituent selected from the group of substituents represented by Chemical Formulae 10 to 18, and at least one of $R_{18}$ to $R_{98}$ is bound to an adjacent atom, and a is 0 or 1.

$Ar_4$ may be selected from a substituent represented by the above Formulae 10 to 18, and at least one of the substituents of $R_{18}$ to $R_{98}$ that is selected to $Ar_4$ is not hydrogen.

$Ar_4$ may be selected from the group of a substituted or unsubstituted phenyl group, a substituted or unsubstituted naphthyl group, a substituted or unsubstituted anthracenyl group, a substituted or unsubstituted phenanthryl group, a substituted or unsubstituted naphthacenyl group, a substituted or unsubstituted pyrenyl group, a substituted or unsubstituted biphenylyl group, a substituted or unsubstituted p-terphenyl group, a substituted or unsubstituted m-terphenyl group, a substituted or unsubstituted chrysenyl group, a substituted or unsubstituted triperylenyl group, a substituted or unsubstituted perylenyl group, a substituted or unsubstituted indenyl group, a substituted or unsubstituted furanyl group, a substituted or unsubstituted thiophenyl group, a substituted or unsubstituted pyrrolyl group, a substituted or unsubstituted pyrazolyl group, a substituted or unsubstituted imidazolyl group, a substituted or unsubstituted triazolyl group, a substituted or unsubstituted oxazolyl group, a substituted or unsubstituted thiazolyl group, a substituted or unsubstituted oxadiazolyl group, a substituted or unsubstituted thiadiazolyl group, a substituted or unsubstituted pyridyl group, a substituted or unsubstituted pyrimidinyl group, a substituted or unsubstituted pyrazinyl group, a substituted or unsubstituted triazinyl group, a substituted or unsubstituted benzofuranyl group, a substituted or unsubstituted benzothiophenyl group, a substituted or unsubstituted benzimidazolyl group, a substituted or unsubstituted indolyl group, a substituted or unsubstituted quinolinyl group, a substituted or unsubstituted isoquinolinyl group, a substituted or unsubstituted quinazolinyl group, a substituted or unsubstituted quinoxalinyl group, a substituted or unsubstituted naphthydinyl group, a substituted or unsubstituted benzoxazinyl group, a substituted or unsubstituted benzthiazinyl group, a substituted or unsubstituted acridinyl group, a substituted or unsubstituted phenazinyl group, a substituted or unsubstituted phenothiazinyl group, and a substituted or unsubstituted phenoxazinyl group.

The compound may be a hole transport material or a hole injection material for an organic light emitting diode.

The compound may have a triplet exciton energy (T1) of about 2.0 eV or higher.

The optoelectronic device may include an organic photoelectronic device, an organic light emitting diode, an organic solar cell, an organic transistor, an organic photo-conductor drum, or an organic memory device.

The embodiments may also be realized by providing a compound for an optoelectronic device, the compound being represented by one of Chemical Formulae A-1 to A-305, A-414 to A-416, A-457, A-458, or A-469 to A-473.

The embodiments may also be realized by providing a compound for an optoelectronic device, the compound being represented by one of Chemical Formulae A-417 to A-456, or A-459 to A-468.

The embodiments may also be realized by providing a compound for an optoelectronic device, the compound being represented by one of Chemical Formulae A-324 to A-395.

The embodiments may also be realized by providing a compound for an optoelectronic device, the compound being represented by one of Chemical Formulae A-306 to A-323.

The embodiments may also be realized by providing a compound for an optoelectronic device, the compound being represented by one of Chemical Formulae A-396 to A-413.

The embodiments may also be realized by providing an organic light emitting diode including an anode, a cathode, and at least one organic thin film between the anode and the cathode, the at least one organic thin film including the compound for an optoelectronic device according to an embodiment.

The at least one organic thin film including the compound for an optoelectronic device may include an emission layer, a hole transport layer (HTL), a hole injection layer (HIL), an electron transport layer (ETL), an electron injection layer (EIL), a hole blocking layer, or a combination thereof.

The at least one organic thin film including the compound for an optoelectronic device may include a hole transport layer (HTL), a hole injection layer (HIL), an electron transport layer (ETL), or an electron injection layer (EIL).

The at least one organic thin film including the compound for an optoelectronic device may include an emission layer.

The at least one organic thin film including the compound for an organic photoelectric device may be an emission layer, and the compound for an optoelectronic device may be a phosphorescent or fluorescent host material in the emission layer.

The embodiments may also be realized by providing a display device including the organic light emitting diode according to an embodiment.

BRIEF DESCRIPTION OF THE DRAWINGS

Features will become apparent to those of ordinary skill in the art by describing in detail exemplary embodiments with reference to the attached drawings in which.

DETAILED DESCRIPTION

Figure 1:
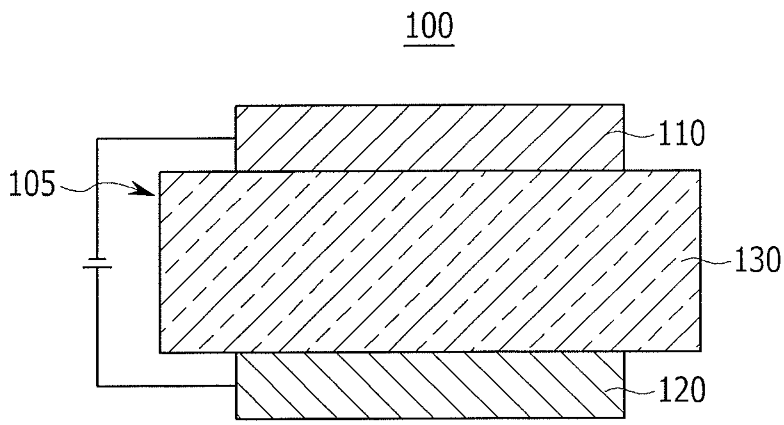
FIGS. 1 to 5 illustrate cross-sectional views of organic light emitting diodes including compounds according to various embodiments.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

As used herein, when specific definition is not otherwise provided, the term "substituted" may refer to one substituted with deuterium, a halogen, a hydroxy group, an amino group, a substituted or unsubstituted C1 to C20 amine group, a nitro group, a substituted or unsubstituted C3 to C40 silyl group, a C1 to C30 alkyl group, a C1 to C10 alkylsilyl group, a C3 to C30 cyclo alkyl group, a C6 to C30 aryl group, a C1 to C20 alkoxy group, a fluoro group, a C1 to C10 trifluoro alkyl group such as a trifluoromethyl group, or a cyano group, instead of hydrogen.

As used herein, when specific definition is not otherwise provided, the term "hetero" may refer to one including 1 to 3 of N, O, S, or P, and remaining carbons in one ring.

As used herein, when a definition is not otherwise provided, the term "combination thereof" may refer to at least two substituents bound to each other by a linker, or at least two substituents condensed to each other.

As used herein, when a definition is not otherwise provided, the term "alkyl" may refer to an aliphatic hydrocarbon group. The alkyl may be a saturated alkyl group that does not include any alkene or alkyne. The alkyl may be branched, linear, or cyclic.

As used herein, when a definition is not otherwise provided, the term "alkene" may refer to a group in which at least two carbon atoms are bound in at least one carbon-carbon double bond, and the term "alkyne" may refer to a group in which at least two carbon atoms are bound in at least one carbon-carbon triple bond.

The alkyl group may have 1 to 20 carbon atoms. The alkyl group may be a medium-sized alkyl having 1 to 10 carbon atoms. The alkyl group may be a lower alkyl having 1 to 6 carbon atoms.

For example, a C1-C4 alkyl may have 1 to 4 carbon atoms and may be selected from the group of methyl, ethyl, propyl, iso-propyl, n-butyl, iso-butyl, sec-butyl, and t-butyl.

Representative examples of an alkyl group may be selected from a methyl group, an ethyl group, a propyl group, an isopropyl group, a butyl group, an isobutyl group, a t-butyl group, a pentyl group, a hexyl group, an ethenyl group, a propenyl group, a butenyl group, a cyclopropyl group, a cyclobutyl group, a cyclopentyl group, a cyclohexyl group, or the like, which may be individually and independently substituted.

The term "aromatic group" may refer a functional group including a cyclic structure where all elements have p-orbitals that form conjugation. An aryl group and a heteroaryl group may be exemplified.

The term "aryl" may refer to a monocyclic or fused ring-containing polycyclic (i.e., rings sharing adjacent pairs of carbon atoms) group.

The "heteroaryl group" may refer to one including 1 to 3 heteroatoms selected from N, O, S, or P in an aryl group, and remaining carbons. When the heteroaryl group is a fused ring, each ring may include 1 to 3 hetero atoms.

The term "spiro structure" may refer to a cyclic structure having a contact point of one carbon. Further, the spiro structure may be used as a compound including the spiro structure or a substituent including the spiro structure.

In an implementation, the compound for an optoelectronic device may have a core structure in which two carbazole-based derivatives are independently bound to a nitrogen atom. For example, the carbazole-based derivative may refer to a structure in which a nitrogen atom of a substituted or unsubstituted carbazolyl group is substituted with another hetero atom instead of nitrogen. However, the structure including two carbazolyl groups bound to each other is not included in one embodiment. In an implementation, the core may include a carbazole (including a nitrogen atom) bound to a nitrogen atom. In an implementation, the compound according to an embodiment may not include two carbazolyl groups (both including nitrogen atoms).

As described above, the core structure may include at least two or more carbazole-based derivatives and may have excellent hole characteristics. Thus, the compound according to an embodiment may be used as a hole injection material or a hole transport material of an organic light emitting device.

At least one substituent that is bound to the core may be a substituent having excellent electron characteristics.

Therefore, the compound according to an embodiment may satisfy desirable properties of an emission layer by reinforcing electron characteristics to a carbazole structure having excellent hole characteristics. In an implementation, the compound according to an embodiment may be used as a host material of an emission layer.

In an implementation, the compound for an optoelectronic device may be synthesized from groups having various energy band gaps by introducing various substituents into the core of a nitrogen and two carbazole-based derivatives bound thereto.

The organic photoelectric device may include the compound having the appropriate energy level depending upon the substituents. Thus, the electron transporting property may be enforced to provide excellent efficiency and driving voltage, and the electrochemical and thermal stability may be improved to enhance the life-span characteristic while driving the organic photoelectric device.

According to an embodiment, a compound for an optoelectronic device may be represented by the following Chemical Formula 1.

[Chemical Formula 1]

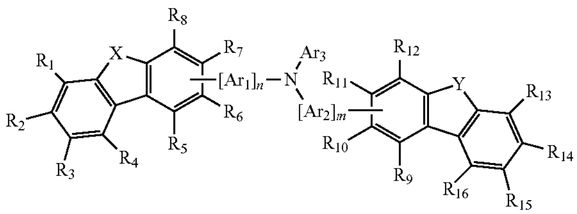

In Chemical Formula 1, $R_1$ to $R_{16}$ may each independently be selected from the group of a single bond, hydrogen, deuterium, a halogen, a cyano group, a hydroxyl group, an amino group, a substituted or unsubstituted C1 to C20 amine group, a nitro group, a carboxyl group, a ferrocenyl group, a substituted or unsubstituted C1 to C20 alkyl group, a substituted or unsubstituted C6 to C30 aryl group, a substituted or unsubstituted C2 to C30 heteroaryl group, a substituted or unsubstituted C1 to C20 alkoxy group, a substituted or unsubstituted C6 to C20 aryloxy group, a substituted or unsubstituted C3 to C40 silyloxy group, a substituted or unsubstituted C1 to C20 acyl group, a substituted or unsubstituted C2 to C20 alkoxycarbonyl group, a substituted or unsubstituted C2 to C20 acyloxy group, a substituted or unsubstituted C2 to C20 acylamino group, a substituted or unsubstituted C2 to C20 alkoxycarbonyl amino group, a substituted or unsubstituted C7 to C20 aryloxycarbonyl amino group, a substituted or unsubstituted C1 to C20 sulfamoyl amino group, a substituted or unsubstituted C1 to C20 sulfonyl group, a substituted or unsubstituted C1 to C20 alkylthiol group, a substituted or unsubstituted C6 to C20 arylthiol group, a substituted or unsubstituted C1 to C20 heterocyclothiol group, a substituted or unsubstituted C1 to C20 ureide group, and a substituted or unsubstituted C3 to C40 silyl group.

In an implementation, one of $R_1$ to $R_9$ may represent a bond to $Ar_1$ or one of $R_9$ to $R_{16}$ may represent a bond to $Ar_2$ or the central N atom of Chemical Formula 1. In an implementation, one of $R_1$ to $R_9$ may be bound to $Ar_1$ through a sigma bond or one of $R_9$ to $R_{16}$ may be bound to $Ar_2$ or the central N atom of Chemical Formula 1 through a sigma bond.

By selecting a suitable combination of substituents, the compound for an optoelectronic device having excellent hole or electron transporting properties, high film stability, thermal stability, and triplet exciton energy (T1) may be provided.

Also, a compound having improved thermal stability or oxidation resistance by selecting a suitable combination of the substituents may be provided.

An asymmetrical bipolar structure may be provided by selecting a suitable combination of substituents. The asymmetrical bipolar structure may help improve hole and electron transporting properties. Thus, luminous efficiency and performance of a device may be improved.

Bulkiness of a structure of a compound may controlled by selecting suitable substituents, and therefore crystallinity may be decreased. When the crystallinity of a compound is decreased, the life-span of a device may be improved.

In Chemical Formula 1, X may be selected from the group of $NR_{17}$, O, S, and $SO_2$ (O═S═O). $R_{17}$ may be a substituted or unsubstituted C1 to C20 alkyl group, a substituted or unsubstituted C6 to C30 aryl group, or a substituted or unsubstituted C2 to C30 heteroaryl group. Y may be O, S, or $SO_2$ (O═S═O).

In the core structure of the above Chemical Formula 1, the hetero atom of the carbazole-based derivatives that are both substituents of a nitrogen atom may not simultaneously be N (i.e., carbazole). For example, two or more carbazolyl groups may not exist as a substituent of nitrogen of a tertiary arylamine in the above Chemical Formula 1. A symmetric compound, e.g., having the same substituents, may exhibit undesirably increased crystallinity.

In Chemical Formula 1, $Ar_1$ and $Ar_2$ may each independently be a substituted or unsubstituted C6 to C30 aryl group or a substituted or unsubstituted C2 to C30 heteroaryl group. n may be an integer ranging from 1 to 4, and m may be an integer ranging from 0 to 4. A π-conjugation length may be controlled by adjusting a length of $Ar_1$ and $Ar_2$. Accordingly, a triplet exciton energy bandgap may be controlled, and the compound according to an embodiment may be usefully applied as a phosphorescent host of the emission layer of an organic photoelectric device. In an implementation, when a heteroaryl group is introduced, a bipolar characteristic of a molecular structure may be realized to provide a phosphorescent host of an organic photoelectric device having high efficiency.

In Chemical Formula 1, $Ar_3$ may be a substituted or unsubstituted C6 to C30 aryl group or a substituted or unsubstituted C2 to C30 heteroaryl group. In an implementation, when X is $NR_{17}$, $Ar_3$ may not be a fluorenyl group.

As described above, $Ar_3$ may be a substituted or unsubstituted C6 to C30 aryl group or a substituted or unsubstituted C2 to C30 heteroaryl group. In an implementation, $Ar_3$ may not be a substituted or unsubstituted carbazolyl group, a substituted or unsubstituted dibenzofuranyl group, or a substituted or unsubstituted dibenzothiophenyl group. When $Ar_3$ does not include the substituents described above, the crystallinity of the compound may be suppressed by decreasing a symmetric structure in the molecule. Thus, recrystallization may be inhibited in a device.

Examples of $Ar_3$ may include a substituted or unsubstituted phenyl group, a substituted or unsubstituted naphthyl group, a substituted or unsubstituted anthracenyl group, a substituted or unsubstituted phenanthryl group, a substituted or unsubstituted naphthacenyl group, a substituted or unsubstituted pyrenyl group, a substituted or unsubstituted biphenylyl group, a substituted or unsubstituted p-terphenyl group, a substituted or unsubstituted m-terphenyl group, a substituted or unsubstituted chrysenyl group, a substituted or unsubstituted triperylenyl group, a substituted or unsubstituted perylenyl group, a substituted or unsubstituted indenyl group, a substituted or unsubstituted furanyl group, a substituted or unsubstituted thiophenyl group, a substituted or unsubstituted pyrrolyl group, a substituted or unsubstituted pyrazolyl group, a substituted or unsubstituted imidazolyl group, a substituted or unsubstituted triazolyl group, a substituted or unsubstituted oxazolyl group, a substituted or unsubstituted thiazolyl group, a substituted or unsubstituted oxadiazolyl group, a substituted or unsubstituted thiadiazolyl group, a substituted or unsubstituted pyridyl group, a substituted or unsubstituted pyrimidinyl group, a substituted or unsubstituted pyrazinyl group, a substituted or unsubstituted triazinyl group, a substituted or unsubstituted benzofuranyl group, a substituted or unsubstituted benzothiophenyl group, a substituted or unsubstituted benzimidazolyl group, a substituted or unsubstituted indolyl group, a substituted or unsubstituted quinolinyl group, a substituted or unsubstituted isoquinolinyl group, a substituted or unsubstituted quinazolinyl group, a substituted or unsubstituted quinoxalinyl group, a substituted or unsubstituted naphthydinyl group, a substituted or unsubstituted benzoxazinyl group, a substituted or unsubstituted benzthiazinyl group, a substituted or unsubstituted acridinyl group, a substituted or unsubstituted phenazinyl group, a substituted or unsubstituted phenothiazinyl group, or a substituted or unsubstituted phenoxazinyl group.

X may be selected from the group of $NR_{17}$, O, S, and $SO_2$ (O═S═O). $R_{17}$ may be a substituted or unsubstituted C1 to C20 alkyl group, a substituted or unsubstituted C6 to C30 aryl group, or a substituted or unsubstituted C2 to C30 heteroaryl group, wherein the term "substituted" refers to at least one hydrogen of an aryl group or a heteroaryl group substituted with deuterium, a halogen, a cyano group, a hydroxy group, an amino group, a substituted or unsubstituted C1 to C20 amine group, a nitro group, a substituted or unsubstituted C1 to C20 alkyl group, a substituted or unsubstituted C1 to C20 alkoxy group, a substituted or unsubstituted C3 to C40 silyl group, or a combination thereof.

As described above, when one of substituents of Rig is the above substituent instead of hydrogen, electro-optical characteristics and thin film characteristics for maximizing performance of the compound for an optoelectronic device may be finely adjusted while maintaining basic characteristics of the compound.

The compound represented by Chemical Formula 1 may be represented by one of the Chemical Formulae 2 to 7.

[Chemical Formula 2]

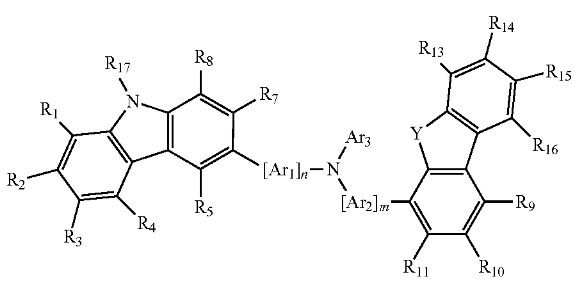

[Chemical Formula 3]

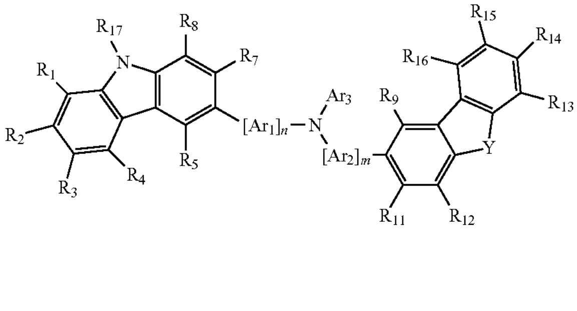

-continued

[Chemical Formula 4]

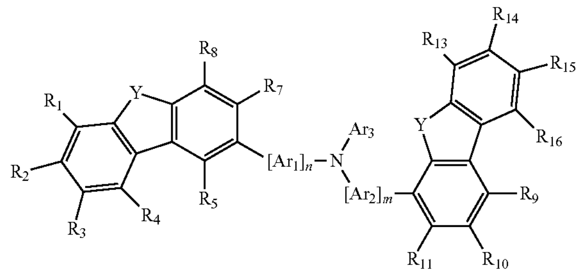

[Chemical Formula 5]

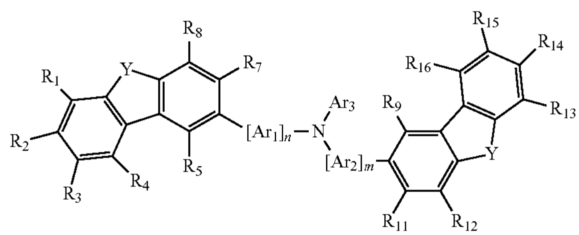

[Chemical Formula 6]

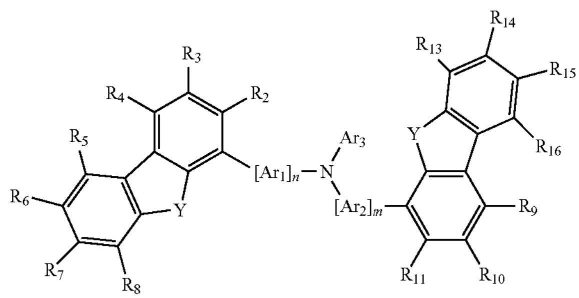

[Chemical Formula 7]

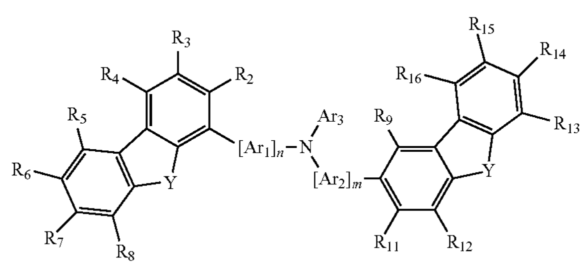

The compounds represented by Chemical Formulae 2 to 7 include fixed positions at which a substituent of a carbazole-based derivative, e.g., a dibenzofuranyl group or a dibenzothiophenyl group, is bound in Chemical Formula 1. When the substituent is bound at fixed positions, substantial synthesis may be advantageously performed.

The compound for an optoelectronic device according to an embodiment may include a compound represented by one of the following Chemical Formulae 8 and 9.

[Chemical Formula 8]

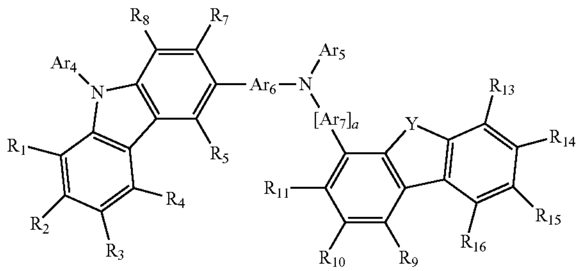

[Chemical Formula 9]

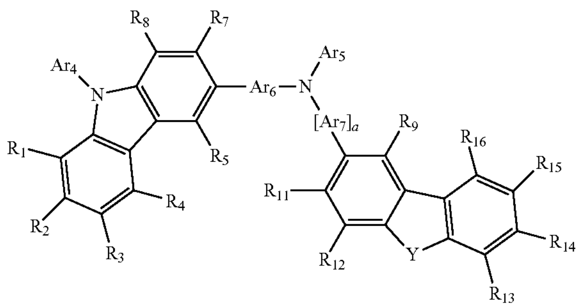

In Chemical Formulae 8 and 9, $Ar_4$ and $Ar_5$ may each independently be selected from substituents represented by the following Chemical Formulae 10 to 18.

[Chemical Formula 10]

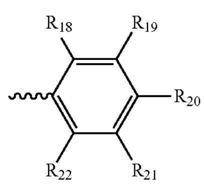

[Chemical Formula 11]

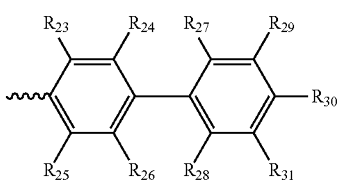

[Chemical Formula 12]

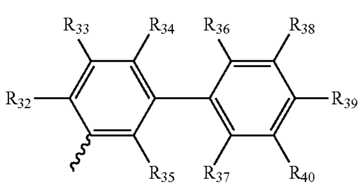

[Chemical Formula 13]

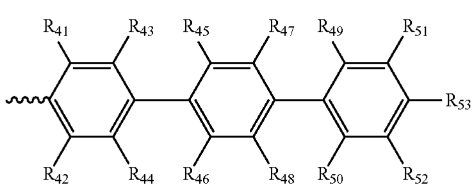

-continued

[Chemical Formula 14]

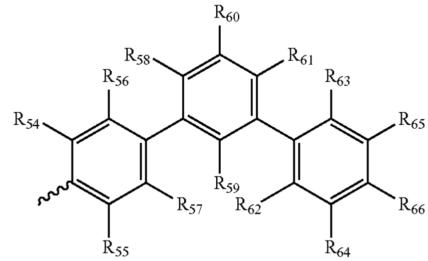

[Chemical Formula 15]

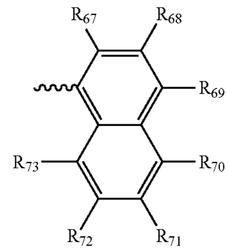

[Chemical Formula 16]

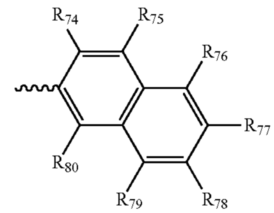

[Chemical Formula 17]

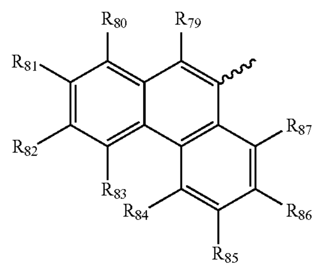

[Chemical Formula 18]

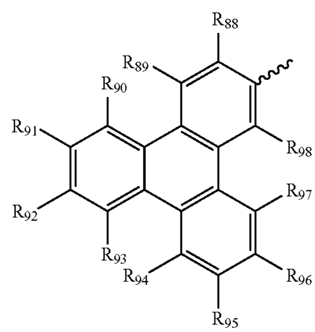

In Chemical Formulae 10 to 18, $R_1$ to $R_5$, $R_7$ to $R_{16}$, and $R_{18}$ to $R_{98}$ may each independently be selected from the group of hydrogen, deuterium, a halogen, a cyano group, a hydroxyl group, an amino group, a substituted or unsubstituted C1 to C20 amine group, a nitro group, a substituted or unsubstituted C1 to C20 alkyl group, a substituted or unsubstituted C1 to C20 alkoxy group, and a substituted or unsubstituted C3 to C40 silyl group. $Ar_6$ and $Ar_7$ may each independently be selected from the group of substituents represented by the above Chemical Formulae 10 to 18. In an implementation, one of the selected substituents of $R_{18}$ to $R_{98}$ may be bound to an adjacent atom. a may be 0 or 1.

The compound represented by Chemical Formula 8 or 9 may include a substituted or unsubstituted aryl group that is substituted with a substituent including nitrogen bound to a carbazolyl group and/or a substituent bound to an amine group. In this structure, it is hard to be recrystallized due to asymmetrical molecule structure as well as excellent hole transporting properties of a carbazolyl group. Therefore, when the compound is used for a hole injection and hole transport layer (HTL) of an organic light emitting diode, a long life-span and high efficiency may be realized.

In an implementation, $Ar_4$ may be selected from the substituents represented by Chemical Formulae 10 to 18. At least one of the substituents $R_{18}$ to $R_{98}$ for $Ar_4$ may not be hydrogen, and in an implementation, may be selected from deuterium, a halogen, a cyano group, a hydroxyl group, an amino group, a substituted or unsubstituted C1 to C20 amine group, a nitro group, a substituted or unsubstituted C1 to C20 alkyl group, a substituted or unsubstituted C1 to C20 alkoxy group, or a substituted or unsubstituted C3 to C40 silyl group.

For example, one of the substituents of $Ar_4$ may be substituted with one of the substituents described above. In this structure, electro-optical characteristics and thin film characteristics for maximizing the performance of the material for an optoelectronic device may be finely adjusted while maintaining basic characteristics of the compound.

The compound for an optoelectronic device according to an embodiment may include a compound represented by one of the following Chemical Formulae A-1 to A-305, A-414 to A-416, A-457, A-458, or A-469 to A-473. The compounds of the following structures may have an excellent hole transport property due to carbazolyl, excellent thin film characteristics due to an asymmetrical molecule, and thermal stability. Therefore when they are used for a hole injection layer and a hole transport layer (HTL) of an organic light emitting diode, a long life-span and high efficiency may be realized.

[A-1]

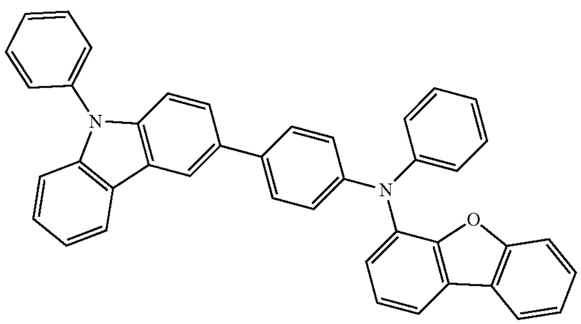

[A-2]

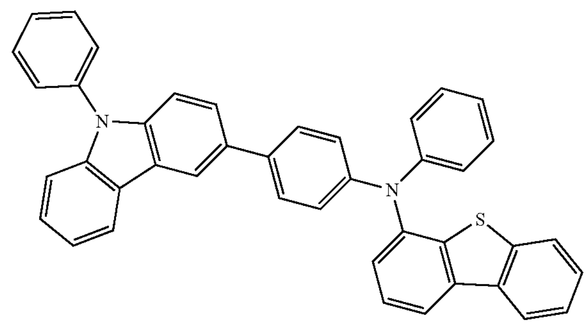

[A-3]

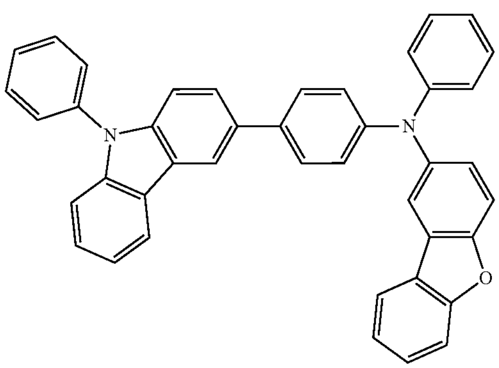

[A-4]

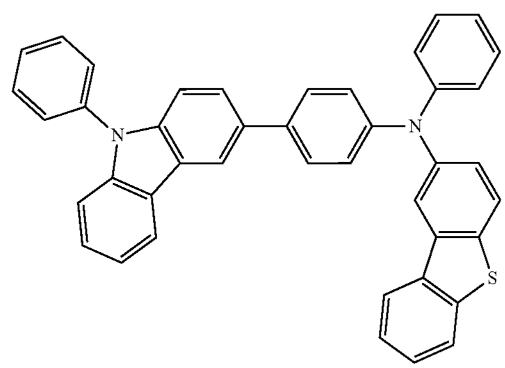

[A-5]

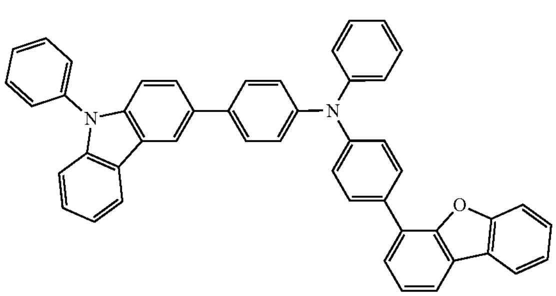

[A-6]

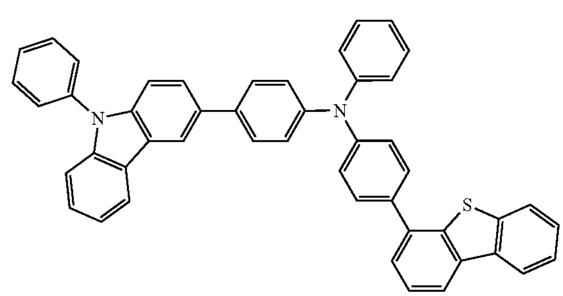

-continued
[A-7]
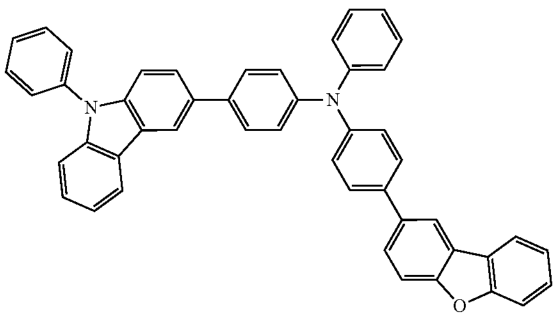
[A-8]
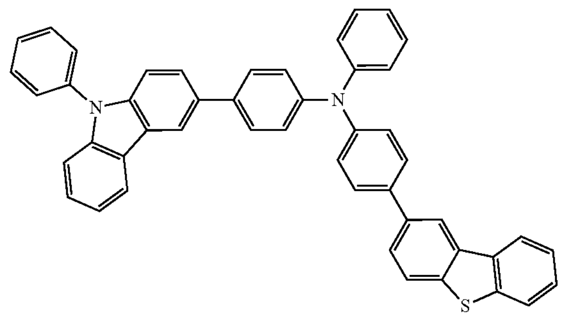
[A-9]
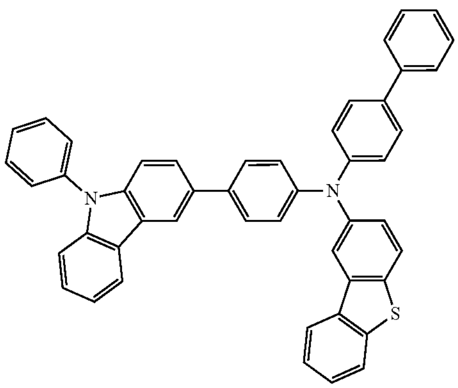
[A-10]
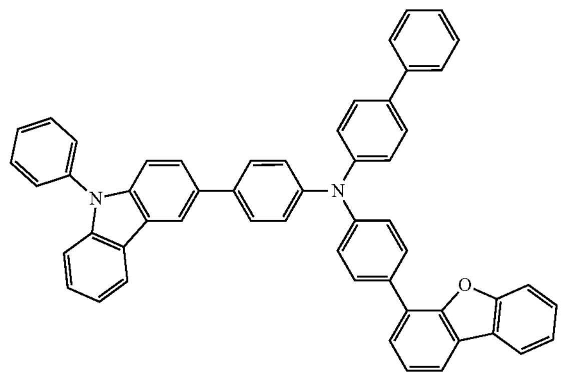
[A-11]
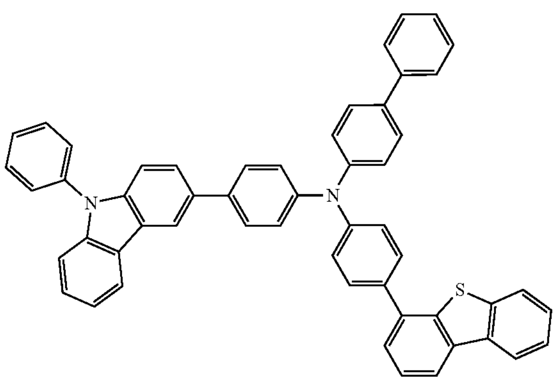
[A-12]
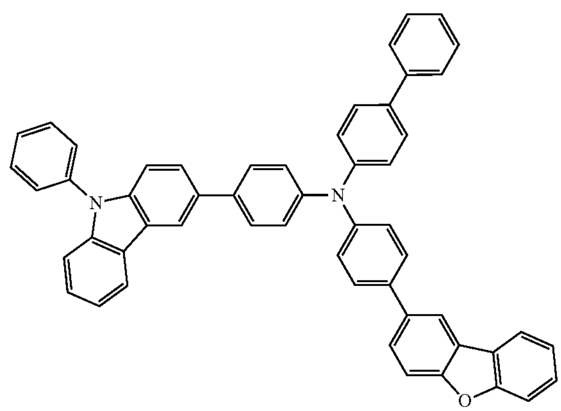
[A-13]
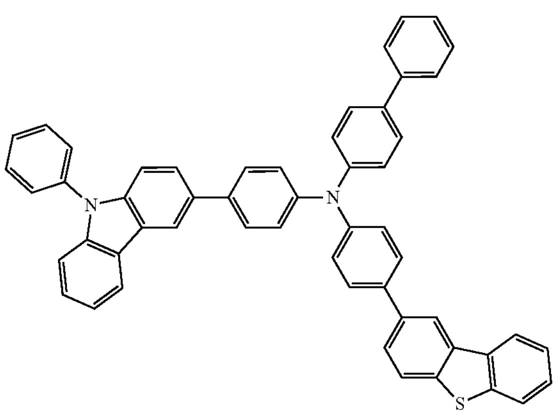
[A-14]
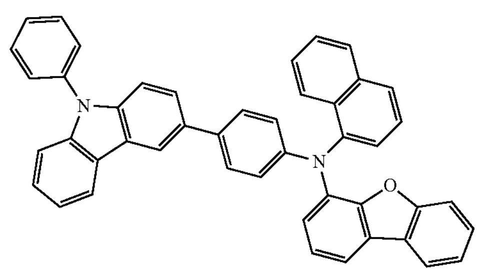

-continued
[A-15]
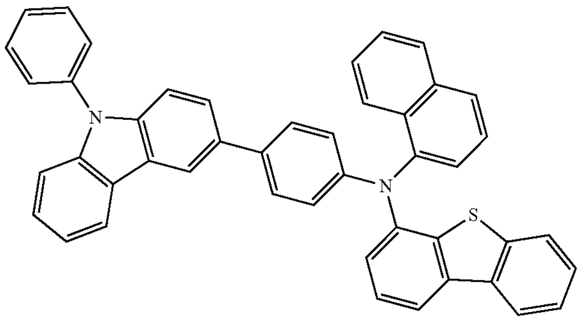
[A-16]
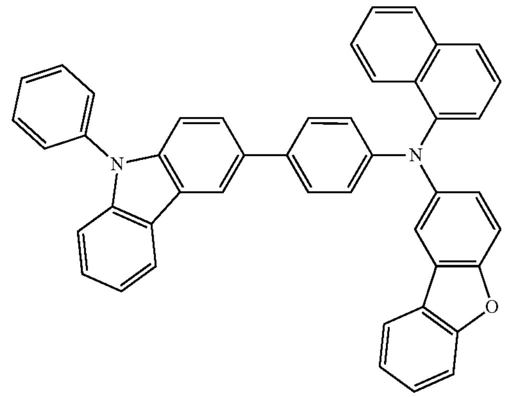
[A-17]
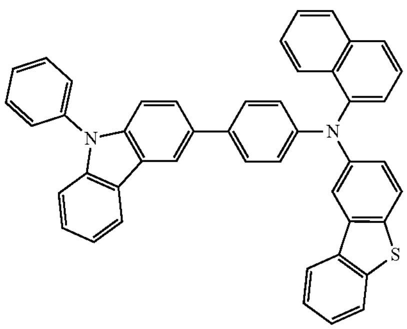
[A-18]
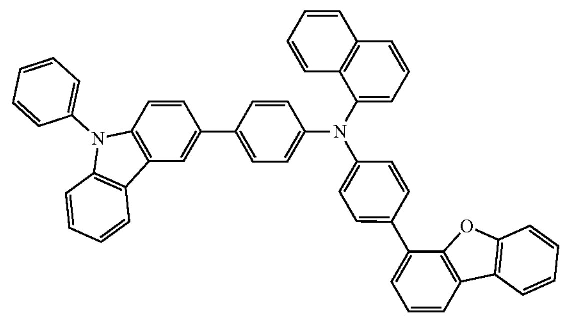
[A-19]
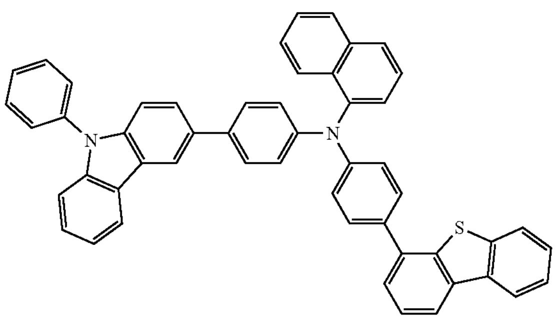
[A-20]
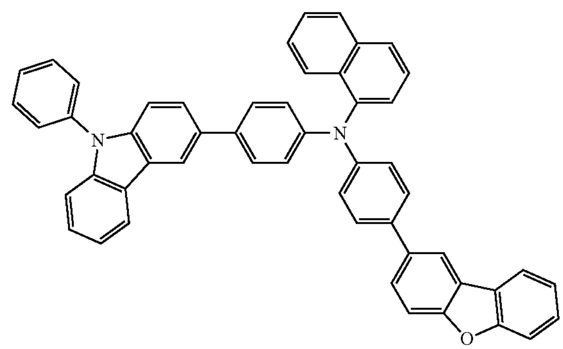
[A-21]
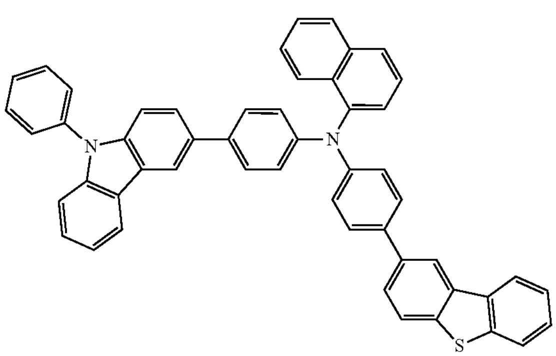
[A-22]
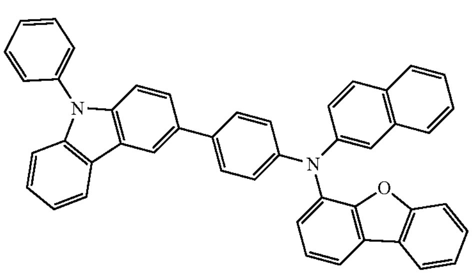

-continued
[A-23]
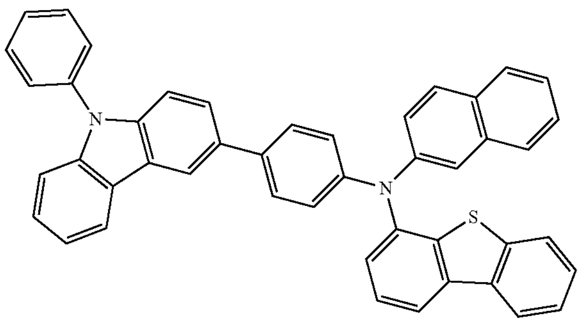
[A-24]
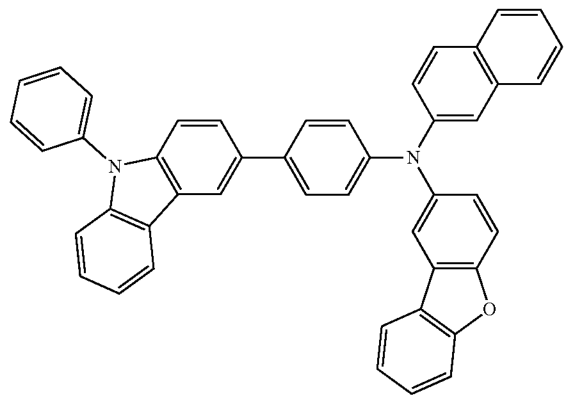
[A-25]
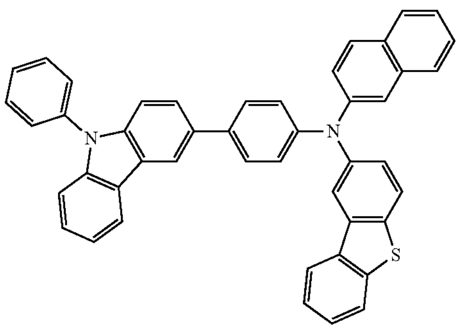
[A-26]
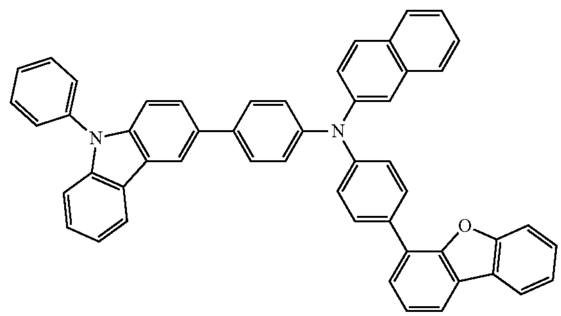
[A-27]
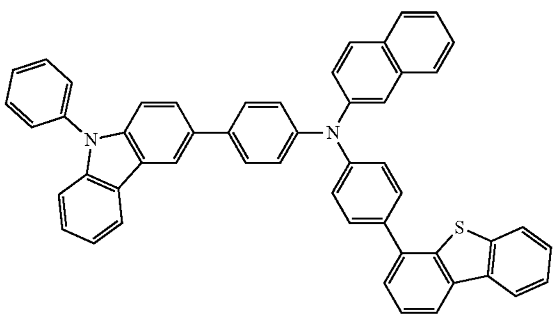
[A-28]
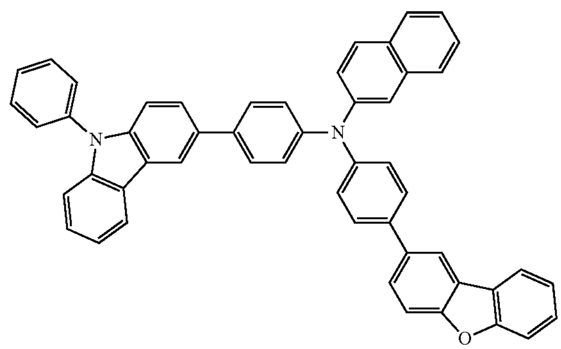
[A-29]
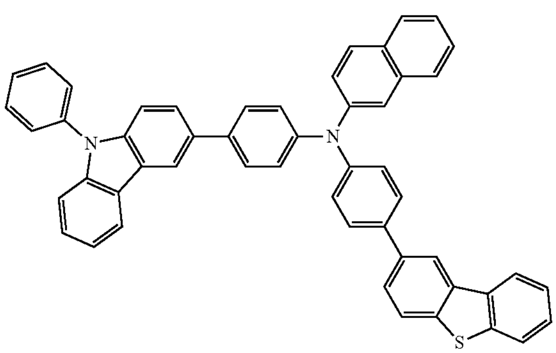
[A-30]
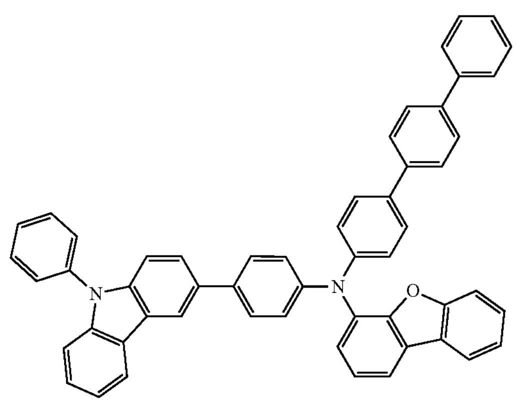

-continued
[A-31]
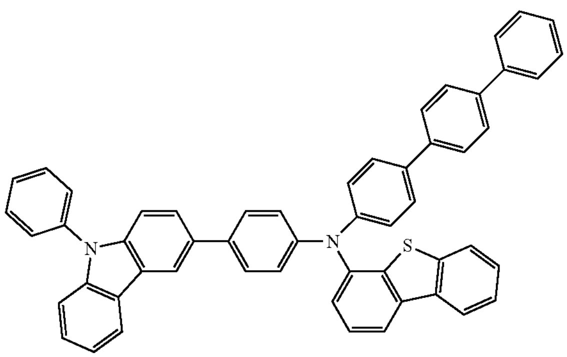
[A-32]
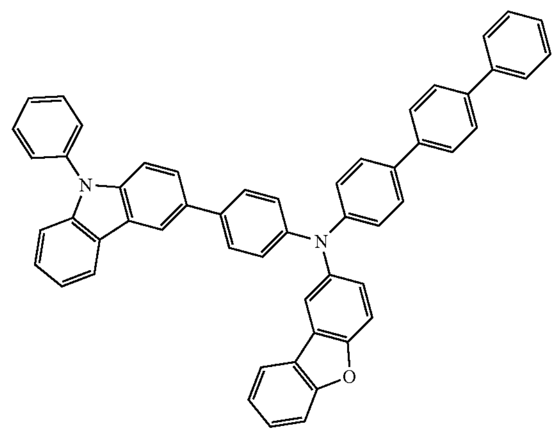
[A-33]
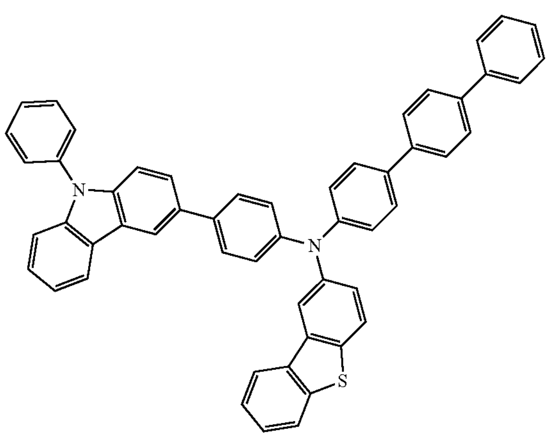
[A-34]
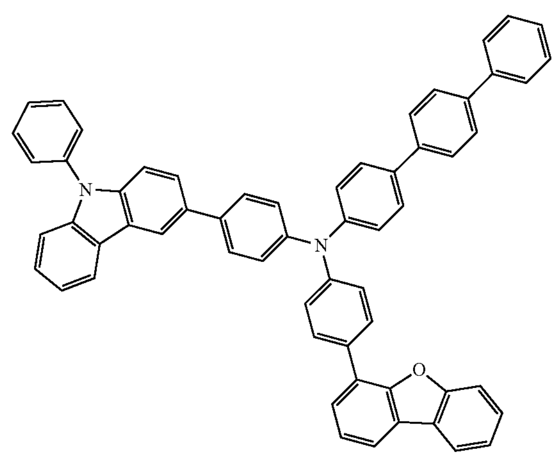
[A-35]
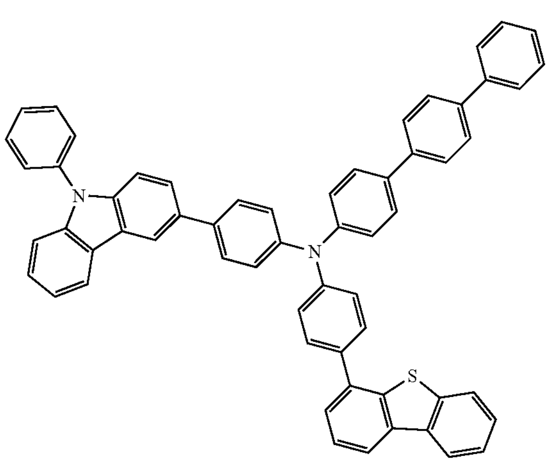
[A-36]
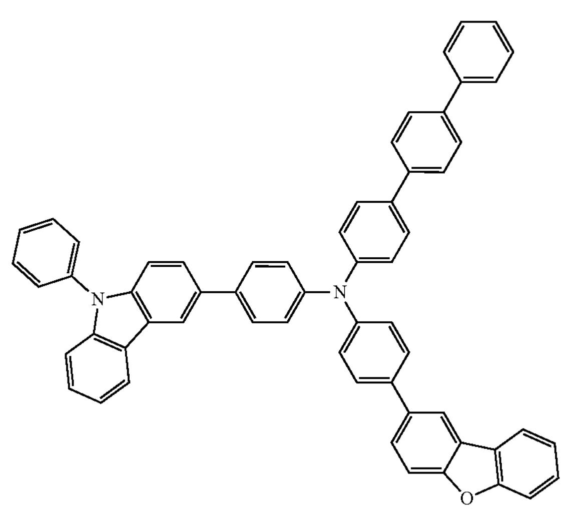

-continued
[A-37]
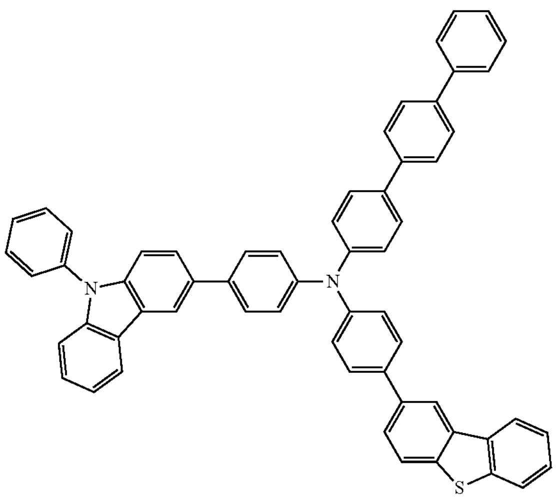
[A-38]
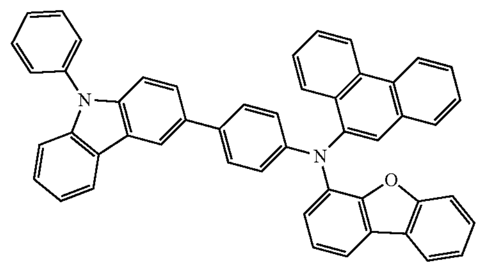
[A-39]
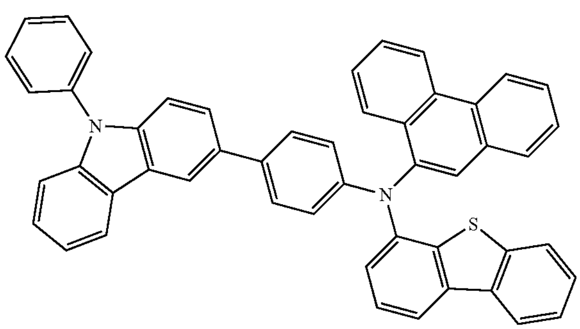
[A-40]
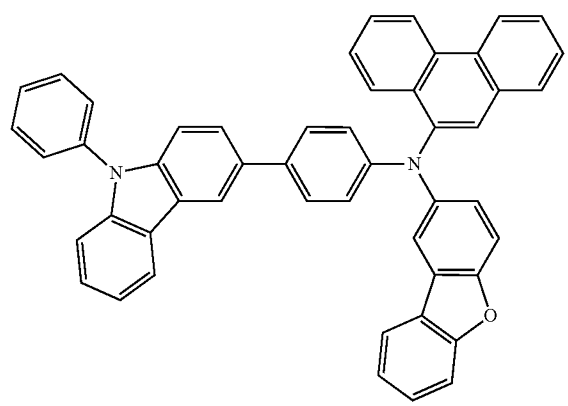
[A-41]
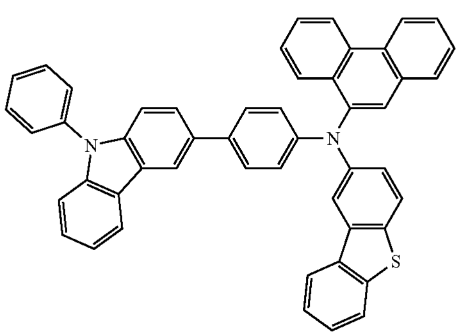
[A-42]
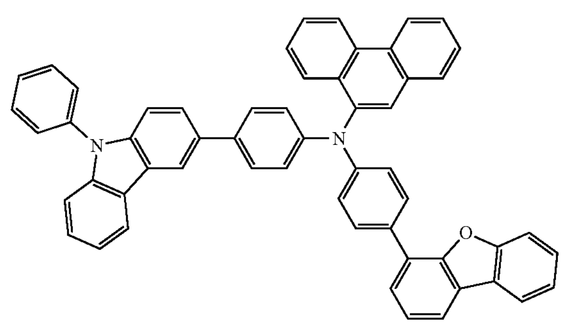
[A-43]
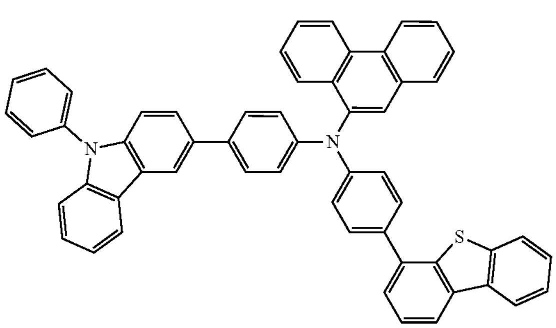
[A-44]
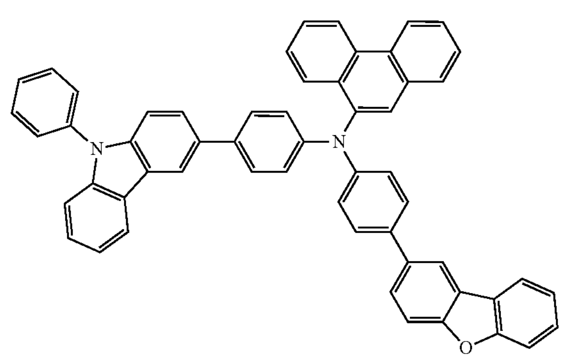

-continued
[A-45]
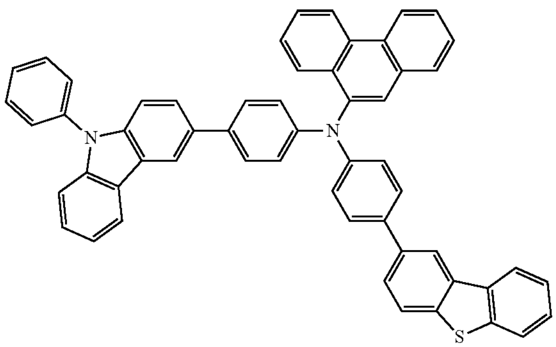
[A-46]
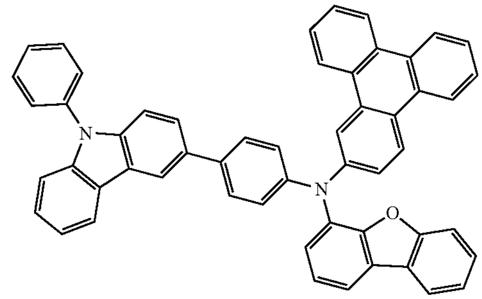
[A-47]
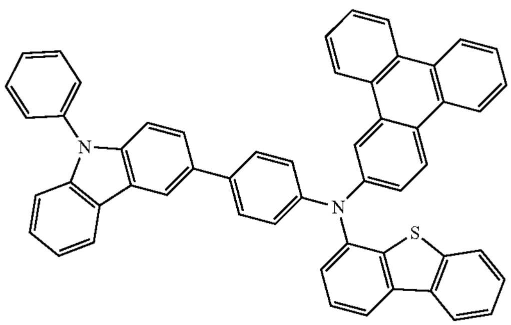
[A-48]
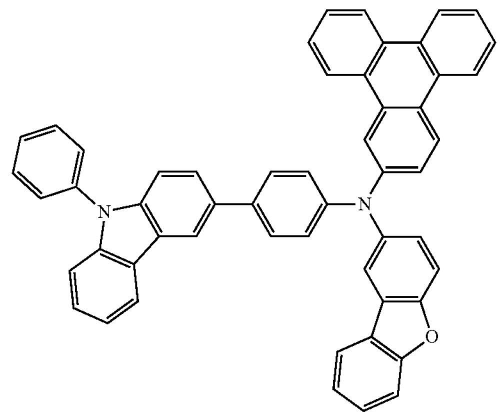
[A-49]
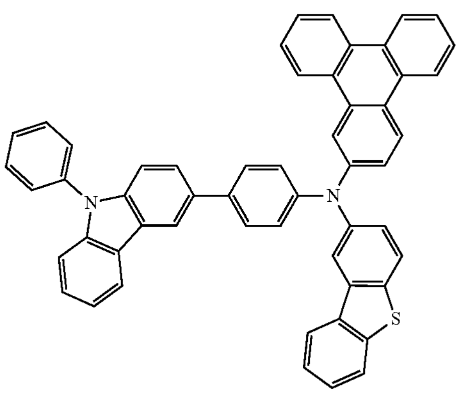
[A-50]
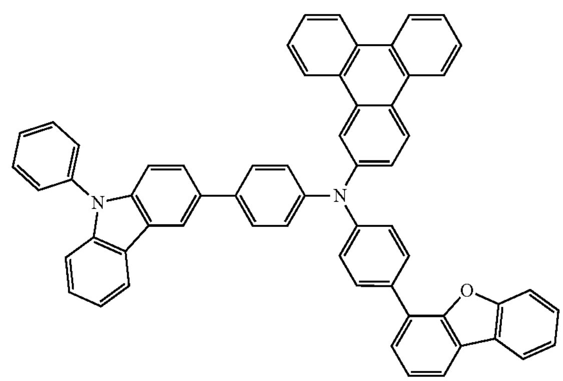
[A-51]
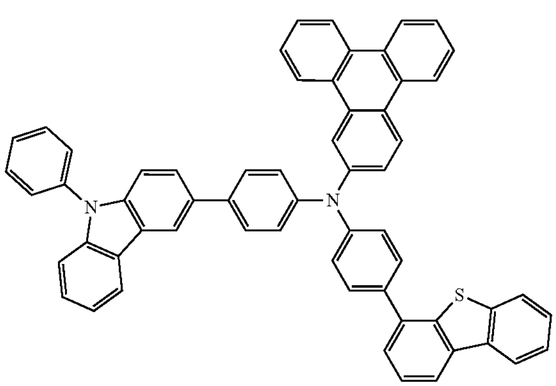
[A-52]
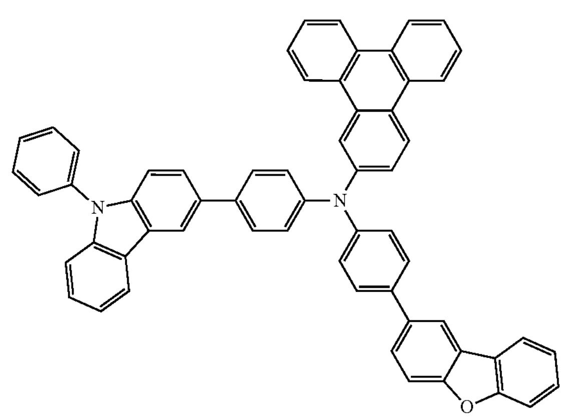

-continued
[A-53]
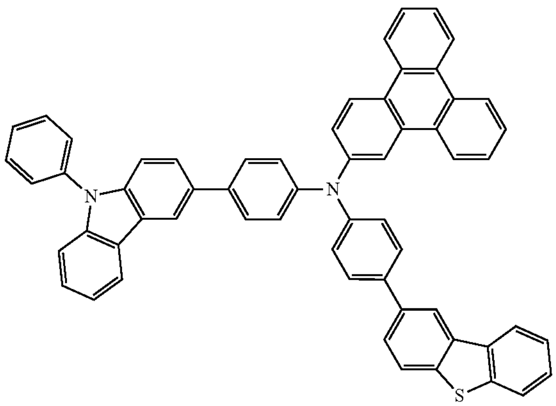
[A-54]
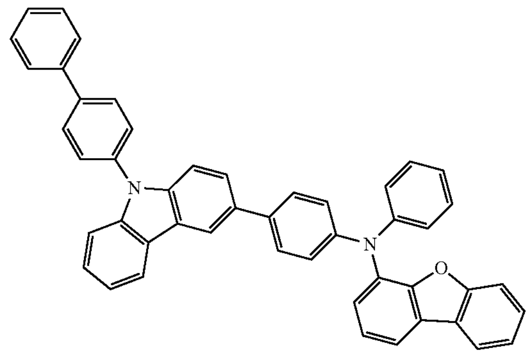
[A-55]
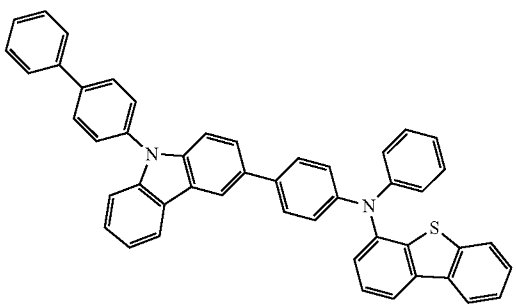
[A-56]
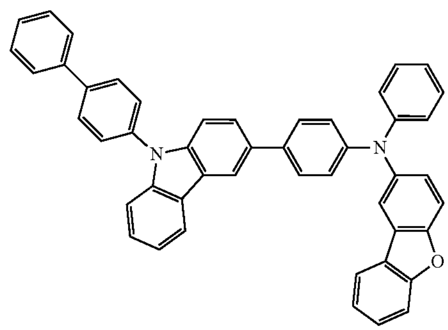
[A-57]
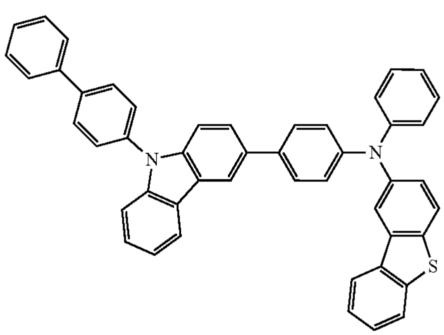
[A-58]
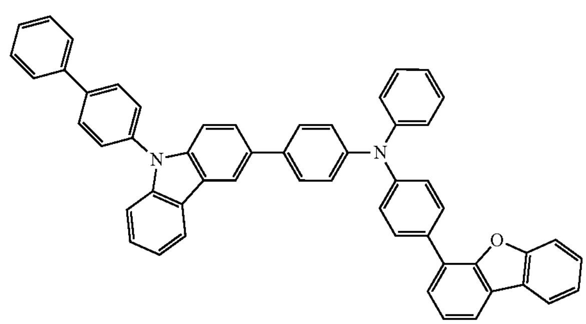
[A-59]
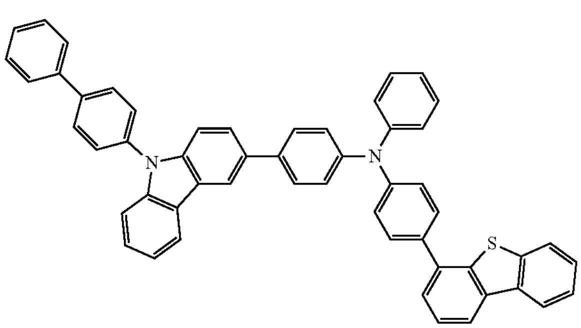
[A-60]
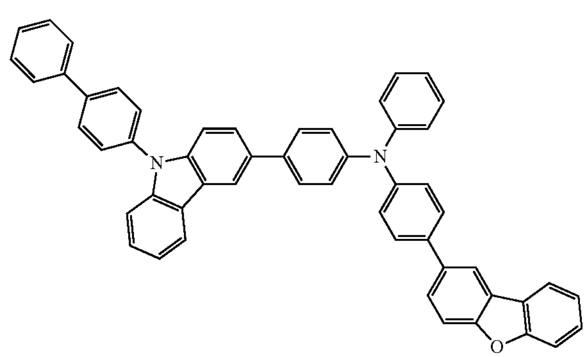

-continued
[A-61]
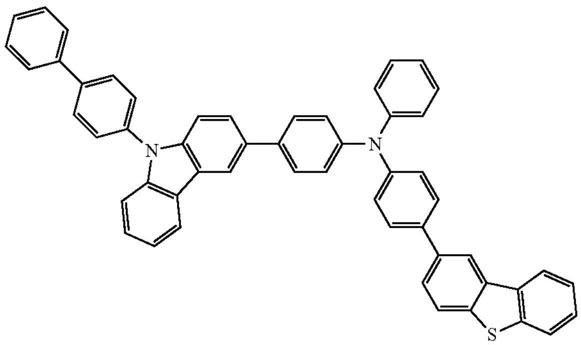
[A-62]
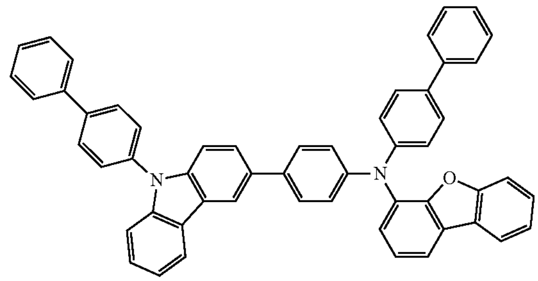
[A-63]
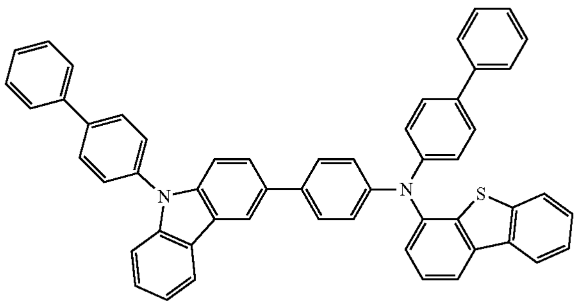
[A-64]
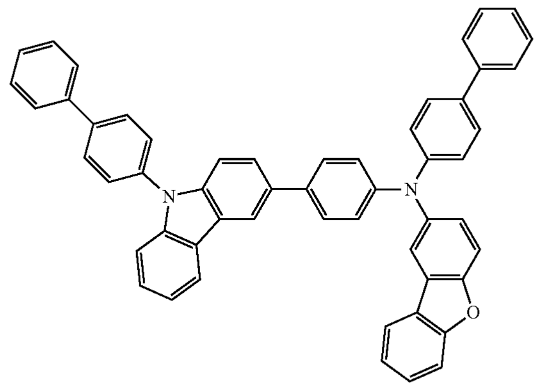
[A-65]
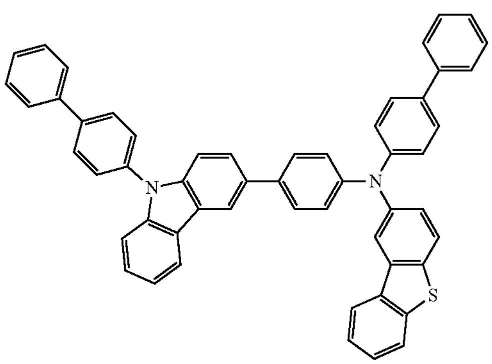
[A-66]
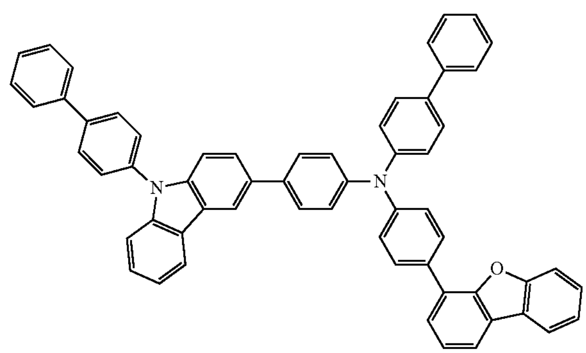
[A-67]
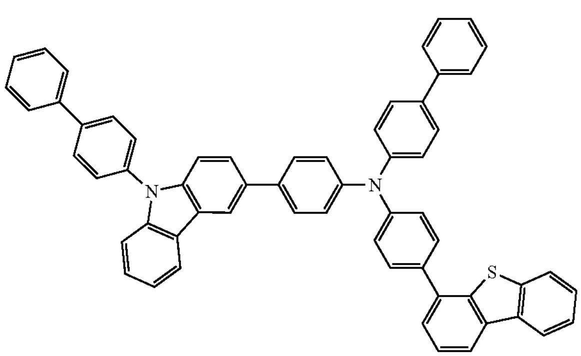
[A-68]
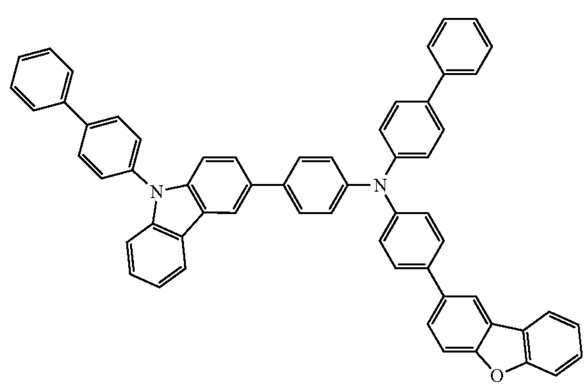

-continued
[A-69]
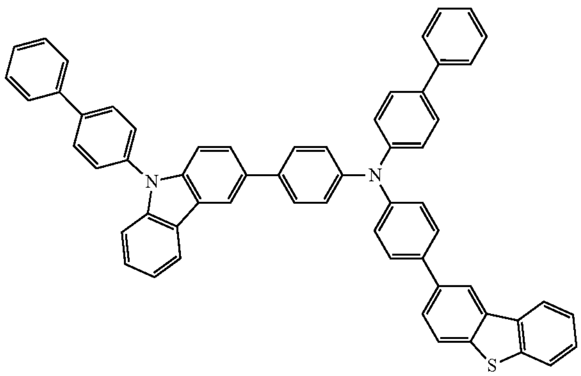
[A-70]
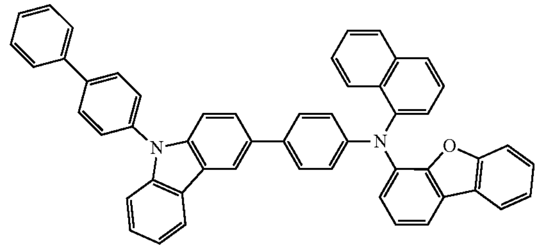
[A-71]
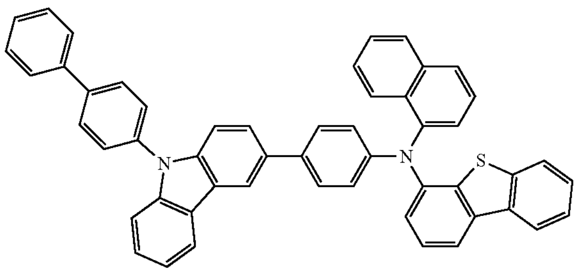
[A-72]
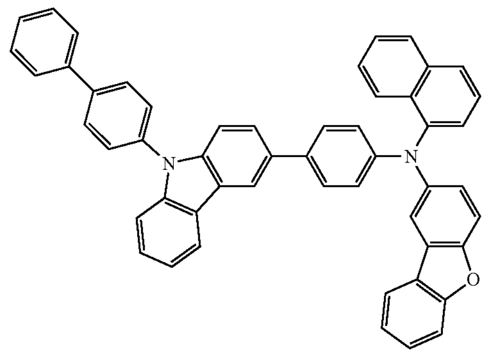
[A-73]
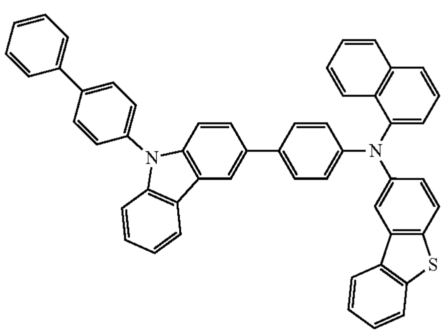
[A-74]
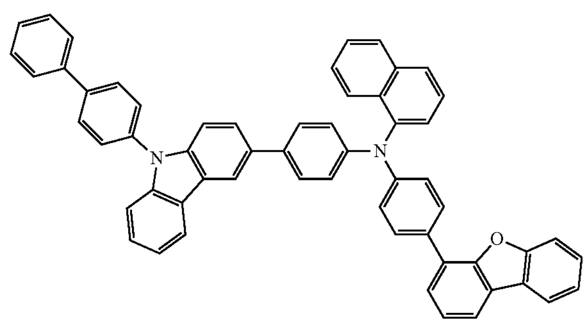
[A-75]
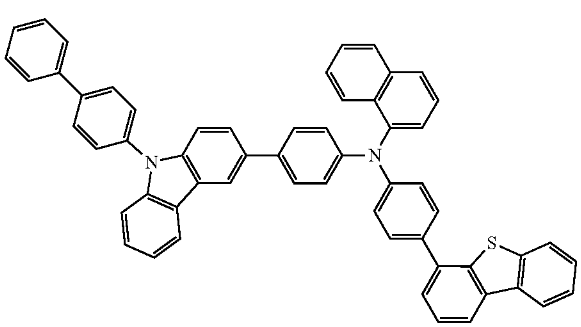
[A-76]
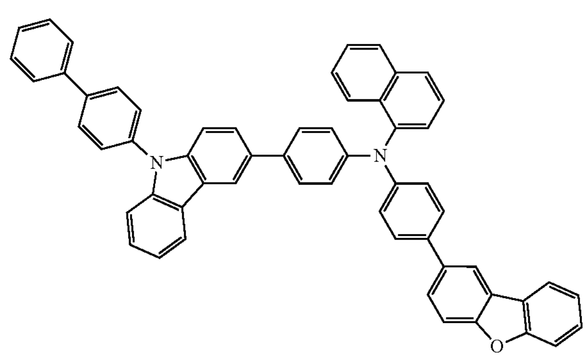

-continued
[A-77]
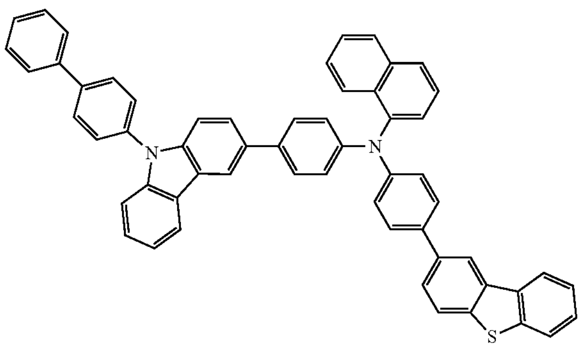
[A-78]
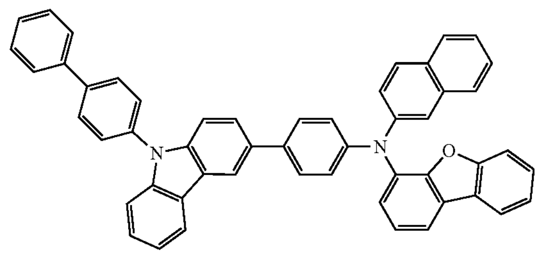
[A-79]
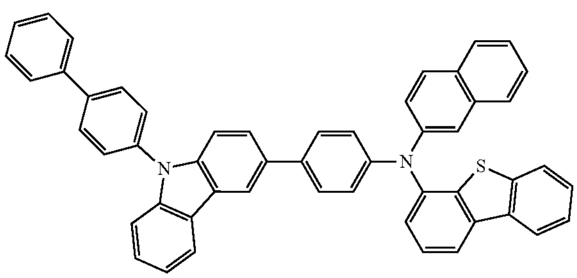
[A-80]
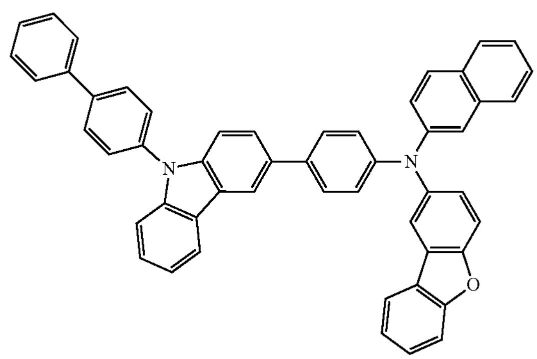
[A-81]
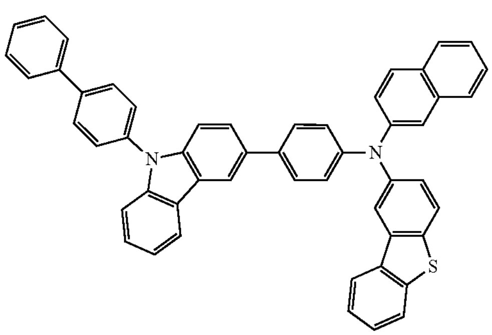
[A-82]
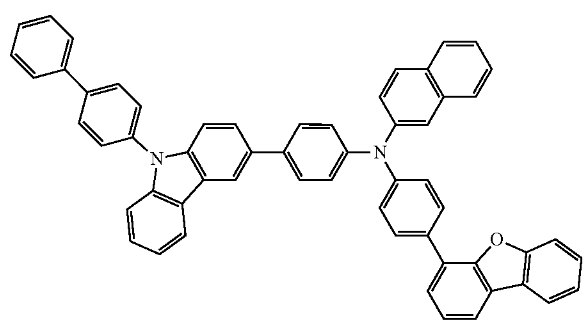
[A-83]
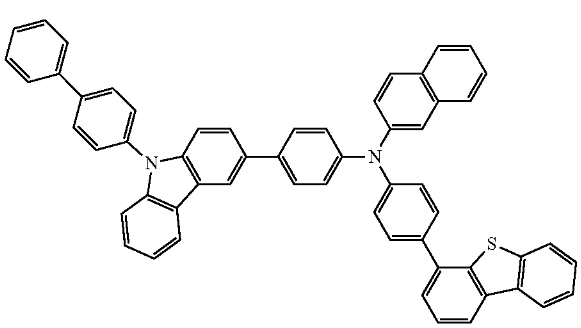
[A-84]
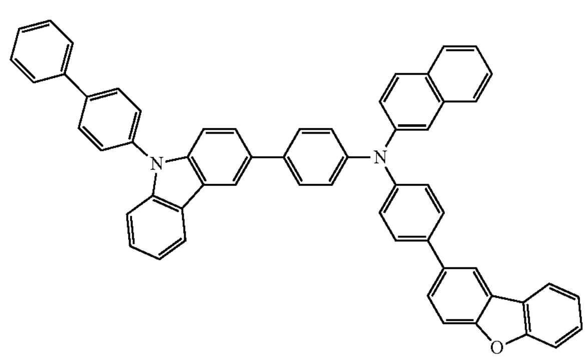

-continued
[A-85]
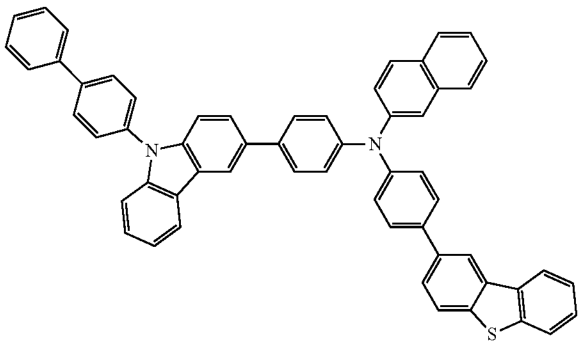
[A-86]
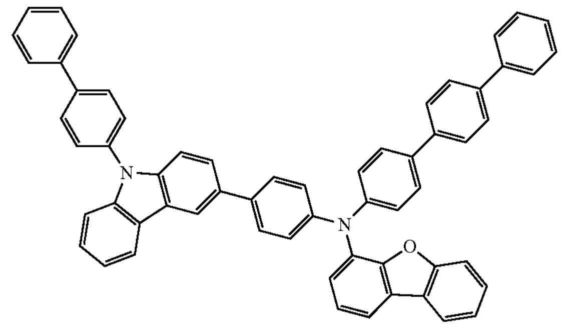
[A-87]
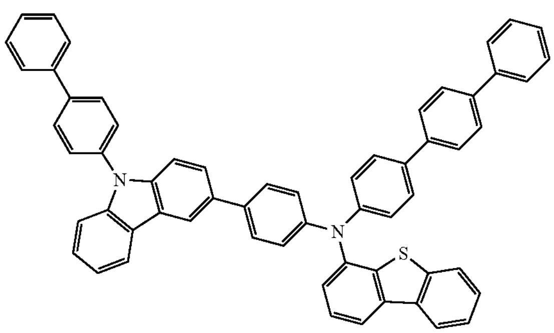
[A-88]
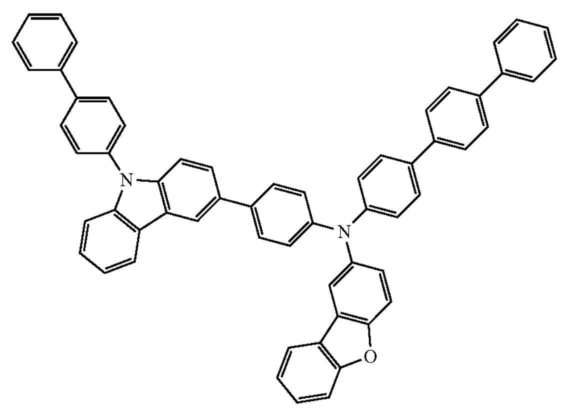
[A-89]
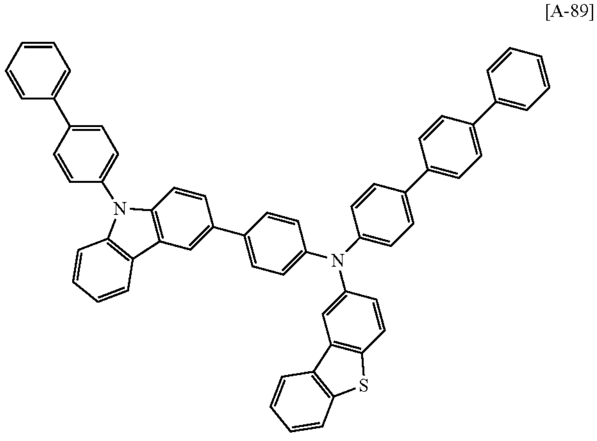
[A-90]
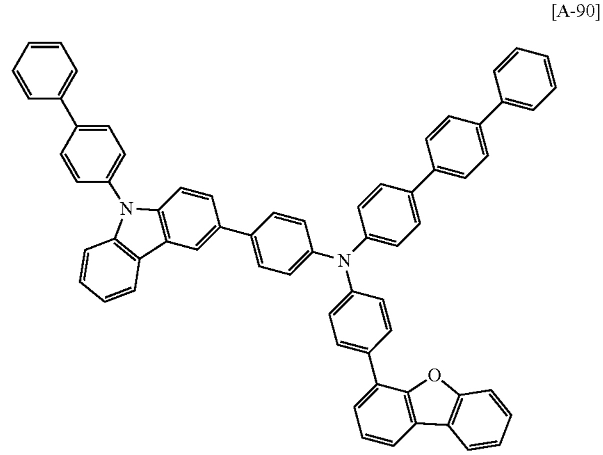

-continued
[A-91]
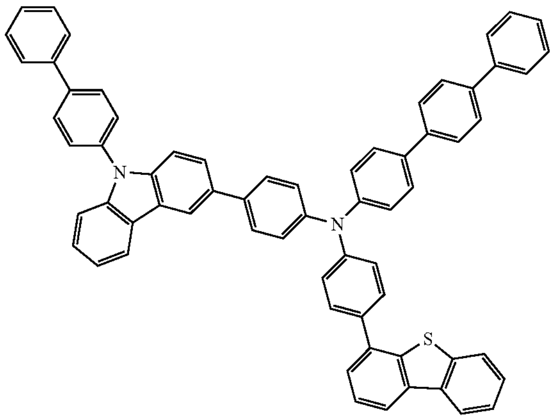
[A-92]
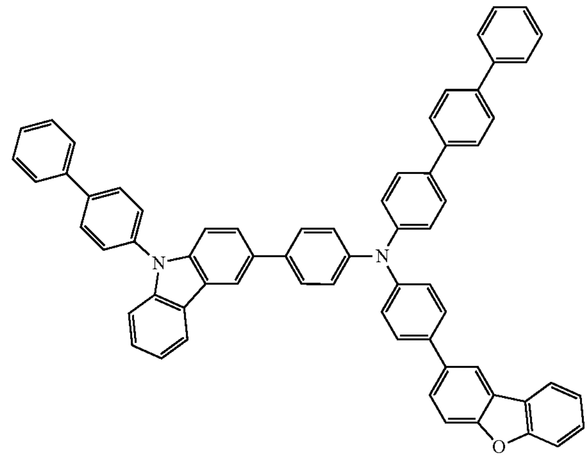
[A-93]
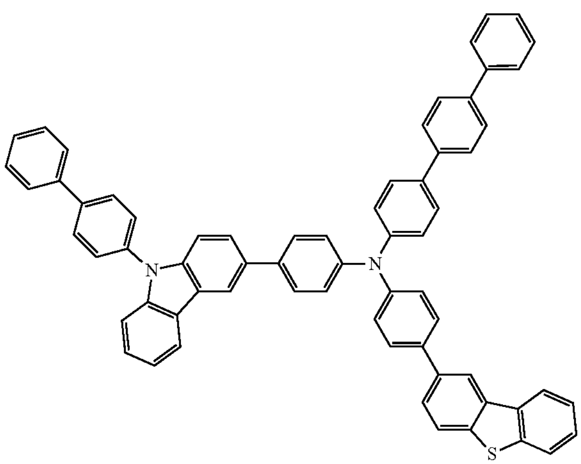
[A-94]
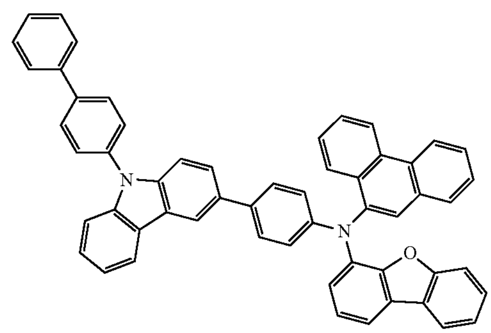
[A-95]
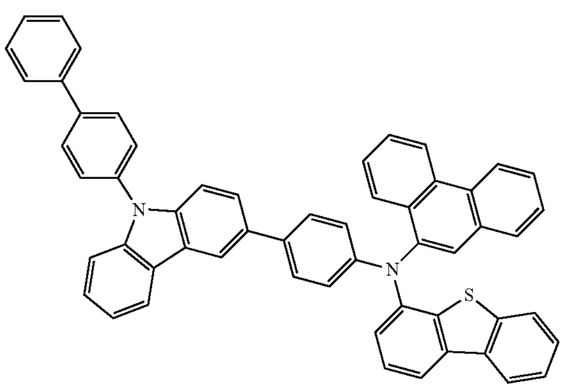
[A-96]
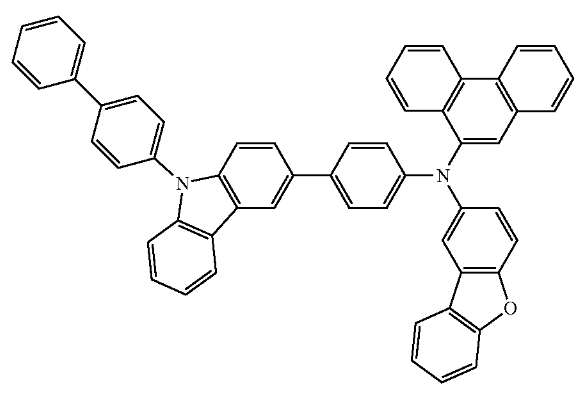

-continued
[A-97]
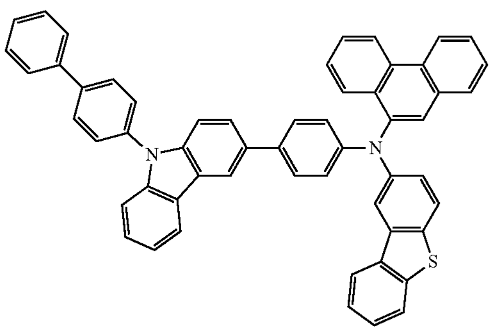
[A-98]
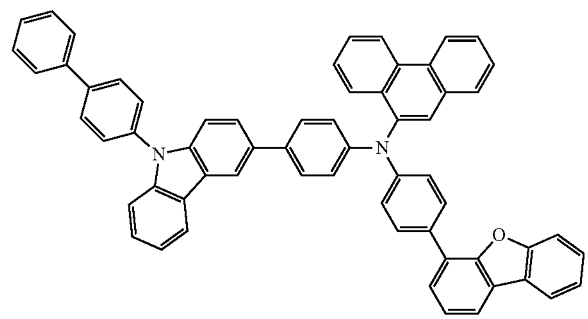
[A-99]
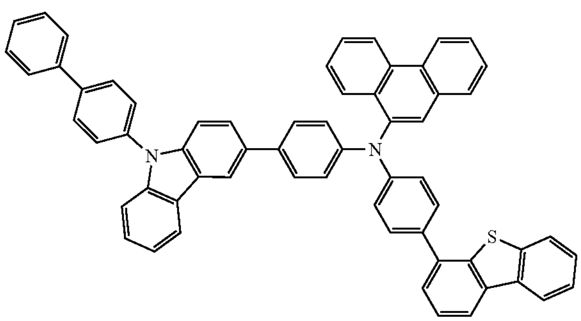
[A-100]
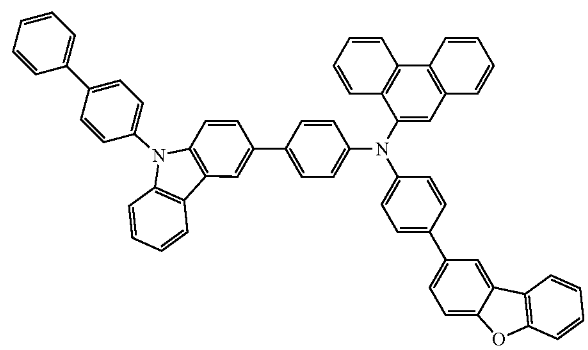
[A-101]
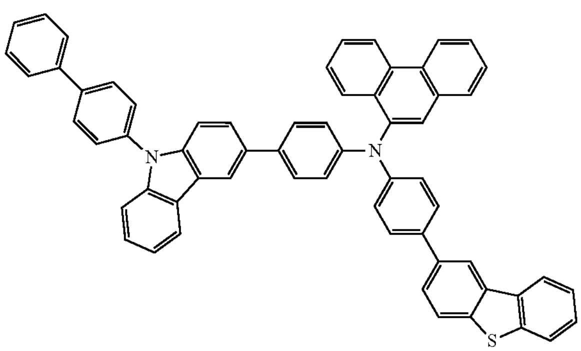
[A-102]
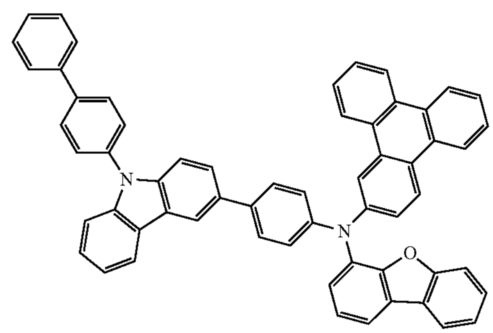
[A-103]
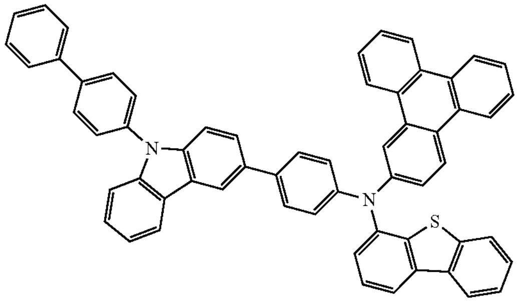
[A-104]
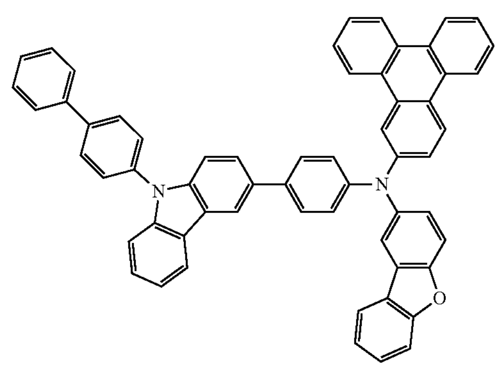

-continued
[A-105]
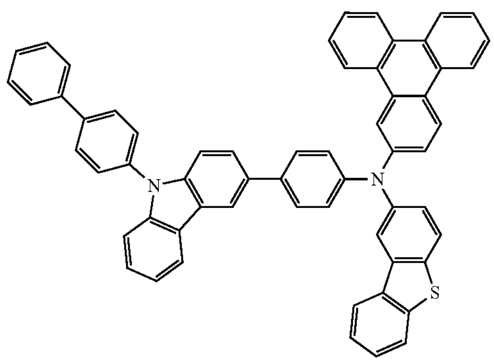
[A-106]
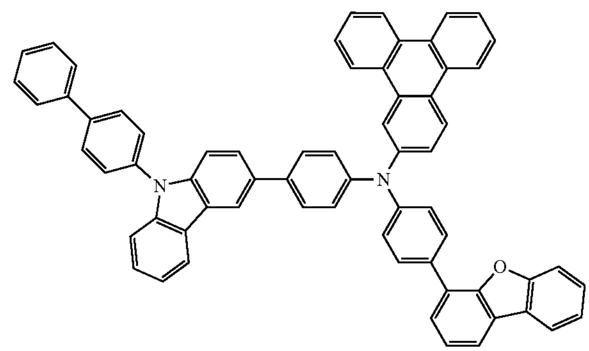
[A-107]
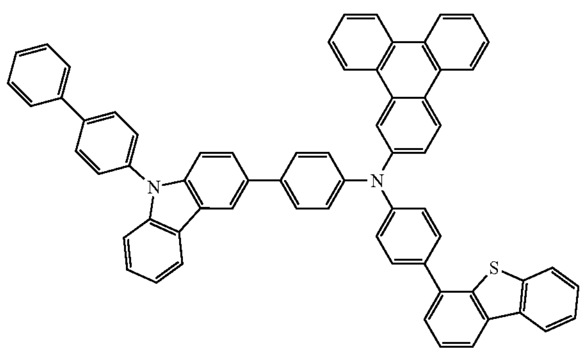
[A-108]
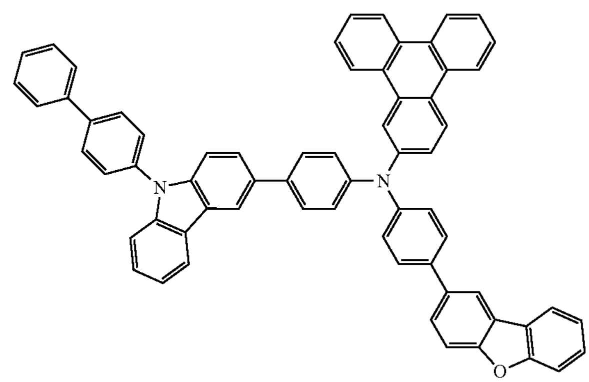
[A-109]
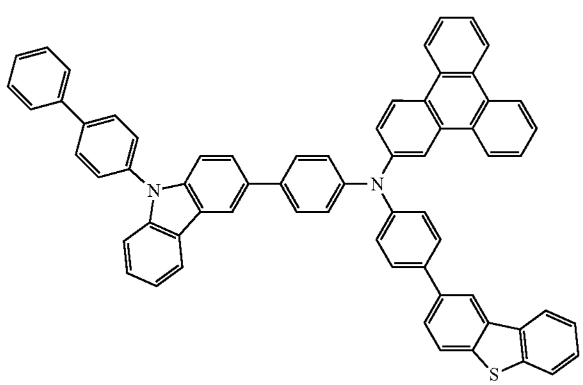
[A-110]
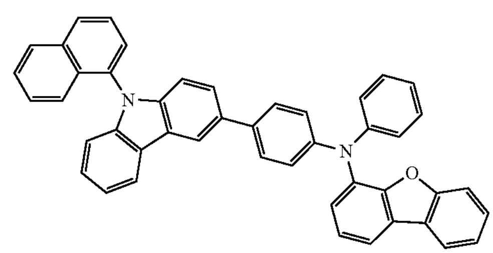
[A-111]
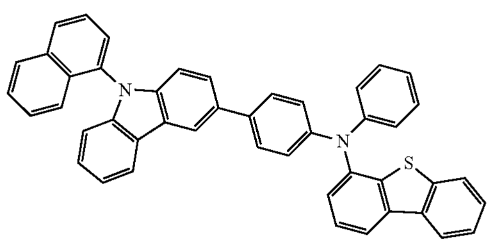
[A-112]
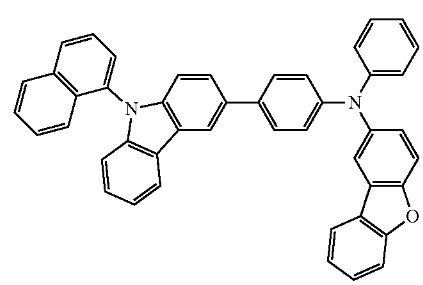

-continued
[A-113]
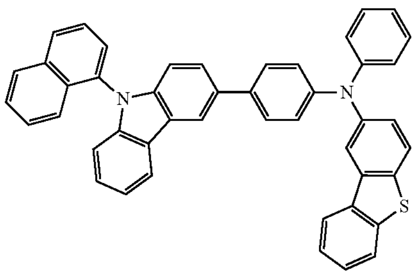
[A-114]
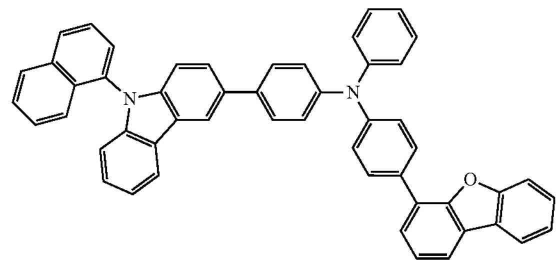
[A-115]
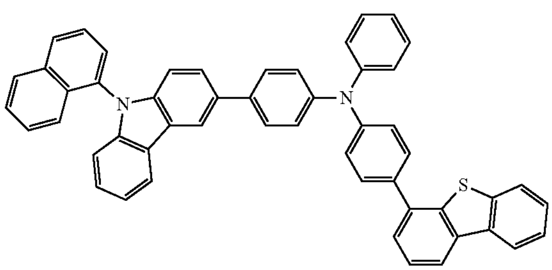
[A-116]
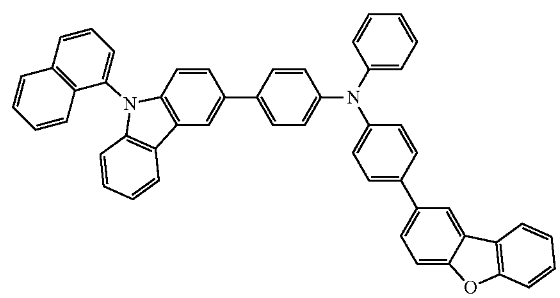
[A-117]
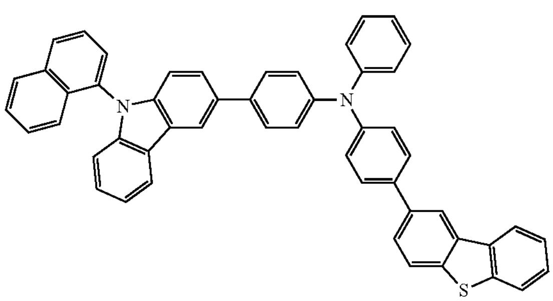
[A-118]
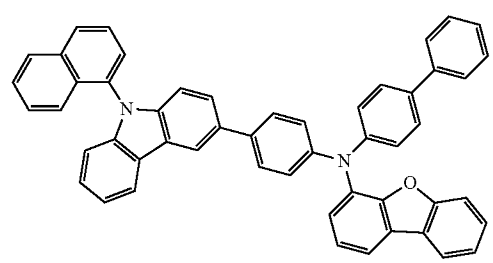
[A-119]
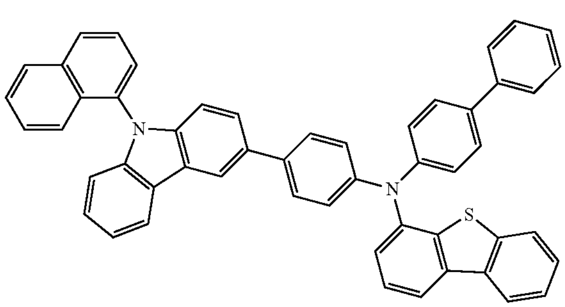
[A-120]
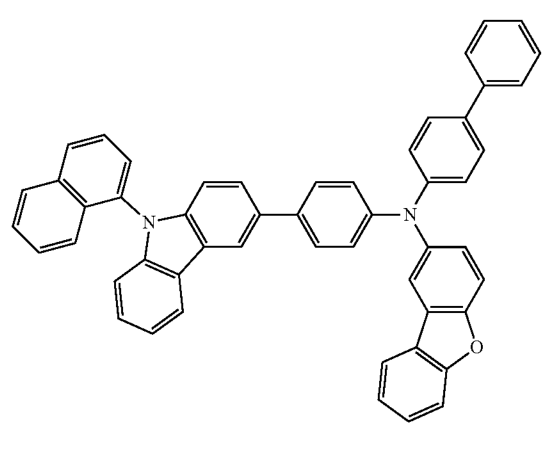

-continued
[A-121]
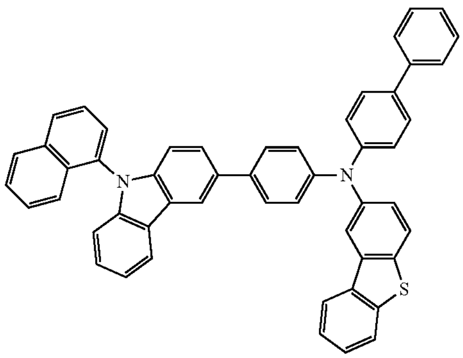
[A-122]
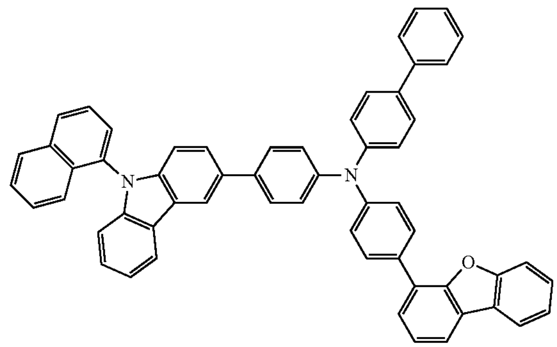
[A-123]
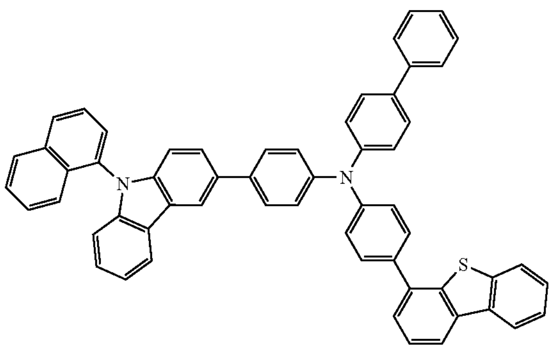
[A-124]
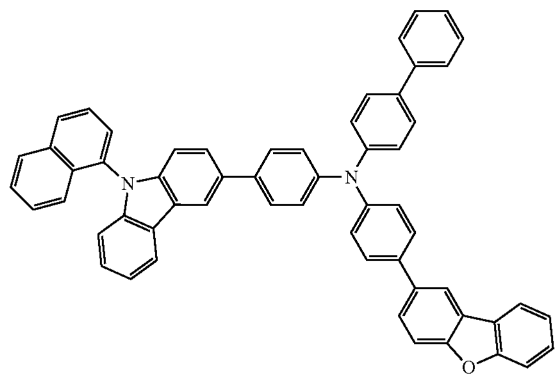
[A-125]
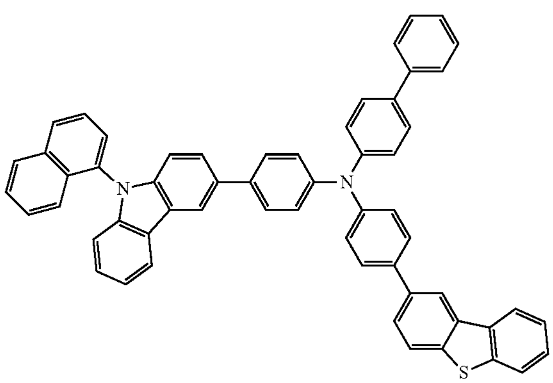
[A-126]
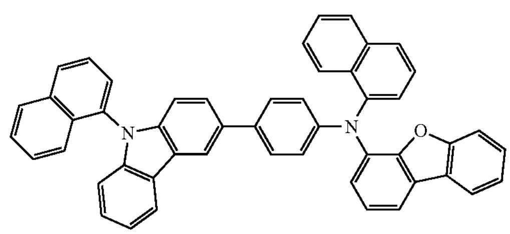
[A-127]
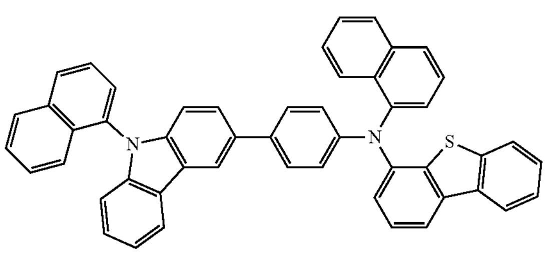
[A-128]
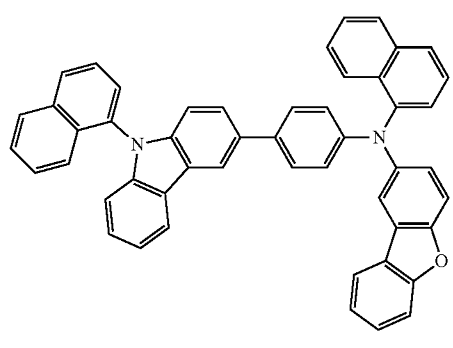

-continued
[A-129]
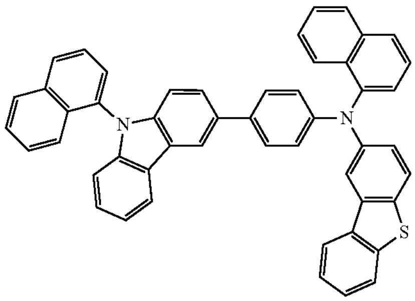
[A-130]
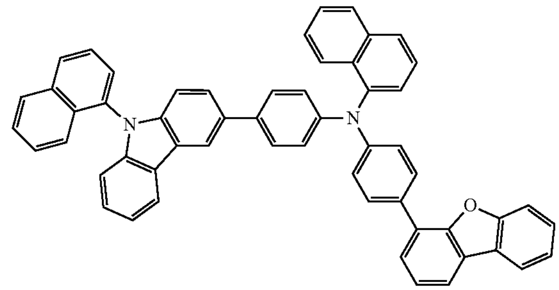
[A-131]
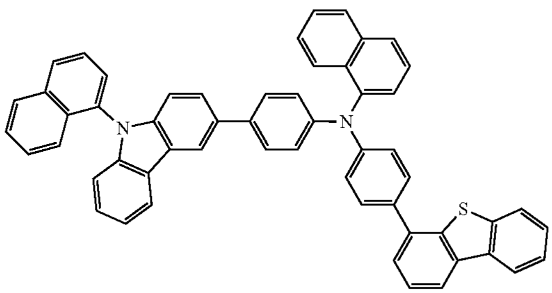
[A-132]
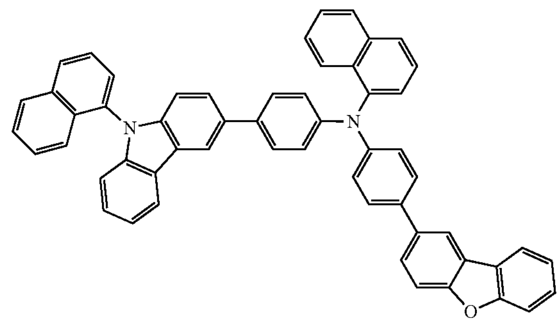
[A-133]
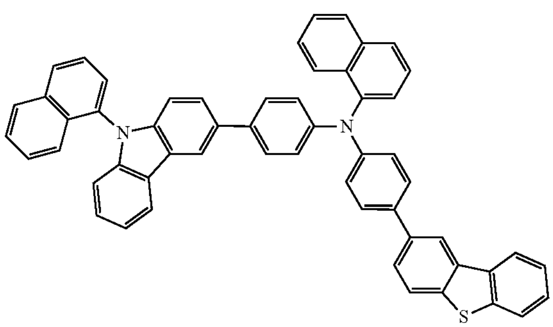
[A-134]
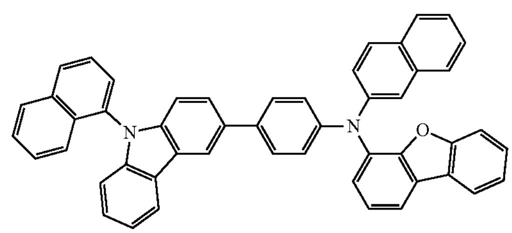
[A-135]
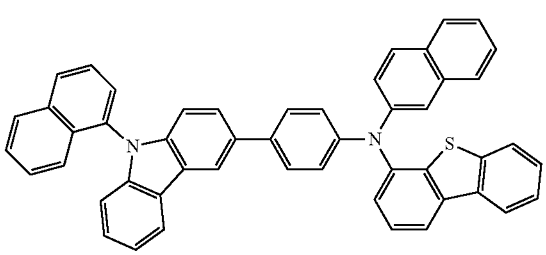
[A-136]
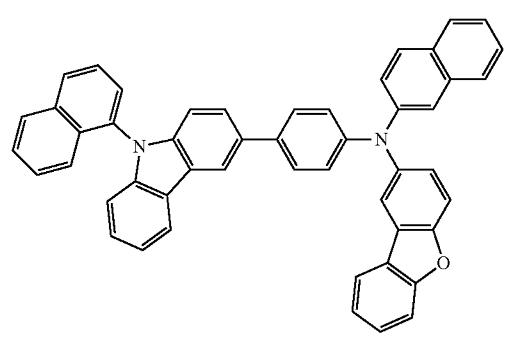

-continued
[A-137]
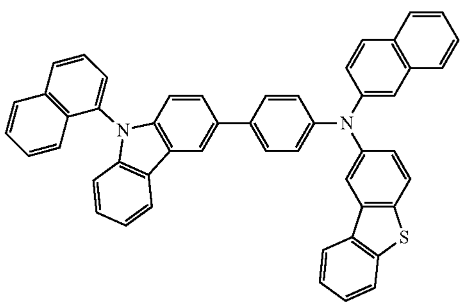
[A-138]
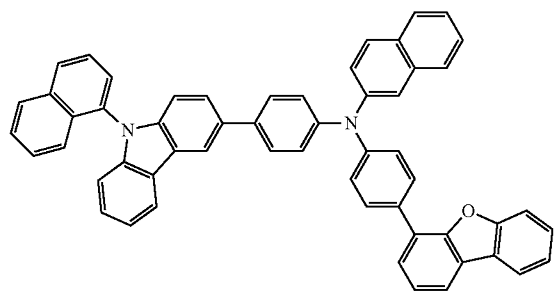
[A-139]
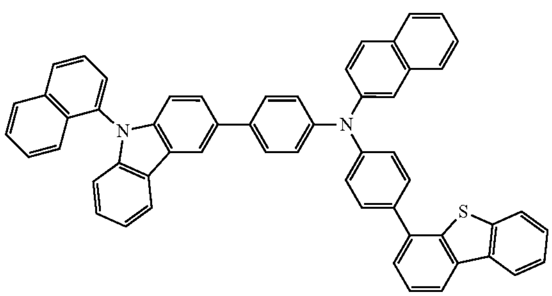
[A-140]
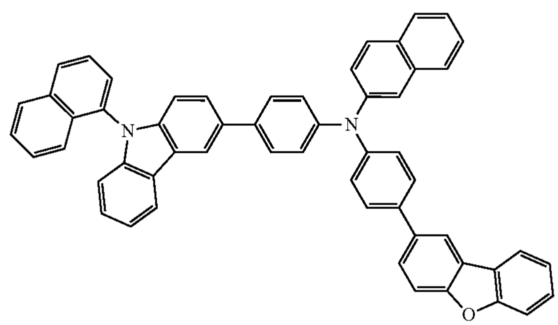
[A-141]
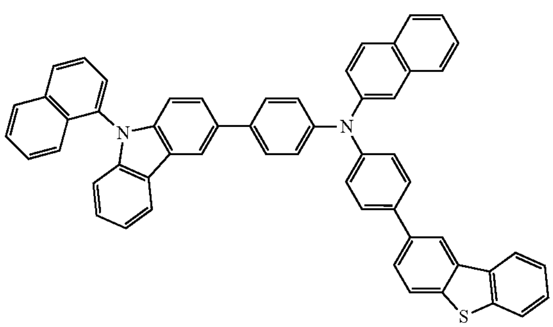
[A-142]
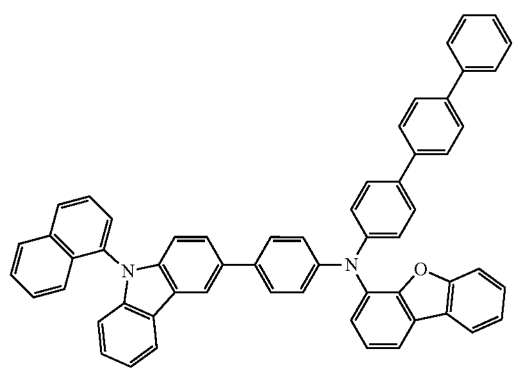
[A-143]
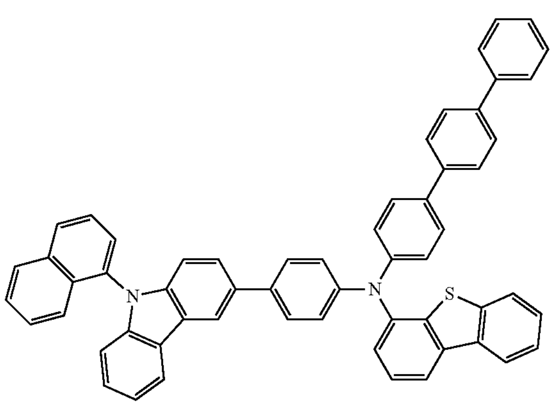
[A-144]
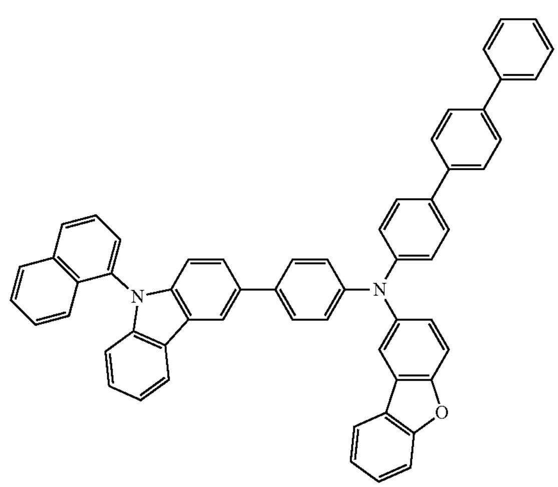

-continued
[A-145]
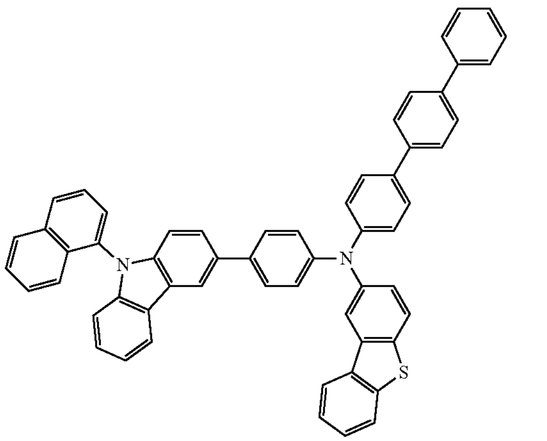
[A-146]
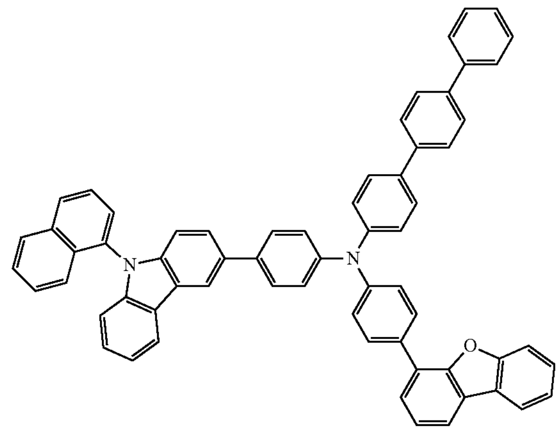
[A-147]
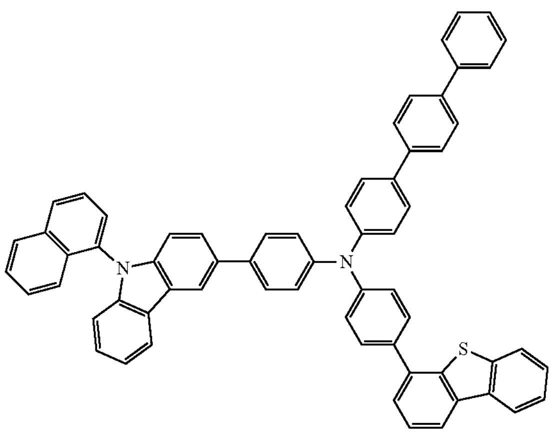
[A-148]
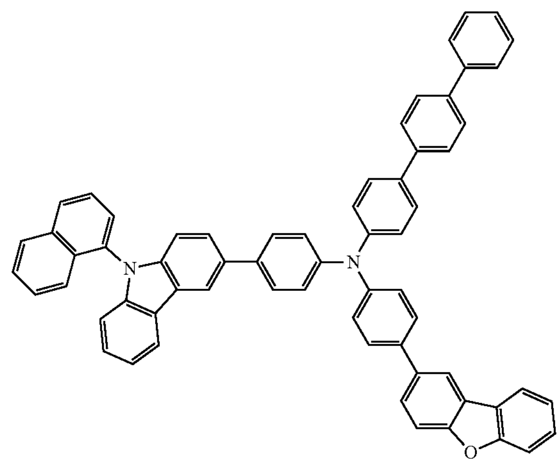
[A-149]
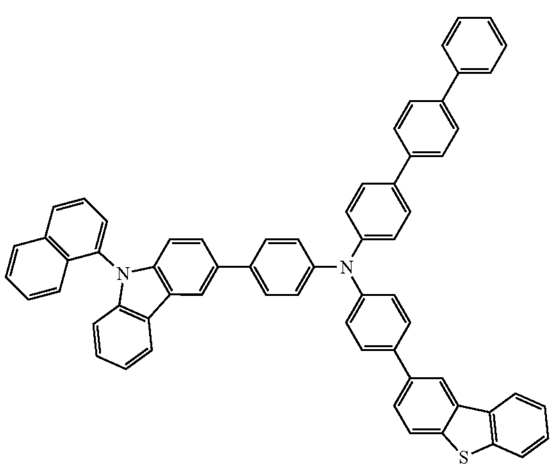
[A-150]
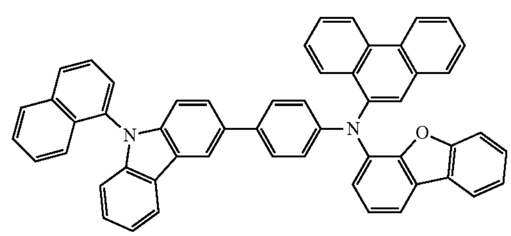

-continued
[A-151]
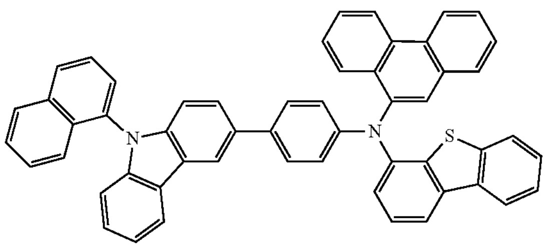
[A-152]
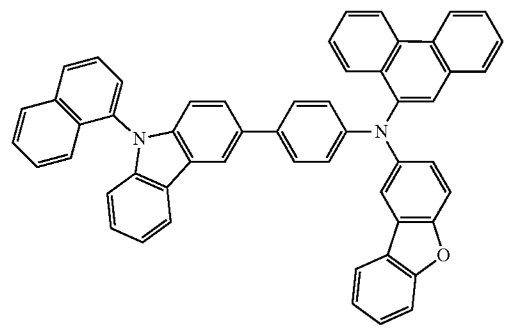
[A-153]
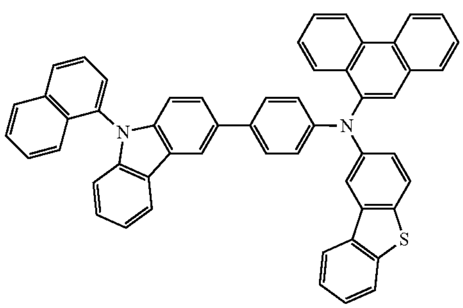
[A-154]
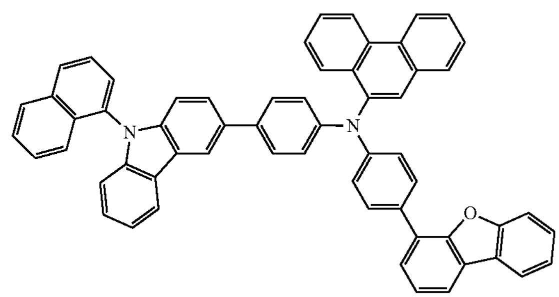
[A-155]
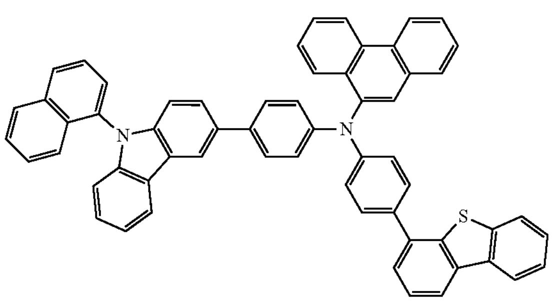
[A-156]
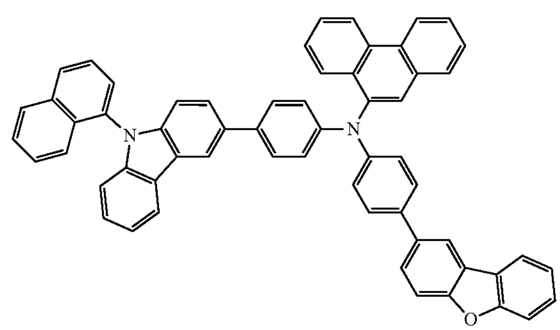
[A-157]
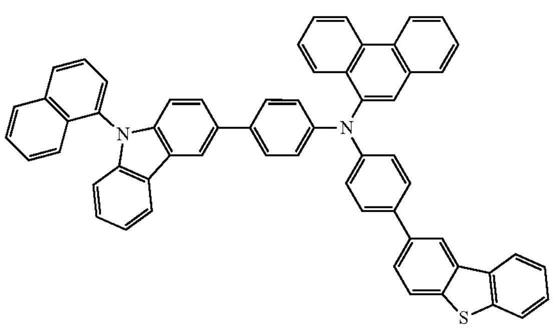
[A-158]
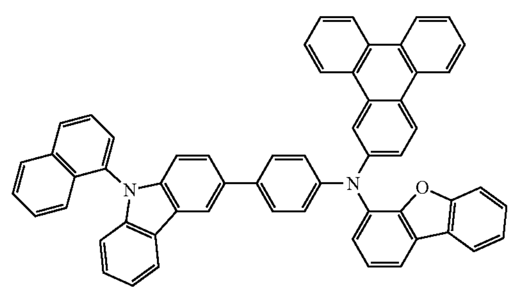

-continued
[A-159]
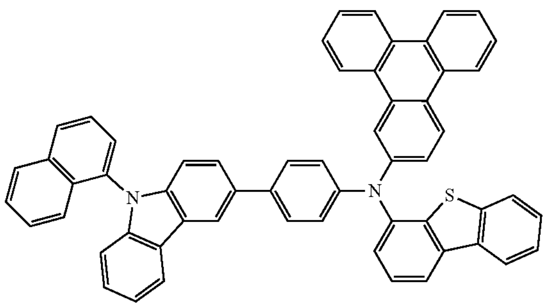
[A-160]
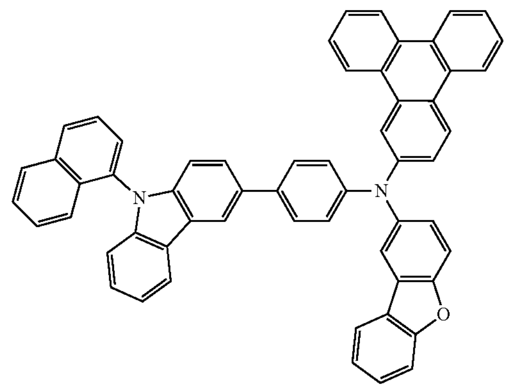
[A-161]
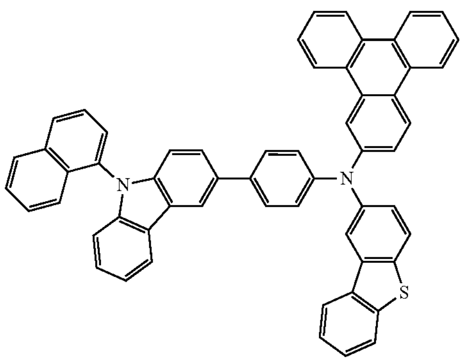
[A-162]
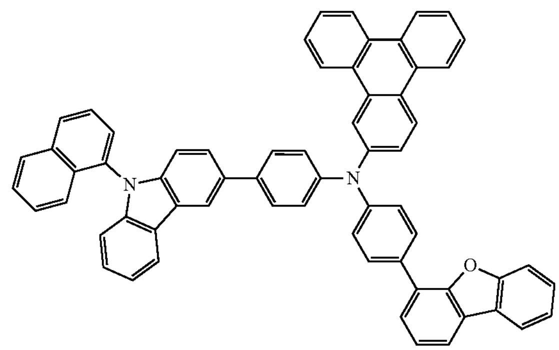
[A-163]
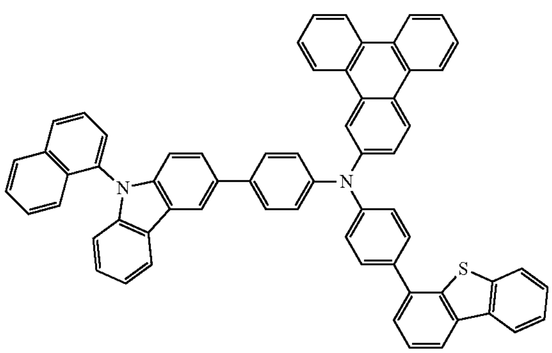
[A-164]
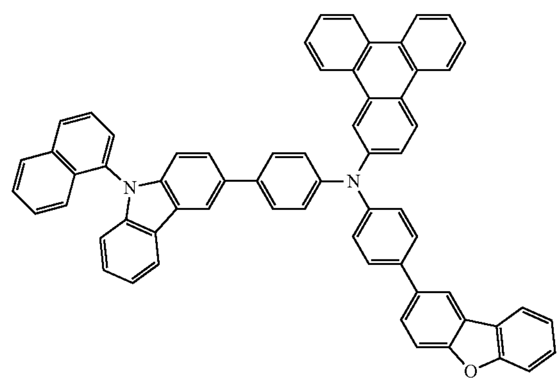
[A-165]
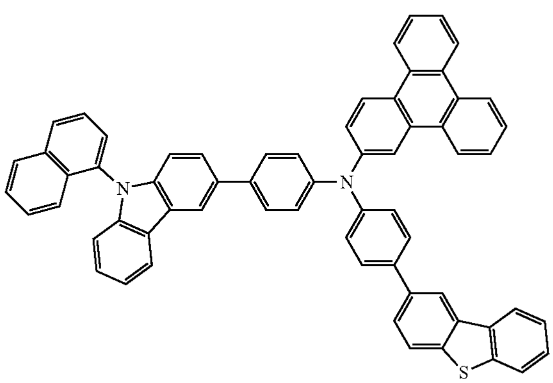
[A-166]
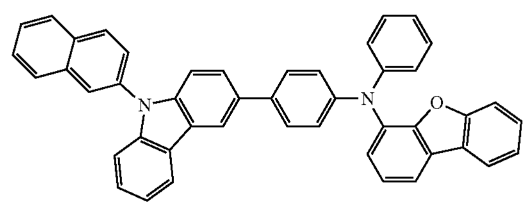

-continued
[A-167]
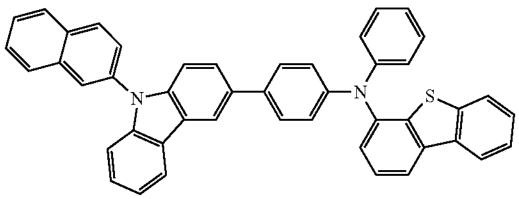
[A-168]
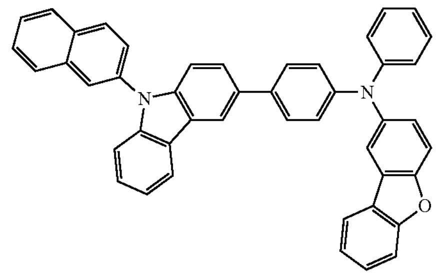
[A-169]
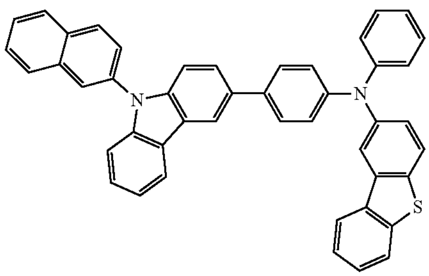
[A-170]
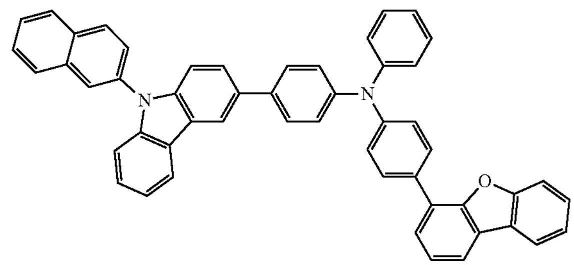
[A-171]
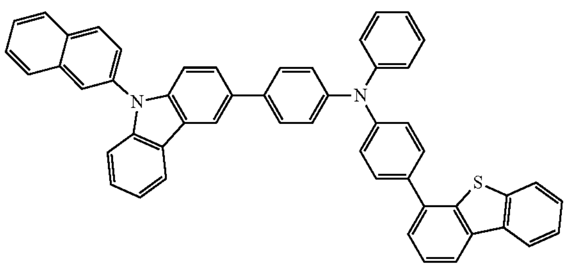
[A-172]
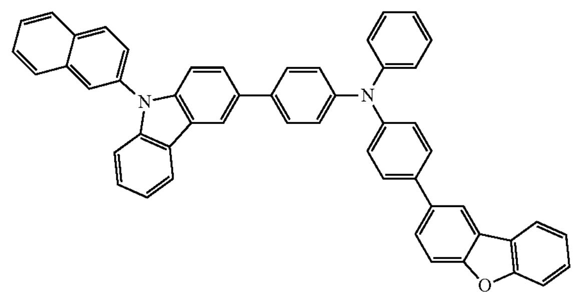
[A-173]
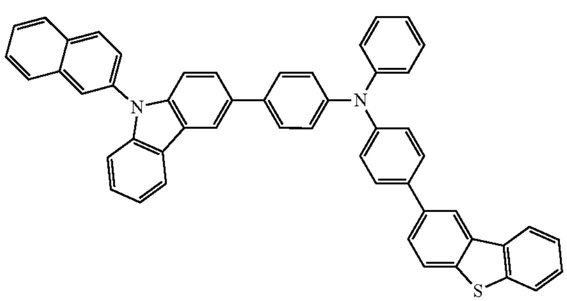
[A-174]
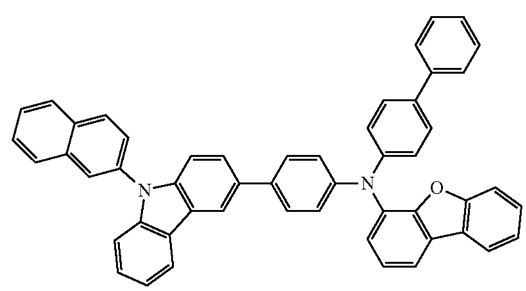
[A-175]
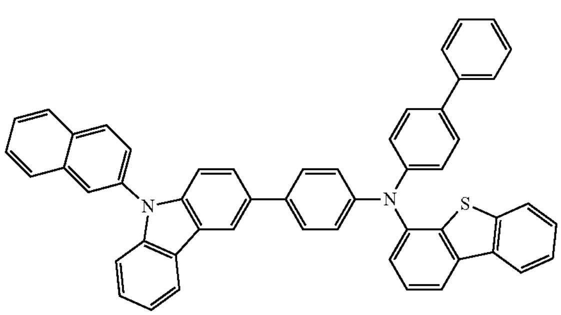
[A-176]
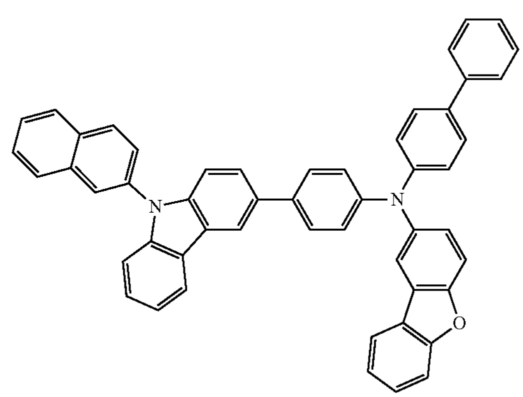

-continued
[A-177]
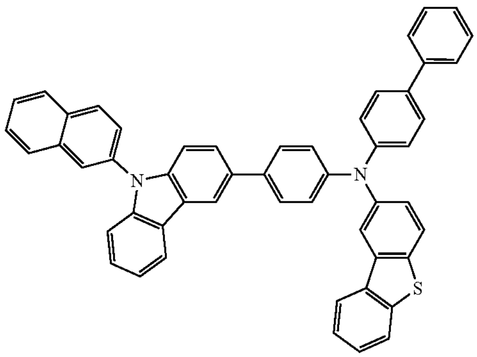
[A-178]
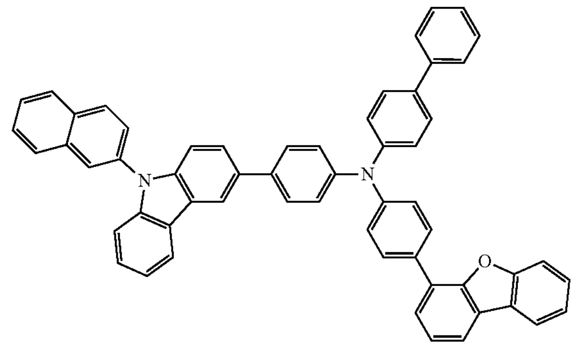
[A-179]
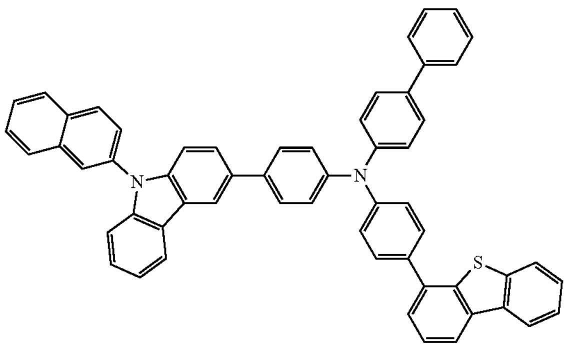
[A-180]
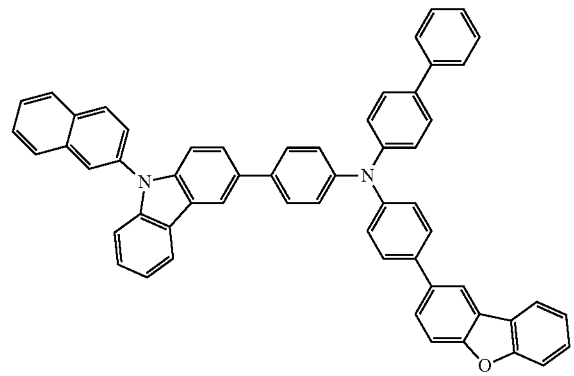
[A-181]
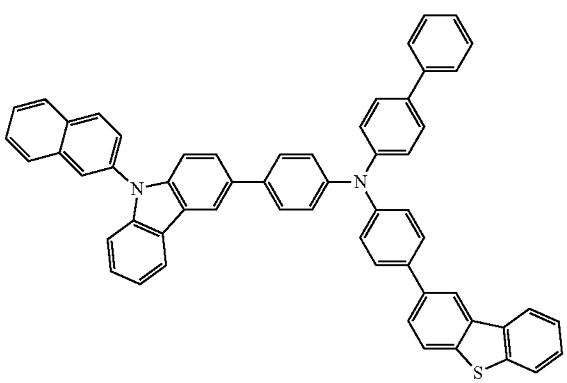
[A-182]
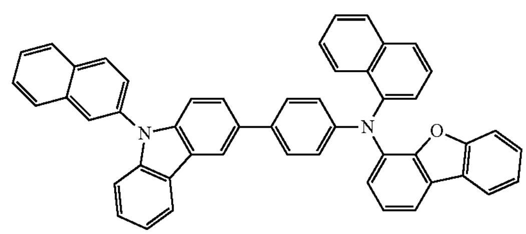
[A-183]
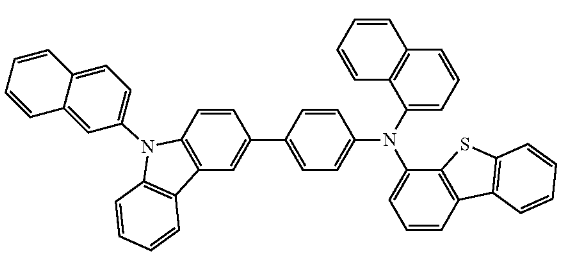
[A-184]
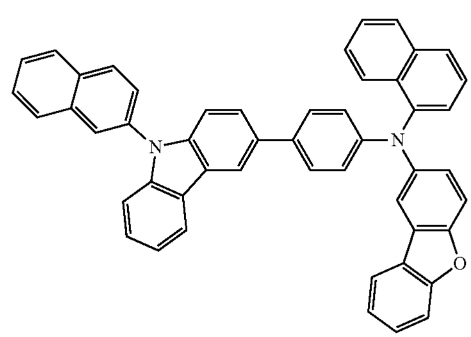

-continued
[A-185]
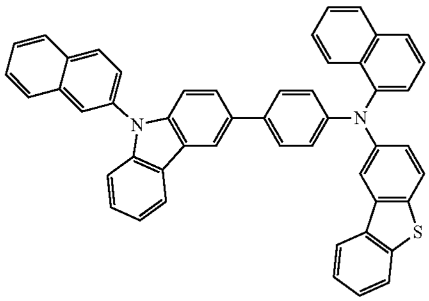
[A-186]
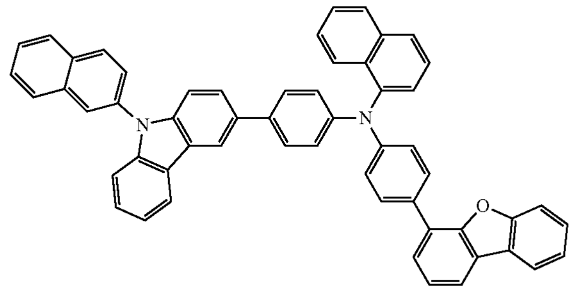
[A-187]
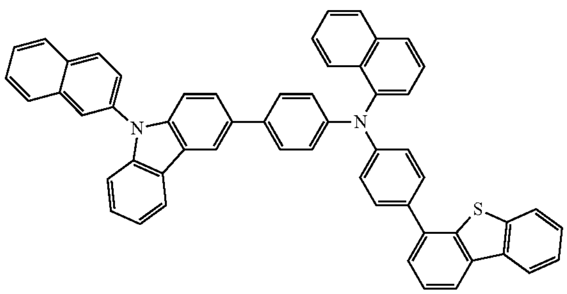
[A-188]
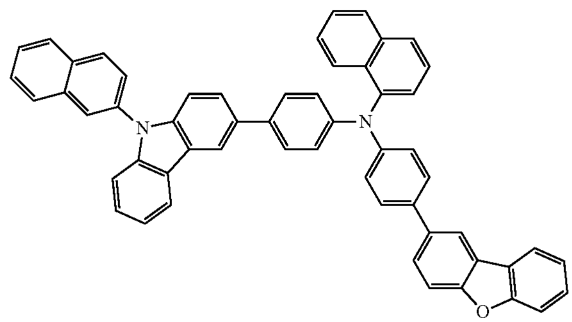
[A-189]
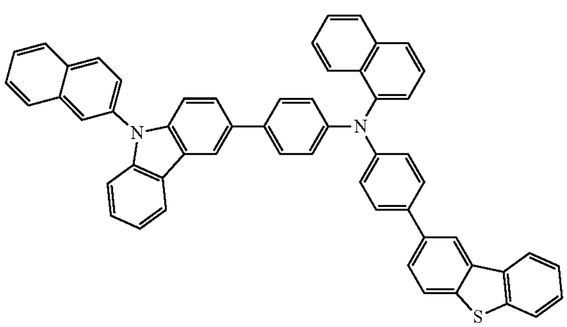
[A-190]
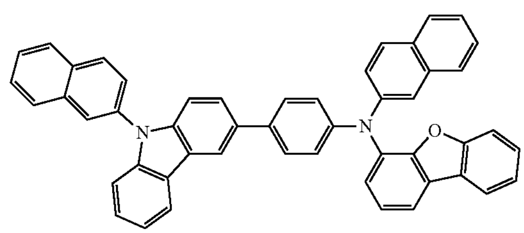
[A-191]
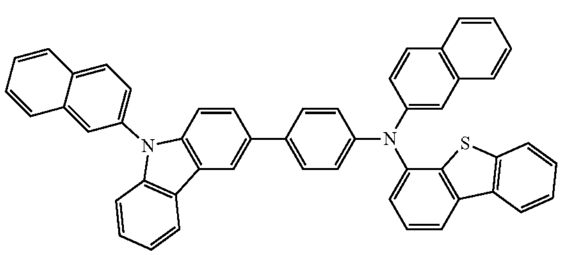
[A-192]
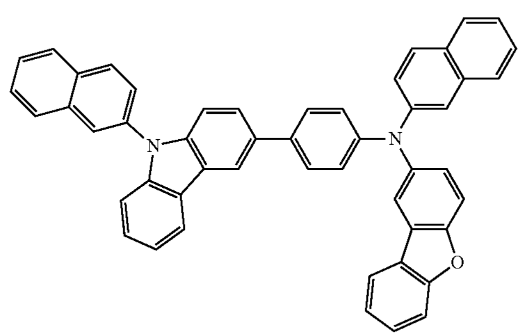

-continued
[A-193]
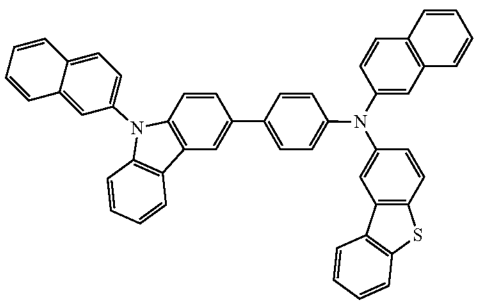
[A-194]
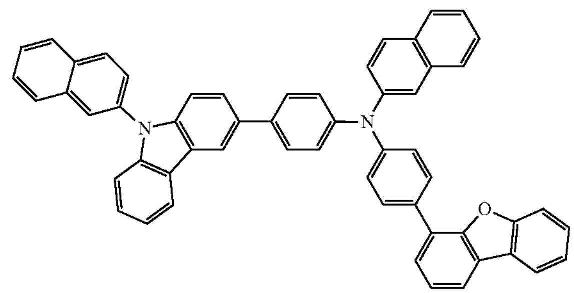
[A-195]
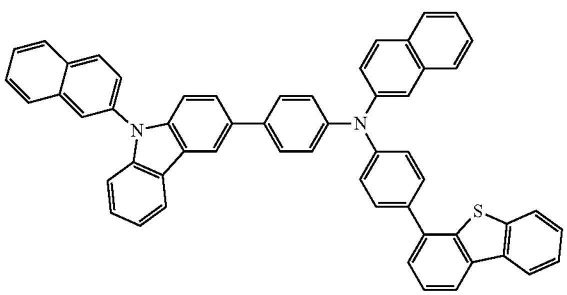
[A-196]
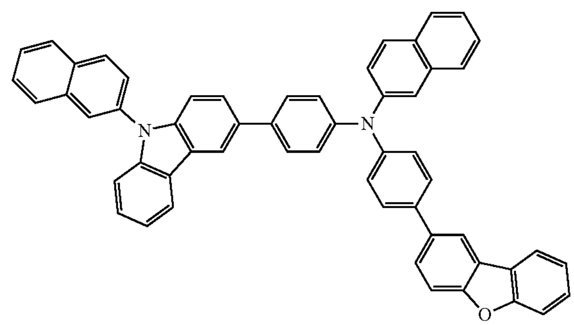
[A-197]
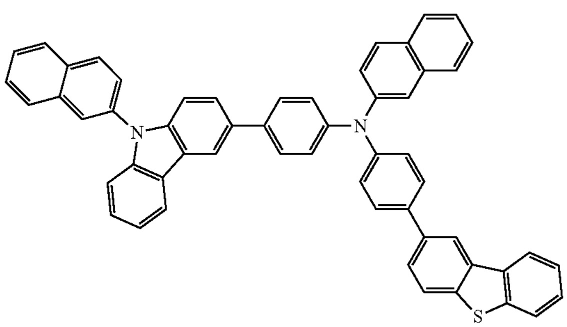
[A-198]
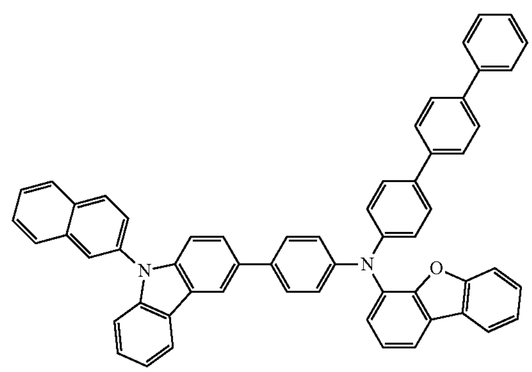
[A-199]
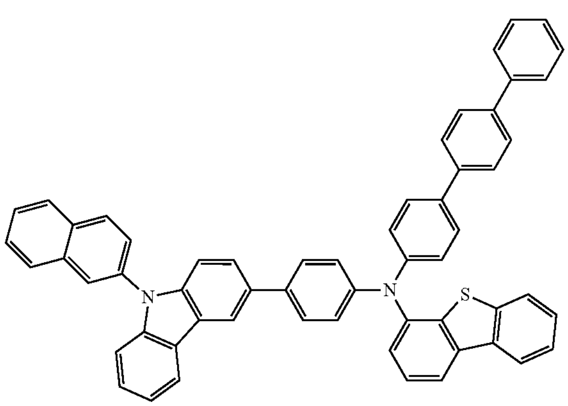
[A-200]
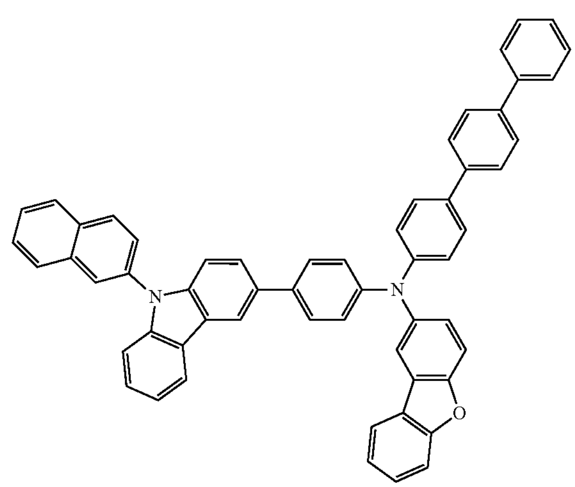

-continued
[A-201]
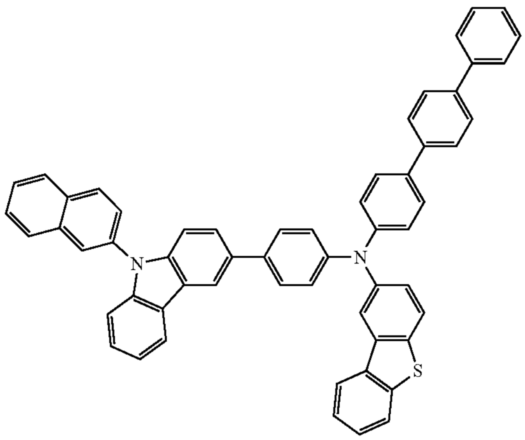
[A-202]
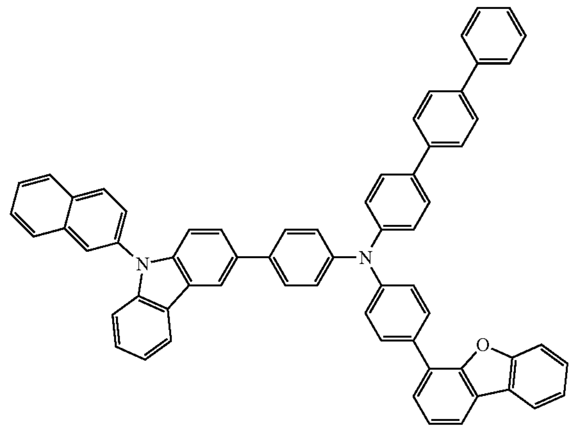
[A-203]
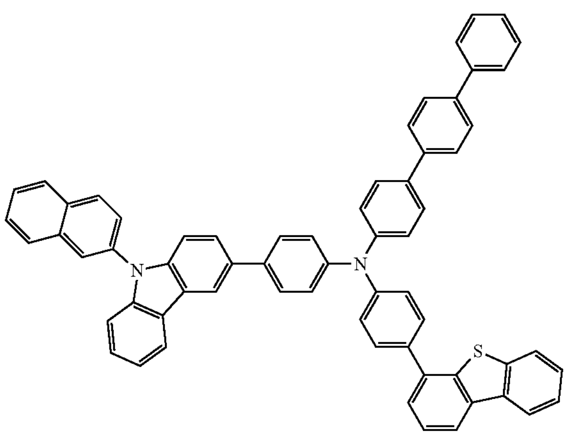
[A-204]
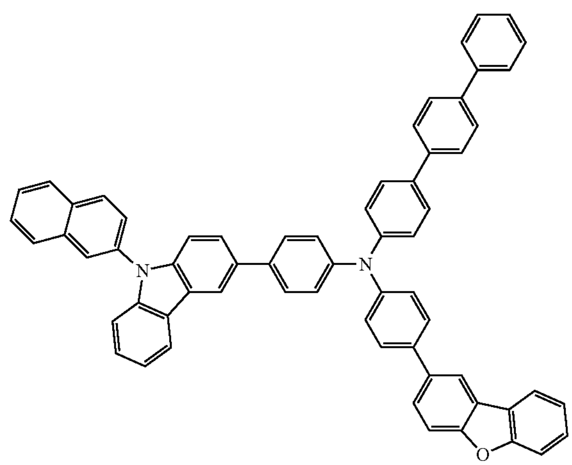
[A-205]
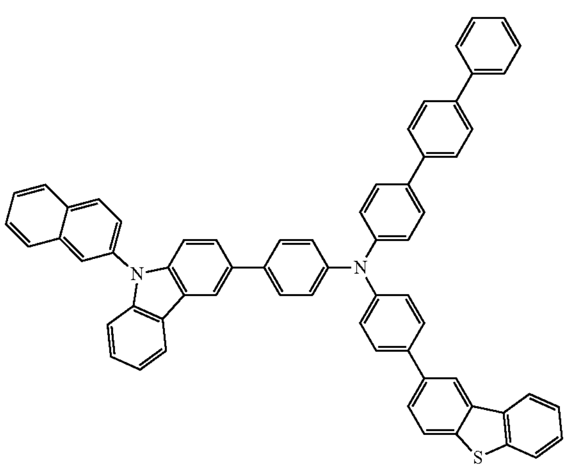
[A-206]
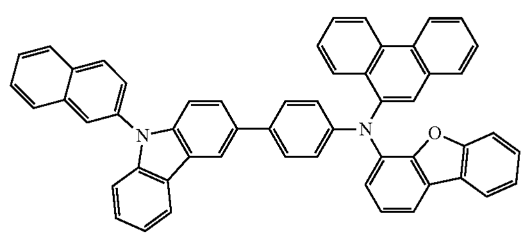

-continued
[A-207]
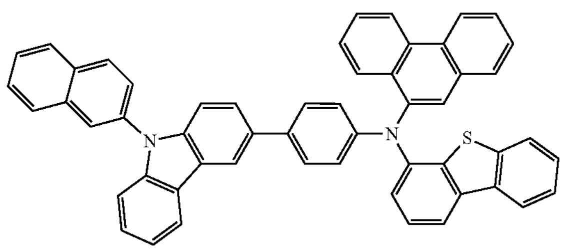
[A-208]
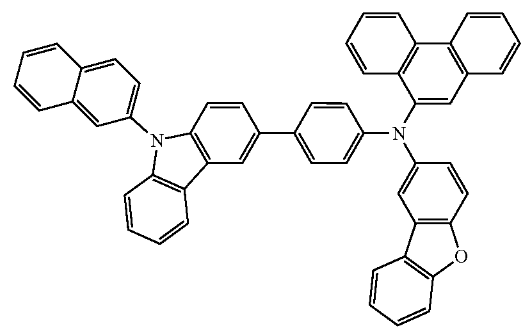
[A-209]
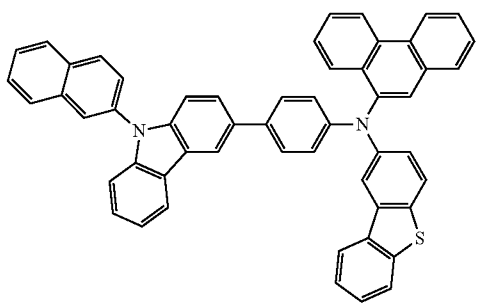
[A-210]
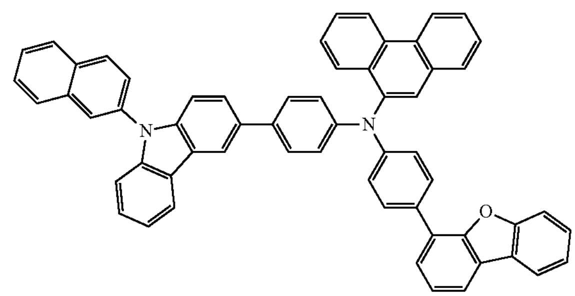
[A-211]
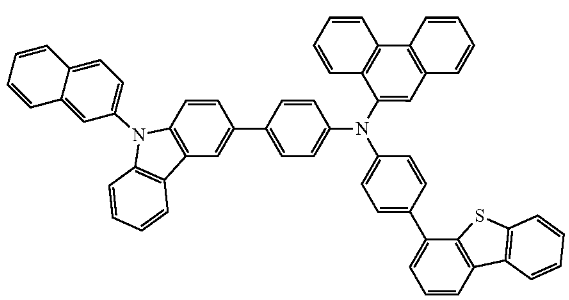
[A-212]
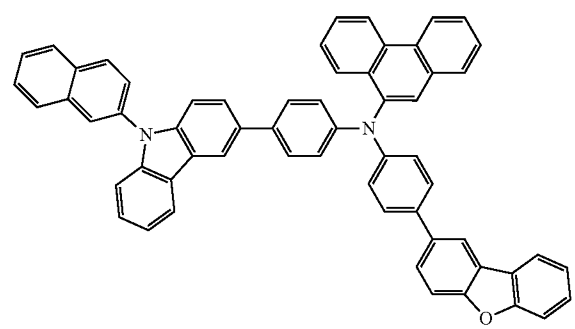
[A-213]
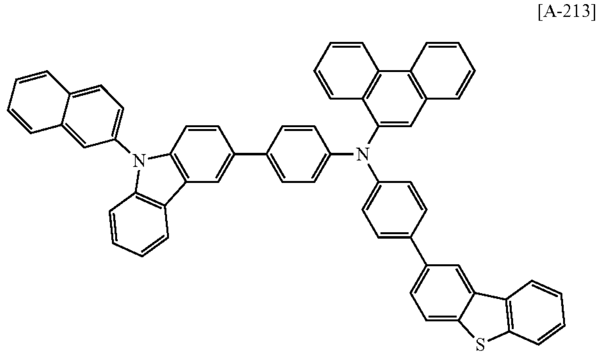
[A-214]
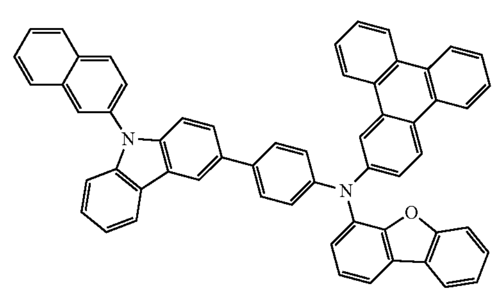

-continued
[A-215]
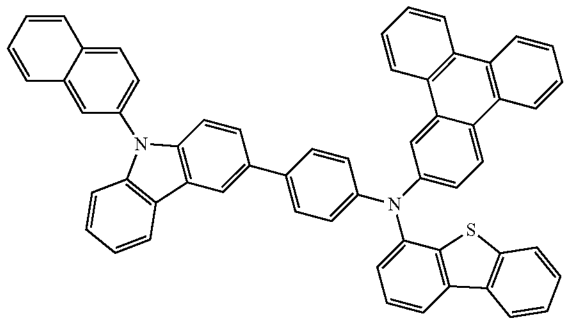
[A-216]
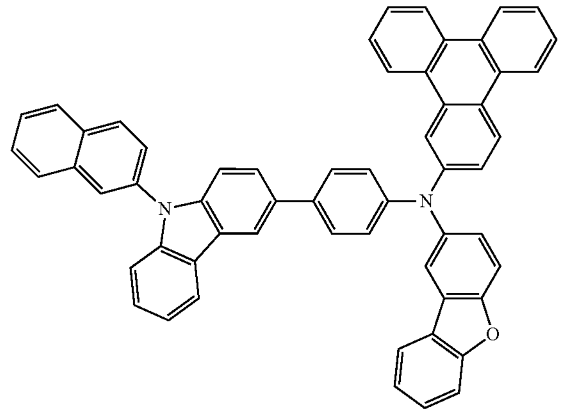
[A-217]
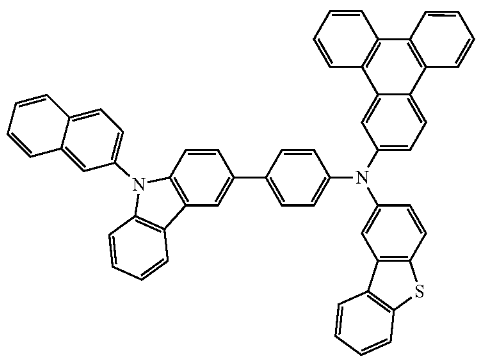
[A-218]
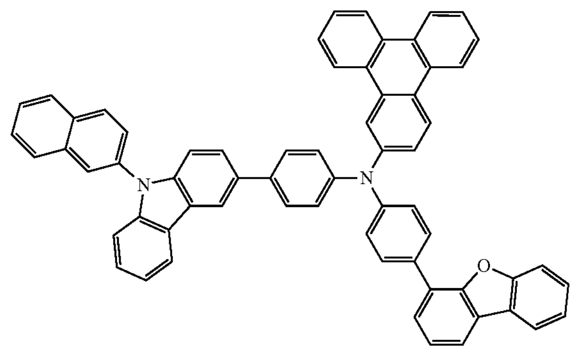
[A-219]
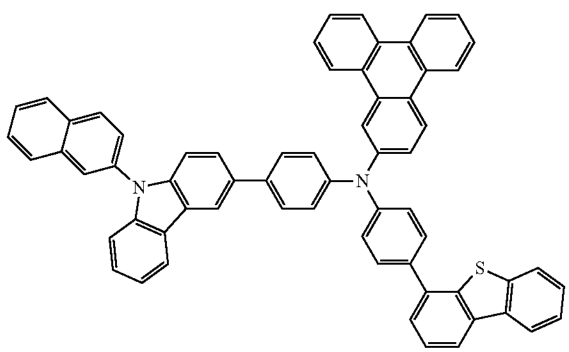
[A-220]
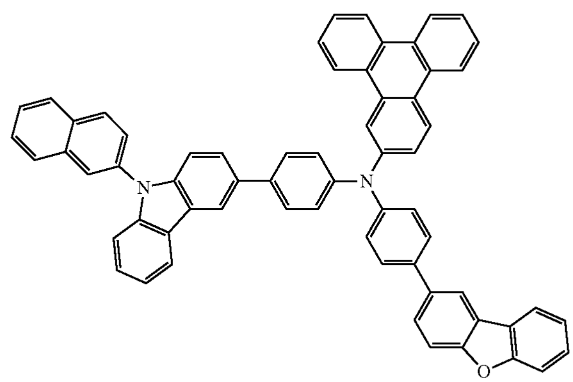
[A-221]
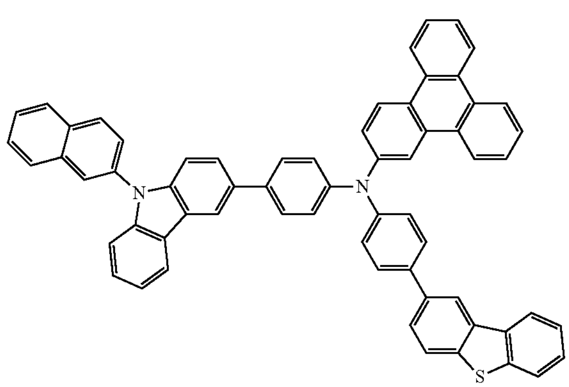
[A-222]
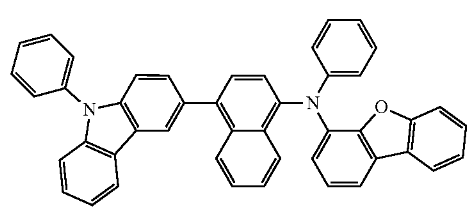

-continued
[A-223]
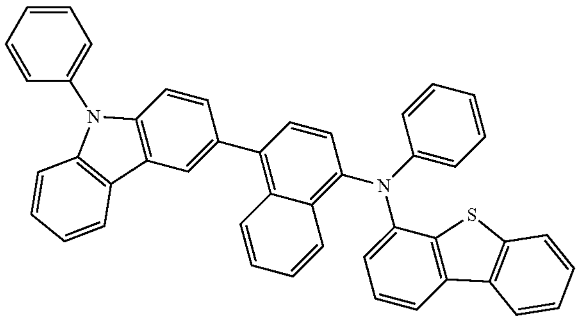
[A-224]
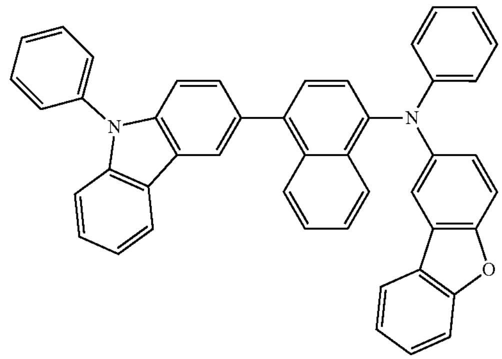
[A-225]
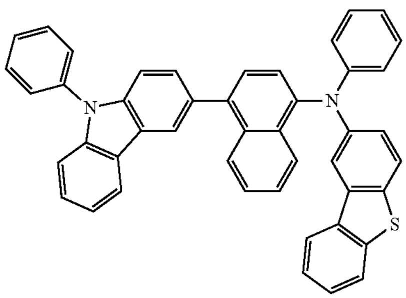
[A-226]
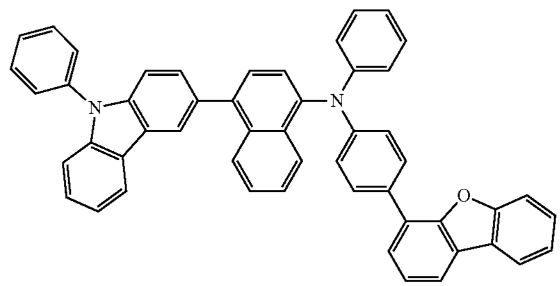
[A-227]
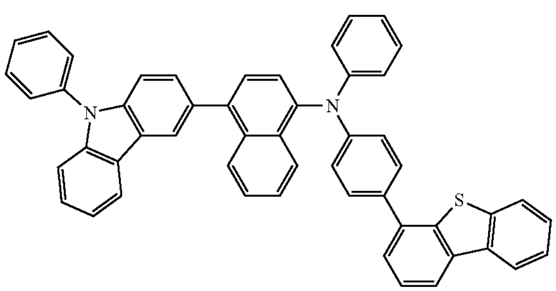
[A-228]
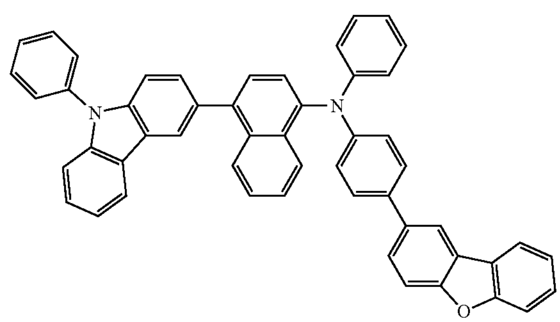
[A-229]
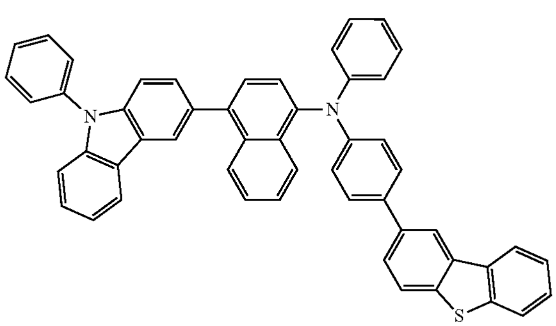
[A-230]
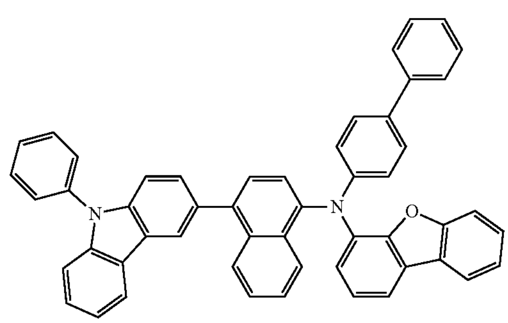

-continued
[A-231]
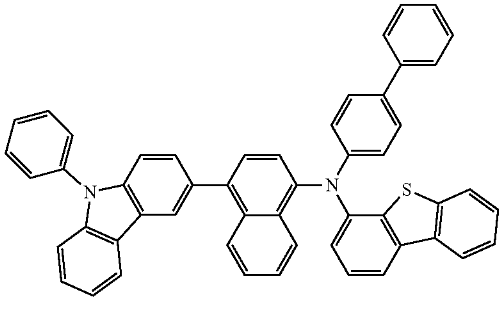
[A-232]
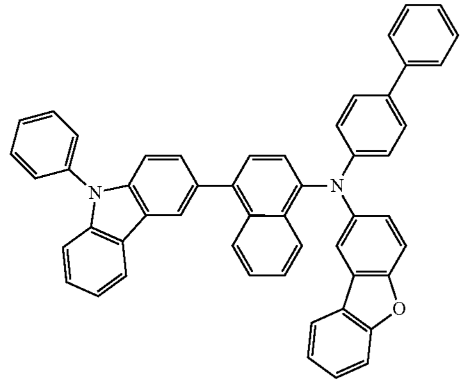
[A-233]
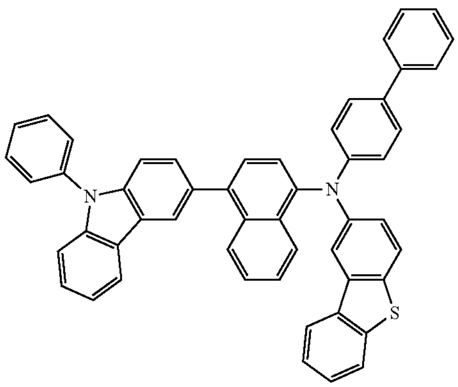
[A-234]
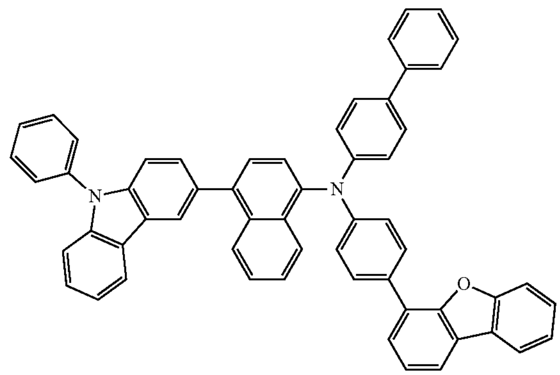
[A-235]
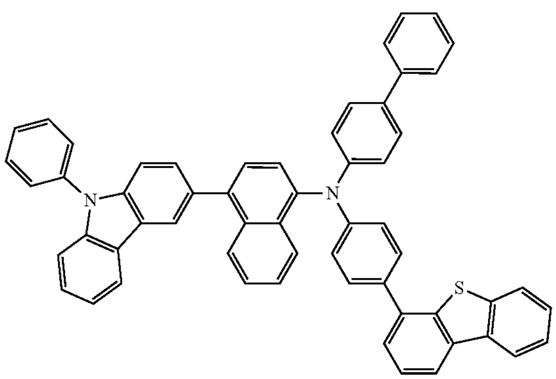
[A-236]
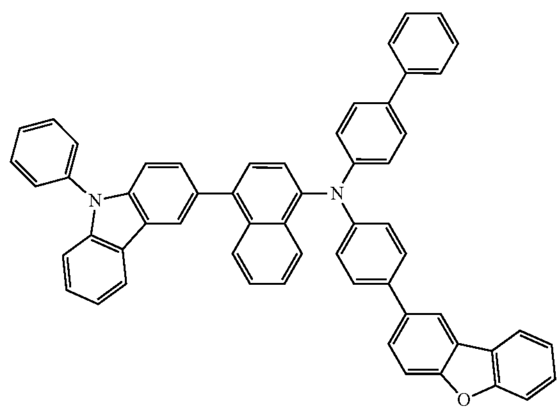
[A-237]
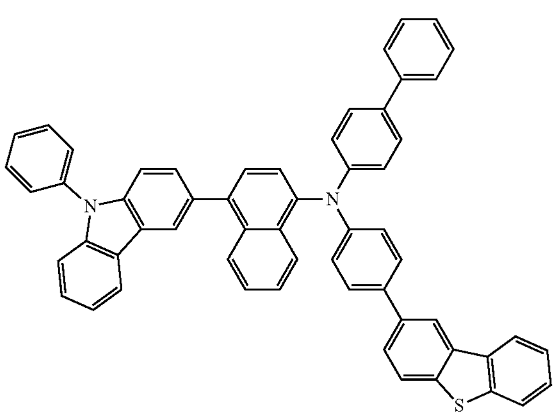
[A-238]
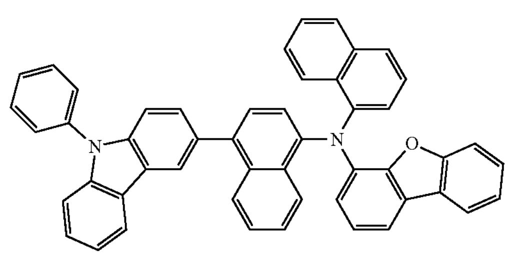

-continued
[A-239]
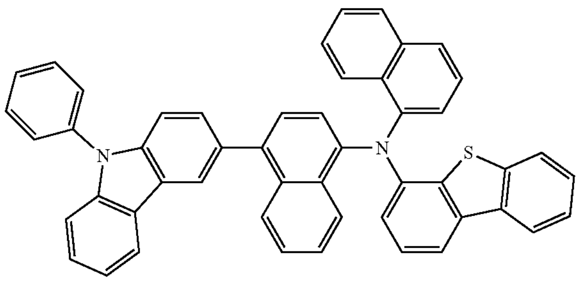
[A-240]
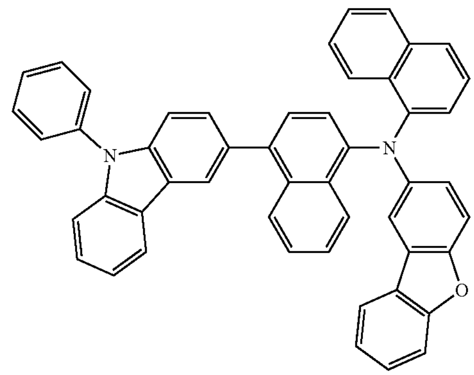
[A-241]
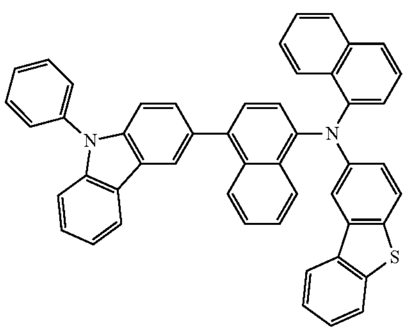
[A-242]
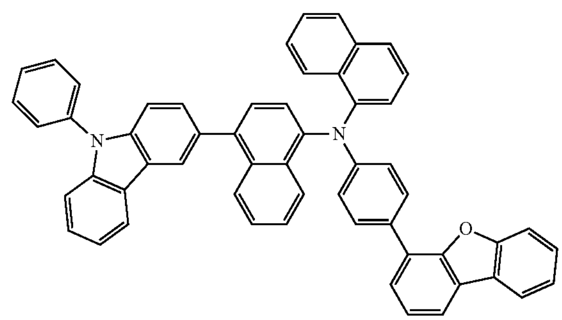
[A-243]
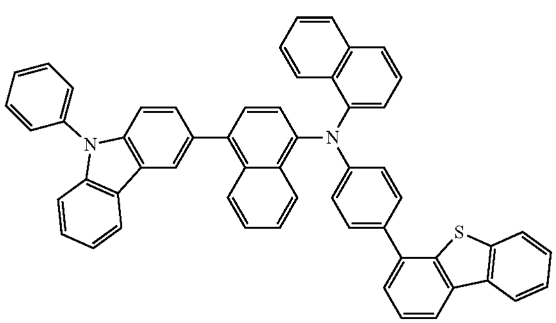
[A-244]
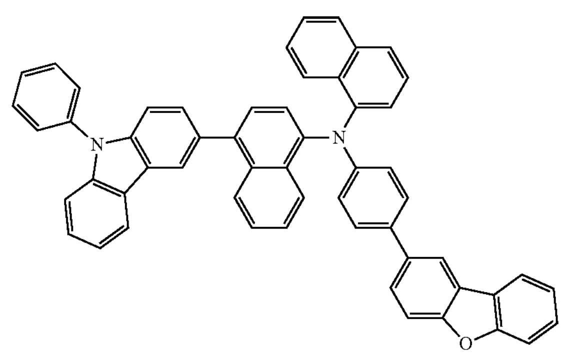
[A-245]
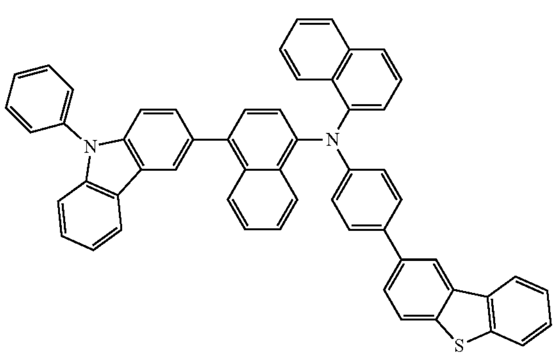
[A-246]
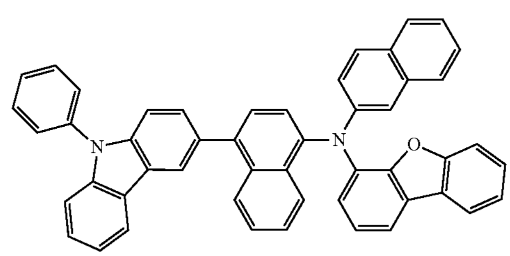

-continued
[A-247]
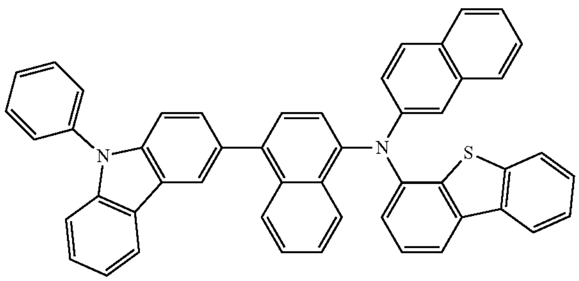
[A-248]
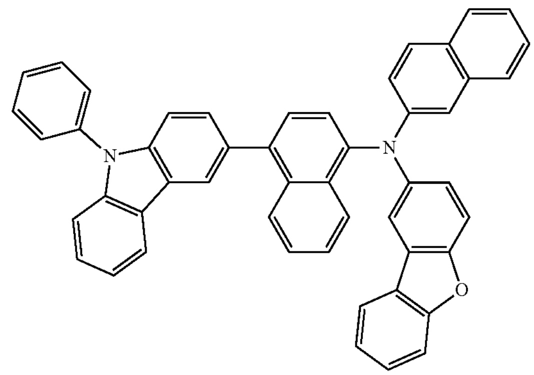
[A-249]
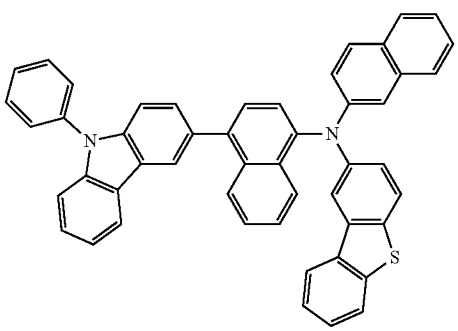
[A-250]
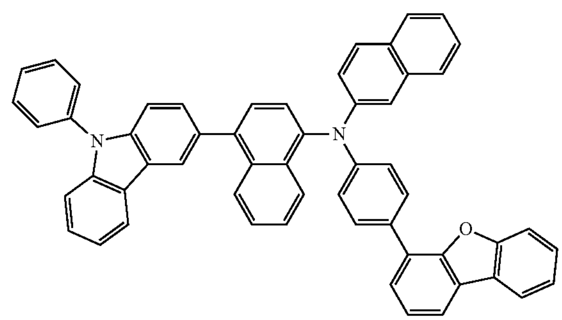
[A-251]
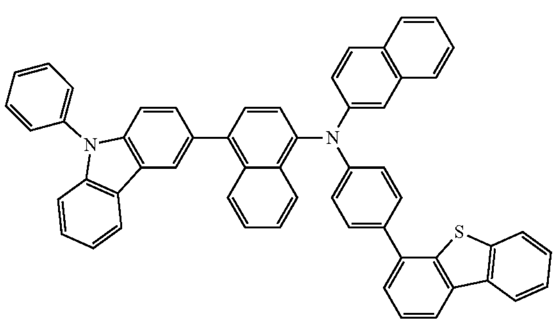
[A-252]
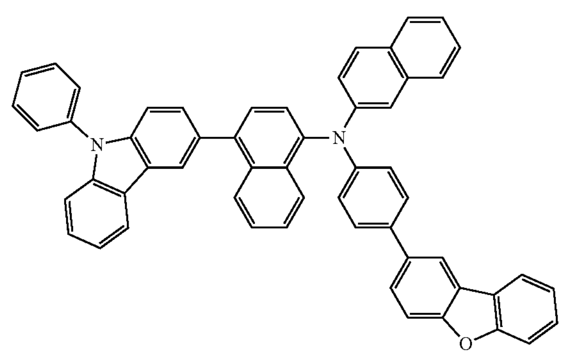
[A-253]
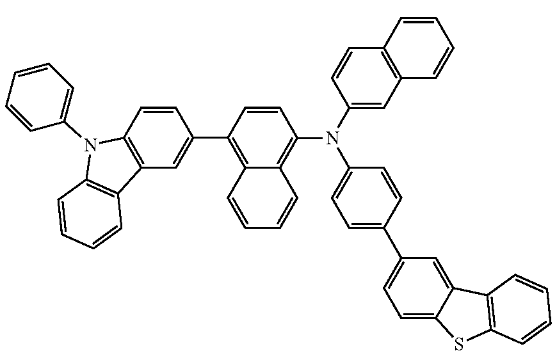
[A-254]
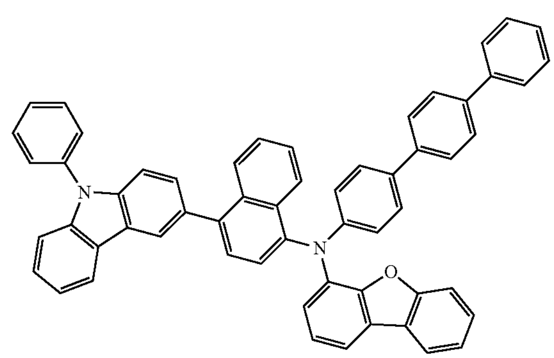

-continued
[A-255]
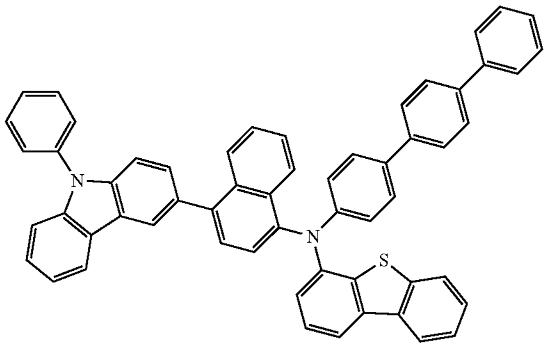
[A-256]
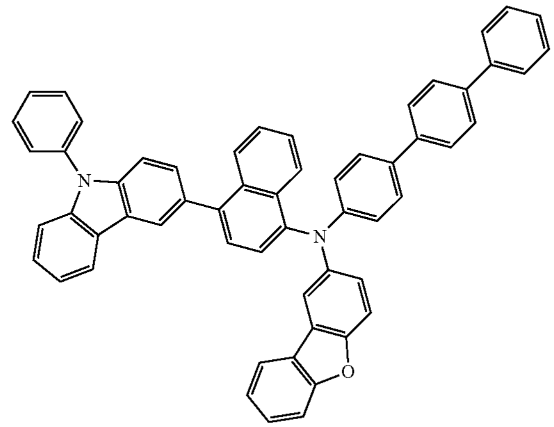
[A-257]
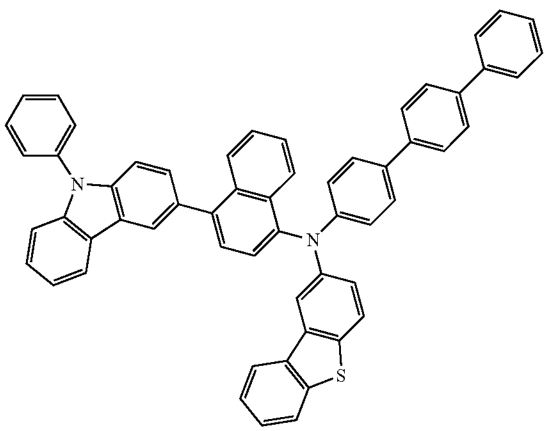
[A-258]
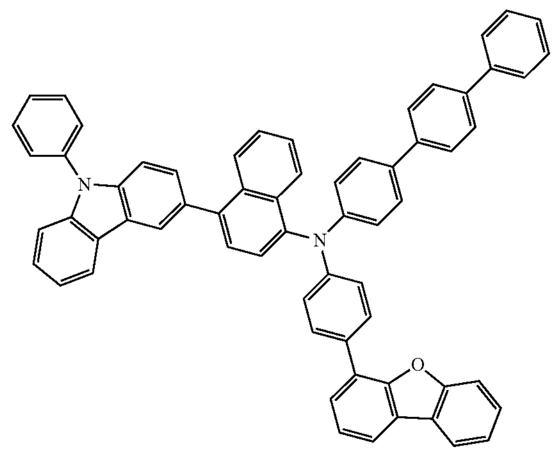
[A-259]
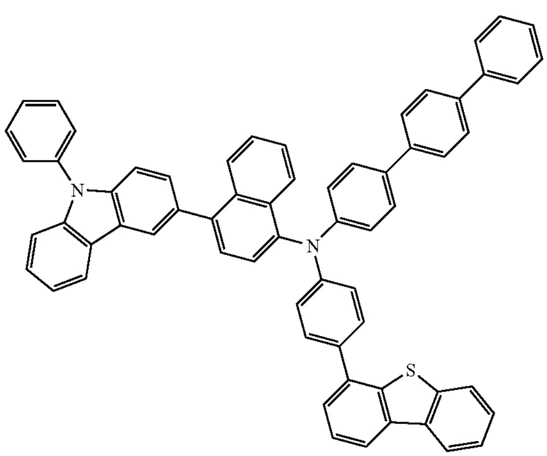
[A-260]
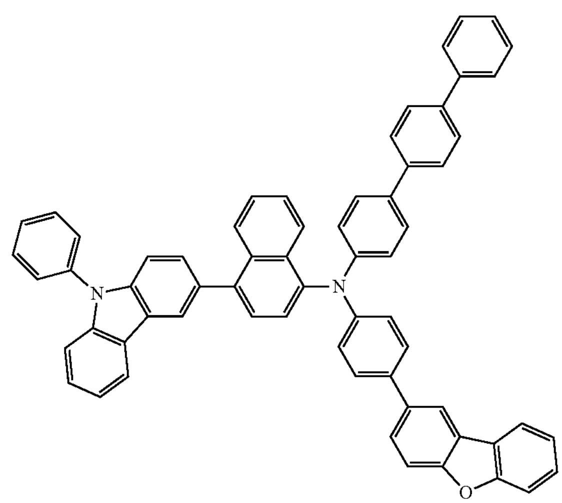

-continued
[A-261]
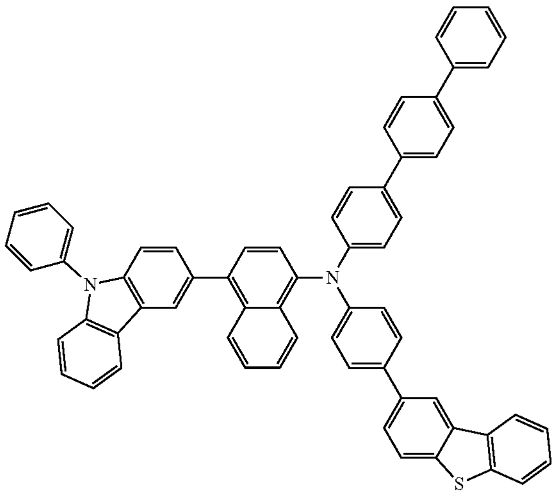
[A-262]
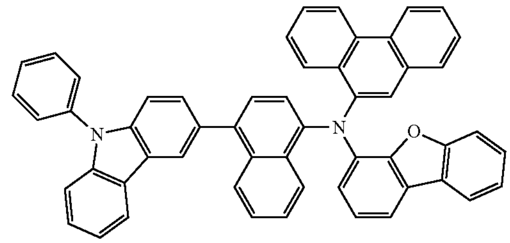
[A-263]
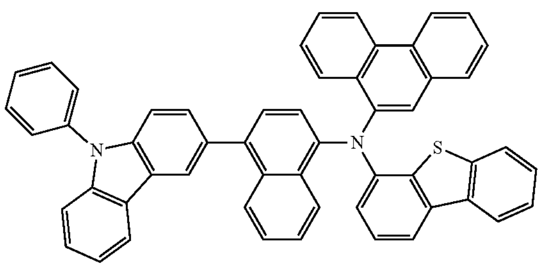
[A-264]
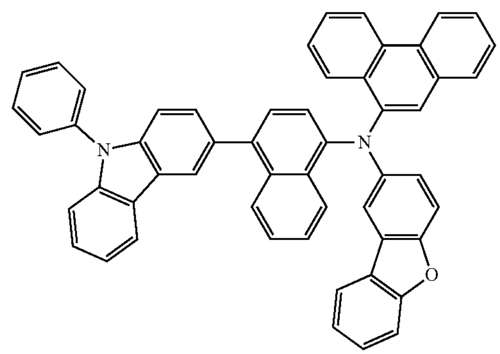
[A-265]
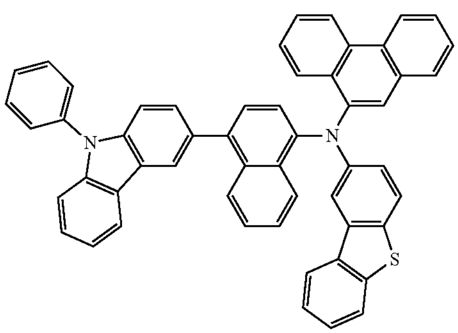
[A-266]
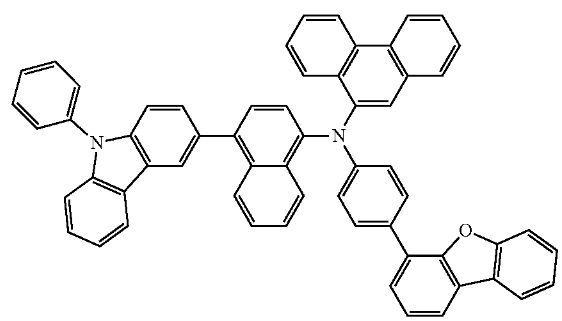
[A-267]
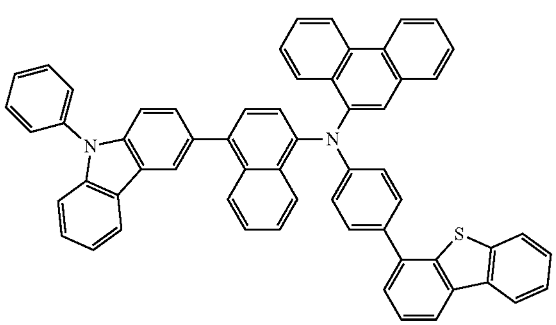
[A-268]
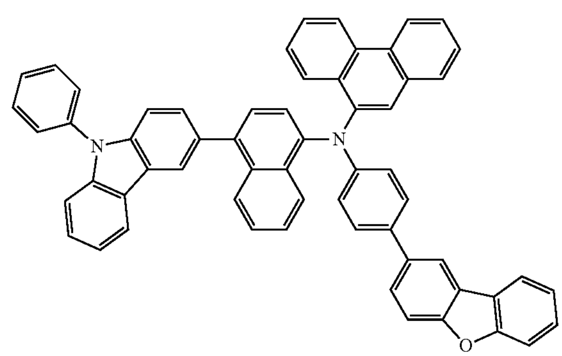

-continued
[A-269]
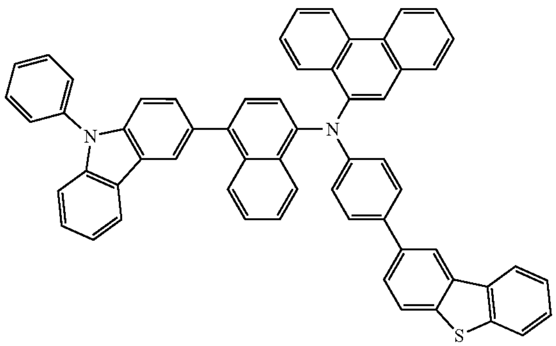
[A-270]
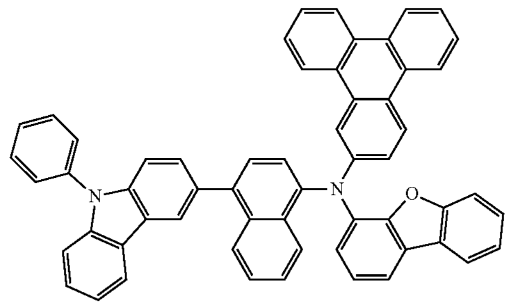
[A-271]
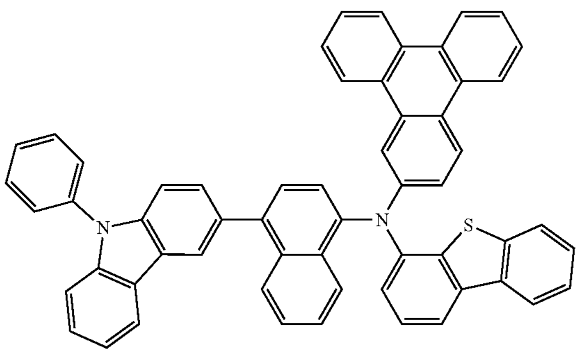
[A-272]
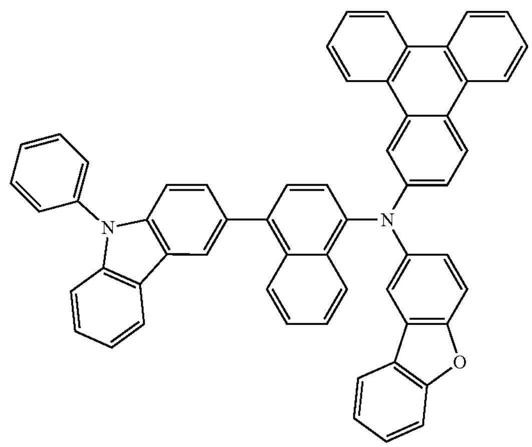
[A-273]
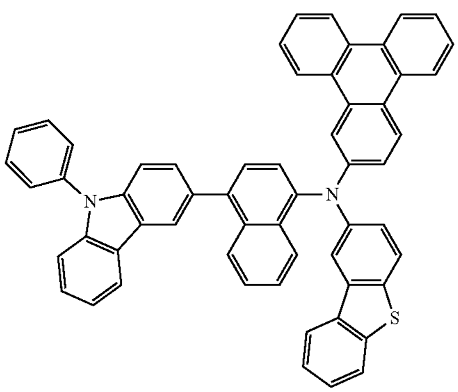
[A-274]
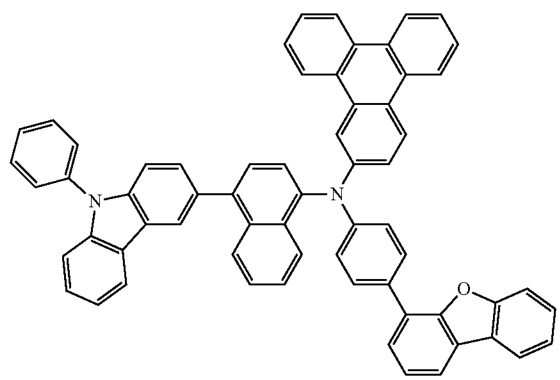
[A-275]
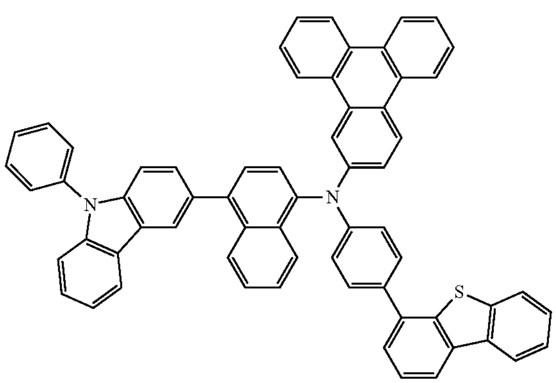
[A-276]
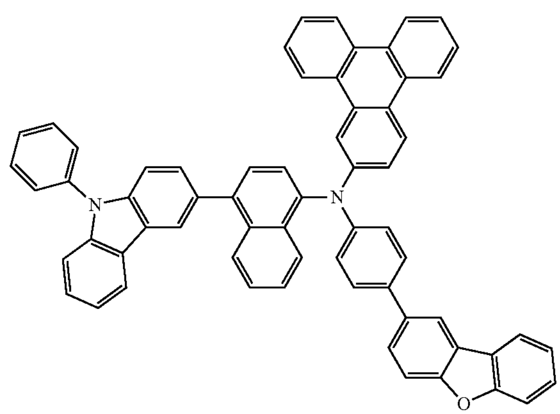

-continued
[A-277]
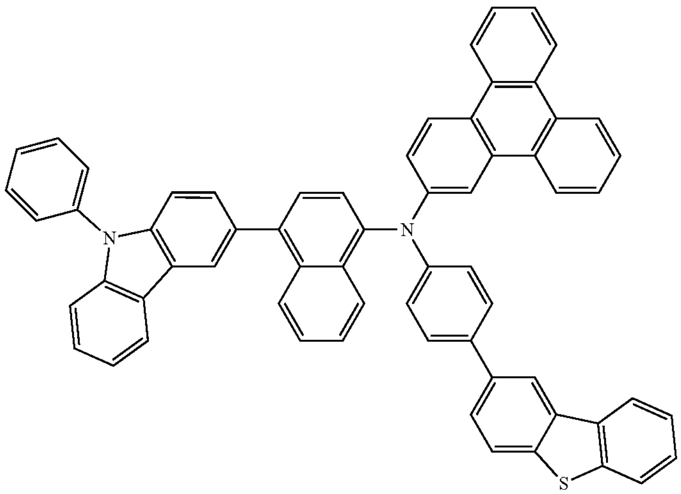
[A-278]
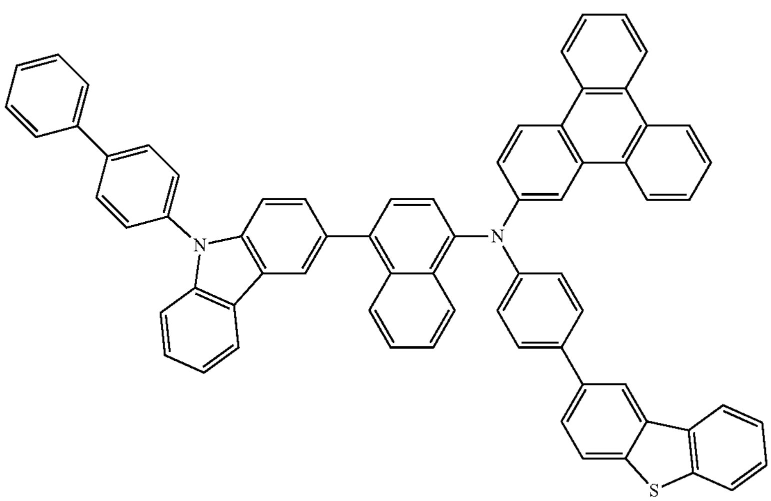
[A-279]
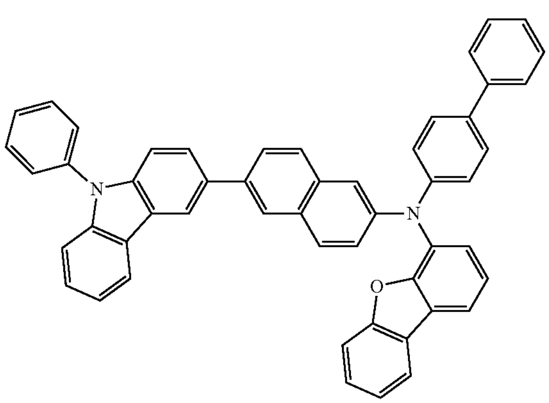
[A-280]
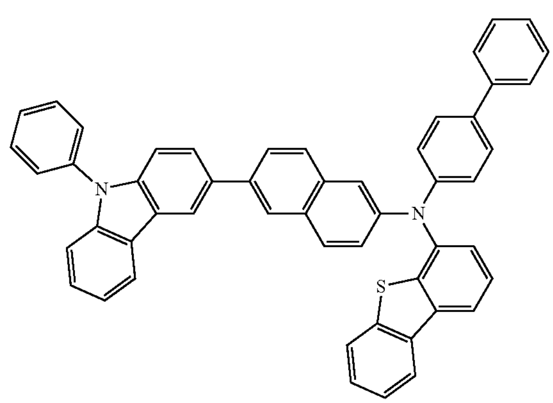

-continued
[A-281]
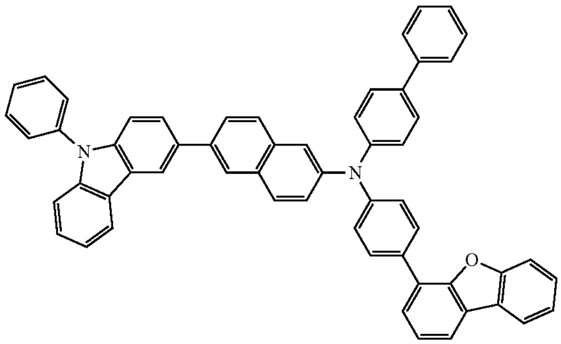
[A-282]
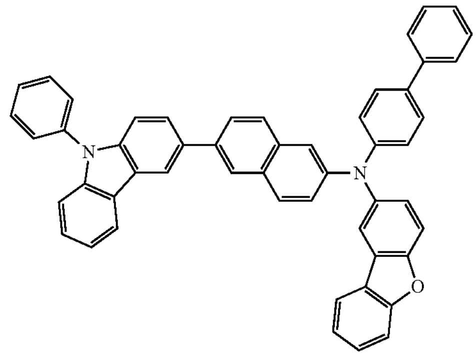
[A-283]
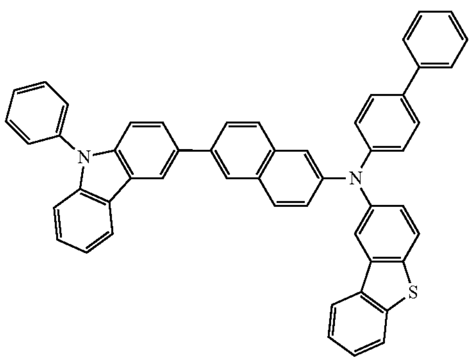
[A-284]
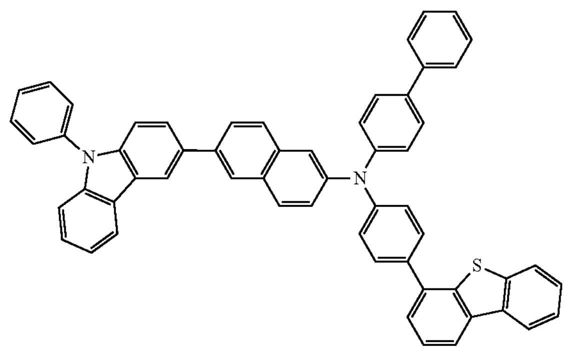
[A-285]
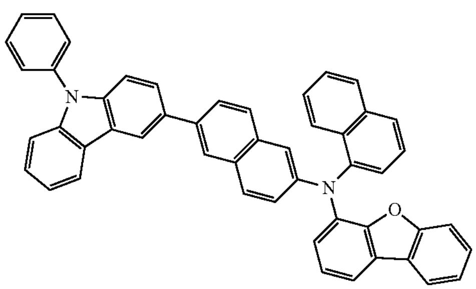
[A-286]
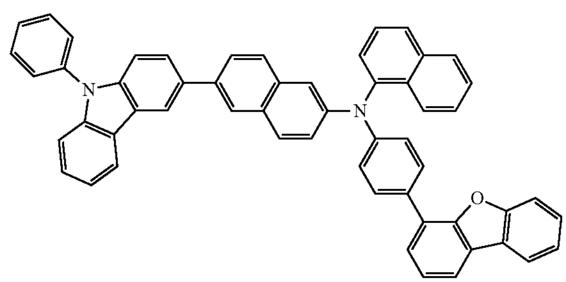
[A-287]
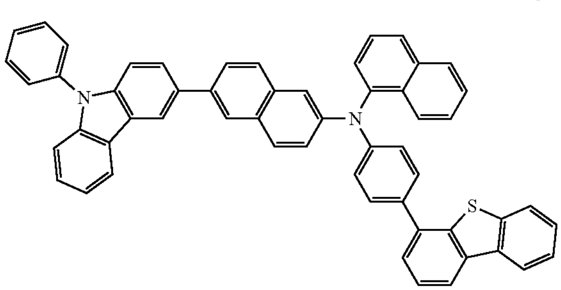
[A-288]
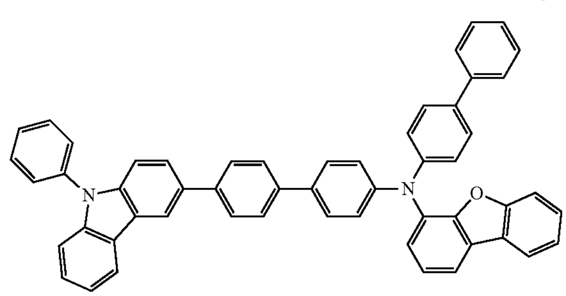

-continued
[A-289]
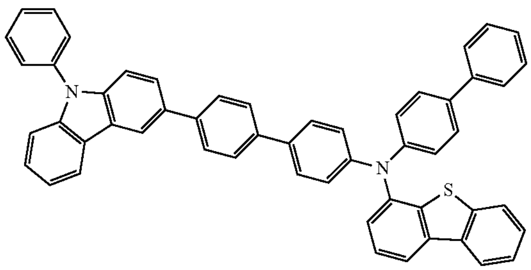
[A-290]
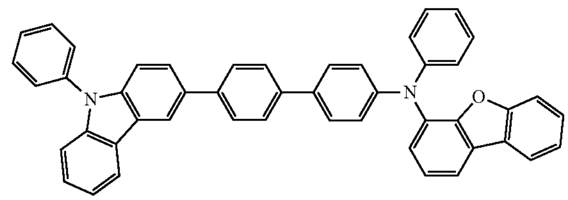
[A-291]
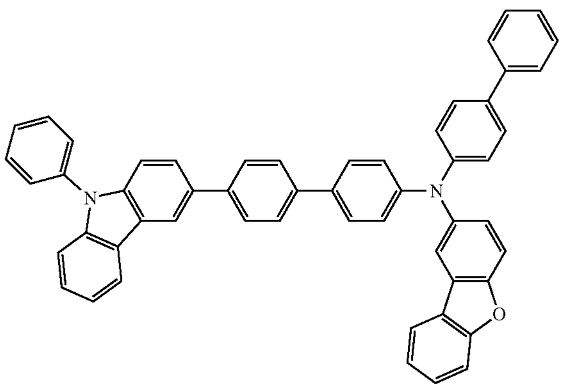
[A-292]
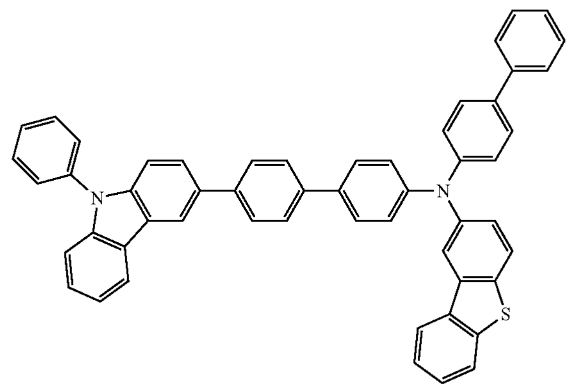
[A293]
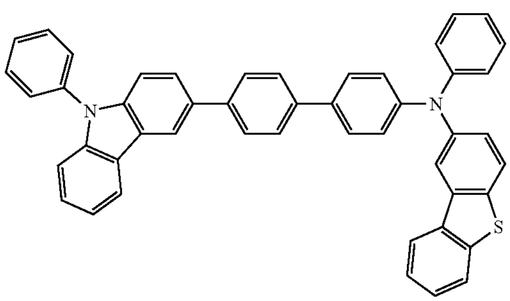
[A-294]
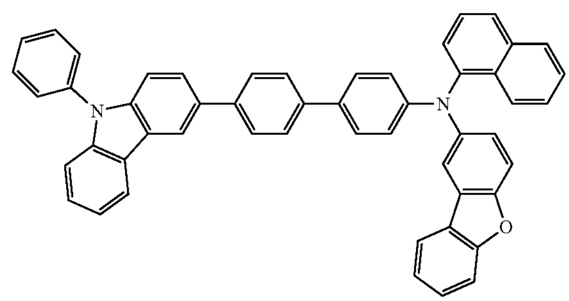
[A-295]
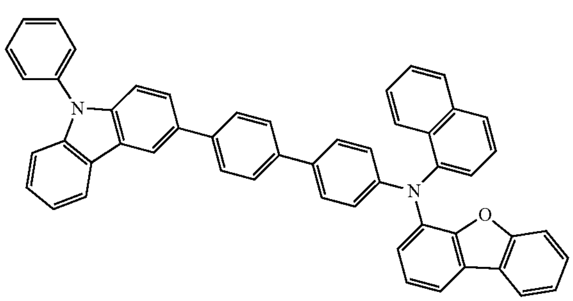
[A-296]
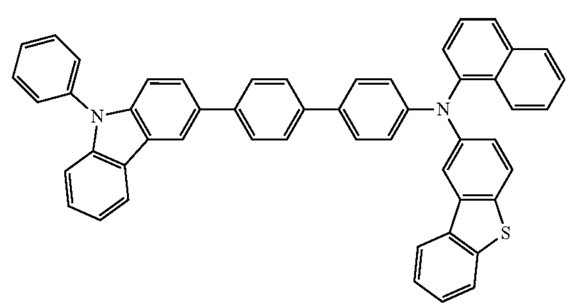
[A-297]
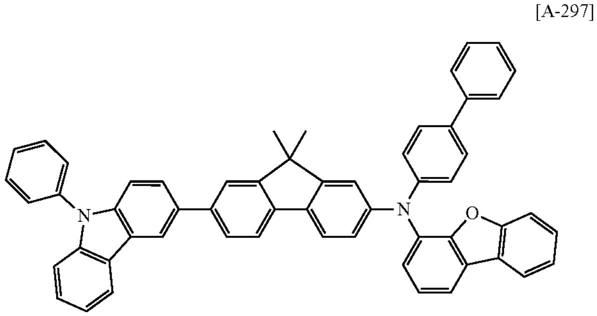
[A-298]
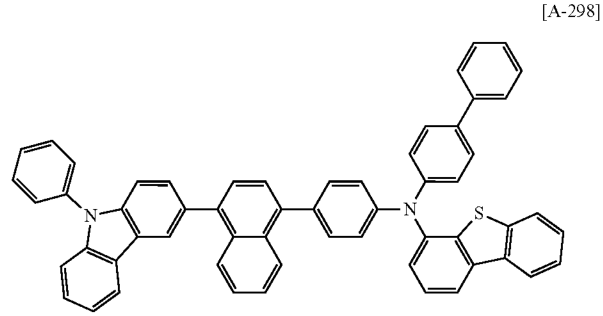

-continued
[A-299]
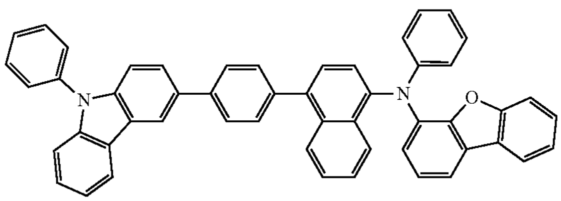
[A-300]
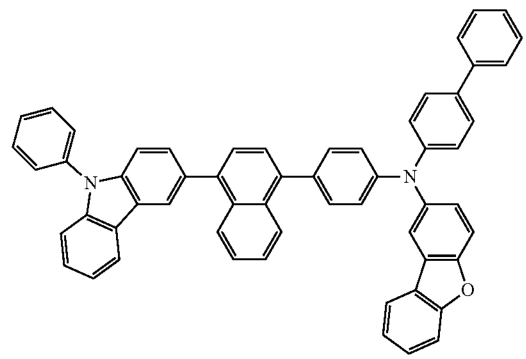
[A-301]
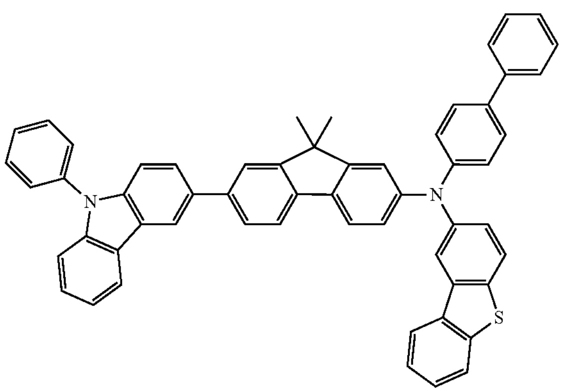
[A-302]
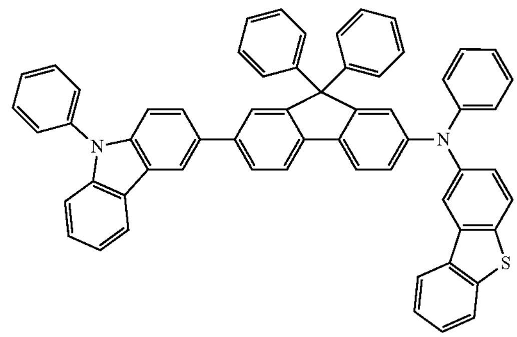
[A-303]
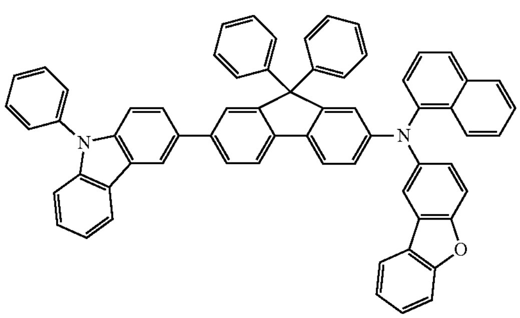
[A-304]
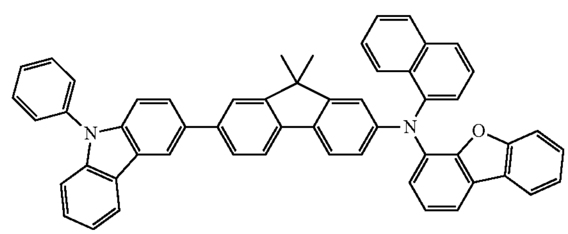
[A-305]
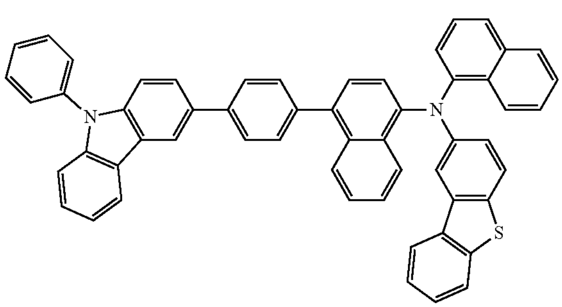
[A-414]
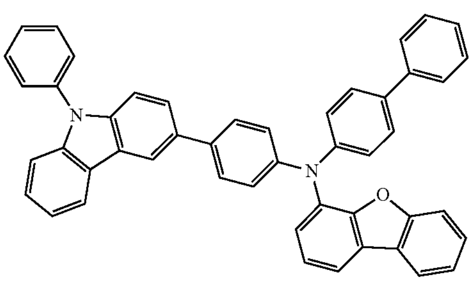

-continued
[A-415]
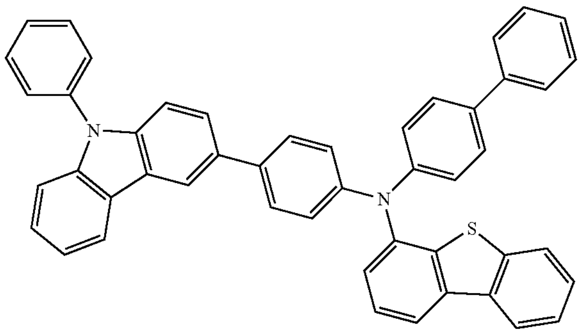
[A-416]
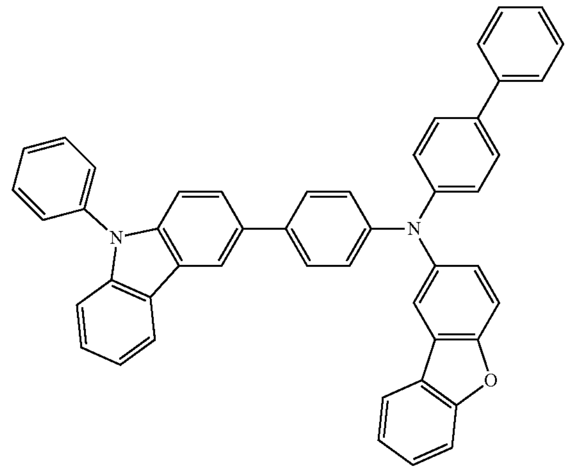
[A-457]
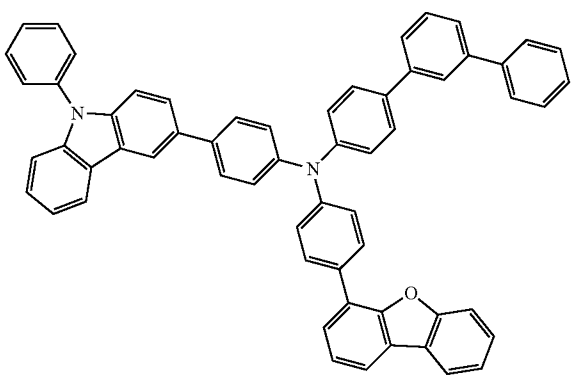
[A-458]
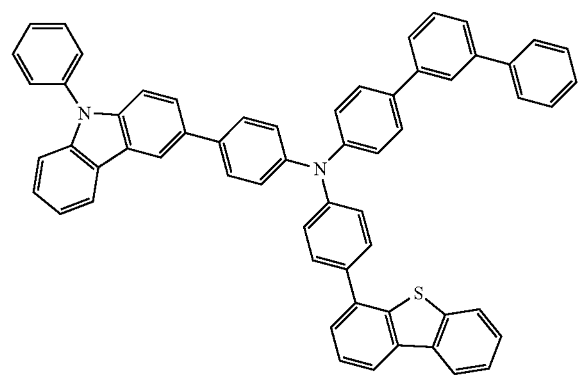
[A-469]
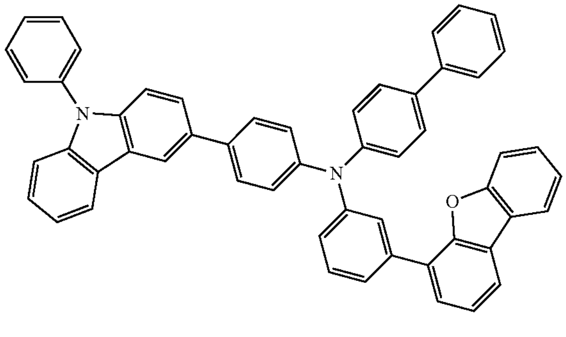
[A-470]
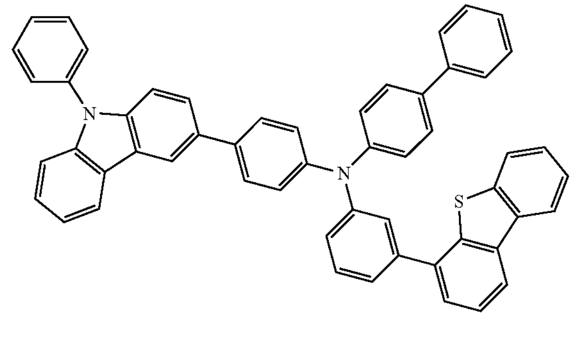

-continued

[A-471]

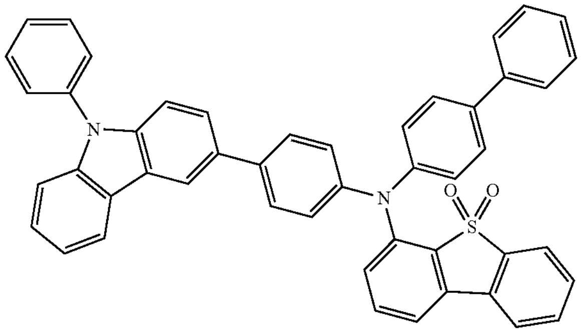

[A-472]

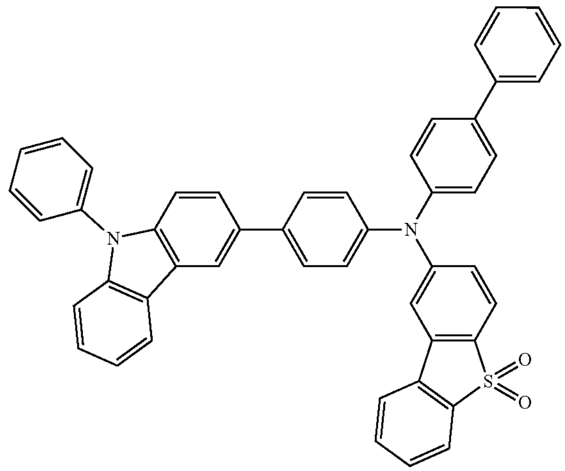

[A-473]

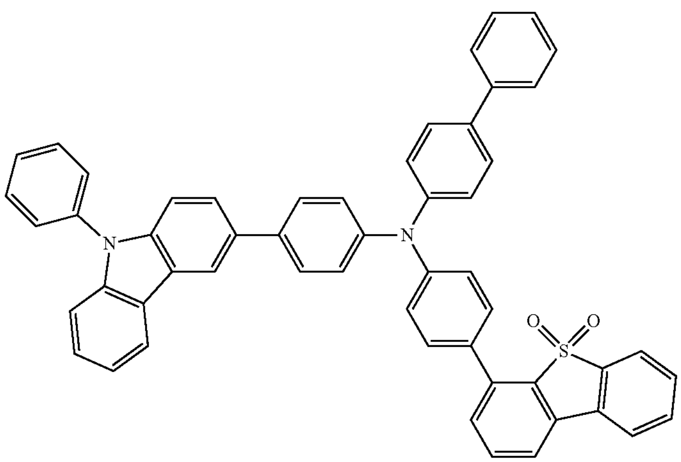

In an implementation, the compound for an optoelectronic device according to one embodiment may be represented by one the following Chemical Formulae A-417 to A-456 and A-459 to A-468. In the following structure, electro-optical characteristics and thin film characteristics for maximizing the performance of the material for an optoelectronic device may be finely adjusted while maintaining basic characteristics of the compound.

[A-417]

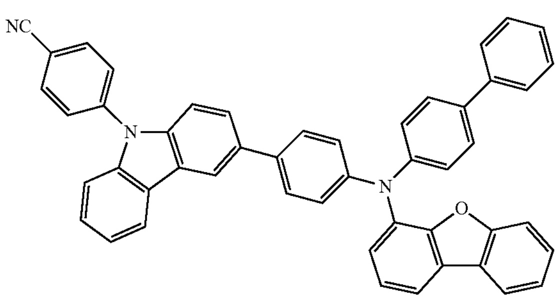

[A-418]

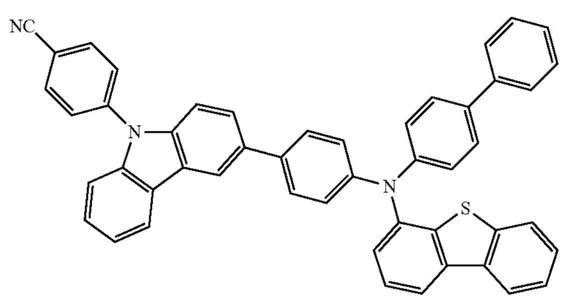

-continued
[A-419]
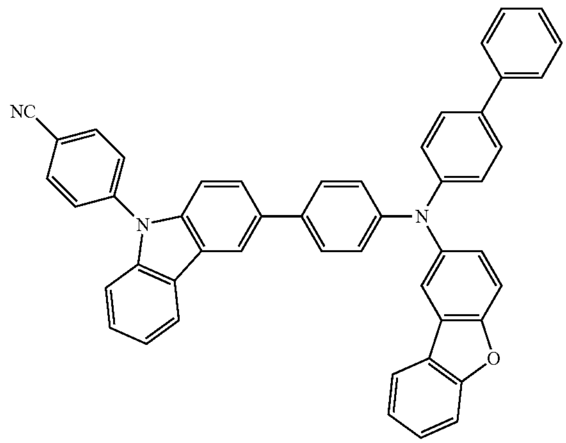
[A-420]
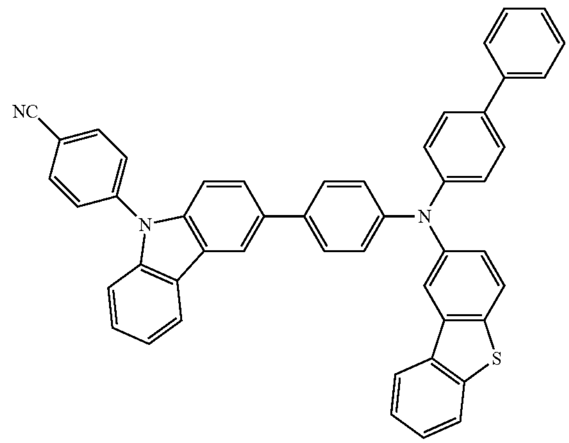
[A-421]
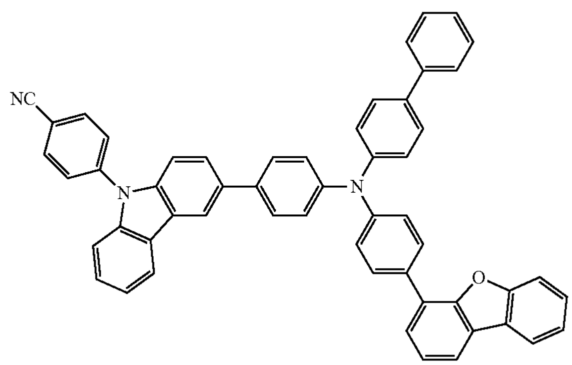
[A-422]
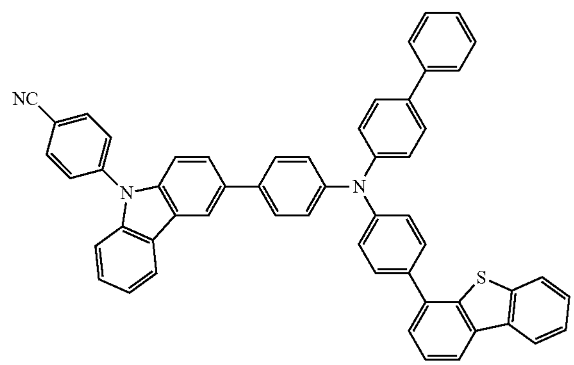
[A-423]
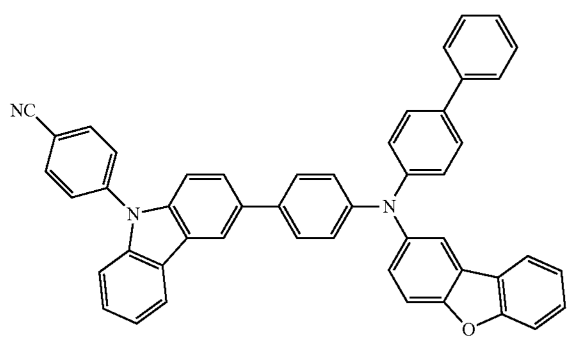
[A-424]
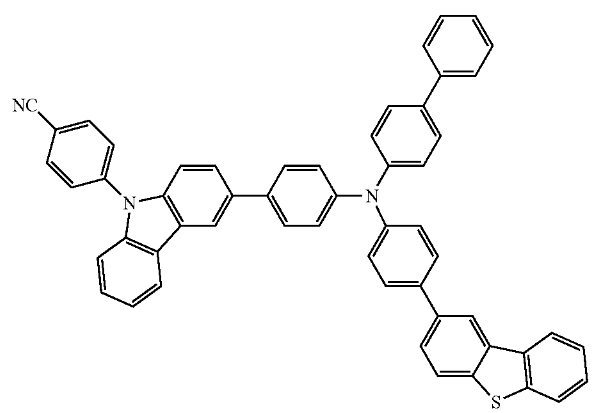
[A-425]
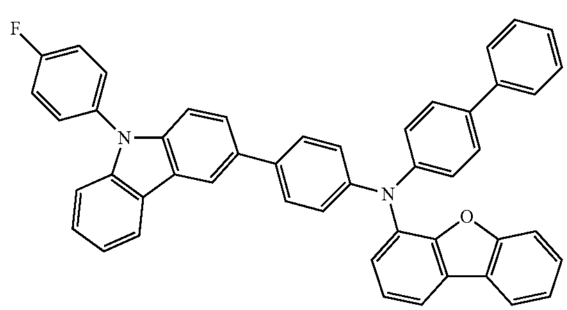
[A-426]
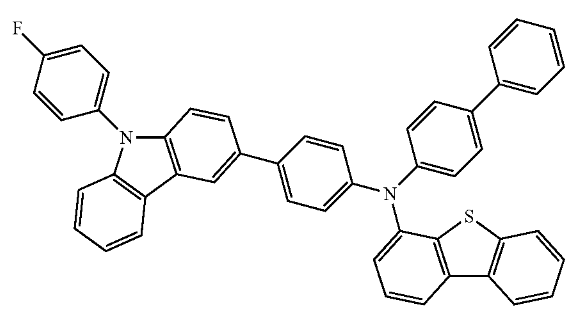

-continued
[A-427]
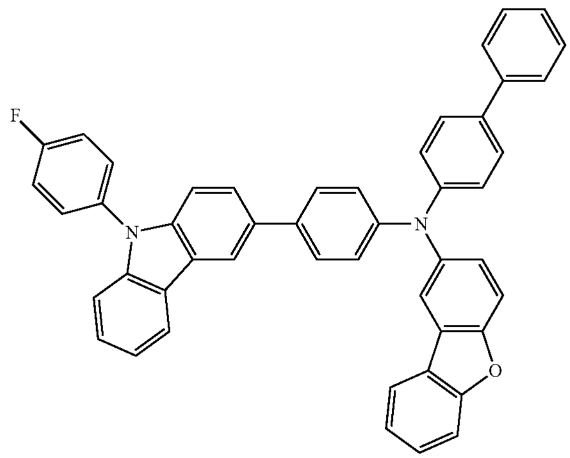
[A-428]
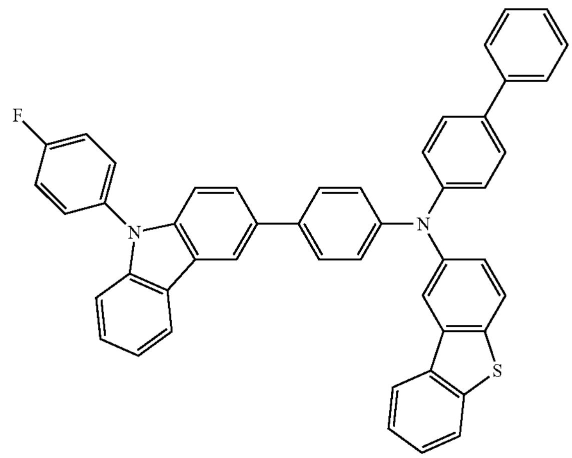
[A-429]
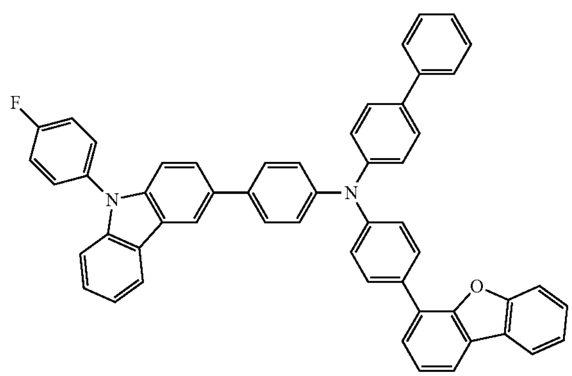
[A-430]
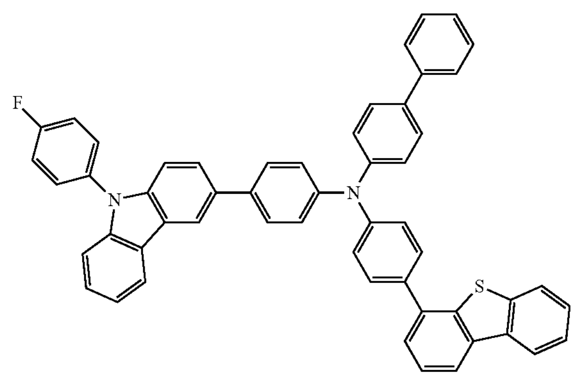
[A-431]
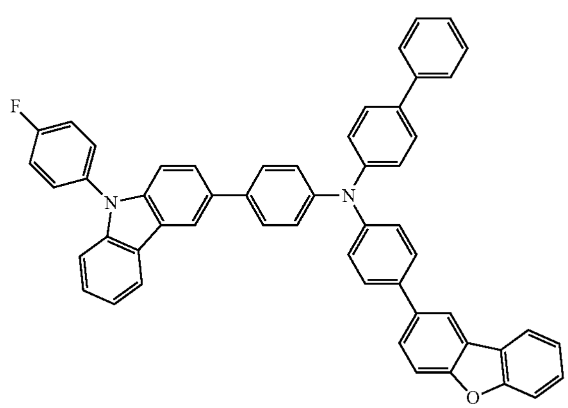
[A-432]
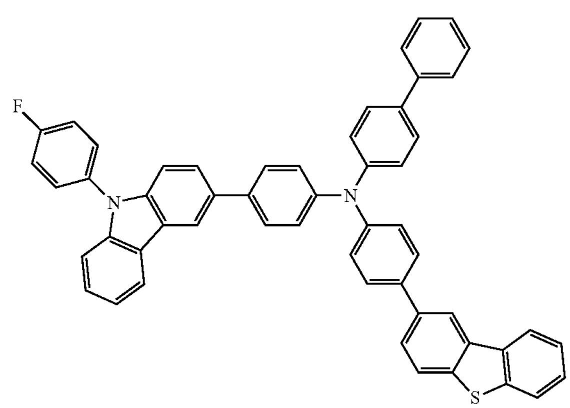
[A-433]
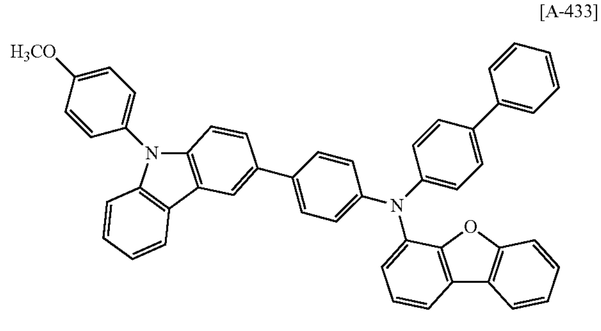
[A-434]
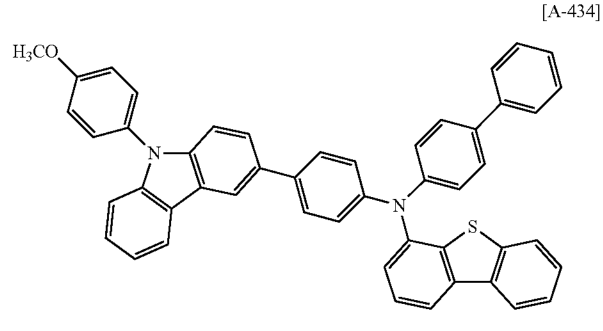

-continued
[A-435]
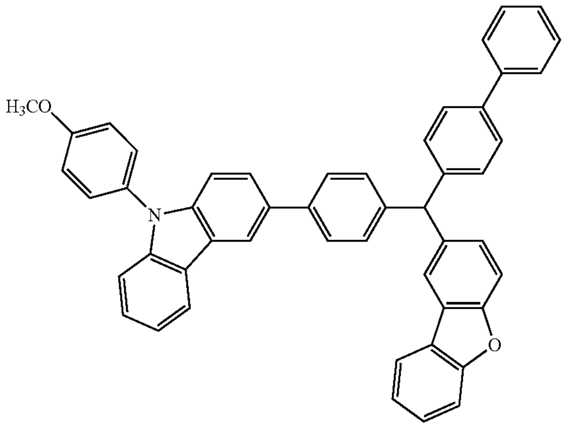
[A-436]
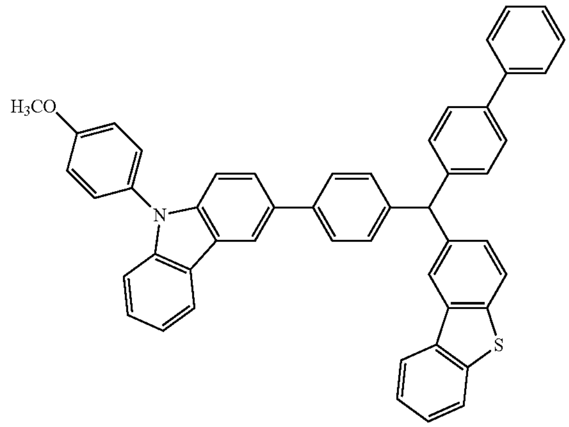
[A-437]
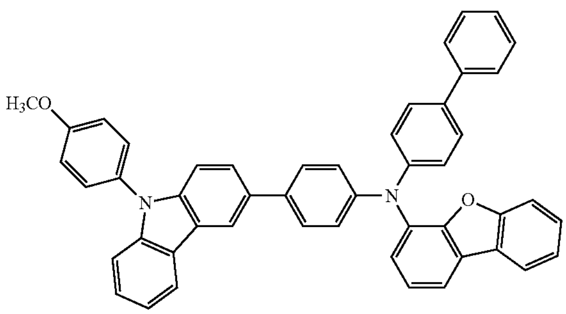
[A-438]
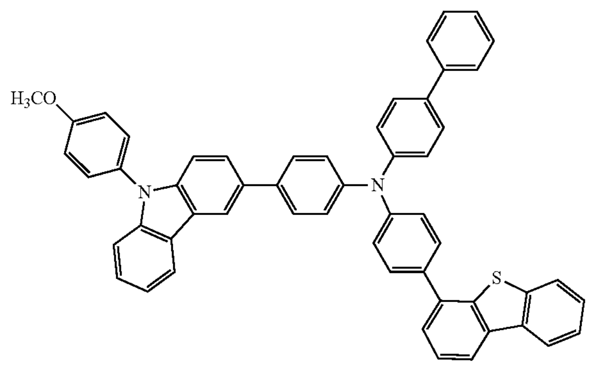
[A-439]
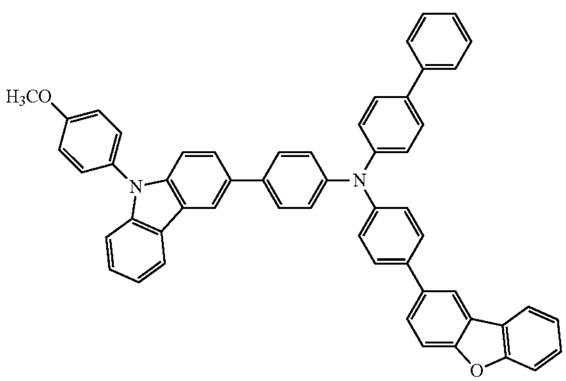
[A-440]
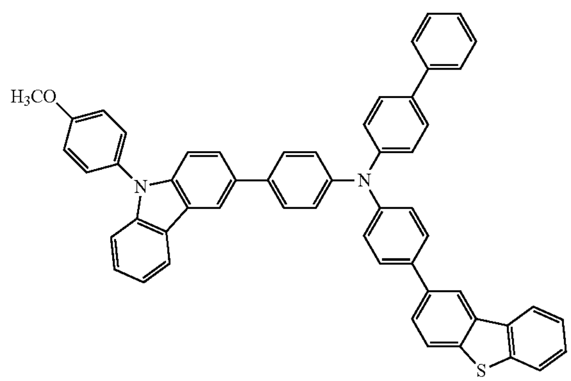
[A-441]
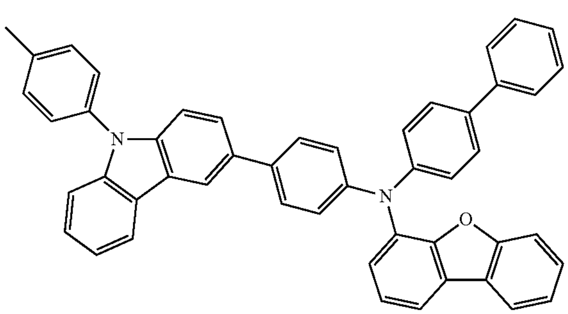
[A-442]
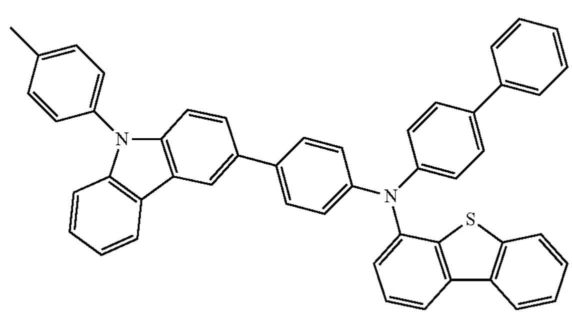

-continued
[A-443]
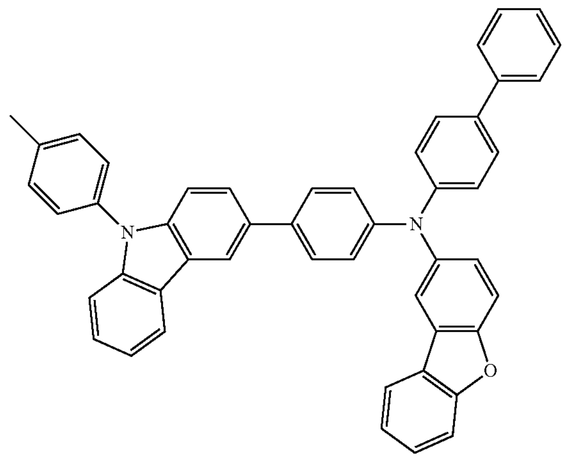
[A-444]
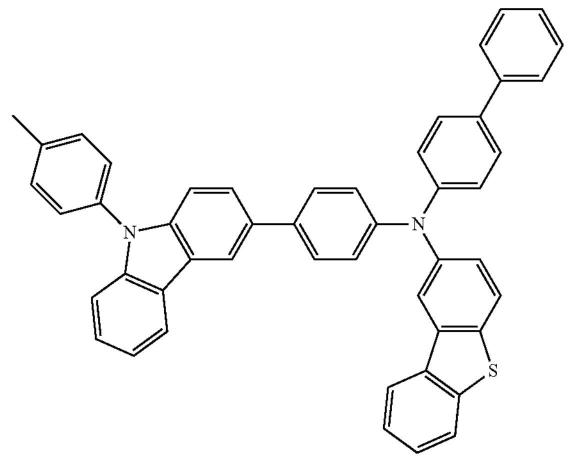
[A-445]
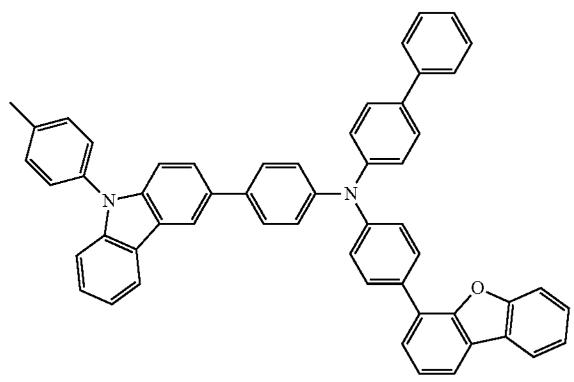
[A-446]
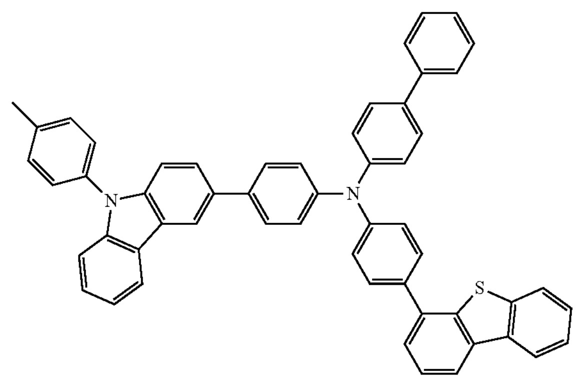
[A-447]
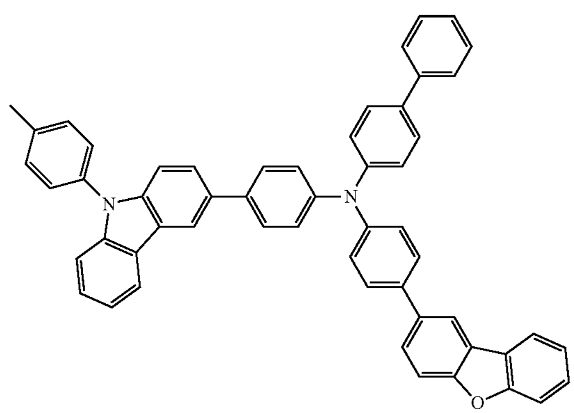
[A-448]
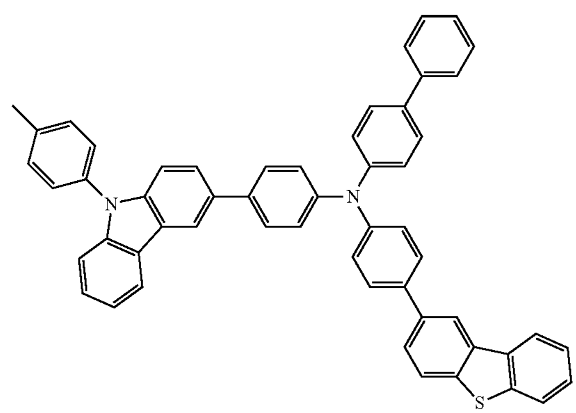
[A-449]
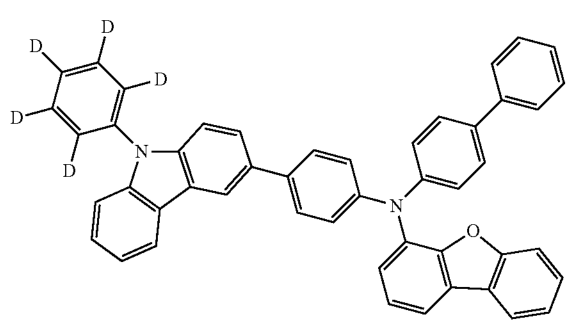
[A-450]
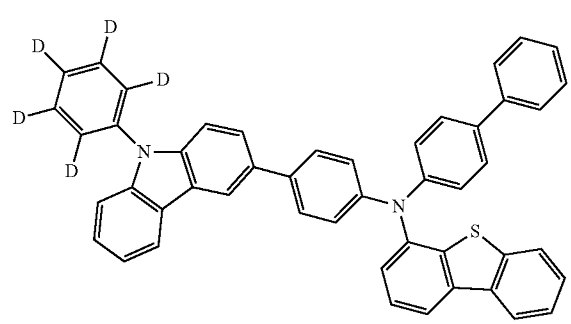

-continued
[A-451]
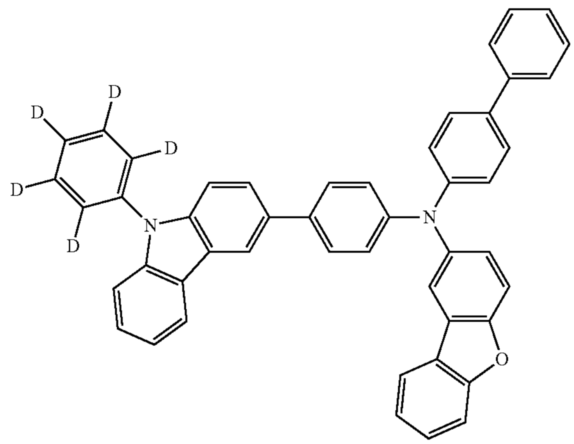
[A-452]
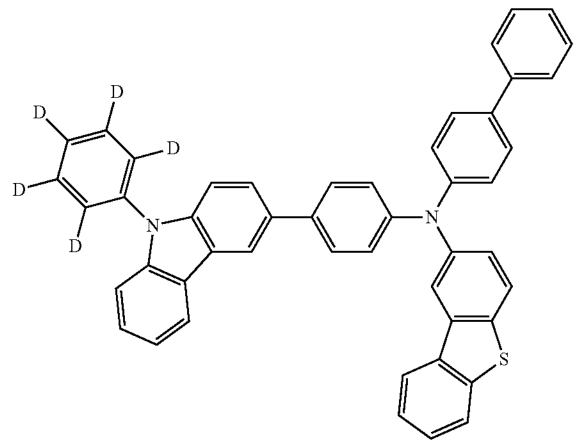
[A-453]
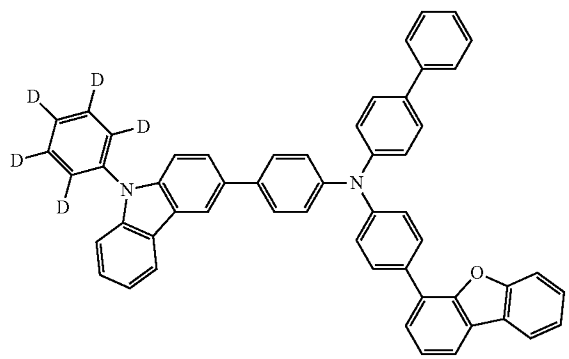
[A-454]
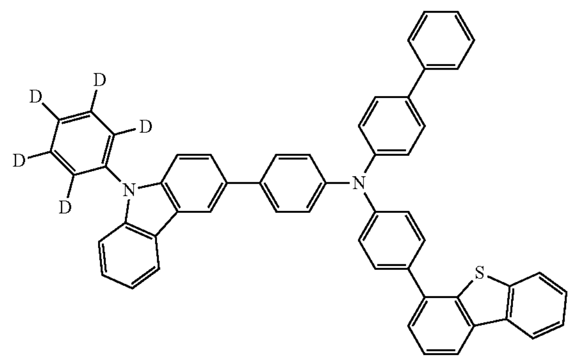
[A-455]
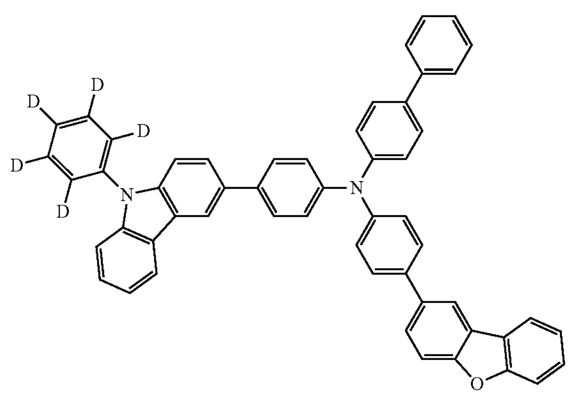
[A-456]
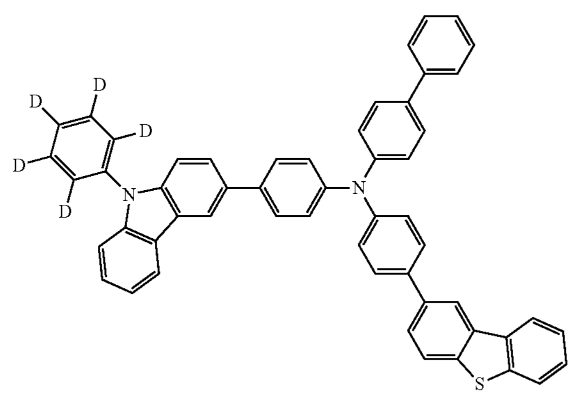
[A-459]
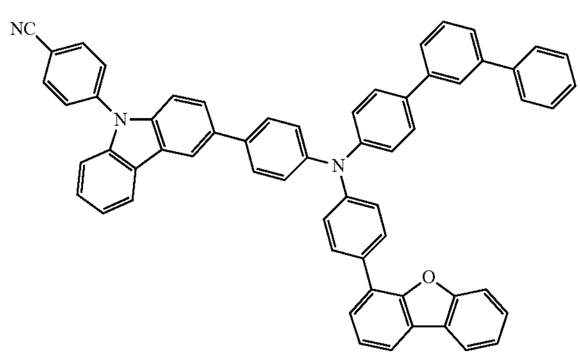
[A-460]
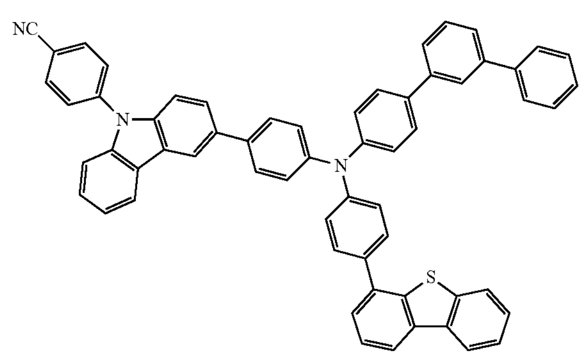

-continued
[A-461]
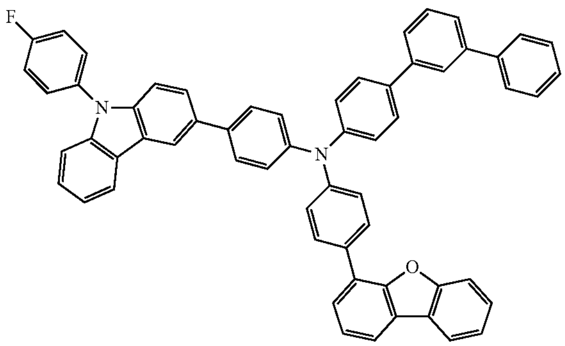
[A-462]
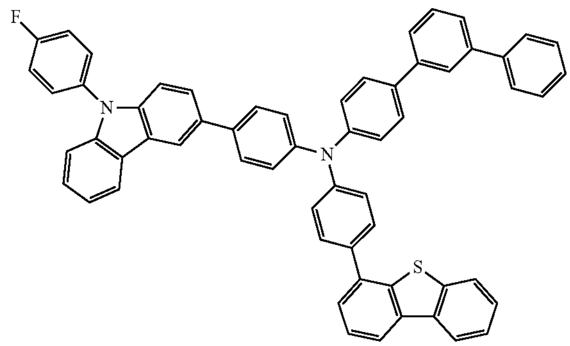
[A-463]
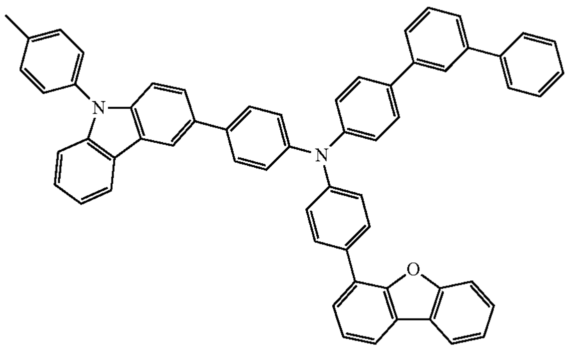
[A-464]
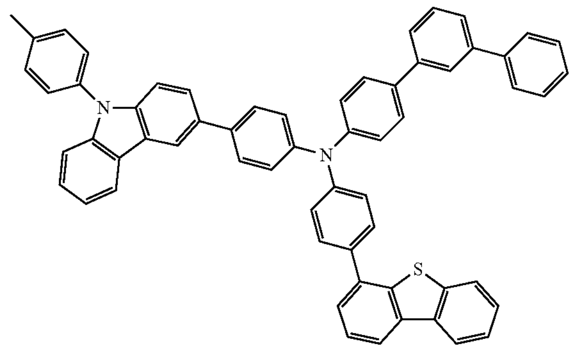
[A-465]
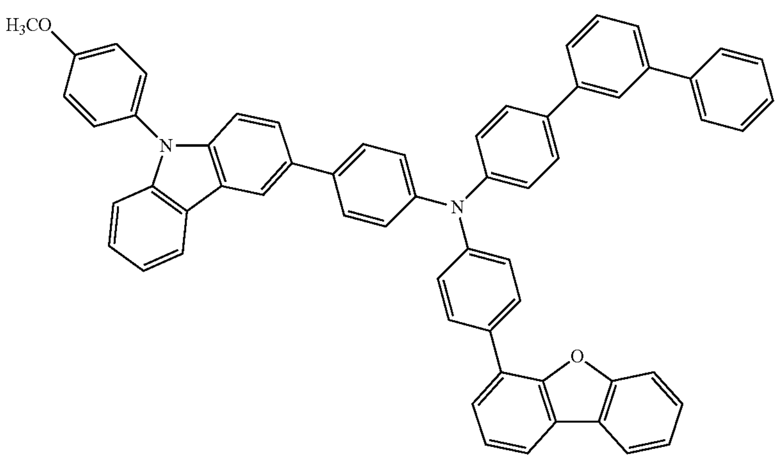
[A-466]
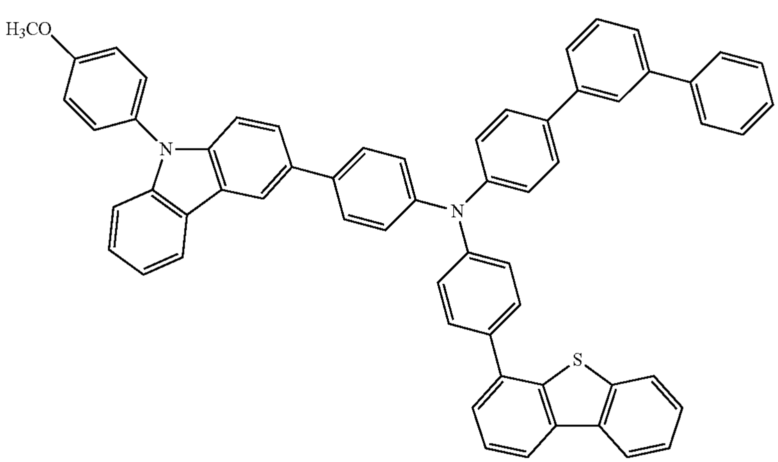

-continued

[A-467]

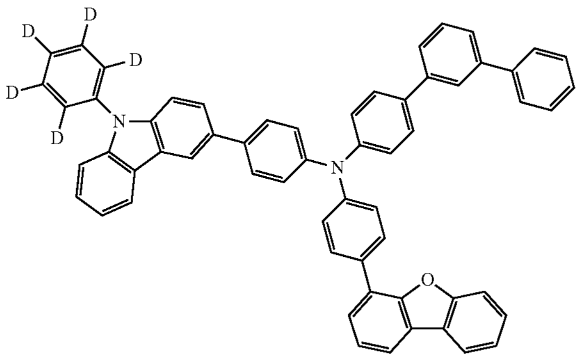

[A-468]

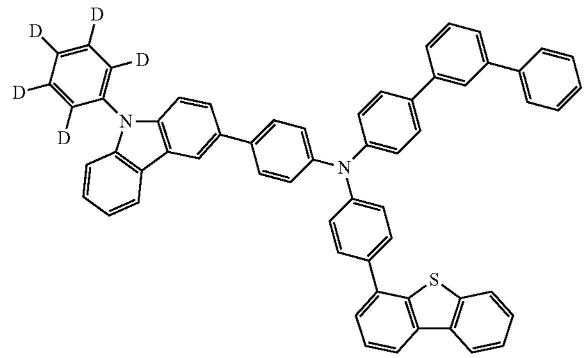

In an implementation, the compound for an optoelectronic device according to one embodiment may be represented by one of the following Chemical Formulae A-324 to A-395. In this structure, since dibenzofuran having a hole transporting property and dibenzothiophene are asymmetrically bound to a tertiary arylamine structure, an excellent hole transporting property and thin film stability may be realized.

[A-324]

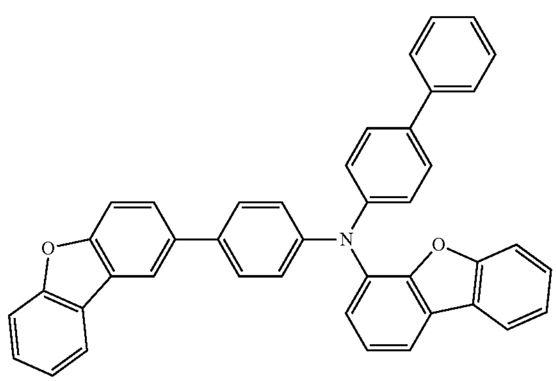

[A-325]

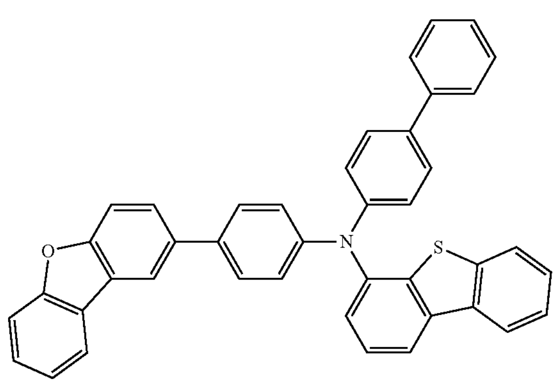

[A-326]

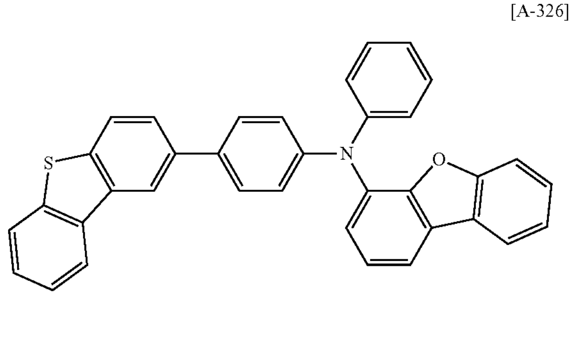

-continued

[A-327]

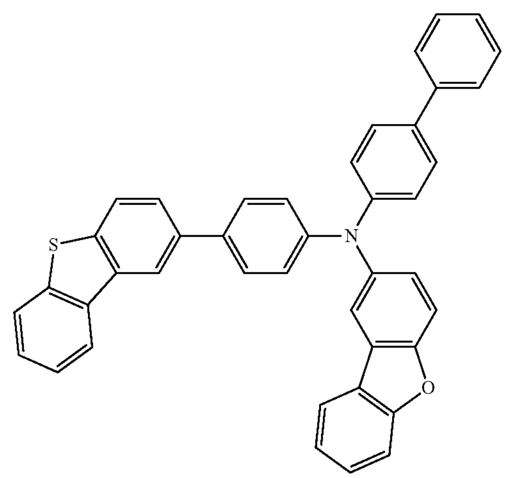

[A-328]

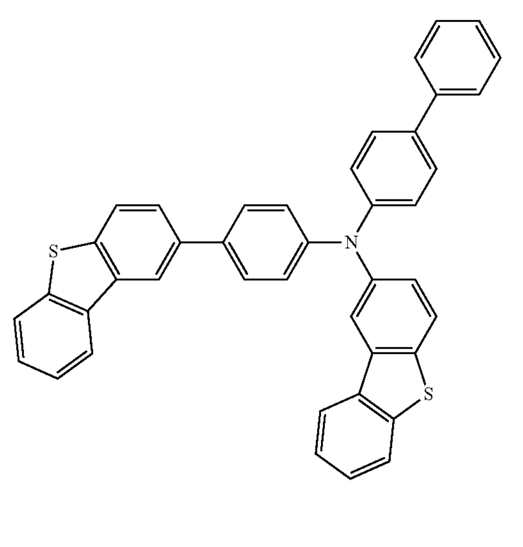

-continued
[A-329]
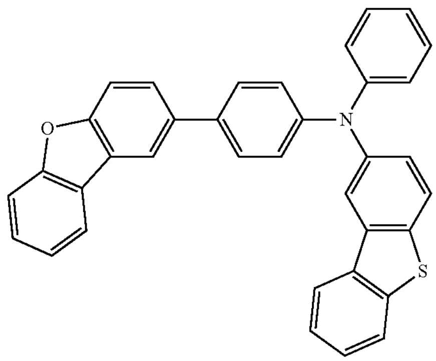
[A-330]
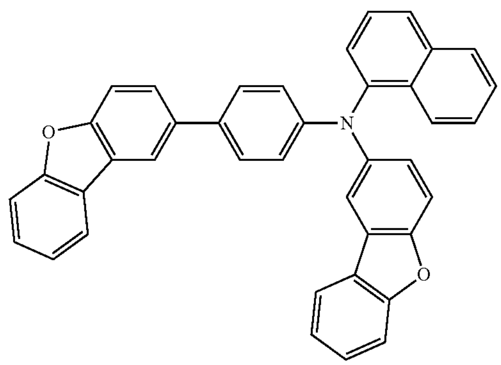
[A-331]
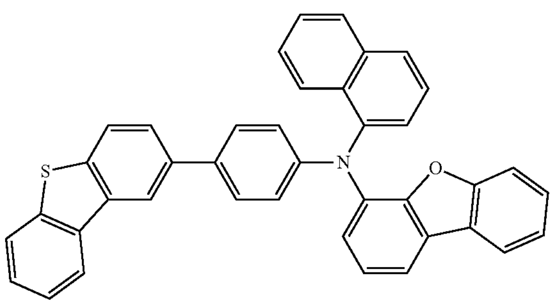
[A-332]
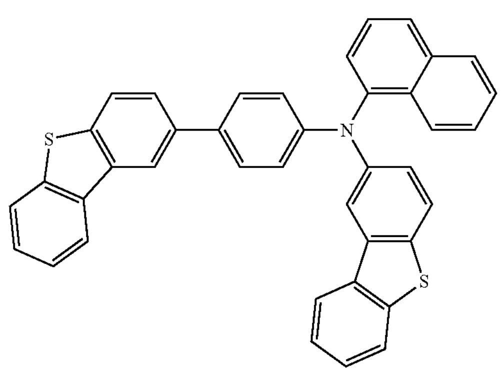
-continued
[A-333]
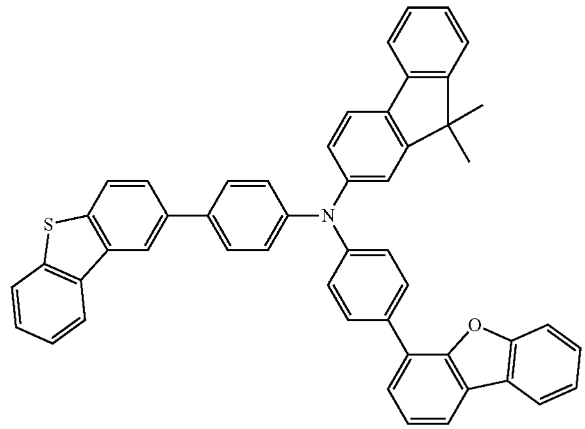
[A-334]
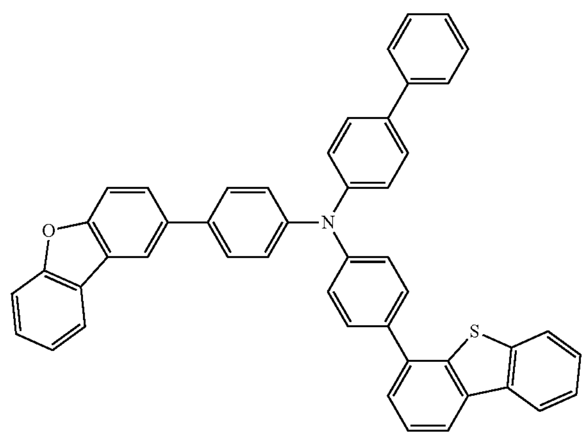
[A-335]
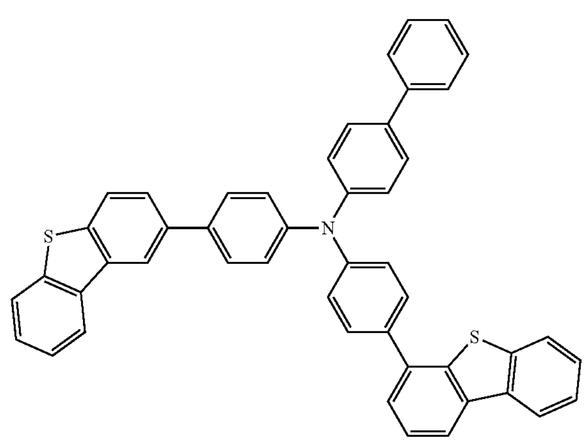

-continued
[A-336]
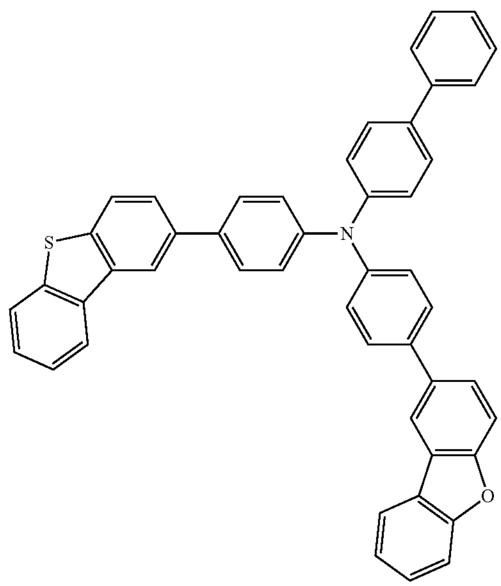
[A-337]
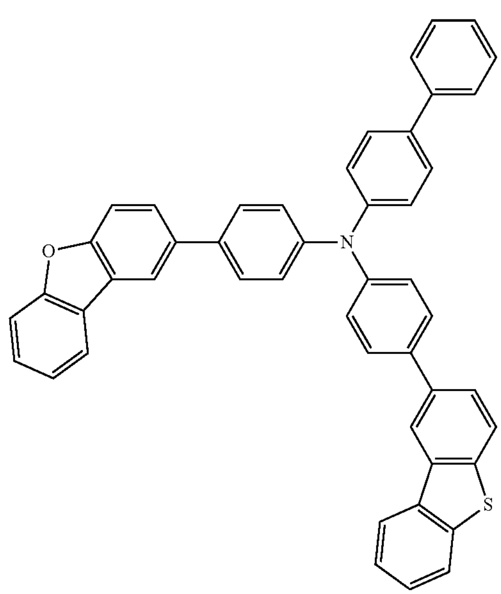
-continued
[A-338]
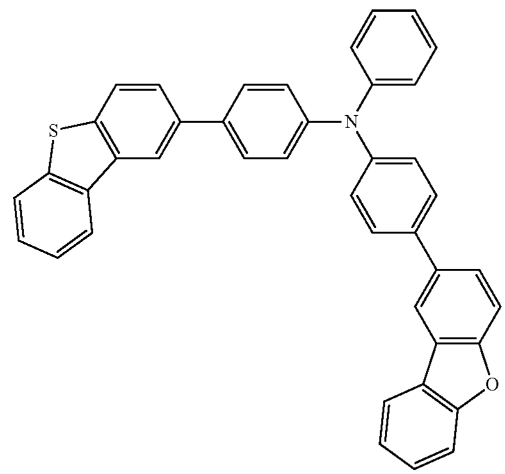
[A-339]
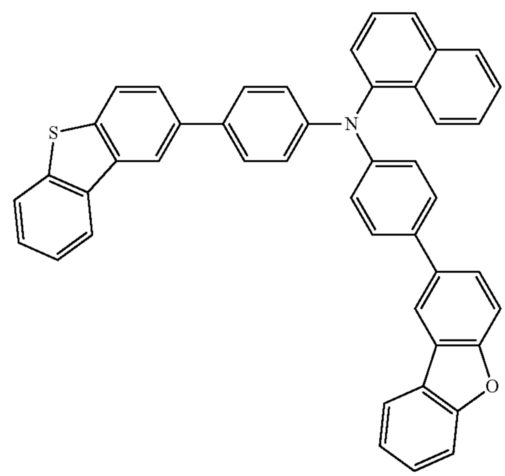
[A-340]
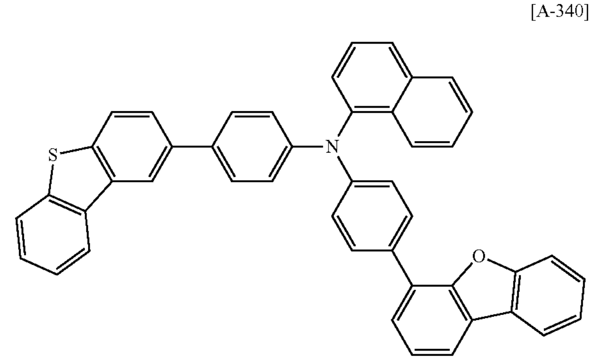

-continued
[A-341]
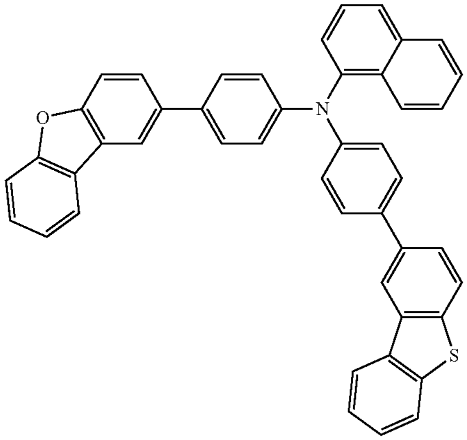
[A-342]
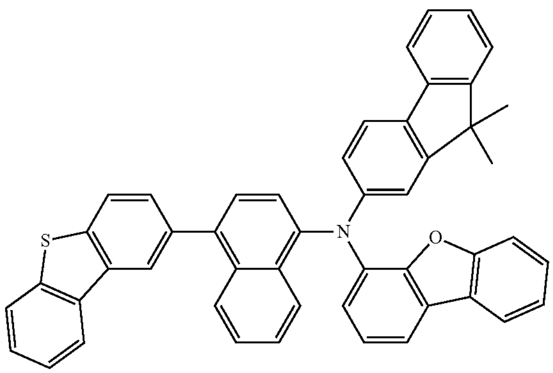
[A-343]
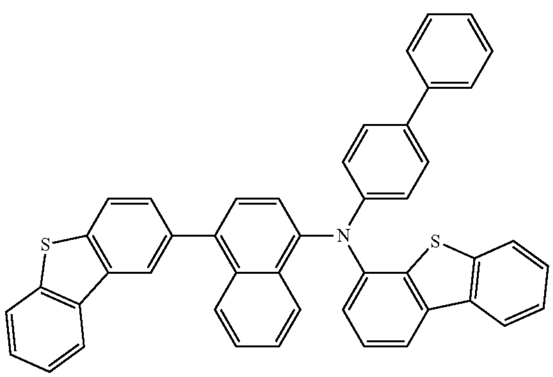
[A-344]
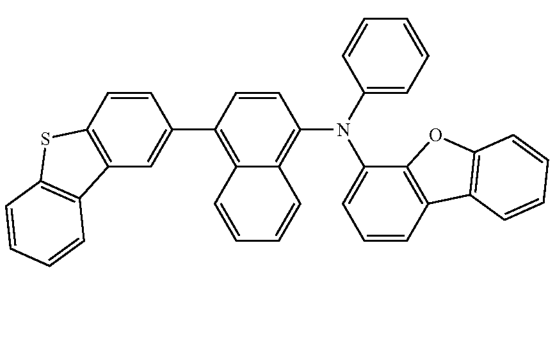
-continued
[A-345]
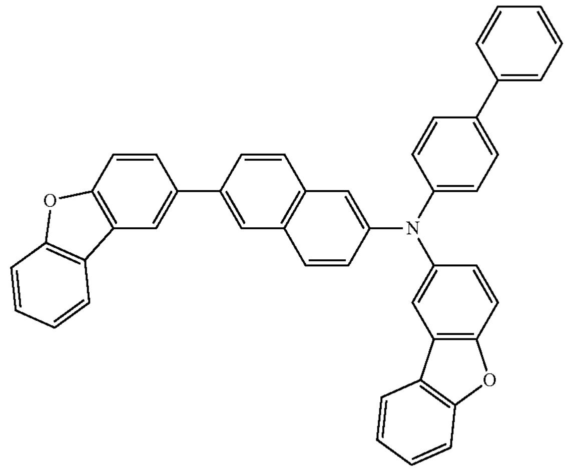
[A-346]
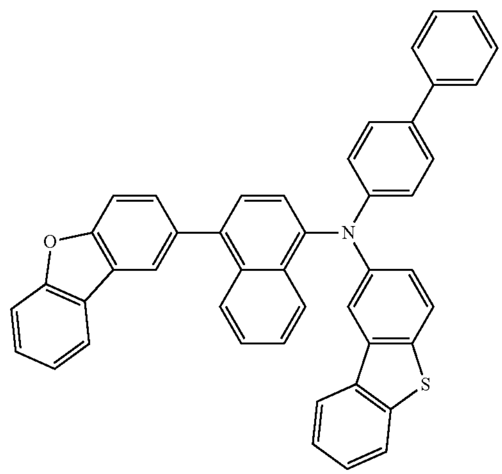
[A-347]
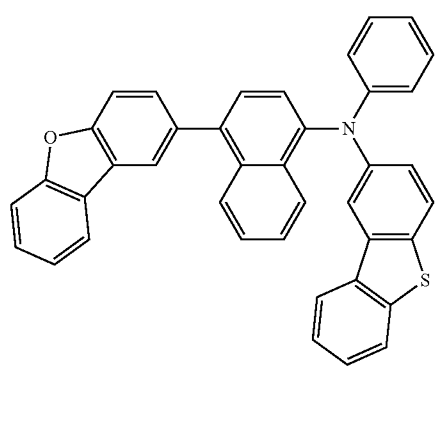

-continued
[A-348]
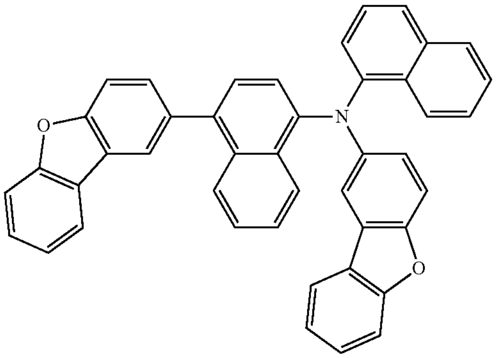
[A-349]
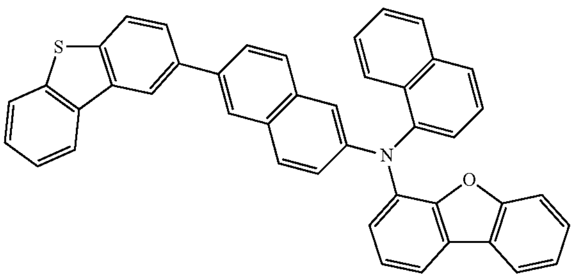
[A-350]
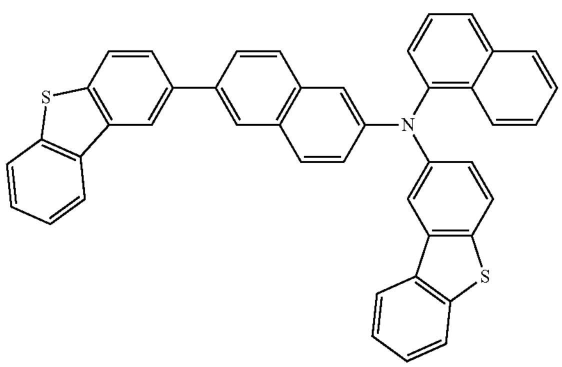
[A-351]
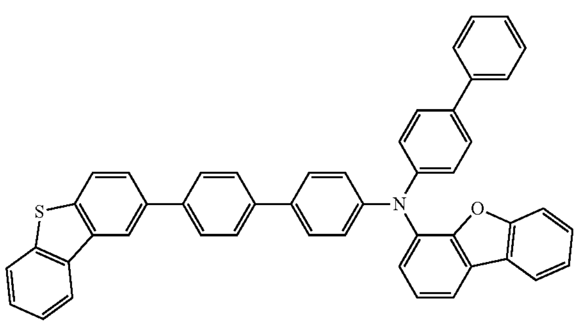
-continued
[A-352]
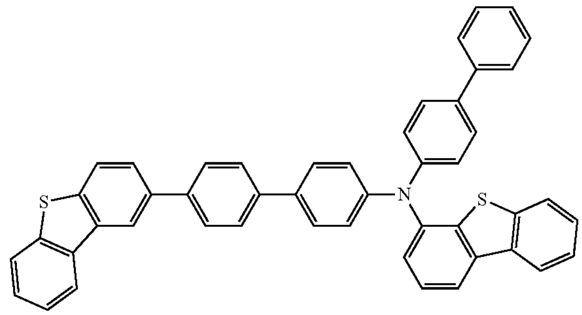
[A-353]
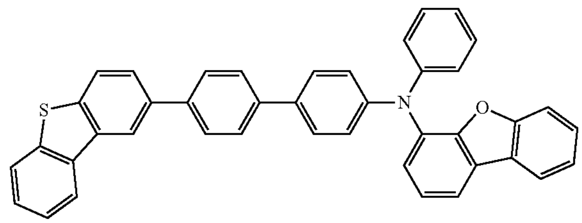
[A-354]
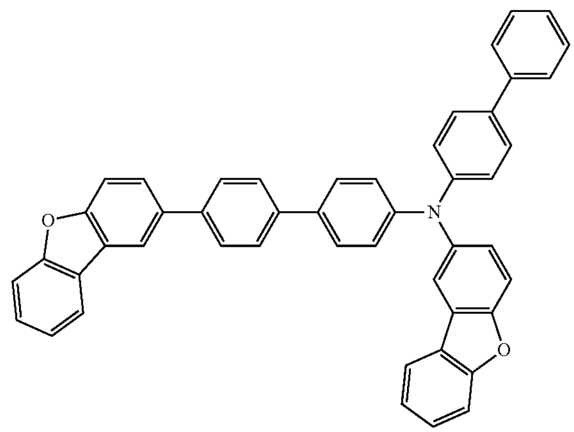
[A-355]
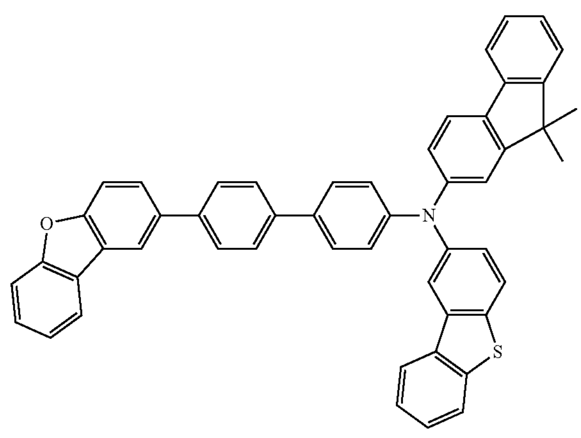

-continued
[A-356]
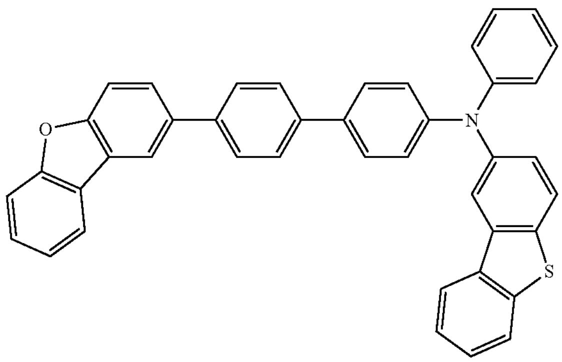
[A-357]
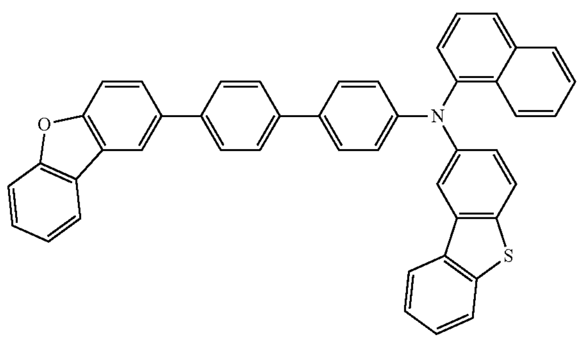
[A-358]
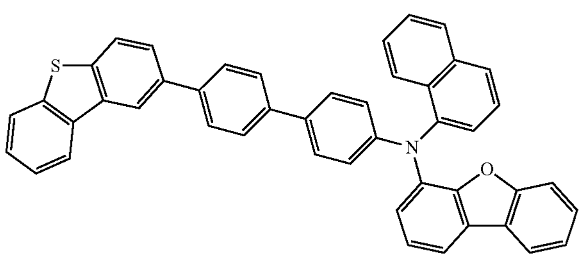
[A-359]
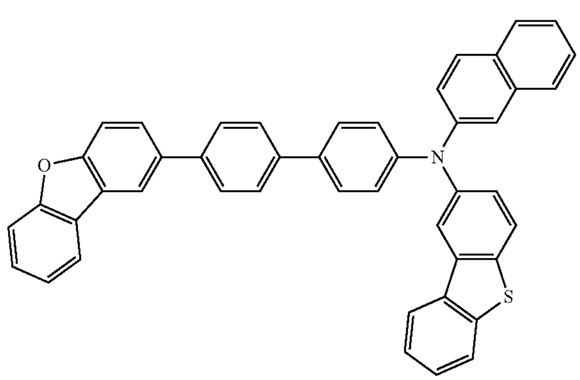
-continued
[A-360]
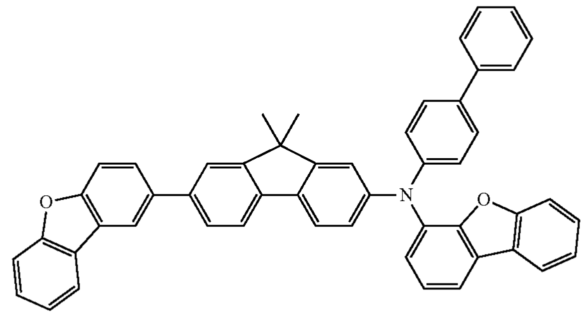
[A-361]
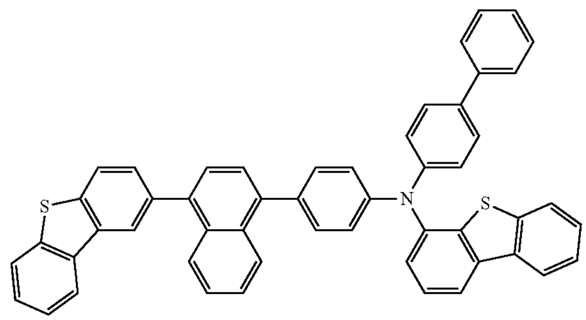
[A-362]
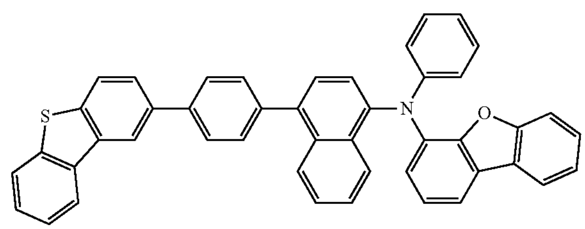
[A-363]
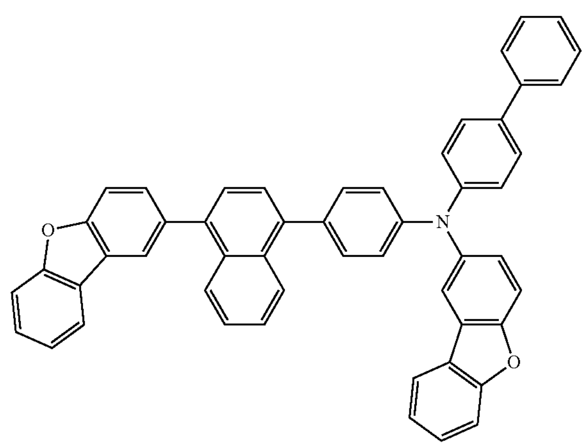

-continued
[A-364]
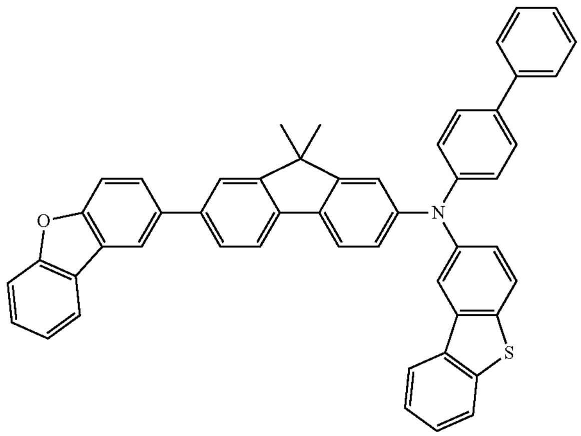
[A-365]
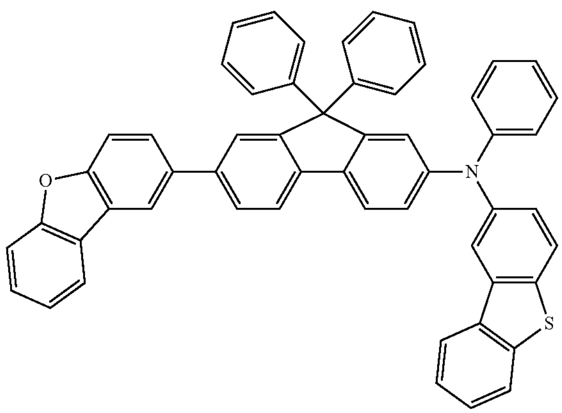
[A-366]
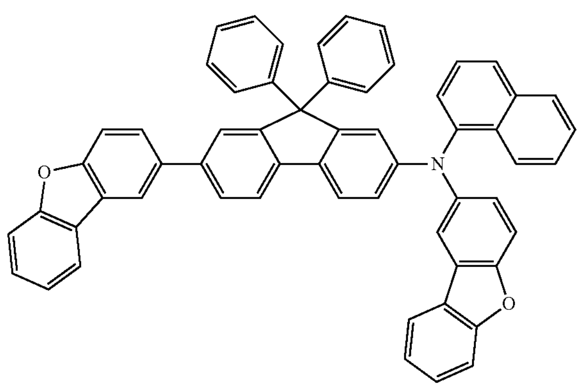
[A-367]
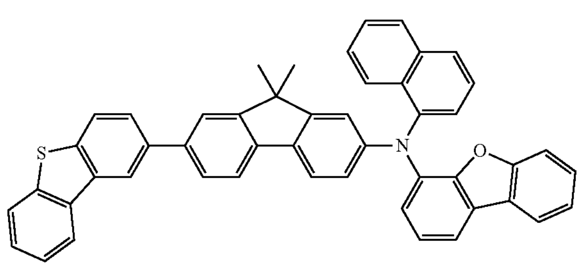
-continued
[A-368]
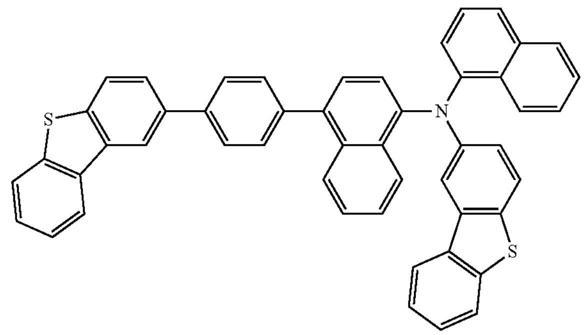
[A-369]
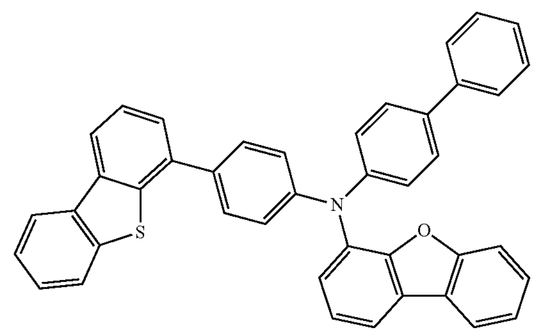
[A-370]
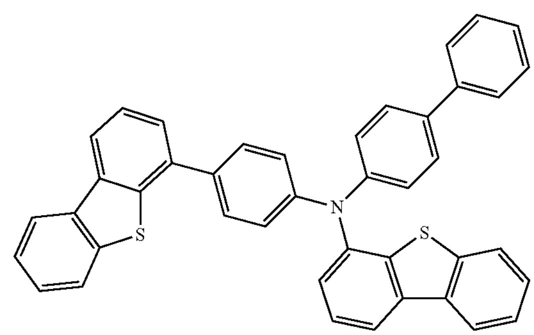
[A-371]
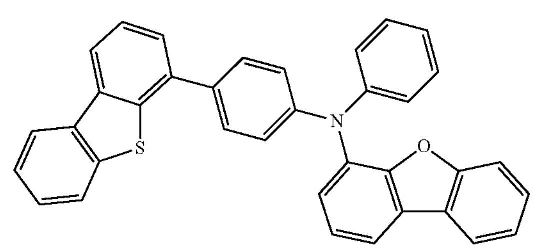

-continued
[A-372]
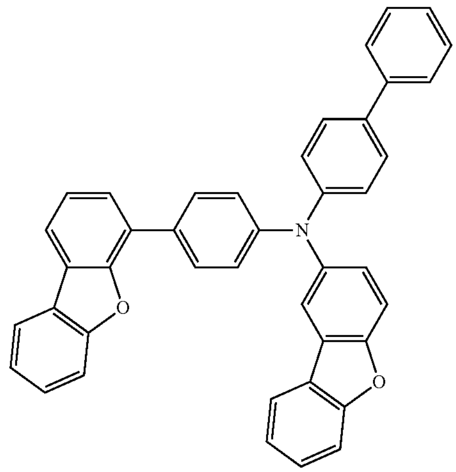
[A-373]
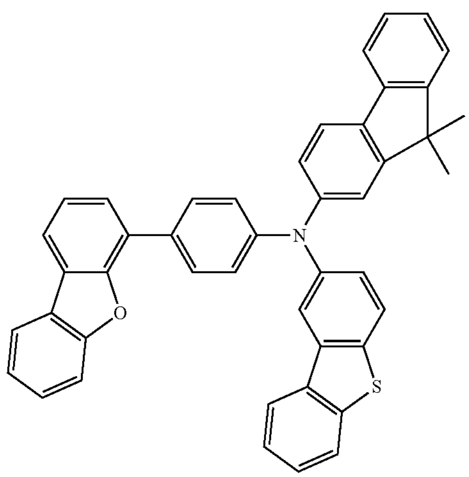
[A-374]
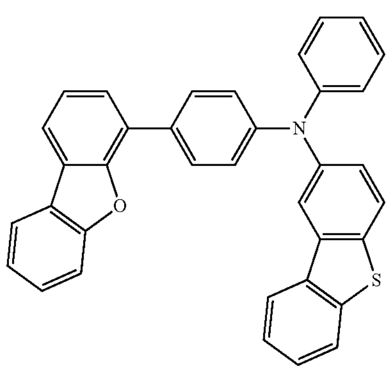
-continued
[A-375]
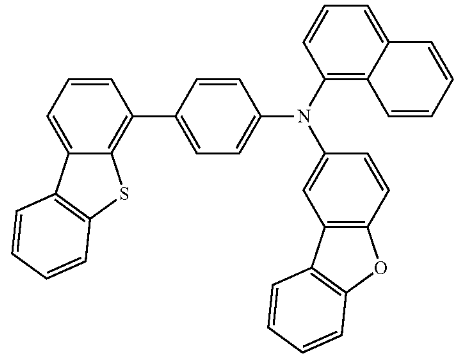
[A-376]
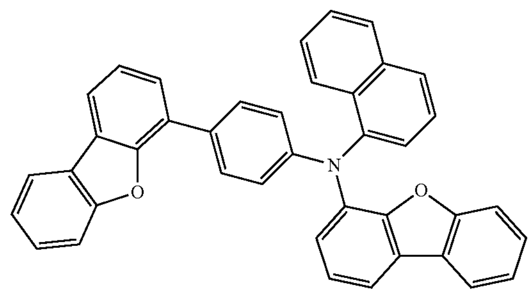
[A-377]
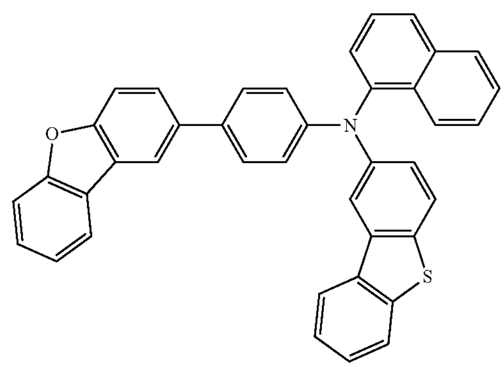
[A-378]
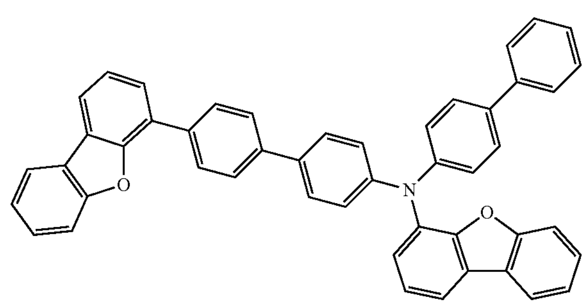

-continued
[A-379]
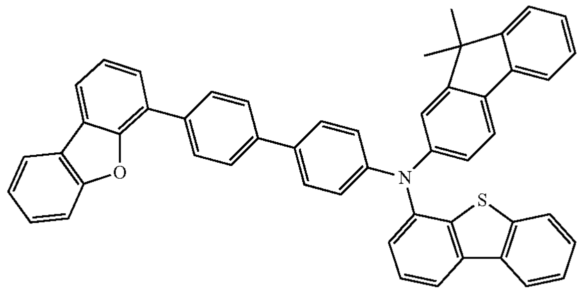
[A-380]
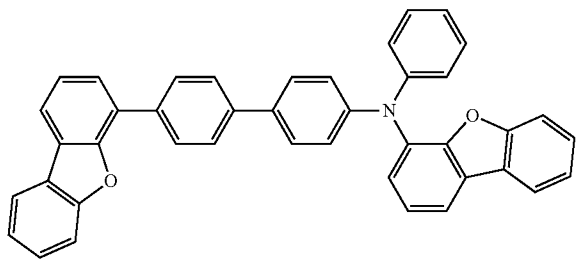
[A-381]
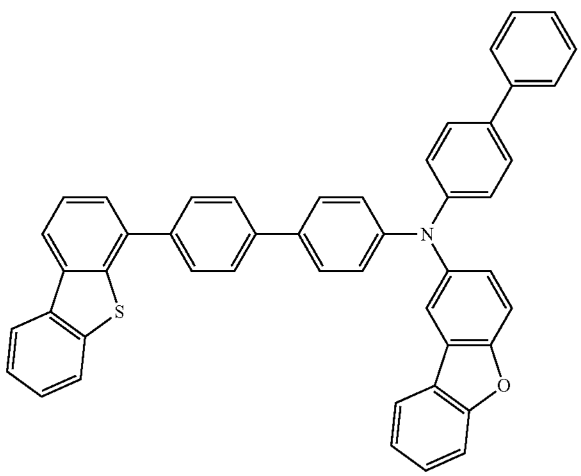
[A-382]
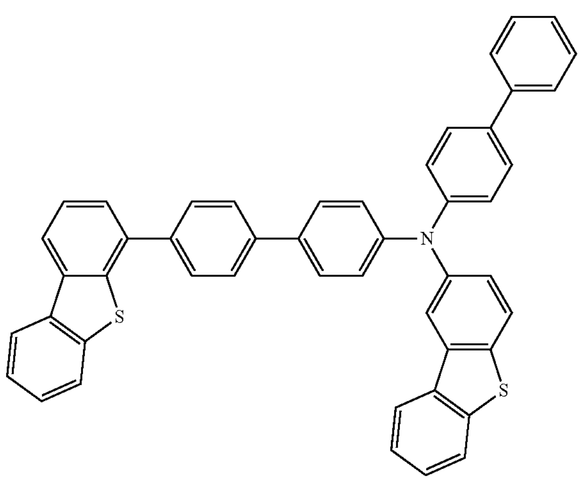
-continued
[A-383]
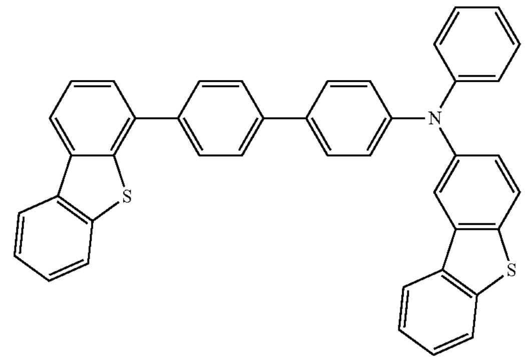
[A-384]
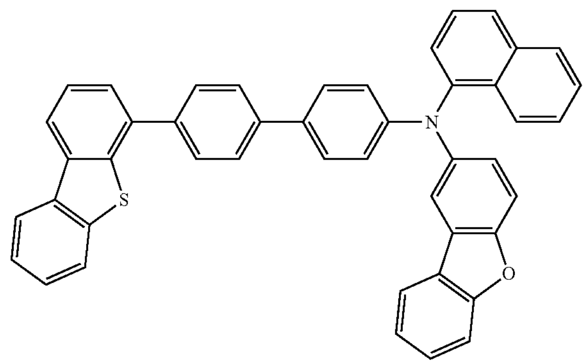
[A-385]
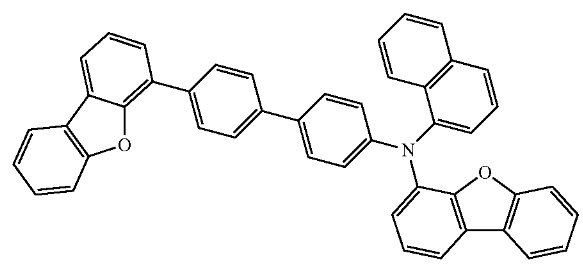
[A-386]
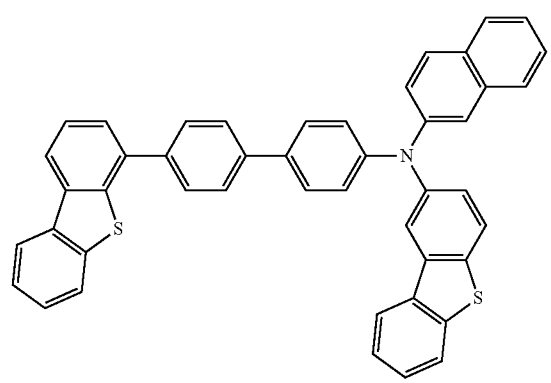

-continued
[A-387]
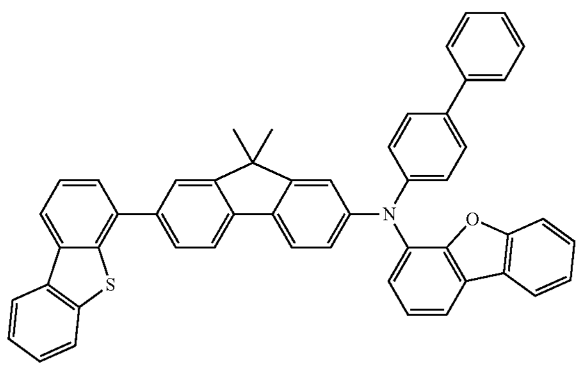
[A-388]
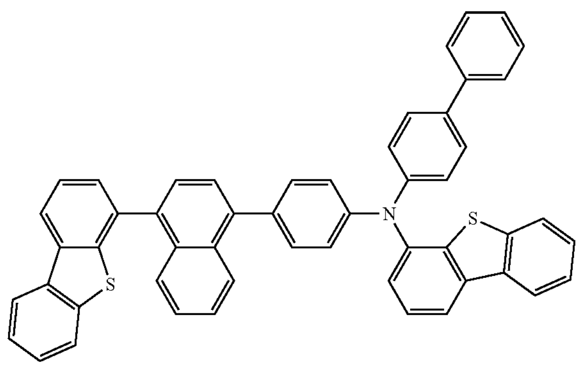
[A-389]
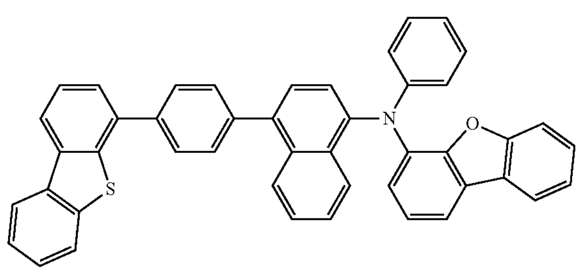
[A-390]
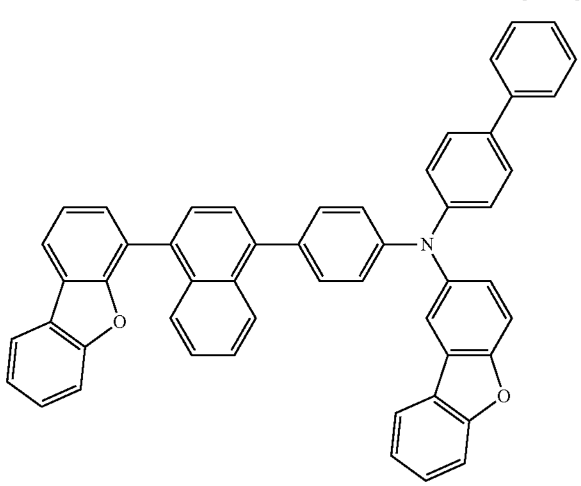
-continued
[A-391]
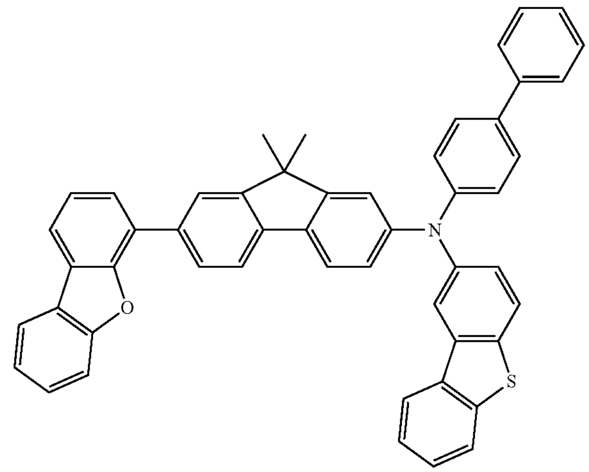
[A-392]
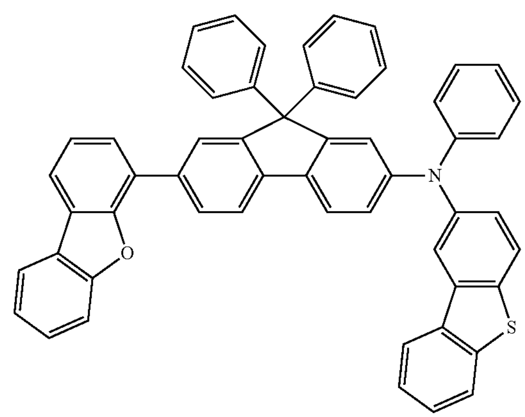
[A-393]
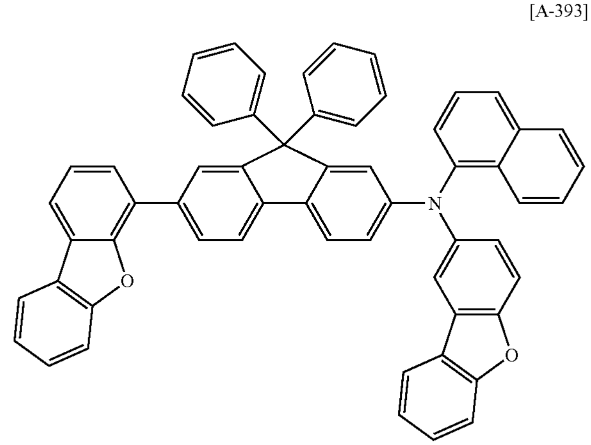

-continued

[A-394]

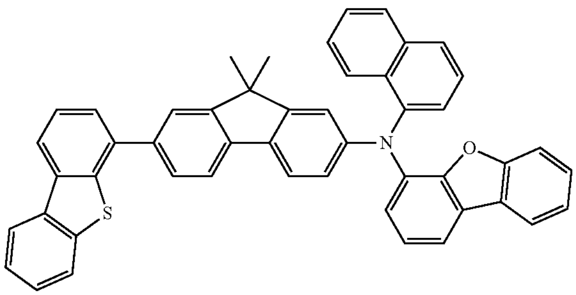

[A-395]

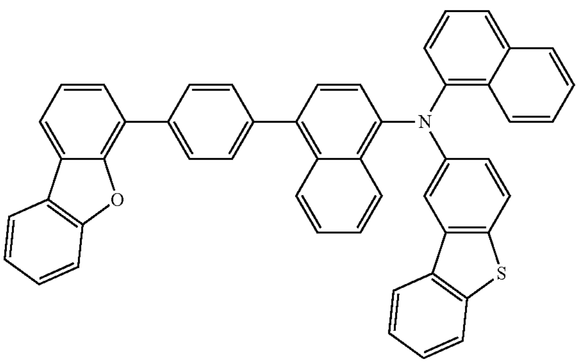

In an implementation, the compound for an optoelectronic device according to one embodiment may be represented by one of the following Chemical Formulae A-306 to A-323. In the following structure, dibenzofuran having a hole transporting property or dibenzothiophene is asymmetrically bound to a carbazole structure to form a tertiary arylamine and includes a hetero aromatic ring group as an electron acceptor, and therefore the structure shows asymmetric bipolar characteristics in its molecular structure. High efficiency may be realized when it is used as a phosphorescent host material and a hole blocking layer material.

[A-306]

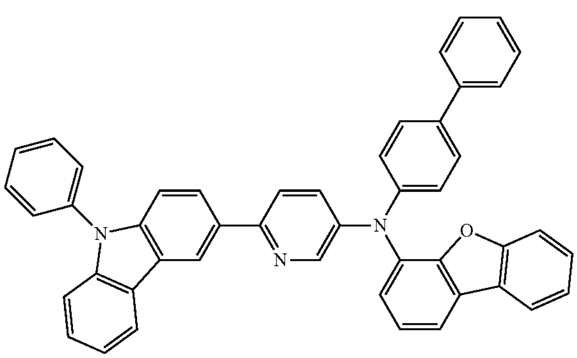

-continued

[A-307]

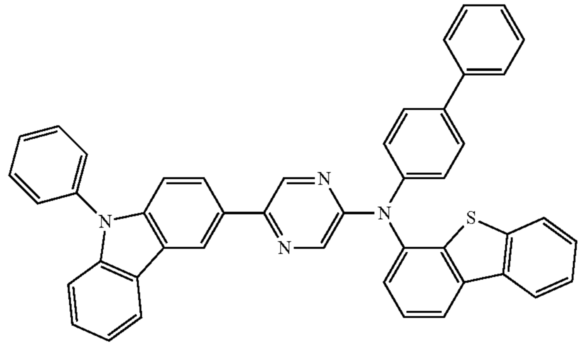

[A-308]

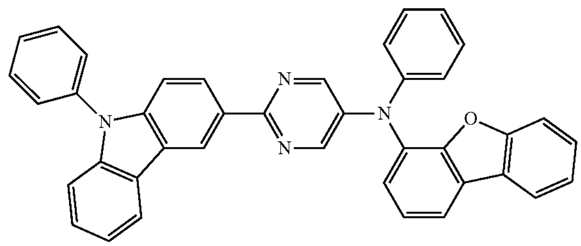

[A-309]

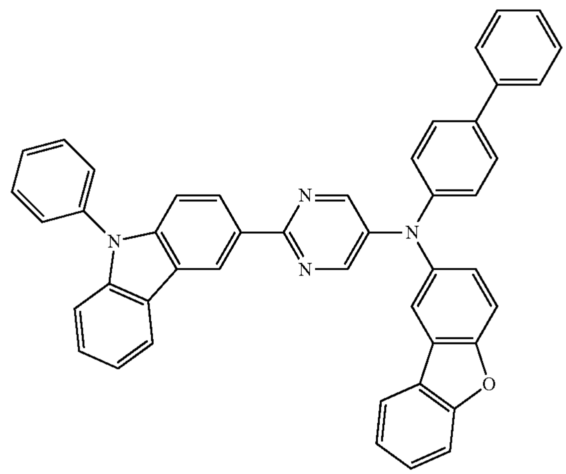

[A-310]

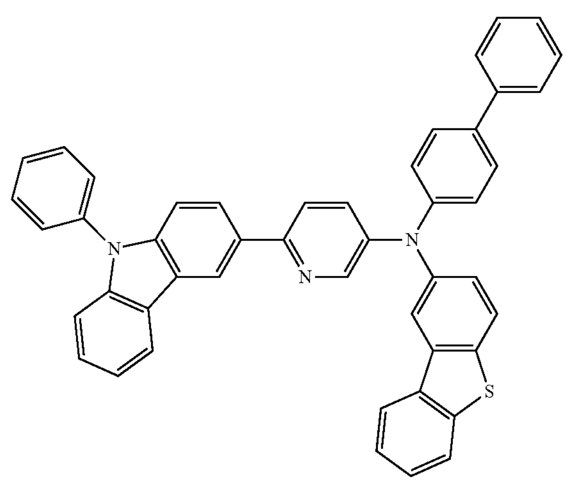

-continued
[A-311]
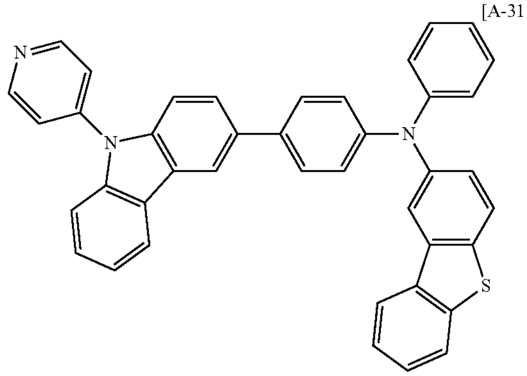
[A-312]
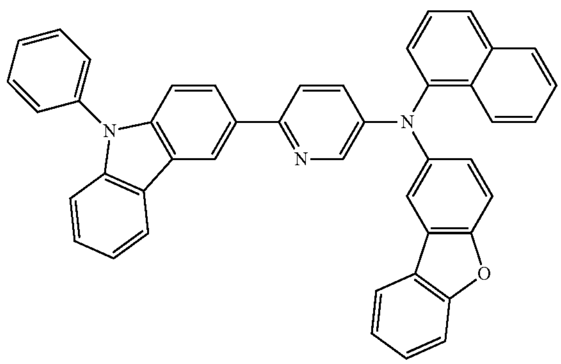
[A-313]
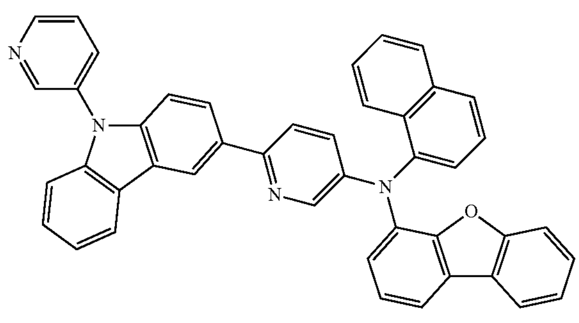
[A-314]
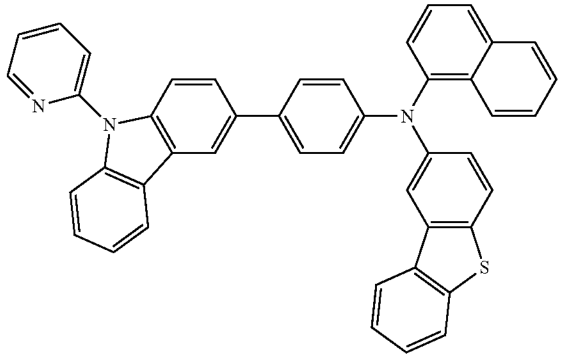
-continued
[A-315]
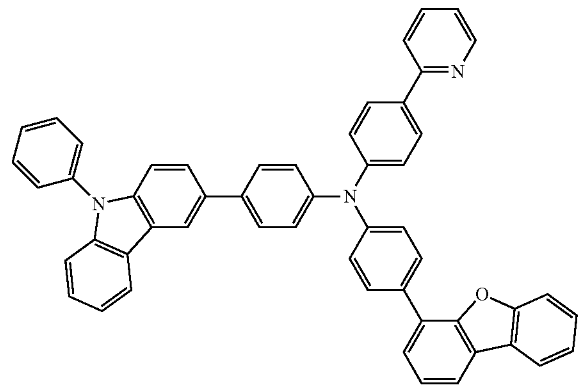
[A-316]
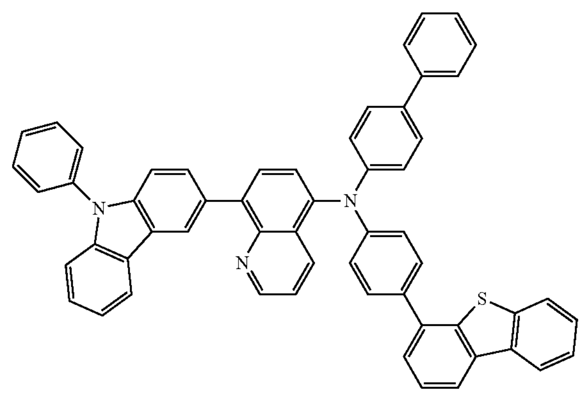
[A-317]
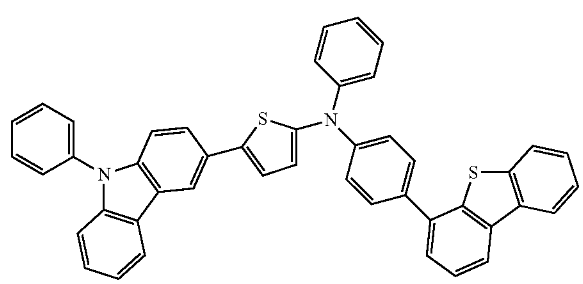

[A-318]
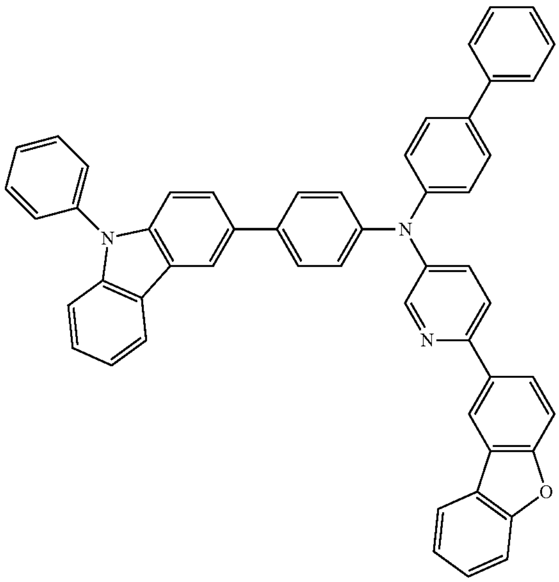
[A-319]
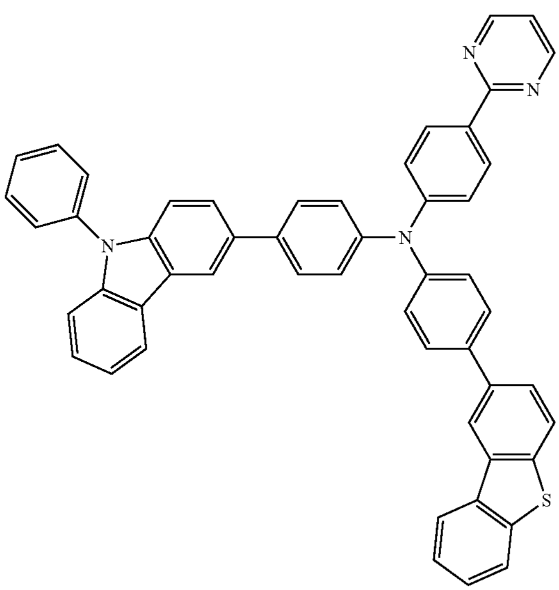
[A-320]
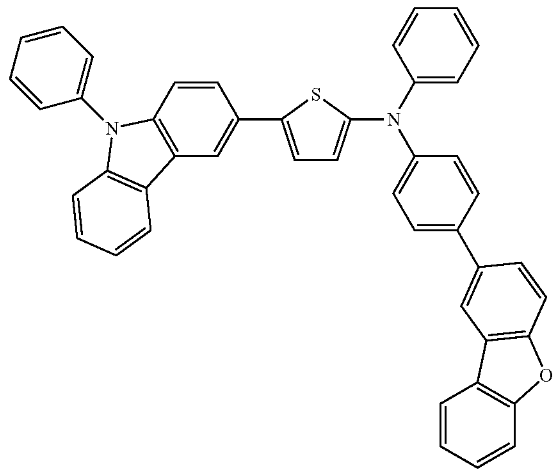
[A-321]
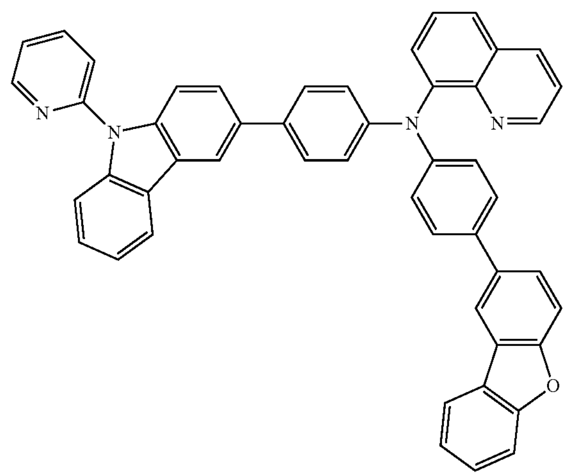
[A-322]
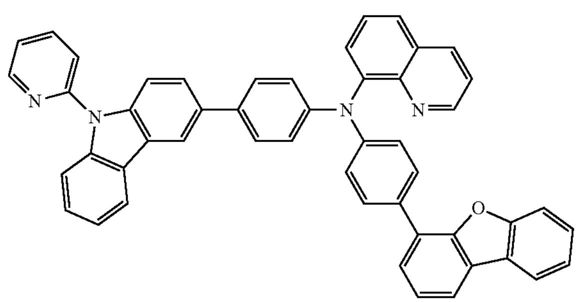

-continued

[A-323]

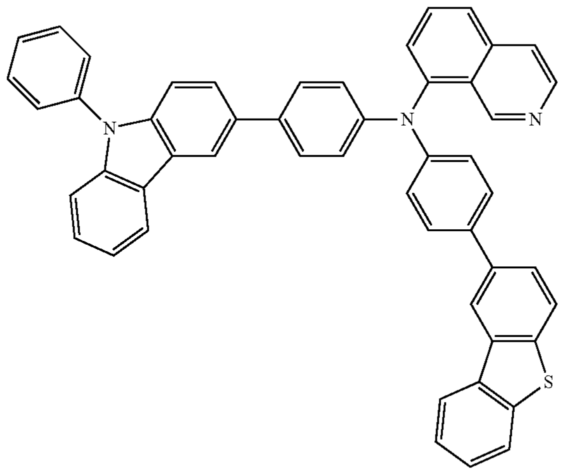

In an implementation, the compound for an optoelectronic device according to one embodiment may be represented by one the following Chemical Formulae A-396 to A-413. In the following structure, dibenzofuran having a hole transporting property or dibenzothiophene is asymmetrically bound to a carbazole structure to form a tertiary arylamine and includes a hetero aromatic ring group as an electron acceptor, and therefore the structure shows asymmetric bipolar characteristics in its molecular structure. High efficiency may be realized when it is used to be a phosphorescent host material and a hole blocking layer material.

[A-396]

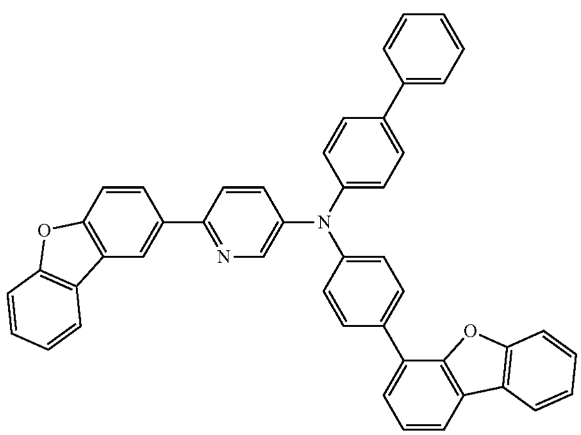

[A-397]

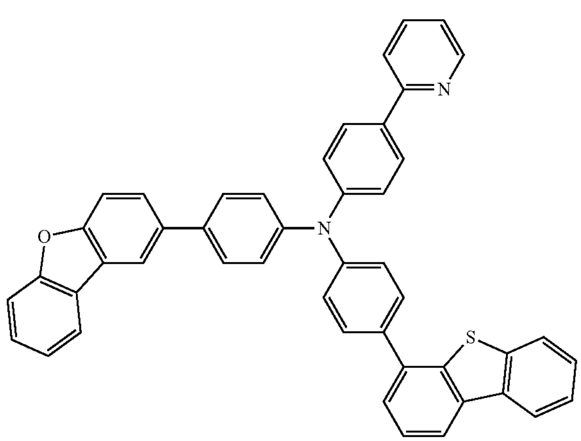

-continued

[A-398]

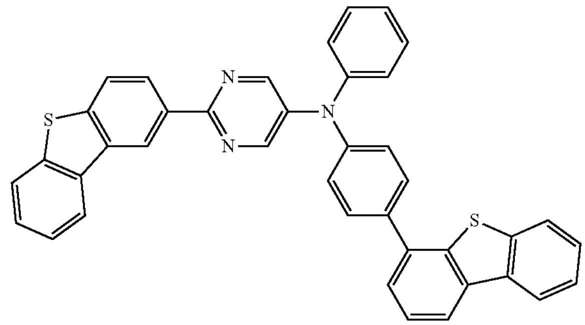

[A-399]

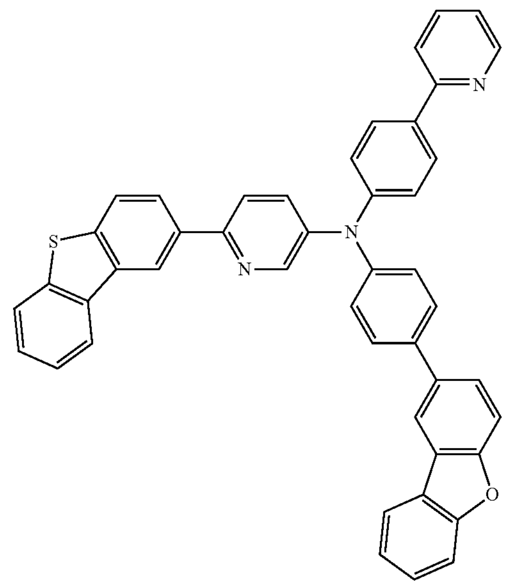

[A-400]

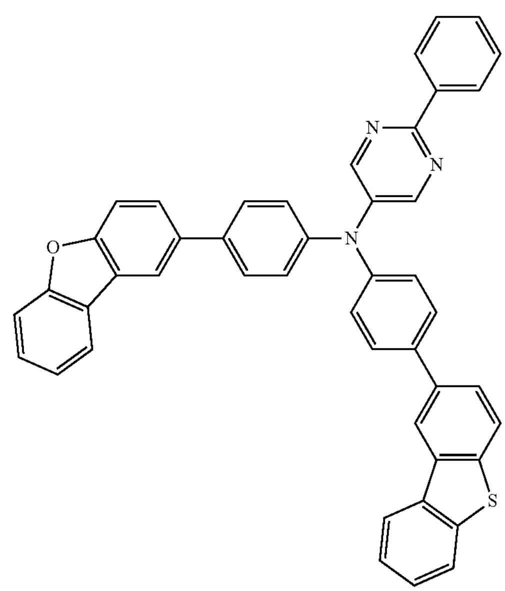

-continued
[A-401]
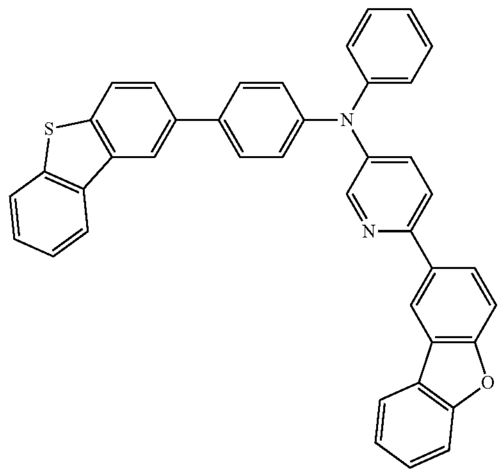
[A-402]
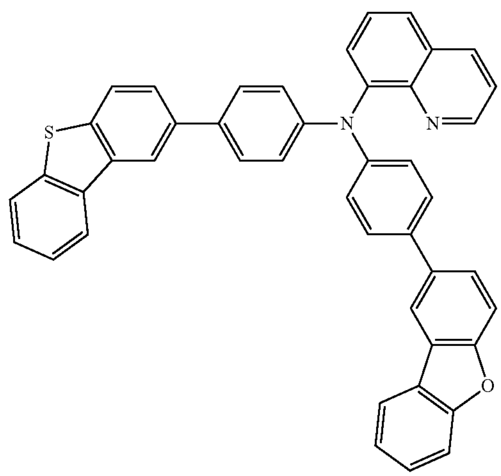
[A-403]
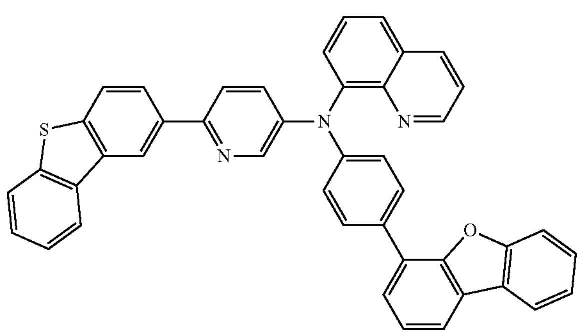
-continued
[A-404]
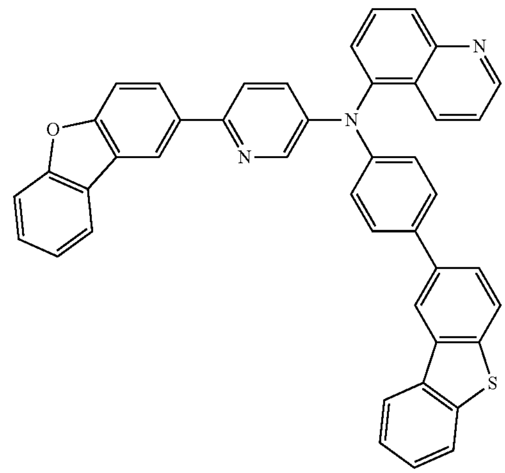
[A-405]
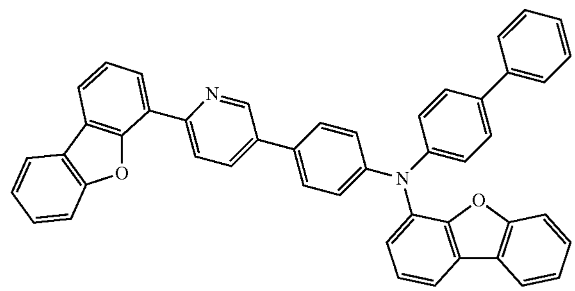
[A-406]
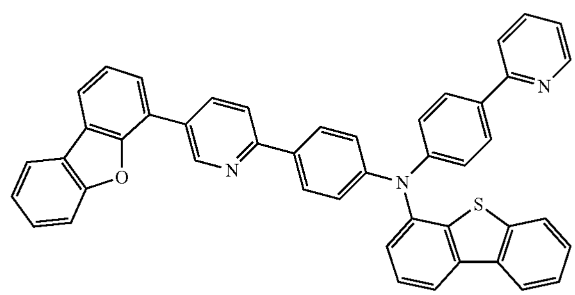
[A-407]
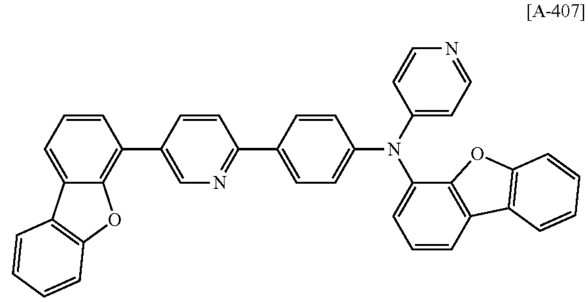

-continued

[A-408]

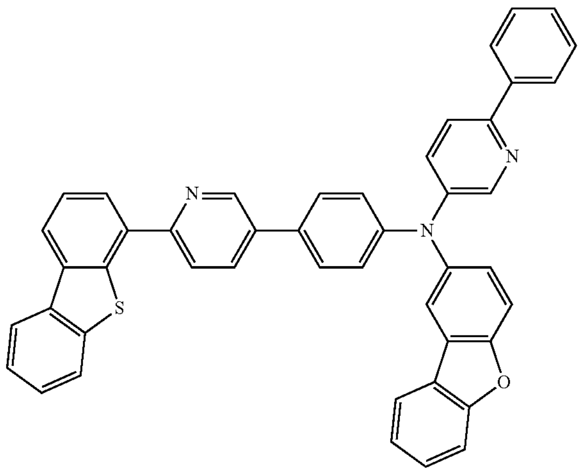

[A-409]

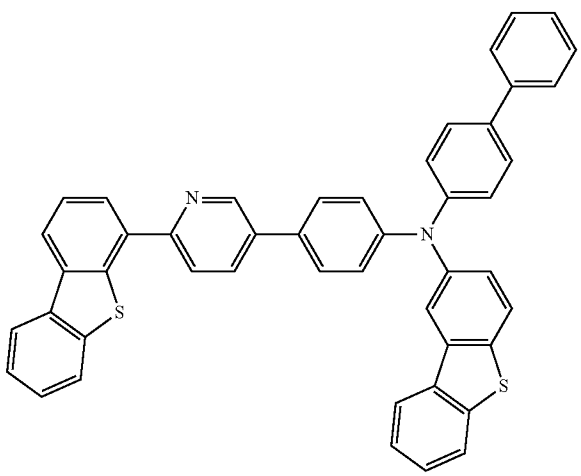

[A-410]

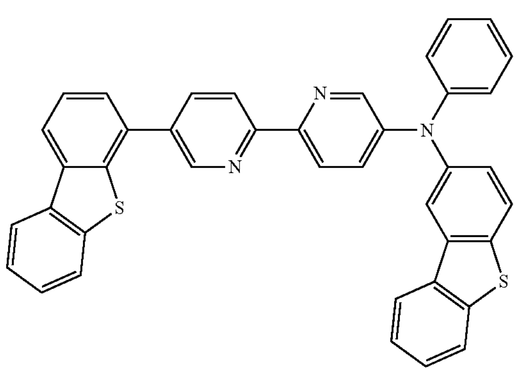

-continued

[A-411]

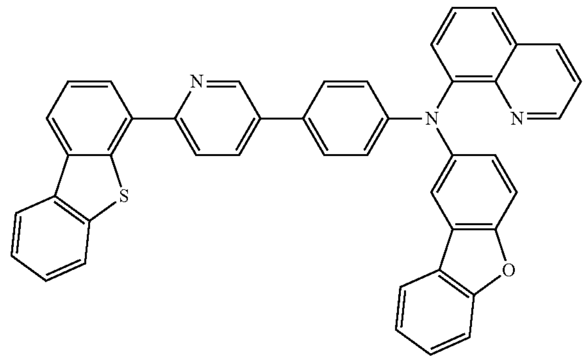

[A-412]

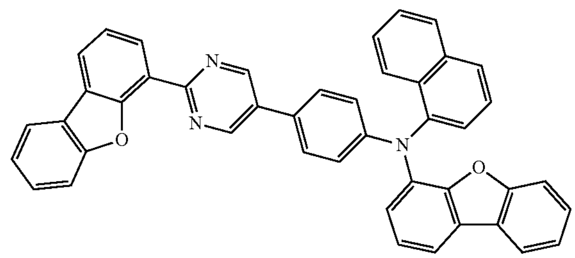

[A-413]

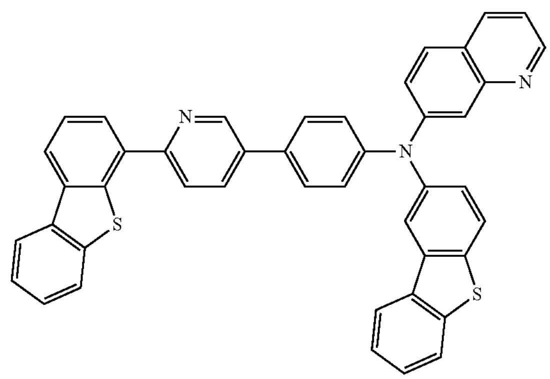

When the compound for an optoelectronic device is applied to an electron blocking layer and a hole transport layer (HTL), electron blocking properties thereof may be reduced due to a functional group having an electron characteristic in a molecule. Therefore, in order to use the compound as an electron blocking layer, the compound may not include a functional group having an electron characteristic. Examples of the functional group having an electron characteristic may include benzoimidazole, pyridine, pyrazine, pyrimidine, triazine, quinoline, isoquinoline, or the like. However, the explanations as above are limited to when the compound is used as an electron blocking layer or a hole transport layer (HTL) (or a hole injection layer (HIL)).

When the compound has electron-transporting and hole-transporting properties, a light emitting diode may have improved life-span and reduced driving voltage by introducing the electron transport backbone.

According to an embodiment, a compound for an optoelectronic device may have a maximum light emitting wavelength ranging from about 320 to about 500 nm and triplet excitation energy of about 2.0 eV or more (T1), e.g., ranging from about 2.0 to about 4.0 eV. When the compound has a high excitation energy, it may transport a charge to a dopant well and may help improve luminous efficiency of the dopant, and may also decrease a driving voltage by freely regulating HOMO and LUMO energy levels. Accordingly, the compound according to an embodiment may be usefully applied as a host material or a charge-transporting material.

The compound for an optoelectronic device may also be used as, e.g., a nonlinear optical material, an electrode material, a chromic material, and as a material applicable to an optical switch, a sensor, a module, a waveguide, an organic transistor, a laser, an optical absorber, a dielectric material, and a membrane due to its optical and electrical properties.

The compound for an optoelectronic device including the above compound may have a glass transition temperature of about 90° C. or higher and a thermal decomposition temperature of about 400° C. or higher, so as to improve thermal stability. Accordingly, it is possible to produce an organic photoelectric device having high efficiency.

The compound for an optoelectronic device including the above compound may play a role of emitting light or injecting and/or transporting electrons. For example, the compound for an optoelectronic device may be used as a phosphorescent or fluorescent host material, a blue light emitting dopant material, or an electron transporting material.

The compound for an optoelectronic device according to an embodiment may be used for an organic thin layer. Thus, the compound may help improve the life-span characteristic, efficiency characteristic, electrochemical stability, and thermal stability of an organic photoelectric device, and decrease the driving voltage.

The optoelectronic device may include, e.g., an organic photoelectronic device, an organic light emitting diode, an organic solar cell, an organic transistor, an organic photosensitive drum, an organic memory device, or the like. For example, the compound for an optoelectronic device according to an embodiment may be included in an electrode or an electrode buffer layer in the organic solar cell to help improve quantum efficiency, and it may be used as an electrode material for a gate, a source-drain electrode, or the like in the organic transistor.

Hereinafter, an organic light emitting diode will be described in detail.

According to an embodiment, an organic light emitting diode including an anode, a cathode, and at least one organic thin layer between the anode and the cathode is provided. At least one of the organic thin layers may include the compound for an optoelectronic device according to an embodiment.

The organic thin layer that may include the compound for an optoelectronic device may include a layer selected from the group of an emission layer, a hole transport layer (HTL), a hole injection layer (HIL), an electron transport layer (ETL), an electron injection layer (EIL), a hole blocking film, and a combination thereof. The at least one layer may include the compound for an optoelectronic device according to an embodiment. For example, the compound for an optoelectronic device according to an embodiment may be included in a hole transport layer (HTL) or a hole injection layer (HIL). In an implementation, when the compound for an optoelectronic device is included in the emission layer, the compound for an optoelectronic device may be included as a phosphorescent or fluorescent host, and particularly, as a fluorescent blue dopant material.

FIGS. 1 to 5 illustrate cross-sectional views of an organic photoelectric device including the compound for an optoelectronic device according to an embodiment.

Referring to FIGS. 1 to 5, organic photoelectric devices 100, 200, 300, 400, and 500 according to an embodiment may include at least one organic thin layer 105 interposed between an anode 120 and a cathode 110.

The anode 120 may include an anode material laving a large work function to facilitate hole injection into an organic thin layer. The anode material may include, e.g., a metal such as nickel, platinum, vanadium, chromium, copper, zinc, and gold, or alloys thereof; a metal oxide such as zinc oxide, indium oxide, indium tin oxide (ITO), and indium zinc oxide (IZO); a combined metal and oxide such as ZnO:Al or SnO2:Sb; or a conductive polymer such as poly(3-methylthiophene), poly[3,4-(ethylene-1,2-dioxy)thiophene] (PEDT), polypyrrole, and polyaniline, but is not limited thereto. In an implementation, a transparent electrode including indium tin oxide (ITO) may be used as an anode.

The cathode 110 may include a cathode material having a small work function to facilitate electron injection into an organic thin layer. The cathode material may include, e.g., a metal such as magnesium, calcium, sodium, potassium, titanium, indium, yttrium, lithium, gadolinium, aluminum, silver, tin, and lead, or alloys thereof; or a multi-layered material such as LiF/Al, Liq/Al, $LiO_2$/Al, LiF/Ca, LiF/Al, and $BaF_2$/Ca, but is not limited thereto. In an implementation, a metal electrode including aluminum may be used as a cathode.

Referring to FIG. 1, the organic photoelectric device 100 may include an organic thin layer 105 including only an emission layer 130.

Figure 2:
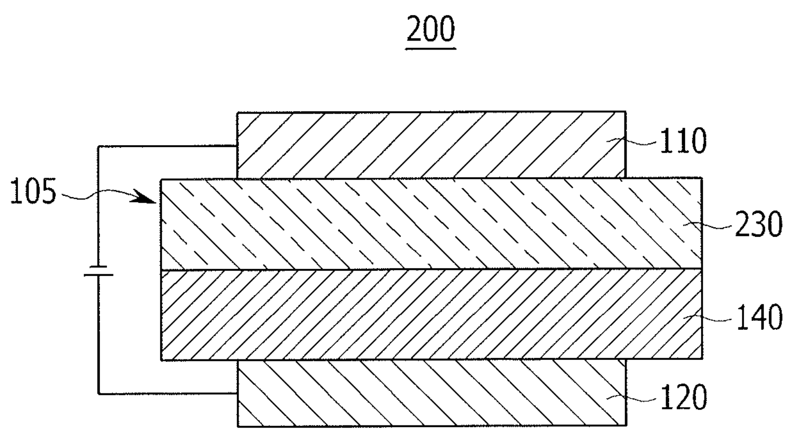

Referring to FIG. 2, a double-layered organic photoelectric device 200 may include an organic thin layer 105 including an emission layer 230 including an electron transport layer (ETL), and a hole transport layer (HTL) 140. The emission layer 230 may also function as an electron transport layer (ETL), and the hole transport layer (HTL) 140 may have an excellent binding property with a transparent electrode such as ITO or an excellent hole transporting property.

Figure 3:
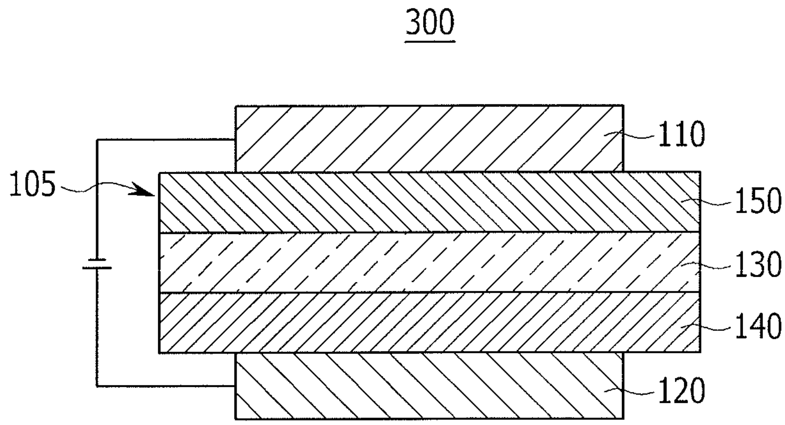

Referring to FIG. 3, a three-layered organic photoelectric device 300 may include an organic thin layer 105 including an electron transport layer (ETL) 150, an emission layer 130, and a hole transport layer (HTL) 140. The emission layer 130 may be independently installed, and layers having an excellent electron transporting property or an excellent hole transporting property may be separately stacked.

Figure 4:
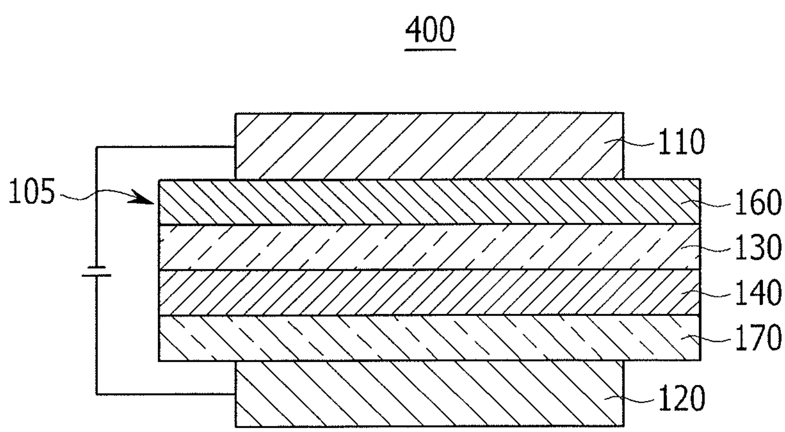

As shown in FIG. 4, a four-layered organic photoelectric device 400 may include an organic thin layer 105 including an electron injection layer (EIL) 160, an emission layer 130, a hole transport layer (HTL) 140, and a hole injection layer (HIL) 170 for binding with the anode of, e.g., ITO.

Figure 5:
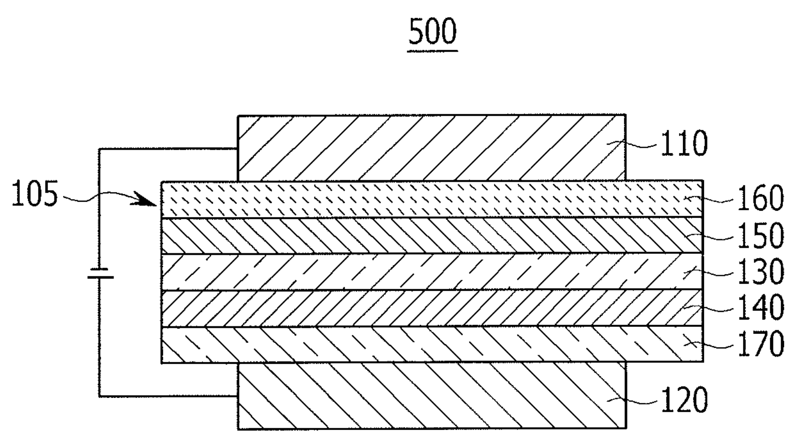

As shown in FIG. 5, a five layered organic photoelectric device 500 may include an organic thin layer 105 including an electron transport layer (ETL) 150, an emission layer 130, a hole transport layer (HTL) 140, and a hole injection layer (HIL) 170, and may further include an electron injection layer (EIL) 160 to achieve a low voltage.

In FIG. 1 to FIG. 5, the organic thin layer 105 including at least one selected from the group of an electron transport layer (ETL) 150, an electron injection layer (EIL) 160, an emission layer 130 or 230, a hole transport layer (HTL) 140, a hole injection layer (HIL) 170, and combinations thereof may include a compound for an optoelectronic device. The compound for the organic photoelectric device may be used for an electron transport layer (ETL) 150 or electron injection layer (EIL) 160. When the compound is used for the electron transport layer (ETL), it is possible to provide an organic photoelectric device having a simpler structure because the device may not require an additional hole blocking layer (not shown).

In an implementation, when the compound for an optoelectronic device is included in the emission layer 130 and 230, the compound for the organic photoelectric device may be included as a phosphorescent or fluorescent host or a fluorescent blue dopant.

The organic photoelectric device may be fabricated by, e.g., forming an anode on a substrate; forming an organic thin layer in accordance with a dry coating method such as evaporation, sputtering, plasma plating, and ion plating or a wet coating method such as spin coating, dipping, and flow coating; and providing a cathode thereon.

Another embodiment provides a display device including the organic photoelectric device according to the above embodiment.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Preparation of Compound for Optoelectronic Device

Synthesizing Intermediate Product

Synthesis of Intermediate Product, M-1

[Reaction Scheme 1]

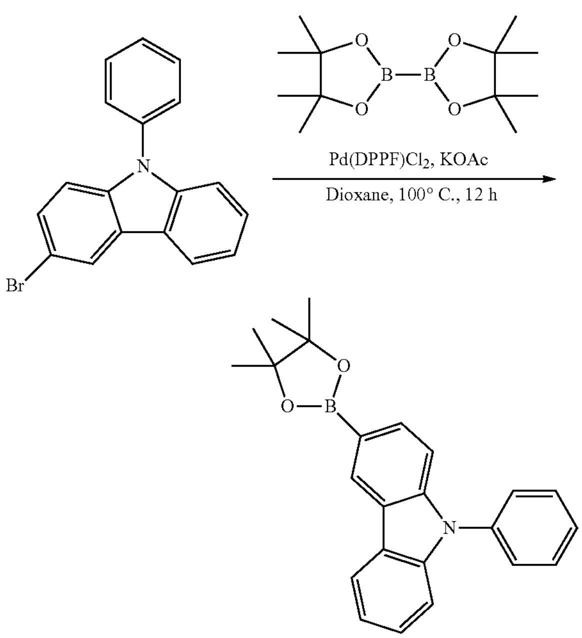

M-1

50 g (155.18 mmol) of 3-bromo-9-phenyl-9H-carbazole, 3.41 g (4.65 mmol) of Pd(dppf)$Cl_2$, 51.32 g (201.8 mmol) of bis(pinacolato)diboron, and 45.8 g (465.5 mmol) of potassium acetate were dissolved in 520 ml of 1,4-dioxane. The reactants were refluxed and agitated under a nitrogen atmosphere for 12 hours and extracted 3 times with dichloromethane and distilled water. The extract was dried with magnesium sulfite and filtered, and the filtrate was concentrated under reduced pressure. The product was purified with n-hexane/dichloromethane mixed at a volume ratio of 7:3 through silica gel column chromatography, and 43 g of a white solid intermediate M-1 was acquired as a desired compound (yield: 75%).

LC-Mass (theoretical mass: 369.19 g/mol, measured mass: M+1=370 g/mol)

Synthesis of Intermediate Product, M-2

[Reaction Scheme 2]

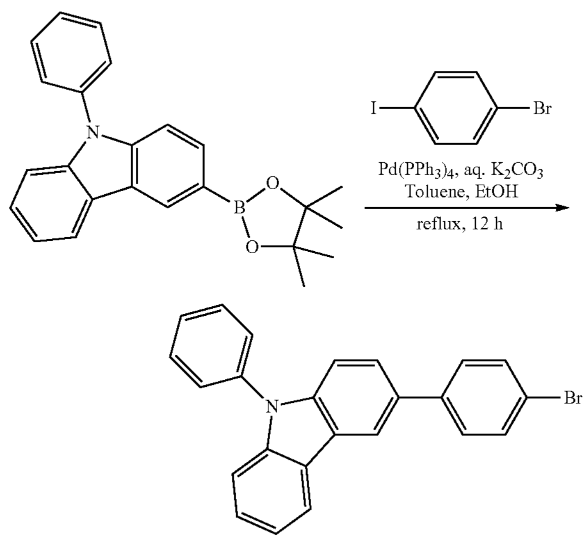

M-2

40 g (108.3 mmol) of the intermediate M-1, 30.6 g (108.3 mmol) of 1-bromo-4-iodobenzene, and 1.25 g (1.08 mmol) of tetrakis(triphenylphosphine) palladium were added to a flask and dissolved in 270 ml of toluene and 135 mL of ethanol under a nitrogen atmosphere.

Then, 135 ml of an aqueous solution including 31.9 g (58.9 mmol) of potassium carbonate was added to the reactants and then refluxed and agitated for 12 hours. After the reaction, the reactants were extracted with ethyl acetate. The extract was dried with magnesium sulfite and filtered. Then, the filtrate was concentrated under reduced pressure. The product was purified with n-hexane/dichloromethane mixed in a volume ratio of 7:3 through silica gel column chromatography, and 35 g of a white solid intermediate M-2 was acquired as a desired compound (yield: 75%).

LC-Mass (theoretical mass: 398.29 g/mol, measured mass: M+1=399 g/mol, M+3=401 g/mol)

Synthesis of Intermediate Product, M-3

[Reaction Scheme 3]

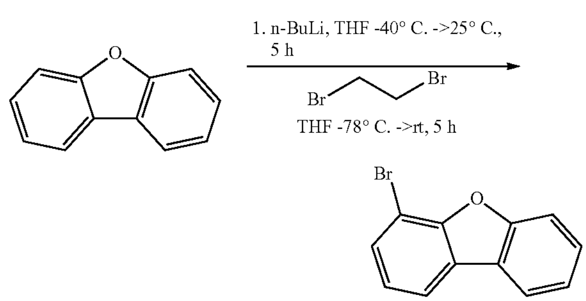

M-3

10 g (59.5 mmol) of a dibenzofuranyl group was added to a two neck round-bottomed flask that was dried under vacuum, and 119 mL of anhydrous tetrahydrofuran was added under a nitrogen atmosphere followed by dissolving. Then, the reactants were cooled down to −40° C. and agitated.

Then, 26 mL of 2.5 M n-butyl lithium (in hexane, 65.5 mmol) was slowly added to the reactants and the resultant was agitated for 5 hours at room temperature under a nitrogen atmosphere. The reactants were cooled down to −78° C., and 22.4 g (119 mmol) of 1,2-dibromoethane that was dissolved in 10 mL anhydrous tetrahydrofuran was slowly added and then agitated for 5 hours at room temperature.

After the reaction, the solution was concentrated under reduced pressure to remove the solvent. Then the reactants were extracted with distilled water and dichloromethane, and the extract was dried with magnesium sulfite and filtered. The filtrate was concentrated under reduced pressure. The reactants were recrystallized in n-hexane and 11 g of a white solid intermediate M-3 was acquired as a desired compound (yield: 75%).

GC-Mass (theoretical mass: 245.97 g/mol, measured mass: M=246 g/mol, M+2=248 g/mol)

Synthesis of Intermediate Product, M-4

[Reaction Scheme 4]

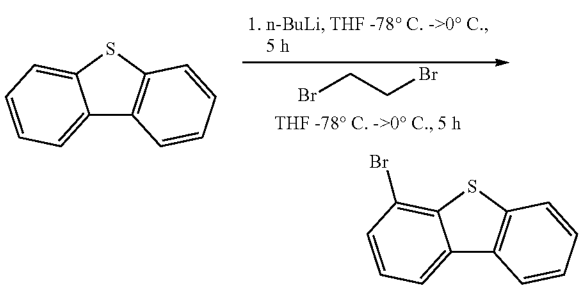

M-4

10 g (54.3 mmol) of dibenzothiophene that was dried under a vacuum condition was added to a two neck round-bottomed flask and dissolved with 120 mL of anhydrous tetrahydrofuran under a nitrogen atmosphere. Then, the reactant was cooled down to −40° C. and agitated.

Then, 24 mL of 2.5 M n-butyl lithium (in hexane, 59.7 mmol) was slowly added to the reactants and agitated for 5 hours at room temperature under a nitrogen atmosphere. The reactants were cooled down to −78° C., and 20.4 g (108.6 mmol) of 1,2-dibromoethane that was dissolved in 10 mL anhydrous tetrahydrofuran was slowly added and then agitated for 5 hours at room temperature. After the reaction, the solution was concentrated under reduced pressure to remove the solvent. Then the reactant was extracted with distilled water and dichloromethane, and the extract was dried with magnesium sulfite and filtered. The filtrate was concentrated under reduced pressure. The reactant was recrystallized in n-hexane, and 11 g of a white solid intermediate M-4 was acquired as a desired compound (yield: 77%).

GC-Mass (theoretical mass: 261.95 g/mol, measured mass: M=262 g/mol, M+2=264 g/mol)

Synthesis of Intermediate Product, M-5

[Reaction Scheme 5]

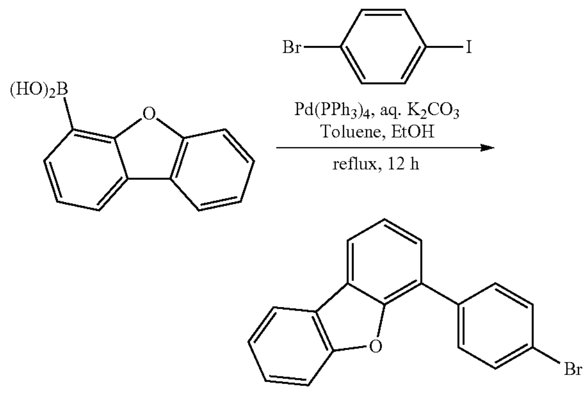

M-5

20 g (94.4 mmol) of 4-dibenzofuranboronic acid, 28 g (99.2 mmol) of 1-bromo-4-iodobenzene, and 1.08 g (0.94 mmol) of tetrakis(triphenylphosphine)palladium were added to a flask and dissolved in 240 ml of toluene and 120 mL of ethanol under a nitrogen atmosphere. Then, 120 ml of an aqueous solution including 28 g (188.8 mmol) of potassium carbonate was added to the reactant and then refluxed and agitated for 12 hours. After the reaction, the reactant was extracted with ethyl acetate. The extract was dried with magnesium sulfite and filtered. Then, the filtrate was concentrated under reduced pressure. The product was purified with n-hexane/dichloromethane mixed in a volume ratio of 9:1 through silica gel column chromatography, and then 27 g of a white solid intermediate M-5 was acquired as a desired compound (yield: 89%).

LC-Mass (theoretical mass: 322.00 g/mol, measured mass: M+1=323 g/mol, M+3=325 g/mol)

Synthesis of Intermediate Product, M-6

[Reaction Scheme 6]

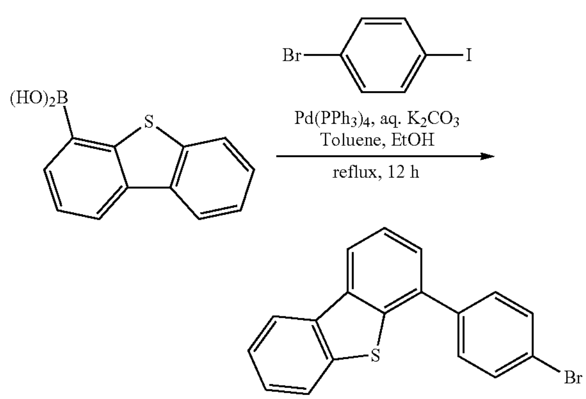

M-6

20 g (87.69 mmol) of 4-dibenzothiopheneboronic acid, 27.3 g (96.46 mmol) of 1-bromo-4-iodobenzene, and 1.01 g (0.88 mmol) of tetrakis(triphenylphosphine)palladium were added to a flask and dissolved in 220 ml of toluene and 110 mL of ethanol under a nitrogen atmosphere. Then, 110 ml of an aqueous solution including 25.8 g (175.4 mmol) of potassium carbonate was added to the reactant and then refluxed and agitated for 12 hours. After the reaction, the reactant was extracted with ethyl acetate. The extract was dried with magnesium sulfite and filtered. Then, the filtrate was concentrated under reduced pressure. The product was purified with n-hexane/dichloromethane mixed in a volume ratio of 9:1 through silica gel column chromatography, and then 25 g of a white solid intermediate M-6 was acquired as a desired compound (yield: 83%).

LC-Mass (theoretical mass: 337.98 g/mol, measured mass: M+1=338 g/mol, M+3=340 g/mol)

Synthesis of Intermediate Product, M-7

[Reaction Scheme 7]

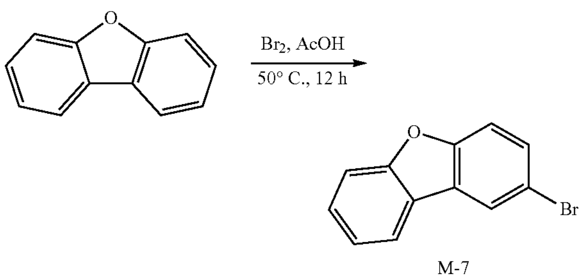

30 g (178.4 mmol) of dibenzofuran was added to a round-bottomed flask and dissolved in 270 g of acetic acid. Then, 29 g (181.5 mmol) of bromine that was dissolved in 6 g of acetic acid was slowly added to the reactant at 50° C. for 4 hours. The reactant was further agitated at 50° C. for 8 hours and cooled down, and then the solution was added to distilled water. The orange solid was dissolved in dichloromethane and washed with a sodium thiosulfite aqueous solution, and then the organic layer was dried with magnesium sulfite and filtered. The filtrate was concentrated under reduced pressure. The product was recrystallized in dichloromethane/n-hexane, and 10.1 g of a white solid intermediate M-7 was acquired as a desired compound (yield: 23%).

GC-Mass (theoretical mass: 245.97 g/mol, measured mass: M=246 g/mol, M+2=248 g/mol)

Synthesis of Intermediate Product, M-8

[Reaction Scheme 8]

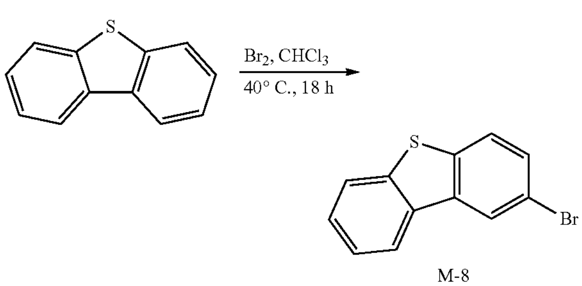

30 g (162.8 mmol) of dibenzothiophene was added to a round-bottomed flask and dissolved in 270 g of acetic acid. Then, 29 g (181.5 mmol) of bromine that was dissolved in 6 g of acetic acid was slowly added to the reactant for 4 hours. The reactant was further agitated at 40° C. for 12 hours and cooled down, and then the solution was added to a sodium thiosulfite aqueous solution. The organic layer was dried with magnesium sulfite and filtered. Then the filtrate was concentrated under reduced pressure. The product was recrystallized with ethyl acetate/n-hexane and 15.4 g of a white solid intermediate M-8 was acquired as a desired compound (yield: 36%).

GC-Mass (theoretical mass: 261.95 g/mol, measured mass: M=262 g/mol, M+2=264 g/mol)

Synthesis of Intermediate Product, M-9

[Reaction Scheme 9]

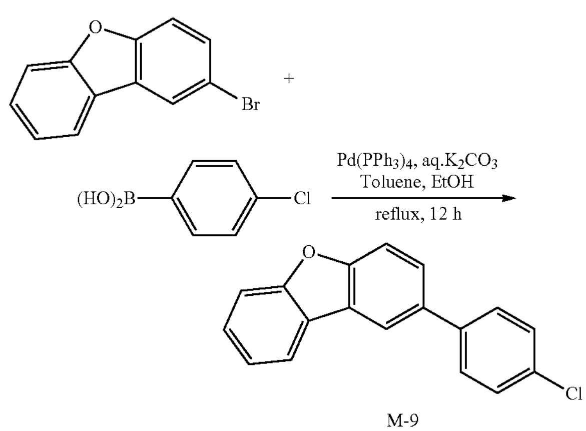

20 g (127.9 mmol) of 4-chlorophenylboronic acid, 30.0 g (121.5 mmol) of intermediate M-7, and 1.48 g (1.28 mmol) of tetrakis(triphenylphosphine)palladium were added to a flask and dissolved in 320 ml of toluene and 160 mL of ethanol under a nitrogen atmosphere. Then, 160 ml of an aqueous solution including 37.7 g (255.8 mmol) of potassium carbonate was added to the reactant and then refluxed and agitated for 12 hours. After the reaction, the reactant was extracted with ethyl acetate. The extract was dried with magnesium sulfite and filtered. Then, the filtrate was concentrated under reduced pressure. The product was purified with n-hexane/dichloromethane mixed in a volume ratio of 9:1 through silica gel column chromatography, and then 28.1 g of a white solid intermediate M-9 was acquired as a desired compound (yield: 83%).

LC-Mass (theoretical mass: 278.05 g/mol, measured mass: M+1=279 g/mol)

Synthesis of Intermediate Product, M-10

[Reaction Scheme 10]

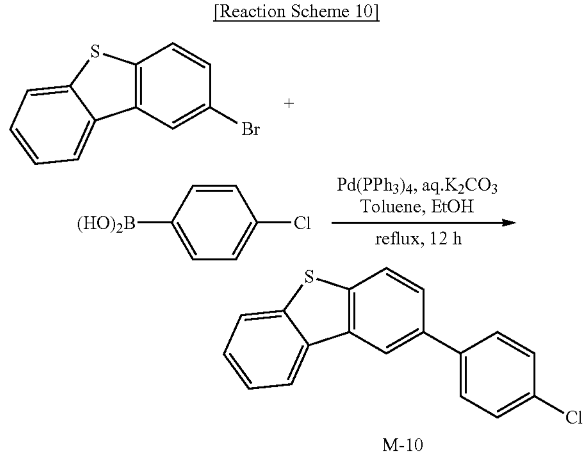

20 g (127.9 mmol) of 4-chlorophenylboronic acid, 32.0 g (121.5 mmol) of intermediate M-8, and 1.48 g (1.28 mmol) of tetrakis(triphenylphosphine)palladium were added to a flask and dissolved in 320 ml of toluene and 160 mL of ethanol under a nitrogen atmosphere. Then, 160 ml of an aqueous solution including 37.7 g (255.8 mmol) of potassium carbonate was added to the reactant and then refluxed and agitated for 12 hours. After the reaction, the reactant was extracted with ethyl acetate. The extract was dried with magnesium sulfite and filtered. Then, the filtrate was concentrated under reduced pressure. The product was purified with n-hexane/dichloromethane mixed in a volume ratio of 9:1 through silica gel column chromatography, and 30.4 g of a white solid intermediate M-10 was acquired as a desired compound (yield: 85%).

LC-Mass (theoretical mass: 294.03 g/mol, measured mass: M+1=295 g/mol)

Synthesis of Intermediate Product, M-11

[Reaction Scheme 11]

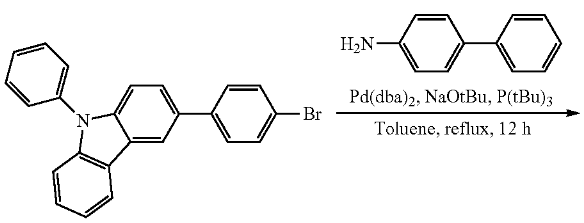

M-2

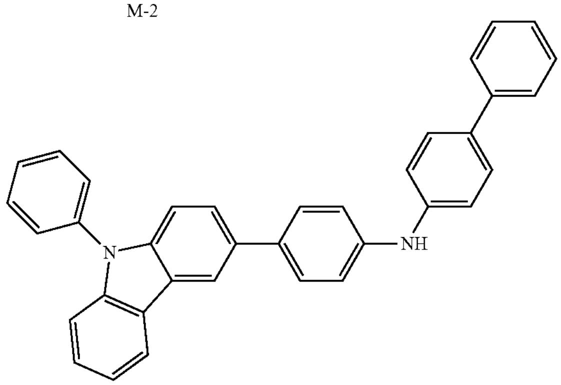

M-11

30 g (75.3 mmol) of intermediate M-2, 14.0 g (82.83 mmol) of 4-aminobiphenyl, 10.9 g (113.0 mmol) of sodium t-butoxide, and 0.46 g (2.26 mmol) of tri-tert-butylphosphine were added to a flask and dissolved in 750 ml of toluene, and 0.43 g (0.753 mmol) of $Pd(dba)_2$ was added, and was then refluxed and agitated for 12 hours under a nitrogen atmosphere. After the reaction, the reactant was extracted with ethyl acetate and distilled water. The extract was dried with magnesium sulfite and filtered. Then, the filtrate was concentrated under reduced pressure. The product was purified with n-hexane/dichloromethane mixed in a volume ratio of 7:3 through silica gel column chromatography, and 27.5 g of a white solid intermediate M-11 was acquired as a desired compound (yield: 75%).

LC-Mass (theoretical mass: 486.21 g/mol, measured mass: M+1=487 g/mol)

Synthesis of Intermediate Product, M-12

[Reaction Scheme 12]

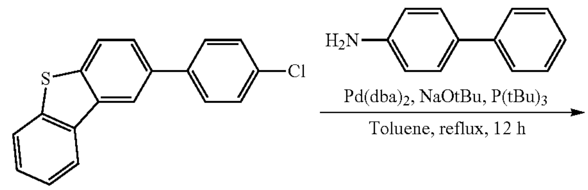

M-10

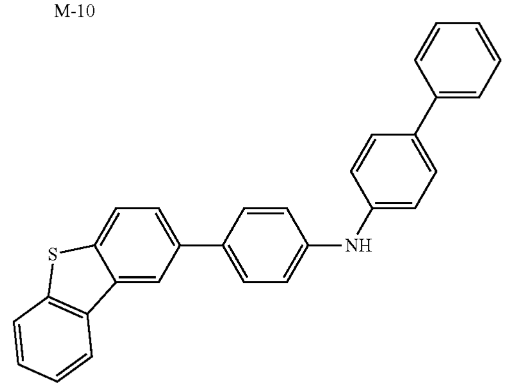

M-12

5 g (17.0 mmol) of intermediate M-10, 3.02 g (17.85 mmol) of 4-aminobiphenyl, 2.45 g (25.5 mmol) of sodium t-butoxide, and 0.10 g (0.51 mmol) of tri-tert-butylphosphine were added to a flask and dissolved in 170 ml of toluene, and 0.098 g (0.17 mmol) of $Pd(dba)_2$ was added and then refluxed and agitated for 12 hours under a nitrogen atmosphere. After the reaction, the reactant was extracted with ethyl acetate. The organic layer was dried with magnesium sulfite and filtered. Then, the filtrate was concentrated under reduced pressure. The product was purified with n-hexane/dichloromethane mixed in a volume ratio of 7:3 through silica gel column chromatography, and 5.23 g of a white solid intermediate M-12 was acquired as a desired compound (yield: 72%).

LC-Mass (theoretical mass: 427.14 g/mol, measured mass: M+1=428 g/mol)

Synthesis of Intermediate Product, M-13

[Reaction Scheme 13]

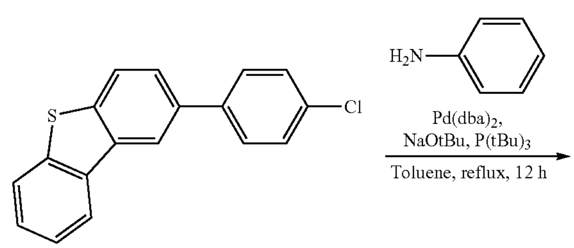

M-10

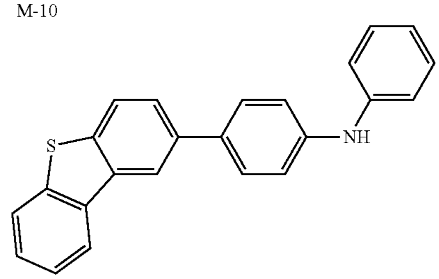

M-13

5 g (17.0 mmol) of intermediate M-10, 1.66 g (17.85 mmol) of aniline, 2.45 g (25.5 mmol) of sodium t-butoxide, and 0.10 g (0.51 mmol) of tri-tert-butylphosphine were added to a flask and dissolved in 170 ml of toluene, and 0.098 g (0.17 mmol) of $Pd(dba)_2$ was added and then refluxed and agitated for 12 hours under a nitrogen atmosphere. After the reaction, the reactant was extracted with ethyl acetate and distilled water. The organic layer was dried with magnesium sulfite and filtered. Then, the filtrate was concentrated under reduced pressure. The product was purified with n-hexane/dichloromethane mixed in a volume ratio of 7:3 through silica gel column chromatography, and 4.66 g of a white solid intermediate M-13 was acquired as a desired compound (yield: 78%).

LC-Mass (theoretical mass: 351.11 g/mol, measured mass: M+1=352 g/mol)

Synthesis of Intermediate Product, M-14

[Reaction Scheme 14]

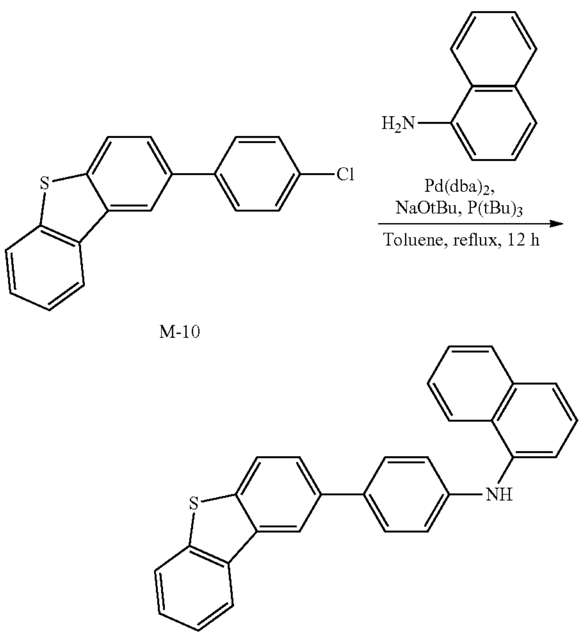

M-10

M-14

5 g (17.0 mmol) of intermediate M-10, 2.56 g (17.85 mmol) of 1-aminonaphthalene, 2.45 g (25.5 mmol) of sodium t-butoxide, and 0.10 g (0.51 mmol) of tri-tert-butylphosphine were added to a flask and dissolved in 170 ml of toluene, and 0.098 g (0.17 mmol) of $Pd(dba)_2$ was added and then refluxed and agitated for 12 hours under a nitrogen atmosphere. After the reaction, the reactant was extracted with ethyl acetate and distilled water. The organic layer was dried with magnesium sulfite and filtered. Then, the filtrate was concentrated under reduced pressure. The product was purified with n-hexane/dichloromethane mixed in a volume ratio of 7:3 through silica gel column chromatography, and 4.98 g of a white solid intermediate M-14 was acquired as a desired compound (yield: 73%).

LC-Mass (theoretical mass: 401.12 g/mol, measured mass: M+1=402 g/mol)

Synthesis of Intermediate Product, M-15

[Reaction Scheme 15]

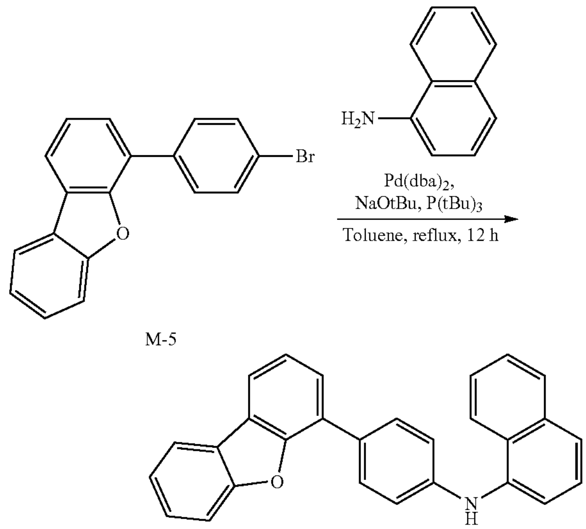

M-5

M-15

5.49 g (17.0 mmol) of intermediate M-5, 2.56 g (17.85 mmol) of 1-aminonaphthalene, 2.45 g (25.5 mmol) of sodium t-butoxide, and 0.10 g (0.51 mmol) of tri-tert-butylphosphine were added to a flask and dissolved in 170 ml of toluene, and 0.098 g (0.17 mmol) of $Pd(dba)_2$ was added and then refluxed and agitated for 12 hours under a nitrogen atmosphere. After the reaction, the reactant was extracted with ethyl acetate and distilled water. The organic layer was dried with magnesium sulfite and filtered. Then, the filtrate was concentrated under reduced pressure. The product was purified with n-hexane/dichloromethane mixed in a volume ratio of 7:3 through silica gel column chromatography, and then 5.05 g of a white solid intermediate M-15 was acquired as a desired compound (yield: 77%).

LC-Mass (theoretical mass: 385.15 g/mol, measured mass: M+1=386 g/mol)

Synthesis of Intermediate Product, M-16

[Reaction Scheme 16]

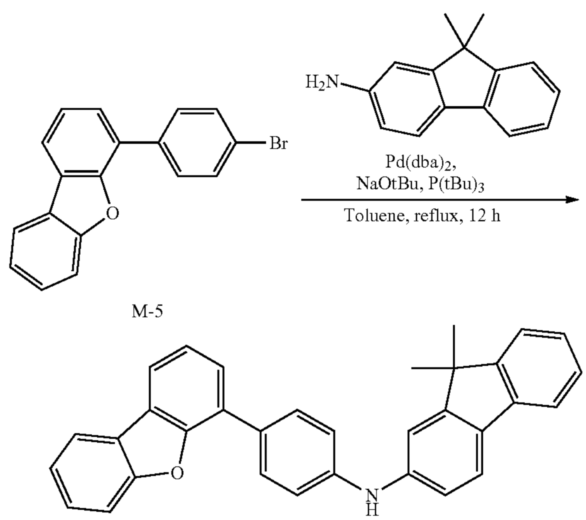

M-5

M-16

5.49 g (17.0 mmol) of intermediate M-5, 3.74 g (17.85 mmol) of (9,9-dimethyl-9H-fluorene-2-yl)amine, 2.45 g (25.5 mmol) of sodium t-butoxide, and 0.10 g (0.51 mmol) of tri-tert-butylphosphine were added to a flask and dissolved in 170 ml of toluene, and 0.098 g (0.17 mmol) of $Pd(dba)_2$ was added and then refluxed and agitated for 12 hours under a nitrogen atmosphere. After the reaction, the reactant was extracted with ethyl acetate and distilled water. The organic layer was dried with magnesium sulfite and filtered. Then, the filtrate was concentrated under reduced pressure. The product was purified with n-hexane/dichloromethane mixed in a volume ratio of 7:3 through silica gel column chromatography, and then 6.0 g of a white solid intermediate M-16 was acquired as a desired compound (yield: 78%).

LC-Mass (theoretical mass: 451.19 g/mol, measured mass: M+1=452 g/mol)

Synthesis of Intermediate Product, M-17

[Reaction Scheme 17]

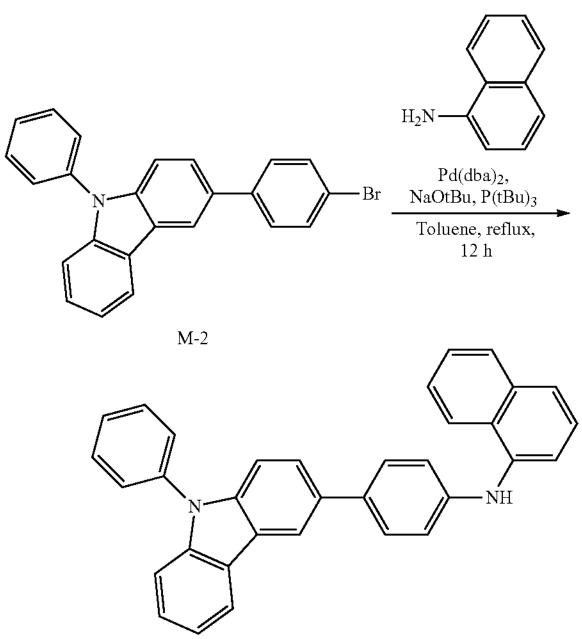

M-2

M-17

30 g (75.3 mmol) of intermediate M-2, 11.9 g (82.83 mmol) of 1-aminonaphthalene, 10.9 g (113.0 mmol) of sodium t-butoxide, and 0.46 g (2.26 mmol) of tri-tert-butylphosphine were added to a flask and dissolved in 750 ml of toluene, and 0.43 g (0.753 mmol) of $Pd(dba)_2$ was added and then refluxed and agitated for 12 hours under a nitrogen atmosphere. After the reaction, the reactant was extracted with ethyl acetate. The organic layer was dried with magnesium sulfite and filtered. Then, the filtrate was concentrated under reduced pressure. The product was purified with n-hexane/dichloromethane mixed in a volume ratio of 7:3 through silica gel column chromatography, and then 25.7 g of a white solid intermediate M-17 was acquired as a desired compound (yield: 74%).

LC-Mass (theoretical mass: 460.19 g/mol, measured mass: M+1=461 g/mol)

Synthesis of Intermediate Product, M-18

[Reaction Scheme 18]

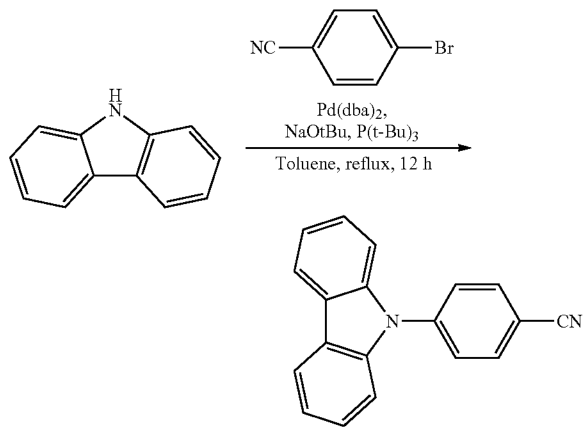

M-18

20 g (119.6 mmol) of carbazole, 23.9 g (131.6 mmol) of 4-bromobenzonitrile, 23 g (239.2 mmol) of sodium t-butoxide, and 1.45 g (7.18 mmol) of tri-tert-butylphosphine were added to a flask and dissolved in 600 ml of toluene, and 1.38 g (2.39 mmol) of $Pd(dba)_2$ was added and then refluxed and agitated for 12 hours under a nitrogen atmosphere. After the reaction, the reactant was extracted with ethyl acetate and distilled water. The organic layer was dried with magnesium sulfite and filtered. Then, the filtrate was concentrated under reduced pressure. The product was purified with n-hexane/dichloromethane mixed in a volume ratio of 7:3 through silica gel column chromatography, and then 22.8 g of a white solid intermediate M-18 was acquired as a desired compound (yield: 71%).

LC-Mass (theoretical mass: 268.10 g/mol, measured mass: M+1=269 g/mol)

Synthesis of Intermediate Product, M-19

[Reaction Scheme 19]

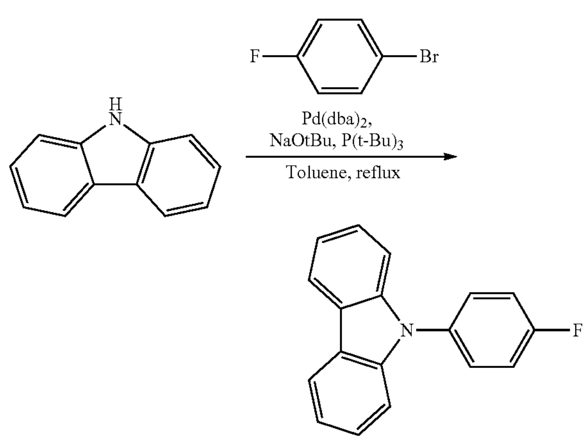

M-19

22.8 g of a white solid intermediate M-19 was acquired as a desired compound (yield: 73%) in accordance with the same procedure as in the acquiring process of intermediate M-18, except that 1-bromo-4-fluorobenzene was used instead of 4-bromobenzonitrile.

LC-Mass (theoretical mass: 261.10 g/mol, measured mass: M+1=262 g/mol).

Synthesis of Intermediate Product, M-20

[Reaction Scheme 20]

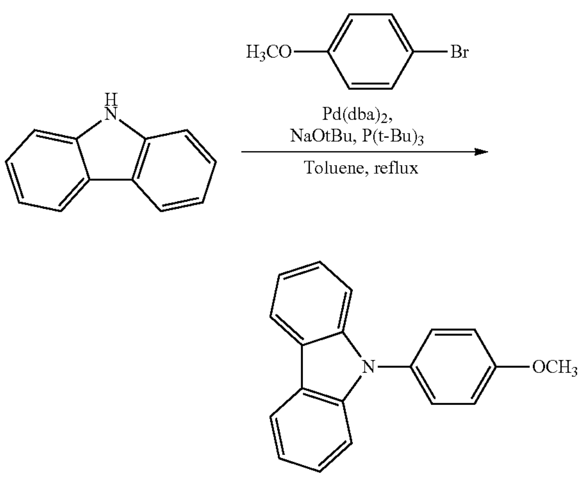

M-20

25.5 g of a white solid intermediate M-20 was acquired as a desired compound (yield: 78%) in accordance with the same procedure as in the acquiring process of intermediate M-18, except that 4-bromoanisole was used instead of 4-bromobenzonitrile.

LC-Mass (theoretical mass: 273.12 g/mol, measured mass: M+1=274 g/mol).

Synthesis of Intermediate Product, M-21

[Reaction Scheme 21]

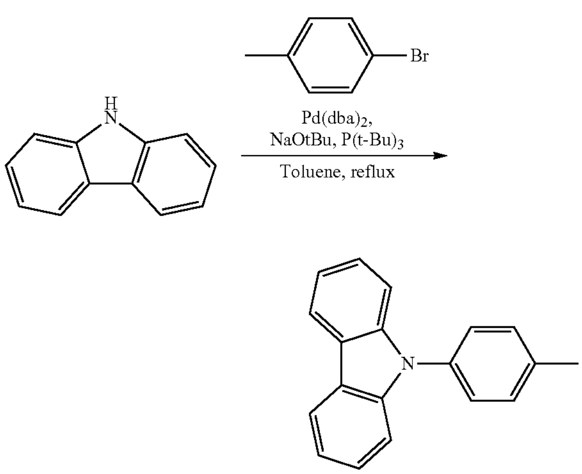

M-21

24.3 g of a white solid intermediate M-21 was acquired as a desired compound (yield: 79%) in accordance with the same procedure as in the acquiring process of intermediate M-18, except that 4-bromotoluene was used instead of 4-bromobenzonitrile.

LC-Mass (theoretical mass: 257.12 g/mol, measured mass: M+1=258 g/mol).

Synthesis of Intermediate Product, M-22

[Reaction Scheme 22]

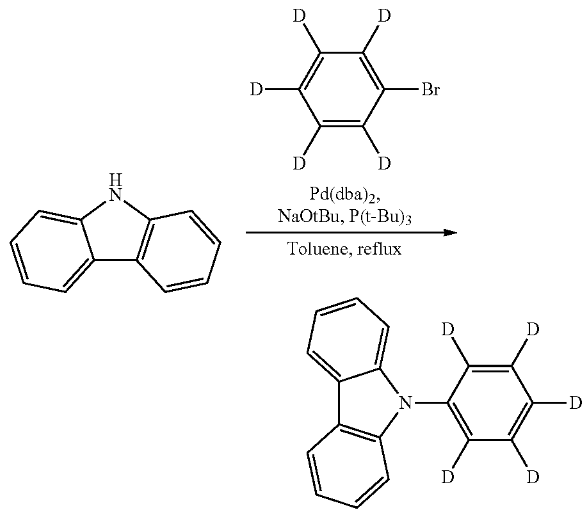

M-22

24.1 g of a white solid intermediate M-22 was acquired as a desired compound (yield: 81%) in accordance with the same procedure as in the acquiring process of intermediate M-18, except that bromobenzene-$d_5$ was used instead of 4-bromobenzonitrile.

LC-Mass (theoretical mass: 248.14 g/mol, measured mass: M+1=249 g/mol).

Synthesis of Intermediate Product, M-23

[Reaction Scheme 23]

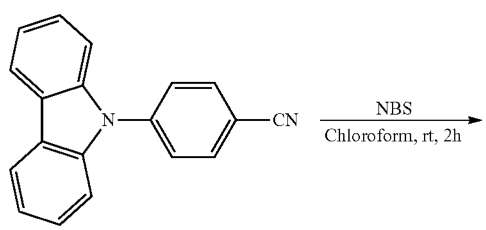

M-18

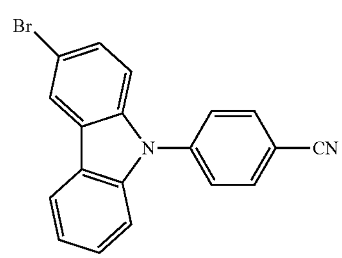

M-23

20 g (74.5 mmol) of intermediate M-18 was dissolved in 370 mL of chloroform, and then 13.3 g (74.5 mmol) of N-bromosuccinimide was added and agitated at room temperature for 2 hours. After the reaction, the reactant was extracted with distilled water and dichloromethane. The organic layer was dried with magnesium sulfite and filtered. Then, the filtrate was concentrated under reduced pressure. The product was recrystallized in n-hexane, and then 21.2 g of a white solid intermediate M-23 was acquired as a desired compound (yield: 82%).

LC-Mass (theoretical mass: 346.01 g/mol, measured mass: M+1=347 g/mol, M+3=349 g/mol)

Synthesis of Intermediate Product, M-24

[Reaction Scheme 24]

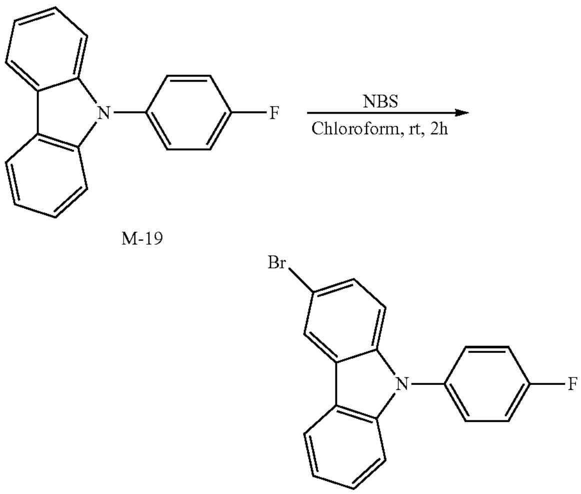

M-19

M-24

21.0 g of a white solid intermediate M-24 was acquired as a desired compound (yield: 83%) in accordance with the same procedure as in the acquiring process of intermediate M-23, except that intermediate M-19 was used instead of intermediate M-18.

LC-Mass (theoretical mass: 339.01 g/mol, measured mass: M+1=340 g/mol, M+3=342 g/mol).

Synthesis of Intermediate Product, M-25

[Reaction Scheme 25]

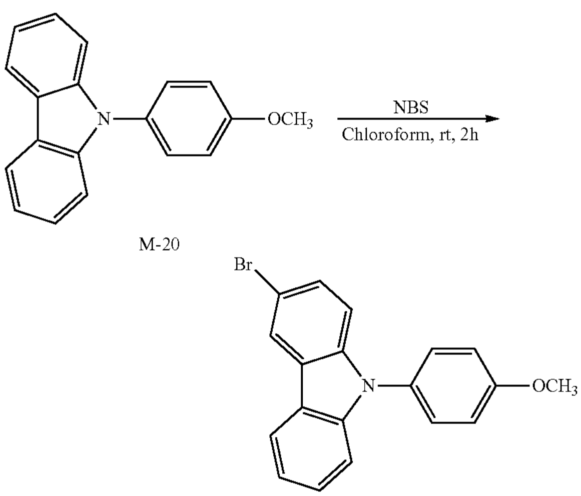

M-20

M-25

21.8 g of a white solid intermediate M-25 was acquired as a desired compound (yield: 83%) in accordance with the same procedure as in the acquiring process of intermediate M-23, except that intermediate M-20 was used instead of intermediate M-18.

LC-Mass (theoretical mass: 351.03 g/mol, measured mass: M+1=352 g/mol, M+3=354 g/mol).

Synthesis of Intermediate Product, M-26

[Reaction Scheme 26]

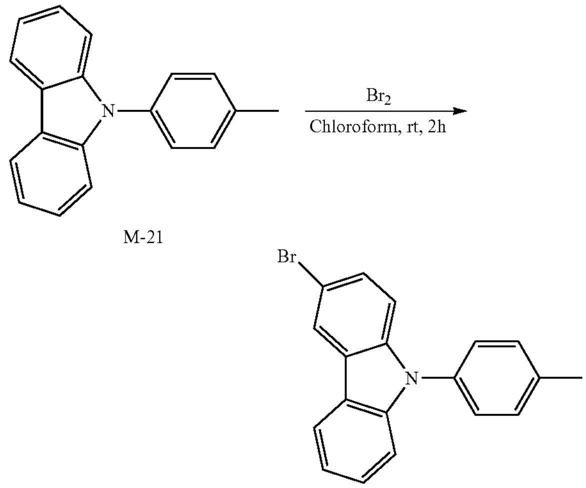

M-21

M-26

20 g (74.5 mmol) of intermediate M-21 was dissolved in 370 mL of chloroform, and then 11.9 g (74.5 mmol) of bromine was added and agitated at room temperature for 2 hours. After the reaction, the reactant was extracted with distilled water and dichloromethane. The organic layer was dried with magnesium sulfite and filtered. Then, the filtrate was concentrated under reduced pressure. The product was recrystallized in n-hexane, and then 18.8 g of a white solid intermediate M-26 was acquired as a desired compound (yield: 75%).

LC-Mass (theoretical mass: 335.03 g/mol, measured mass: M+1=336 g/mol, M+3=338 g/mol)

Synthesis of Intermediate Product, M-27

[Reaction Scheme 27]

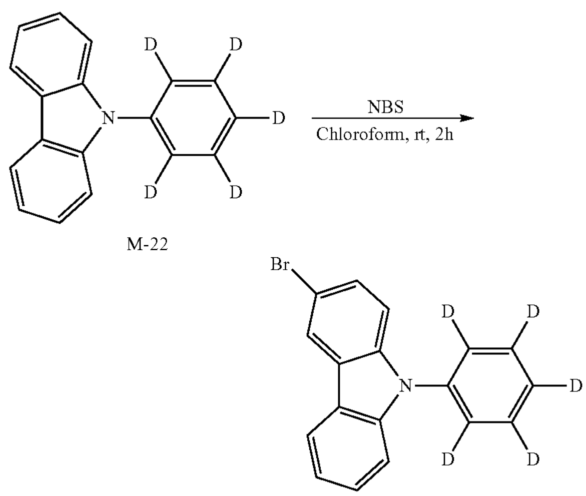

M-22

M-27

20.7 g of a white solid intermediate M-27 was acquired as a desired compound (yield: 85%) in accordance with the same procedure as in the acquiring process of intermediate M-23, except that intermediate M-22 was used instead of intermediate M-18.

LC-Mass (theoretical mass: 326.05 g/mol, measured mass: M+1=327 g/mol, M+3=329 g/mol).

Synthesis of Intermediate Product, M-28

[Reaction Scheme 28]

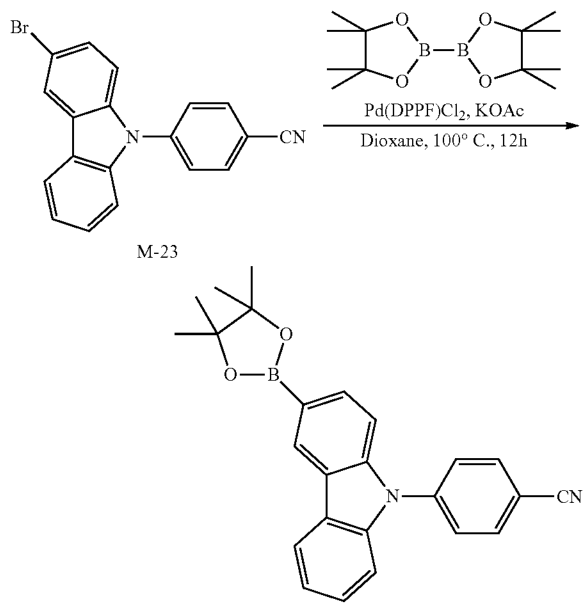

M-23

M-28

18 g (51.8 mmol) of intermediate M-23, 0.85 g (1.04 mmol) of Pd(dppf)$Cl_2$, 14.5 g (57.0 mmol) of bis(pinacolato) diboron, and 10.2 g (103.6 mmol) of potassium acetate were dissolved in 260 ml of 1,4-dioxane. The reactant was refluxed and agitated for 12 hours under a nitrogen atmosphere, and then extracted 3 times with dichloromethane and distilled water. The extract was dried with magnesium sulfite and filtered. Then, the filtrate was concentrated under reduced pressure. The product was purified with n-hexane/dichloromethane mixed in a volume ratio of 7:3 through silica gel column chromatography, and then 14.5 g of a white solid intermediate M-28 was acquired as a desired compound (yield: 71%).

LC-Mass (theoretical mass: 394.19 g/mol, measured mass: M+1=395 g/mol)

Synthesis of Intermediate Product, M-29

[Reaction Scheme 29]

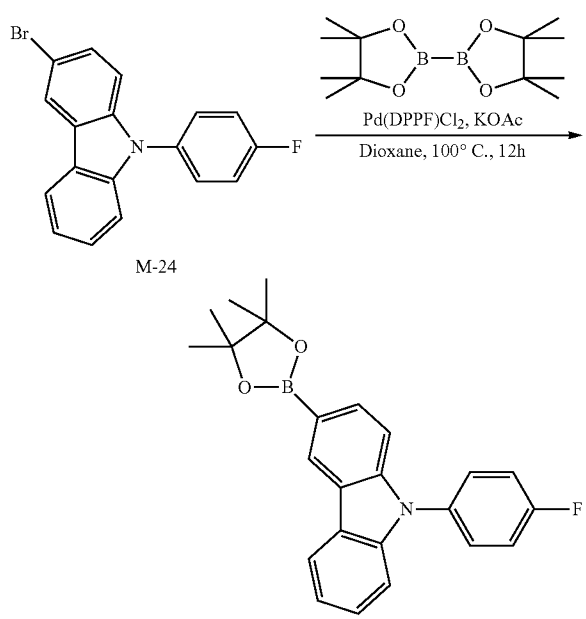

M-24

M-29

14.2 g of a white solid intermediate M-29 was acquired as a desired compound (yield: 75%) in accordance with the same procedure as in the acquiring process of intermediate M-28, except that intermediate M-24 was used instead of intermediate M-23.

LC-Mass (theoretical mass: 387.18 g/mol, measured mass: M+1=388 g/mol).

Synthesis of Intermediate Product, M-30

[Reaction Scheme 30]

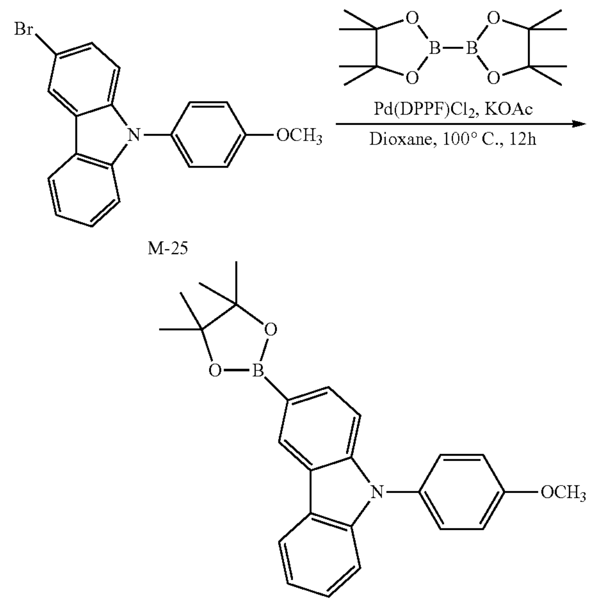

M-25

M-30

15.9 g of a white solid intermediate M-30 was acquired as a desired compound (yield: 77%) in accordance with the same procedure as in the acquiring process of intermediate M-28, except that intermediate M-25 was used instead of intermediate M-24.

LC-Mass (theoretical mass: 399.20 g/mol, measured mass: M+1=400 g/mol).

Synthesis of Intermediate Product, M-31

[Reaction Scheme 31]

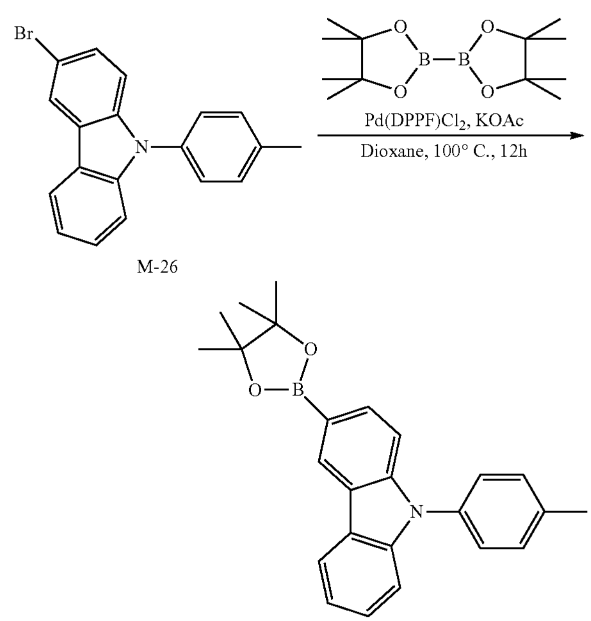

M-26

M-31

16.1 g of a white solid intermediate M-31 was acquired as a desired compound (yield: 81%) in accordance with the same procedure as in the acquiring process of intermediate M-28, except that intermediate M-26 was used instead of intermediate M-23.

LC-Mass (theoretical mass: 383.21 g/mol, measured mass: M+1=384 g/mol).

Synthesis of Intermediate Product, M-32

[Reaction Scheme 32]

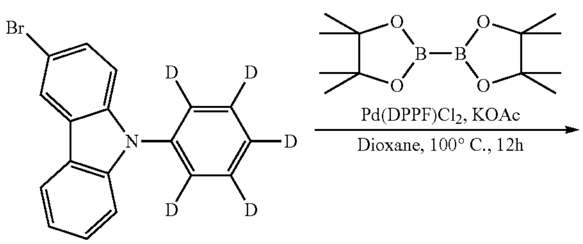

M-27

M-32

15.1 g of a white solid intermediate M-32 was acquired as a desired compound (yield: 81%) in accordance with the same procedure as in the acquiring process of intermediate M-28, except that intermediate M-27 was used instead of intermediate M-23

LC-Mass (theoretical mass: 359.20 g/mol, measured mass: M+1=360 g/mol).

Synthesis of Intermediate Product, M-33

[Reaction Scheme 33]

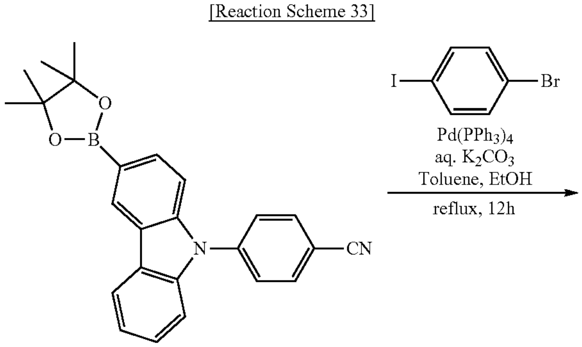

M-28

-continued

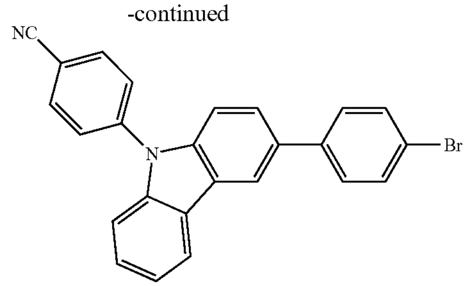

M-33

12 g (30.4 mmol) of intermediate M-28, 8.6 g (30.4 mmol) of 1-bromo-4-iodobenzene, and 0.35 g (0.304 mmol) of tetrakist(riphenylphosphine)palladium were added to a flask and dissolved in 152 ml of toluene and 76 mL of ethanol under a nitrogen atmosphere.

76 ml of an aqueous solution including 8.95 g (60.8 mmol) of potassium carbonate was added, and then refluxed and agitated for 12 hours. After the reaction, the reactant was extracted with ethyl acetate. The extract was dried with magnesium sulfite and filtered. Then, the filtrate was concentrated under reduced pressure. The product was purified with n-hexane/dichloromethane mixed in a volume ratio of 7:3 through silica gel column chromatography, and then 10.6 g of a white solid intermediate M-33 was acquired as a desired compound (yield: 82%).

LC-Mass (theoretical mass: 422.04 g/mol, measured mass: M+1=423 g/mol, M+3=425 g/mol)

Synthesis of Intermediate Product, M-34

[Reaction Scheme 34]

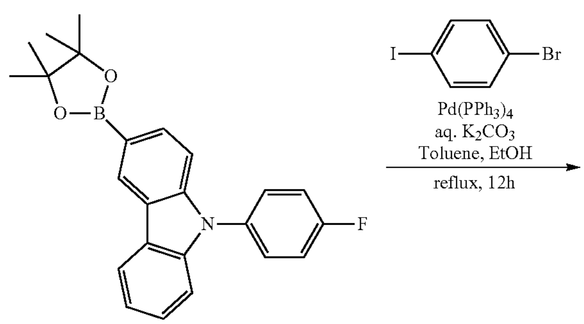

M-29

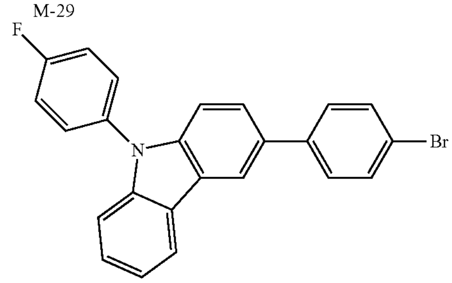

M-34

10.8 g of white solid intermediate M-34 was acquired as a desired compound (yield: 85%) in accordance with the same procedure as in the acquiring process of intermediate M-33, except that M-9 was used instead of M-28.

LC-Mass (theoretical mass: 415.04 g/mol, measured mass: M+1=416 g/mol, M+3=418 g/mol).

Synthesis of Intermediate Product, M-35

[Reaction Scheme 35]

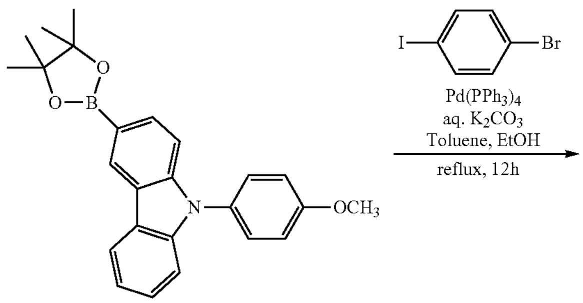

M-30

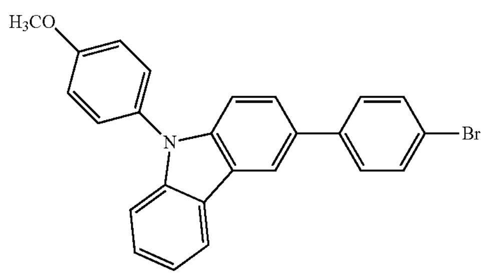

M-35

10.9 g of a white solid intermediate M-35 was acquired as a desired compound (yield: 84%) in accordance with the same procedure as in the acquiring process of intermediate M-33, except that intermediate M-30 was used instead of intermediate M-28.

LC-Mass (theoretical mass: 428.32 g/mol, measured mass: M+1=429 g/mol, M+3=431 g/mol).

Synthesis of Intermediate Product, M-36

[Reaction Scheme 36]

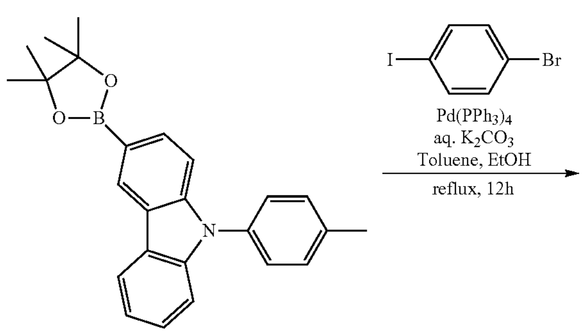

M-31

-continued

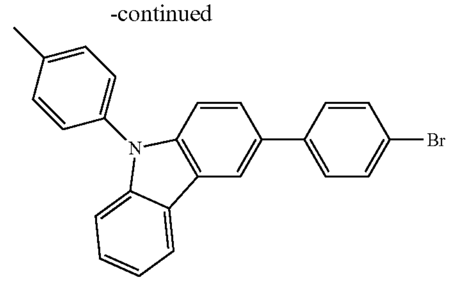

M-36

10.9 g of white solid intermediate M-36 was acquired as a desired compound (yield: 87%) in accordance with the same procedure as in the acquiring process of intermediate M-33, except that M-31 was used instead of M-28.

LC-Mass (theoretical mass: 411.06 g/mol, measured mass: M+1=412 g/mol, M+3=414 g/mol).

Synthesis of Intermediate Product, M-37

[Reaction Scheme 37]

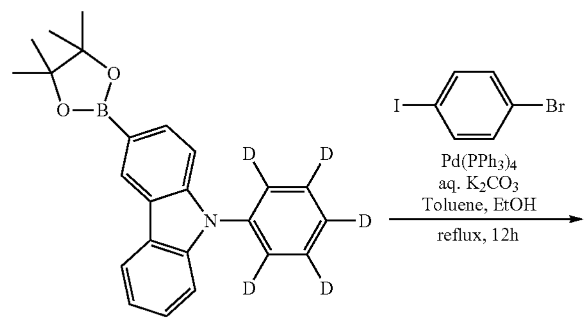

M-32

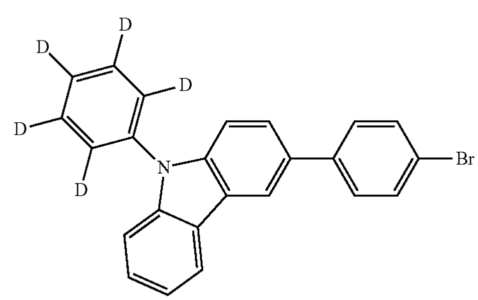

M-37

10.9 g of white solid intermediate M-36 was acquired as a desired compound (yield: 89%) in accordance with the same procedure as in the acquiring process of intermediate M-33, except that M-31 was used instead of M-28.

LC-Mass (theoretical mass: 402.08 g/mol, measured mass: M+1=403 g/mol, M+3=405 g/mol).

Synthesis of Intermediate Product, M-38

[Reaction Scheme 38]

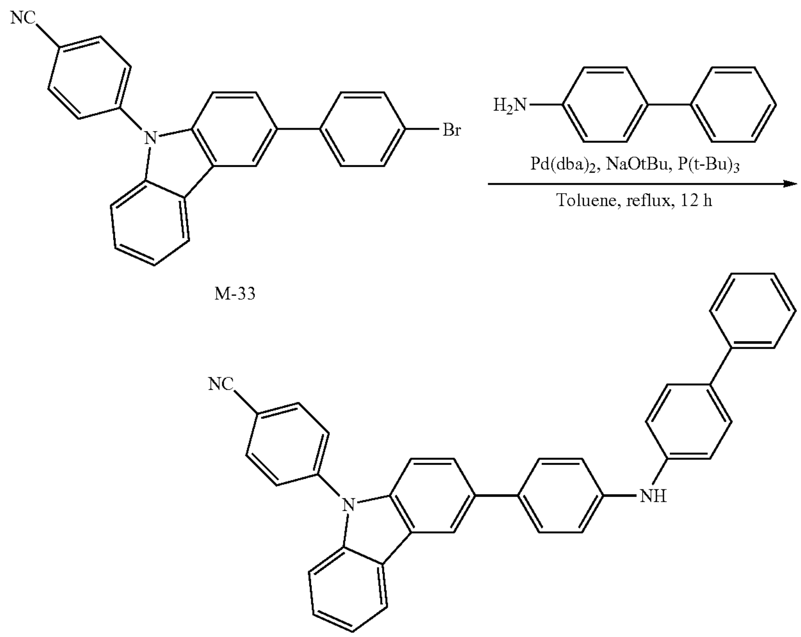

10 g (19.5 mmol) of intermediate M-33, 3.3 g (19.5 mmol) of 4-aminobiphenyl, 3.7 g (39.0 mmol) of sodium t-butoxide, and 0.12 g (0.58 mmol) of tri-tert-butylphosphine were added to a flask and dissolved in 195 ml of toluene, and 0.11 g (0.753 mmol) of $Pd(dba)_2$ was added and then refluxed and agitated for 12 hours under a nitrogen atmosphere. After the reaction, the reactant was extracted with ethyl acetate and distilled water. The organic layer was dried with magnesium sulfite and filtered. Then, the filtrate was concentrated under reduced pressure. The product was purified with n-hexane/dichloromethane mixed in a volume ratio of 7:3 through silica gel column chromatography, and then 7.2 g of a white solid intermediate M-38 was acquired as a desired compound (yield: 72%).

LC-Mass (theoretical mass: 511.20 g/mol, measured mass: M+1=512 g/mol)

Synthesis of Intermediate Product, M-39

[Reaction Scheme 39]

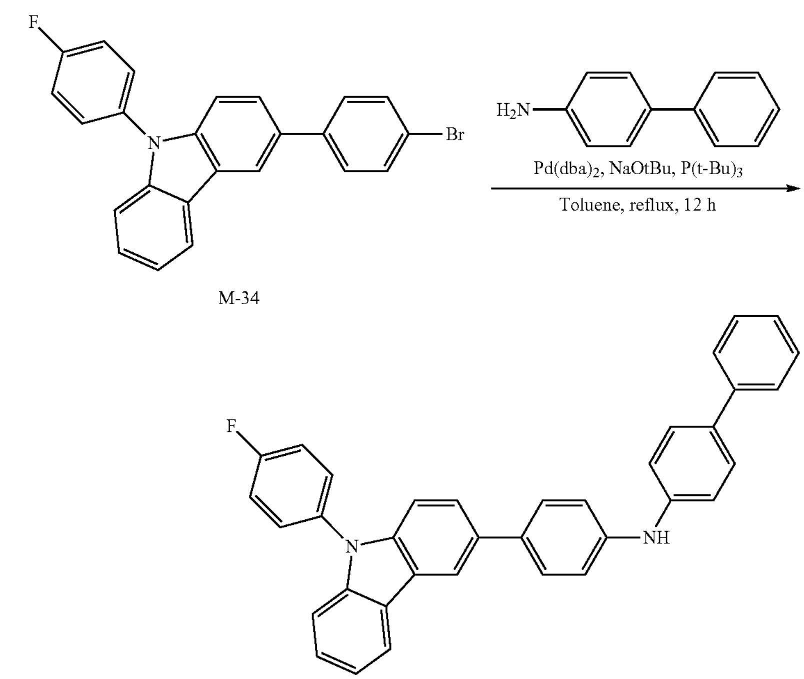

7.4 g of a white solid intermediate M-39 was acquired as a desired compound (yield: 75%) in accordance with the same procedure as in the acquiring process of intermediate M-38, except that intermediate M-34 was used instead of intermediate M-33.

LC-Mass (theoretical mass: 504.20 g/mol, measured mass: M+1=504.60 g/mol).

Synthesis of Intermediate Product, M-40

[Reaction Scheme 40]

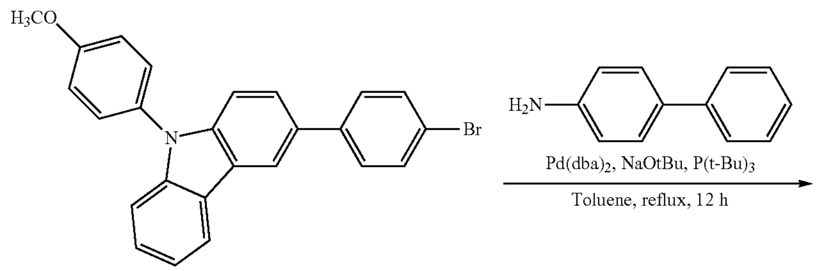

M-35

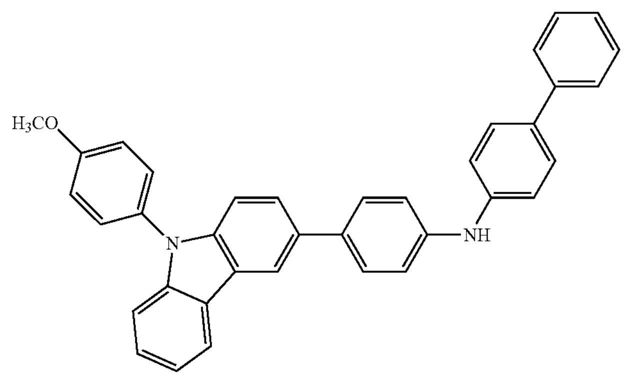

M-40

7.7 g of a white solid intermediate M-40 was acquired as a desired compound (yield: 76%) in accordance with the same procedure as in the acquiring process of intermediate M-38, except that intermediate M-35 was used instead of intermediate M-33.

LC-Mass (theoretical mass: 516.22 g/mol, measured mass: M+1=517 g/mol).

Synthesis of Intermediate Product, M-41

[Reaction Scheme 41]

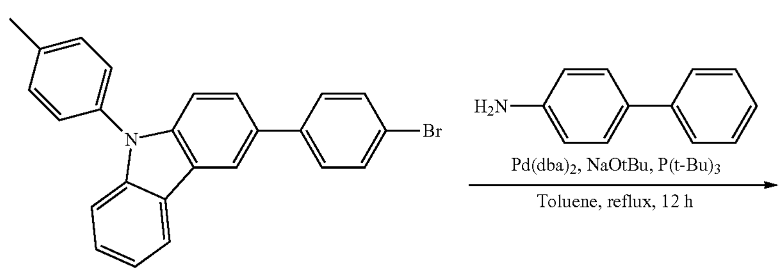

M-36

-continued
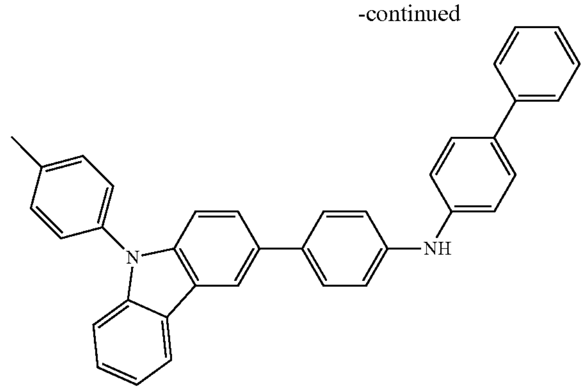
M-41
7.7 g of a white solid intermediate M-41 was acquired as a desired compound (yield: 79%) in accordance with the same procedure as in the acquiring process of intermediate M-38, except that intermediate M-36 was used instead of intermediate M-33.
LC-Mass (theoretical mass: 500.23 g/mol, measured mass: M+1=501 g/mol).
Synthesis of Intermediate Product, M-42
[Reaction Scheme 42]
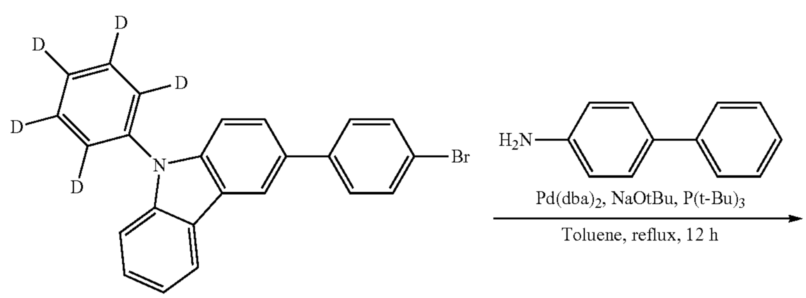
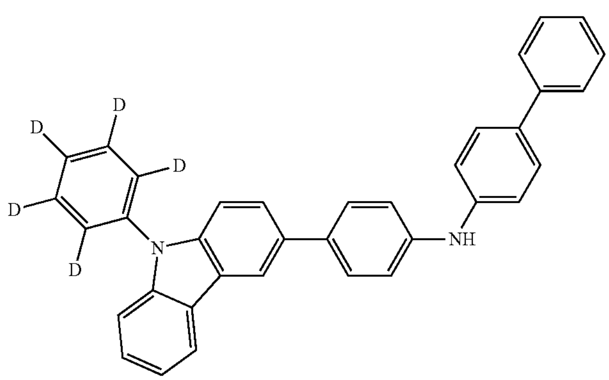
M-42

8.0 g of a white solid intermediate M-42 was acquired as a desired compound (yield: 83%) in accordance with the same procedure as in the acquiring process of intermediate M-38, except that intermediate M-37 was used instead of intermediate M-33.

LC-Mass (theoretical mass: 491.24 g/mol, measured mass: M+1=492 g/mol).

Example 1

Preparation of Compound Represented by Chemical Formula A-414

[Reaction Scheme 43]

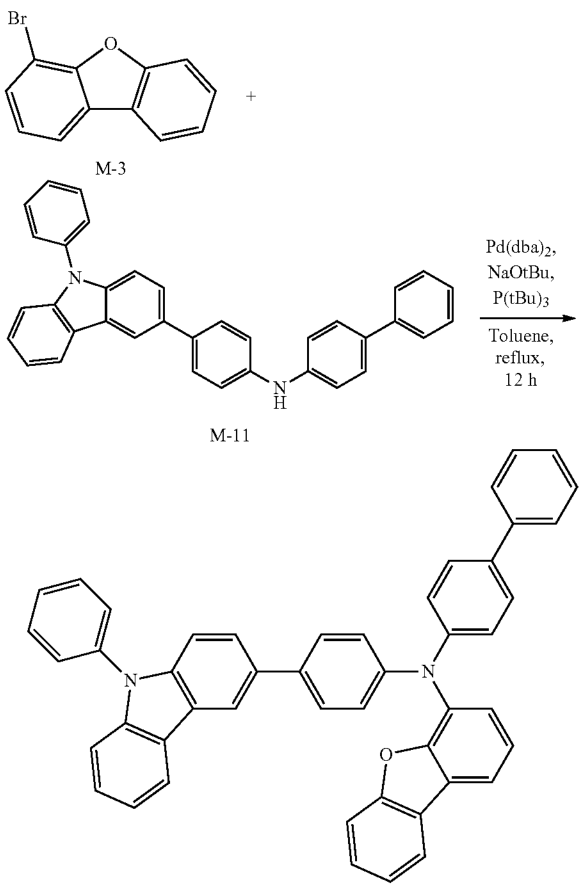

A-414

5 g (20.2 mmol) of intermediate M-3, 9.85 g (20.2 mmol) of sodium t-butoxide, and 0.12 g (2.26 mmol) of tri-tert-butylphosphine were added to a flask and dissolved in 200 ml of toluene, and 0.12 g (0.202 mmol) of $Pd(dba)_2$ was added and then refluxed and agitated for 12 hours under a nitrogen atmosphere. After the reaction, the reactant was extracted with ethyl acetate and distilled water. The organic layer was dried with magnesium sulfite and filtered. Then, the filtrate was concentrated under reduced pressure. The product was purified with n-hexane/dichloromethane mixed in a volume ratio of 7:3 through silica gel column chromatography, and then 12 g of a white solid compound A-414 was acquired as a desired compound (yield: 91%).

LC-Mass (theoretical mass: 652.25 g/mol, measured mass: M+1=653 g/mol)

Example 2

Preparation of Compound Represented by Chemical Formula A-415

[Reaction Scheme 44]

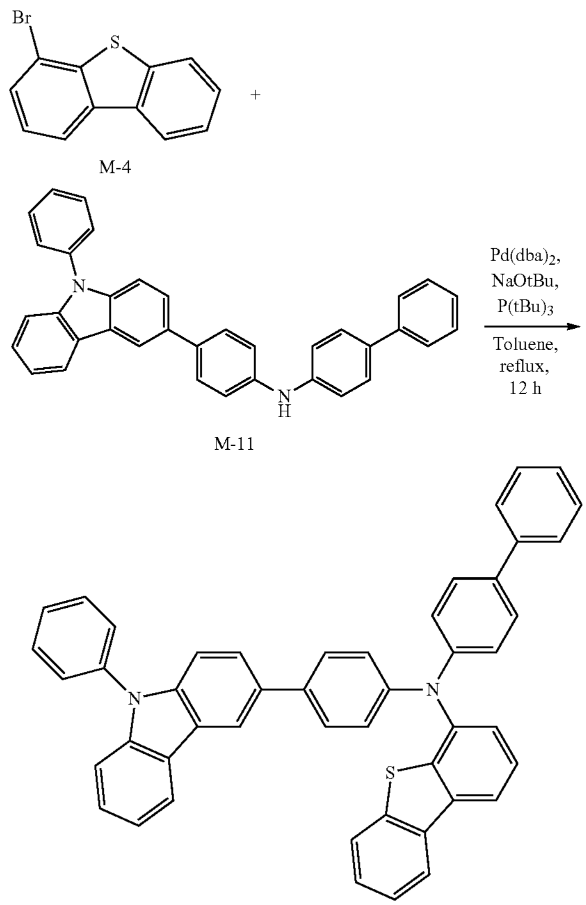

A-415

5.3 g (20.2 mmol) of intermediate M-4, 9.85 g (20.2 mmol) of M-11, 2.91 g (30.3 mmol) of sodium t-butoxide, and 0.12 g (2.26 mmol) of tri-tert-butylphosphine were added to a flask and dissolved in 200 ml of toluene, and 0.12 g (0.202 mmol) of $Pd(dba)_2$ was added and then refluxed and agitated for 12 hours under a nitrogen atmosphere. After the reaction, the reactant was extracted with ethyl acetate and distilled water. The organic layer was dried with magnesium sulfite and filtered. Then, the filtrate was concentrated under reduced pressure. The product was purified with n-hexane/dichloromethane mixed in a volume ratio of 7:3 through silica gel column chromatography, and then 11.8 g of a white solid compound A-415 was acquired as a desired compound (yield: 87%).

LC-Mass (theoretical mass: 668.23 g/mol, measured mass: M+1=669 g/mol)

Example 3

Preparation of Compound Represented by Chemical Formula A-9

[Reaction Scheme 45]

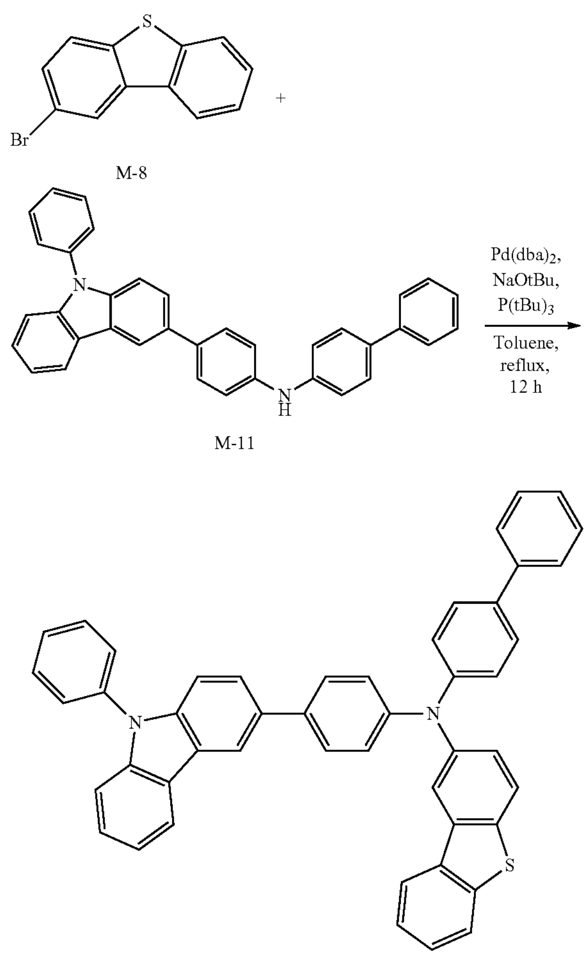

A-9

5.3 g (20.2 mmol) of intermediate M-8, 9.85 g (20.2 mmol) of M-11, 2.91 g (30.3 mmol) of sodium t-butoxide, and 0.12 g (2.26 mmol) of tri-tert-butylphosphine were added to a flask and dissolved in 200 ml of toluene, and 0.12 g (0.202 mmol) of $Pd(dba)_2$ was added and then refluxed and agitated for 12 hours under a nitrogen atmosphere. After the reaction, the reactant was extracted with ethyl acetate and distilled water. The organic layer was dried with magnesium sulfite and filtered. Then, the filtrate was concentrated under reduced pressure. The product was purified with n-hexane/dichloromethane mixed in a volume ratio of 7:3 through silica gel column chromatography, and then 11.8 g of a white solid compound A-9 was acquired as a desired compound (yield: 87%).

LC-Mass (theoretical mass: 668.23 g/mol, measured mass: M+1=669 g/mol)

Example 4

Preparation of Compound Represented by Chemical Formula A-10

[Reaction Scheme 46]

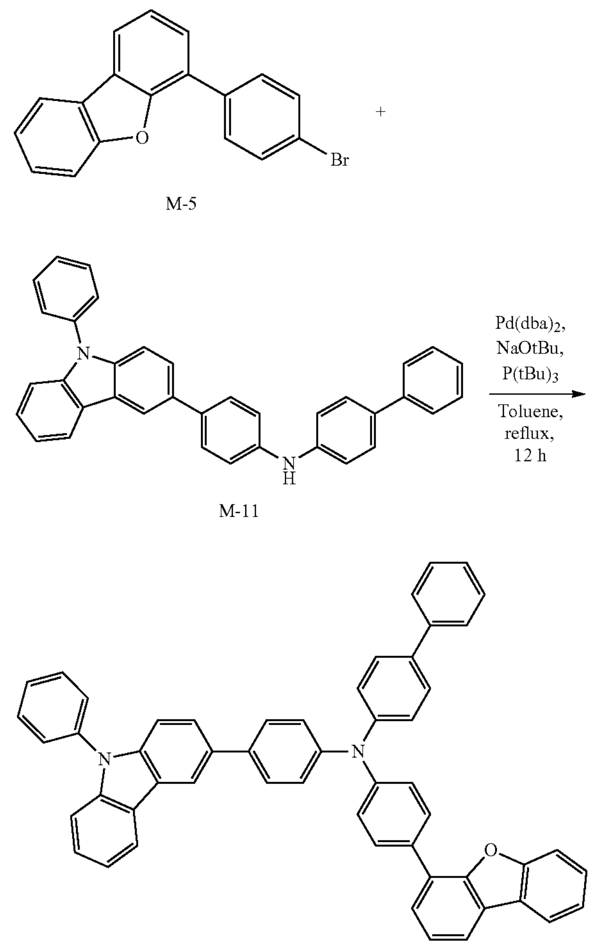

A-10

6.5 g (20.2 mmol) of intermediate M-5, 9.85 g (20.2 mmol) of intermediate M-11, 2.91 g (30.3 mmol) of sodium t-butoxide, and 0.12 g (2.26 mmol) of tri-tert-butylphosphine were added to a flask and dissolved in 200 ml of toluene, and 0.12 g (0.202 mmol) of $Pd(dba)_2$ was added and then refluxed and agitated for 12 hours under a nitrogen atmosphere. After the reaction, the reactant was extracted with ethyl acetate and distilled water. The organic layer was dried with magnesium sulfite and filtered. Then, the filtrate was concentrated under reduced pressure. The product was purified with n-hexane/dichloromethane mixed in a volume ratio of 7:3 through silica gel column chromatography, and then 12.4 g of a white solid compound A-10 was acquired as a desired compound (yield: 84%).

LC-Mass (theoretical mass: 728.28 g/mol, measured mass: M+1=729 g/mol)

Example 5

Preparation of Compound Represented by Chemical Formula A-11

[Reaction Scheme 47]

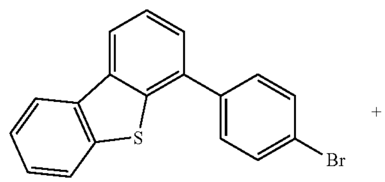

M-6

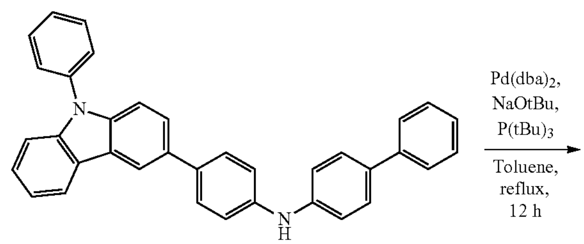

M-11

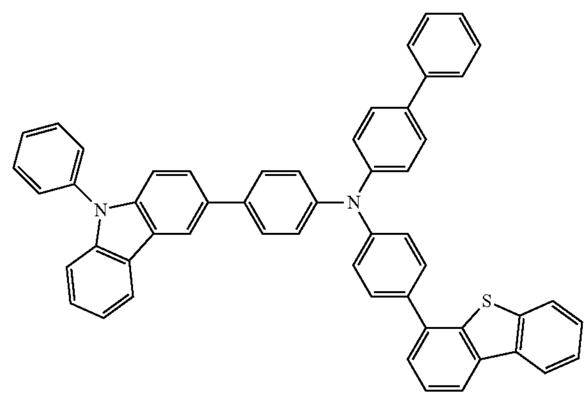

A-11

6.85 g (20.2 mmol) of intermediate M-6, 9.85 g (20.2 mmol) of M-11, 2.91 g (30.3 mmol) of sodium t-butoxide, and 0.12 g (2.26 mmol) of tri-tert-butylphosphine were added to a flask and dissolved in 200 ml of toluene, and 0.12 g (0.202 mmol) of $Pd(dba)_2$ was added and then refluxed and agitated for 12 hours under a nitrogen atmosphere. After the reaction, the reactant was extracted with ethyl acetate and distilled water. The organic layer was dried with magnesium sulfite and filtered. Then, the filtrate was concentrated under reduced pressure. The product was purified with n-hexane/dichloromethane mixed in a volume ratio of 7:3 through silica gel column chromatography, and then 13.2 g of a white solid compound A-11 was acquired as a desired compound (yield: 88%).

LC-Mass (theoretical mass: 744.26 g/mol, measured mass: M+1=745 g/mol)

Example 6

Preparation of Compound Represented by Chemical Formula A-18

[Reaction Scheme 48]

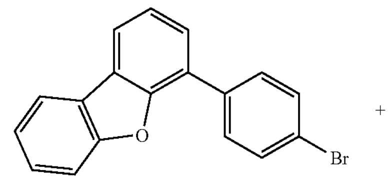

M-5

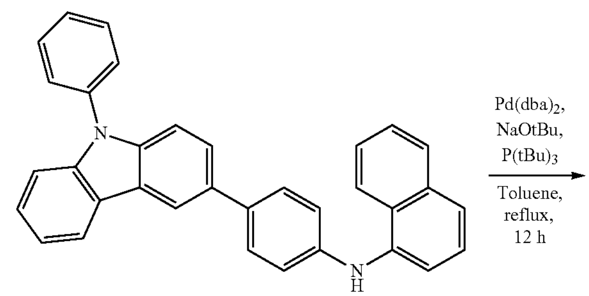

M-17

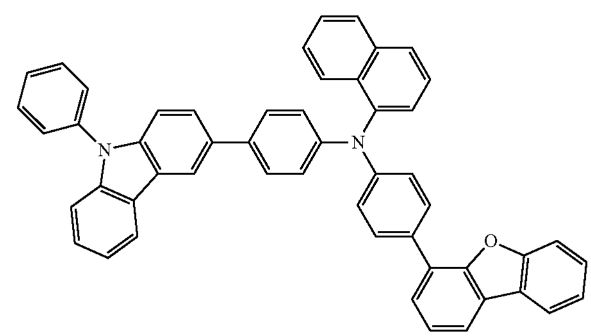

A-18

6.53 g (20.2 mmol) of intermediate M-5, 9.30 g (20.2 mmol) of M-17, 2.91 g (30.3 mmol) of sodium t-butoxide, and 0.12 g (2.26 mmol) of tri-tert-butylphosphine were added to a flask and dissolved in 200 ml of toluene, and 0.12 g (0.202 mmol) of $Pd(dba)_2$ was added and then refluxed and agitated for 12 hours under a nitrogen atmosphere. After the reaction, the reactant was extracted with ethyl acetate and distilled water. The organic layer was dried with magnesium sulfite and filtered. Then, the filtrate was concentrated under reduced pressure. The product was purified with n-hexane/dichloromethane mixed in a volume ratio of 7:3 through silica gel column chromatography, and then 12.5 g of a white solid compound A-18 was acquired as a desired compound (yield: 88%).

LC-Mass (theoretical mass: 702.27 g/mol, measured mass: M+1=703 g/mol)

Example 7

Preparation of Compound Represented by Chemical Formula A-19

[Reaction Scheme 49]

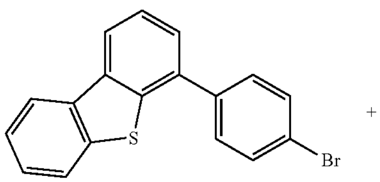

M-6

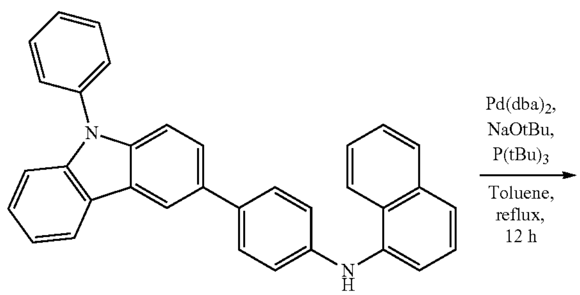

M-17

-continued

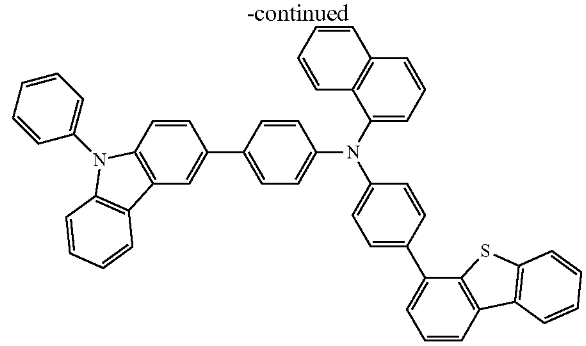

A-19

6.85 g (20.2 mmol) of intermediate M-6, 9.30 g (20.2 mmol) of M-17, 2.91 g (30.3 mmol) of sodium t-butoxide, and 0.12 g (2.26 mmol) of tri-tert-butylphosphine were added to a flask and dissolved in 200 ml of toluene, and 0.12 g (0.202 mmol) of Pd(dba)$_2$ was added and then refluxed and agitated for 12 hours under a nitrogen atmosphere. After the reaction, the reactant was extracted with ethyl acetate and distilled water. The organic layer was dried with magnesium sulfite and filtered. Then, the filtrate was concentrated under reduced pressure. The product was purified with n-hexane/dichloromethane mixed in a volume ratio of 7:3 through silica gel column chromatography, and then 12.3 g of a white solid compound A-18 was acquired as a desired compound (yield: 85%).

LC-Mass (theoretical mass: 718.24 g/mol, measured mass: M+1=719 g/mol)

Example 8

Preparation of Compound Represented by Chemical Formula A-327

[Reaction Scheme 50]

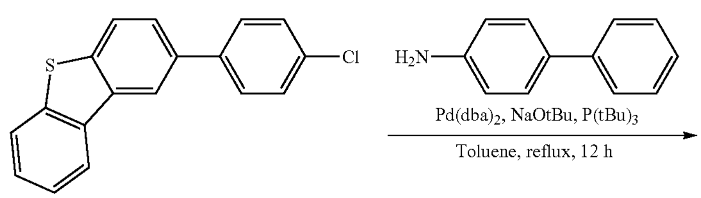

M-10

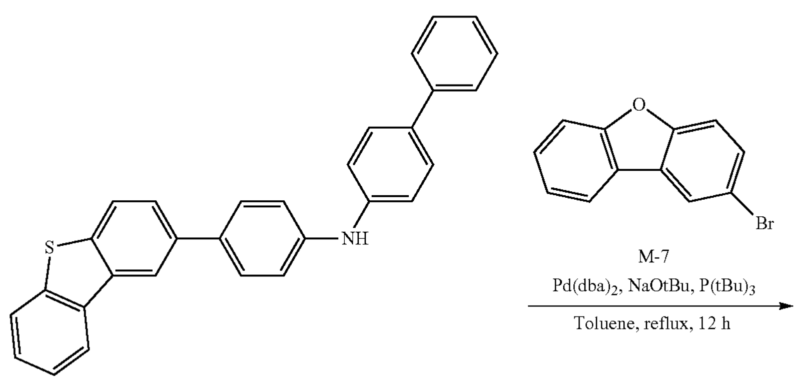

M-12

-continued

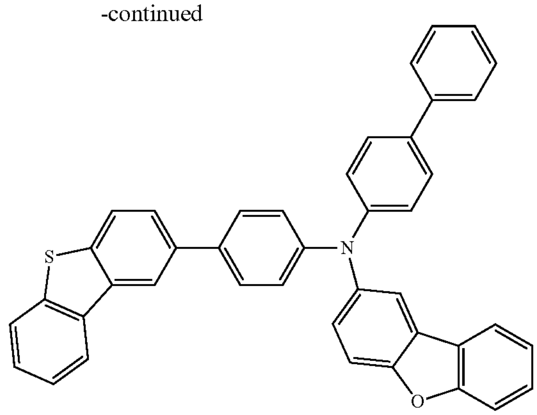

A-327

5.2 g (12.2 mmol) of intermediate M-12, 3.0 g (12.2 mmol) of intermediate M-7, 1.76 g (18.3 mmol) of sodium t-butoxide, and 0.074 g (0.37 mmol) of tri-tert-butylphosphine were added to a flask and dissolved in 120 ml of toluene, and 0.070 g (0.122 mmol) of $Pd(dba)_2$ was added and then refluxed and agitated for 12 hours under a nitrogen atmosphere. After the reaction, the reactant was extracted with ethyl acetate and distilled water. The organic layer was dried with magnesium sulfite and filtered. Then, the filtrate was concentrated under reduced pressure. The product was purified with n-hexane/dichloromethane mixed in a volume ratio of 7:3 through silica gel column chromatography, and then 6.2 g of a white solid compound A-327 was acquired as a desired compound (yield: 86%).

LC-Mass (theoretical mass: 593.18 g/mol, measured mass: M+1=594 g/mol)

Example 9

Preparation of Compound Represented by Chemical Formula A-335

[Reaction Scheme51]

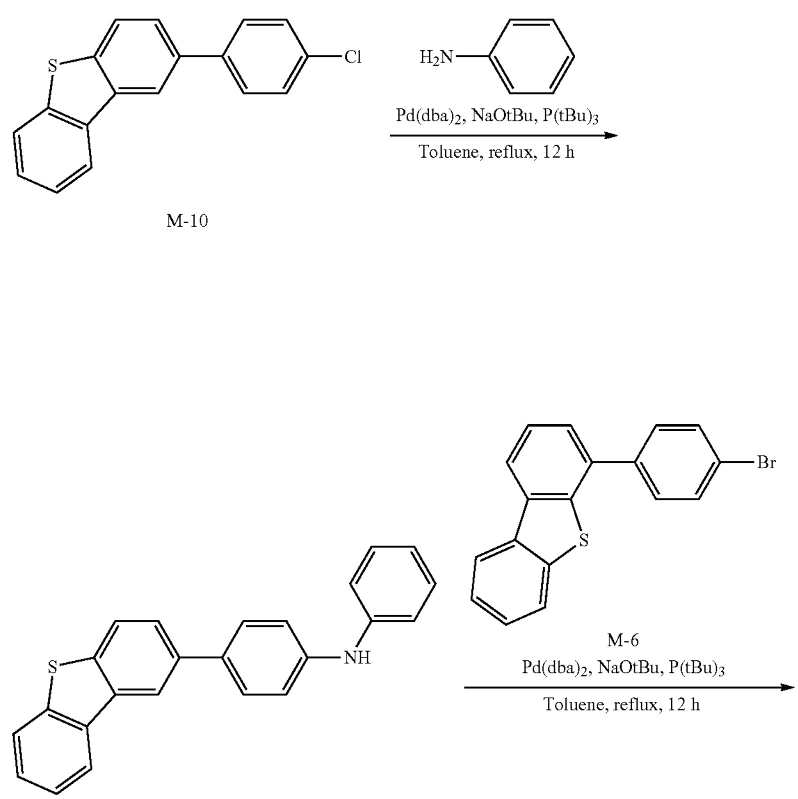

-continued

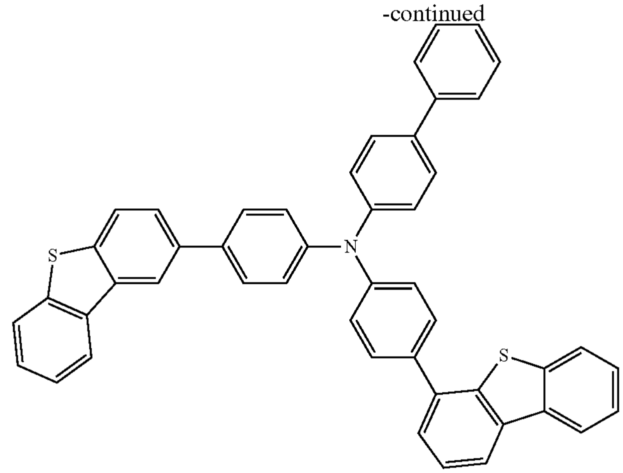

A-335

4.3 g (12.2 mmol) of intermediate M-13, 4.14 g (12.2 mmol) of intermediate M-6, 1.76 g (18.3 mmol) of sodium t-butoxide, and 0.074 g (0.37 mmol) of tri-tert-butylphosphine were added to a flask and dissolved in 120 ml of toluene, and 0.070 g (0.122 mmol) of $Pd(dba)_2$ was added and then refluxed and agitated for 12 hours under a nitrogen atmosphere. After the reaction, the reactant was extracted with ethyl acetate and distilled water. The organic layer was dried with magnesium sulfite and filtered. Then, the filtrate was concentrated under reduced pressure. The product was purified with n-hexane/dichloromethane mixed in a volume ratio of 7:3 through silica gel column chromatography, and then 6.8 g of a white solid compound A-335 was acquired as a desired compound (yield: 91%).

LC-Mass (theoretical mass: 609.16 g/mol, measured mass: M+1=610 g/mol)

Example 10

Preparation of Compound Represented by Chemical Formula A-340

[Reaction Scheme 52]

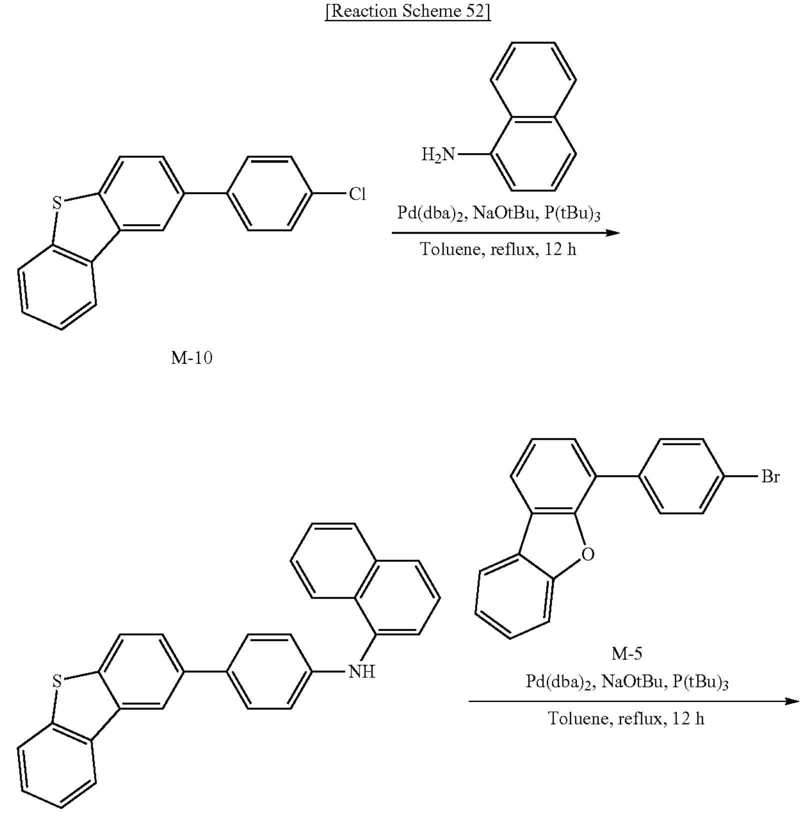

-continued

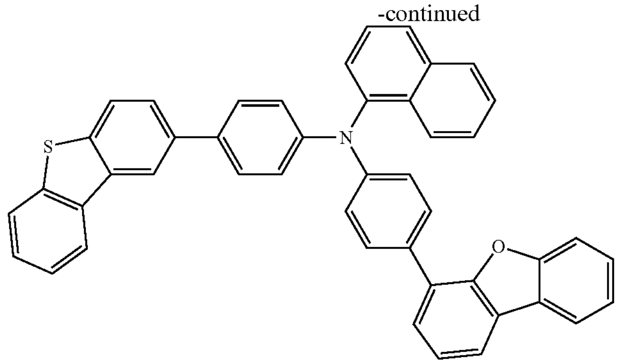

A-340

4.9 g (12.2 mmol) of intermediate M-14, 3.94 g (12.2 mmol) of intermediate M-5, 1.76 g (18.3 mmol) of sodium t-butoxide, and 0.074 g (0.37 mmol) of tri-tert-butylphosphine were added to a flask and dissolved in 120 ml of toluene, and 0.070 g (0.122 mmol) of $Pd(dba)_2$ was added and then refluxed and agitated for 12 hours under a nitrogen atmosphere. After the reaction, the reactant was extracted with ethyl acetate and distilled water. The organic layer was dried with magnesium sulfite and filtered. Then, the filtrate was concentrated under reduced pressure. The product was purified with n-hexane/dichloromethane mixed in a volume ratio of 7:3 through silica gel column chromatography, and then 7.2 g of a white solid compound A-340 was acquired as a desired compound (yield: 92%).

LC-Mass (theoretical mass: 643.20 g/mol, measured mass: M+1=644 g/mol)

Example 11

Preparation of Compound Represented by Chemical Formula A-373

[Reaction Scheme 53]

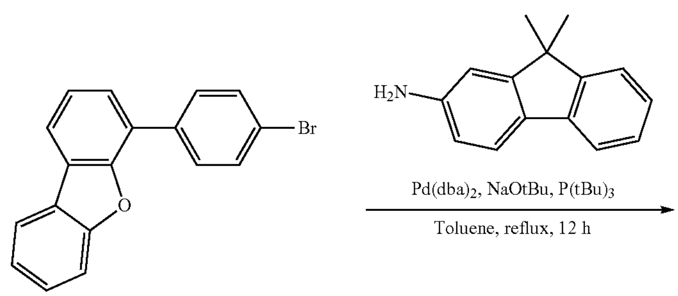

M-5

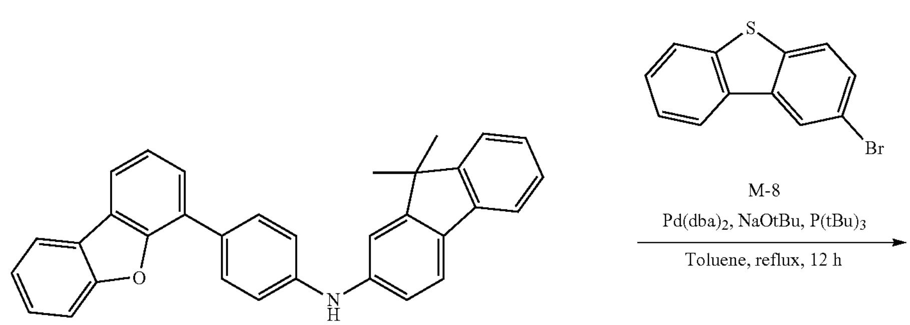

M-16

-continued

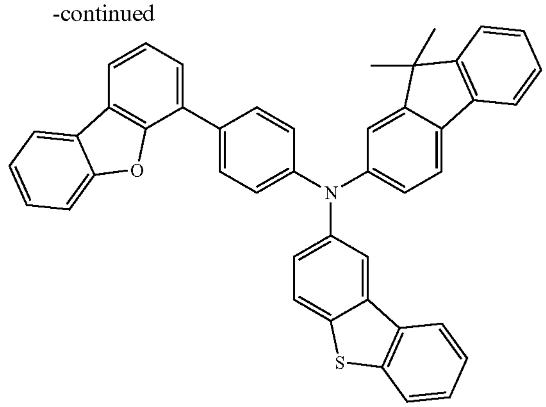

A-373

5.51 g (12.2 mmol) of intermediate M-16, 3.21 g (12.2 mmol) of intermediate M-8, 1.76 g (18.3 mmol) of sodium t-butoxide, and 0.074 g (0.37 mmol) of tri-tert-butylphosphine were added to a flask and dissolved in 120 ml of toluene, and 0.070 g (0.122 mmol) of $Pd(dba)_2$ was added and then refluxed and agitated for 12 hours under a nitrogen atmosphere. After the reaction, the reactant was extracted with ethyl acetate and distilled water. The organic layer was dried with magnesium sulfite and filtered. Then, the filtrate was concentrated under reduced pressure. The product was purified with n-hexane/dichloromethane mixed in a volume ratio of 7:3 through silica gel column chromatography, and then 7.0 g of a white solid compound A-373 was acquired as a desired compound (yield: 91%).

LC-Mass (theoretical mass: 633.21 g/mol, measured mass: M+1=634 g/mol)

Example 12

Preparation of Compound Represented by Chemical Formula A-376

[Reaction Scheme 54]

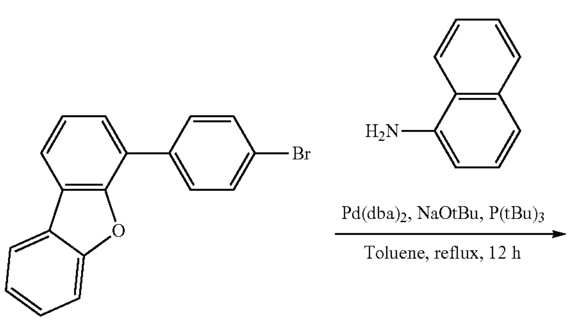

M-5

-continued

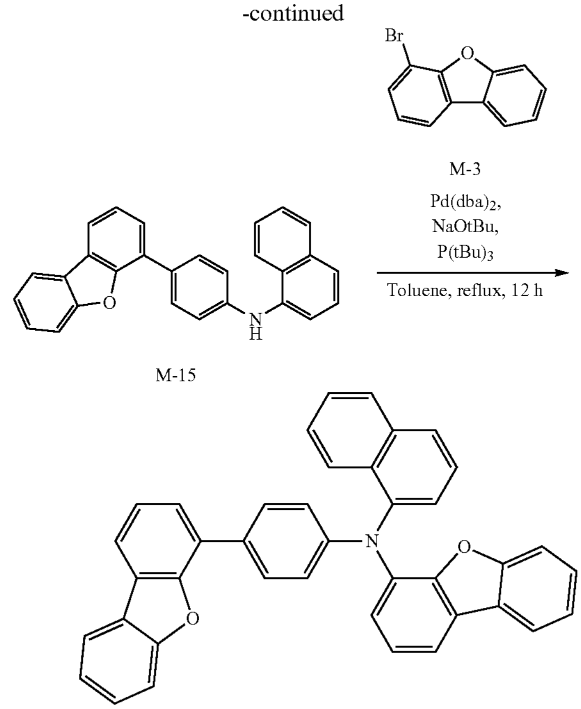

A-376

4.7 g (12.2 mmol) of intermediate M-15, 3.01 g (12.2 mmol) of intermediate M-3, 1.76 g (18.3 mmol) of sodium t-butoxide, and 0.074 g (0.37 mmol) of tri-tert-butylphosphine were added to a flask and dissolved in 120 ml of toluene, and 0.070 g (0.122 mmol) of $Pd(dba)_2$ was added and then refluxed and agitated for 12 hours under a nitrogen atmosphere. After the reaction, the reactant was extracted with ethyl acetate and distilled water. The organic layer was dried with magnesium sulfite and filtered. Then, the filtrate was concentrated under reduced pressure. The product was purified with n-hexane/dichloromethane mixed in a volume ratio of 7:3 through silica gel column chromatography, and then 6.2 g of a white solid compound A-376 was acquired as a desired compound (yield: 92%).

LC-Mass (theoretical mass: 551.19 g/mol, measured mass: M+1=552 g/mol)

Example 13

Preparation of Compound Represented by Chemical Formula A-421

[Reaction Scheme 55]

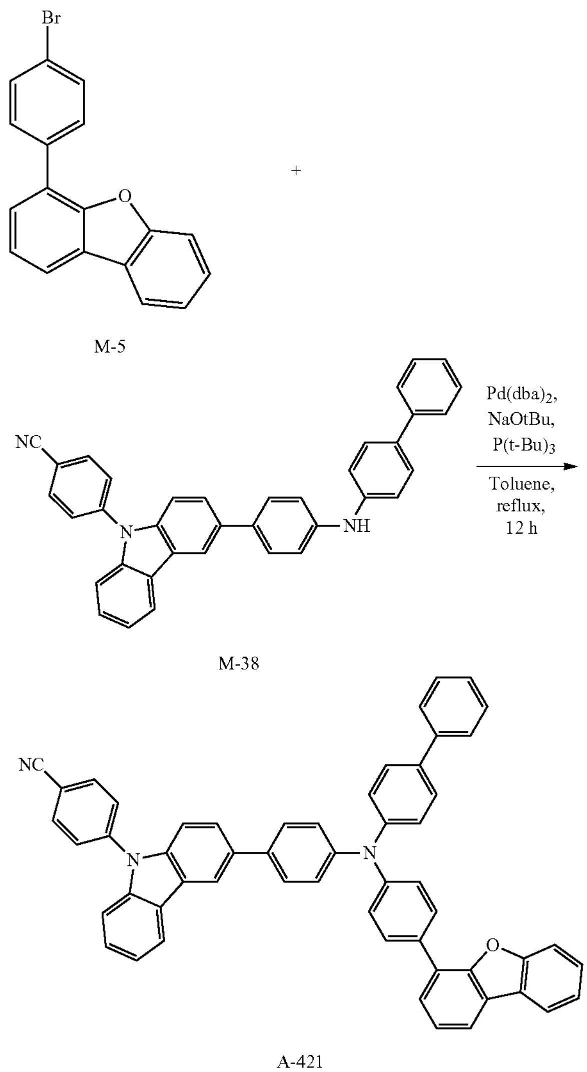

4.4 g (13.7 mmol) of intermediate M-5, 7.0 g (13.7 mmol) of intermediate M-38, 2.63 g (27.4 mmol) of sodium t-butoxide, and 0.08 g (0.41 mmol) of tri-tert-butylphosphine were added to a flask and dissolved in 137 ml of toluene, and 0.08 g (0.137 mmol) of Pd(dba)$_2$ was added and then refluxed and agitated for 12 hours under a nitrogen atmosphere. After the reaction, the reactant was extracted with ethyl acetate and distilled water. The organic layer was dried with magnesium sulfite and filtered. Then, the filtrate was concentrated under reduced pressure. The product was purified with n-hexane/dichloromethane mixed in a volume ratio of 7:3 through silica gel column chromatography, and then 8.7 g of a white solid compound A-421 was acquired as a desired compound (yield: 84%).

LC-Mass (theoretical mass: 753.28 g/mol, measured mass: M+1=754 g/mol)

Example 14

Preparation of Compound Represented by Chemical Formula A-429

[Reaction Scheme 56]

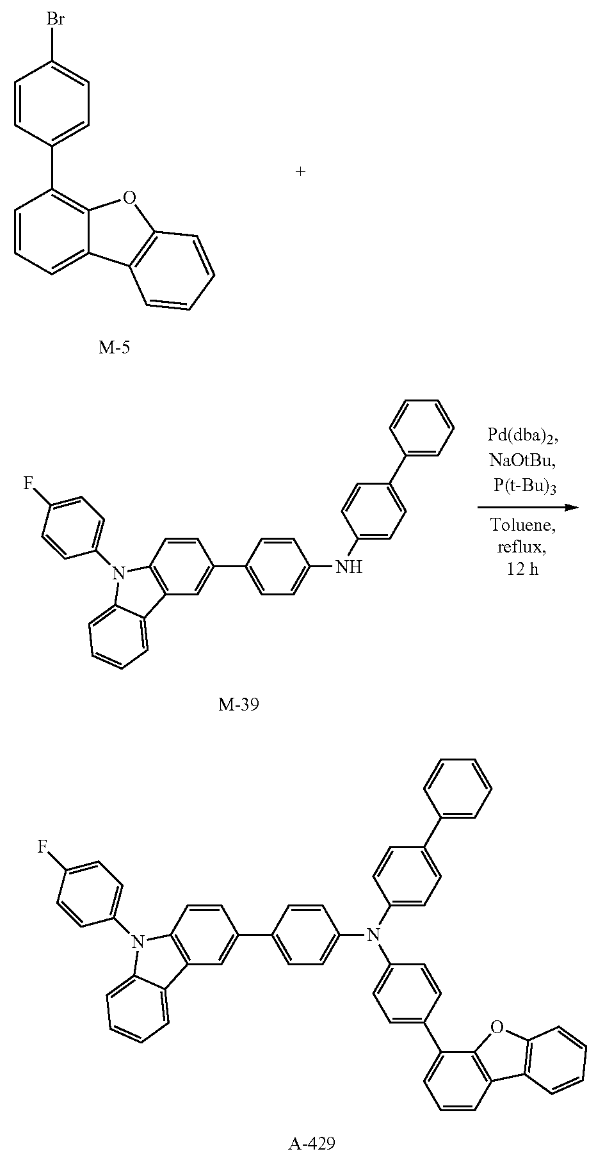

8.3 g of a white solid compound A-429 was acquired as a desired compound (yield: 81%) in accordance with the same procedure as in the acquiring process of compound A-421, except that intermediate M-39 was used instead of intermediate M-38.

LC-Mass (theoretical mass: 746.27 g/mol, measured mass: M+1=747 g/mol).

Example 15
Preparation of Compound Represented by Chemical Formula A-437
[Reaction Scheme 57]
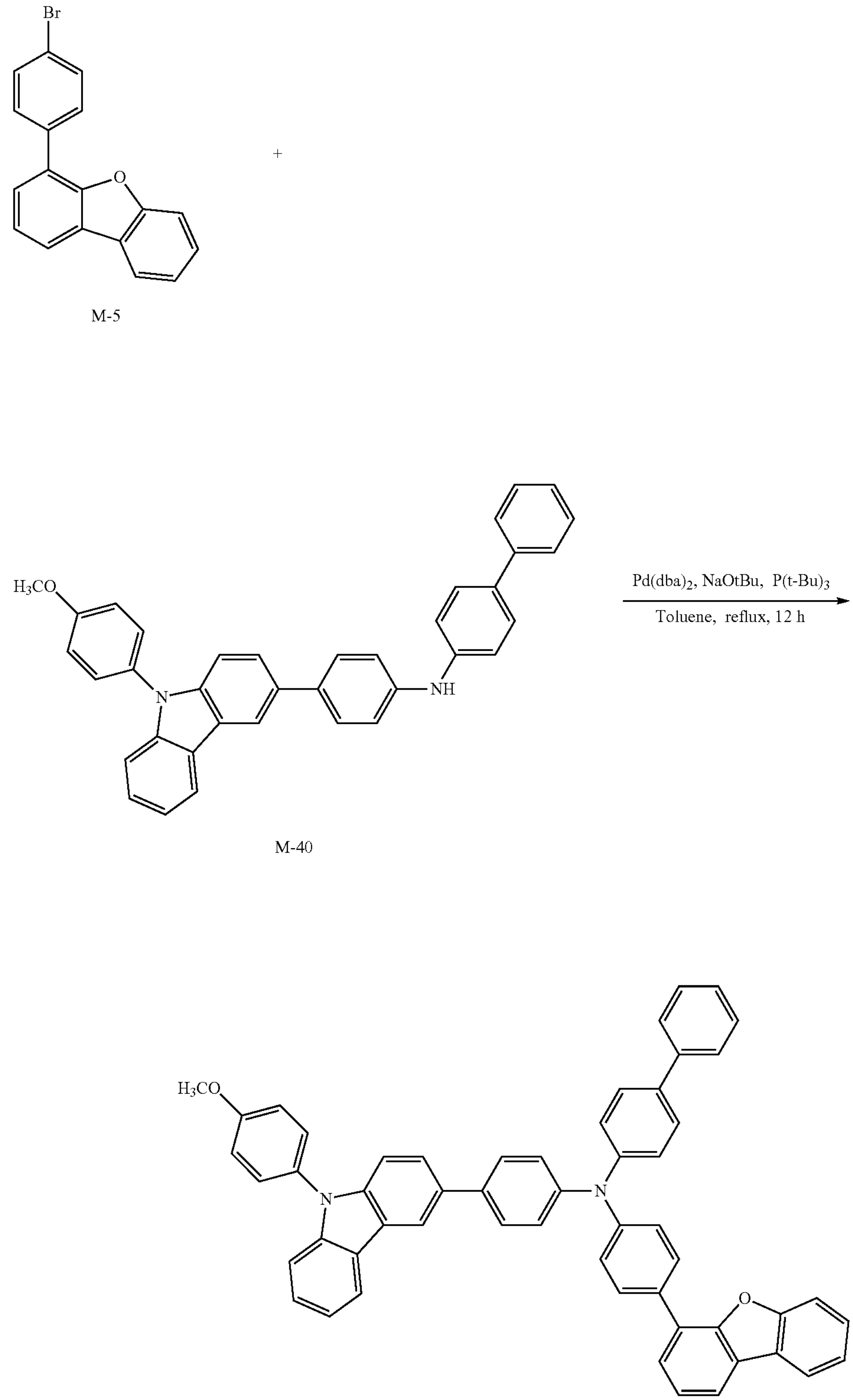

8.8 g of a white solid compound A-437 was acquired as a desired compound (yield: 85%) in accordance with the same procedure as in the acquiring process of compound A-421, except that intermediate M-40 was used instead of intermediate M-38.

LC-Mass (theoretical mass: 758.29 g/mol, measured mass: M+1=759 g/mol).

Example 16

Preparation of Compound Represented by Chemical Formula A-445

[Reaction Scheme 58]

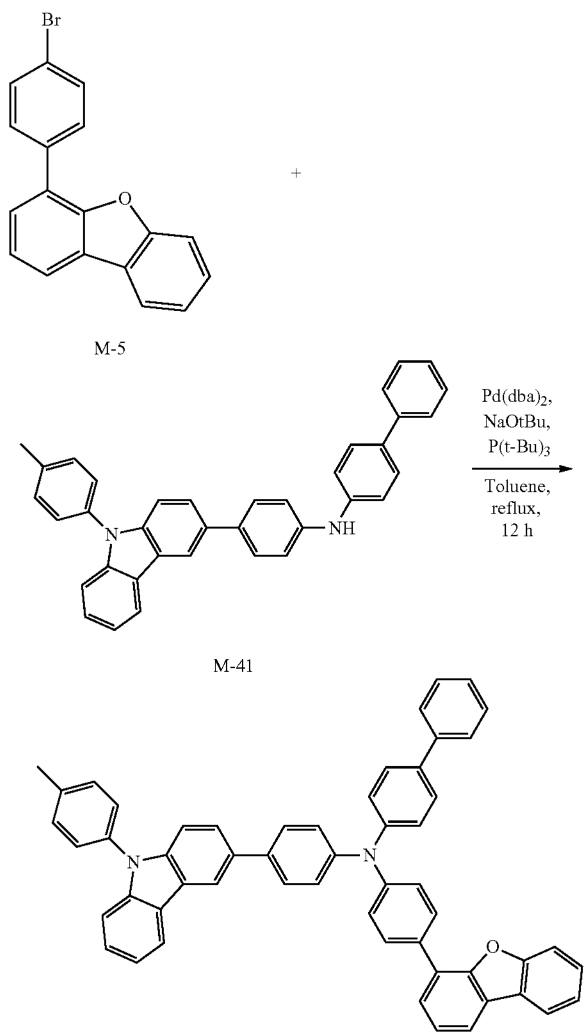

8.9 g of a white solid compound A-445 was acquired as a desired compound (yield: 87%) in accordance with the same procedure as in the acquiring process of compound A-421, except that intermediate M-41 was used instead of intermediate M-38.

LC-Mass (theoretical mass: 742.30 g/mol, measured mass: M+1=743 g/mol).

Example 17

Preparation of Compound Represented by Chemical Formula A-453

[Reaction Scheme 59]

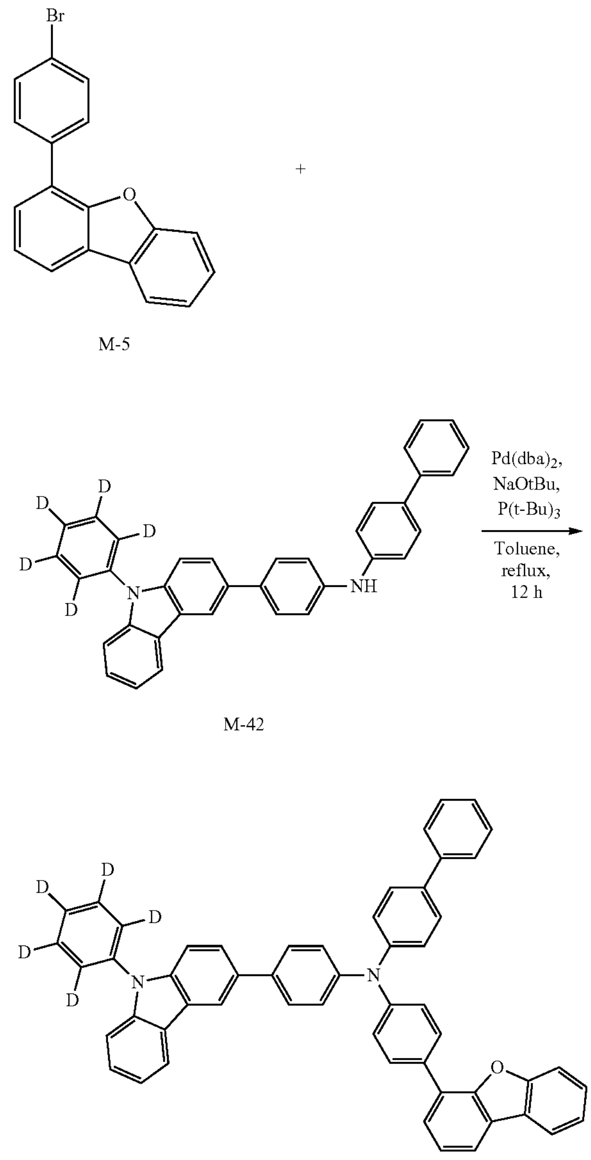

8.3 g of a white solid compound A-453 was acquired as a desired compound (yield: 83%) in accordance with the same procedure as in the acquiring process of compound A-421, except that intermediate M-42 was used instead of intermediate M-38.

LC-Mass (theoretical mass: 733.31 g/mol, measured mass: M+1=734 g/mol).

Example 18

Preparation of Compound Represented by Chemical Formula A-422

[Reaction Scheme 60]

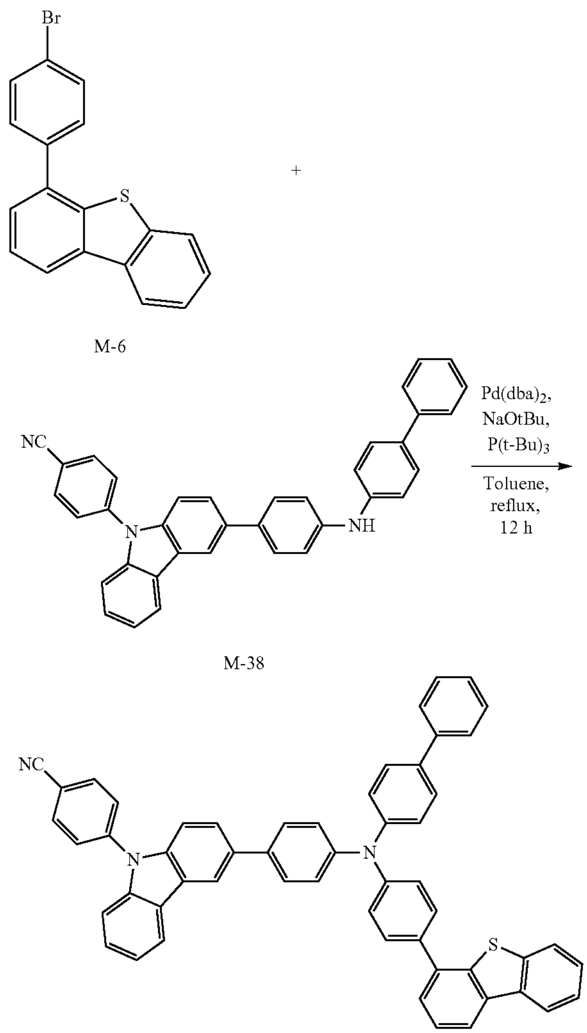

M-6

M-38

A-422

4.6 g (13.7 mmol) of intermediate M-6, 7.0 g (13.7 mmol) of intermediate M-38, 2.63 g (27.4 mmol) of sodium t-butoxide, and 0.08 g (0.41 mmol) of tri-tert-butylphosphine were added to a flask and dissolved in 137 ml of toluene, and 0.08 g (0.137 mmol) of $Pd(dba)_2$ was added and then refluxed and agitated for 12 hours under a nitrogen atmosphere. After the reaction, the reactant was extracted with ethyl acetate and distilled water. The organic layer was dried with magnesium sulfite and filtered. Then, the filtrate was concentrated under reduced pressure. The product was purified with n-hexane/dichloromethane mixed in a volume ratio of 7:3 through silica gel column chromatography, and then 8.6 g of a white solid compound A-422 was acquired as a desired compound (yield: 82%).

LC-Mass (theoretical mass: 769.26 g/mol, measured mass: M+1=770 g/mol)

Example 19

Preparation of Compound Represented by Chemical Formula A-430

[Reaction Scheme 61]

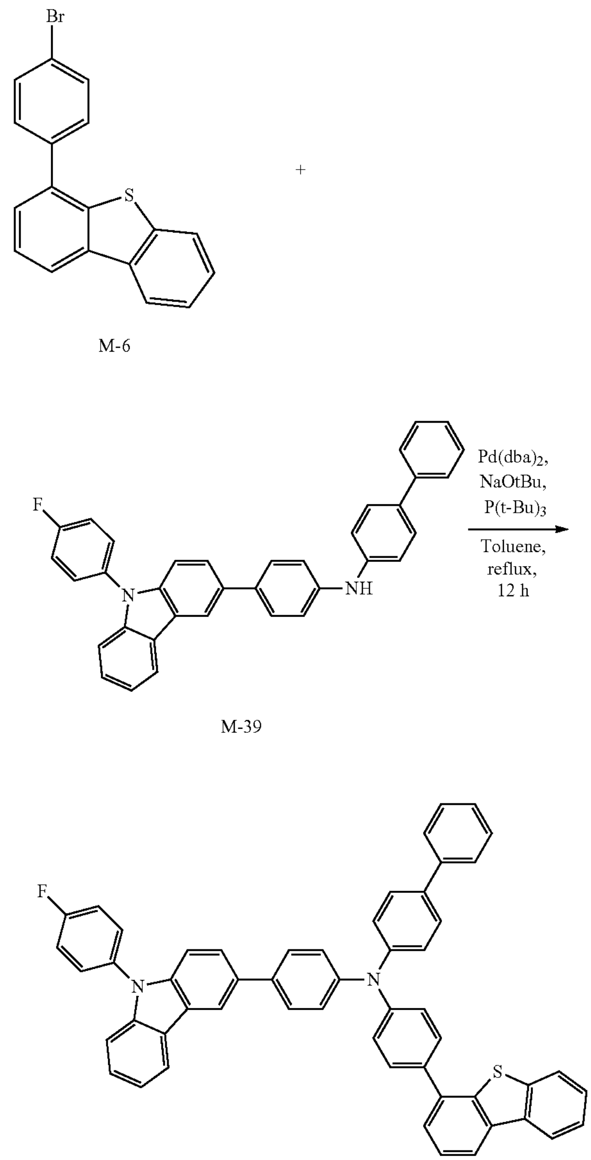

M-6

M-39

A-430

8.8 g of a white solid compound A-430 was acquired as a desired compound (yield: 84%) in accordance with the same procedure as in the acquiring process of compound A-422, except that intermediate M-39 was used instead of intermediate M-38.

LC-Mass (theoretical mass: 762.25 g/mol, measured mass: M+1=763 g/mol).

Example 20

Preparation of Compound Represented by Chemical Formula A-438

[Reaction Scheme 62]

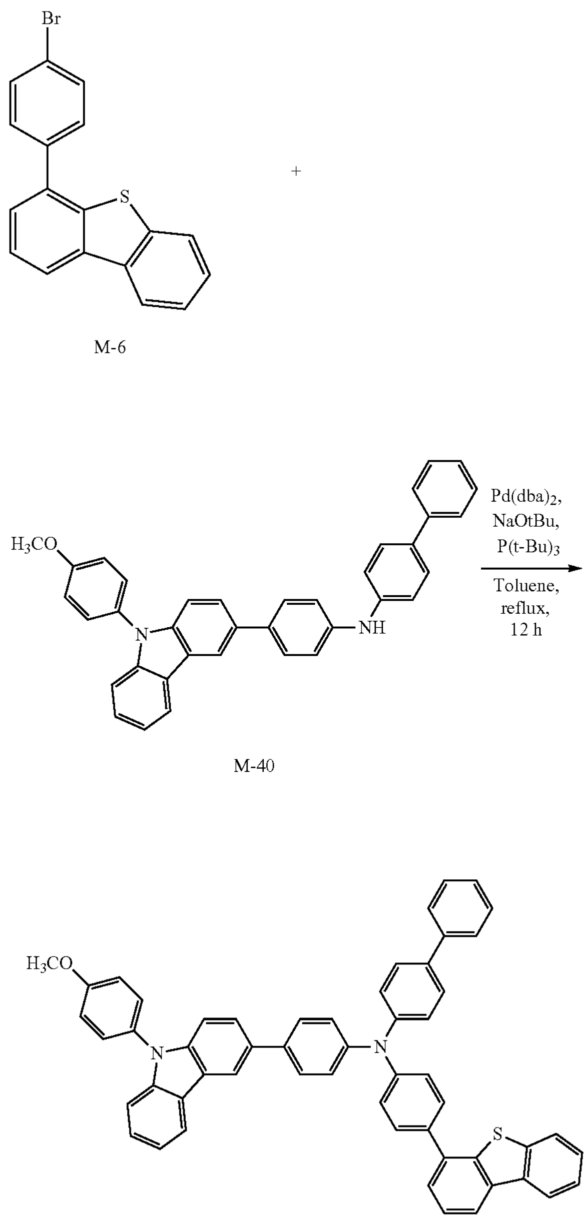

9.1 g of a white solid compound A-438 was acquired as a desired compound (yield: 86%) in accordance with the same procedure as in the acquiring process of compound A-422, except that intermediate M-40 was used instead of intermediate M-38.

LC-Mass (theoretical mass: 774.27 g/mol, measured mass: M+1=775 g/mol).

Example 21

Preparation of Compound Represented by Chemical Formula A-446

[Reaction Scheme 63]

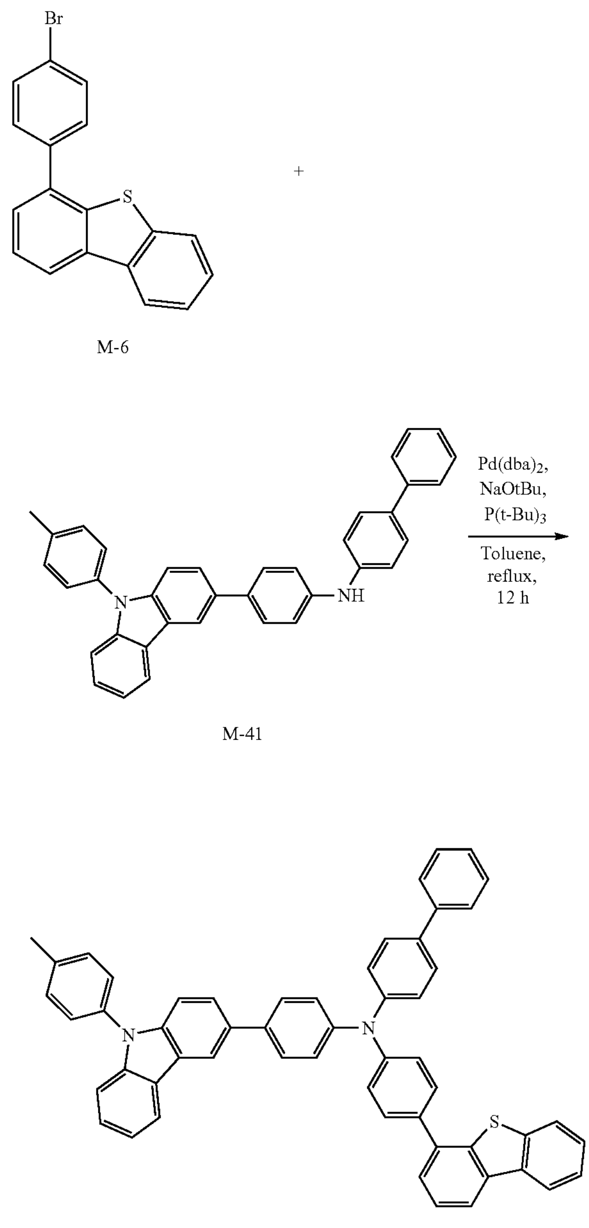

9.2 g of a white solid compound A-446 was acquired as a desired compound (yield: 88%) in accordance with the same procedure as in the acquiring process of compound A-422, except that intermediate M-41 was used instead of intermediate M-38.

LC-Mass (theoretical mass: 758.28 g/mol, measured mass: M+1=759 g/mol).

Example 22

Preparation of Compound Represented by Chemical Formula A-454

[Reaction Scheme 64]

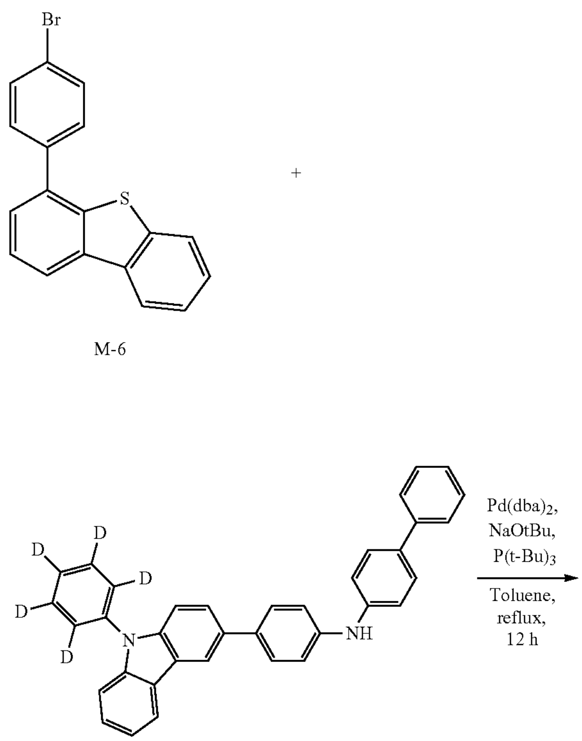

M-6

M-42

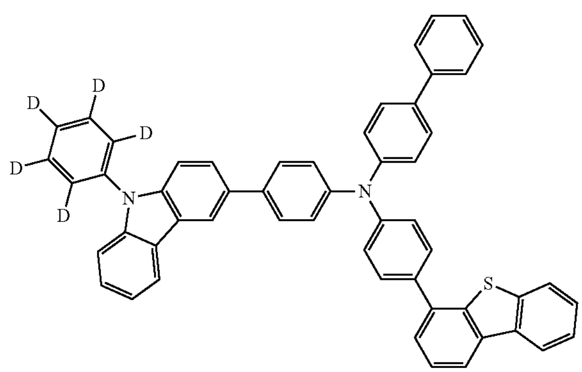

A-454

8.8 g of a white solid compound A-454 was acquired as a desired compound (yield: 86%) in accordance with the same procedure as in the acquiring process of compound A-422, except that intermediate M-42 was used instead of intermediate M-38.

LC-Mass (theoretical mass: 749.29 g/mol, measured mass: M+1=750 g/mol).

Example 23

Preparation of Compound Represented by Chemical Formula A-42

[Reaction Scheme 65]

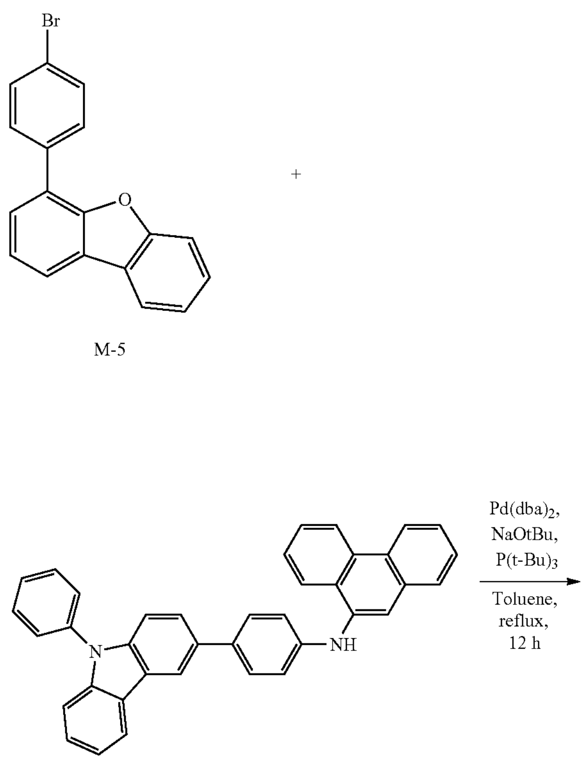

M-5

M-43

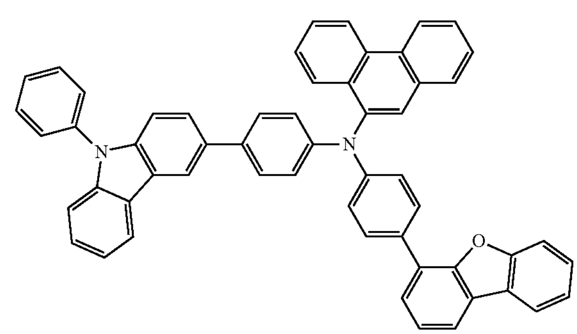

A-42

8.4 g of a white solid compound A-42 was acquired as a desired compound (yield: 81%) in accordance with the same procedure as in the acquiring process of compound A-421, except that intermediate M-43 was used instead of intermediate M-38.

LC-Mass (theoretical mass: 752.28 g/mol, measured mass: M+1=753 g/mol).

Example 24

Preparation of Compound Represented by Chemical Formula A-43

[Reaction Scheme 66]

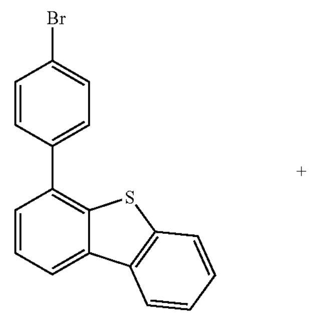

M-6

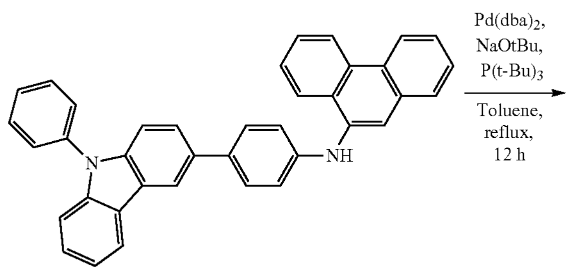

M-43

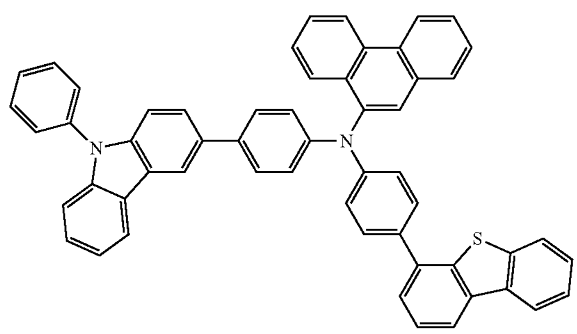

A-43

8.7 g of a white solid compound A-43 was acquired as a desired compound (yield: 83%) in accordance with the same procedure as in the acquiring process of compound A-422, except that intermediate M-43 was used instead of intermediate M-38.

LC-Mass (theoretical mass: 768.26 g/mol, measured mass: M+1=769 g/mol).

Example 25

Preparation of Compound Represented by Chemical Formula A-234

[Reaction Scheme 67]

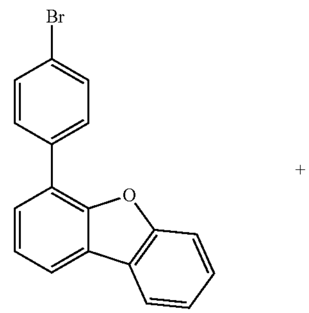

M-5

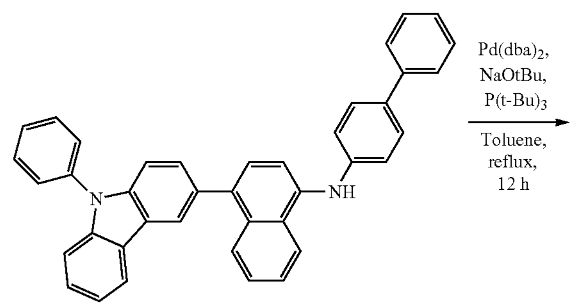

M-44

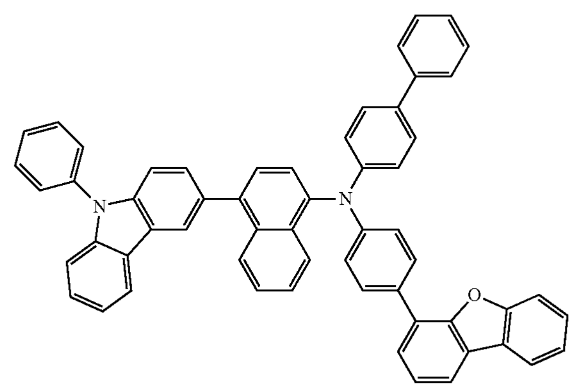

A-234

9.0 g of a white solid compound A-234 was acquired as a desired compound (yield: 84%) in accordance with the same procedure as in the acquiring process of compound A-421, except that intermediate M-44 was used instead of intermediate M-38.

LC-Mass (theoretical mass: 778.30 g/mol, measured mass: M+1=779 g/mol).

Example 26

Preparation of Compound Represented by Chemical Formula A-235

[Reaction Scheme 68]

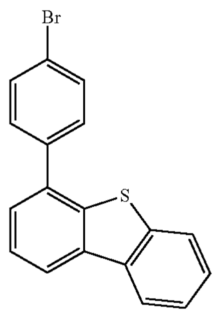

M-6

+

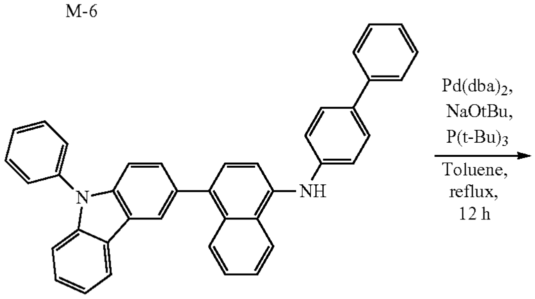

M-44

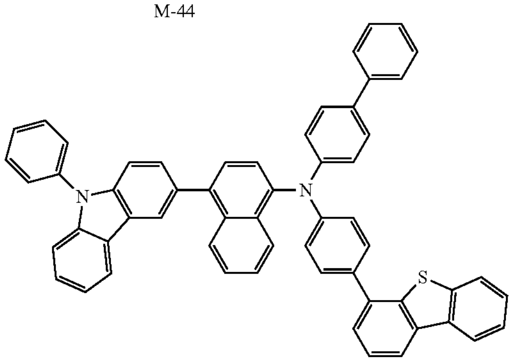

A-235

9.0 g of a white solid compound A-235 was acquired as a desired compound (yield: 83%) in accordance with the same procedure as in the acquiring process of compound A-422, except that intermediate M-44 was used instead of intermediate M-38.

LC-Mass (theoretical mass: 794.28 g/mol, measured mass: M+1=795 g/mol).

Example 27

Preparation of Compound Represented by Chemical Formula A-469

[Reaction Scheme 69]

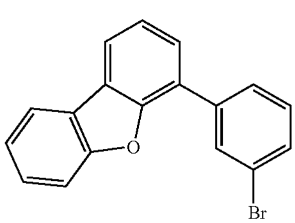

M-45

+

-continued

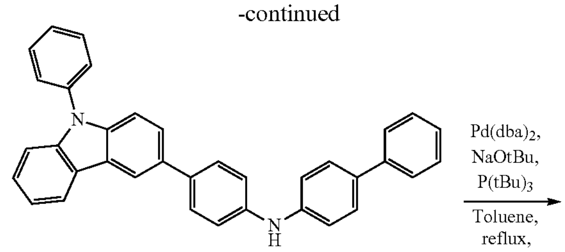

M-11

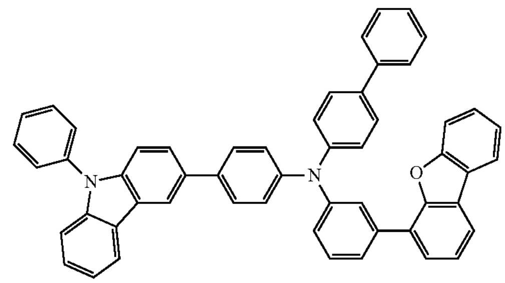

A-469

12.8 g of a white solid compound A-469 was acquired as a desired compound (yield: 87%) in accordance with the same procedure as in the acquiring process of intermediate compound A-10, except that intermediate M-45 was used instead of intermediate M-5.

LC-Mass (theoretical mass: 728.28 g/mol, measured mass: M+1=729 g/mol).

Example 28

Preparation of Compound Represented by Chemical Formula A-470

[Reaction Scheme 70]

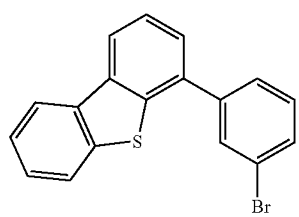

M-46

+

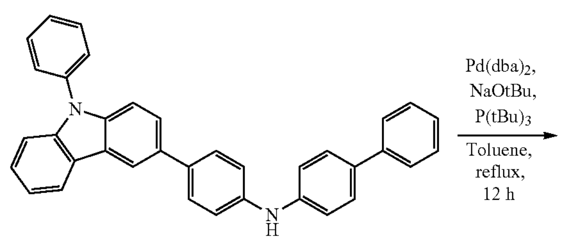

M-11

-continued

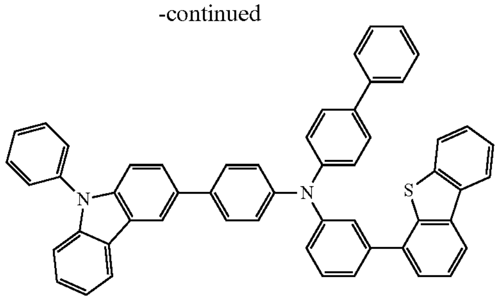

A-470

13.4 g of a white solid compound A-470 was acquired as a desired compound (yield: 89%) in accordance with the same procedure as in the acquiring process of intermediate compound A-11, except that intermediate M-46 was used instead of intermediate M-6.

LC-Mass (theoretical mass: 744.26 g/mol, measured mass: M+1=745 g/mol).

Example 29

Preparation of Compound Represented by Chemical Formula A-457

[Reaction Scheme 71]

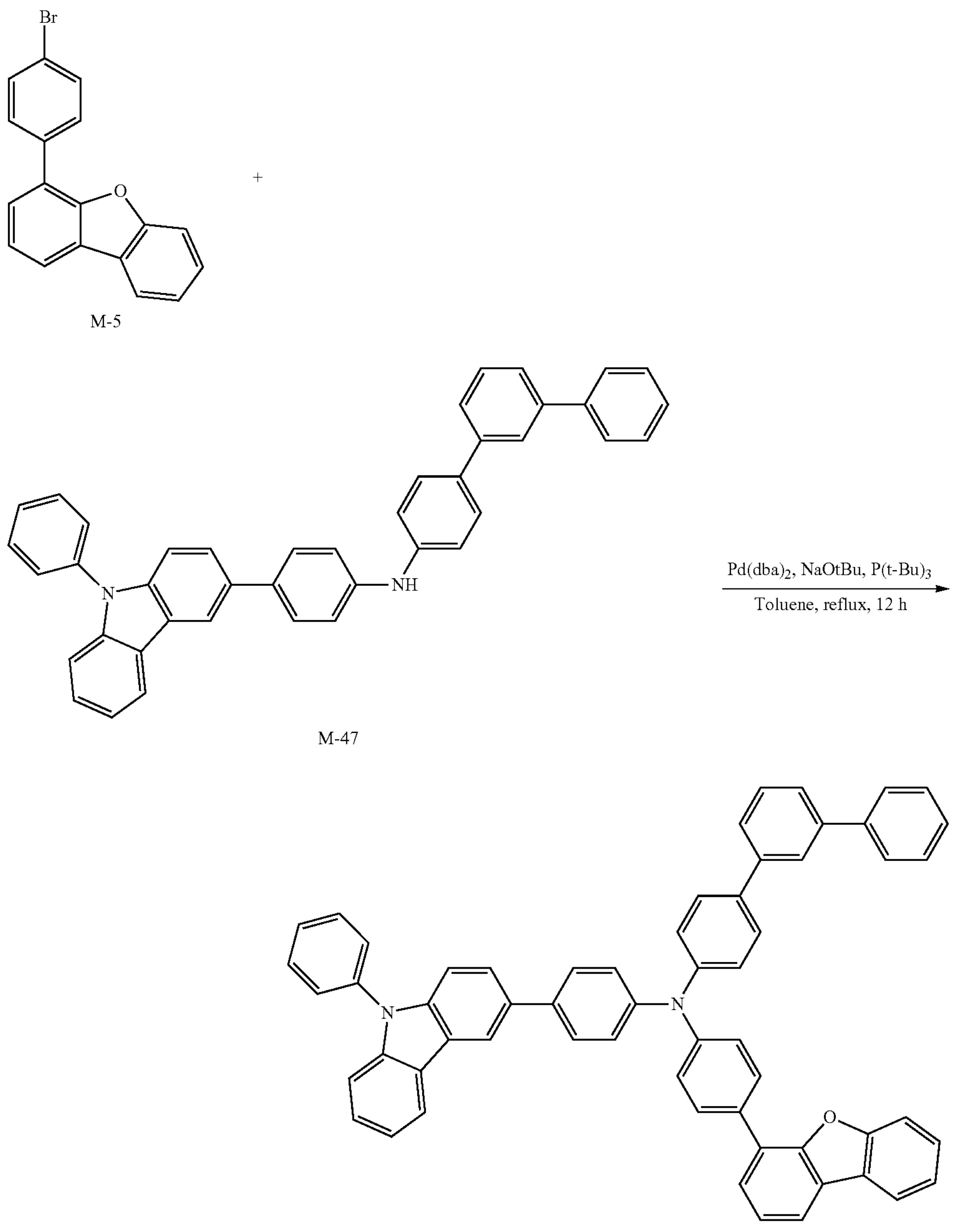

A-457

9.4 g of a white solid compound A-457 was acquired as a desired compound (yield: 85%) in accordance with the same procedure as in the acquiring process of intermediate compound A-421, except that intermediate M-47 was used instead of intermediate M-38.

LC-Mass (theoretical mass: 804.31 g/mol, measured mass: M+1=805 g/mol).

Example 30

Preparation of Compound Represented by Chemical Formula A-458

[Reaction Scheme 72]

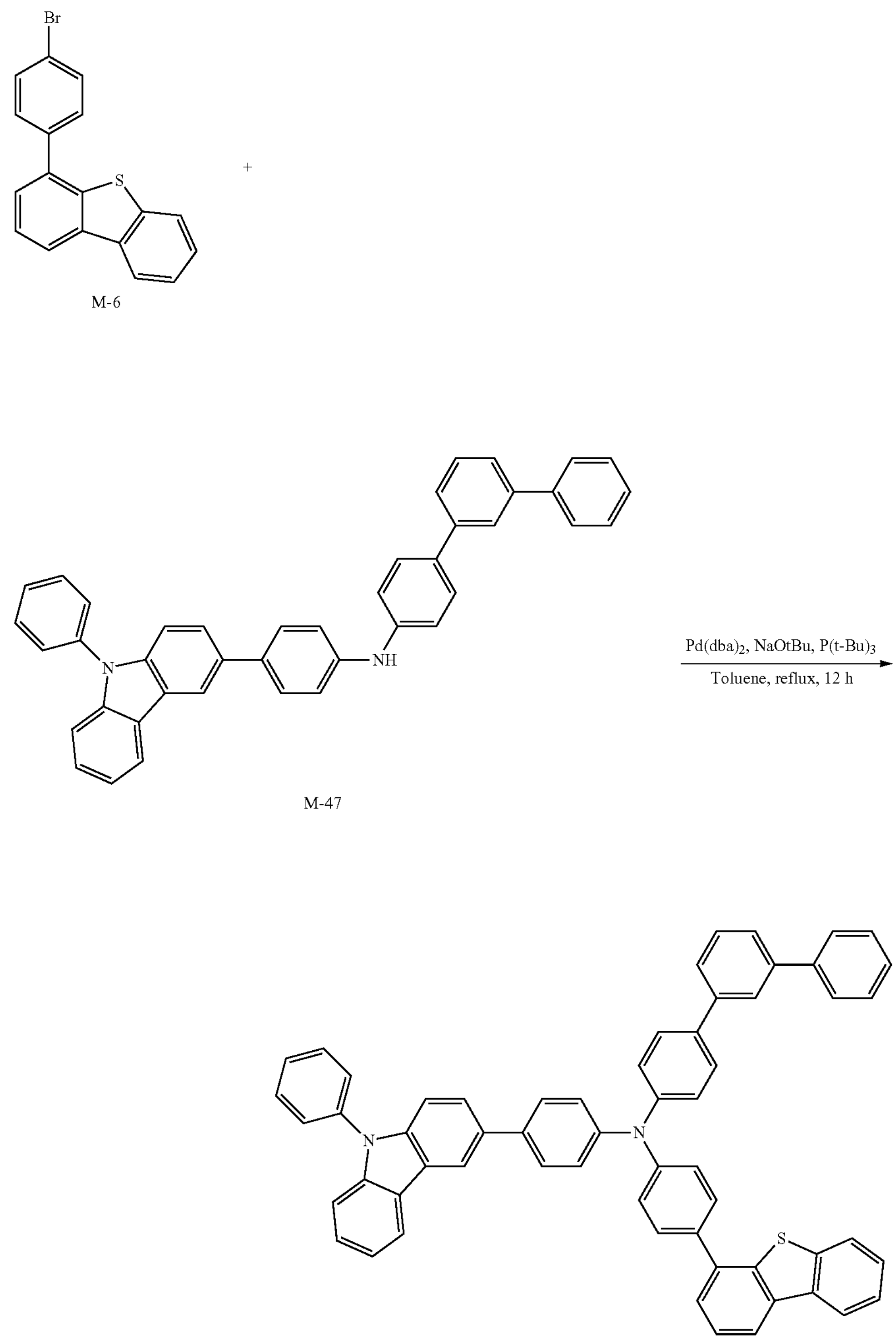

10.01 g of a white solid compound A-458 was acquired as a desired compound (yield: 89%) in accordance with the same procedure as in the acquiring process of intermediate compound A-422, except that intermediate M-47 was used instead of intermediate M-38.

LC-Mass (theoretical mass: 820.29 g/mol, measured mass: M+1=821 g/mol).

Example 31

Preparation of Compound Represented by Chemical Formula A-463

[Reaction Scheme 73]

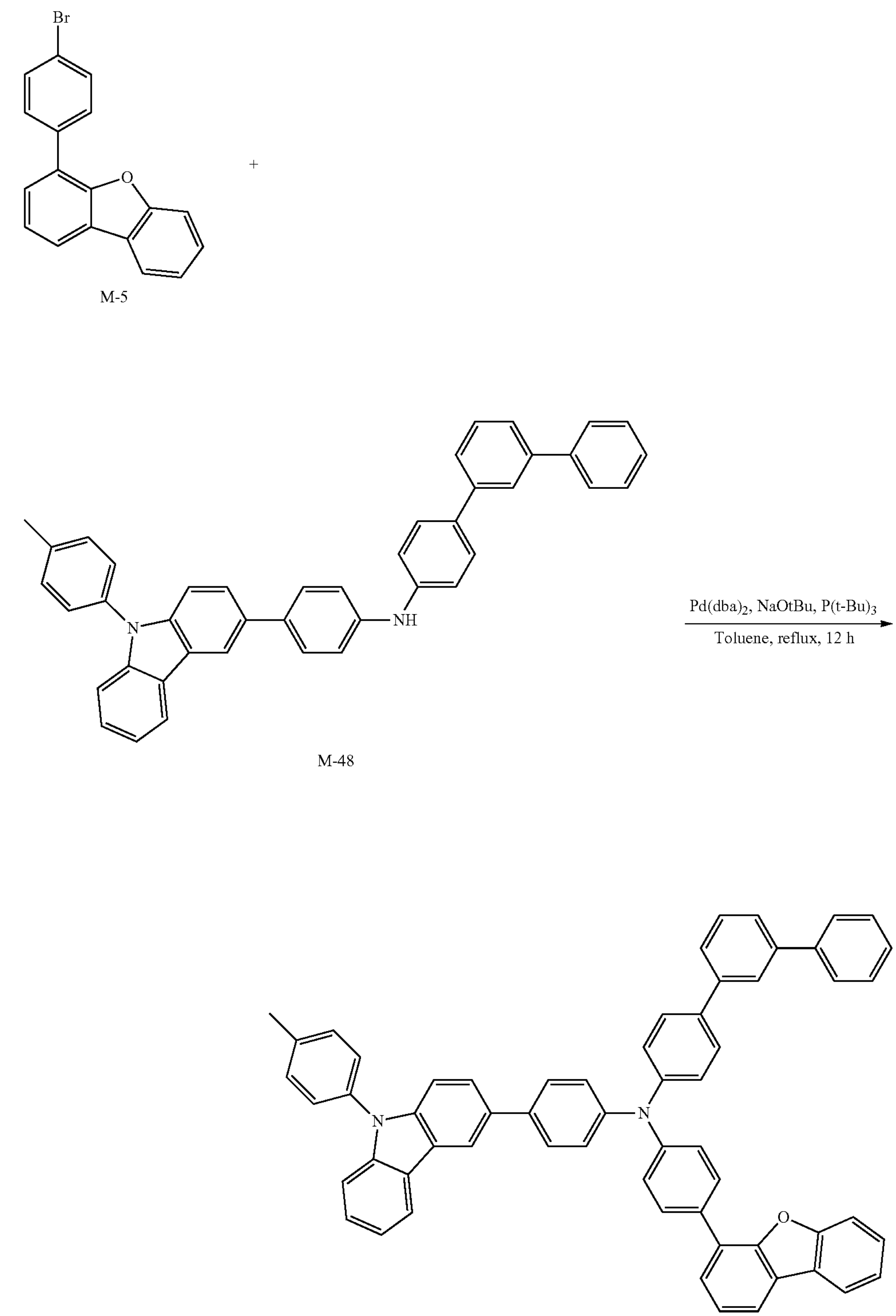

M-5

M-48

A-463

9.5 g of a white solid compound A-463 was acquired as a desired compound (yield: 85%) in accordance with the same procedure as in the acquiring process of intermediate compound A-421, except that intermediate M-48 was used instead of intermediate M-38.

LC-Mass (theoretical mass: 818.33 g/mol, measured mass: M+1=819 g/mol).

Example 32

Preparation of Compound Represented by Chemical Formula A-464

[Reaction Scheme 74]

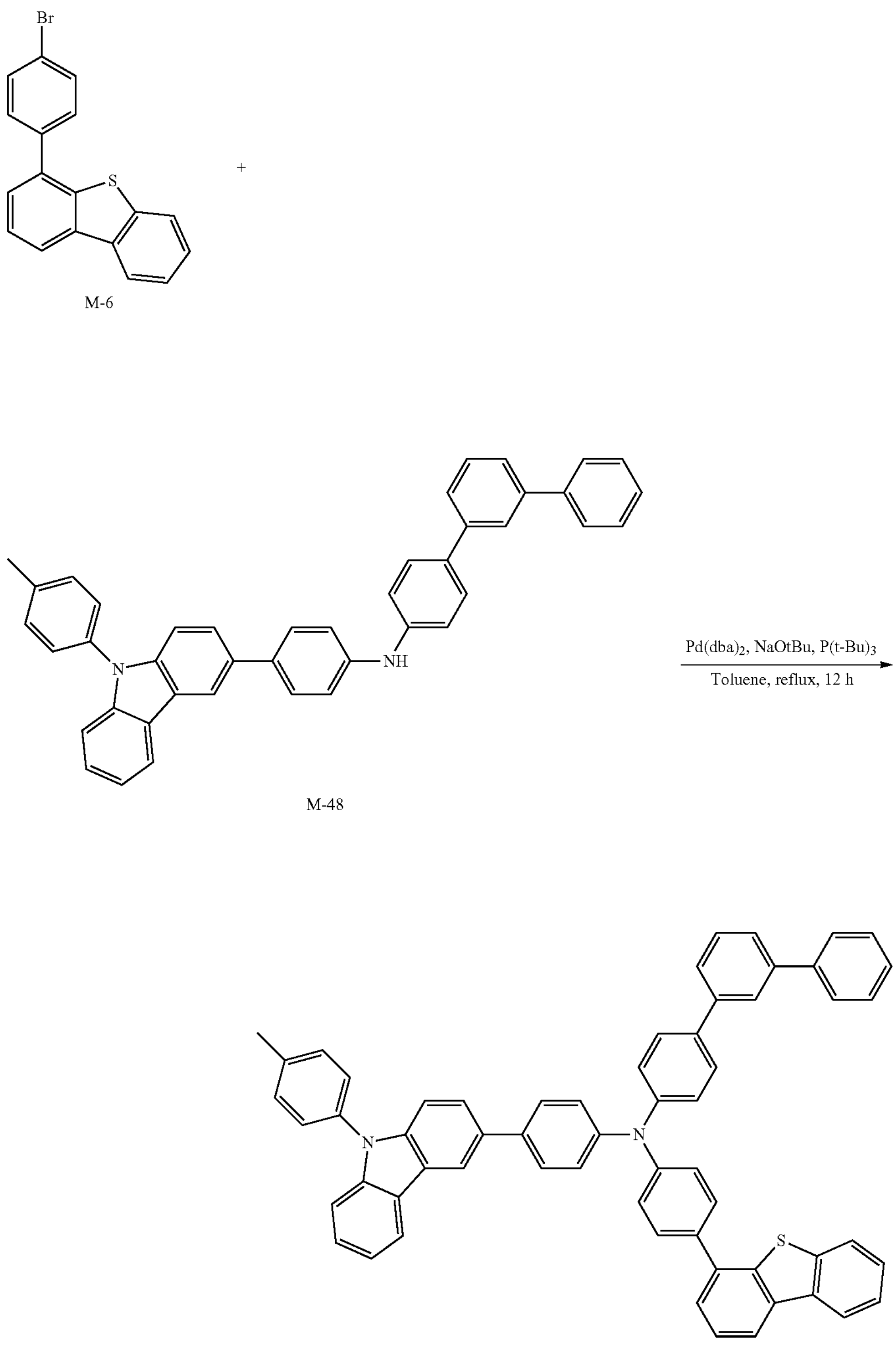

9.8 g of a white solid compound A-464 was acquired as a desired compound (yield: 86%) in accordance with the same procedure as in the acquiring process of intermediate compound A-422, except that intermediate M-48 was used instead of intermediate M-38.

LC-Mass (theoretical mass: 834.31 g/mol, measured mass: M+1=835 g/mol).

Example 33

Preparation of Compound Represented by Chemical Formula A-467

[Reaction Scheme 75]

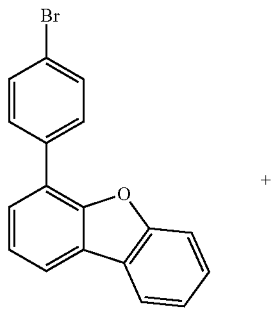

M-5

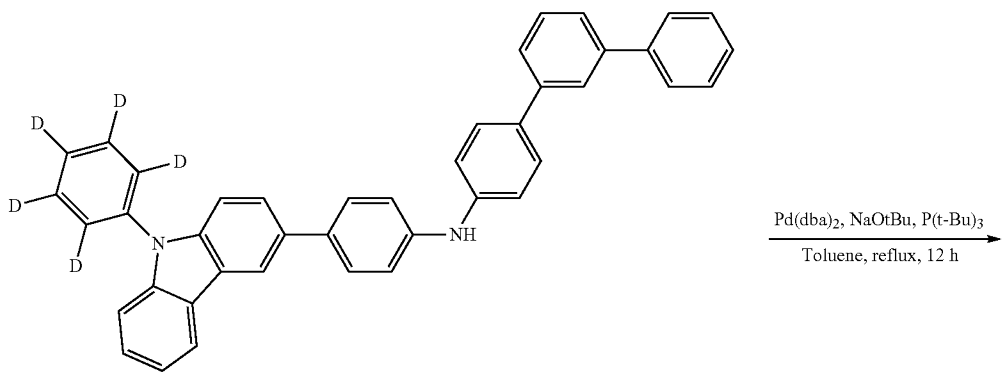

M-49

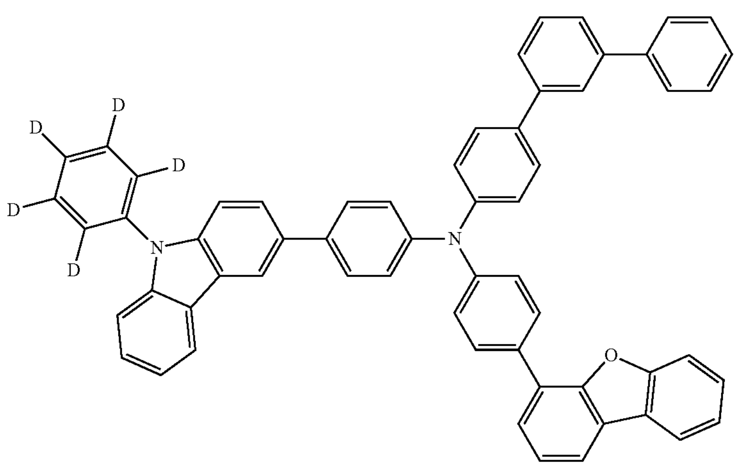

A-467

9.8 g of a white solid compound A-467 was acquired as a desired compound (yield: 88%) in accordance with the same procedure as in the acquiring process of intermediate compound A-421, except that intermediate M-49 was used instead of intermediate M-38.

LC-Mass (theoretical mass: 809.34 g/mol, measured mass: M+1=810 g/mol).

Example 34

Preparation of Compound Represented by Chemical Formula A-468

[Reaction Scheme 76]

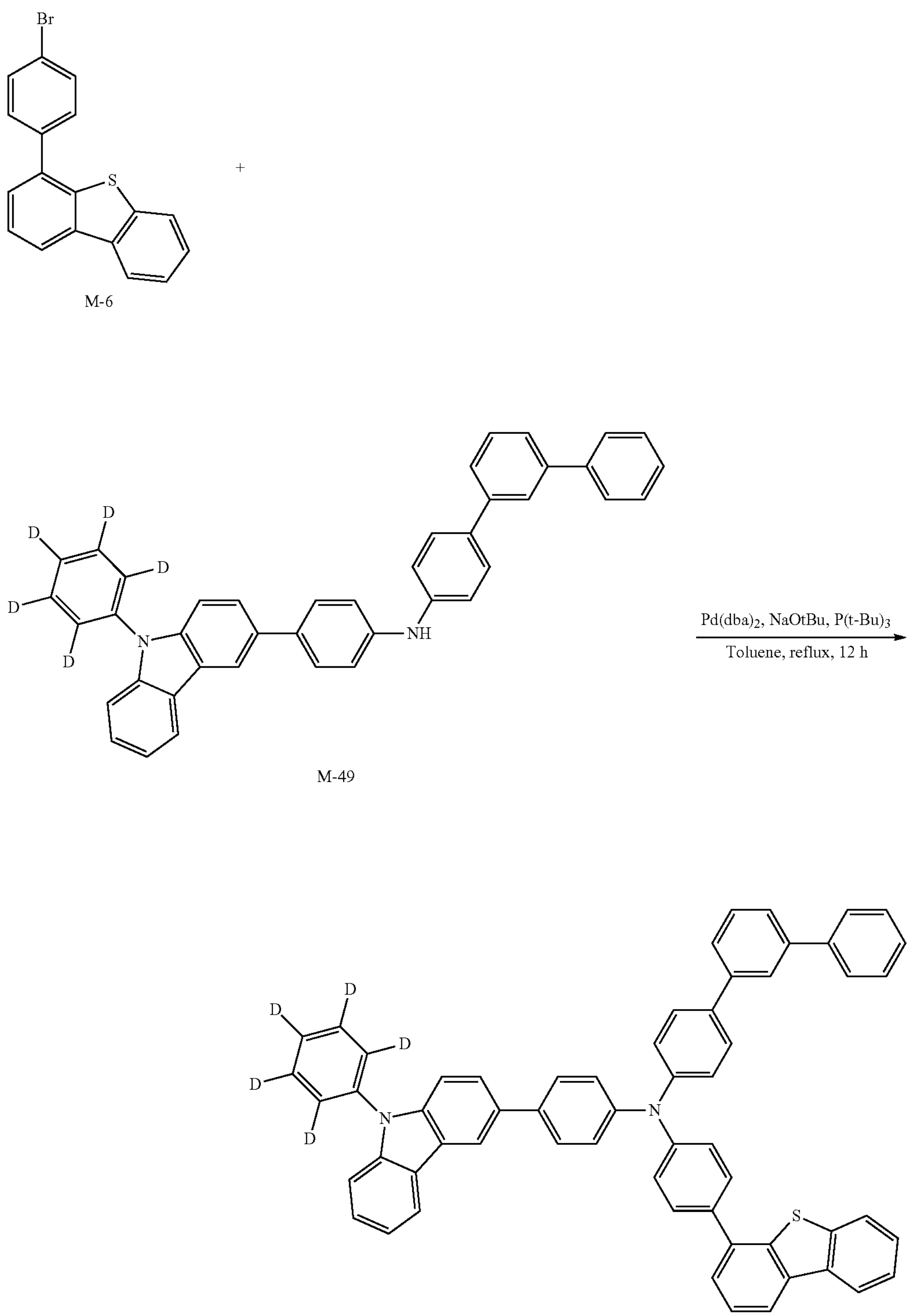

9.3 g of a white solid compound A-468 was acquired as a desired compound (yield: 82%) in accordance with the same procedure as in the acquiring process of intermediate compound A-422, except that intermediate M-49 was used instead of intermediate M-38.

LC-Mass (theoretical mass: 825.32 g/mol, measured mass: M+1=826 g/mol).

Example 35

Preparation of Compound Represented by Chemical Formula A-306

[Reaction Scheme 77]

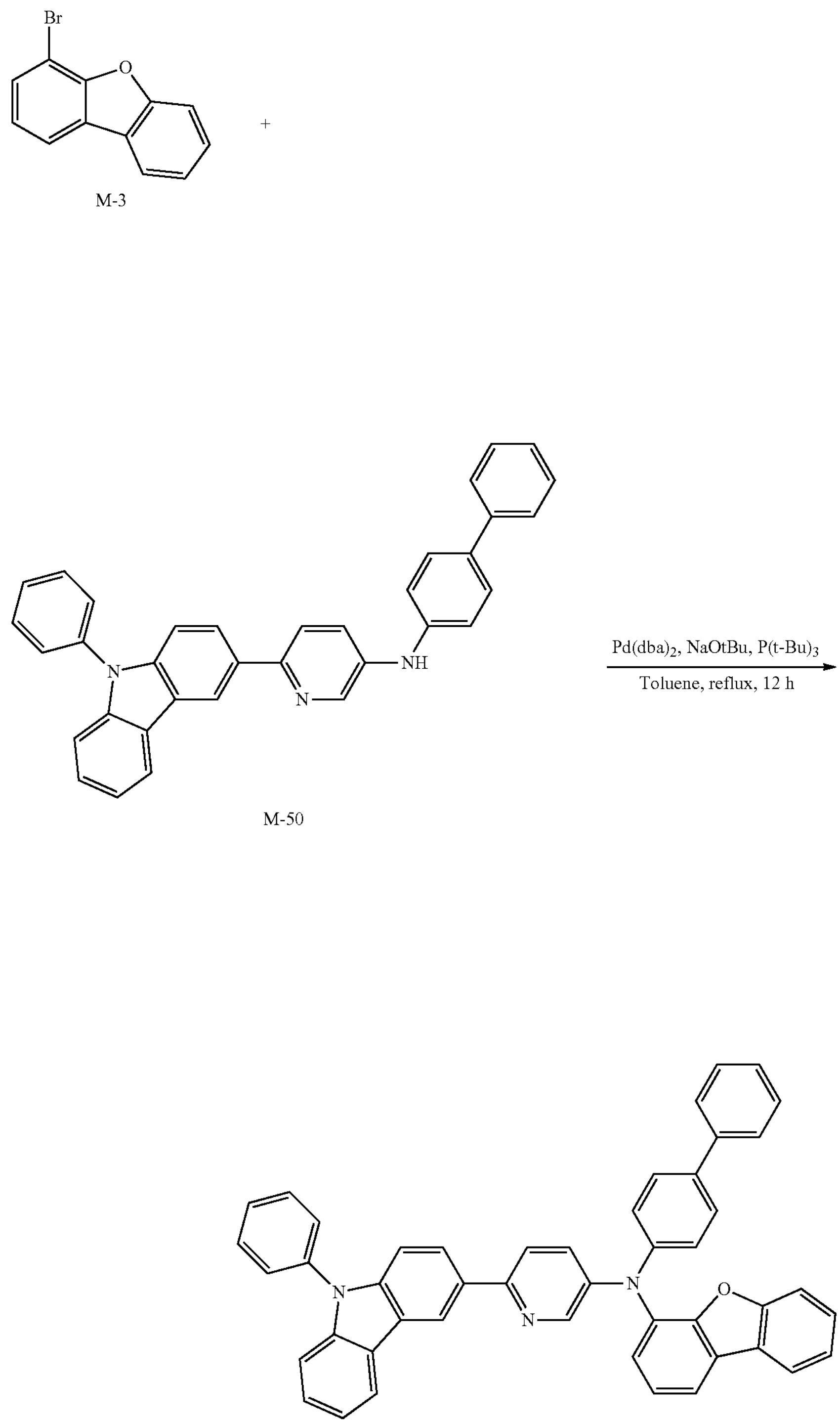

M-3

M-50

A-306

3.4 g (13.7 mmol) of intermediate M-3, 6.7 g (13.7 mmol) of intermediate M-50, 2.63 g (27.4 mmol) of sodium t-butoxide, and 0.08 g (0.41 mmol) of tri-tert-butylphosphine were added to a flask and dissolved in 750 ml of toluene, and 0.43 g (0.753 mmol) of $Pd(dba)_2$ was added and then refluxed and agitated for 12 hours under a nitrogen atmosphere. After the reaction, the reactant was extracted with ethyl acetate and distilled water. The organic layer was dried with magnesium sulfite and filtered. Then, the filtrate was concentrated under reduced pressure. The product was purified with n-hexane/dichloromethane mixed in a volume ratio of 6:4 through silica gel column chromatography, and then 7.0 g of a white solid compound A-306 was acquired as a desired compound (yield: 78%).

LC-Mass (theoretical mass: 653.25 g/mol, measured mass: M+1=654 g/mol)

Example 36

Preparation of Compound Represented by Chemical Formula A-319

[Reaction Scheme 78]

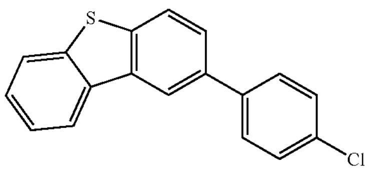

M-10

+

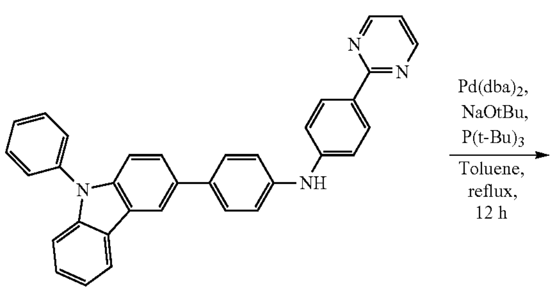

M-51

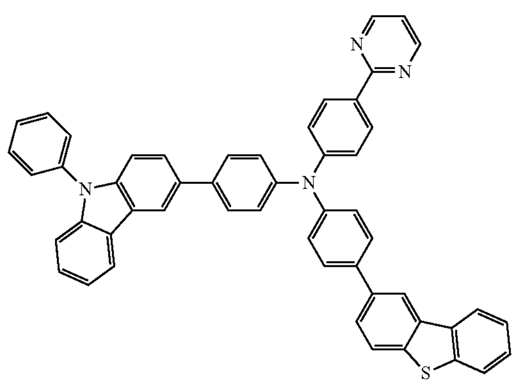

A-319

4.0 g (13.7 mmol) of intermediate M-10, 6.7 g (13.7 mmol) of intermediate M-51, 2.63 g (27.4 mmol) of sodium t-butoxide, and 0.08 g (0.41 mmol) of tri-tert-butylphosphine were added to a flask and dissolved in 137 ml of toluene, and 0.08 g (0.137 mmol) of $Pd(dba)_2$ was added and then refluxed and agitated for 12 hours under a nitrogen atmosphere. After the reaction, the reactant was extracted with ethyl acetate and distilled water. The organic layer was dried with magnesium sulfite and filtered. Then, the filtrate was concentrated under reduced pressure. The product was purified with n-hexane/dichloromethane mixed in a volume ratio of 6:4 through silica gel column chromatography, and then 8.4 g of a white solid compound A-306 was acquired as a desired compound (yield: 82%).

LC-Mass (theoretical mass: 746.25 g/mol, measured mass: M+1=747 g/mol)

Example 37

Preparation of Compound Represented by Chemical Formula A-416

[Reaction Scheme 79]

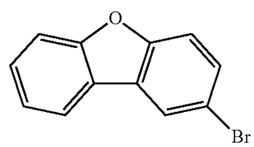

M-7

+

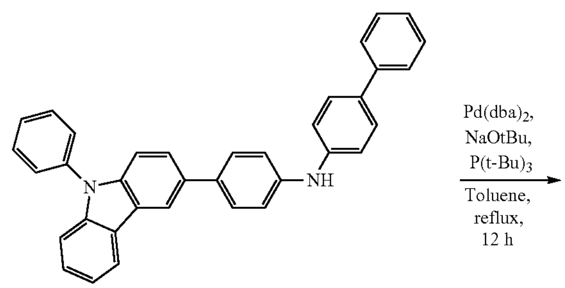

M-11

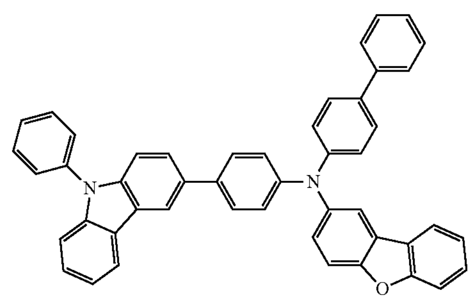

A-416

11.2 g of a white solid compound A-416 was acquired as a desired compound (yield: 85%) in accordance with the same procedure as in the acquiring process of intermediate compound A-414, except that intermediate M-7 was used instead of intermediate M-3.

LC-Mass (theoretical mass: 652.25 g/mol, measured mass: M+1=653 g/mol).

Example 38

Preparation of Compound Represented by Chemical Formula A-12

[Reaction Scheme 80]

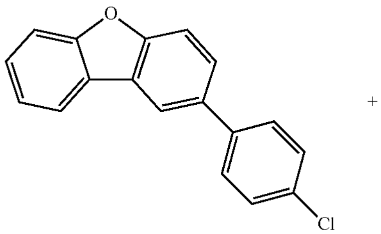

M-9

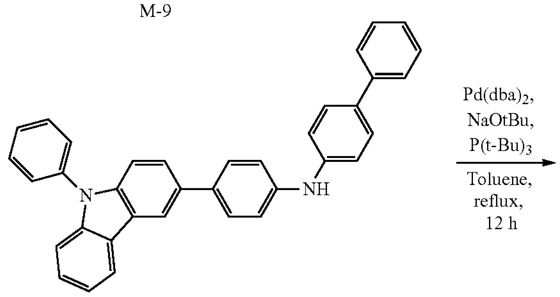

M-11

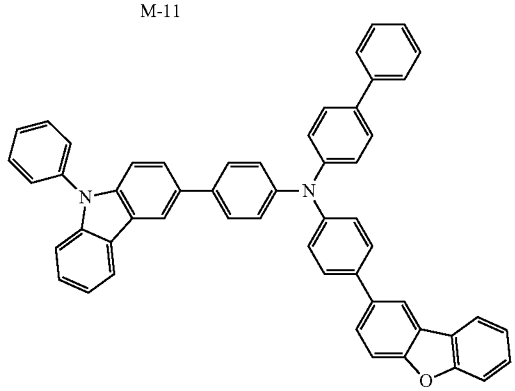

A-12

12.2 g of a white solid compound A-12 was acquired as a desired compound (yield: 83%) in accordance with the same procedure as in the acquiring process of intermediate compound A-414, except that intermediate M-9 was used instead of intermediate M-3.

LC-Mass (theoretical mass: 728.28 g/mol, measured mass: M+1=729 g/mol).

Example 39

Preparation of Compound Represented by Chemical Formula A-13

[Reaction Scheme 81]

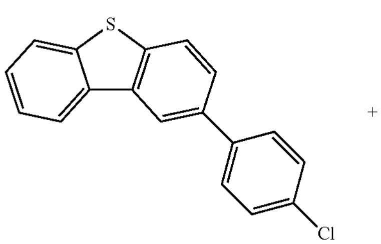

M-10

-continued

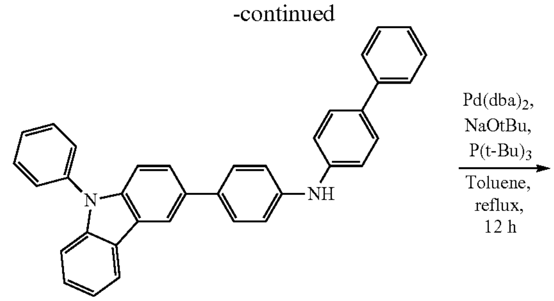

M-11

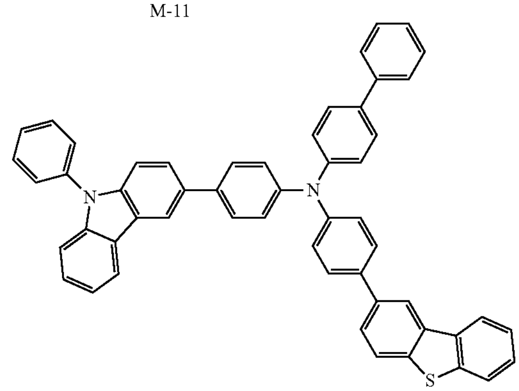

A-13

12.8 g of a white solid compound A-13 was acquired as a desired compound (yield: 85%) in accordance with the same procedure as in the acquiring process of intermediate compound A-414, except that intermediate M-10 was used instead of intermediate M-3.

LC-Mass (theoretical mass: 744.26 g/mol, measured mass: M+1=745 g/mol).

Example 40

Preparation of Compound Represented by Chemical Formula A-396

[Reaction Scheme 82]

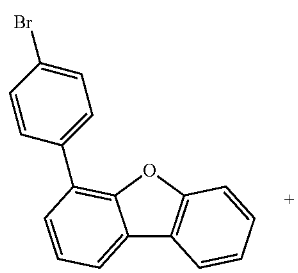

M-5

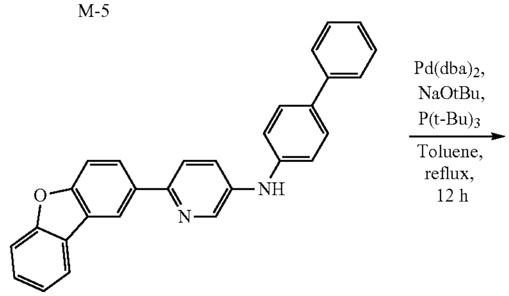

M-52

-continued

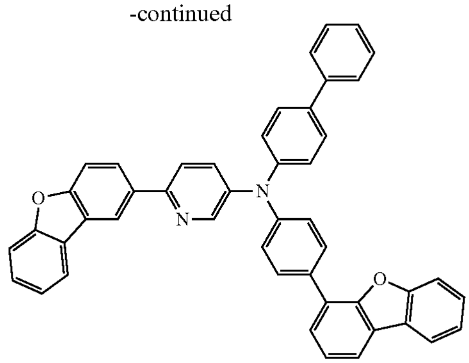

A-396

4.4 g (13.7 mmol) of intermediate M-5, 5.7 g (13.7 mmol) of intermediate M-52, 2.63 g (27.4 mmol) of sodium t-butoxide, and 0.08 g (0.41 mmol) of tri-tert-butylphosphine were added to a flask and dissolved in 137 ml of toluene, and 0.08 g (0.137 mmol) of $Pd(dba)_2$ was added and then refluxed and agitated for 12 hours under a nitrogen atmosphere. After the reaction, the reactant was extracted with ethyl acetate and distilled water. The organic layer was dried with magnesium sulfite and filtered. Then, the filtrate was concentrated under reduced pressure. The product was purified with n-hexane/dichloromethane mixed in a volume ratio of 6:4 through silica gel column chromatography, and then 7.2 g of a white solid compound A-396 was acquired as a desired compound (yield: 80%).

LC-Mass (theoretical mass: 654.23 g/mol, measured mass: M+1=655 g/mol)

Fabrication of Organic Light Emitting Diode

Example 41

A glass substrate thin film coated with 1,500 Å of indium tin oxide (ITO) was ultrasonic-wave cleaned with distilled water. Subsequently, the glass substrate (cleaned with distilled water) was ultrasonic-wave cleaned with a solvent such as isopropyl alcohol, acetone, methanol, or the like and dried. Then the glass substrate was moved to a plasma cleaner and cleaned for 5 minutes with oxygen plasma, and then the substrate was moved to a vacuum evaporator. 4,4'-bis[N-[4-{N,N-bis(3-methylphenyl)amino}-phenyl]-N-phenylamino]biphenyl (DNTPD) was vacuum deposited on the ITO substrate using an ITO transparent electrode prepared according to the above procedure to provide a 600 Å thick hole injection layer (HIL). Then the compound prepared according to Example 4 was vacuum deposited to provide a 300 Å-thick hole transport layer (HTL). A 250 Å-thick emission layer was vacuum deposited on the hole transport layer (HTL) using 9,10-di-(2-naphthyl)anthracene (ADN) as a host and 3 wt % of 2,5,8,11'-tetra(tert-butyl)perylene (TBPe) as a dopant.

Next, $Alq_3$ was vacuum-deposited to be 250 Å thick on the emission layer, forming an electron transport layer (ETL). On the electron transport layer (ETL), LiF at 10 Å and Al at 1,000 Å were sequentially vacuum-deposited to fabricate a cathode, completing an organic light emitting diode.

The organic light emitting diode had five organic thin layers.

In particular, it had Al (1,000 Å)/LiF (10 Å)/$Alq_3$ (250 Å)/EML[ADN:TBPe=97:3] (250 Å)/HTL (300 Å)/DNTPD (600 Å)/ITO (1,500 Å).

Example 42

An organic light emitting diode was prepared with the same method as Example 41, except for using the compound prepared according to Example 5 instead of Example 4.

Example 43

An organic light emitting diode was prepared with the same method as Example 41, except for using the compound prepared according to Example 6 instead of Example 4.

Example 44

An organic light emitting diode was prepared with the same method as Example 41, except for using the compound prepared according to Example 7 instead of Example 4.

Example 45

An organic light emitting diode was prepared with the same method as Example 41, except for using the compound prepared according to Example 9 instead of Example 4.

Example 46

An organic light emitting diode was prepared with the same method as Example 41, except for using the compound prepared according to Example 10 instead of Example 4.

Example 47

An organic light emitting diode was prepared with the same method as Example 41, except for using the compound prepared according to Example 38 instead of Example 4.

Example 48

An organic light emitting diode was prepared with the same method as Example 41, except for using the compound prepared according to Example 39 instead of Example 4.

Comparative Example 1

An organic light emitting diode was prepared with the same method as Example 41, except for using NPB instead of Example 4. The structure of NPB is shown in the following.

Comparative Example 2

An organic light emitting diode was prepared with the same method as Example 41, except for using HT1 instead of Example 4. The structure of HT1 is shown below.

Comparative Example 3

An organic light emitting diode was fabricated in accordance with the same procedure as in Example 41, except that HT2 was used instead of the compound prepared according to Example 41. The structure of HT2 is shown below.

The structures of DNTPD, ADN, TBPe, NPB, HT1, and HT2 that are used for preparing the organic light emitting diode are as follows.

[DNTPD]
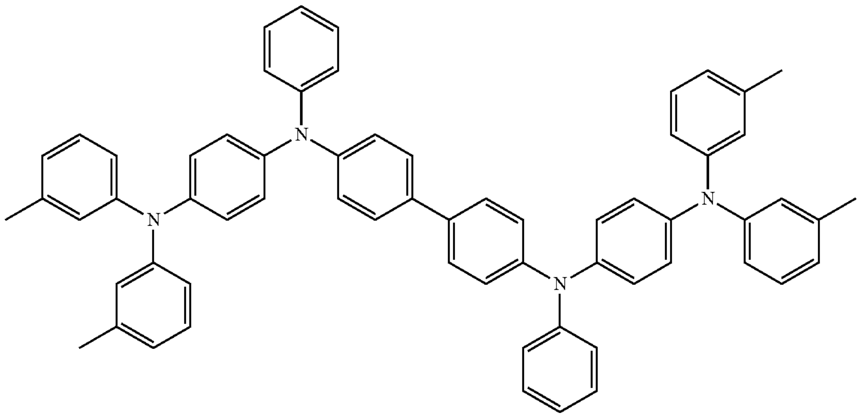
[ADN]
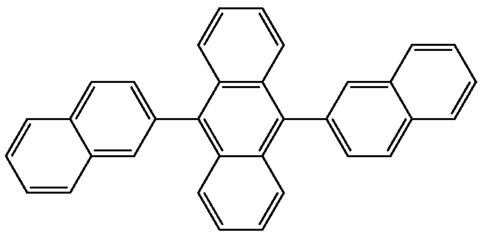
[TBPe]
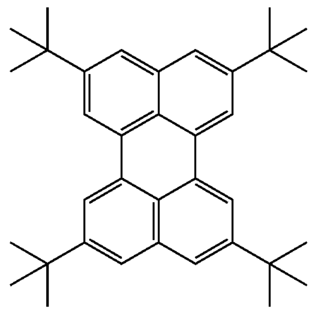
[NPB]
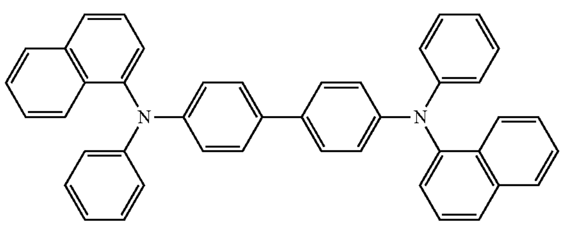
[HT1]
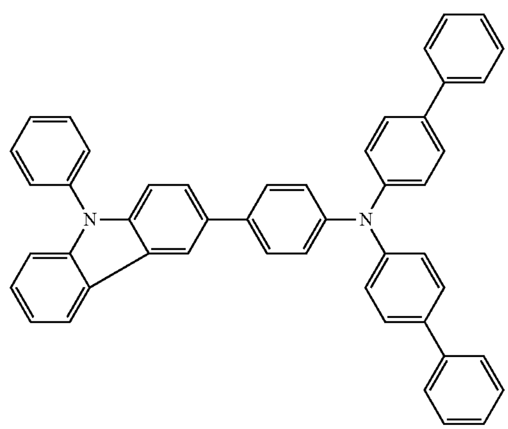
[HT2]
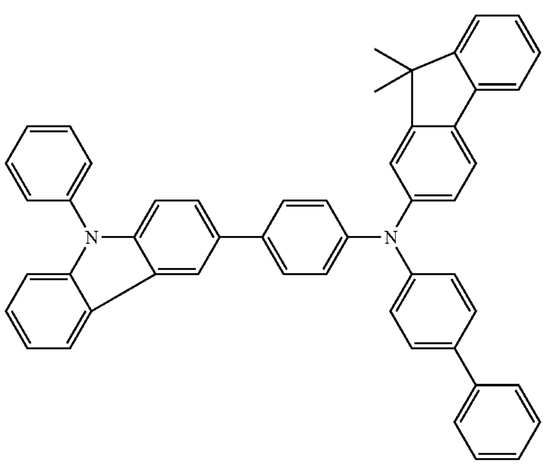

Analysis and Characteristic Measurement of the Compounds

Analysis of $^{1}$H-NMR Result

In order to structural analyze the intermediate M-1 to M-42 compounds of Examples 1 to 40, the molecular weight was measured using GC-MS or LC-MS, and $^{1}$H-NMR was measured by dissolving the intermediate M-1 to M-42 compounds in a $CD_2Cl_2$ solvent or a $CDCl_3$ solvent and using 300 MHz NMR equipment.

Figure 6:
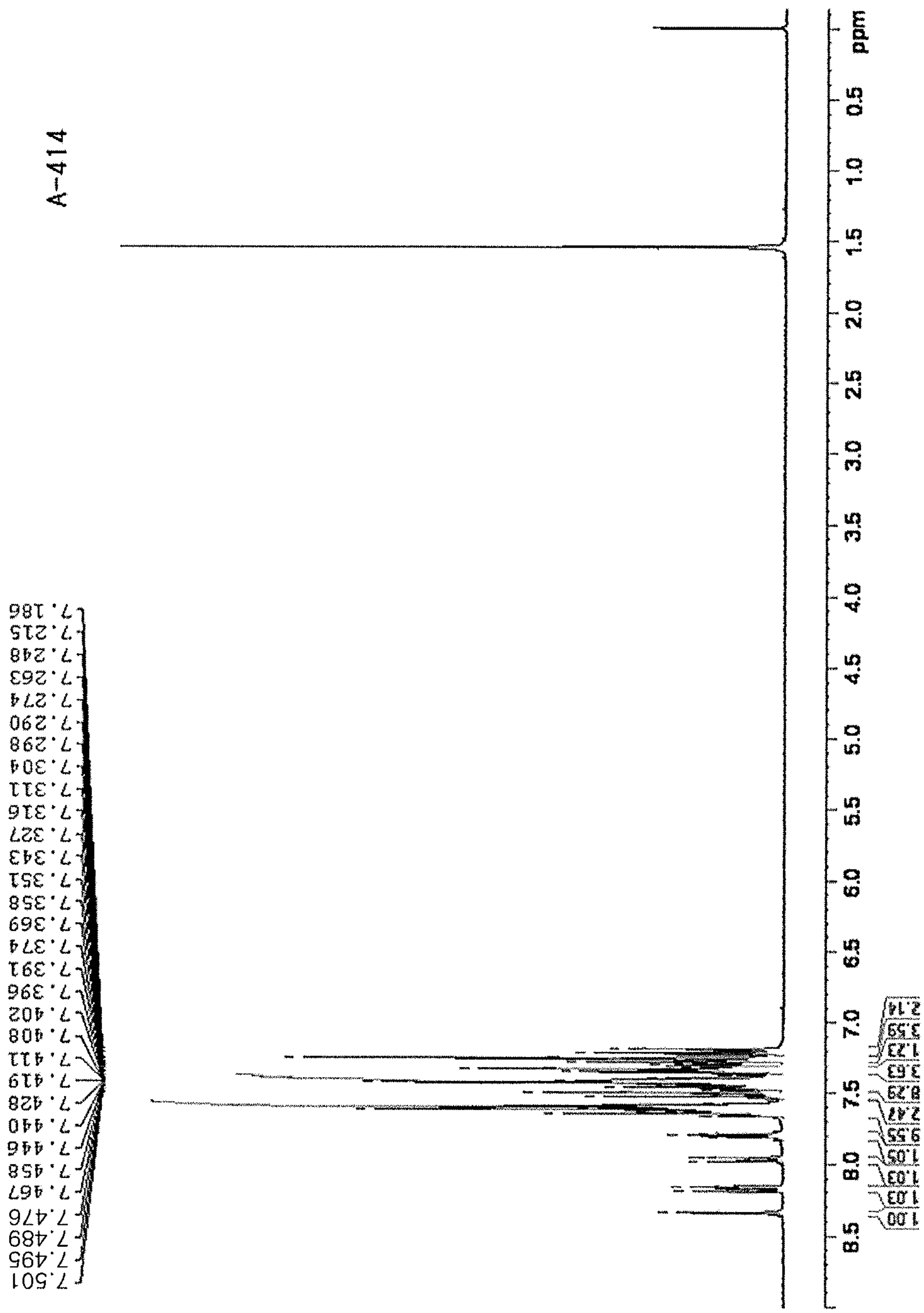
FIG. 6 illustrates a $^1$H-NMR spectrum of a compound represented by Chemical Formula A-414 according to Example 1.
Figure 7:
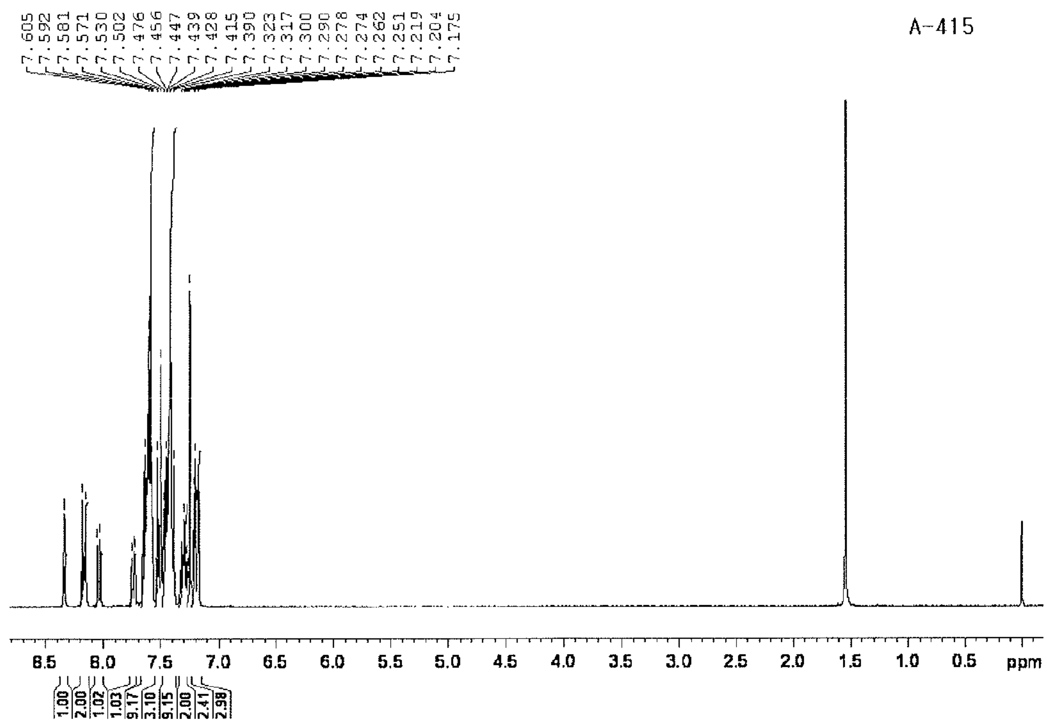
FIG. 7 illustrates a $^1$H-NMR spectrum of a compound represented by Chemical Formula A-415 according to Example 2.
Figure 8:
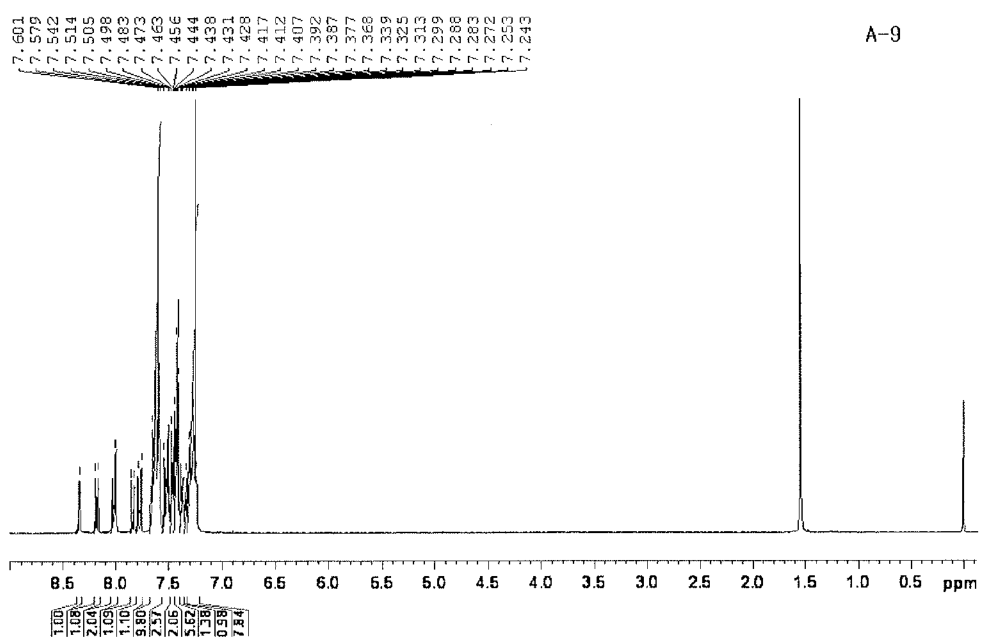
FIG. 8 illustrates a $^1$H-NMR spectrum of a compound represented by Chemical Formula A-9 according to Example 3.
Figure 9:
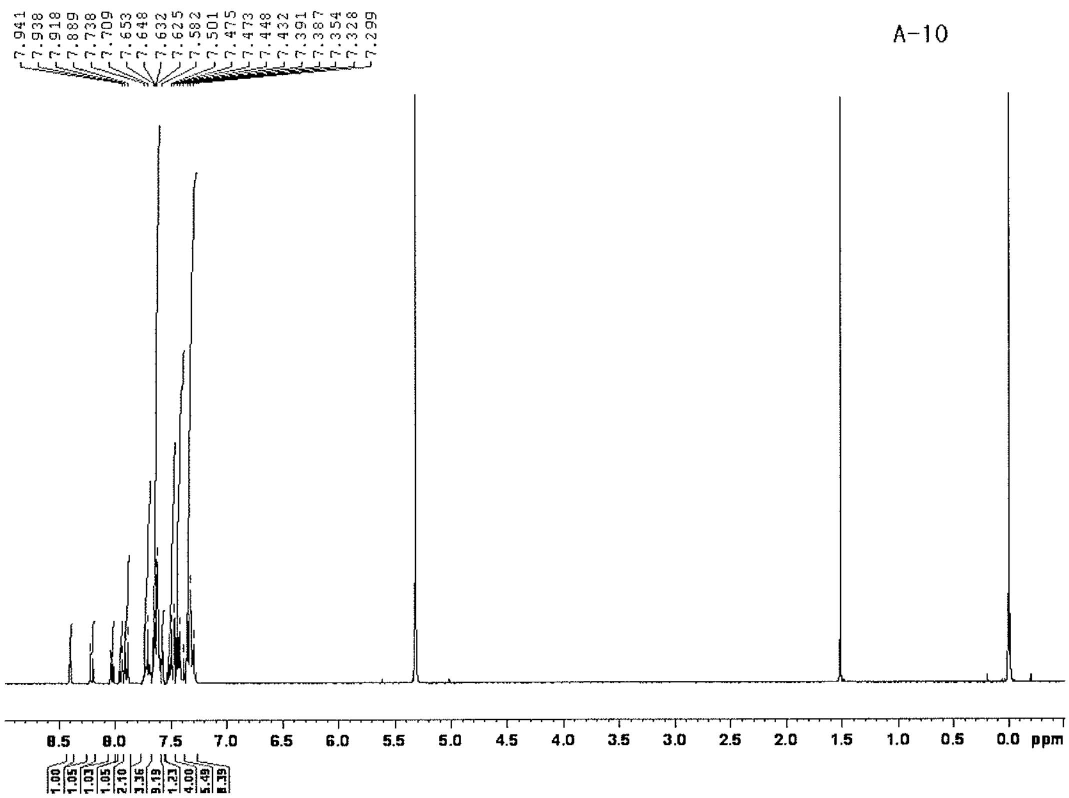
FIG. 9 illustrates a $^1$H-NMR spectrum of a compound represented by Chemical Formula A-10 according to Example 4.
Figure 10:
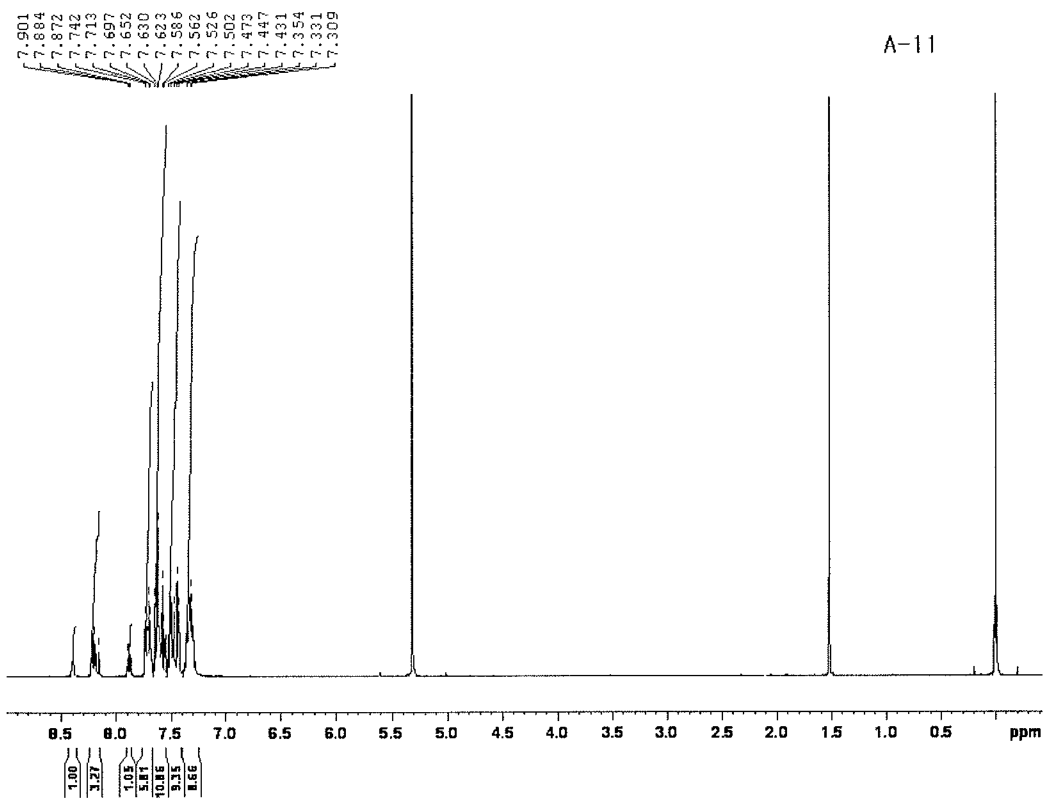
FIG. 10 illustrates a $^1$H-NMR spectrum of a compound represented by A-11 according to Example 5.
Figure 11:
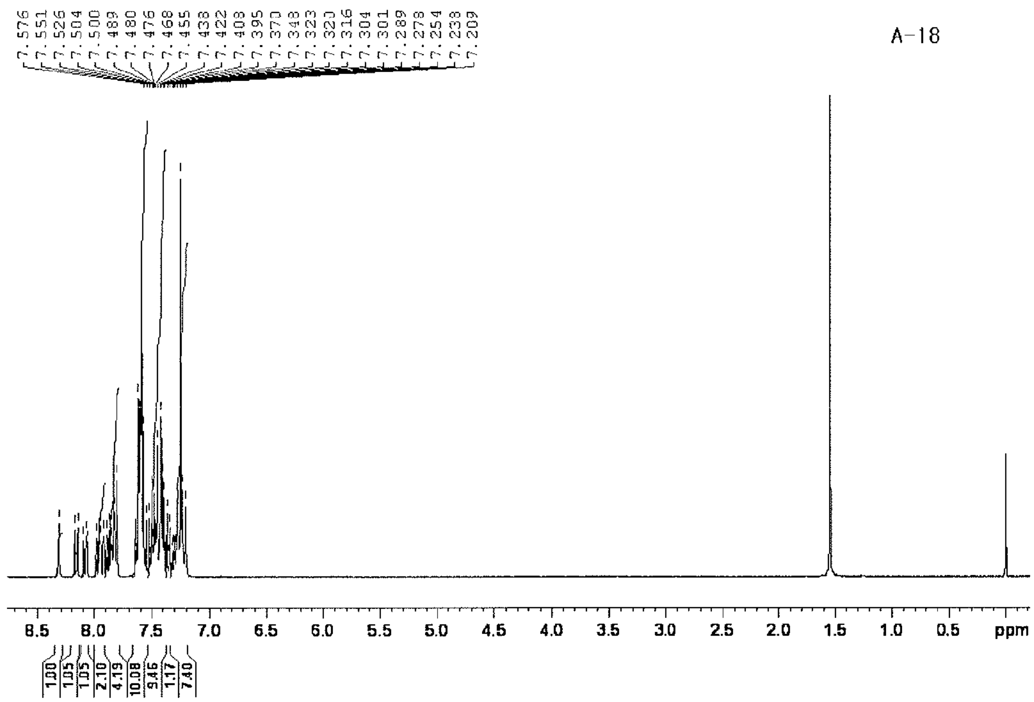
FIG. 11 illustrates a $^1$H-NMR spectrum of a compound represented by A-18 according to Example 6.
Figure 12:
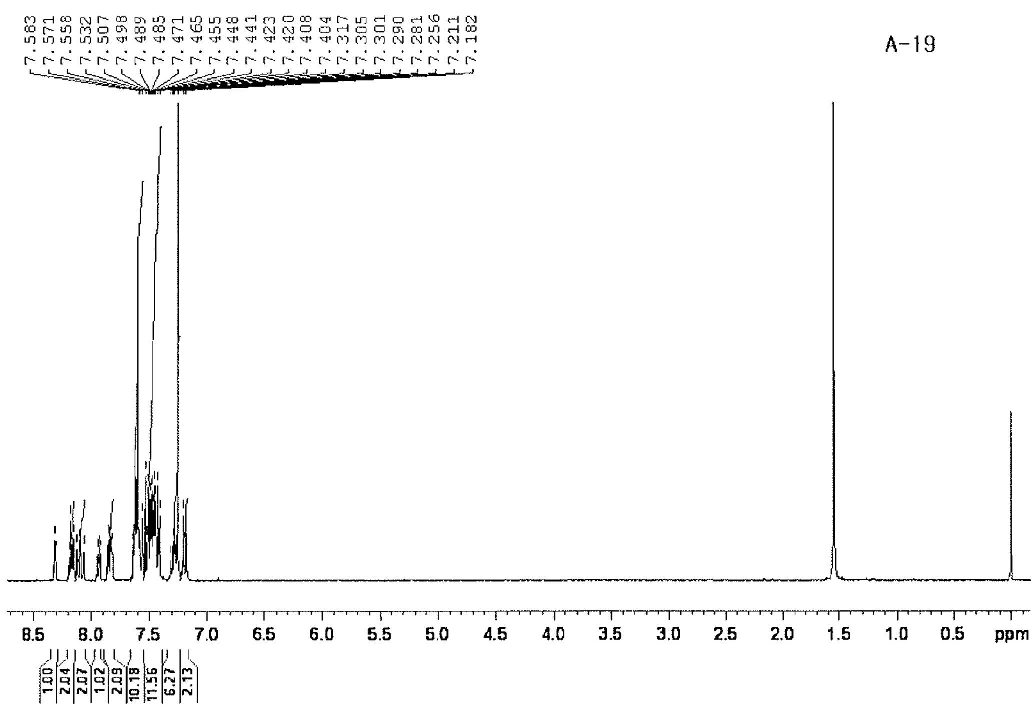
FIG. 12 illustrates a $^1$H-NMR spectrum of a compound represented by A-19 according to Example 7.
Figure 13:
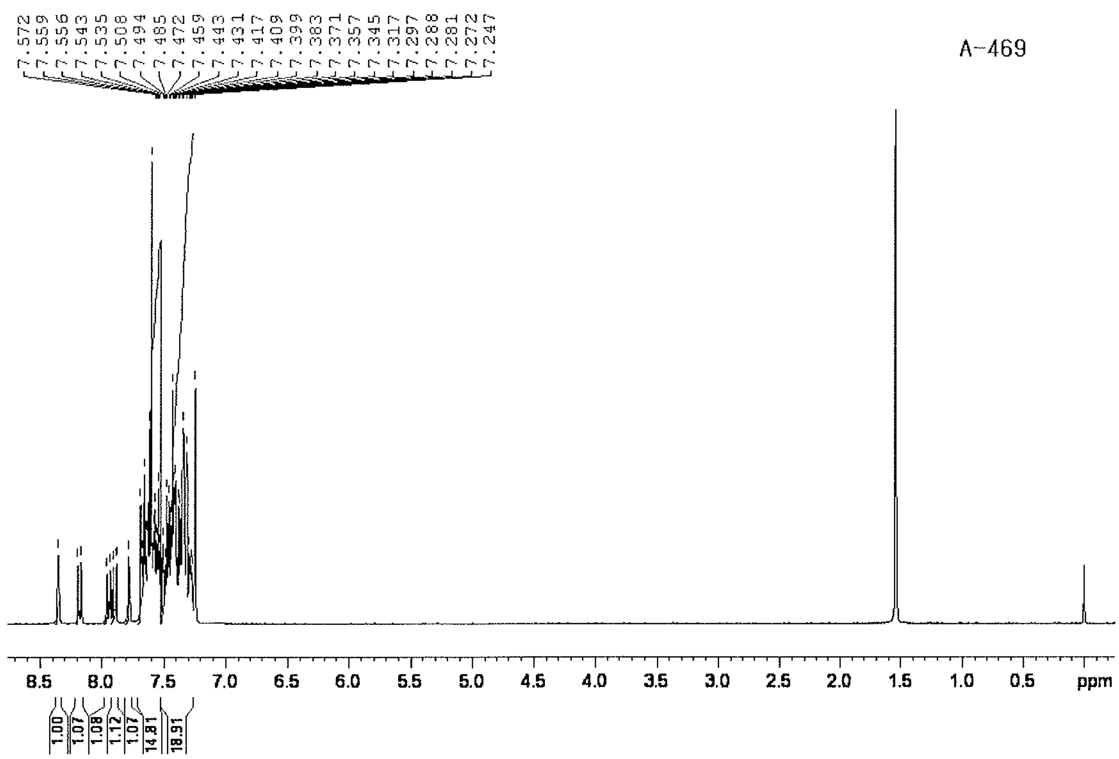
FIG. 13 illustrates a $^1$H-NMR spectrum of a compound represented by A-469 according to Example 13.
Figure 14:
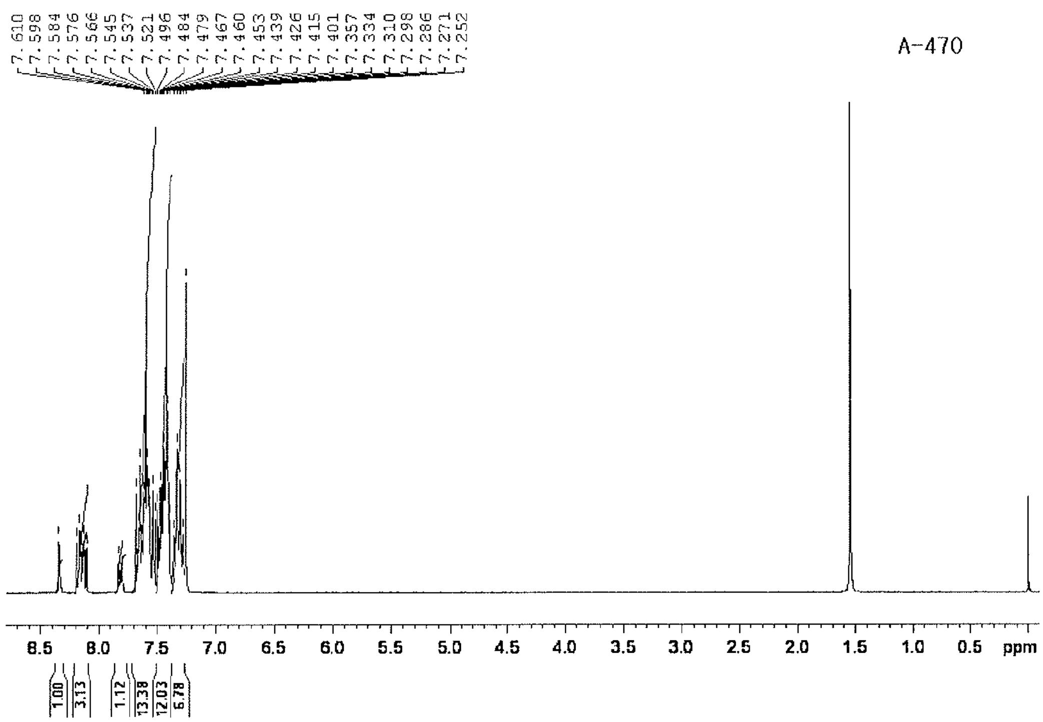
FIG. 14 illustrates a $^1$H-NMR spectrum of a compound represented by A-470 according to Example 28.
Figure 15:
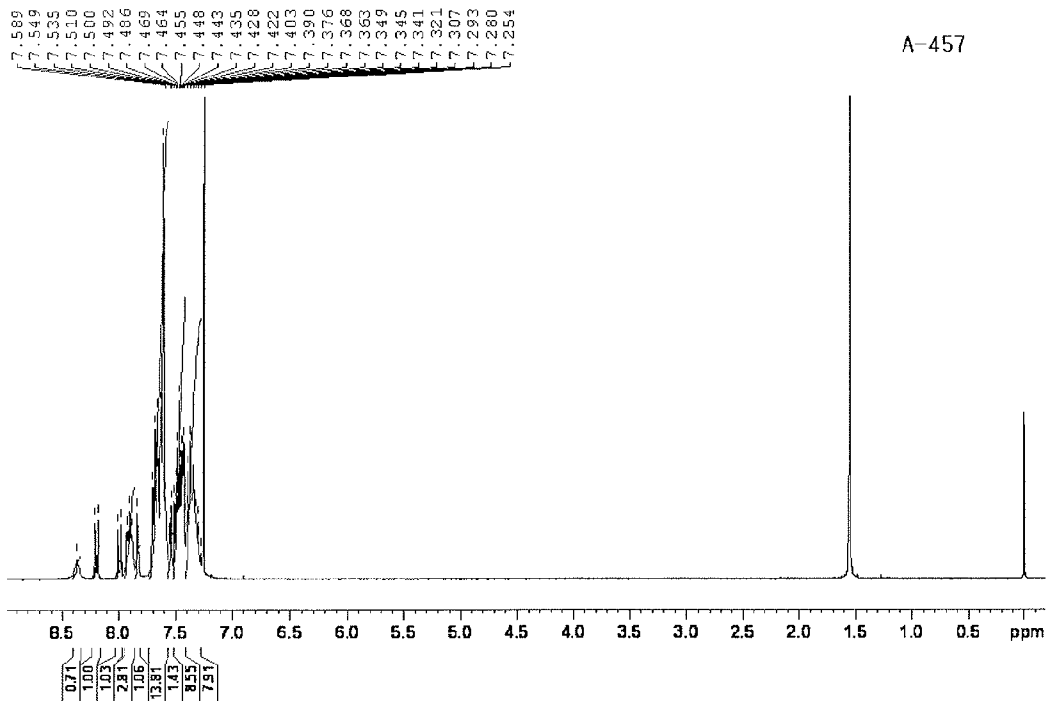
FIG. 15 illustrates a $^1$H-NMR spectrum of a compound represented by A-457 according to Example 29.
Figure 16:
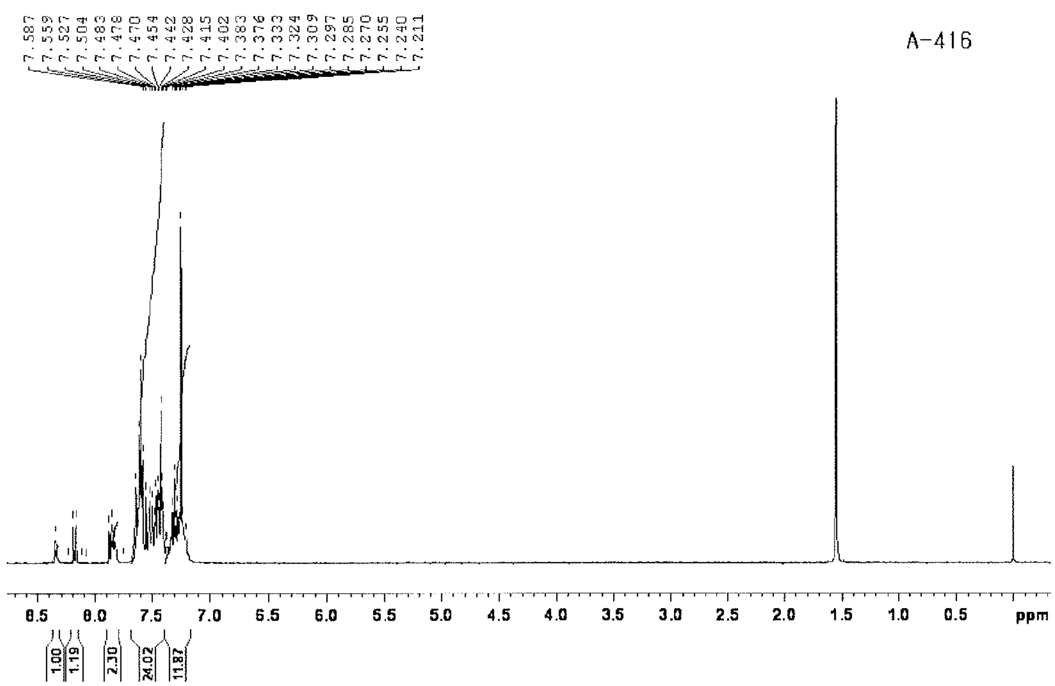
FIG. 16 illustrates a $^1$H-NMR spectrum of a compound represented by A-416 according to Example 37.
Figure 17:
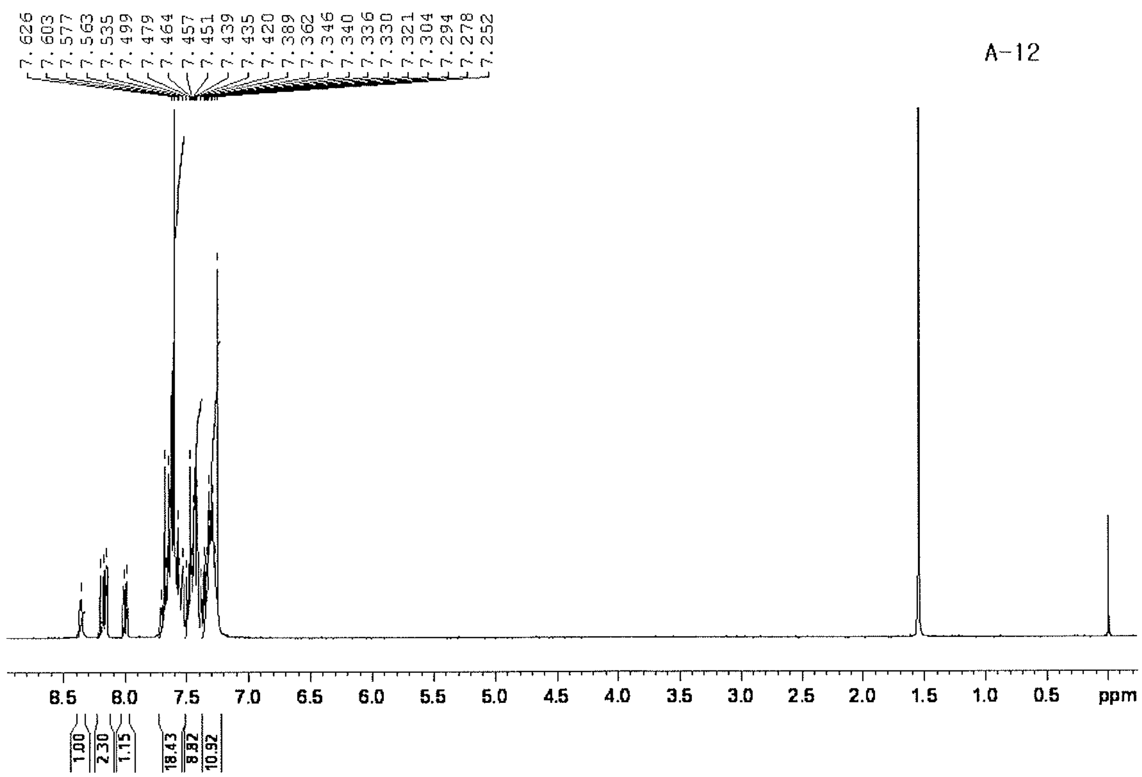
FIG. 17 illustrates a $^1$H-NMR spectrum of a compound represented by A-12 according to Example 38.
Figure 18:
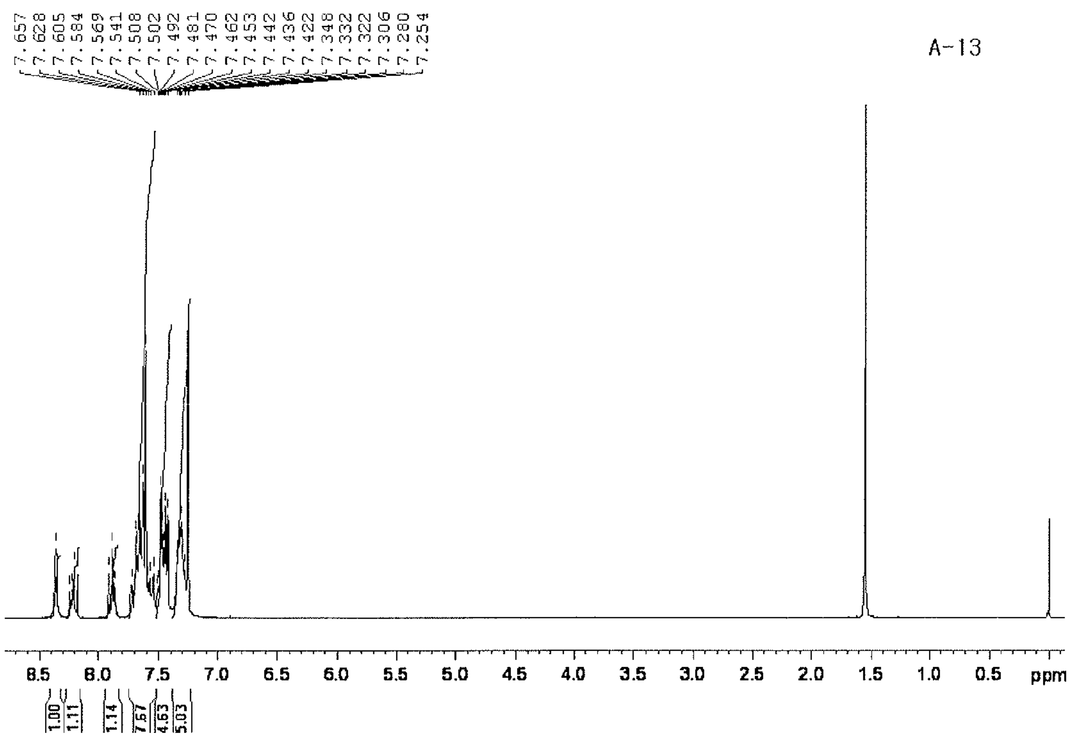
FIG. 18 illustrates a $^1$H-NMR spectrum of a compound represented by A-13 according to Example 39.

As an example of the analysis, FIG. 6 shows the $^{1}$H-NMR result of A-414 according to Example 1, FIG. 7 shows the result of A-415 according to Example 2, FIG. 8 shows the result of A-9 according to Example 3, FIG. 9 shows the result of A-10 according to Example 4, FIG. 10 shows the result of A-11 according to Example 5, FIG. 11 shows the result of A-18 according to Example 6, FIG. 12 shows the result of A-19 according to Example 7, FIG. 13 shows the result of A-469 according to Example 27, FIG. 14 shows the result of A-470 according to Example 28, FIG. 15 shows the result of A-457 according to Example 29, FIG. 16 shows the result of A-416 according to Example 37, FIG. 17 shows the result of A-12 according to Example 38, and FIG. 18 shows the result of A-13 according to Example 39.

Fluorescent Characteristic Analysis

Figure 19:
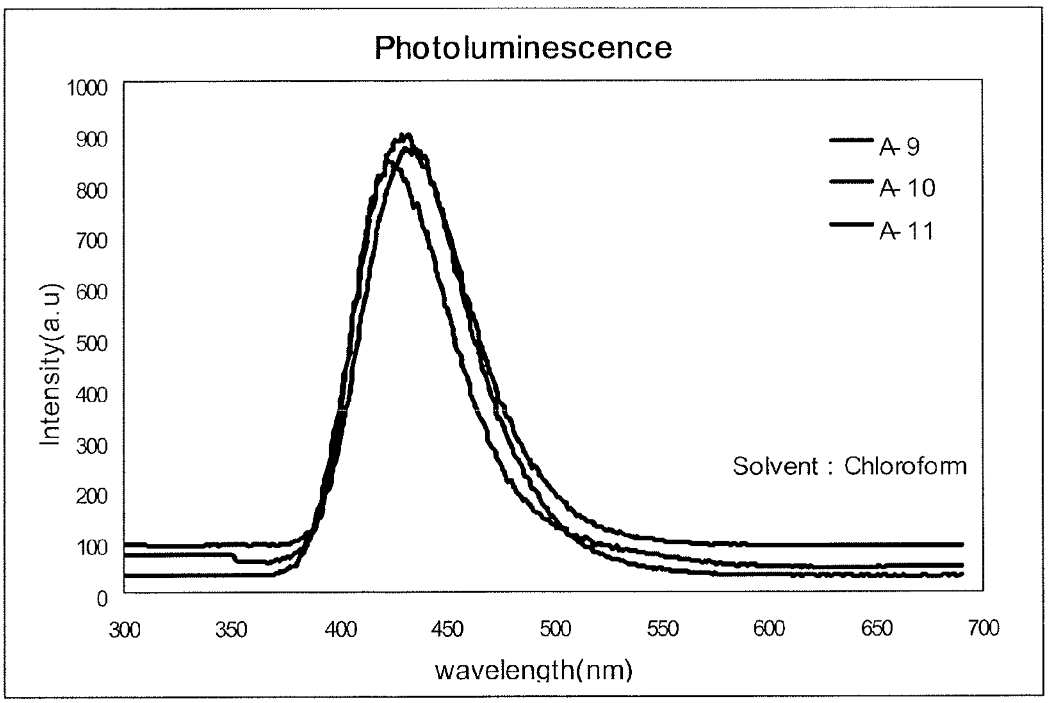
FIG. 19 illustrates a graph showing photoluminescence (PL) of compounds represented by A-9, A-10, and A-11 according to Examples 3 to 5.

The compounds of the examples were dissolved in THF, and PL (photoluminescence) wavelength was measured using HITACHI F-4500 equipment to measure fluorescent characteristics. FIG. 19 shows the PL wavelength measurement results of Examples 3, 4, and 5.

Electrochemical Characteristics

The compounds of Examples 1, 2, 3, 4, and 5 were measured regarding electrochemical characteristics by using cyclic voltammetry equipment. The results are provided in Table 1.

TABLE 1

| Synthesis Example | Example 1 A-414 | Example 2 A-415 | Example 3 A-9 | Example 4 A-10 | Example 5 A-11 |
|---|---|---|---|---|---|
| HOMO (eV) | 5.24 | 5.23 | 5.23 | 5.22 | 5.27 |
| LUMO (eV) | 2.16 | 2.17 | 2.16 | 2.15 | 2.17 |
| Band gap (eV) | 3.08 | 3.06 | 3.07 | 3.07 | 3.10 |

Referring to Table 1, the compounds according to Examples 1 to 5 exhibited band gaps suitable for use as a hole transporting layer and an electron blocking layer.

Thermal Characteristics

Thermal decomposition temperature of the compounds synthesized according to Examples 1, 2, 3, 4, 5, 6, 7, 27, 28, 29, 37, 38, and 39 were measured by thermogravimetry (TGA) to show the thermal characteristics. The synthesized compounds were measured to determine glass transition temperature (Tg) by differential scanning calorimetry (DSC). The results are shown in the following Table 2.

TABLE 2

| Example | Material | Thermal decomposition temperature (° C.) | Tg (° C.) |
|---|---|---|---|
| Example 1 | A-414 | 485 | 124 |
| Example 2 | A-415 | 460 | 133 |
| Example 3 | A-9 | 475 | 132 |
| Example 4 | A-10 | 522 | 128 |
| Example 5 | A-11 | 532 | 133 |
| Example 6 | A-18 | 506 | 137 |
| Example 7 | A-19 | 520 | 141 |
| Example 27 | A-469 | 503 | 122 |
| Example 28 | A-470 | 511 | 124 |
| Example 29 | A-457 | 546 | 125 |
| Example 37 | A-416 | 449 | 135 |
| Example 38 | A-12 | 516 | 125 |
| Example 39 | A-13 | 531 | 133 |

Referring to Table 2, all of the compounds according to Example 1, 2, 3, 4, 5, 6, 7, 27, 28, 29, 37, 38, and 39 exhibited excellent thermal stability, excellent thermal decomposition temperature of 400° C. or higher, and Tg higher than 90° C. When the compound according to an embodiment is used as a material for an organicelectric field light emitting diode (OLED), it may have good life-span characteristics. Also, when the compound according to an embodiment is used for preparing an organic light emitting diode with process heat, it may have excellent process stability.

Performance Measurement of Organic Light Emitting Diode

The organic light emitting elements of Examples 41 to 48 and Comparative Examples 1 to 3 were measured regarding current density and luminance changes depending on voltage change. In particular, the measurements were performed as follows. The results are shown in the following Table 3.

(1) Current Density Change Measurement Depending on Voltage

The organic light emitting diodes were respectively measured regarding a current in a unit device by using a current-voltage meter (Keithley 2400) while their voltages were increased from 0 V. Each current value was divided by area, measuring current density.

(2) Luminance Change Measurement Depending on Voltage Change

The prepared organic light emitting diode was measured regarding luminance while its voltage was increased from 0 V to 10 V by using a luminance meter (Minolta Cs-1000A).

(3) Luminous Efficiency Measurement

The organic light emitting diode were measured by using luminance, current density, and voltage measured from (1) and (2) regarding current efficiency (cd/A) at the same current density (10 mA/cm$^2$).

TABLE 3

| Device | Compound used in hole transport layer (HTL) | Voltage (V) | Color (EL color) | Efficiency (cd/A) | Half-life (h) at 1,000 cd/m$^2$ |
|---|---|---|---|---|---|
| Example 41 | A-10 | 6.3 | Blue | 6.1 | 2,170 |
| Example 42 | A-11 | 6.3 | Blue | 6.2 | 2,290 |
| Example 43 | A-18 | 6.2 | Blue | 5.9 | 1,870 |
| Example 44 | A-19 | 6.2 | Blue | 6.0 | 1,910 |
| Example 45 | A-335 | 6.9 | Blue | 5.2 | 1,570 |
| Example 46 | A-340 | 6.8 | Blue | 5.7 | 1,490 |
| Example 47 | A-12 | 6.1 | Blue | 6.2 | 2,150 |
| Example 48 | A-13 | 6.1 | Blue | 6.1 | 2,230 |

TABLE 3-continued

| Device | Compound used in hole transport layer (HTL) | Voltage (V) | Color (EL color) | Efficiency (cd/A) | Half-life (h) at 1,000 cd/m$^2$ |
|---|---|---|---|---|---|
| Comparative Example 1 | NPB | 7.1 | Blue | 4.9 | 1,250 |
| Comparative Example 2 | HT1 | 6.6 | Blue | 5.7 | 1,340 |
| Comparative Example 3 | HT2 | 6.4 | Blue | 5.9 | 1,350 |

Current density: 10 mA/$cm_2$

Referring to the results shown in Table 3, the materials that were used for preparing the hole transport layer (HTL) of Examples 41 to 48 turned out to decrease driving voltage of the organic light emitting diode but improved luminance and efficiency.

Further, the half-life of Examples 41 to 48 were remarkably improved compared to the half-life of Comparative Examples 1 to 3, particularly, the organic light emitting diode of Example 42 had a half-life of 2,290 hours, which was 1.8 times improved compared to that of Comparative Example 1 of 1,250 hours. In terms of commercial appeal, the life-span of a device is one of the biggest issues for commercializing a device. Therefore, the devices according to the exemplary embodiments are shown as sufficient to be commercialized.

By way of summation and review, in an organic light emitting diode, an organic material layer may include a light emitting material and a charge transport material, e.g., a hole injection material, a hole transport material, an electron transport material, an electron injection material, and the like.

The light emitting material may be classified as blue, green, and red light emitting materials according to emitted colors, and yellow and orange light emitting materials to emit colors approaching natural colors.

When one material is used as a light emitting material, a maximum light emitting wavelength may be shifted to a long wavelength or color purity may decrease because of interactions between molecules, or device efficiency may decrease because of a light emitting quenching effect. Therefore, a host/dopant system may be included as a light emitting material in order to help improve color purity and increase luminous efficiency and stability through energy transfer.

In order to implement the above excellent performance of an organic light emitting diode, a material constituting an organic material layer, e.g., a hole injection material, a hole transport material, a light emitting material, an electron transport material, an electron injection material, and a light emitting material such as a host and/or a dopant should be stable and have good efficiency.

A low molecular organic light emitting diode may be manufactured as a thin film using a vacuum deposition method, and may have good efficiency and life-span performance. A polymer organic light emitting diode manufactured using an Inkjet or spin coating method may have an advantage of low initial cost and being large-sized.

Both low molecular organic light emitting and polymer organic light emitting diodes may have an advantage of being self-light emitting and having high speed response, wide viewing angle, ultrathinness, high image quality, durability, a large driving temperature range, and the like. For example, they have good visibility due to the self-light emitting characteristic (compared with a conventional LCD (liquid crystal display)), and may have an advantage of decreasing thickness and weight of an LCD up to a third, because they do not need a backlight.

In addition, low molecular organic light emitting and polymer organic light emitting diodes may have a response speed that is 1,000 times faster than an LCD. Thus, they can realize a perfect motion picture without an after-image. Based on these advantages, low molecular organic light emitting and polymer organic light emitting diodes have been remarkably developed to have 80 times the efficiency and more than 100 times the life-span since they first came out in the late 1980s. Recently, low molecular organic light emitting and polymer organic light emitting diodes have kept becoming rapidly larger, such as development of a 40-inch organic light emitting diode panel.

Simultaneously exhibiting improved luminous efficiency and life-span may be desirable in order to manufacture a larger display. Herein, luminous efficiency may require a smooth combination between holes and electrons in an emission layer. However, an organic material in general may have slower electron mobility than hole mobility. Thus, it may exhibit inefficient combination between holes and electrons. Accordingly, it is desirable to increase electron injection and mobility from a cathode while simultaneous preventing movement of holes.

In order to improve the life-span, material crystallization caused by Joule heat generated during device operation should be prevented. Accordingly, an organic compound having excellent electron injection and mobility, and high electrochemical stability, is particularly desirable.

The compound for an optoelectronic device according to an embodiment may act as hole injection, hole transport, light emitting, or electron injection and/or transport material, and may also act as a light emitting host along with an appropriate dopant.

The embodiments provide an organic optoelectronic device having excellent life-span, efficiency, driving voltage, electrochemical stability, and thermal stability.

The compound for an optoelectronic device according to an embodiment may exhibit excellent hole or electron transporting properties, high film stability, good thermal stability, and good triplet exciton energy.

The compound according to an embodiment may be used as a hole injection/transport material of an emission layer, a host material, or an electron injection/transport material. The organic photoelectric device according to an embodiment may exhibit excellent electrochemical and thermal stability, and therefore may have an excellent life-span characteristic and high luminous efficiency at a low driving voltage.

The embodiments provide a compound for an optoelectronic device that is capable of providing an optoelectronic device having excellent life-span, efficiency, electrochemical stability, and thermal stability.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A compound for an optoelectronic device, the compound being represented by the following Chemical Formula 1:

[Chemical Formula 1]

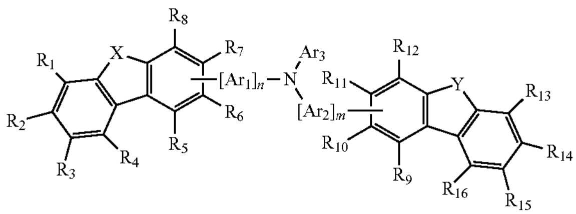

wherein in Chemical Formula 1, $R_1$ to $R_{16}$ are each independently selected from the group of hydrogen, deuterium, a single bond, a halogen, a cyano group, a hydroxyl group, an amino group, a substituted or unsubstituted C1 to C20 amine group, a nitro group, a carboxyl group, a ferrocenyl group, a substituted or unsubstituted C1 to C20 alkyl group, a substituted or unsubstituted C6 to C30 aryl group, a substituted or unsubstituted C2 to C30 heteroaryl group, a substituted or unsubstituted C1 to C20 alkoxy group, a substituted or unsubstituted C6 to C20 aryloxy group, a substituted or unsubstituted C3 to C40 silyloxy group, a substituted or unsubstituted C1 to C20 acyl group, a substituted or unsubstituted C2 to C20 alkoxycarbonyl group, a substituted or unsubstituted C2 to C20 acyloxy group, a substituted or unsubstituted C2 to C20 acylamino group, a substituted or unsubstituted C2 to C20 alkoxycarbonyl amino group, a substituted or unsubstituted C7 to C20 aryloxycarbonyl amino group, a substituted or unsubstituted C1 to C20 sulfamoyl amino group, a substituted or unsubstituted C1 to C20 sulfonyl group, a substituted or unsubstituted C1 to C20 alkylthiol group, a substituted or unsubstituted C6 to C20 arylthiol group, a substituted or unsubstituted C1 to C20 heterocyclothiol group, a substituted or unsubstituted C1 to C20 ureide group, and a substituted or unsubstituted C3 to C40 silyl group, at least one of $R_1$ to $R_8$ represents a bond with $Ar_1$, at least one of $R_9$ to $R_{16}$ represents a bond with $Ar_2$ or the central N atom of Chemical Formula 1, at least one of $R_1$ to $R_8$ is bound to $Ar_1$ through a sigma bond, or at least one of $R_9$ to $R_{16}$ is bound to $Ar_2$ or the central N atom of Chemical Formula 1 through a sigma bond, X is selected from $NR_{17}$, O, S, and $SO_2$ (O═S═O), wherein $R_{17}$ is a substituted or unsubstituted C1 to C20 alkyl group, a substituted or unsubstituted C6 to C30 aryl group, or a substituted or unsubstituted C2 to C30 heteroaryl group, Y is selected from O, S, and $SO_2$ (O═S═O), $Ar_1$ and $Ar_2$ are each independently a substituted or unsubstituted C6 to C30 aryl group or a substituted or unsubstituted C2 to C30 heteroaryl group, n is an integer ranging from 1 to 4, m is an integer ranging from 0 to 4, and $Ar_3$ is a substituted or unsubstituted C6 to C30 aryl group or a substituted or unsubstituted C2 to C30 heteroaryl group, provided that $Ar_3$ is not a substituted or unsubstituted carbazolyl group, a substituted or unsubstituted dibenzofuranyl group, or a substituted or unsubstituted dibenzothiophenyl group, and when X is $NR_{17}$, $Ar_3$ is not a fluorenyl group.

2. The compound as claimed in claim 1, wherein X is selected from $NR_{17}$, O, S, and $SO_2$ (O═S═O), wherein $R_{17}$ is a substituted or unsubstituted C1 to C20 alkyl group, a substituted or unsubstituted C6 to C30 aryl group, or a substituted or unsubstituted C2 to C30 heteroaryl group, and the "substituted" aryl group or heteroaryl group refers to one substituted with at least one substituent selected from deuterium, a halogen, a cyano group, hydroxy group, an amino group, a substituted or unsubstituted C1 to C20 amine group, a nitro group, a substituted or unsubstituted C1 to C20 alkyl group, a substituted or unsubstituted C1 to C20 alkoxy group, a substituted or unsubstituted C3 to C40 silyl group, and a combination thereof.

3. The compound as claimed in claim 1, wherein the compound is represented by one of the following Chemical Formulae 2 to 7:

[Chemical Formula 2]

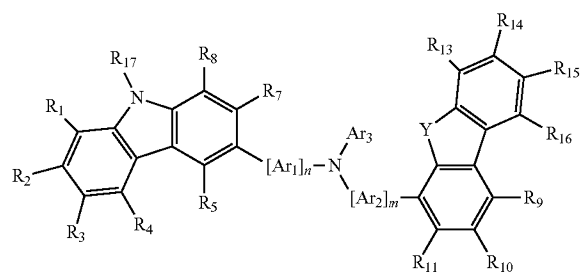

[Chemical Formula 3]

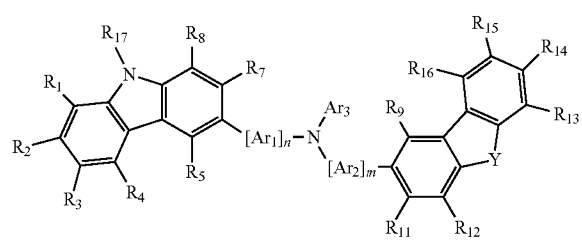

[Chemical Formula 4]

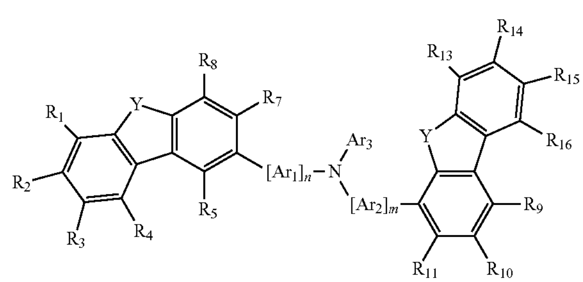

-continued

[Chemical Formula 5]

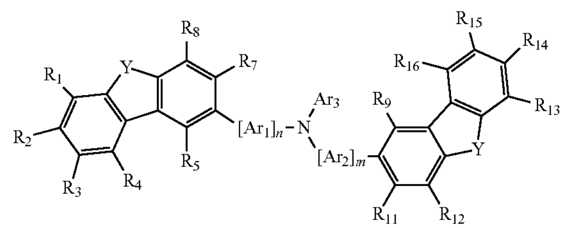

[Chemical Formula 6]

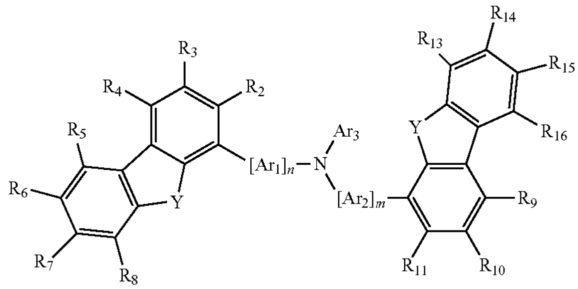

[Chemical Formula 7]

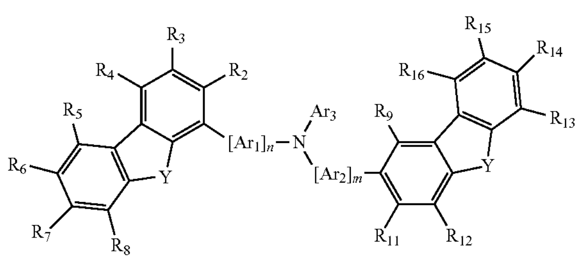

wherein in Chemical Formulae 2 to 7, $R_1$ to $R_{16}$ are each independently selected from the group of hydrogen, deuterium, a halogen, a cyano group, a hydroxyl group, an amino group, a substituted or unsubstituted C1 to C20 amine group, a nitro group, a carboxyl group, a ferrocenyl group, a substituted or unsubstituted C1 to C20 alkyl group, a substituted or unsubstituted C6 to C30 aryl group, a substituted or unsubstituted C2 to C30 heteroaryl group, a substituted or unsubstituted C1 to C20 alkoxy group, a substituted or unsubstituted C6 to C20 aryloxy group, a substituted or unsubstituted C3 to C40 silyloxy group, a substituted or unsubstituted C1 to C20 acyl group, a substituted or unsubstituted C2 to C20 alkoxycarbonyl group, a substituted or unsubstituted C2 to C20 acyloxy group, a substituted or unsubstituted C2 to C20 acylamino group, a substituted or unsubstituted C2 to C20 alkoxycarbonyl amino group, a substituted or unsubstituted C7 to C20 aryloxycarbonyl amino group, a substituted or unsubstituted C1 to C20 sulfamoyl amino group, a substituted or unsubstituted C1 to C20 sulfonyl group, a substituted or unsubstituted C1 to C20 alkylthiol group, a substituted or unsubstituted C6 to C20 arylthiol group, a substituted or unsubstituted C1 to C20 heterocyclothiol group, a substituted or unsubstituted C1 to C20 ureide group, and a substituted or unsubstituted C3 to C40 silyl group, $R_{17}$ is a substituted or unsubstituted C1 to C20 alkyl group, a substituted or unsubstituted C6 to C30 aryl group, or a substituted or unsubstituted C2 to C30 heteroaryl group, Y is selected from O, S, and $SO_2$ (O═S═O), $Ar_1$ and $Ar_2$ are each independently a substituted or unsubstituted C6 to C30 aryl group or a substituted or unsubstituted C2 to C30 heteroaryl group, n is an integer ranging from 1 to 4, m is an integer ranging from 0 to 4, and $Ar_3$ is a substituted or unsubstituted C6 to C30 aryl group or a substituted or unsubstituted C2 to C30 heteroaryl group, provided that $Ar_3$ is not a substituted or unsubstituted carbazolyl group, a substituted or unsubstituted dibenzofuranyl group, or a substituted or unsubstituted dibenzothiophenyl group.

4. The compound as claimed in claim 1, wherein the compound is represented by one of the following Chemical Formulae 8 and 9:

[Chemical Formula 8]

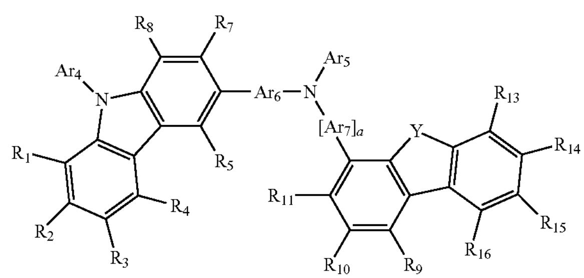

[Chemical Formula 9]

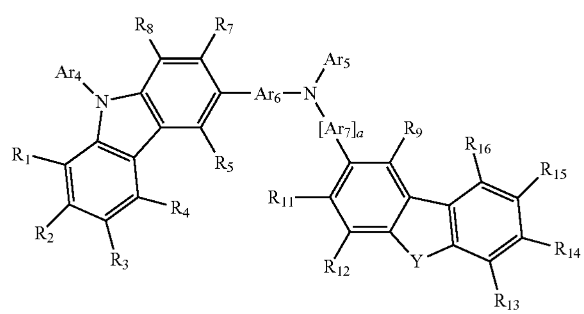

wherein in Chemical Formulae 8 and 9, $Ar_4$ and $Ar_y$ are each independently selected from the group of substituents represented by the following Chemical Formulae 10 to 18,

[Chemical Formula 10]

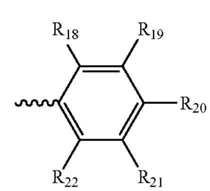

[Chemical Formula 11]

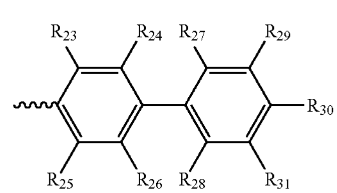

-continued

[Chemical Formula 12]

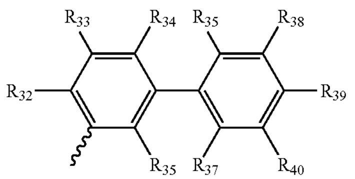

[Chemical Formula 13]

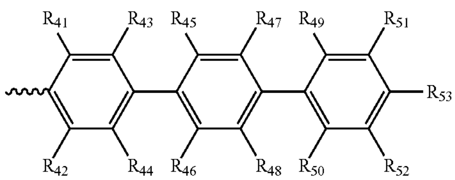

[Chemical Formula 14]

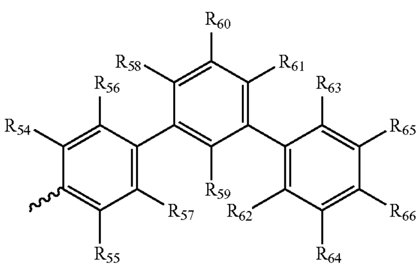

[Chemical Formula 15]

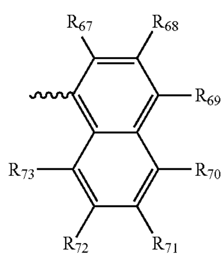

[Chemical Formula 16]

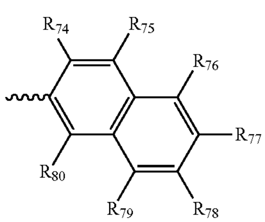

[Chemical Formula 17]

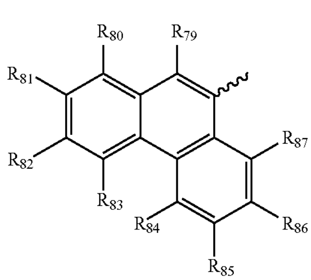

-continued

[Chemical Formula 18]

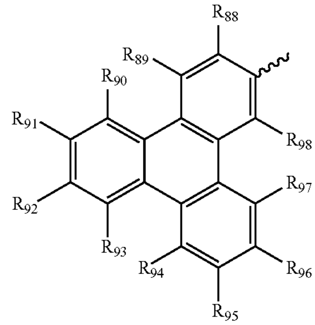

$R_1$ to $R_5$, $R_7$ to $R_{16}$, and $R_{18}$ to $R_{98}$ are each independently selected from the group of hydrogen, deuterium, a halogen, a cyano group, a hydroxyl group, an amino group, a substituted or unsubstituted C1 to C20 amine group, a nitro group, a substituted or unsubstituted C1 to C20 alkyl group, a substituted or unsubstituted C1 to C20 alkoxy group, or a substituted or unsubstituted C3 to C40 silyl group, $Ar_6$ and $Ar_7$ are each independently a substituent selected from the group of substituents represented by Chemical Formulae 10 to 18, and at least one of $R_{18}$ to $R_{98}$ is bound to an adjacent atom, and a is 0 or 1.

5. The compound as claimed in claim 4, wherein $Ar_4$ is selected from a substituent represented by the above Formulae 10 to 18, and at least one of the substituents of $R_{18}$ to $R_{98}$ that is selected to $Ar_4$ is not hydrogen.

6. The compound as claimed in claim 1, wherein $Ar_3$ is selected from the group of a substituted or unsubstituted phenyl group, a substituted or unsubstituted naphthyl group, a substituted or unsubstituted anthracenyl group, a substituted or unsubstituted phenanthryl group, a substituted or unsubstituted naphthacenyl group, a substituted or unsubstituted pyrenyl group, a substituted or unsubstituted biphenylyl group, a substituted or unsubstituted p-terphenyl group, a substituted or unsubstituted m-terphenyl group, a substituted or unsubstituted chrysenyl group, a substituted or unsubstituted triperylenyl group, a substituted or unsubstituted perylenyl group, a substituted or unsubstituted indenyl group, a substituted or unsubstituted furanyl group, a substituted or unsubstituted thiophenyl group, a substituted or unsubstituted pyrrolyl group, a substituted or unsubstituted pyrazolyl group, a substituted or unsubstituted imidazolyl group, a substituted or unsubstituted triazolyl group, a substituted or unsubstituted oxazolyl group, a substituted or unsubstituted thiazolyl group, a substituted or unsubstituted oxadiazolyl group, a substituted or unsubstituted thiadiazolyl group, a substituted or unsubstituted pyridyl group, a substituted or unsubstituted pyrimidinyl group, a substituted or unsubstituted pyrazinyl group, a substituted or unsubstituted triazinyl group, a substituted or unsubstituted benzofuranyl group, a substituted or unsubstituted benzothiophenyl group, a substituted or unsubstituted benzimidazolyl group, a substituted or unsubstituted indolyl group, a substituted or unsubstituted quinolinyl group, a substituted or unsubstituted isoquinolinyl group, a substituted or unsubstituted quinazolinyl group, a substituted or unsubstituted quinoxalinyl group, a substituted or unsubstituted naphthydinyl group, a substituted or unsubstituted benzoxazinyl group, a substituted or unsubstituted benzthiazinyl group, a substituted or unsubstituted acridinyl group, a substituted or unsubstituted phenazinyl group, a substituted or unsubstituted phenothiazinyl group, and a substituted or unsubstituted phenoxazinyl group.

7. The compound as claimed in claim 1, wherein the compound is a hole transport material or a hole injection material for an organic light emitting diode.

8. The compound as claimed in claim 1, wherein the compound has a triplet exciton energy (T1) of about 2.0 eV or higher.

9. The compound as claimed in claim 1, wherein the optoelectronic device includes an organic photoelectronic device, an organic light emitting diode, an organic solar cell, an organic transistor, an organic photo-conductor drum, or an organic memory device.

10. The compound as claimed in claim 1, wherein the compound being represented by one of the following Chemical Formulae A-1 to A-305, A-414 to A-416, A-457, A-458, or A-469 to A-473:

[A-1]

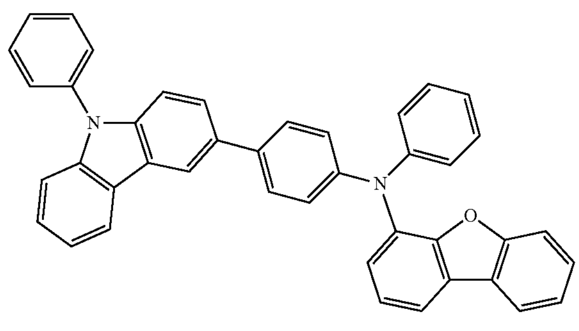

[A-2]

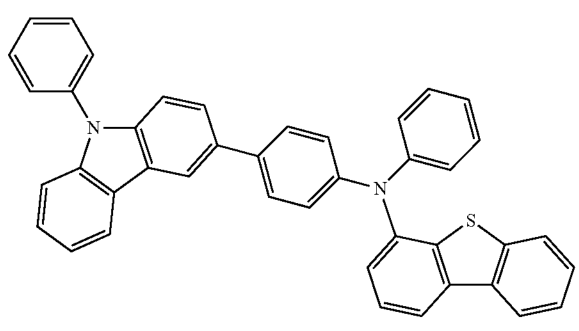

[A-3]

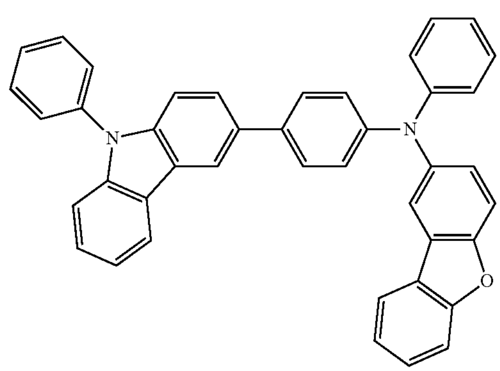

-continued

[A-4]

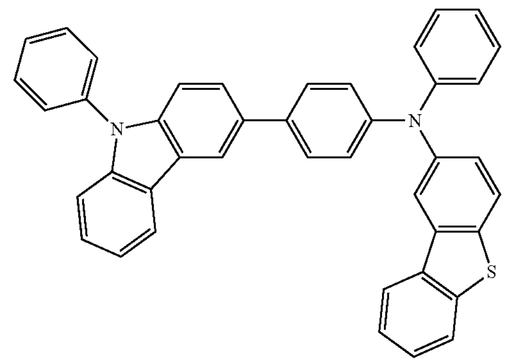

[A-5]

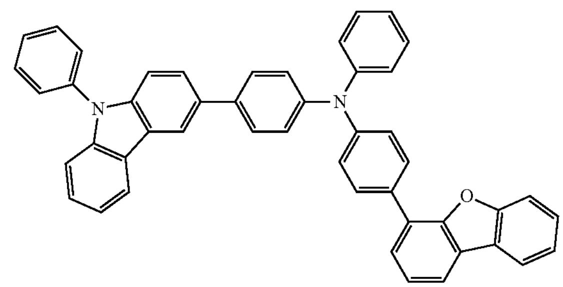

[A-6]

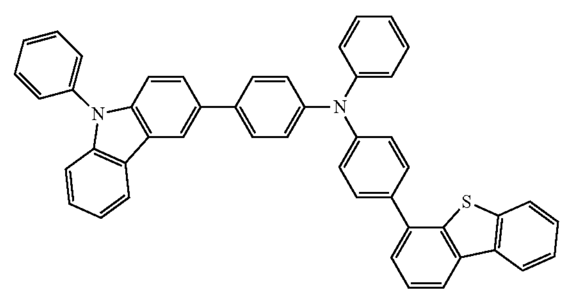

[A-7]

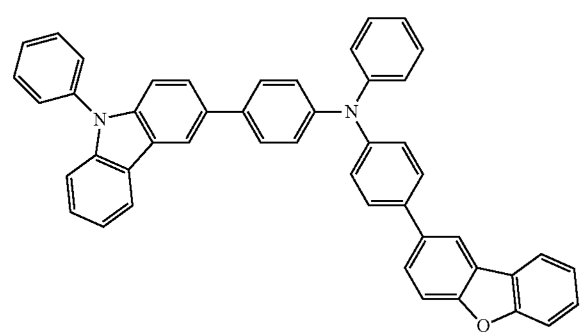

-continued
[A-8]
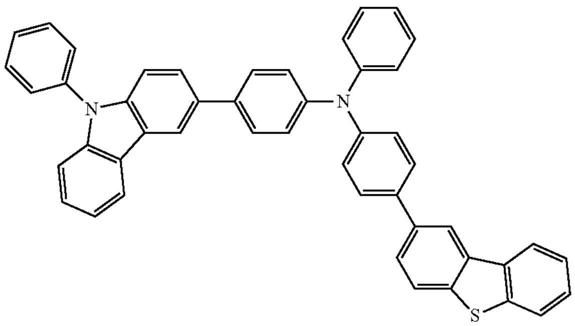
[A-9]
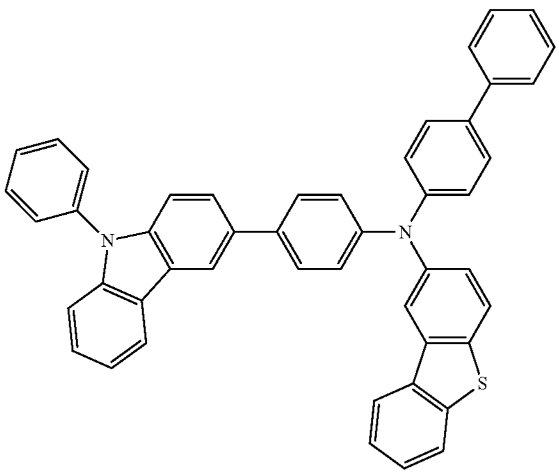
[A-10]
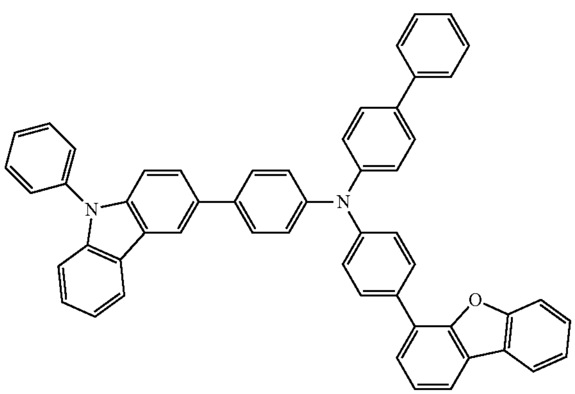
[A-11]
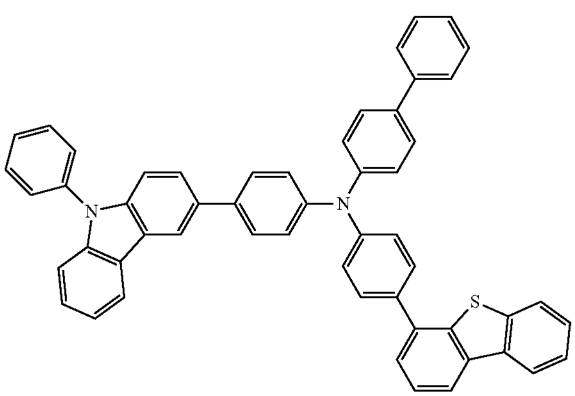
-continued
[A-12]
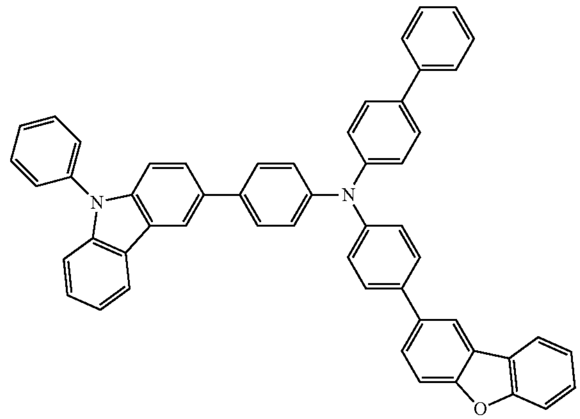
[A-13]
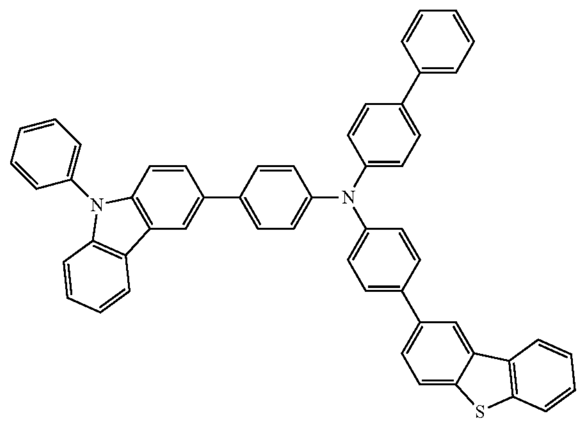
[A-14]
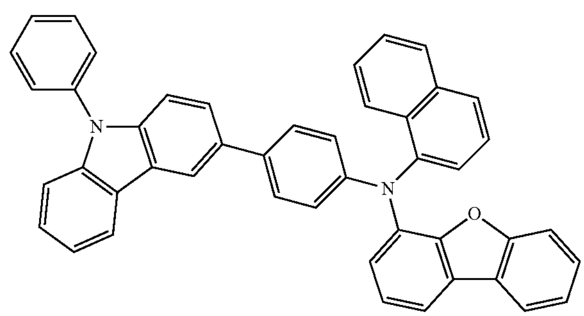
[A-15]
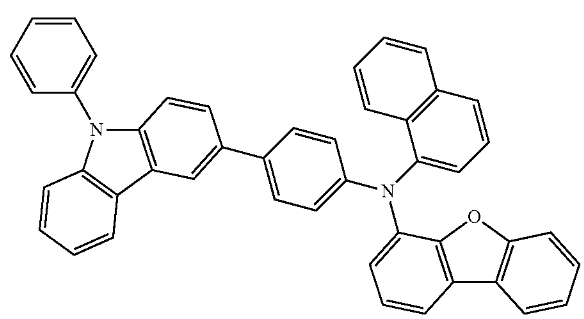

-continued
[A-16]
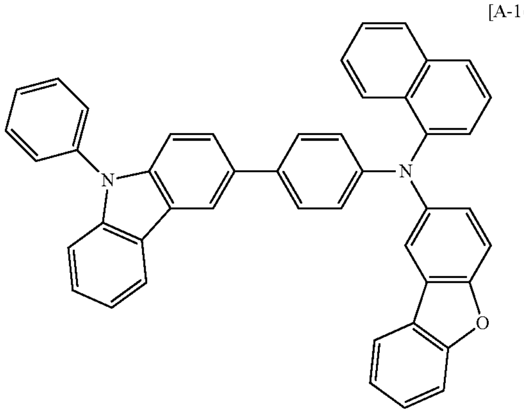
[A-17]
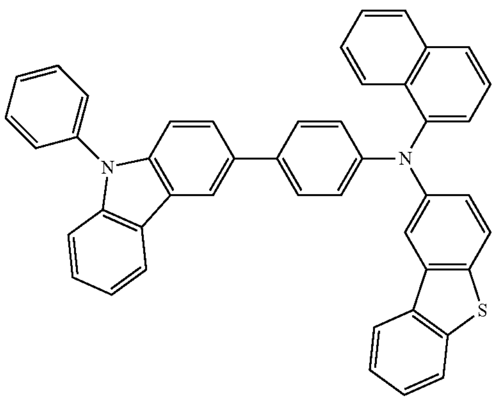
[A-18]
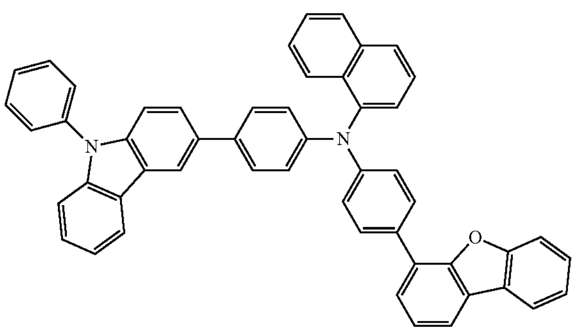
[A-19]
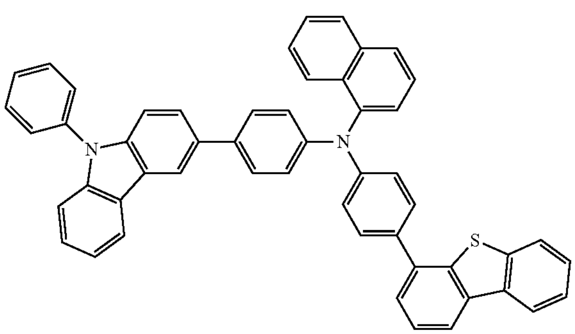
-continued
[A-20]
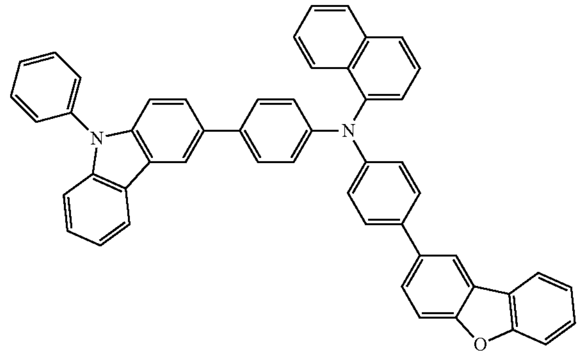
[A-21]
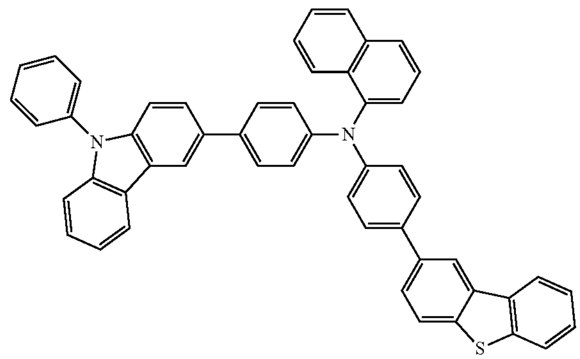
[A-22]
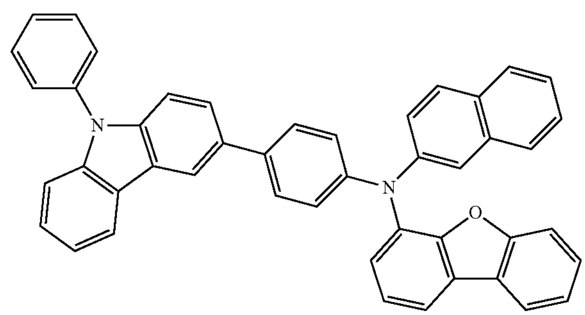
[A-23]
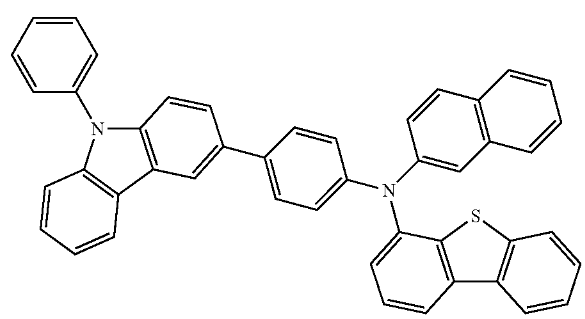

-continued
[A-24]
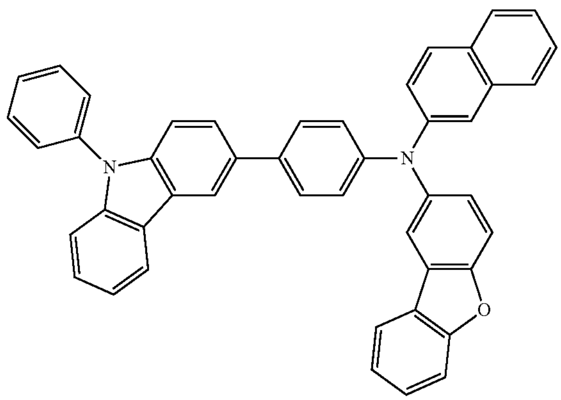
[A-25]
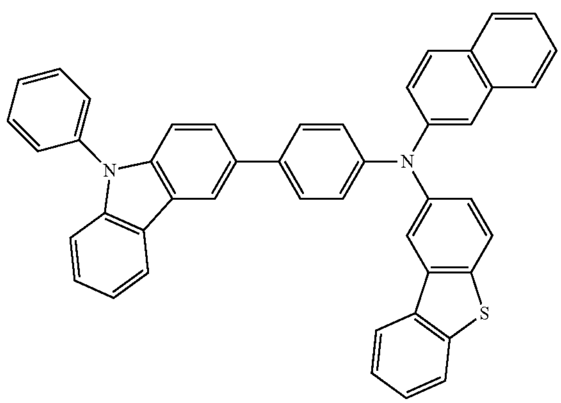
[A-26]
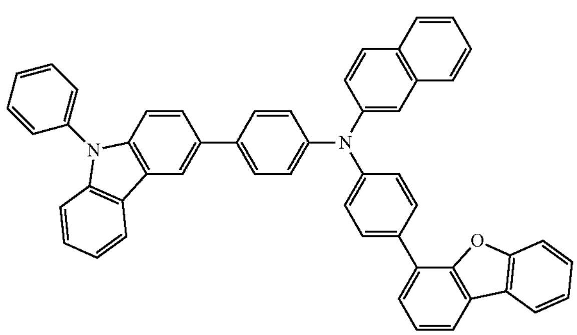
[A-27]
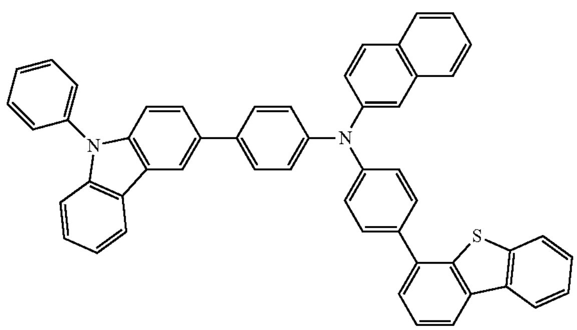
-continued
[A-28]
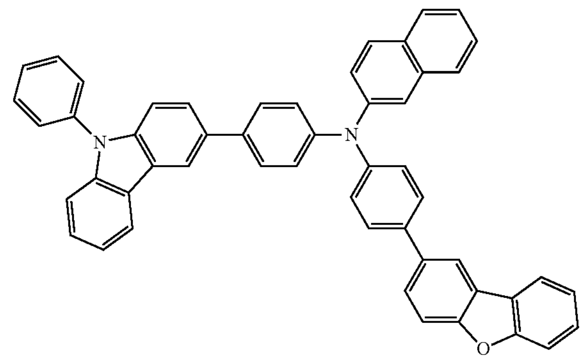
[A-29]
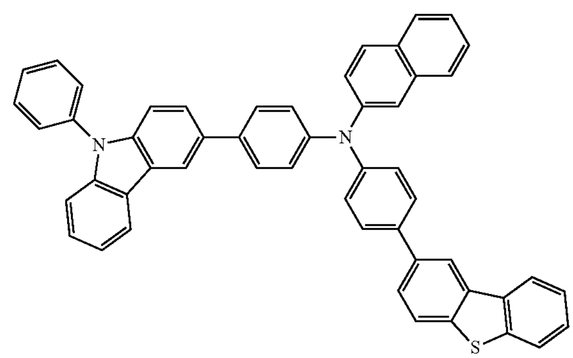
[A-30]
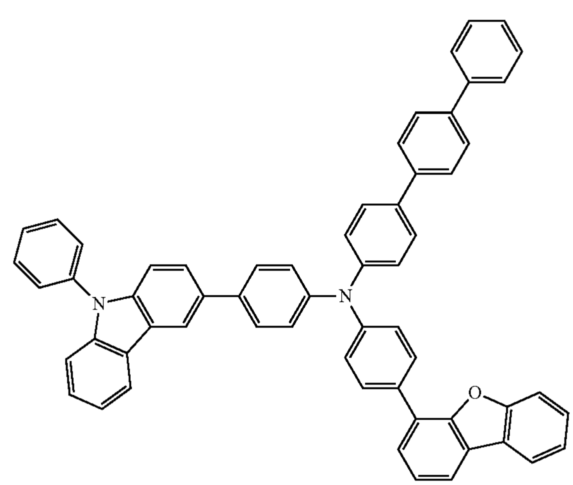

-continued
[A-31]
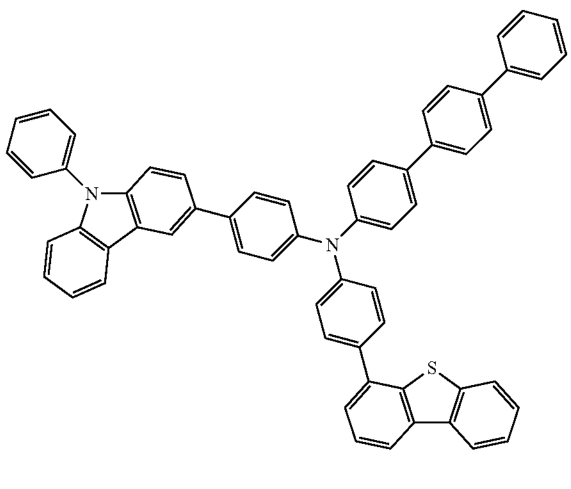
[A-32]
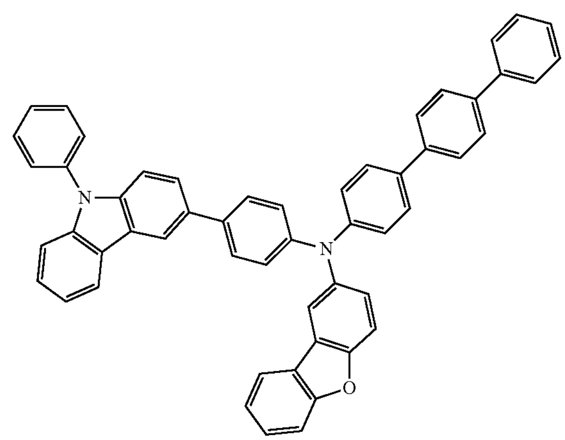
[A-33]
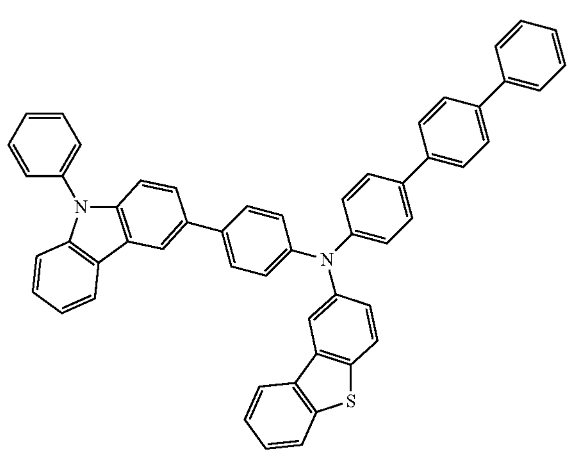
-continued
[A-34]
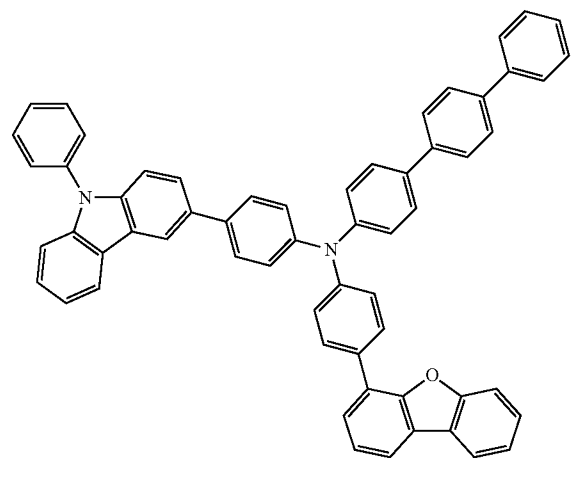
[A-35]
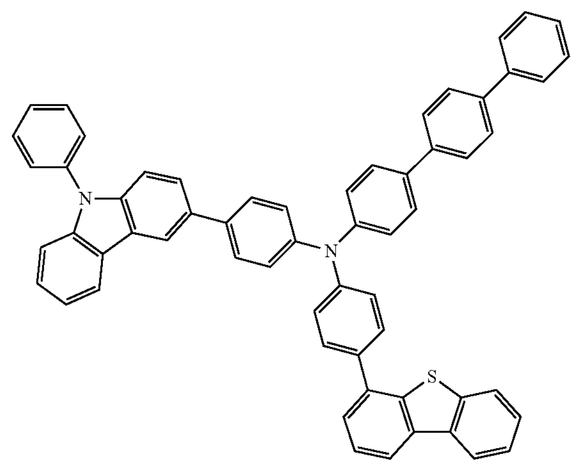
[A-36]
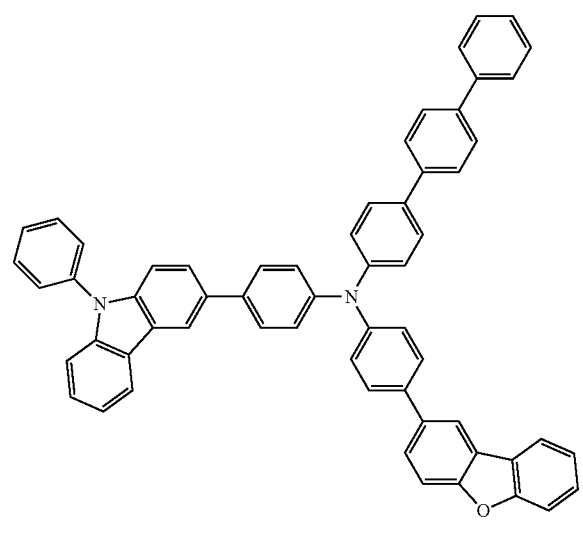

[A-37]
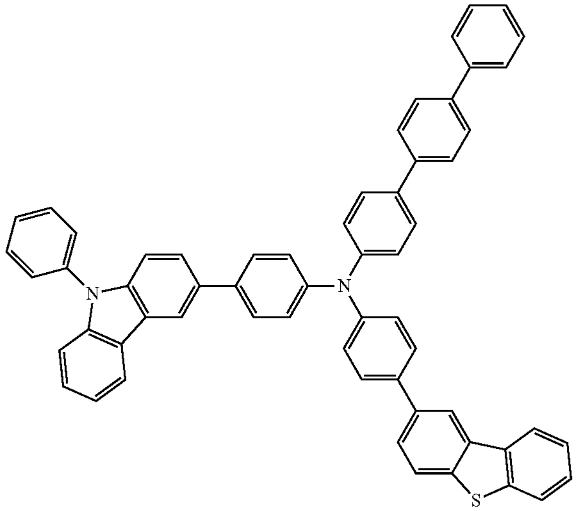
[A-38]
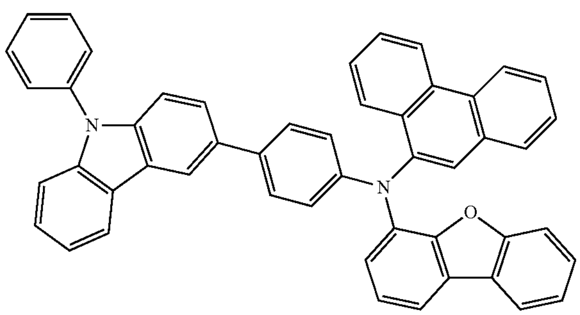
[A-39]
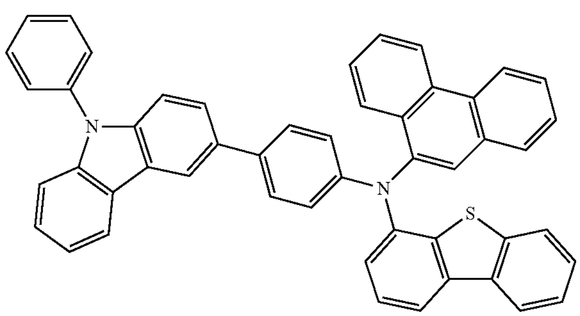
[A-40]
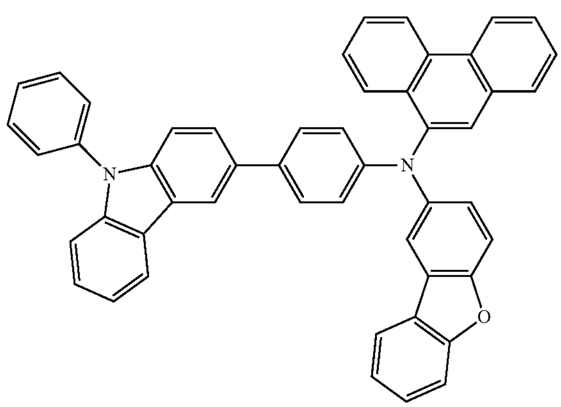
[A-41]
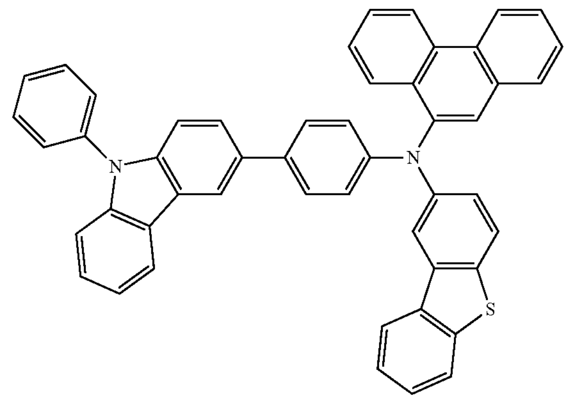
[A-42]
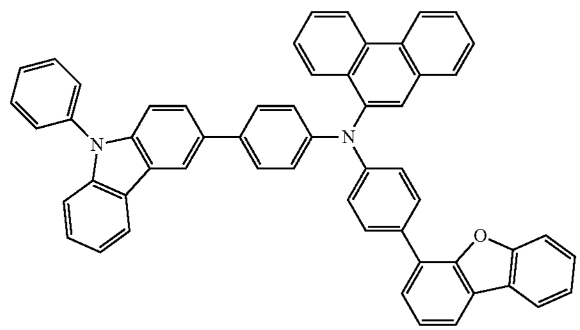
[A-43]
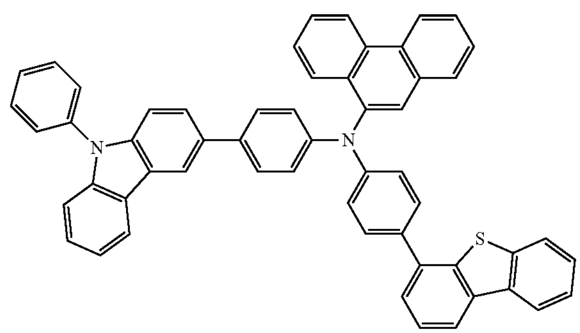
[A-44]
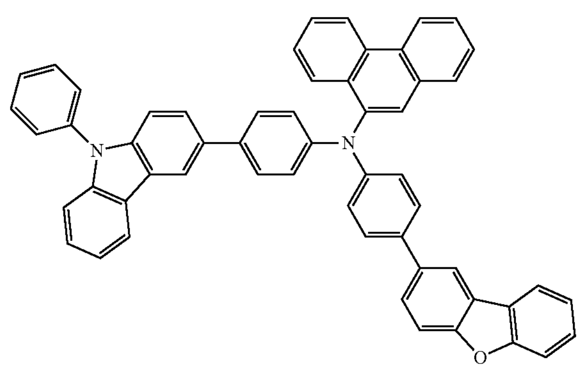

-continued
[A-45]
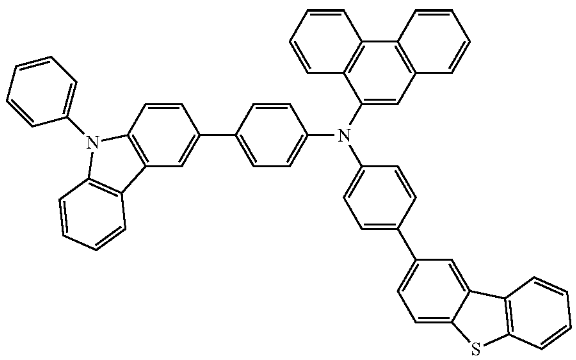
[A-46]
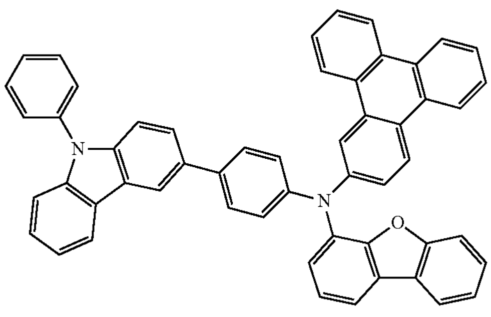
[A-47]
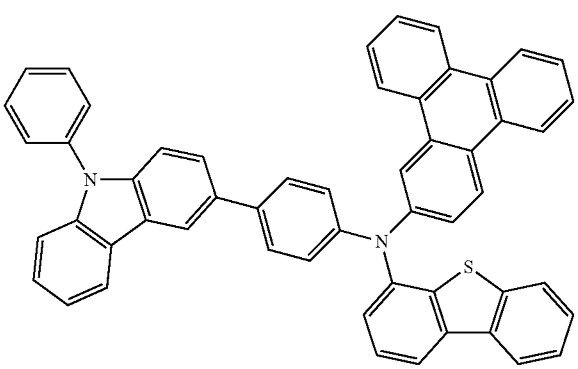
[A-48]
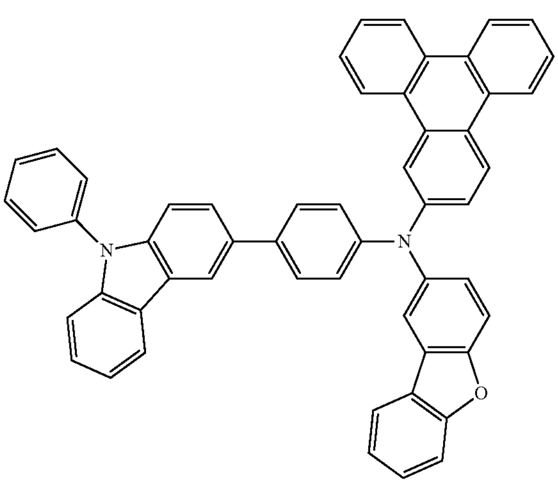
-continued
[A-49]
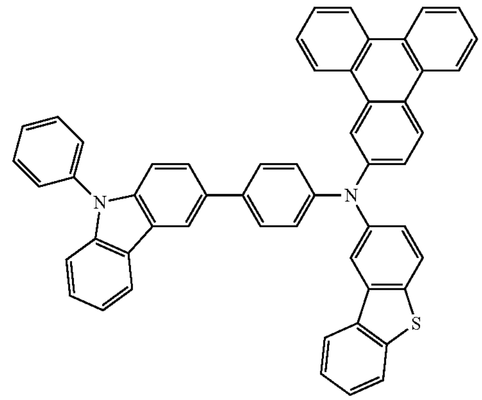
[A-50]
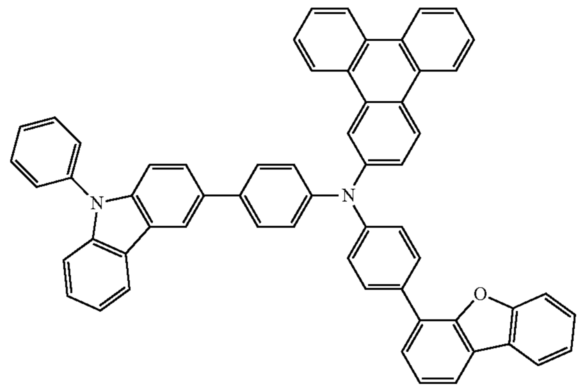
[A-51]
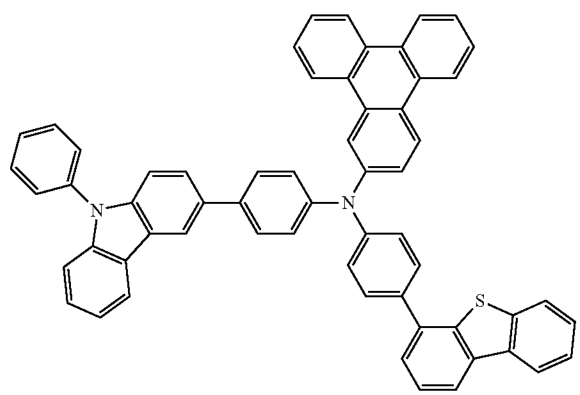
[A-52]
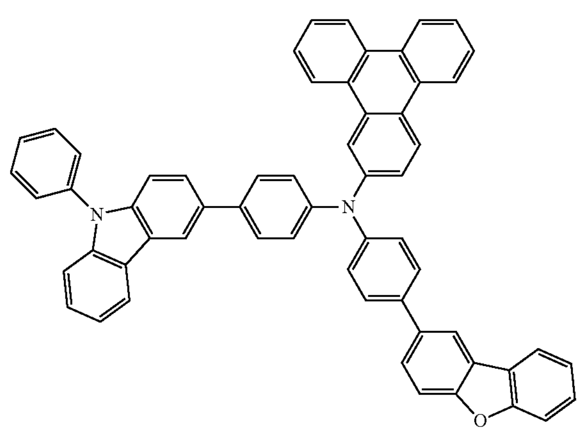

-continued
[A-53]
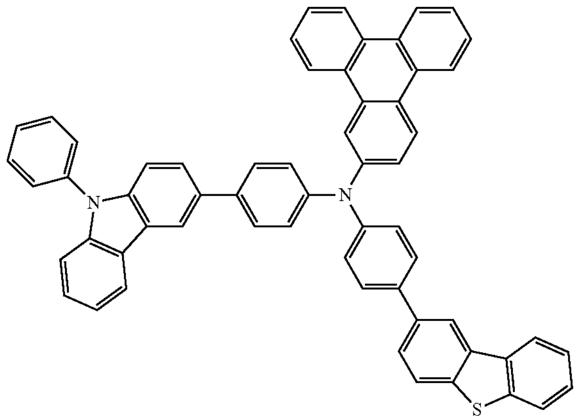
[A-54]
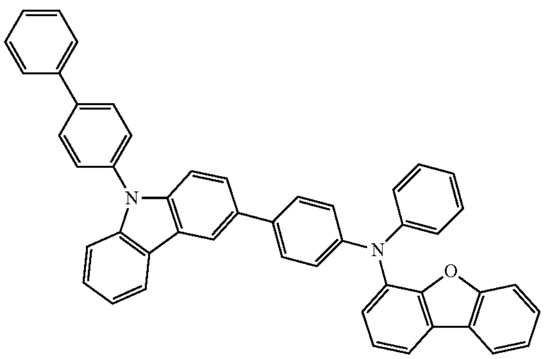
[A-55]
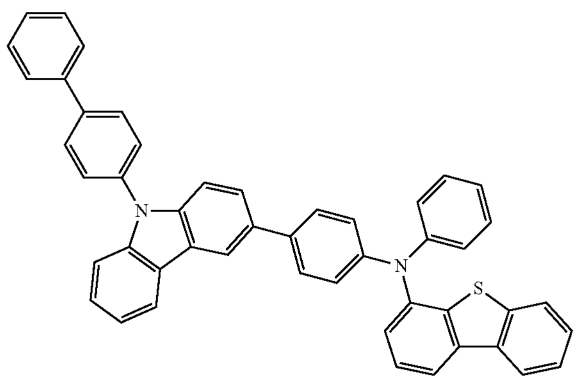
[A-56]
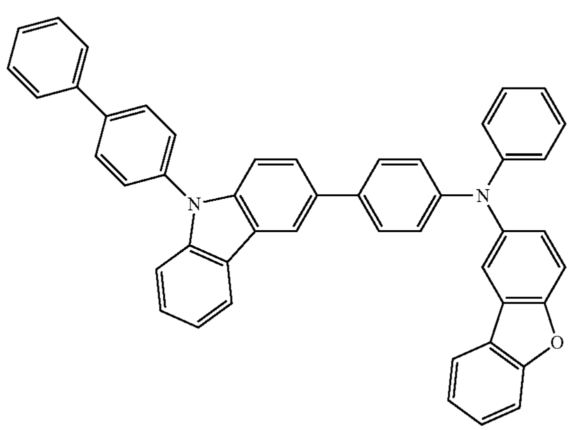
-continued
[A-57]
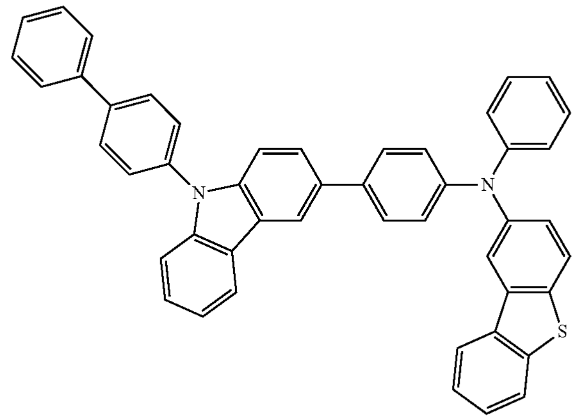
[A-58]
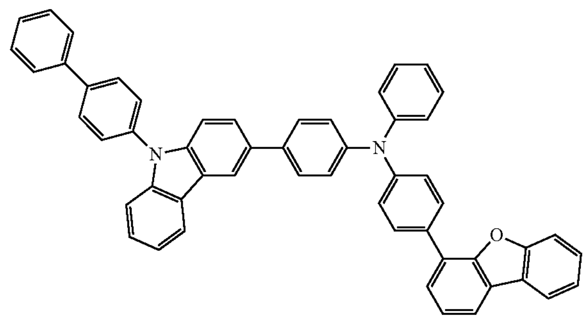
[A-59]
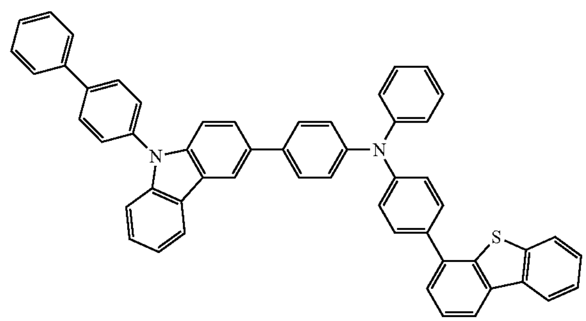
[A-60]
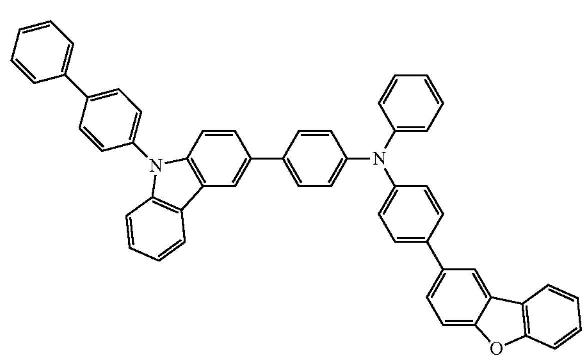

-continued
[A-61]
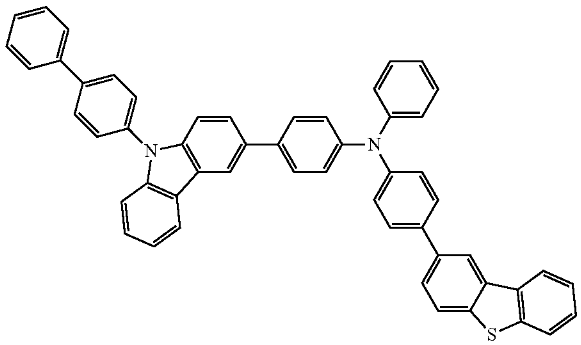
[A-62]
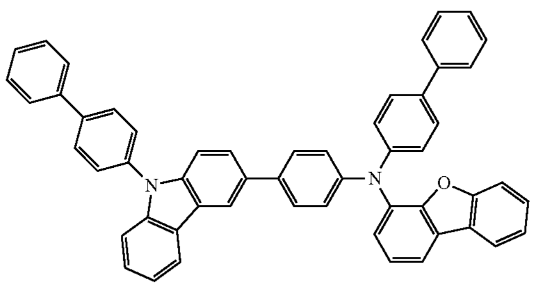
[A-63]
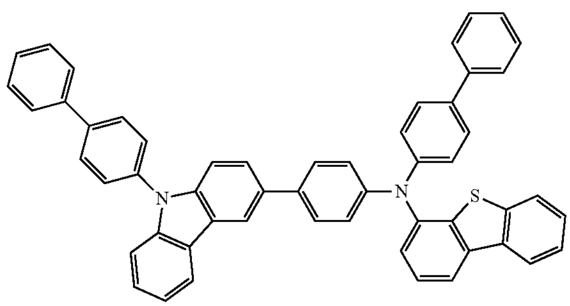
[A-64]
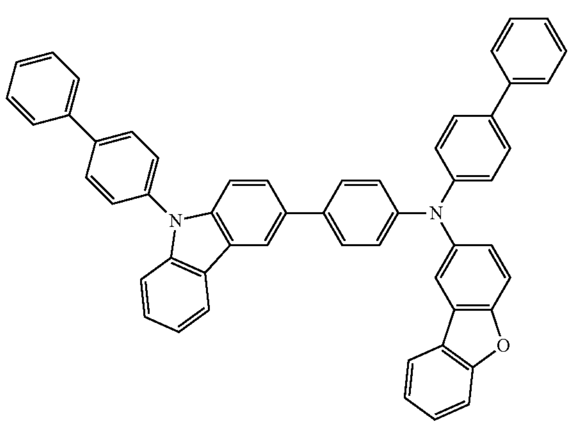
-continued
[A-65]
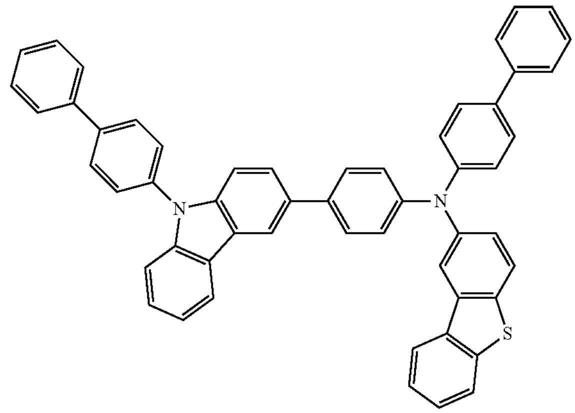
[A-66]
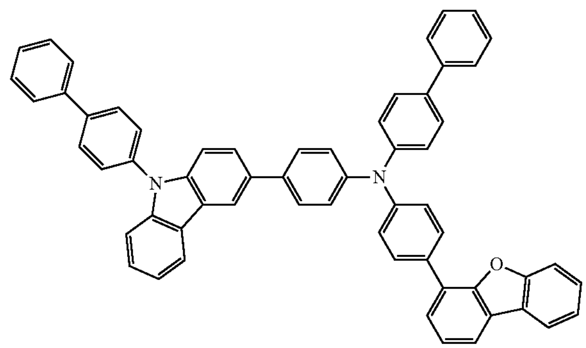
[A-67]
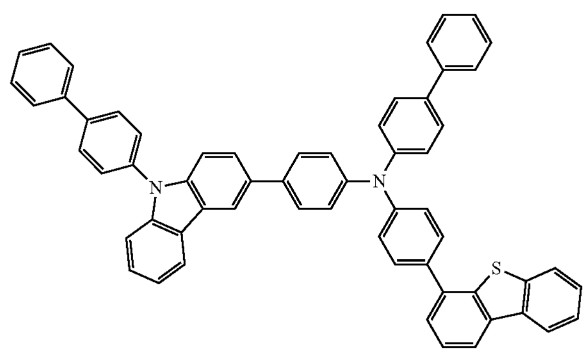
[A-68]
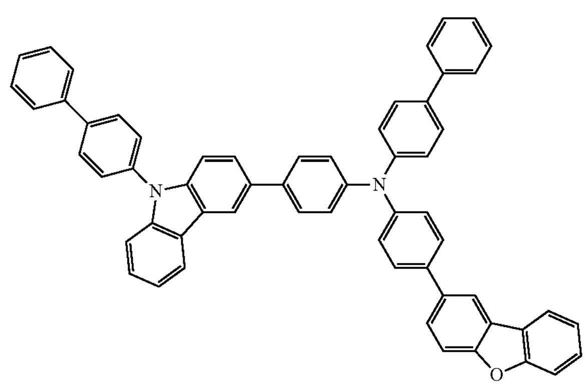

-continued
[A-69]
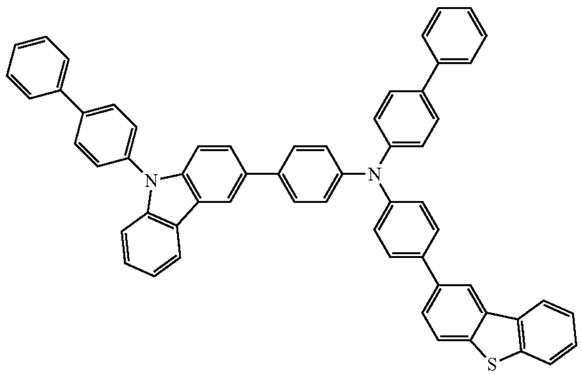
[A-70]
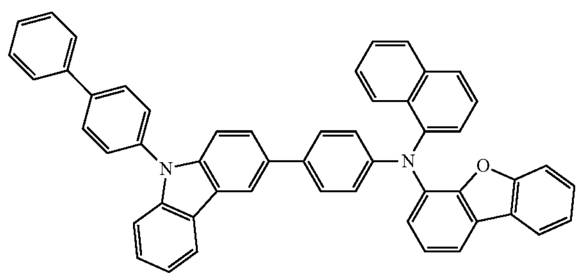
[A-71]
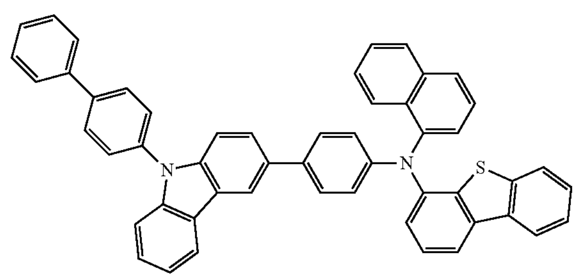
[A-72]
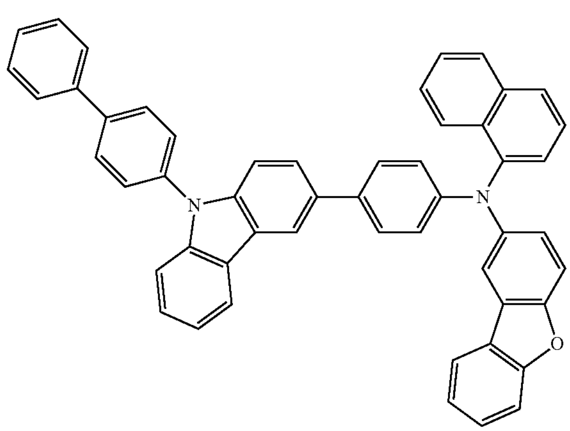
-continued
[A-73]
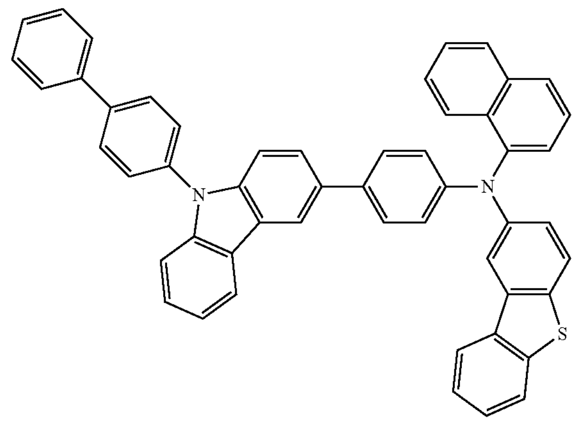
[A-74]
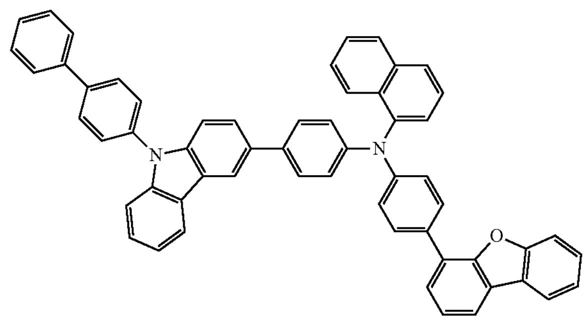
[A-75]
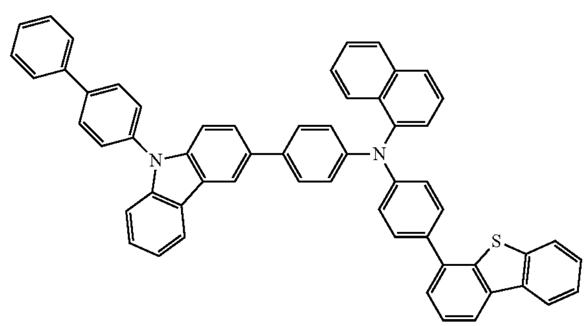
[A-76]
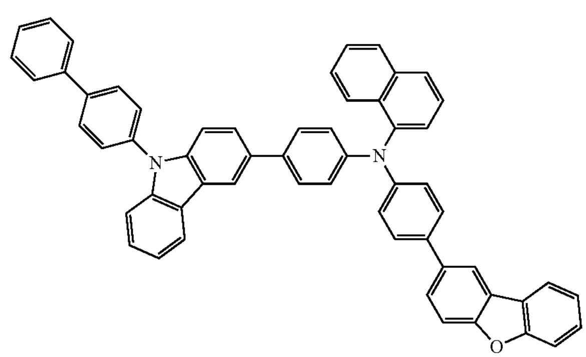

-continued
[A-77]
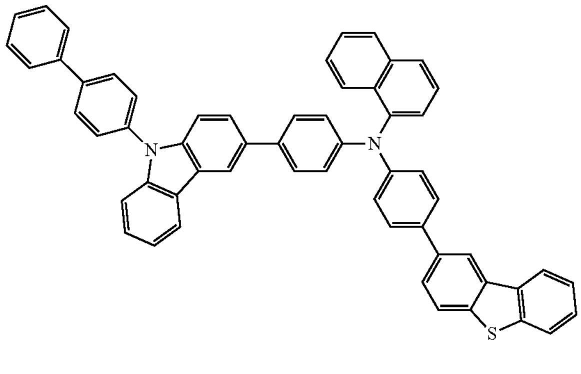
[A-78]
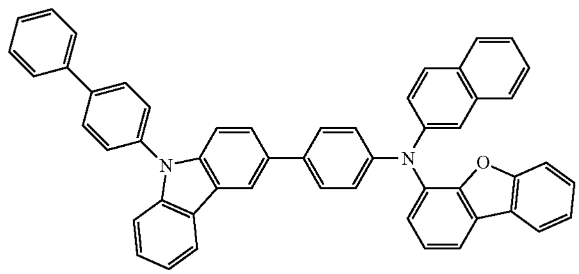
[A-79]
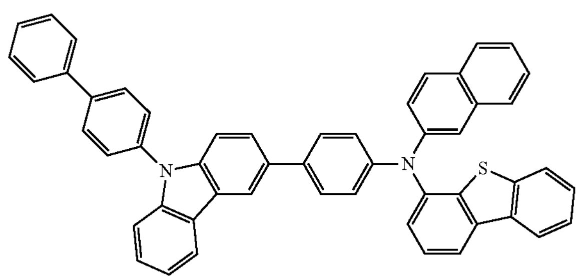
[A-80]
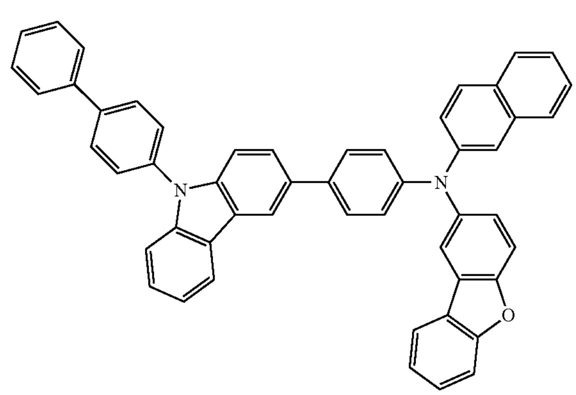
-continued
[A-81]
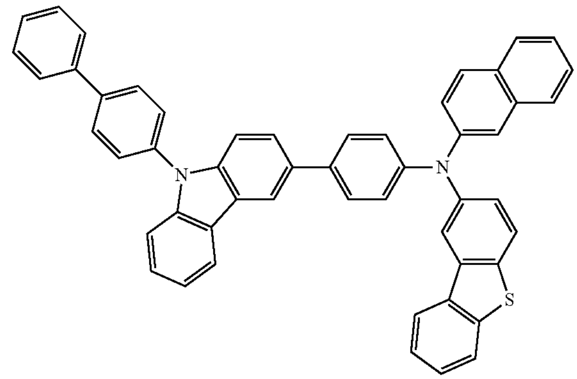
[A-82]
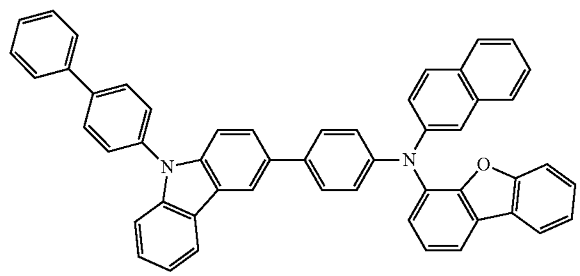
[A-83]
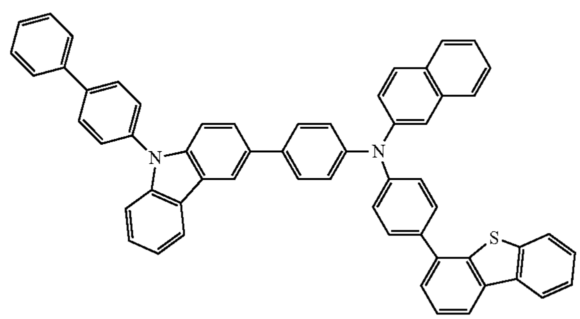
[A-84]
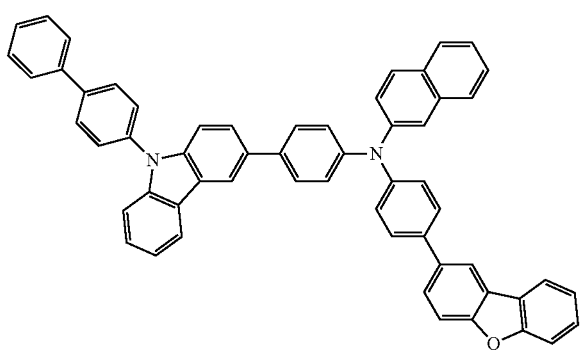

-continued
[A-85]
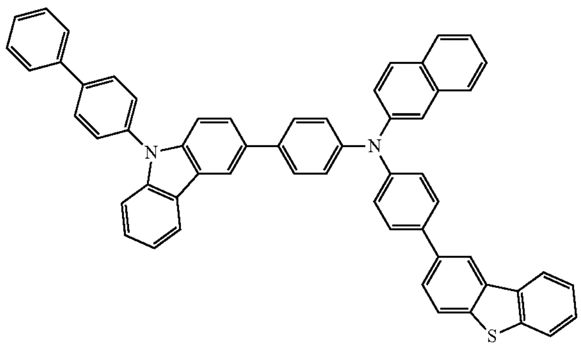
[A-86]
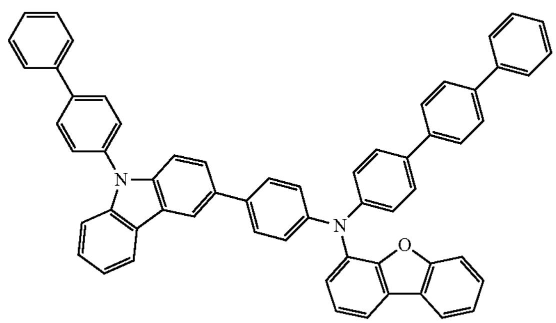
[A-87]
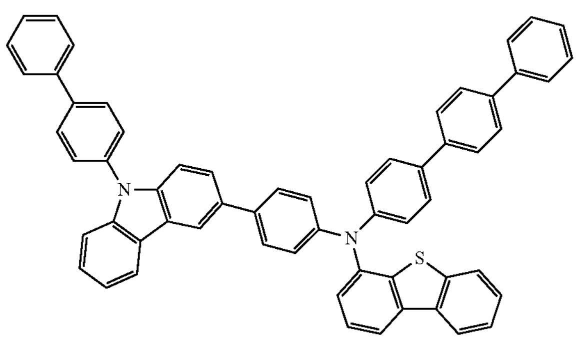
[A-88]
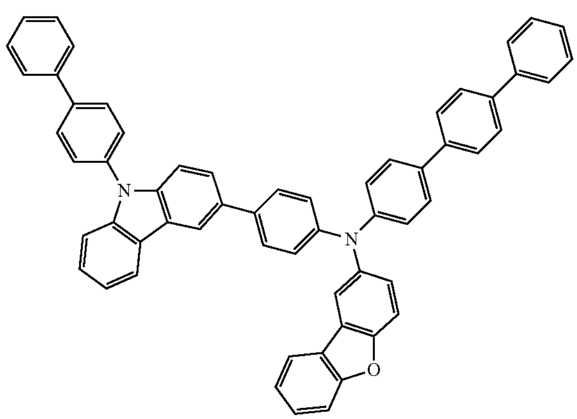
-continued
[A-89]
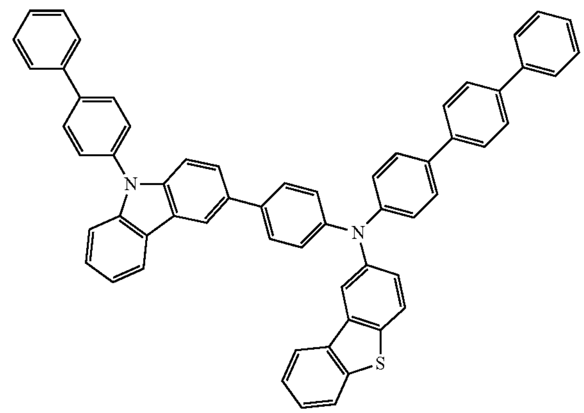
[A-90]
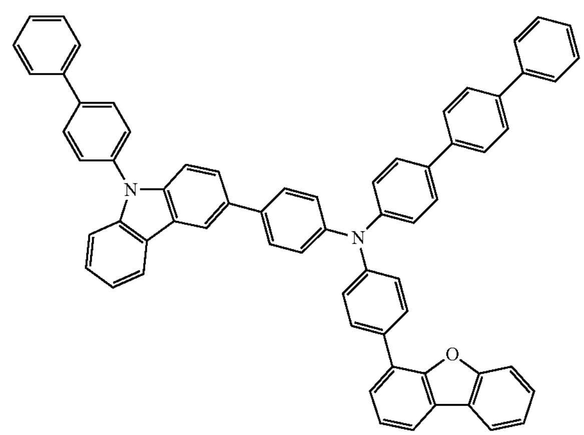
[A-91]
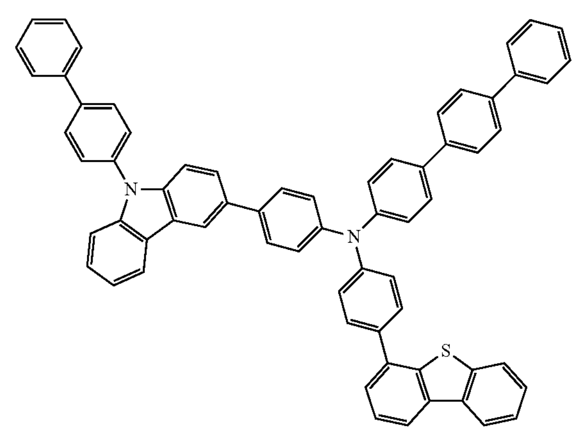

-continued
[A-92]
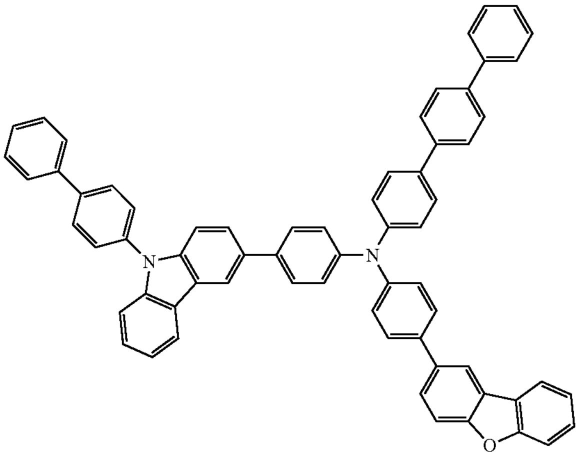
[A-93]
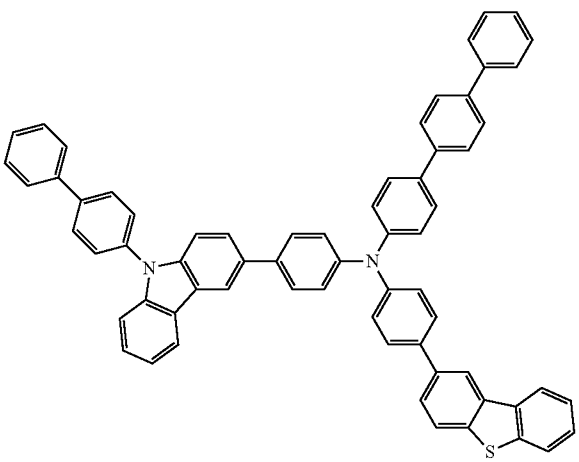
[A-94]
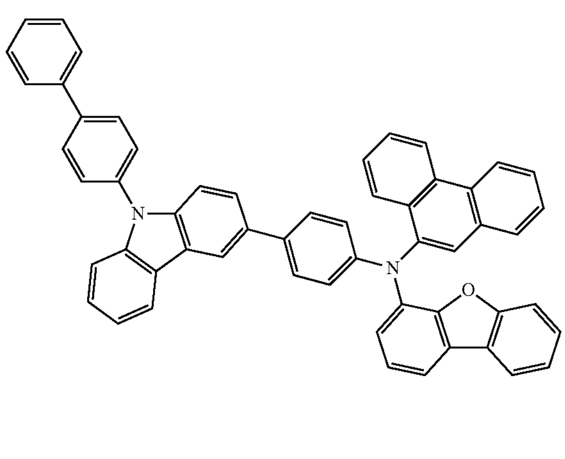
-continued
[A-95]
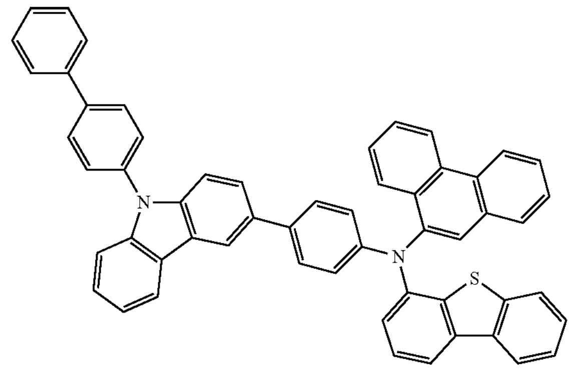
[A-96]
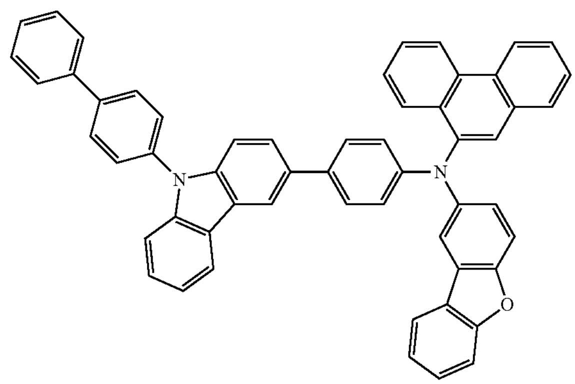
[A-97]
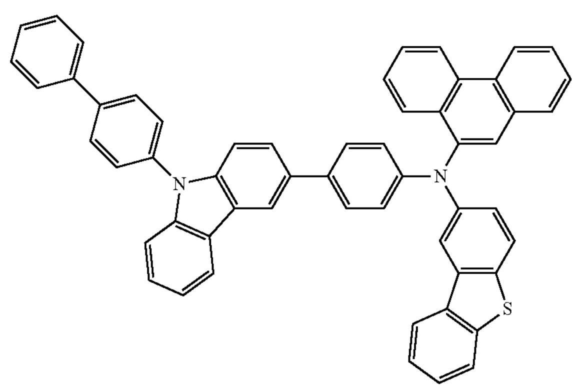
[A-98]
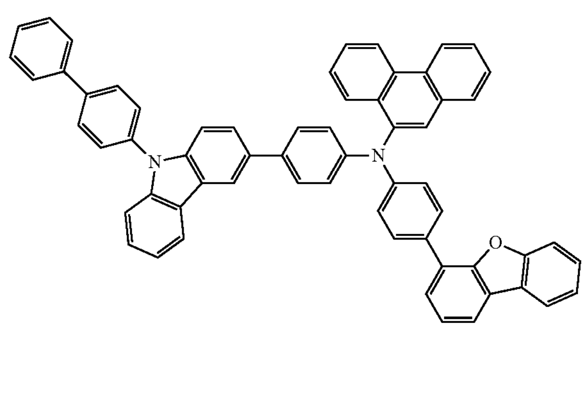

-continued
[A-99]
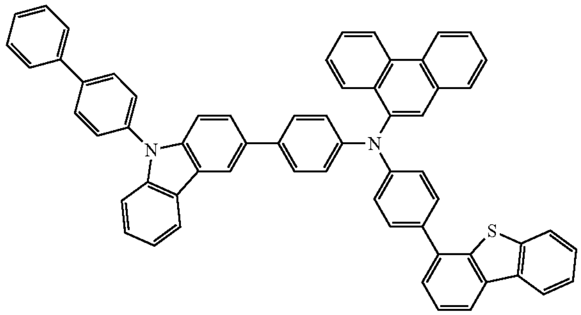
[A-100]
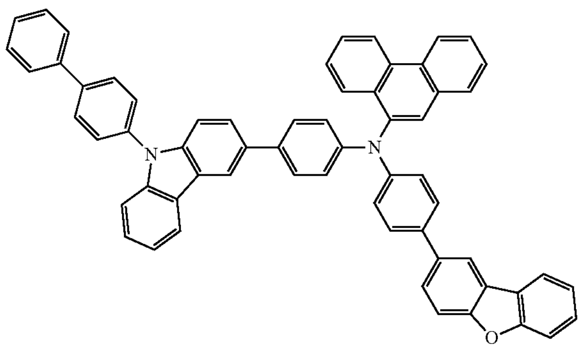
[A-101]
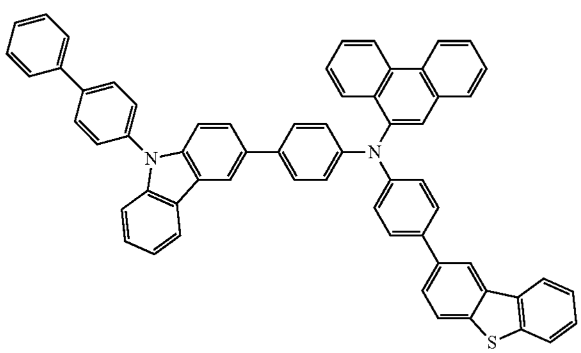
[A-102]
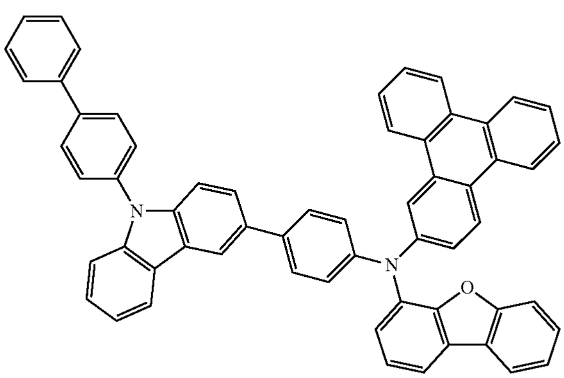
-continued
[A-103]
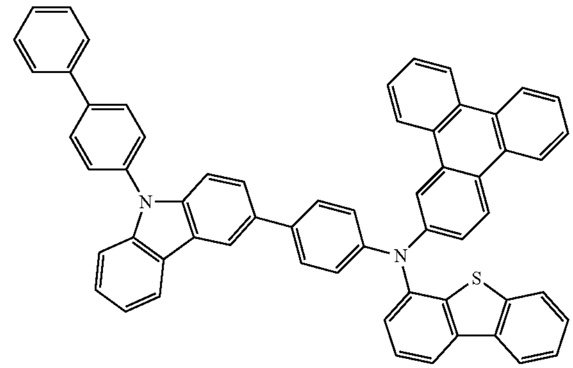
[A-104]
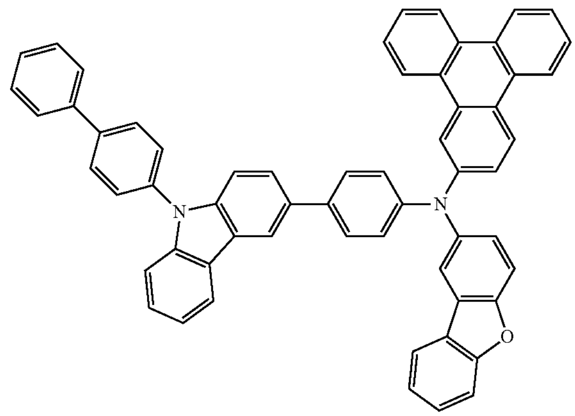
[A-105]
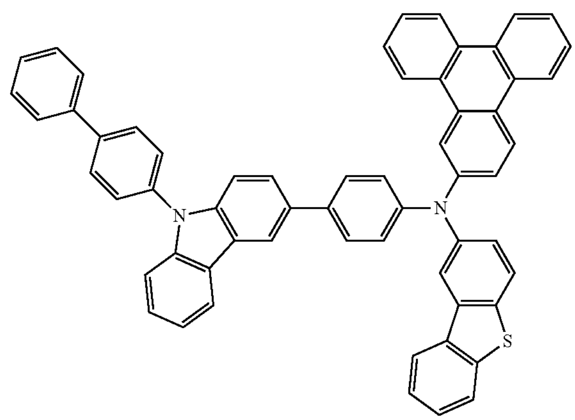
[A-106]
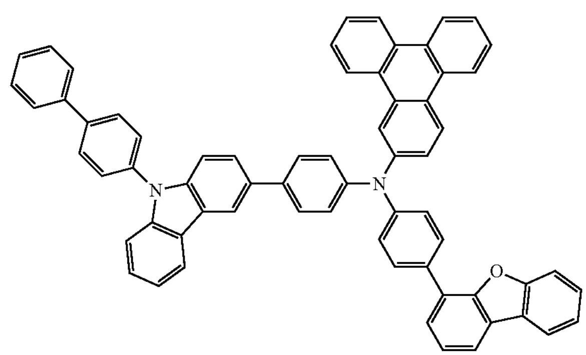

-continued
[A-107]
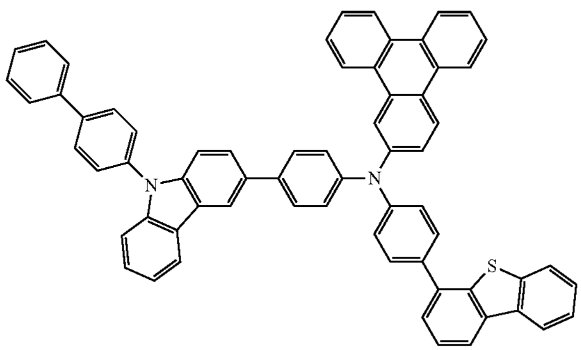
[A-108]
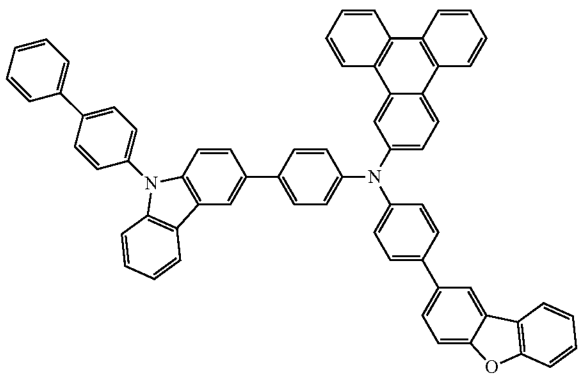
[A-109]
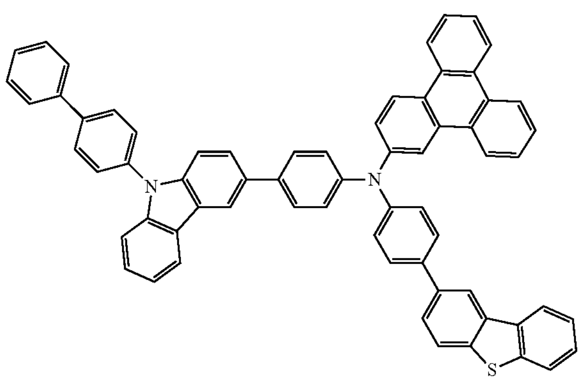
[A-110]
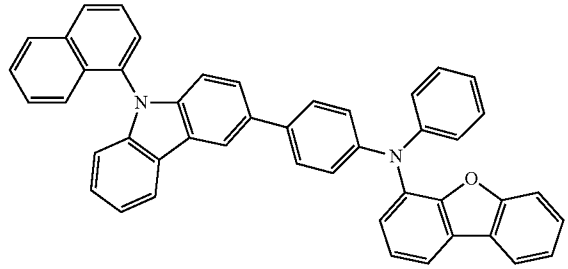
-continued
[A-111]
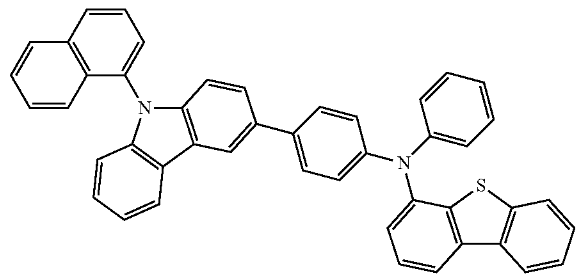
[A-112]
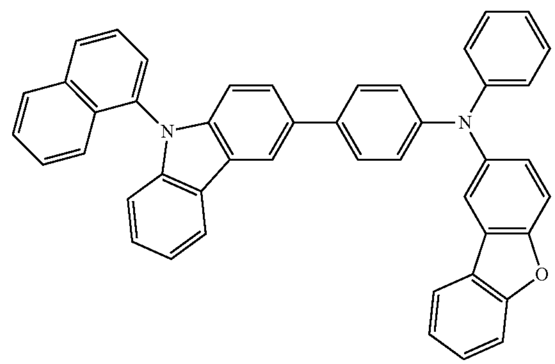
[A-113]
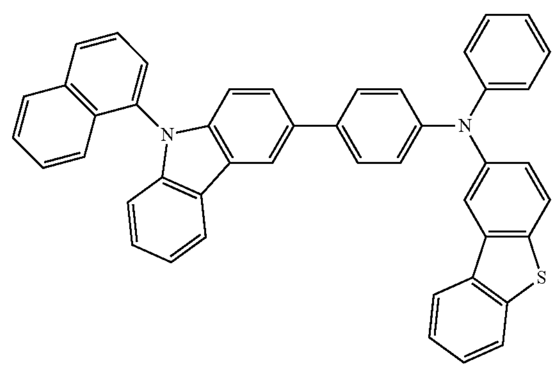
[A-114]
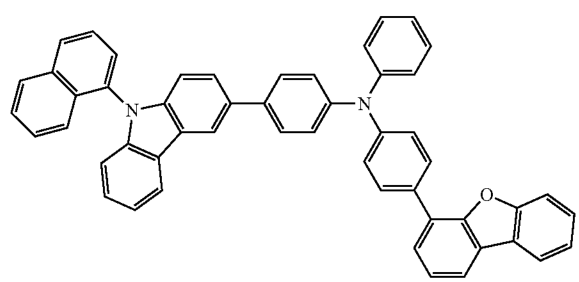
[A-115]
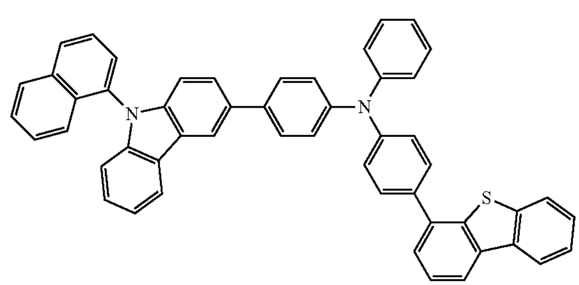

-continued
[A-116]
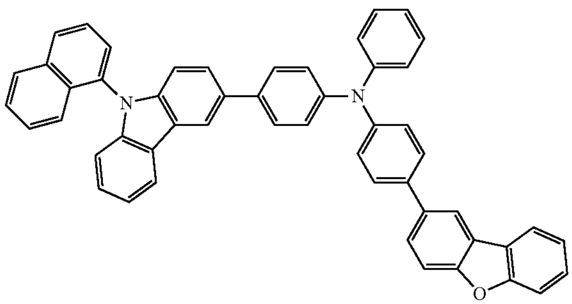
[A-117]
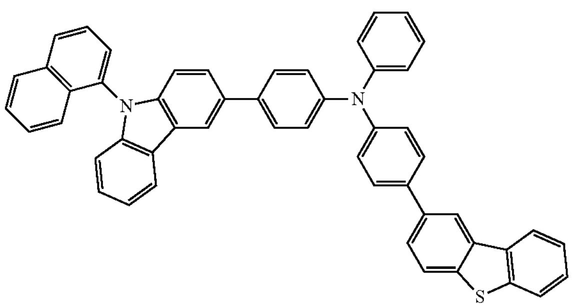
[A-118]
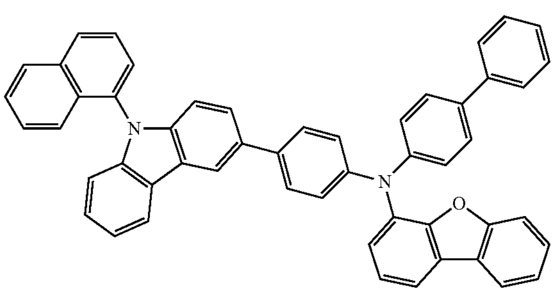
[A119]
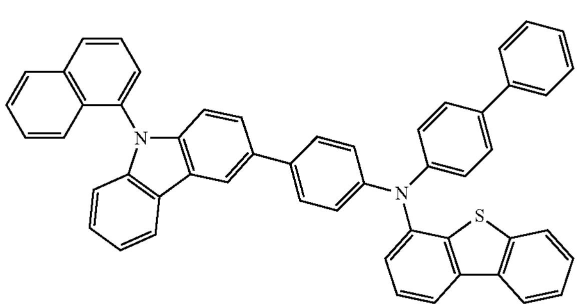
-continued
[A-120]
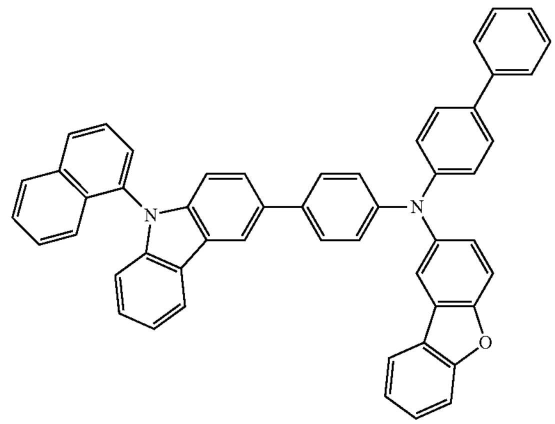
[A-121]
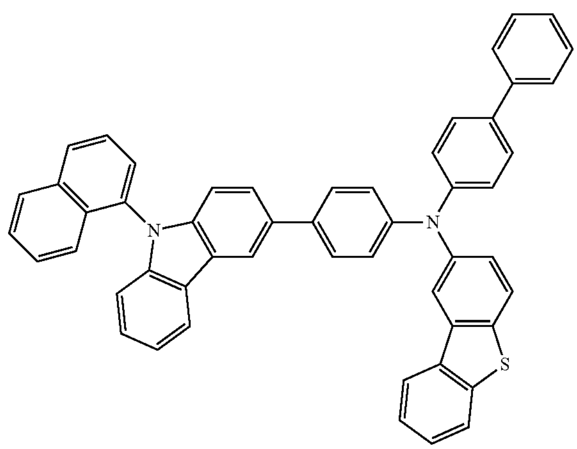
[A-122]
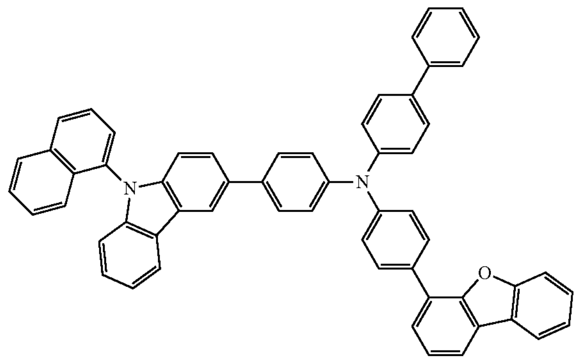

-continued
[A-123]
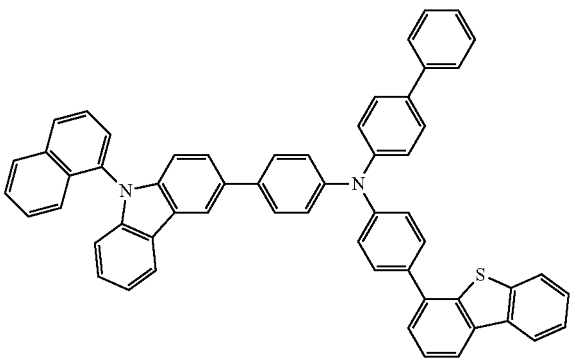
[A-124]
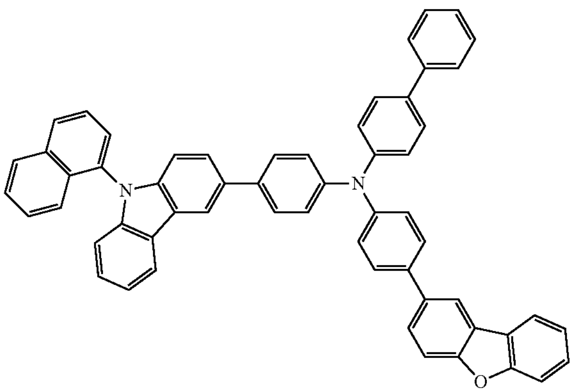
[A-125]
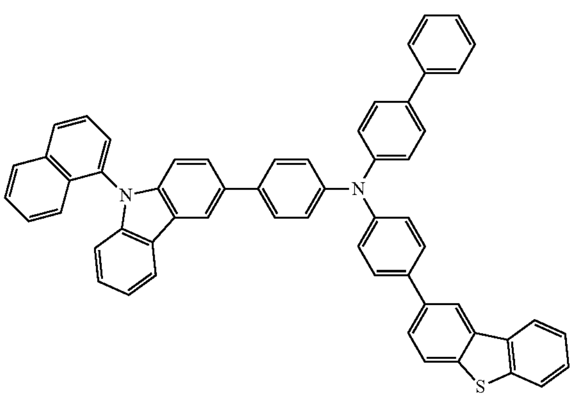
[A-126]
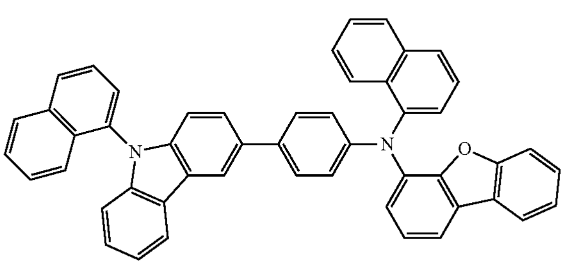
-continued
[A-127]
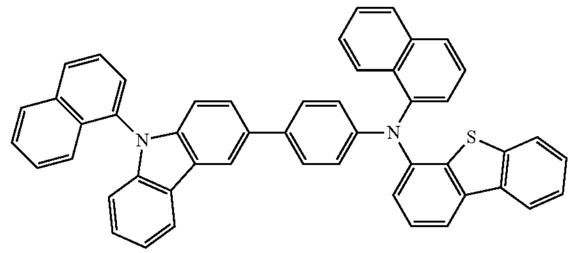
[A-128]
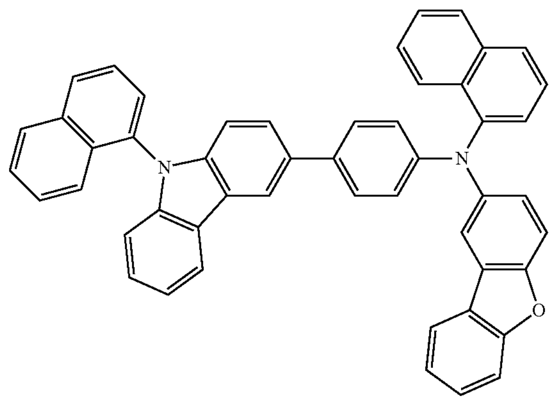
[A-129]
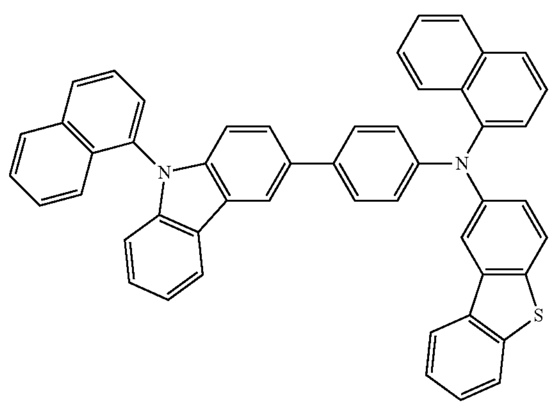
[A-130]
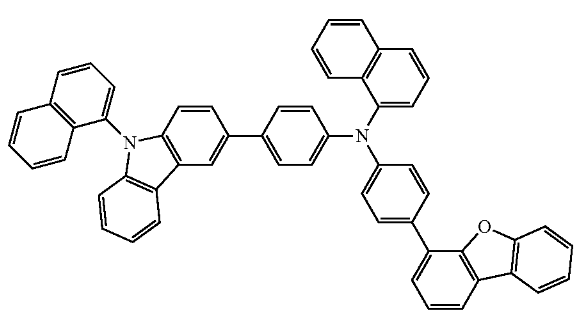

-continued
[A-131]
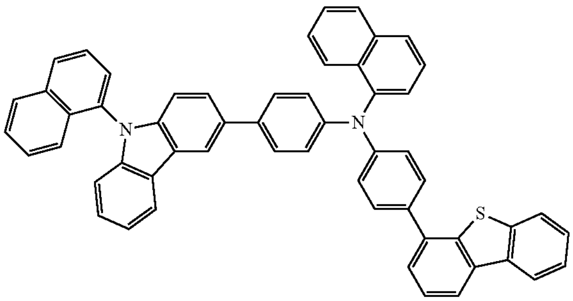
[A-132]
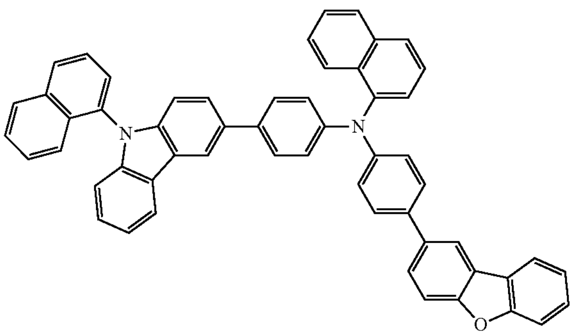
[A-133]
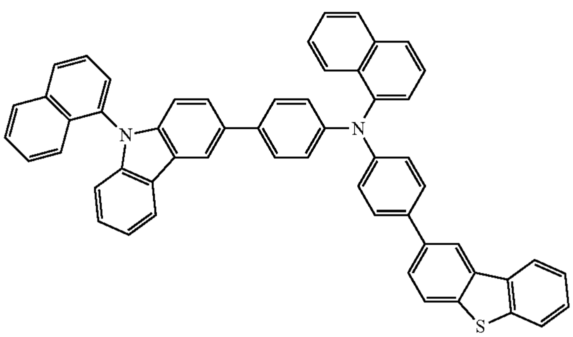
[A-134]
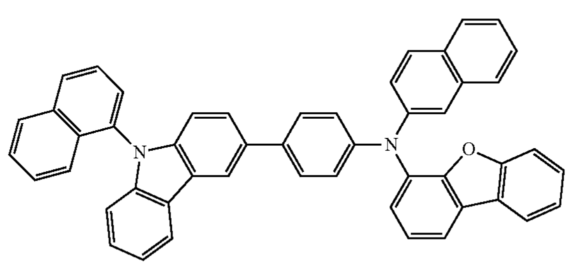
[A-135]
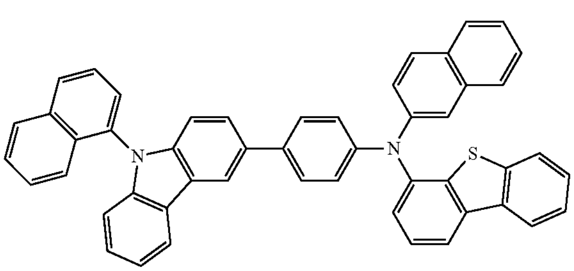
-continued
[A-136]
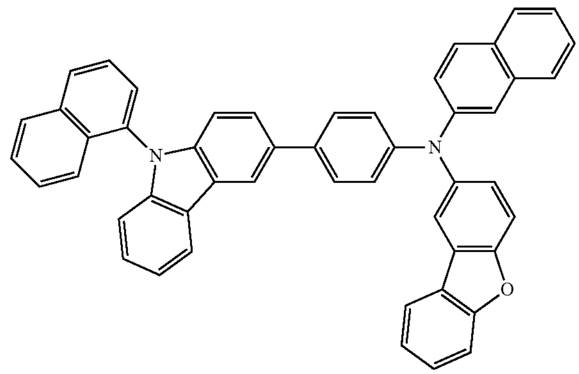
[A-137]
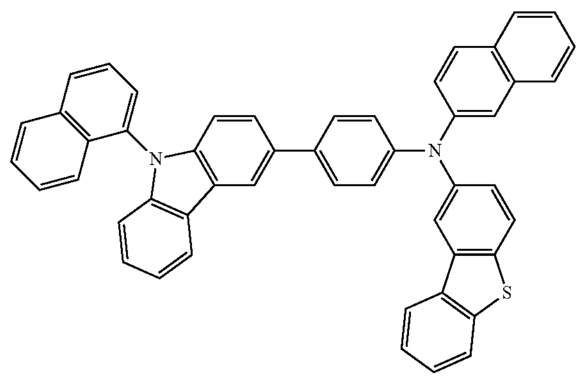
[A-138]
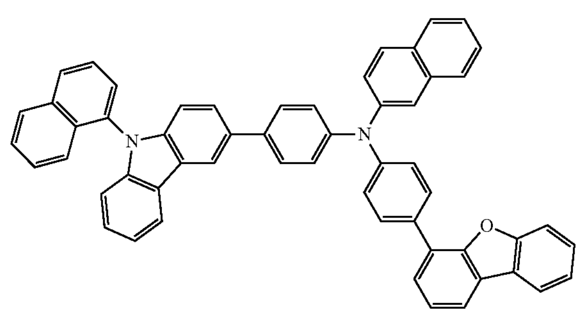
[A-139]
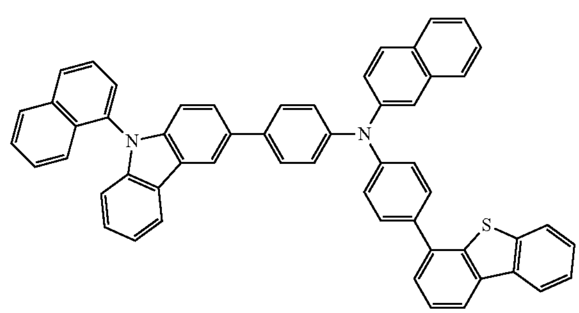

-continued
[A-140]
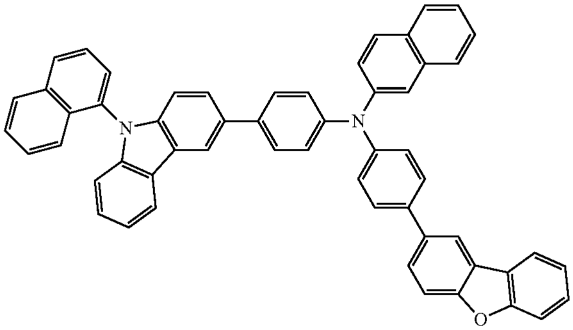
[A-141]
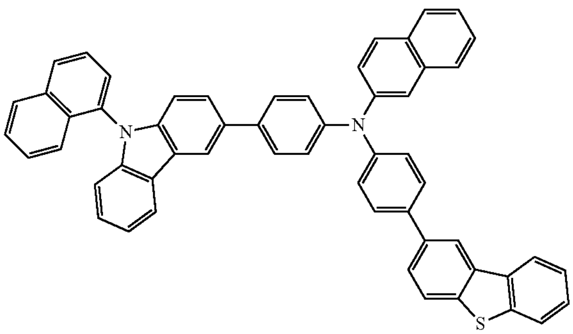
[A-142]
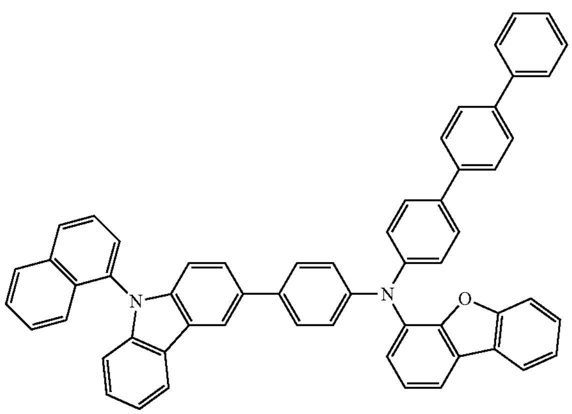
[A-143]
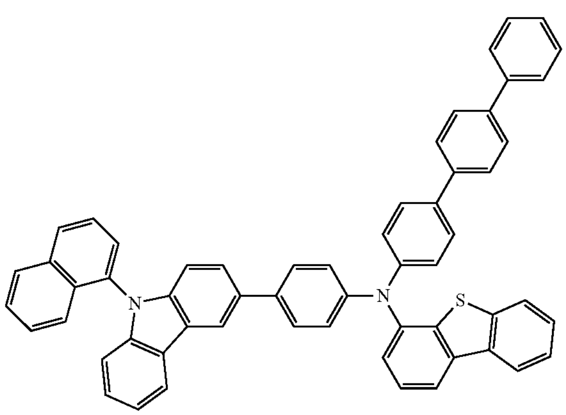
-continued
[A-144]
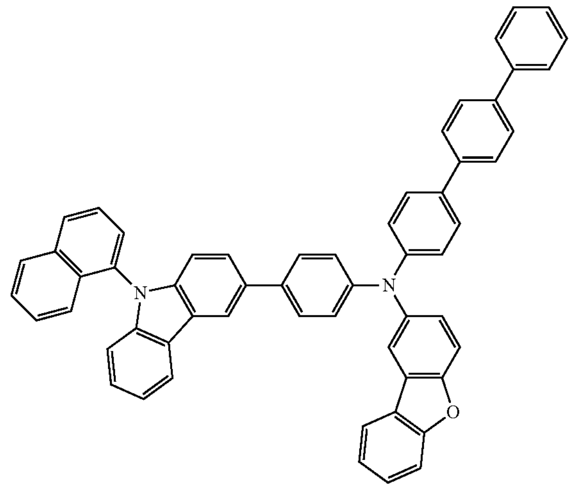
[A-145]
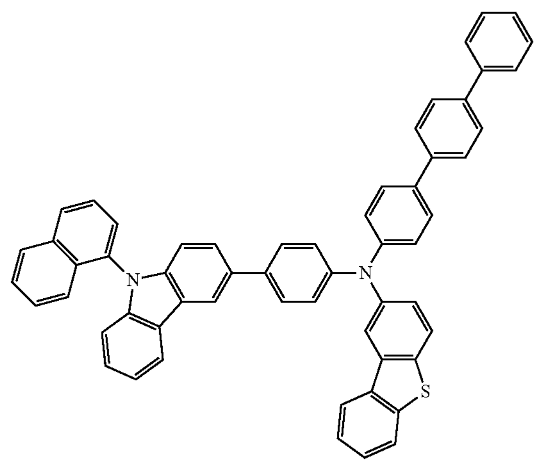
[A-146]
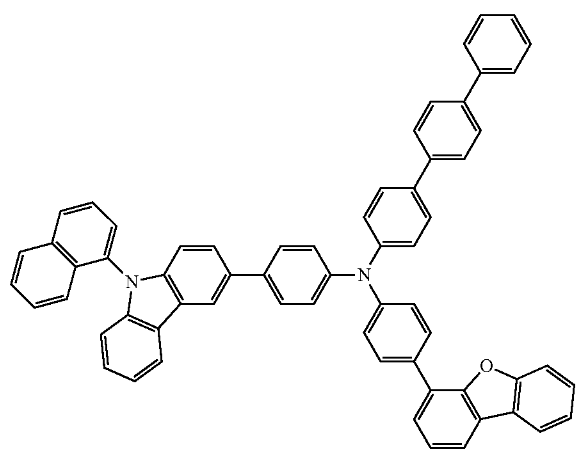

-continued
[A-147]
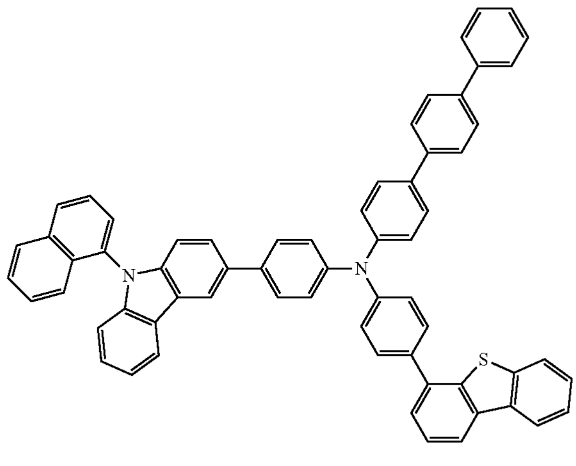
[A-148]
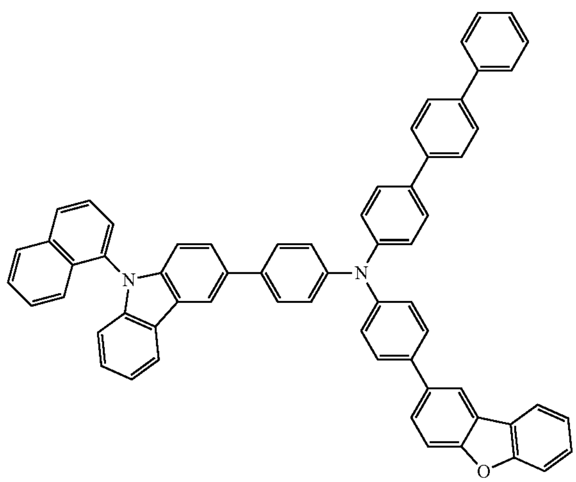
[A-149]
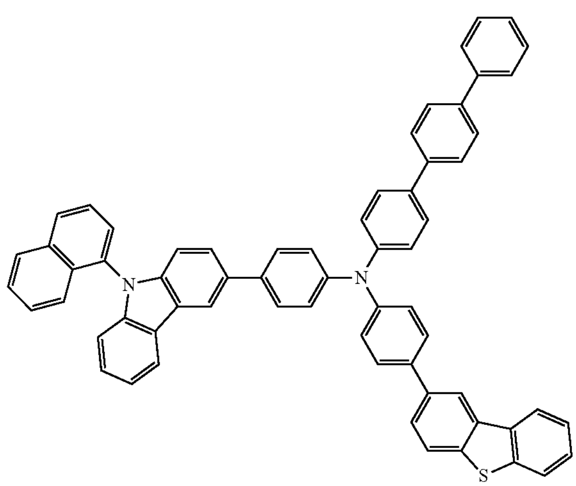
-continued
[A-150]
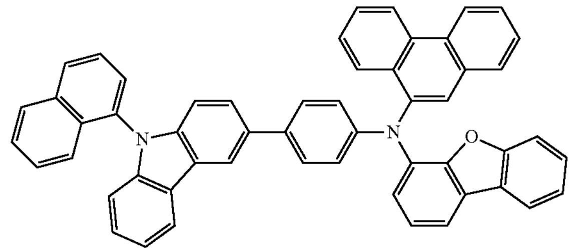
[A-151]
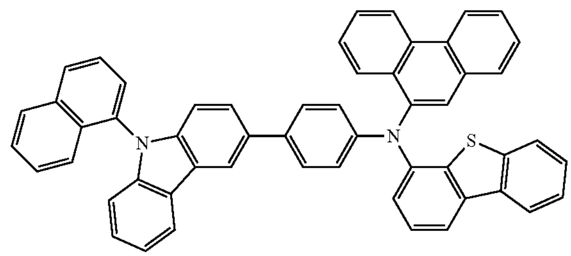
[A-152]
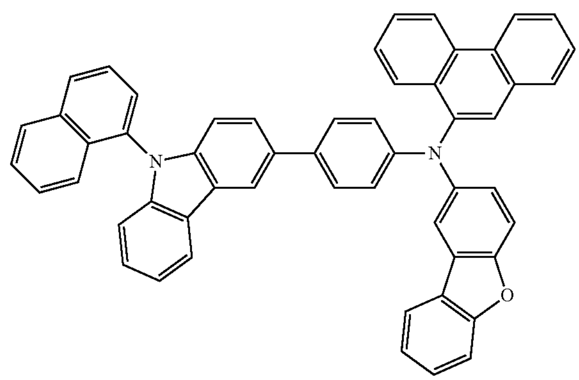
[A-153]
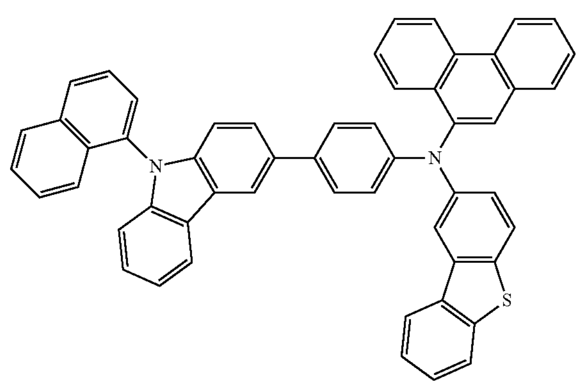

-continued
[A-154]
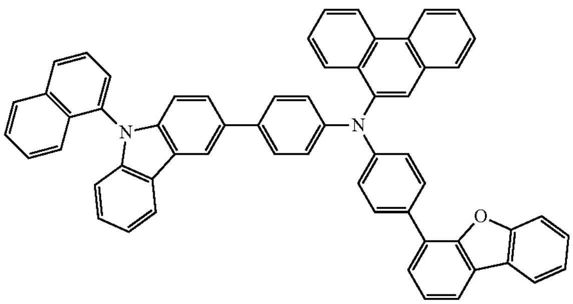
[A-155]
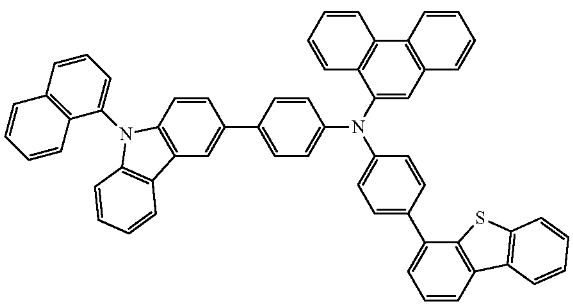
[A-156
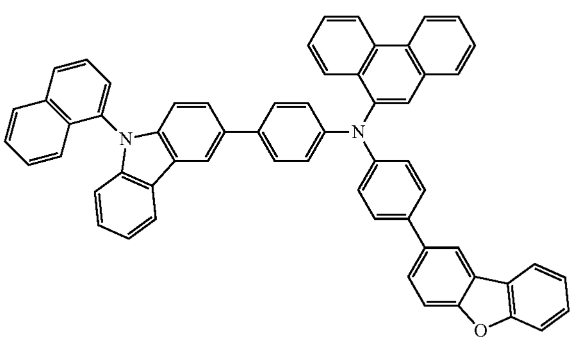
[A-157]
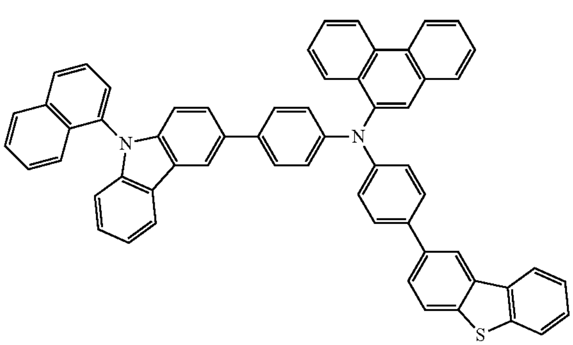
-continued
[A-158]
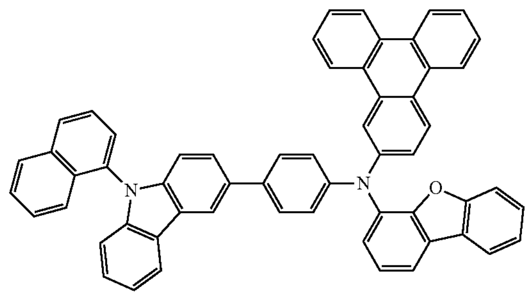
[A-159]
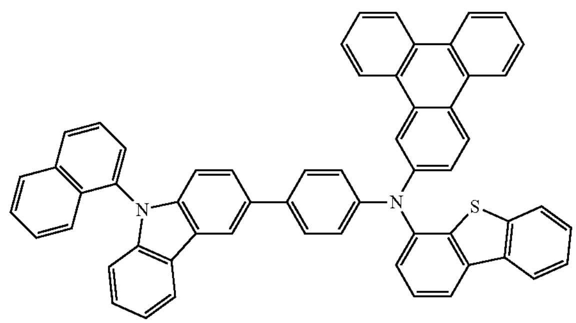
[A-160]
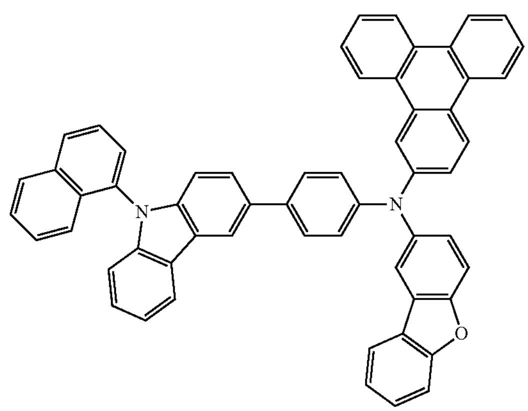
[A-161]
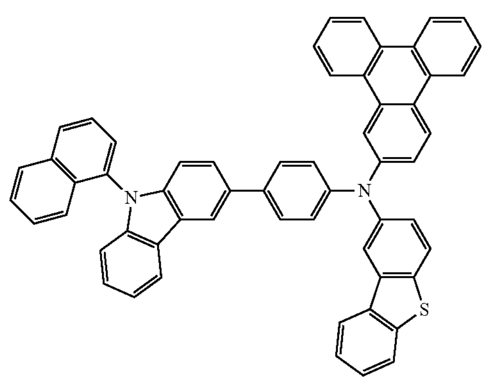

-continued
[A-162]
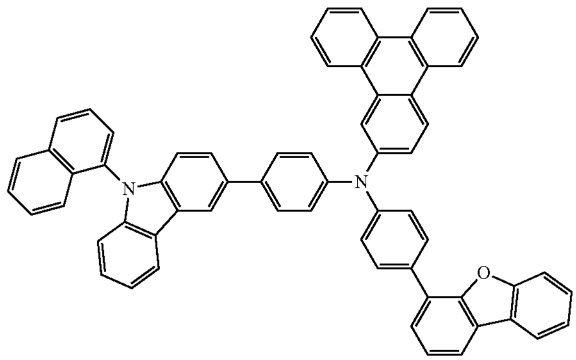
[A-163]
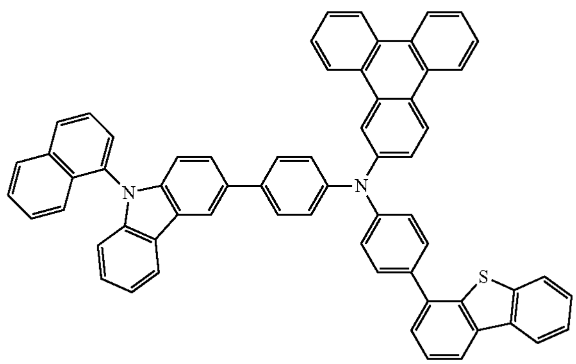
[A-164]
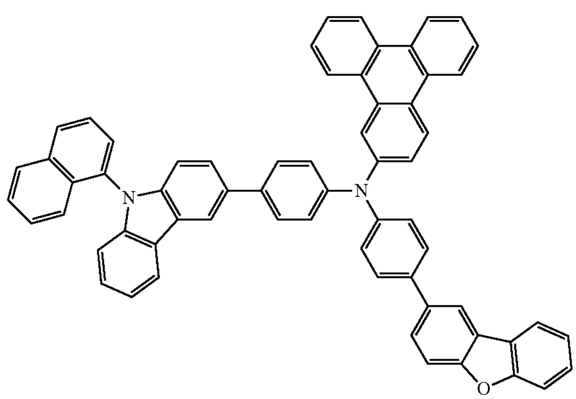
[A-165]
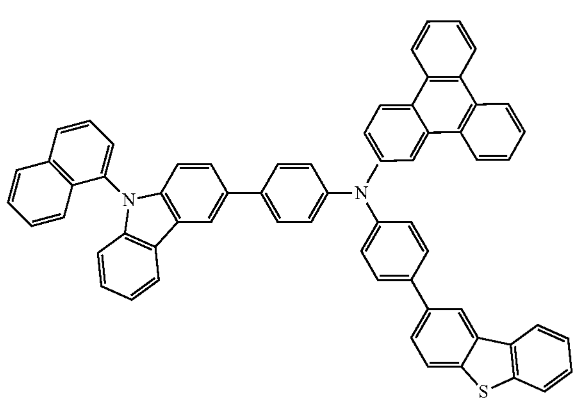
-continued
[A-166]
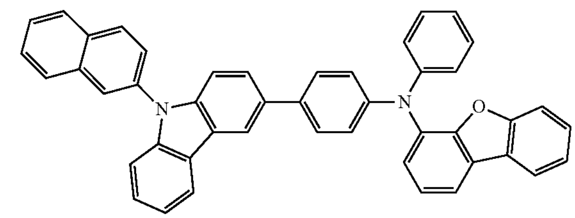
[A-167]
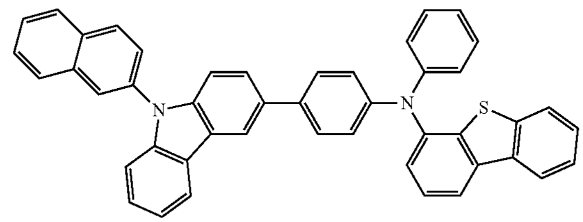
[A-168]
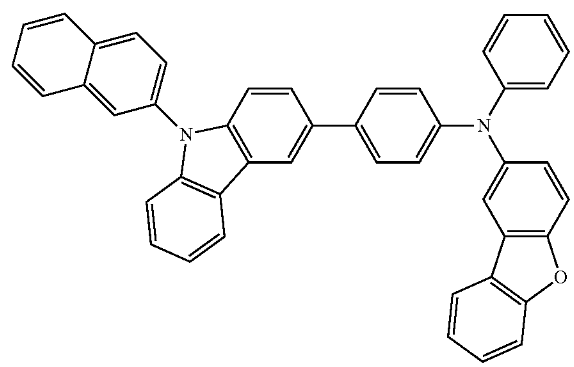
[A-169]
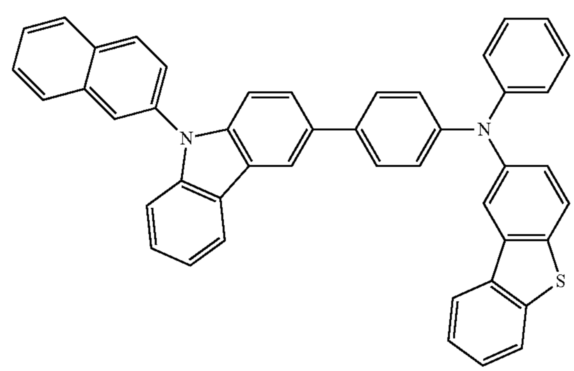
[A-170]
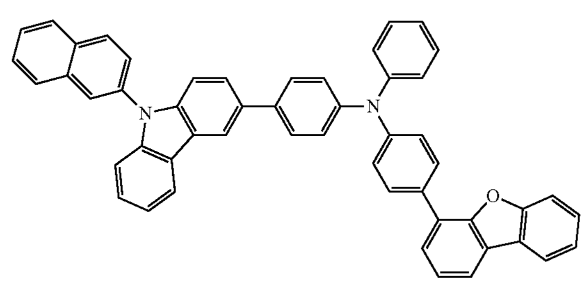

-continued
[A-171]
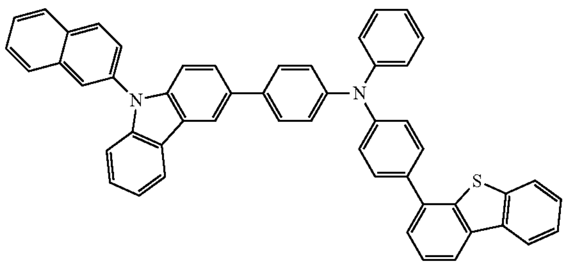
[A-172]
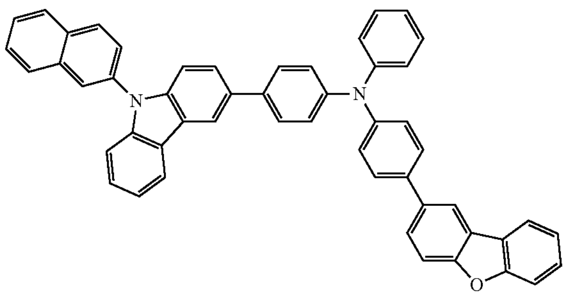
[A-173]
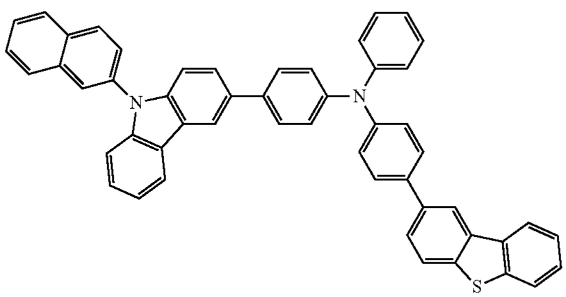
[A-174]
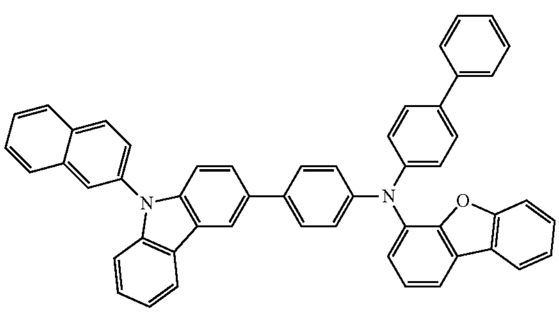
[A-175]
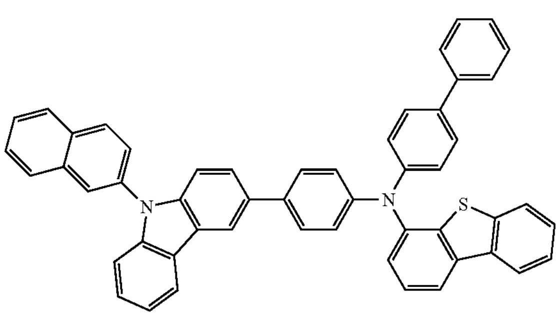
-continued
[A-176]
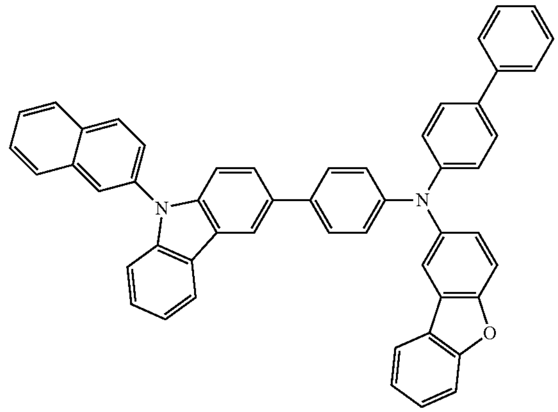
[A-177]
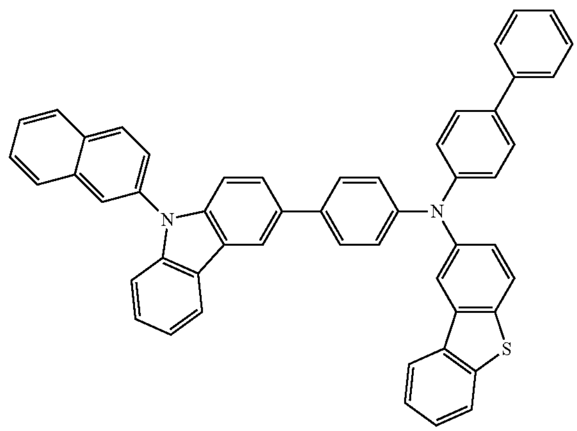
[A-178]
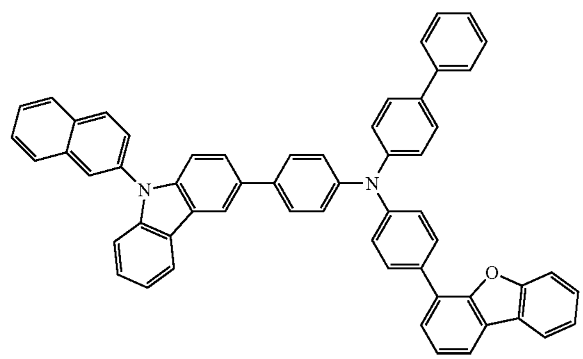
[A-179]
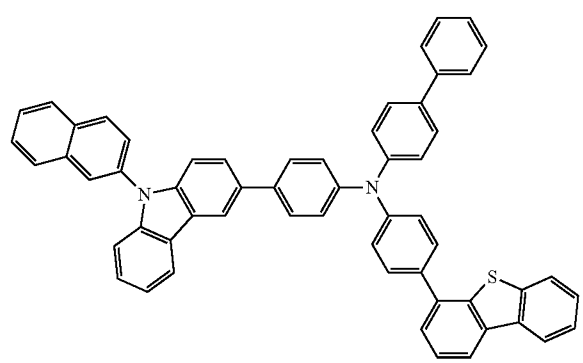

-continued
[A-180]
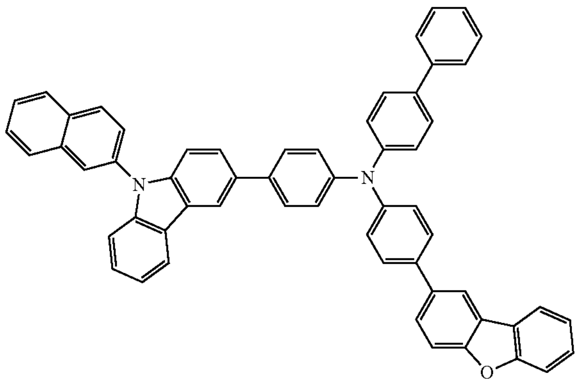
[A-181]
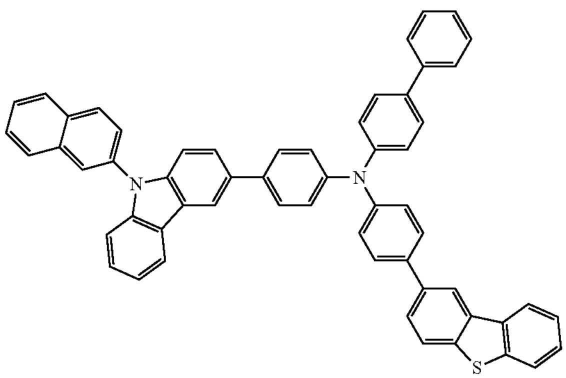
[A-182]
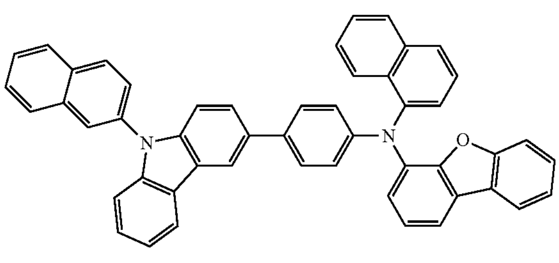
[A-183]
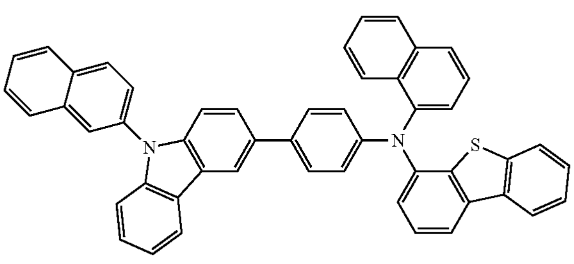
-continued
[A-184]
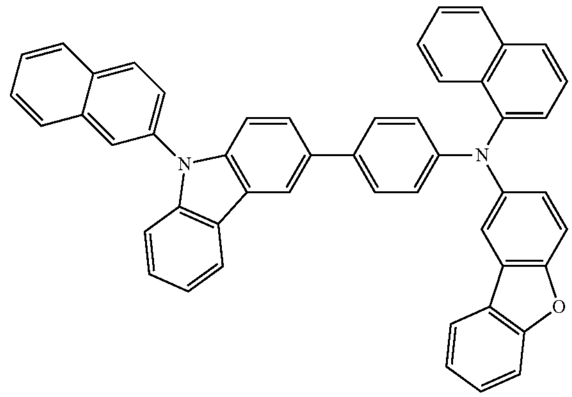
[A-185]
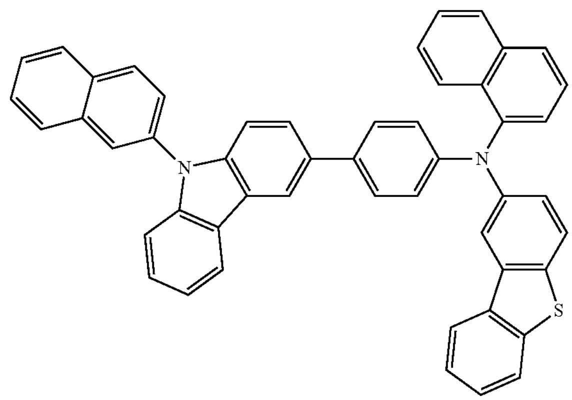
[A-186]
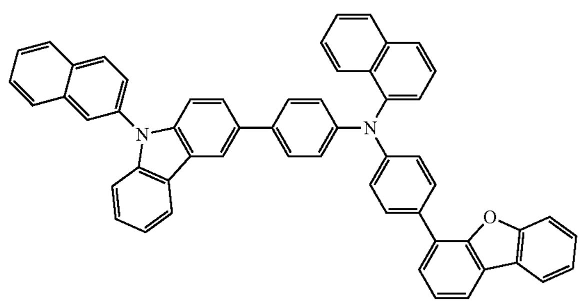
[A-187]
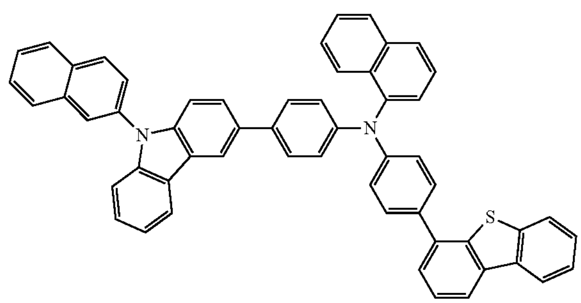

-continued
[A-188]
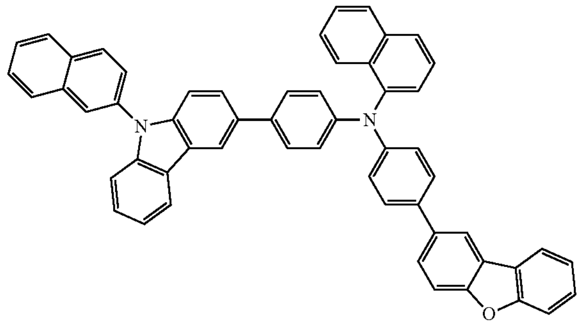
[A-189]
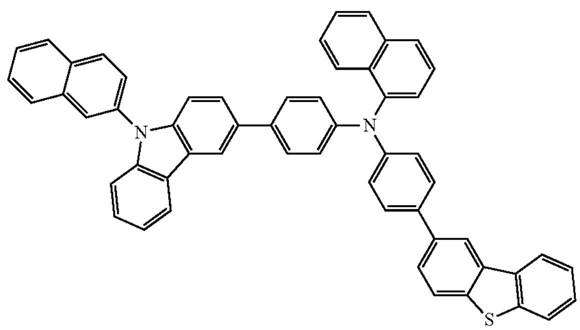
[A-190]
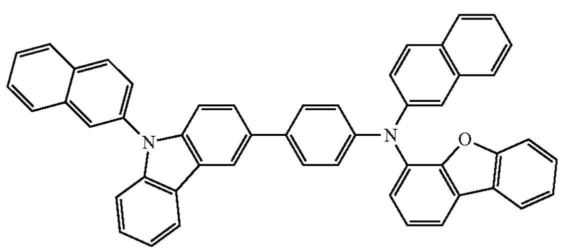
[A-191]
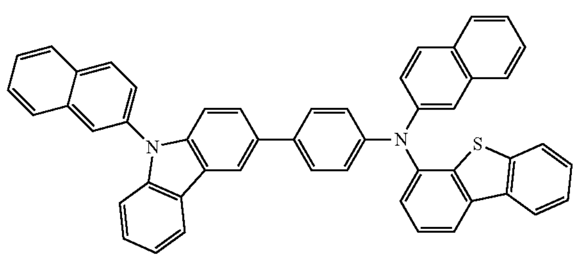
[A-192]
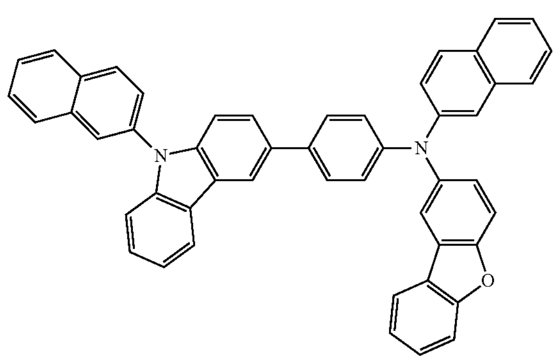
-continued
[A-193]
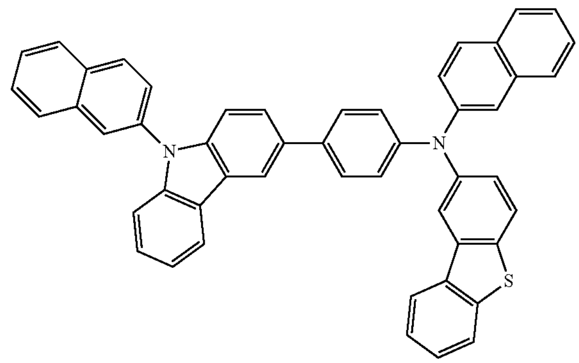
[A-194]
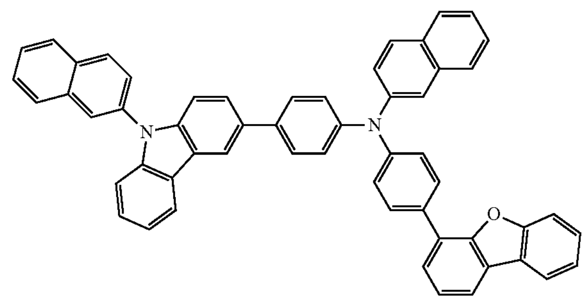
[A-195]
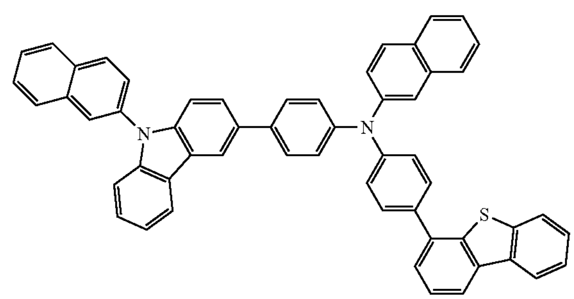
[A-196]
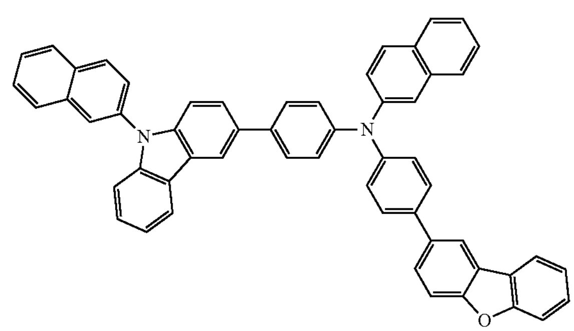

-continued
[A-197]
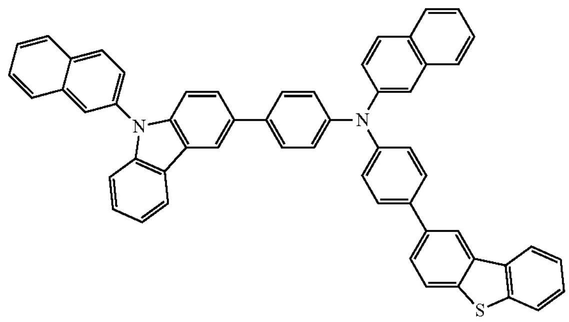
[A-198]
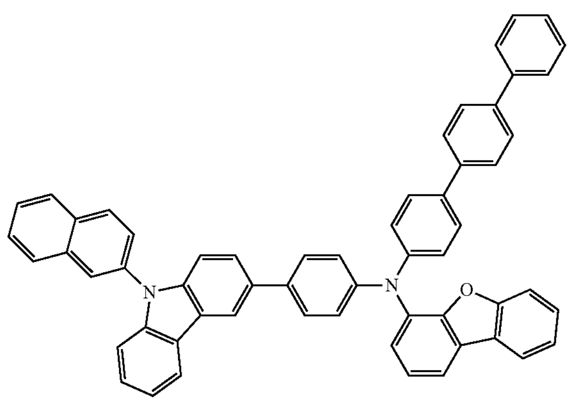
[A-199]
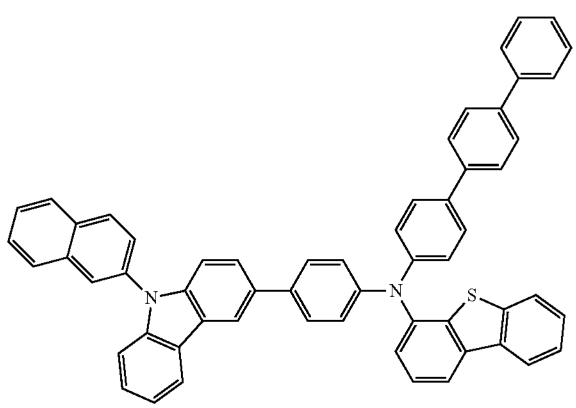
-continued
[A-200]
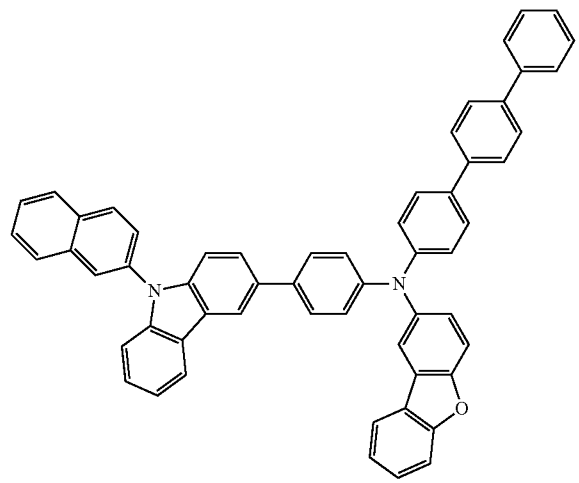
[A-201]
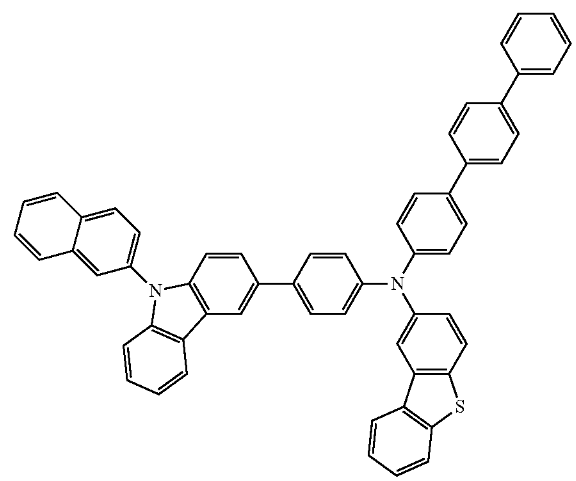
[A-202]
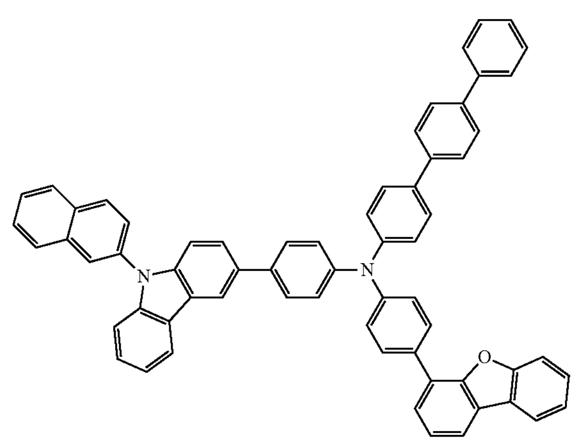

-continued
[A-203]
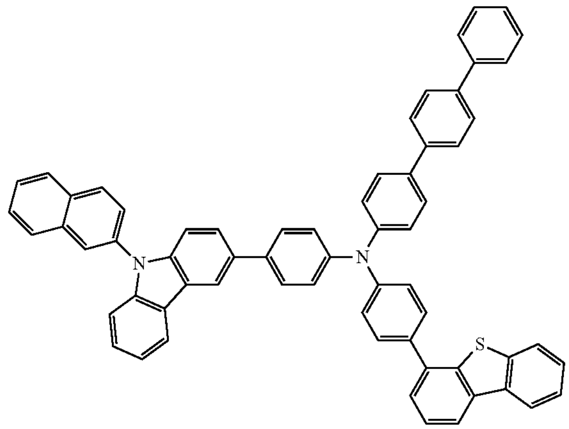
[A-204]
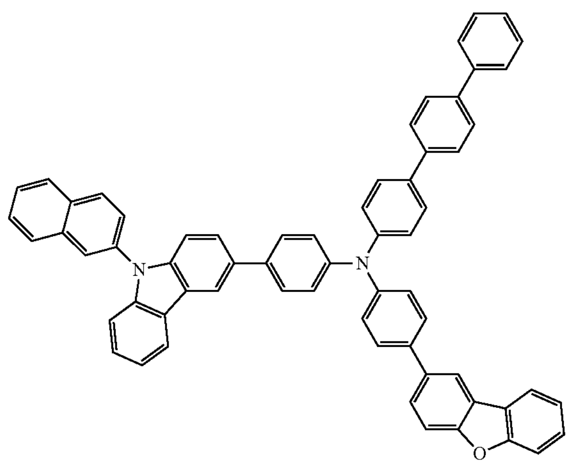
[A-205]
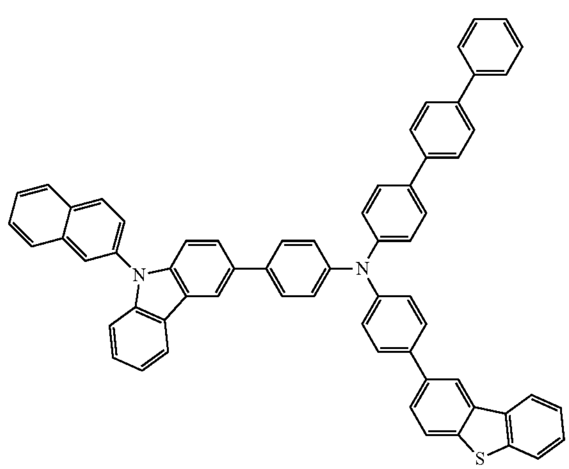
-continued
[A-206]
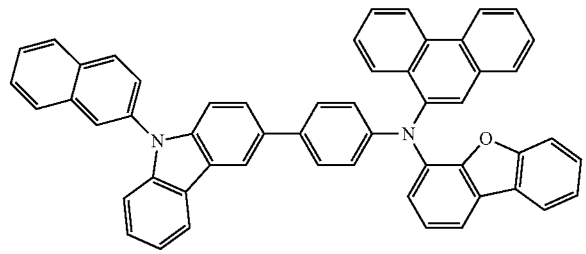
[A-207]
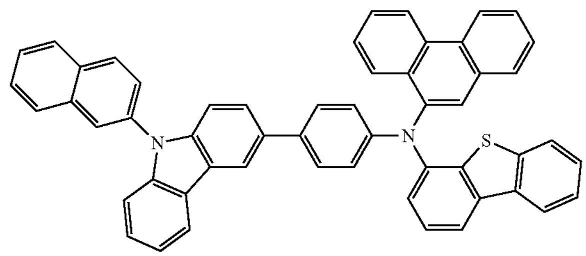
[A-208]
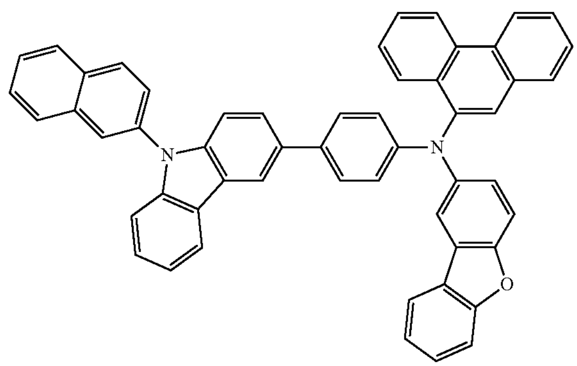
[A-209]
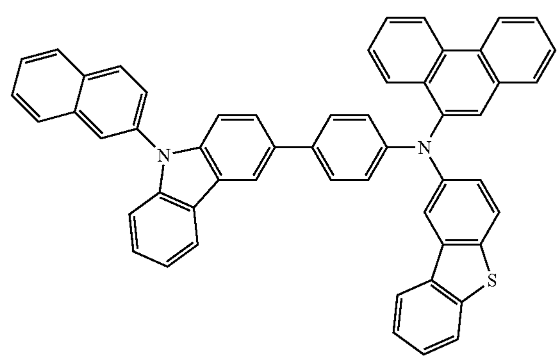
[A-210]
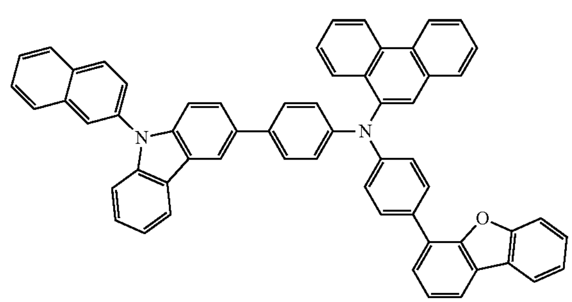

-continued
[A-211]
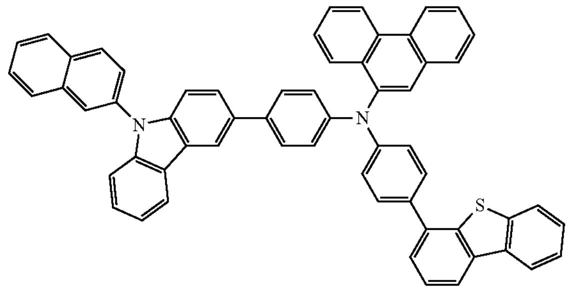
[A-212]
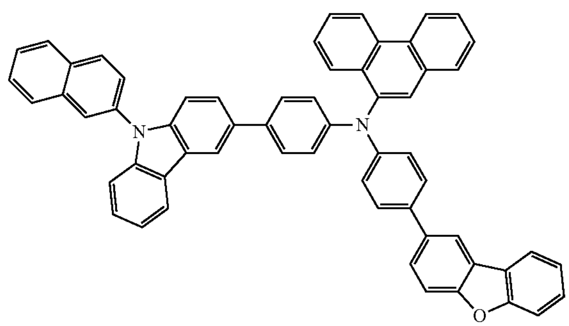
[A-213]
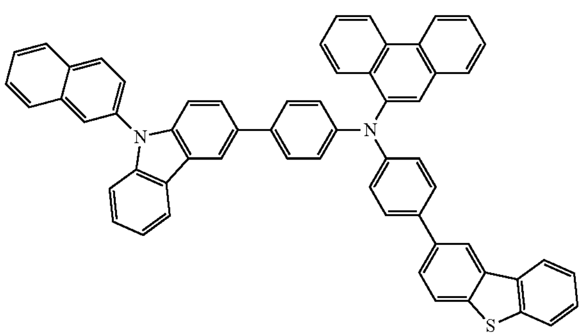
[A-214]
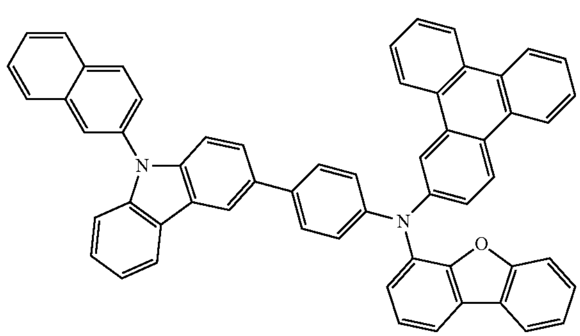
-continued
[A-215]
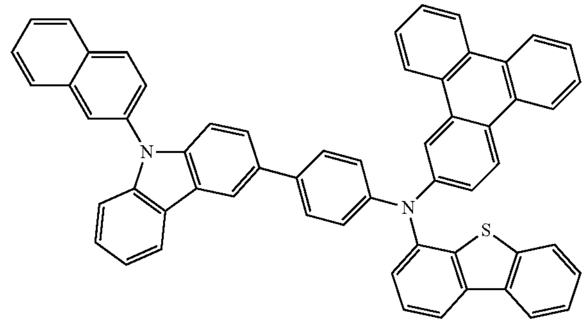
[A-216]
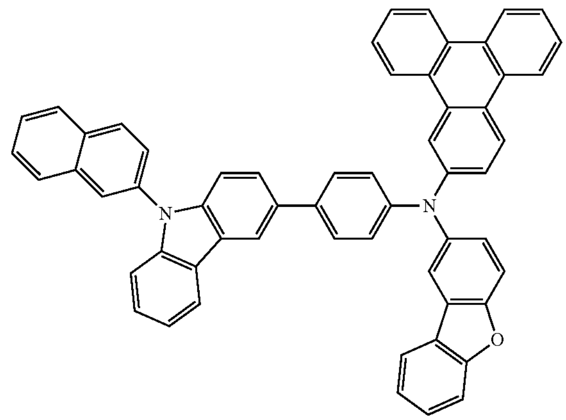
[A-217]
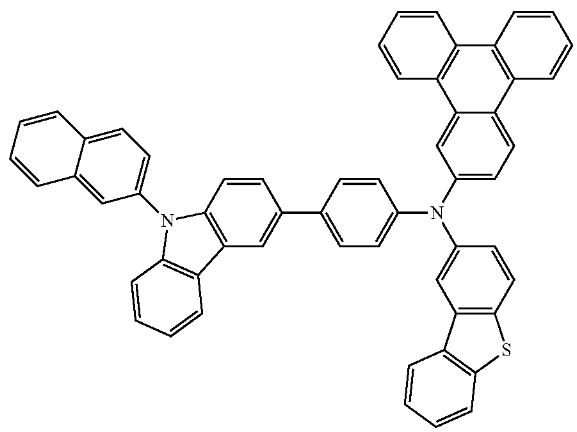
[A-218]
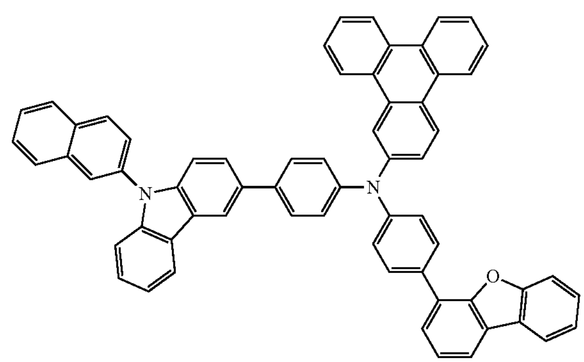

-continued
[A-219]
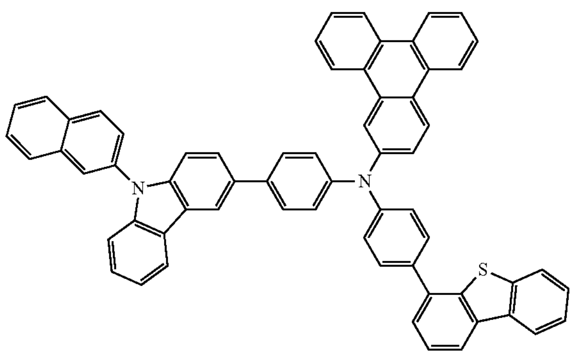
[A-220]
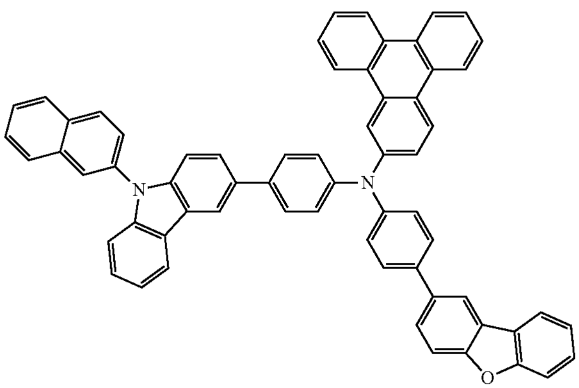
[A-221]
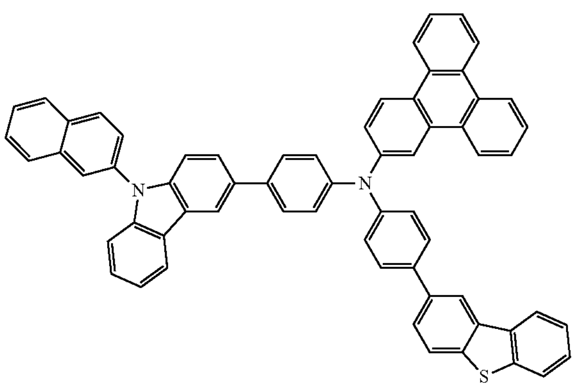
[A-222]
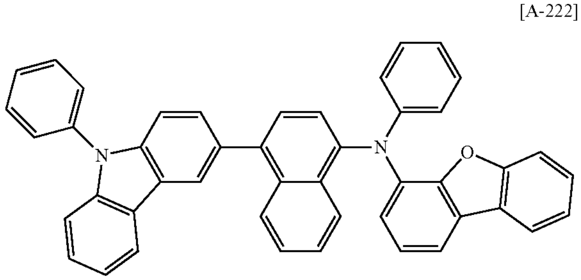
-continued
[A-223]
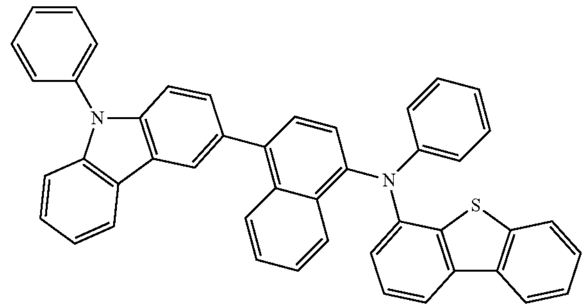
[A-224]
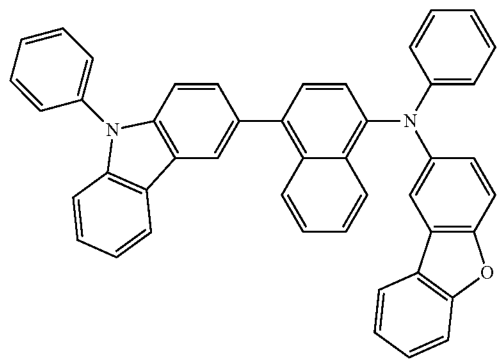
[A-225]
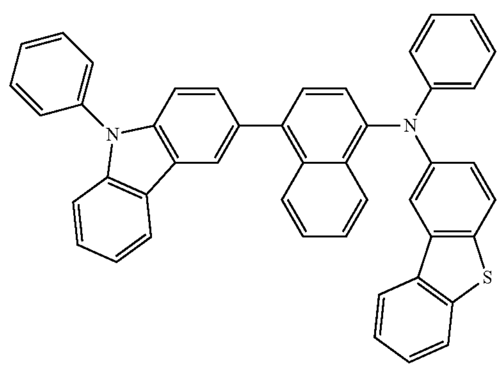
[A-226]
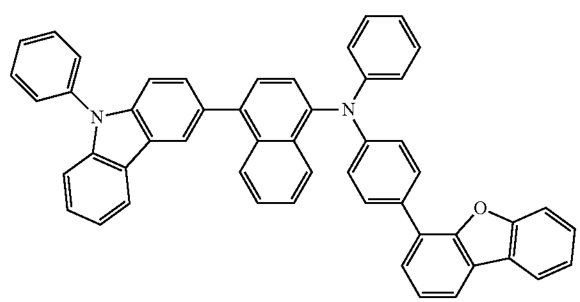

-continued
[A-227]
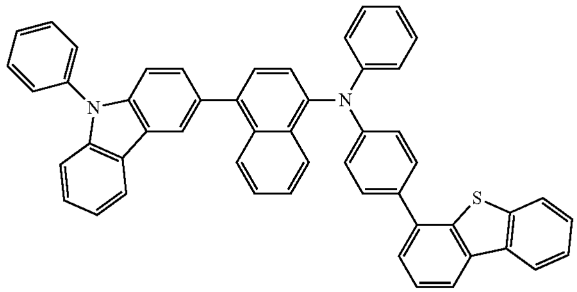
[A-228]
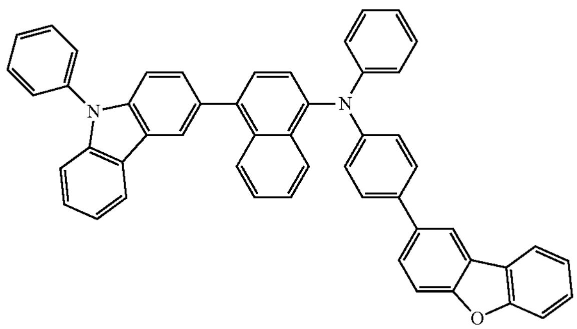
[A-229]
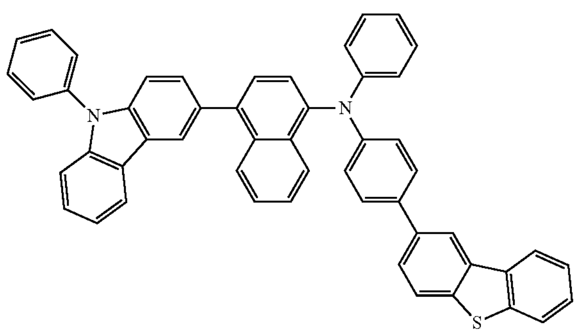
[A-230]
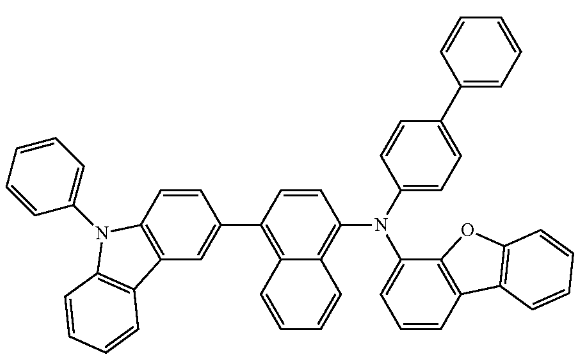
-continued
[A-231]
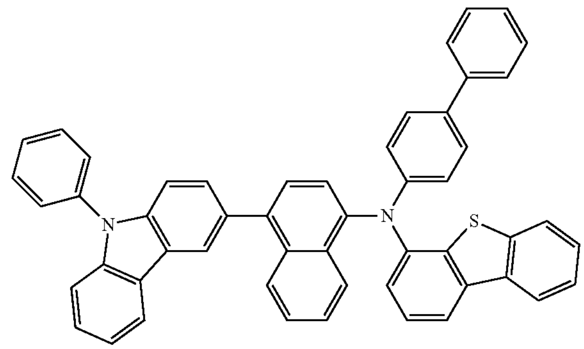
[A-232]
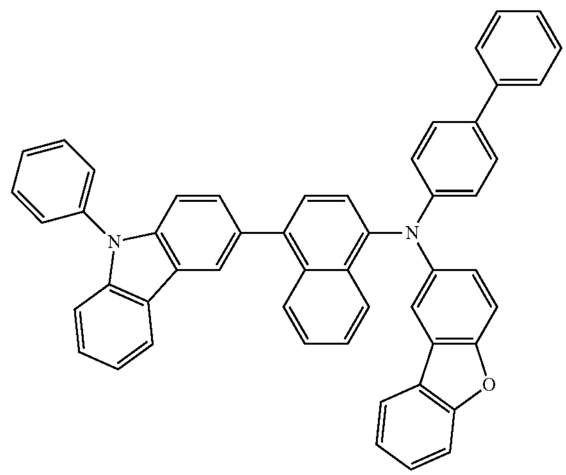
[A-233]
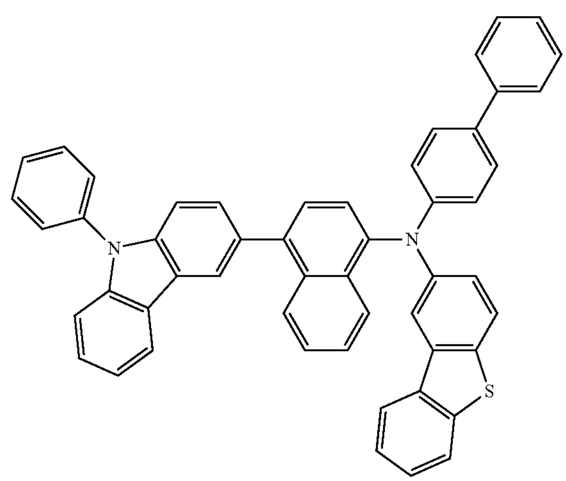

-continued
[A-234]
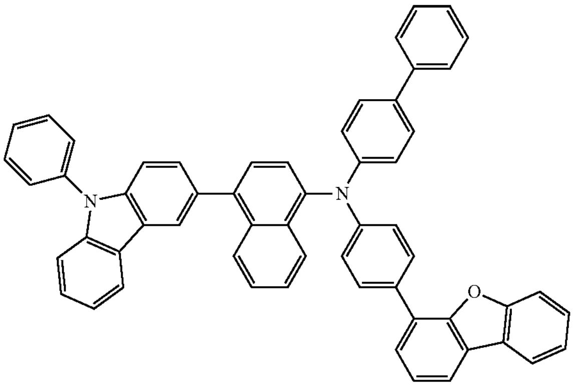
[A-235]
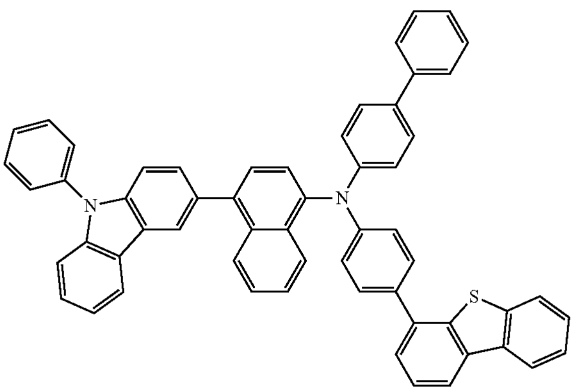
[A-236]
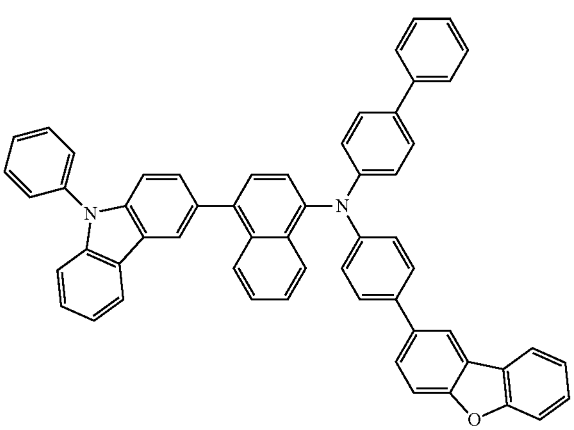
-continued
[A-237]
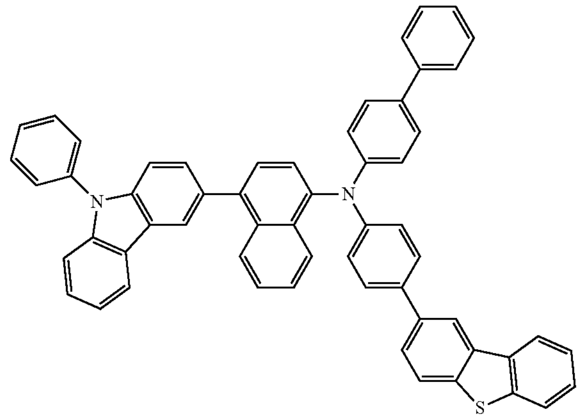
[A-238]
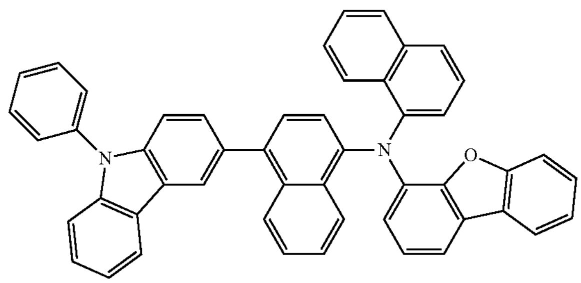
[A-239]
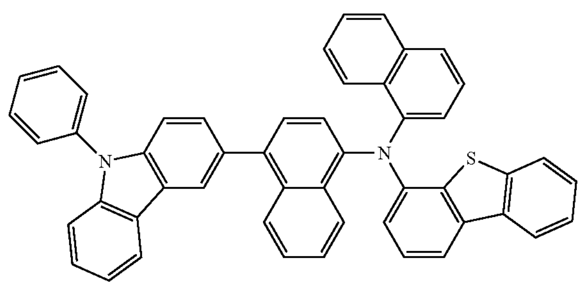
[A-240]
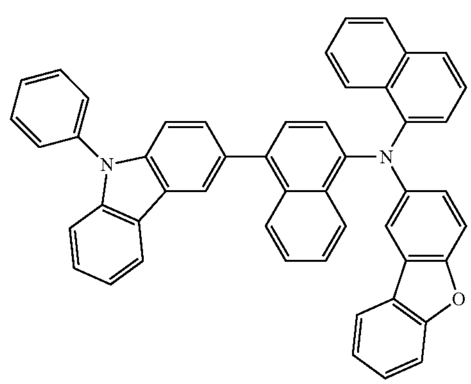

-continued
[A-241]
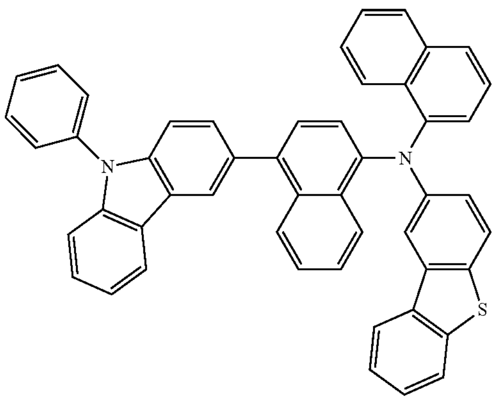
[A-242]
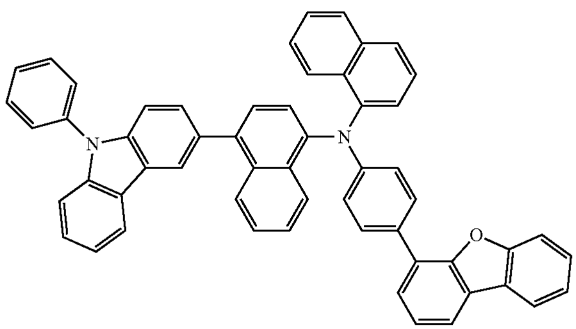
[A-243]
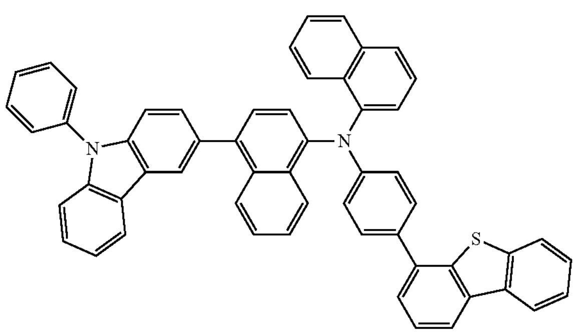
[A-244]
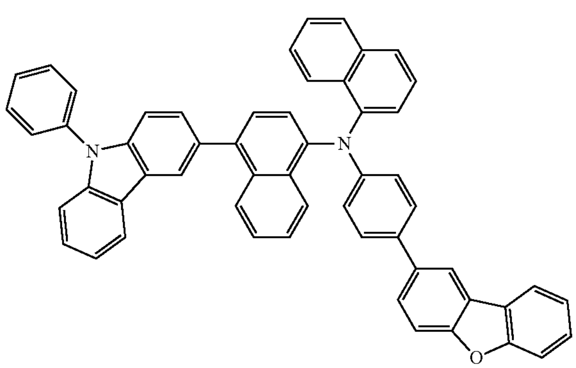
-continued
[A-245]
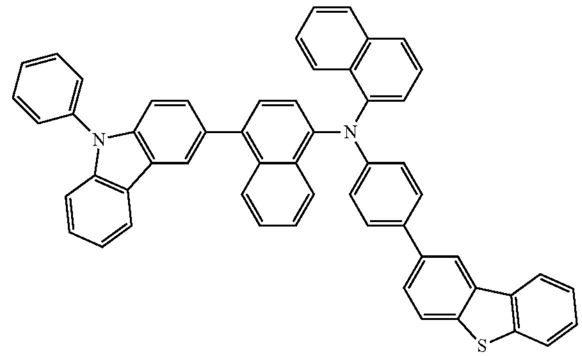
[A-246]
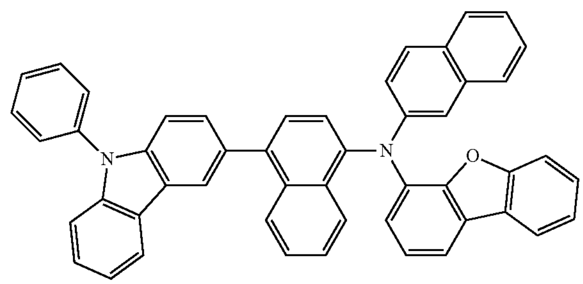
[A-247]
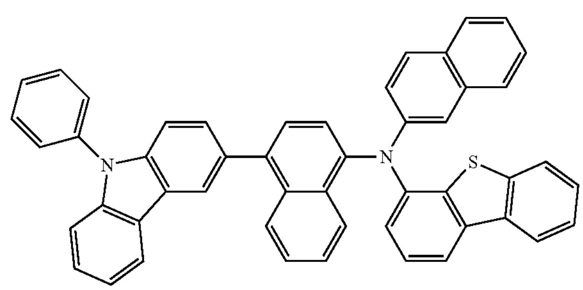
[A-248]
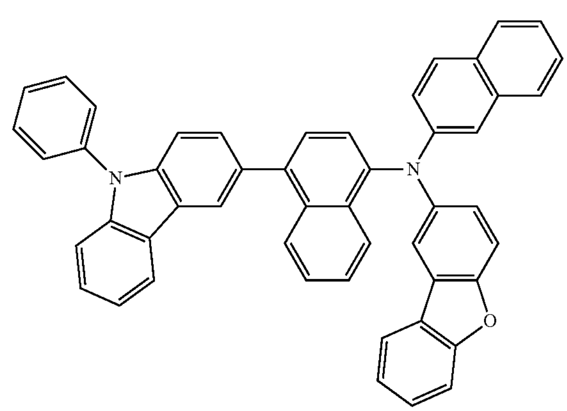

-continued
[A-249]
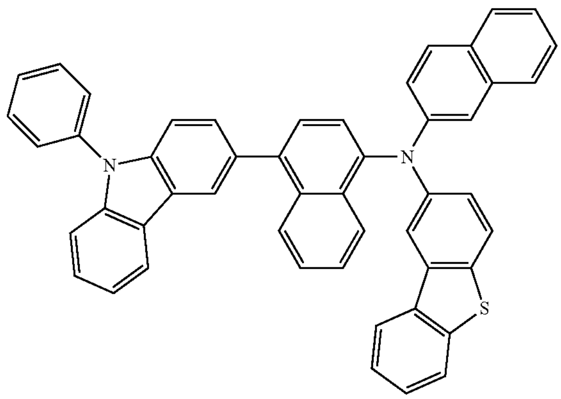
[A-250]
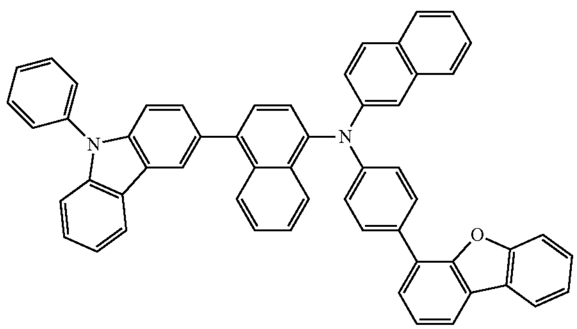
[A-251]
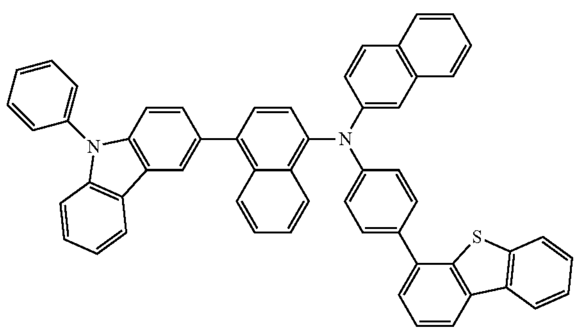
[A-252]
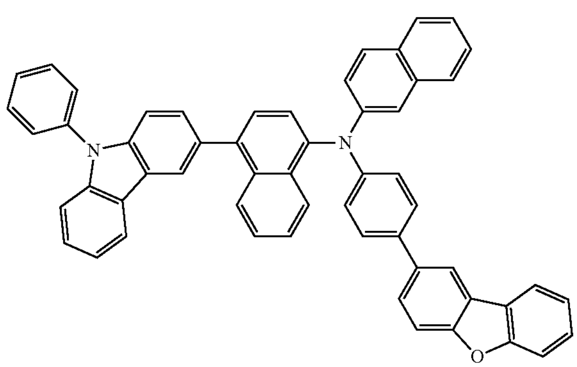
-continued
[A-253]
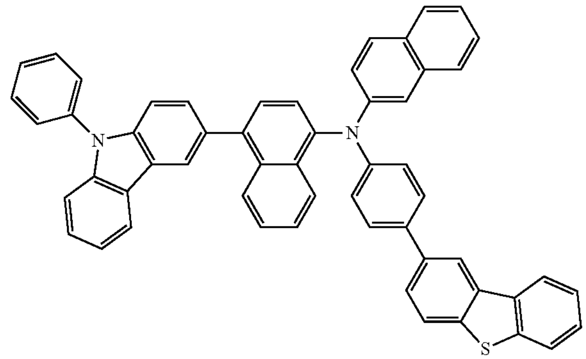
[A-254]
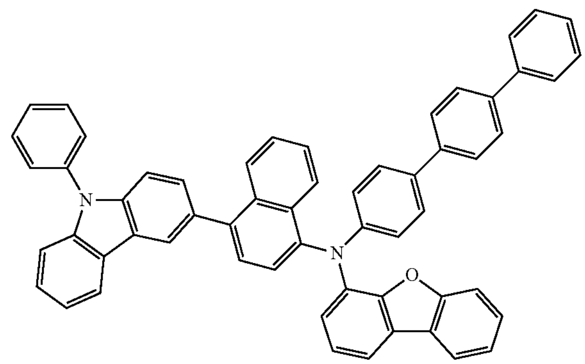
[A-255]
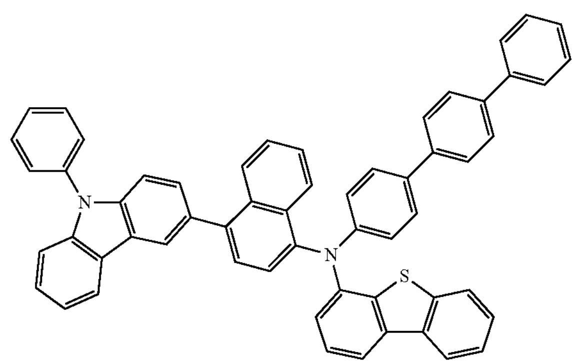
[A-256]
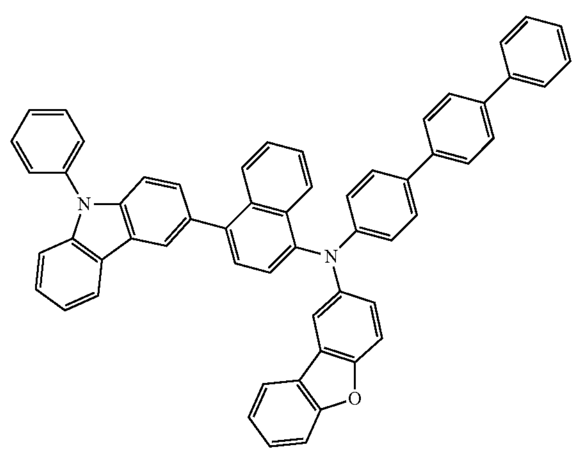

-continued
[A-257]
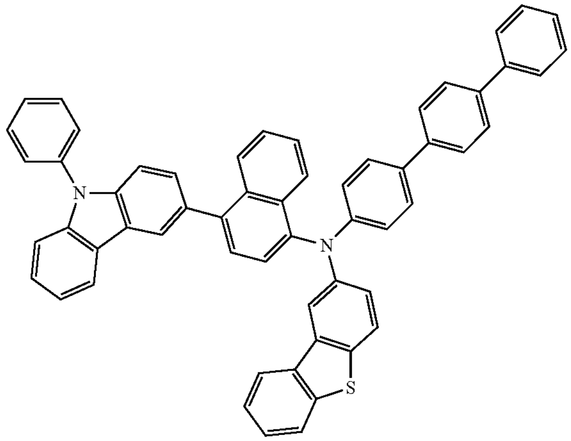
[A-258]
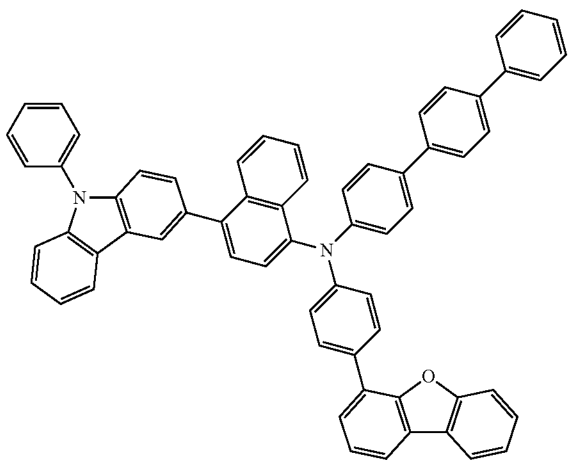
[A-259]
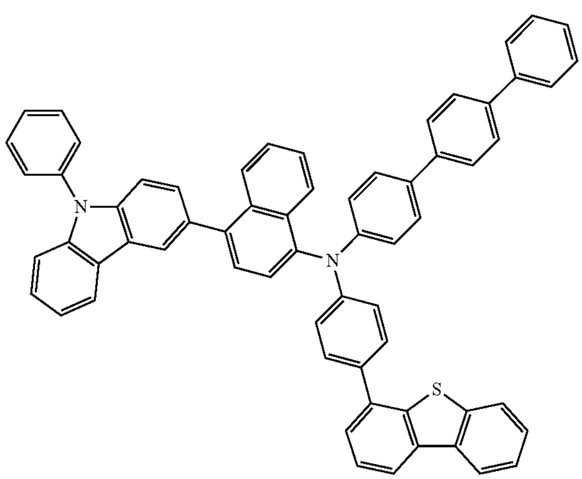
-continued
[A-260]
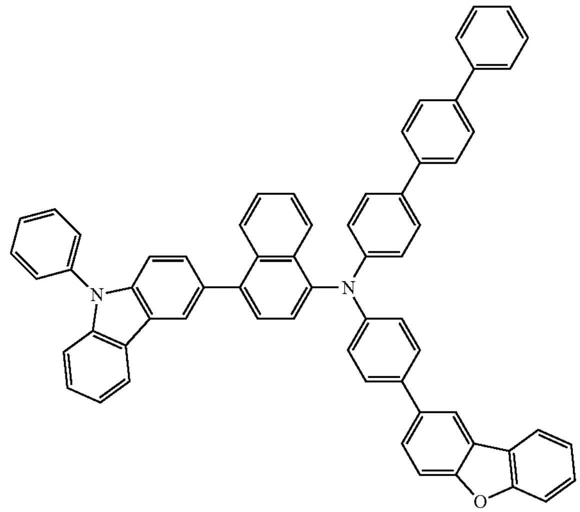
[A-261]
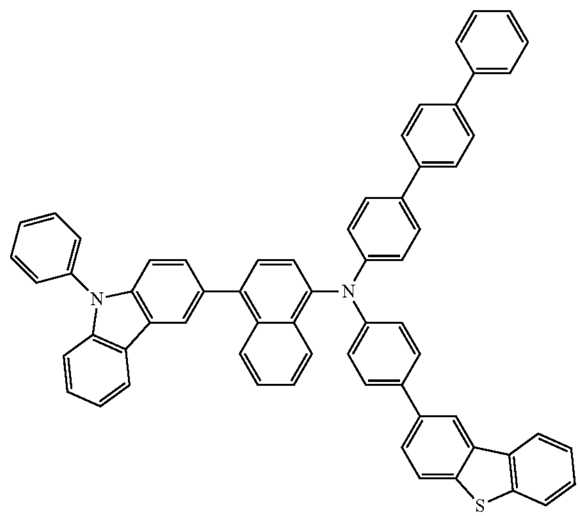
[A-262]
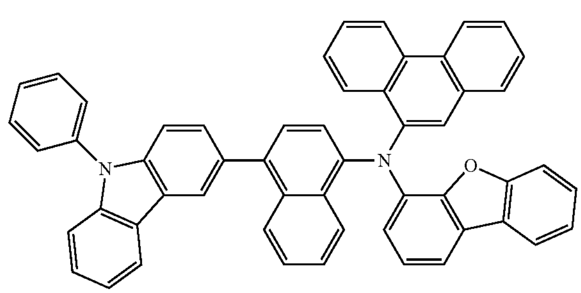

-continued
[A-263]
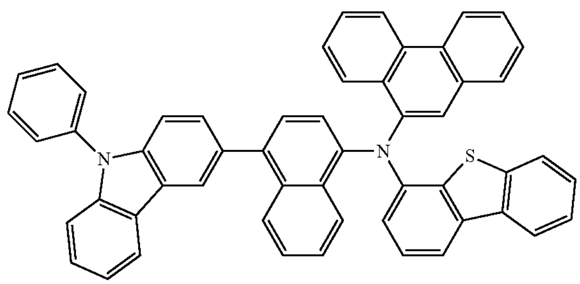
[A-264]
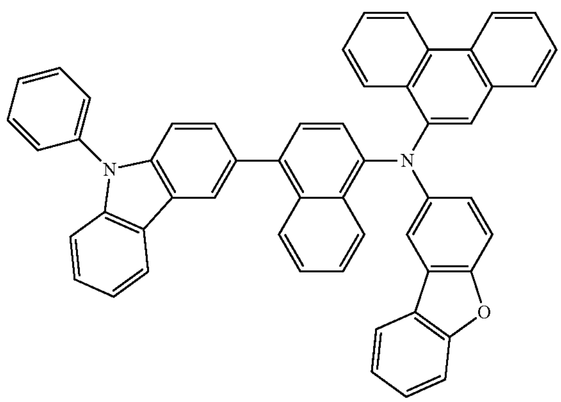
[A-265]
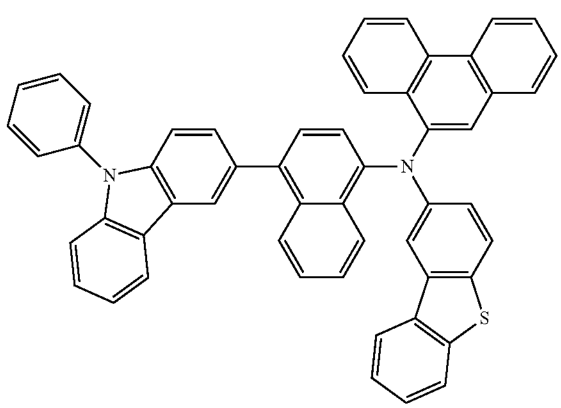
[A-266]
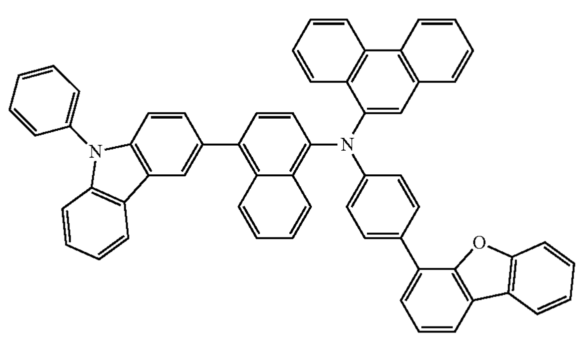
-continued
[A-267]
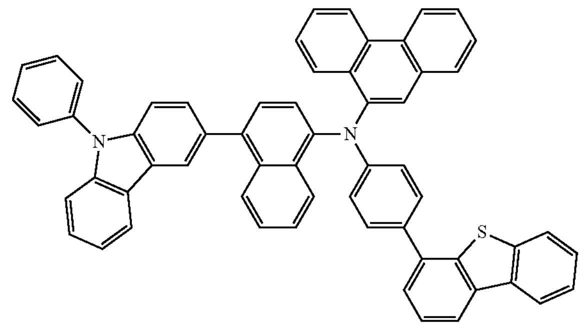
[A-268]
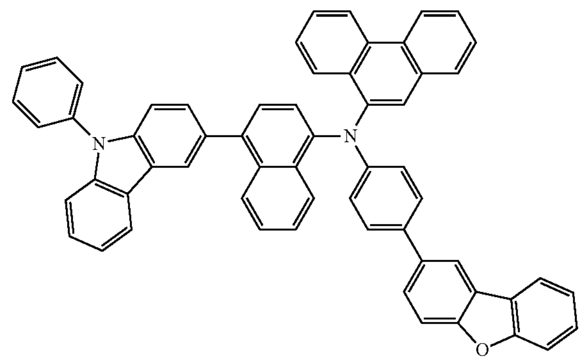
[A-269]
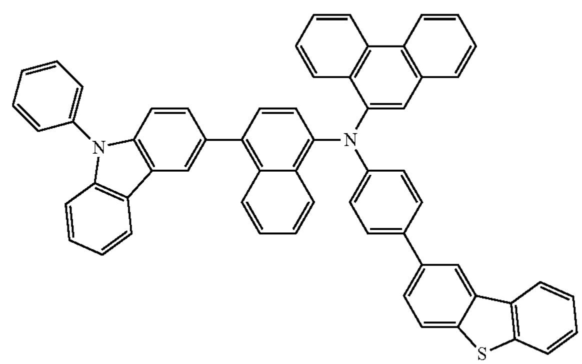
[A-270]
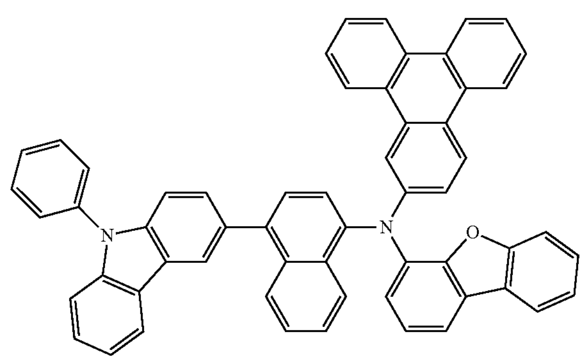

-continued
[A-271]
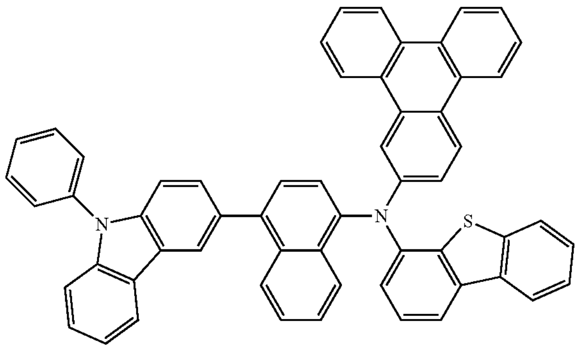
[A-272]
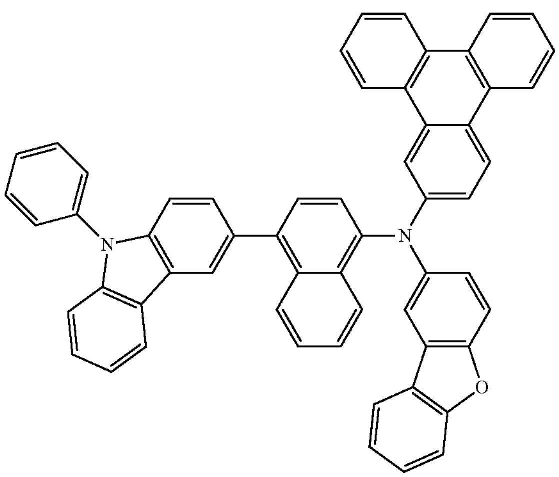
[A-273]
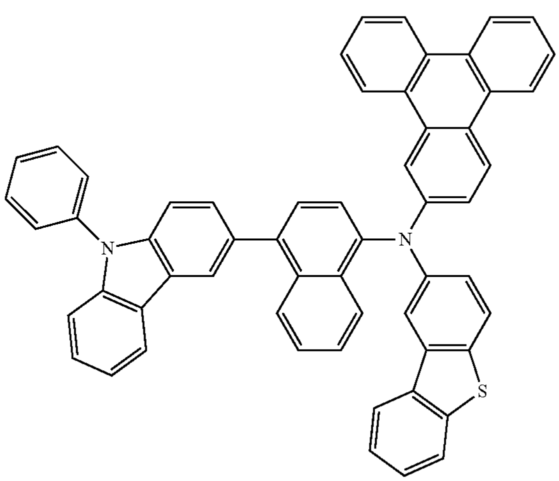
-continued
[A-274]
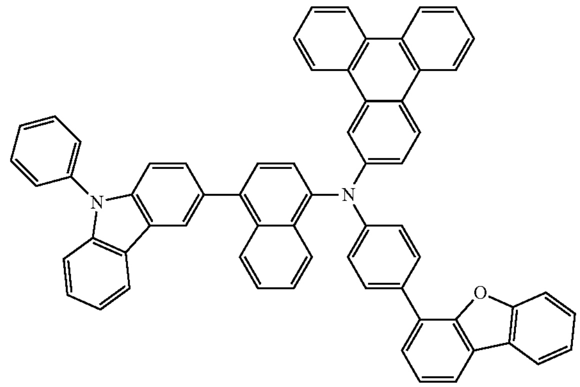
[A-275]
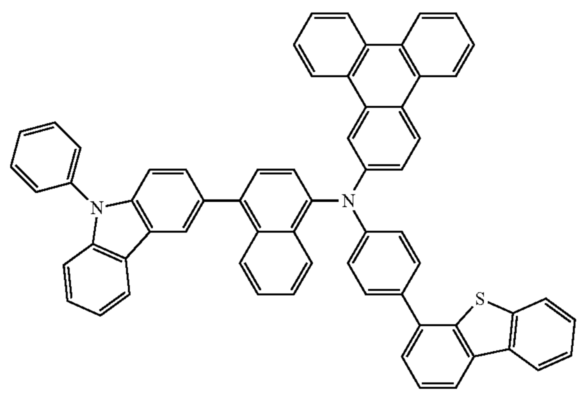
[A-276]
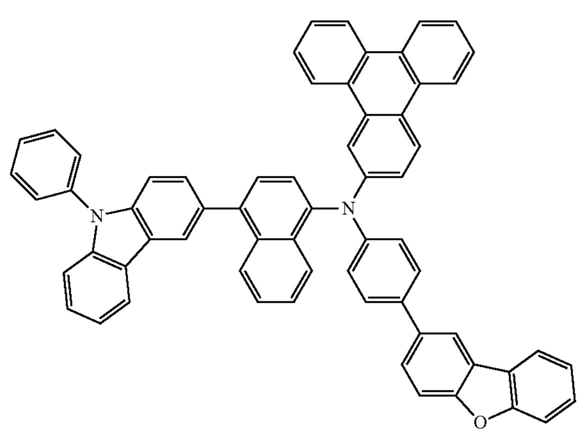

-continued
[A-277]
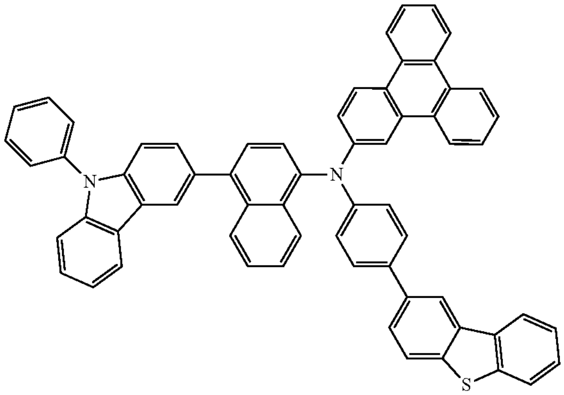
[A-278]
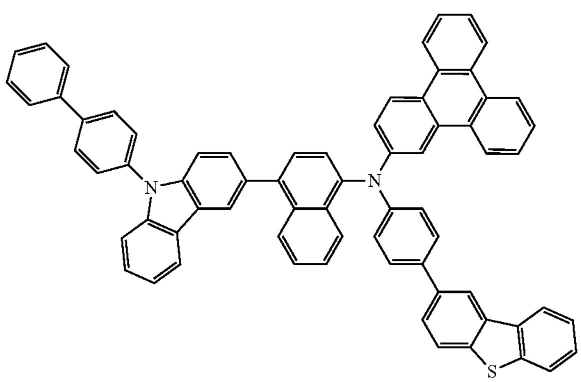
[A-279]
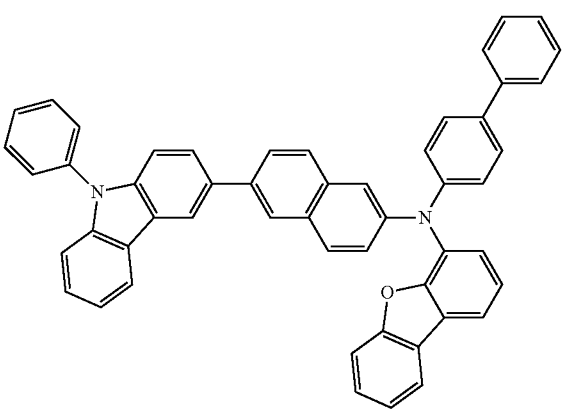
-continued
[A-280]
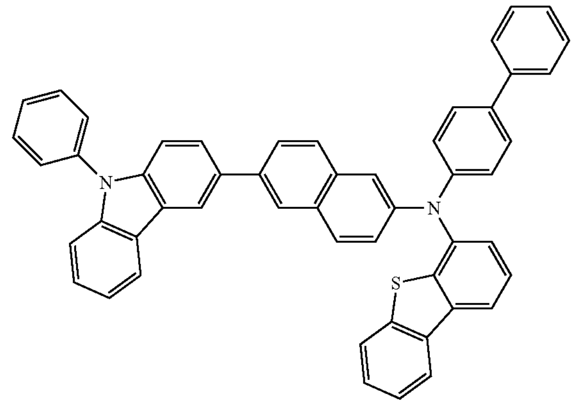
[A-281]
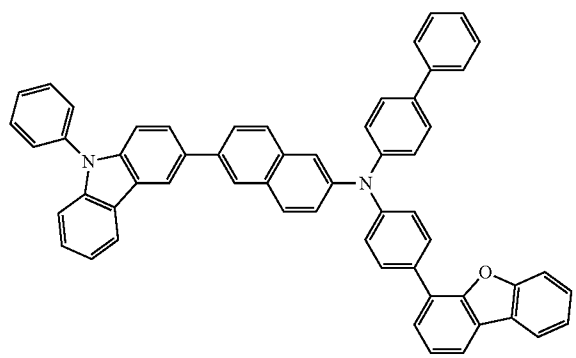
[A-282]
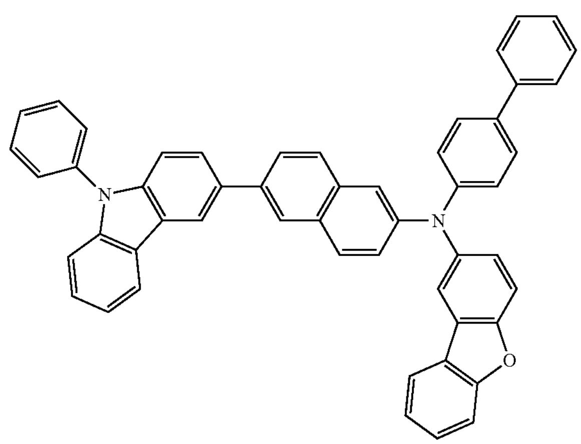

-continued
[A-283]
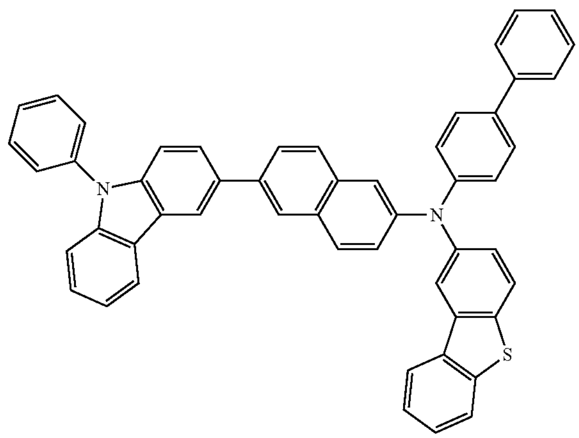
[A-284]
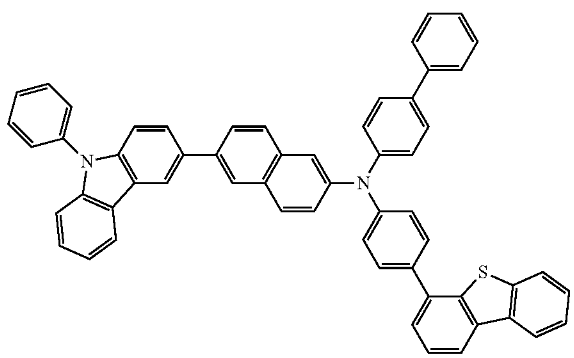
[A-285]
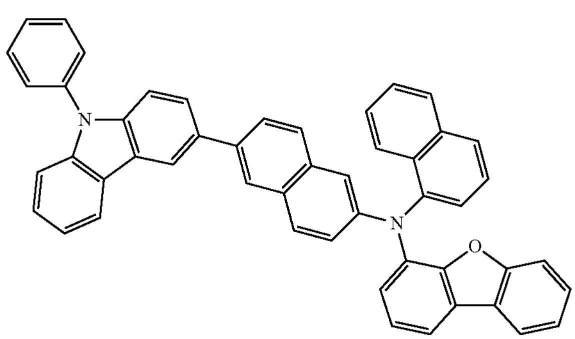
[A-286]
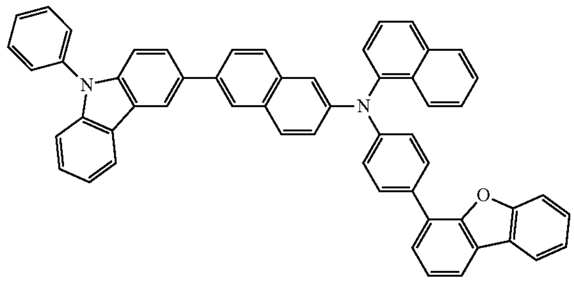
-continued
[A-287]
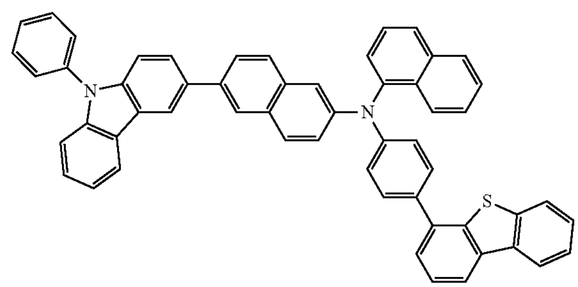
[A-288]
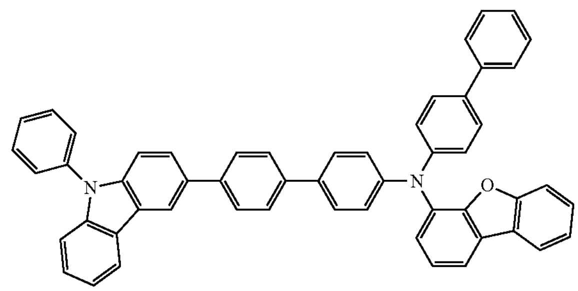
[A-289]
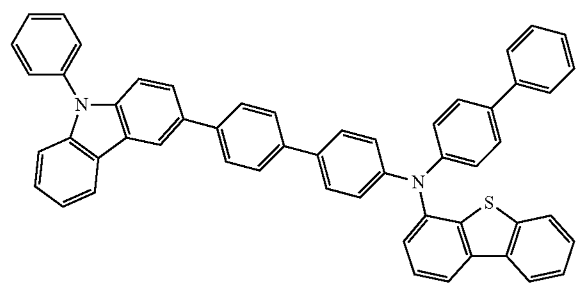
[A-290]
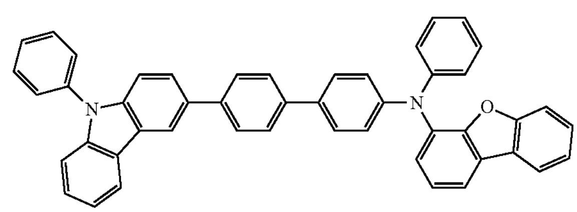
[A-291]
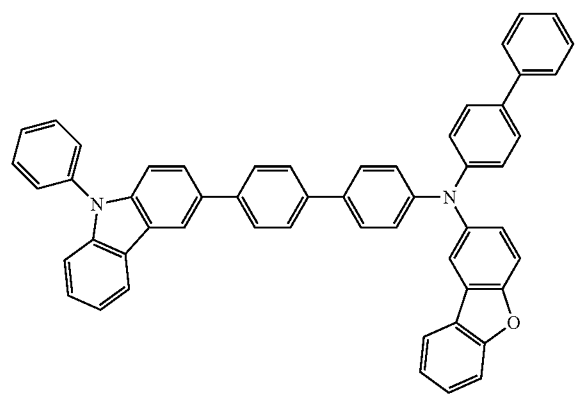

-continued
[A-292]
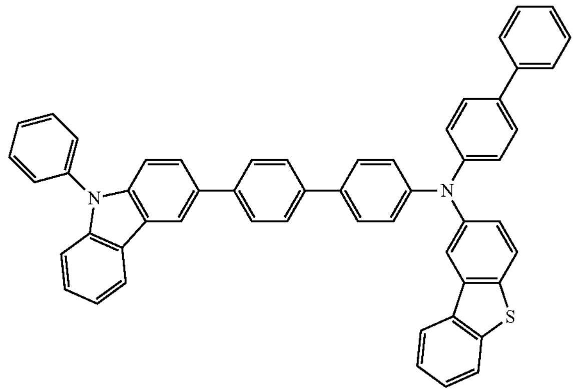
[A-293]
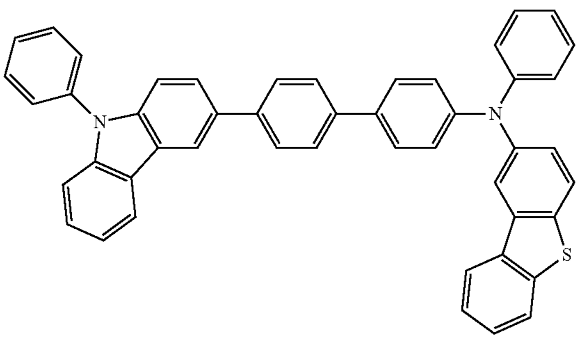
[A-294]
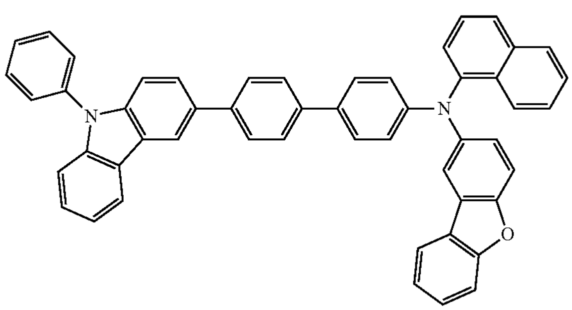
[A-295]
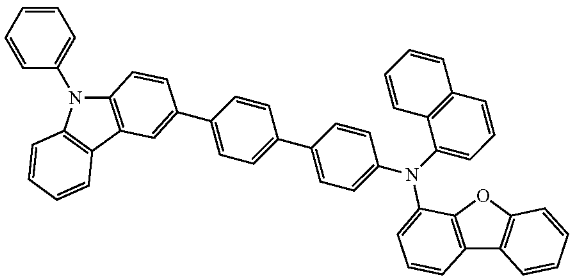
-continued
[A-296]
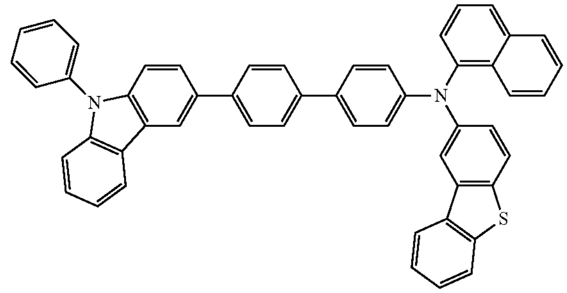
[A-297]
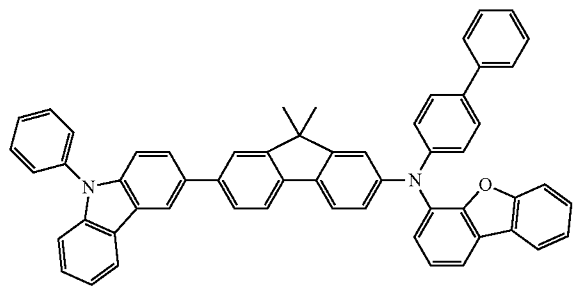
[A-298]
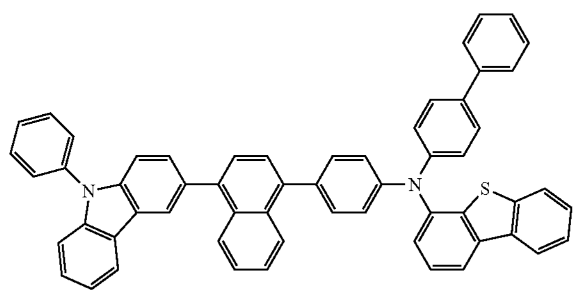
[A-299]
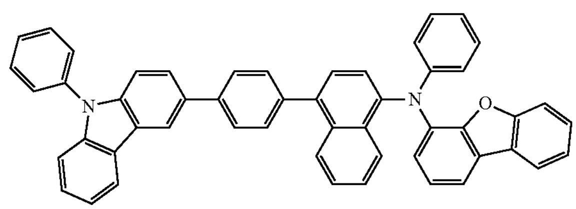
[A-300]
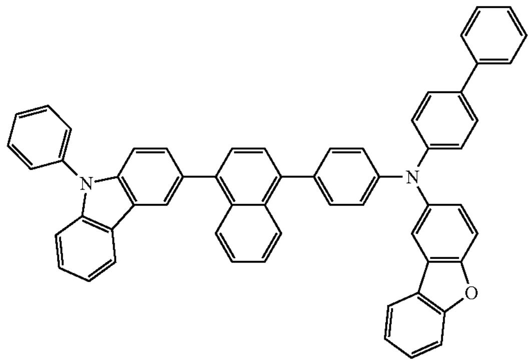

-continued
[A-301]
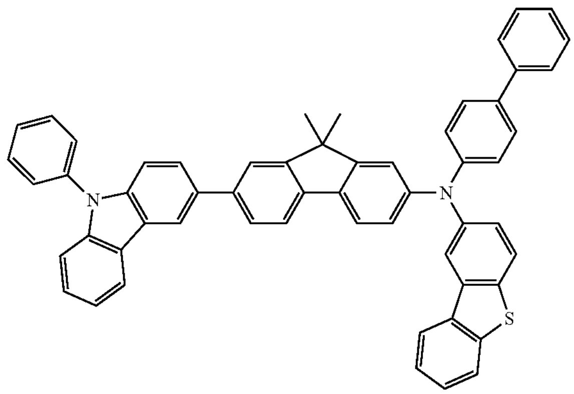
[A-302]
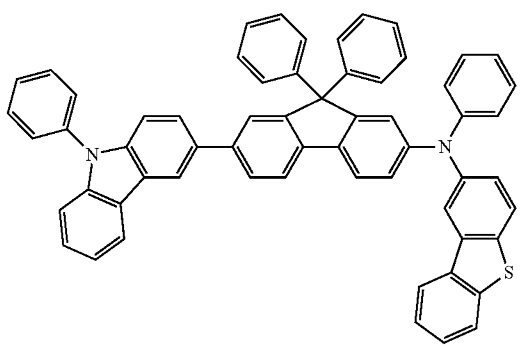
[A-303]
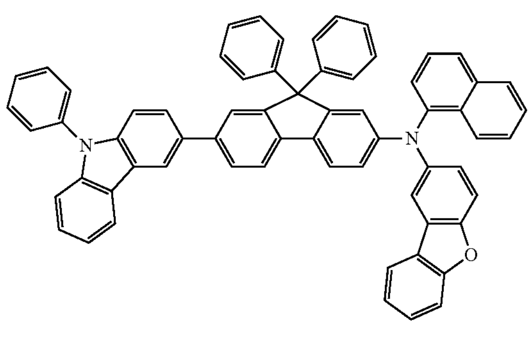
[A-304]
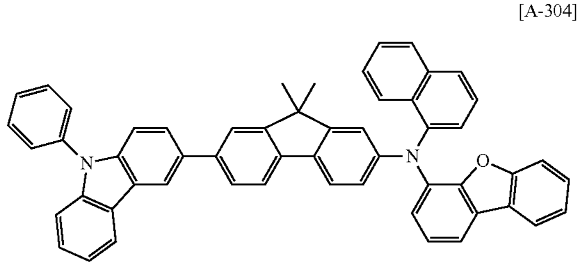
-continued
[A-305]
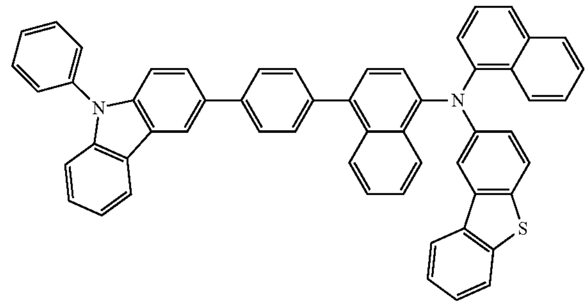
[A-414]
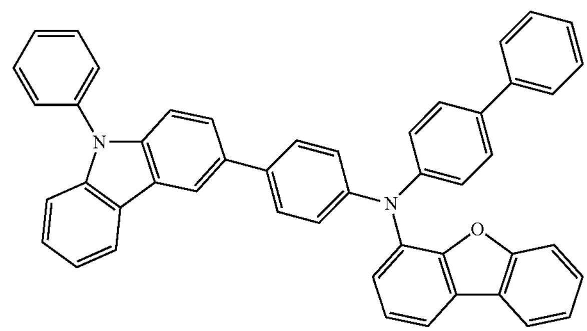
[A-415]
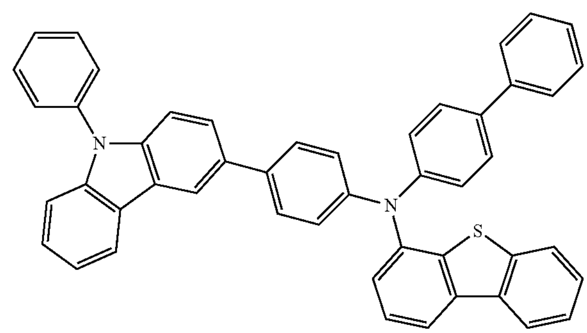
[A-416]
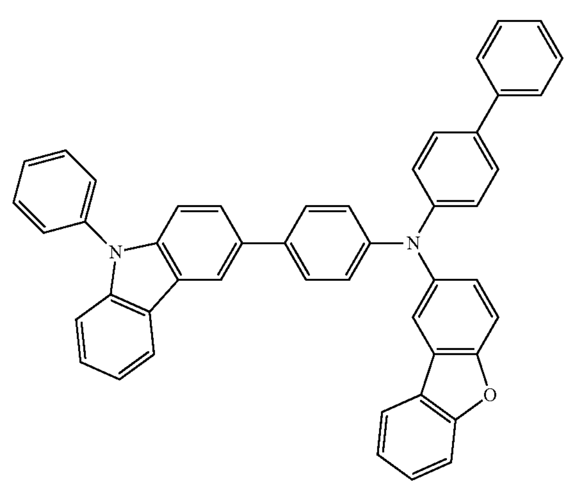

-continued
[A-457]
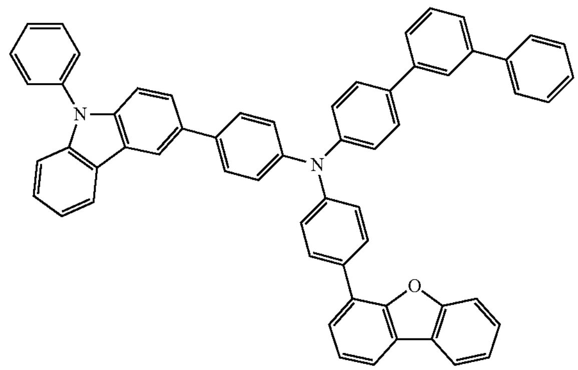
[A-458]
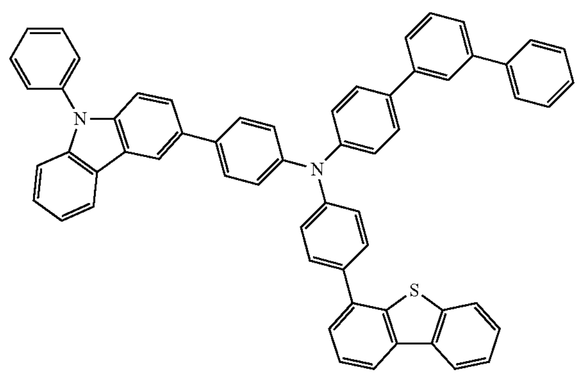
[A-469]
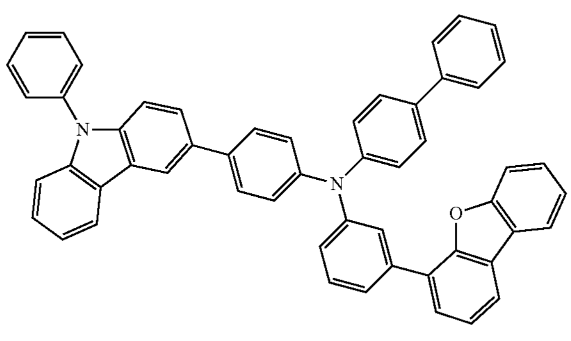
[A-470]
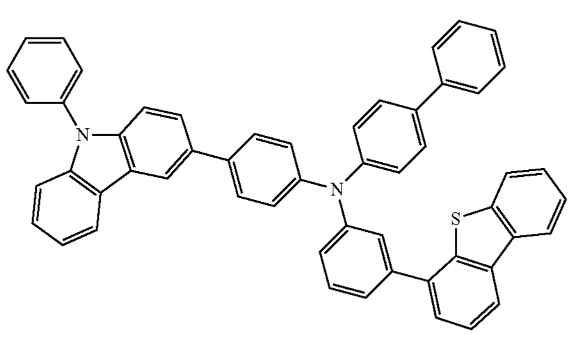
-continued
[A-471]
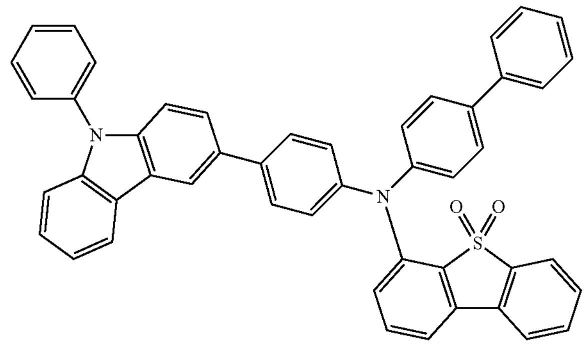
[A-472]
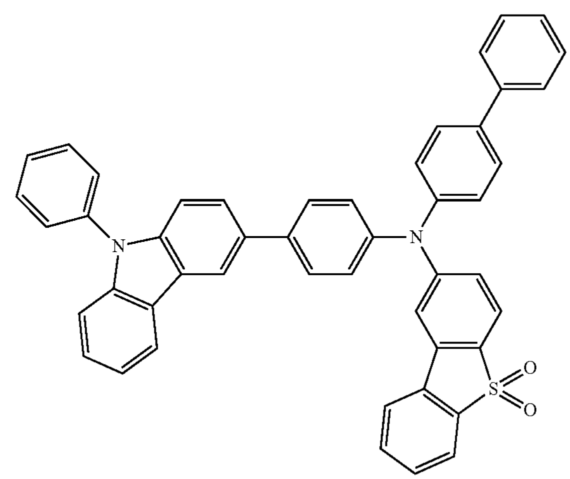
[A-473]
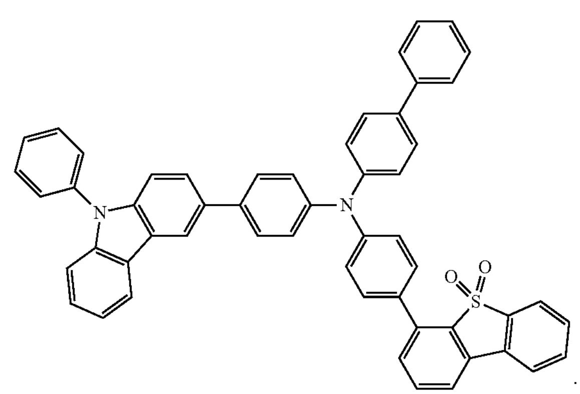
11. The compound as claimed in claim 1, wherein the compound being represented by one of the following Chemical Formulae A-417 to A-456, or A-459 to A-468:

[A-417]
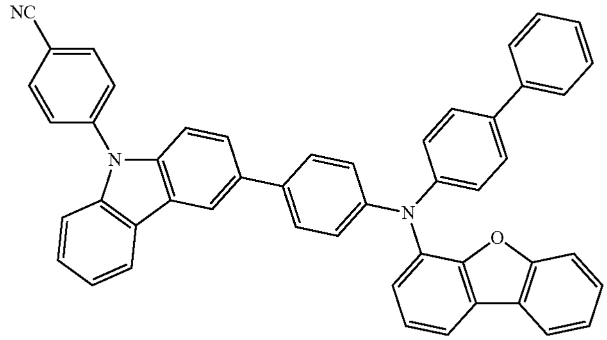
[A-418]
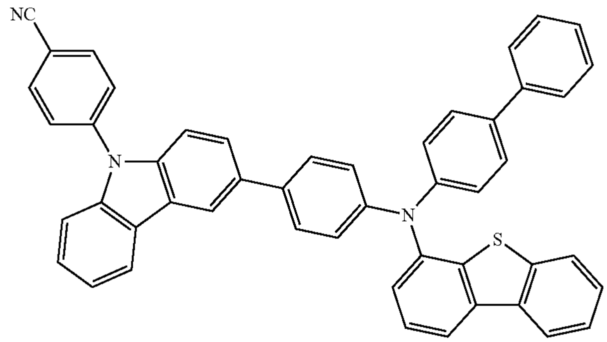
[A-419]
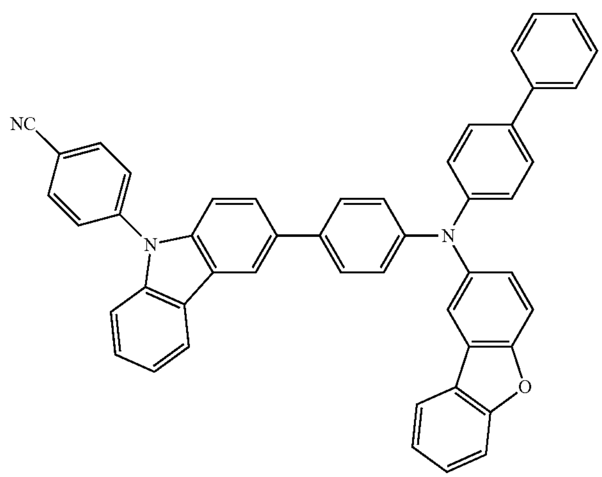
[A-420]
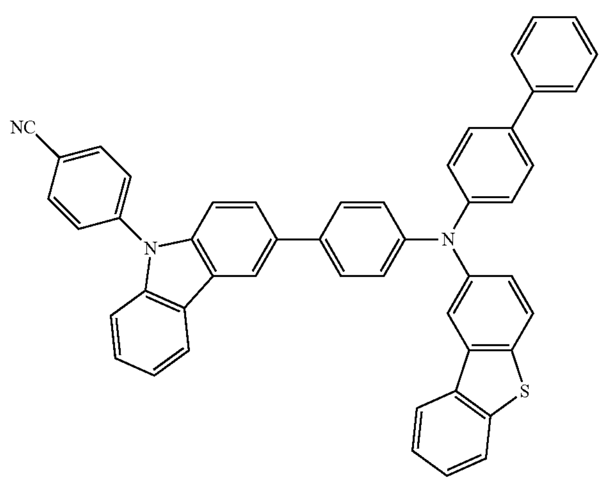

-continued
[A-421]
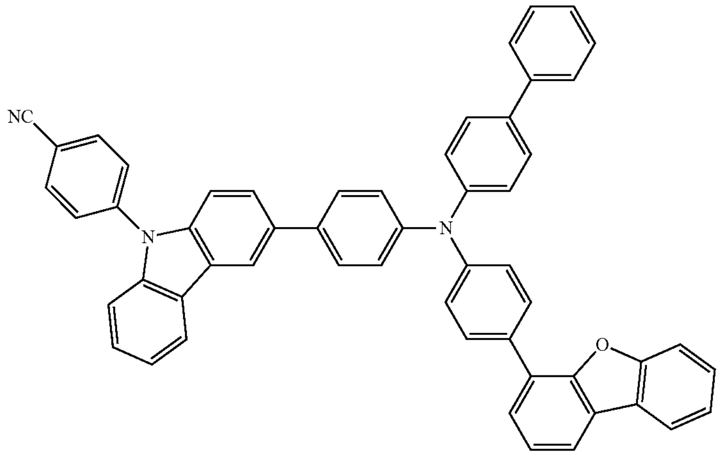
[A-422]
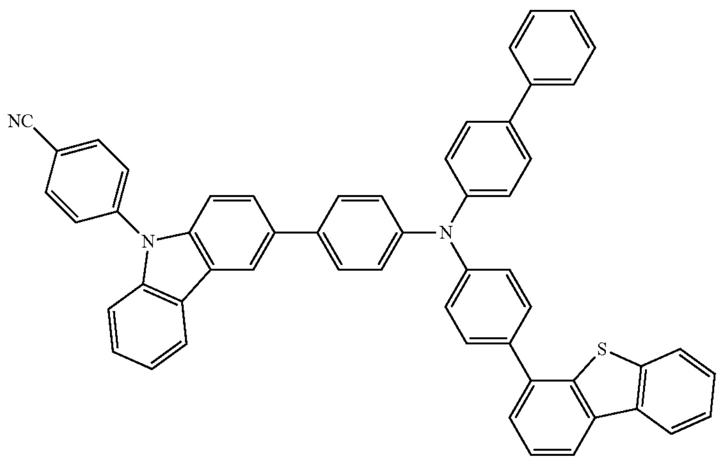
[A-423]
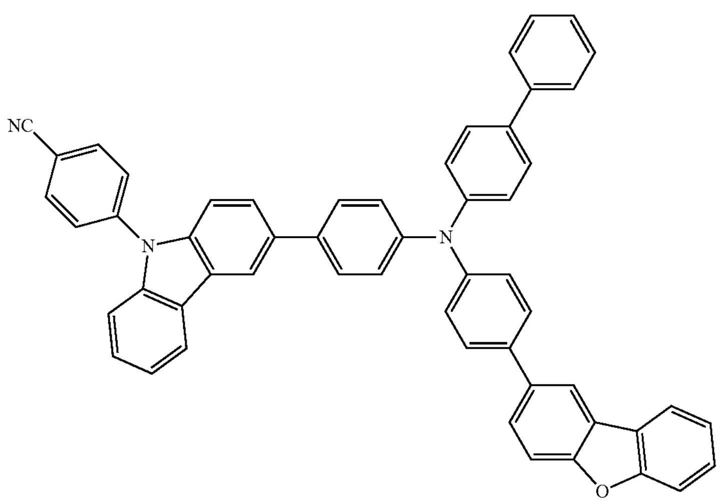

-continued
[A-424]
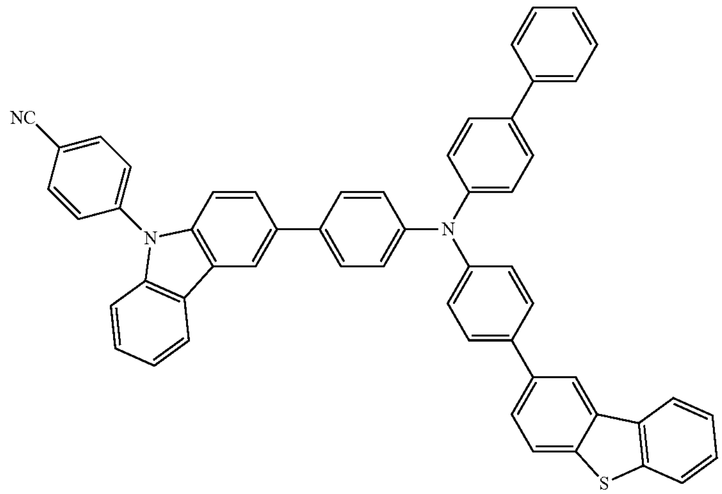
[A-425]
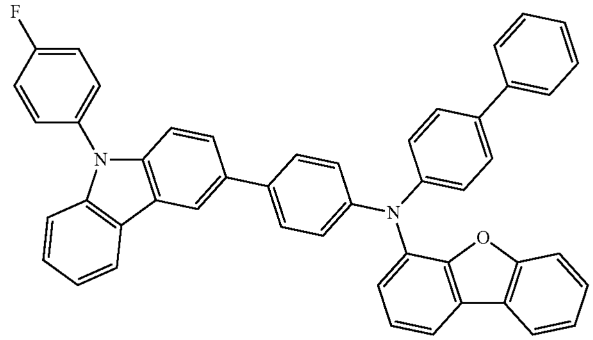
[A-426]
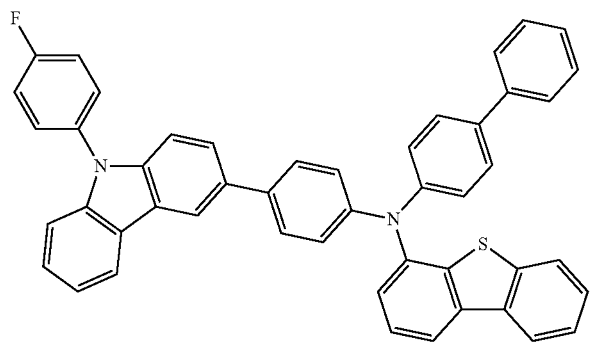
[A-427]
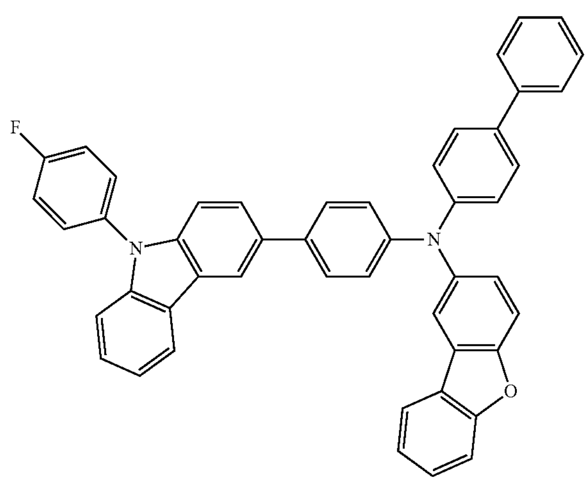

-continued
[A-428]
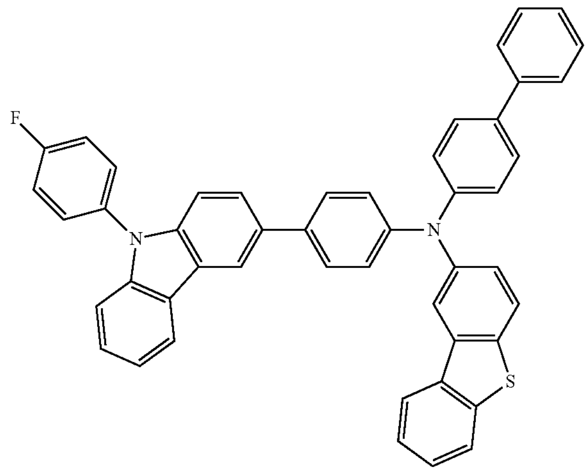
[A-429]
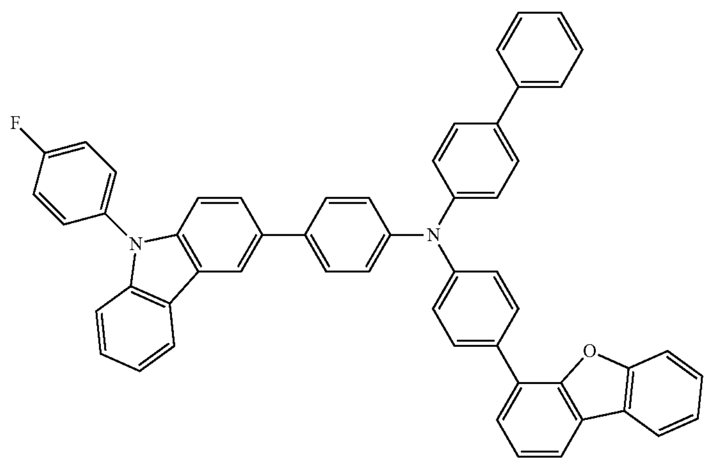
[A-430]
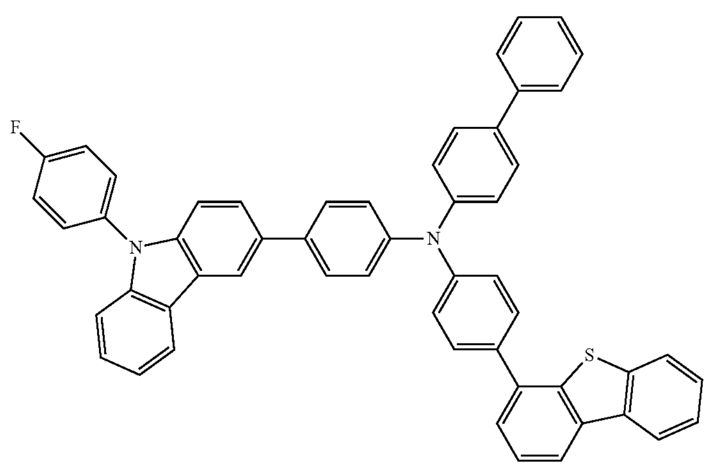

-continued
[A-431]
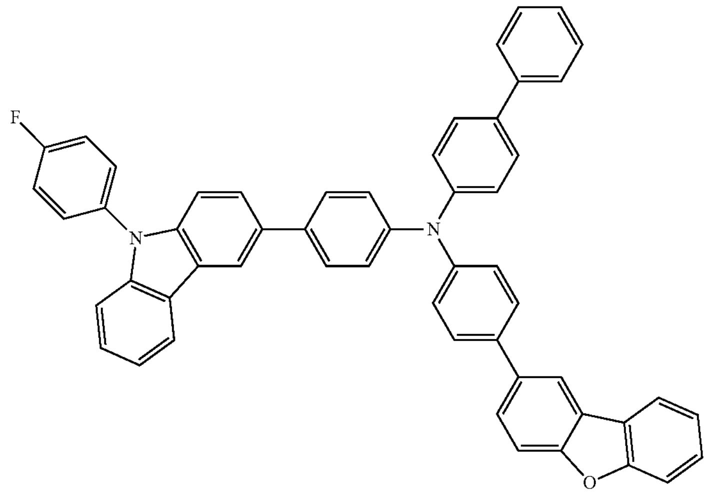
[A-432]
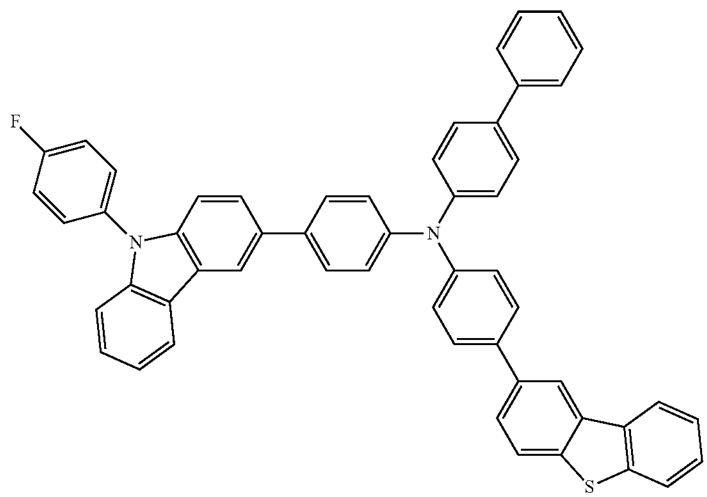
[A-433]
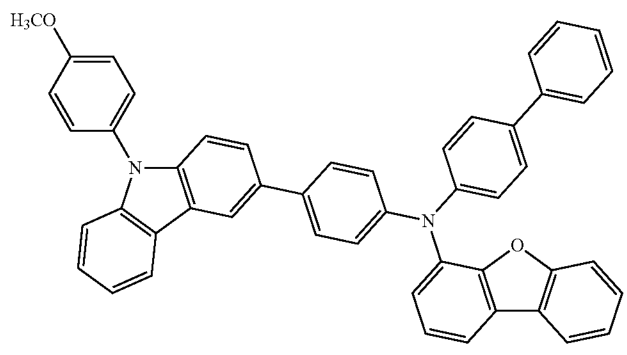

-continued
[A-434]
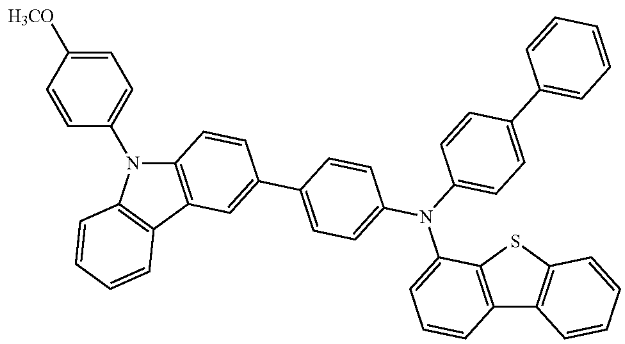
[A-435]
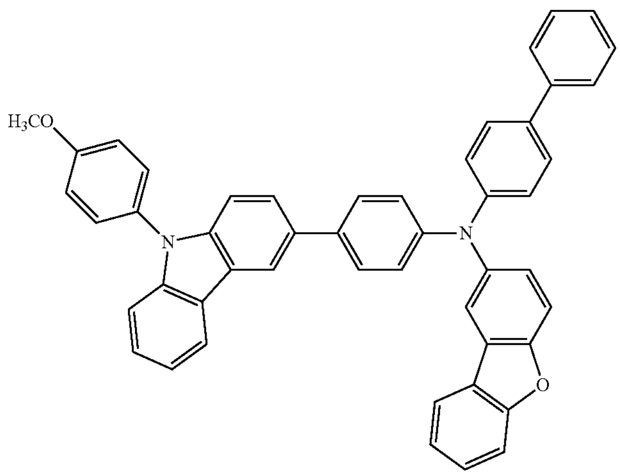
[A-436]
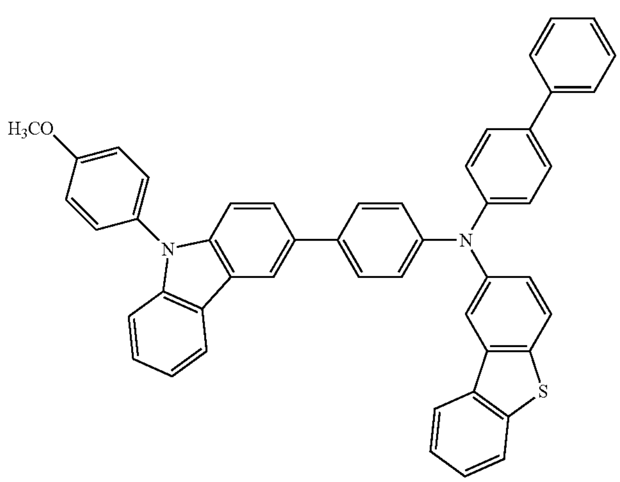

-continued
[A-437]
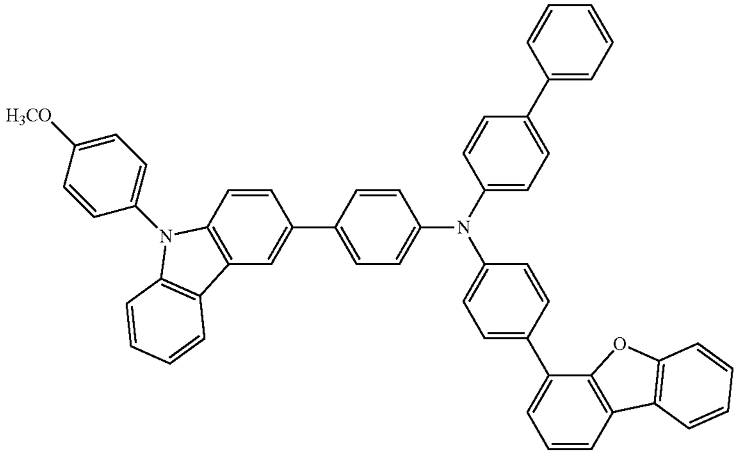
[A-438]
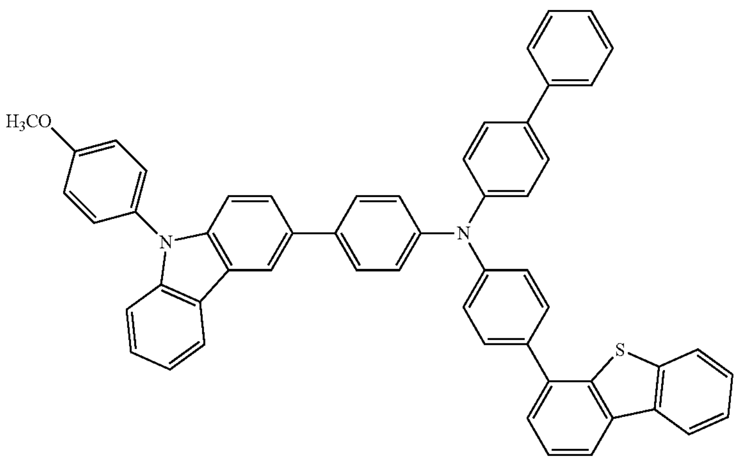
[A-439]
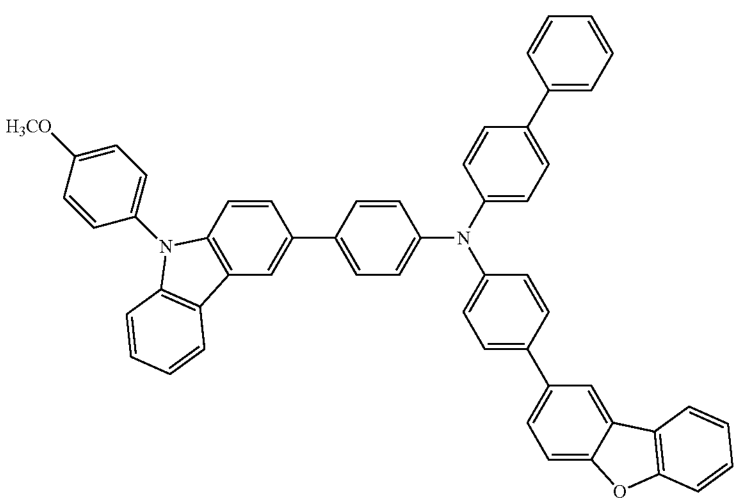

-continued
[A-440]
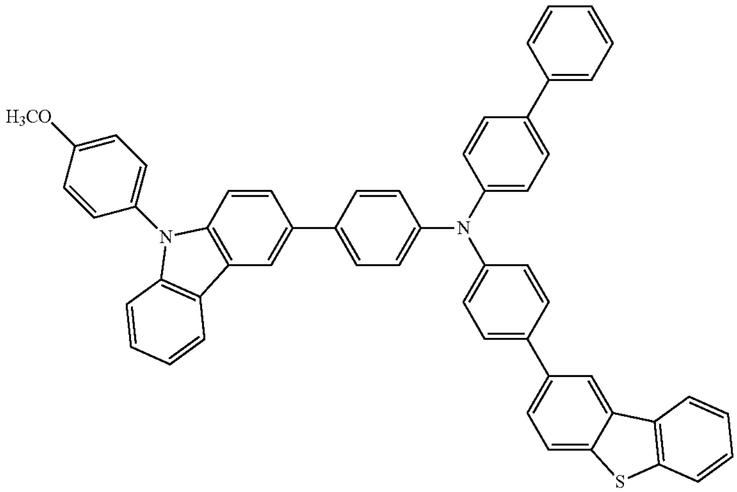
[A-441]
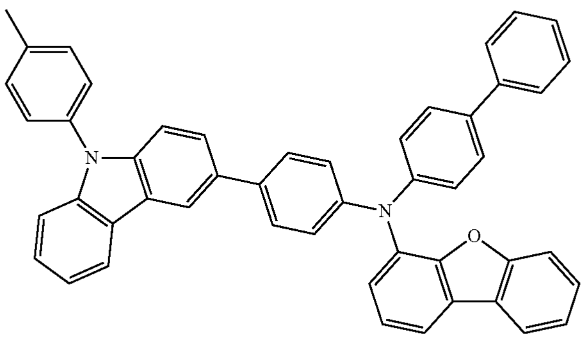
[A-442]
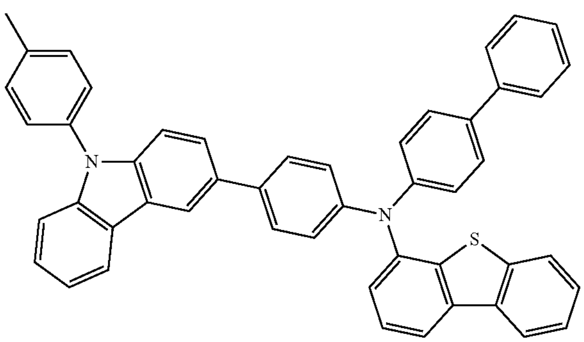
[A-443]
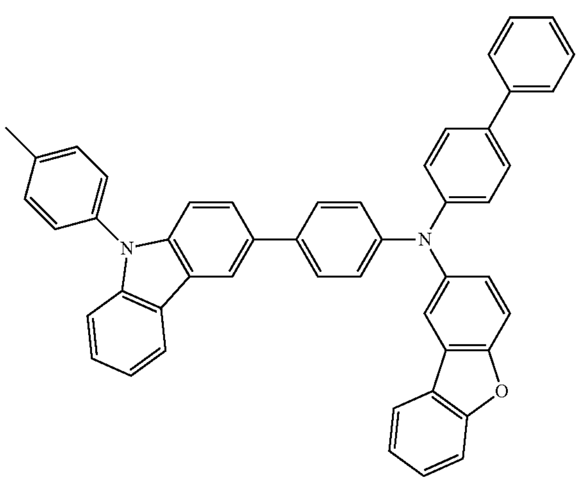

-continued
[A-444]
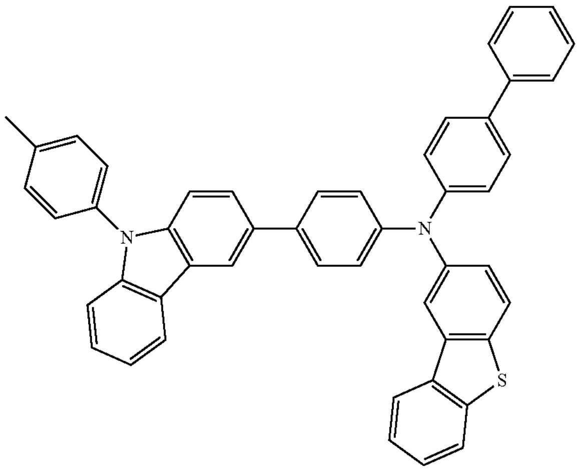
[A-445]
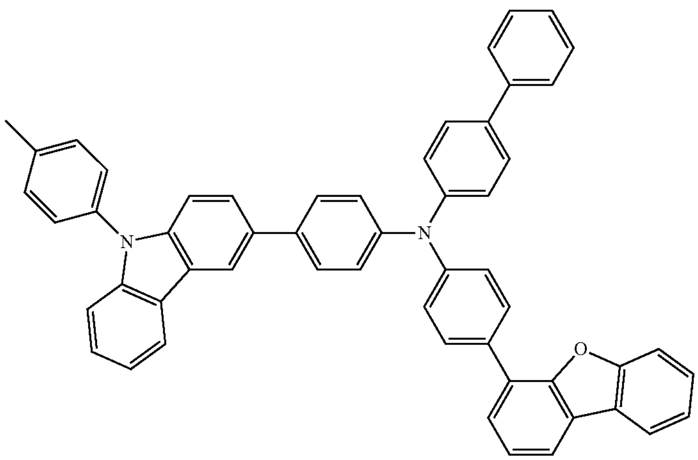
[A-446]
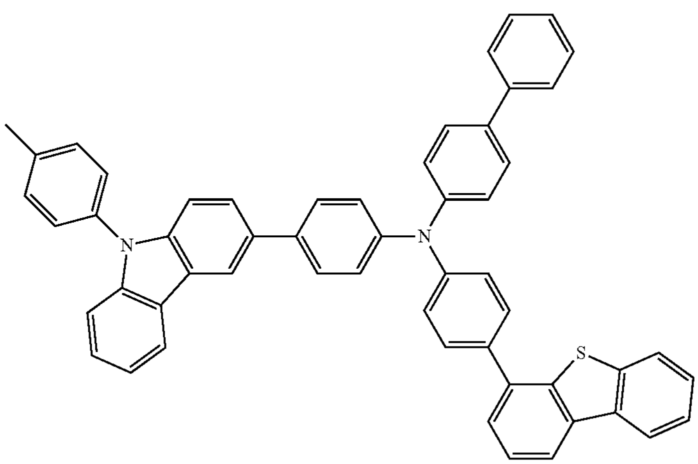

-continued
[A-447]
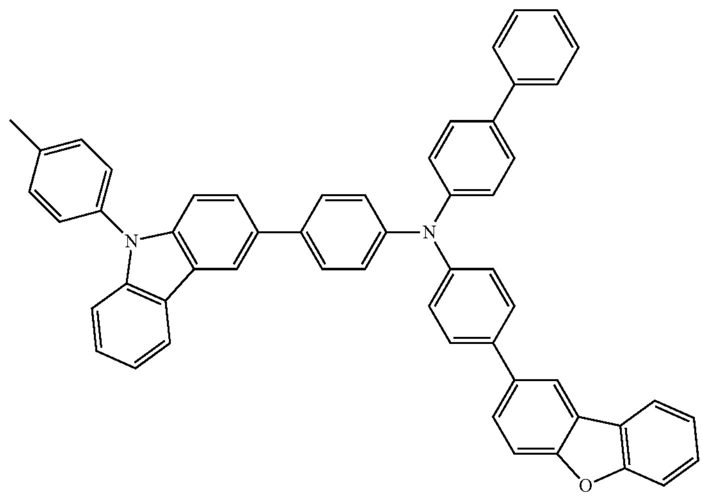
[A-448]
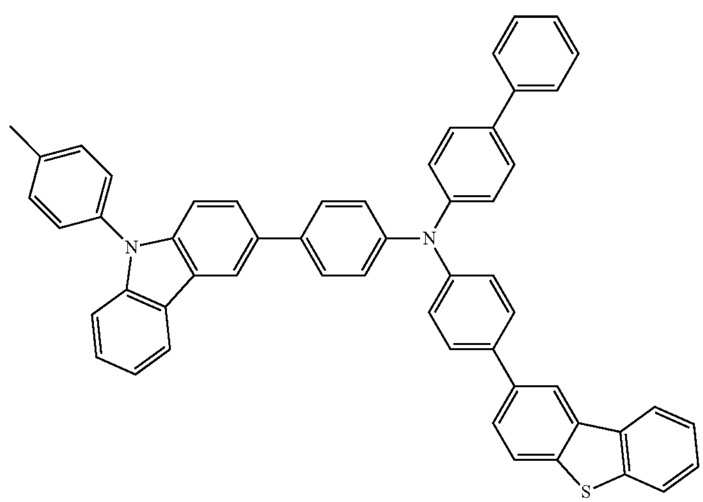
[A-449]
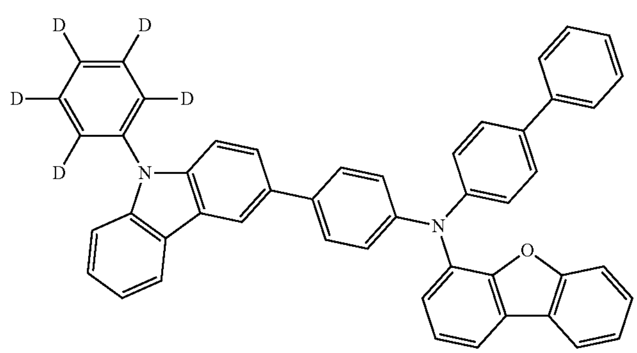

-continued
[A-450]
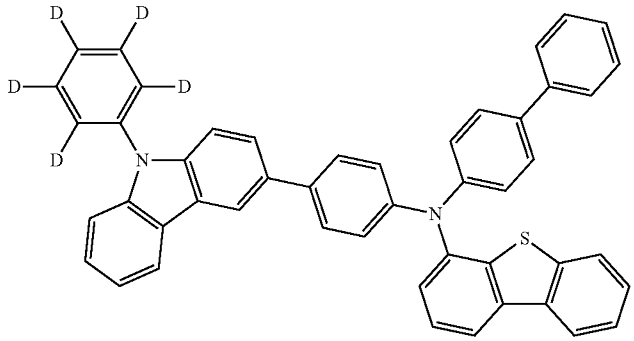
[A-451]
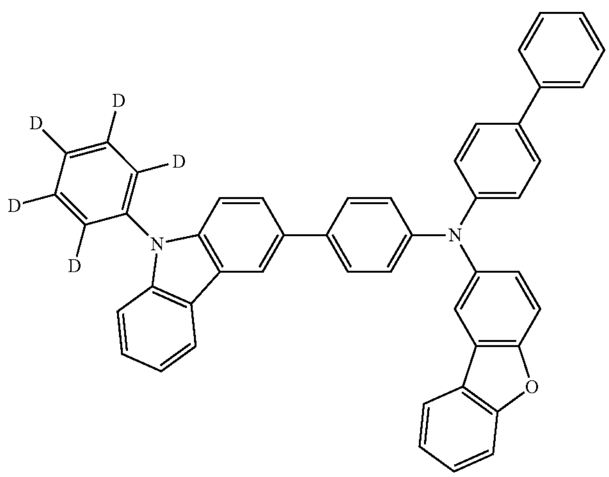
[A-452]
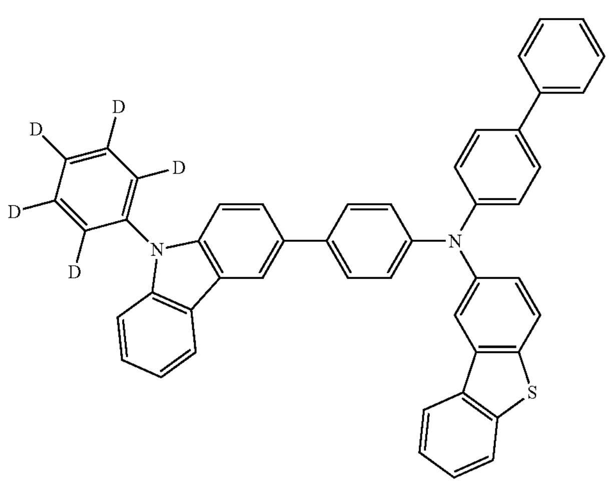

-continued
[A-453]
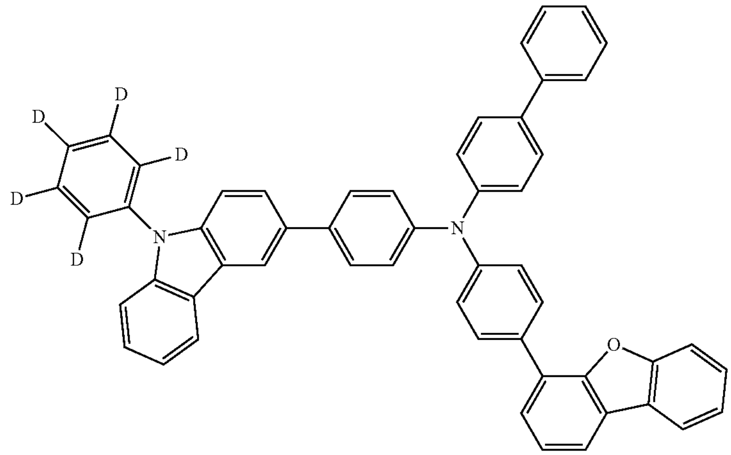
[A-454]
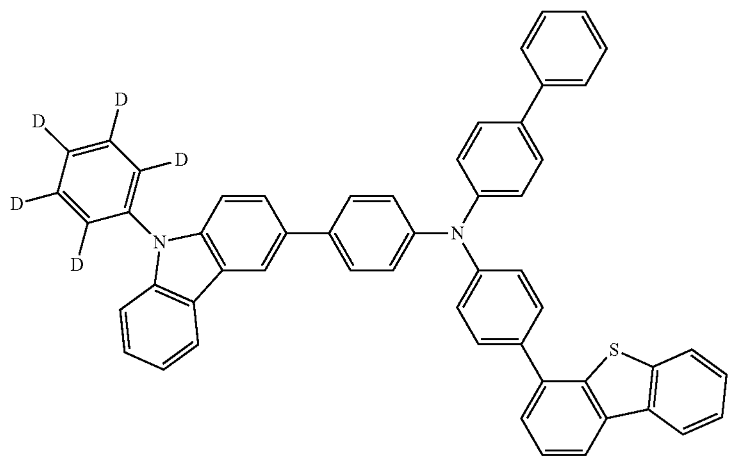
[A-455]
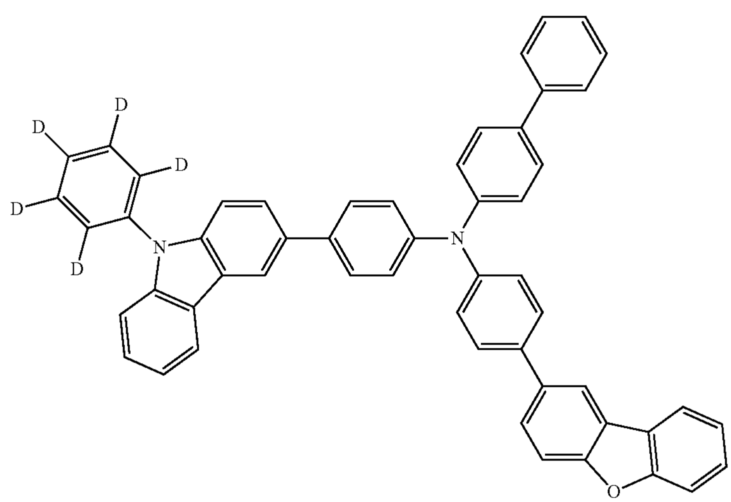

-continued
[A-456]
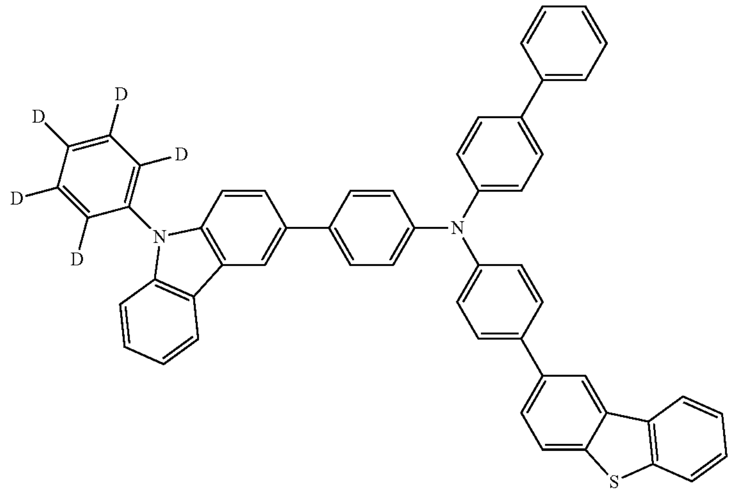
[A-459]
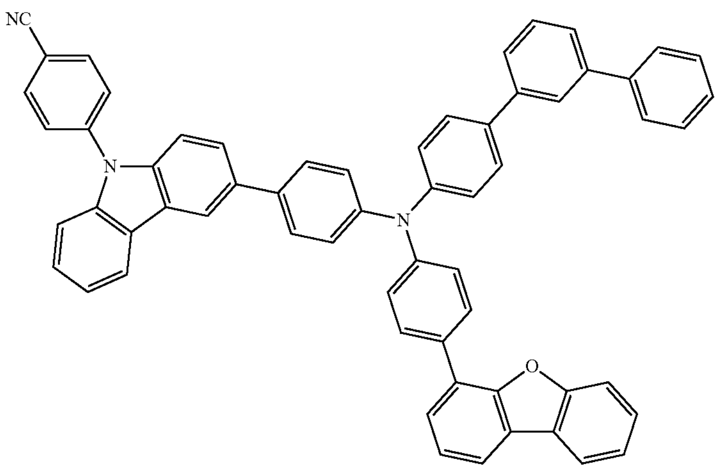
[A-460]
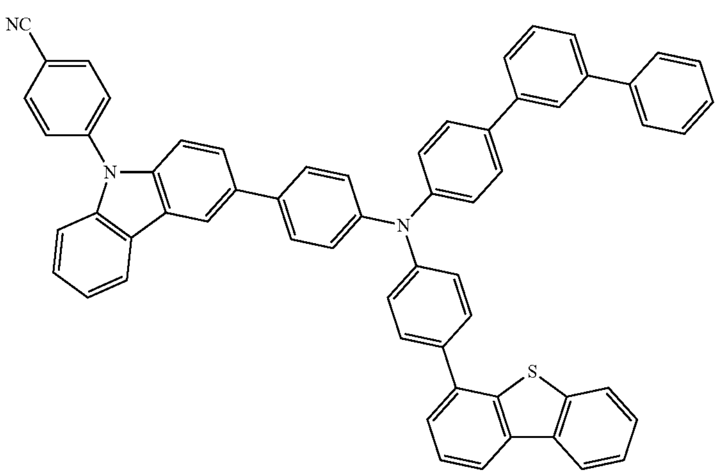

-continued
[A-461]
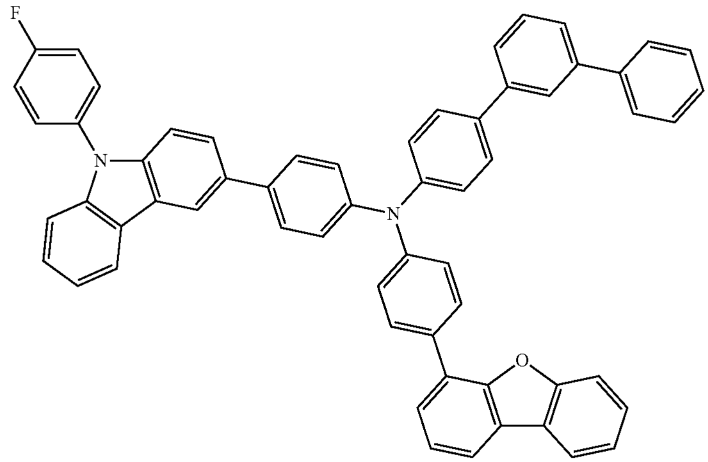
[A-462]
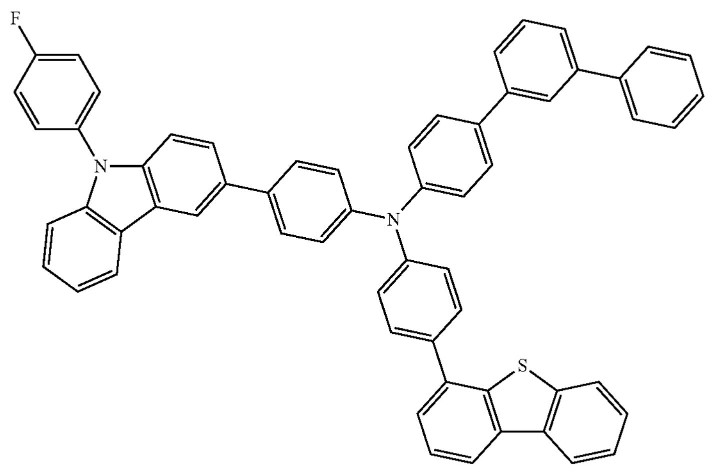
[A-463]
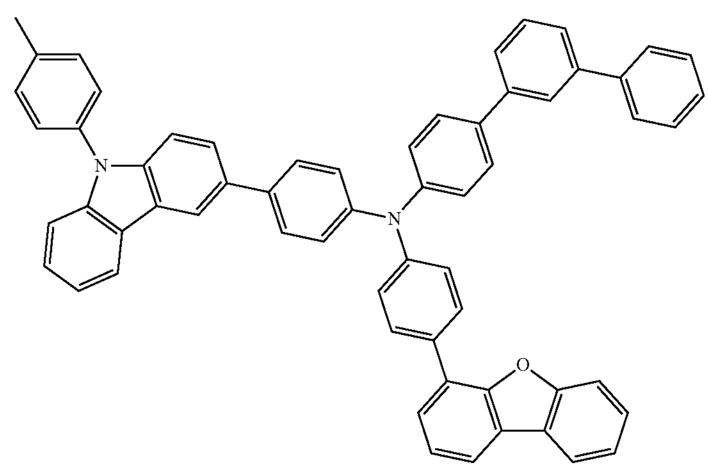

-continued
[A-464]
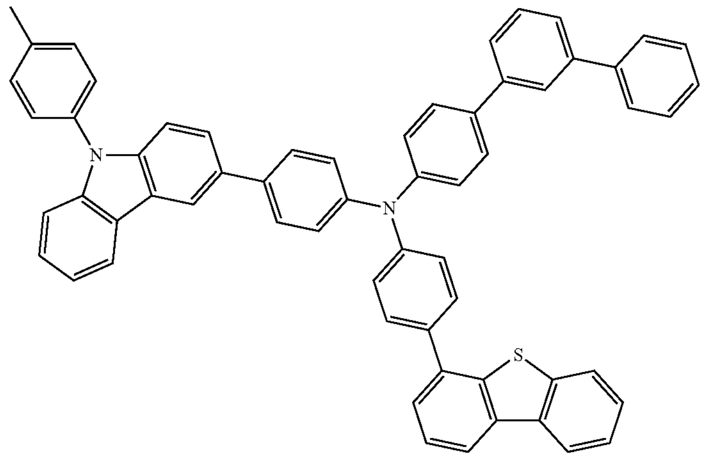
[A-465]
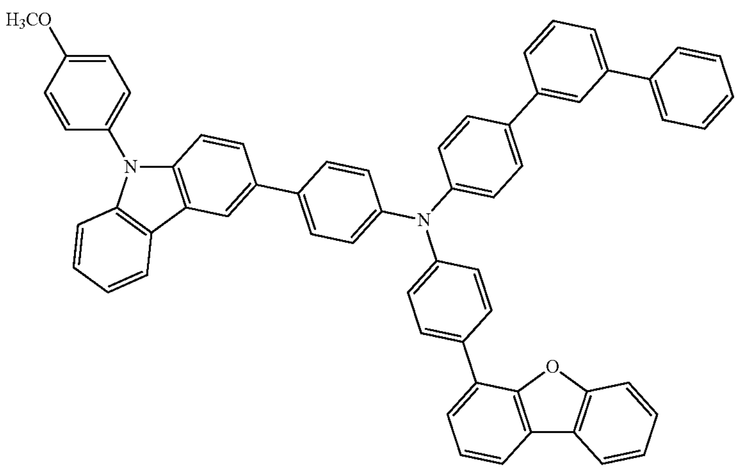
[A-466]
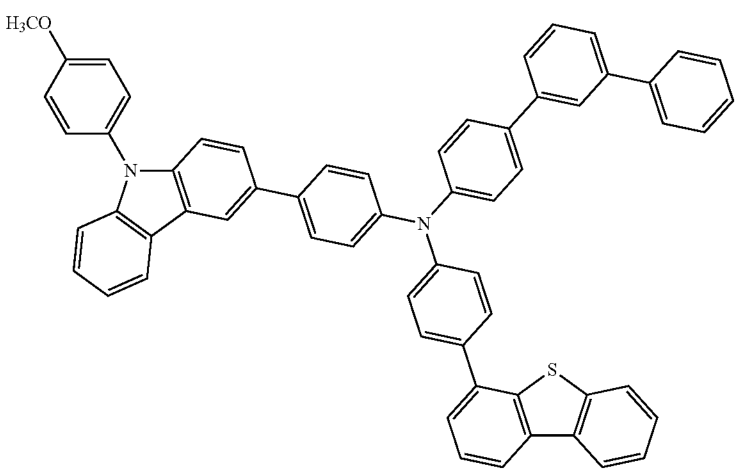

-continued
[A-467]
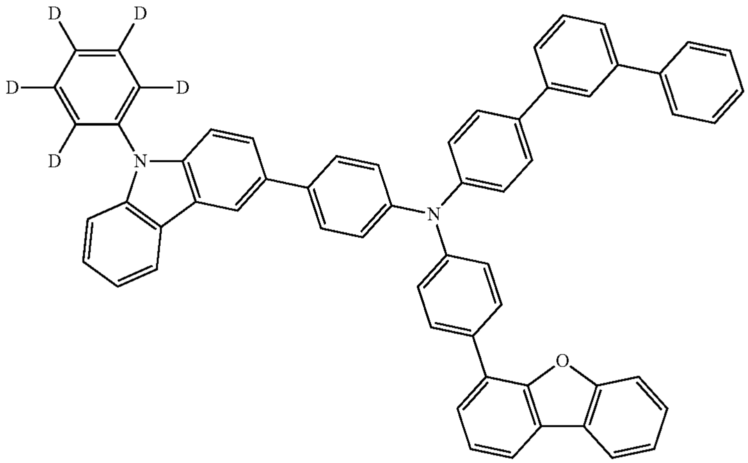
[A-468]
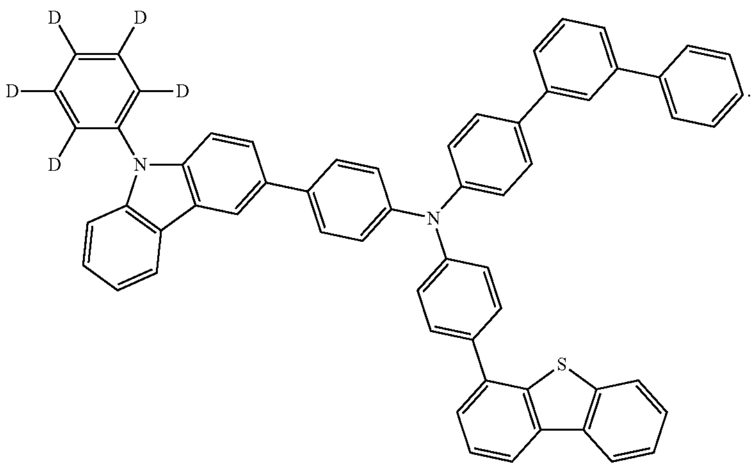
12. The compound as claimed in claim 1, wherein the compound being represented by one of the following Chemical Formulae A-324 to A-395:
[A-324]
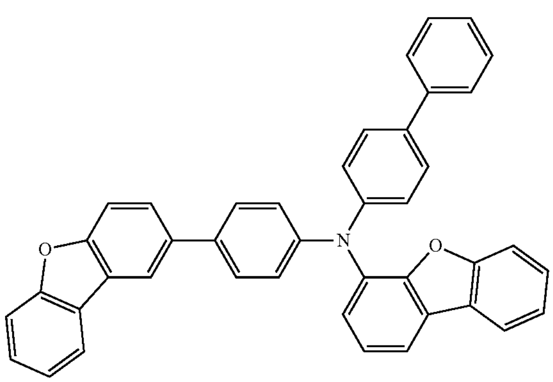
-continued
[A-325]
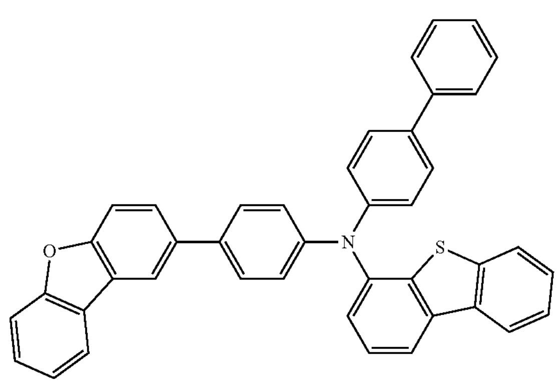

-continued
[A-326]
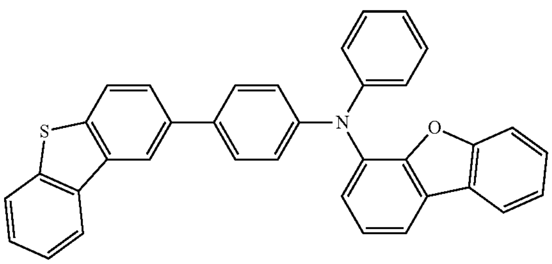
[A-327]
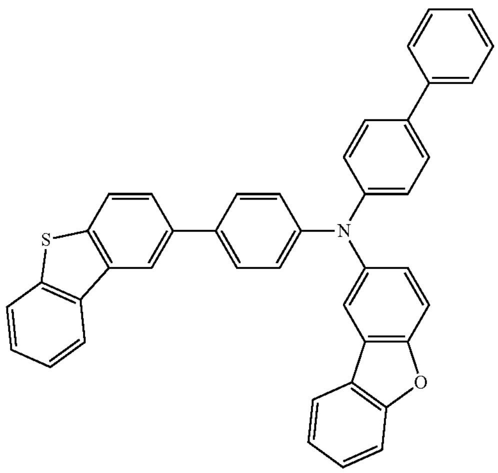
[A-328]
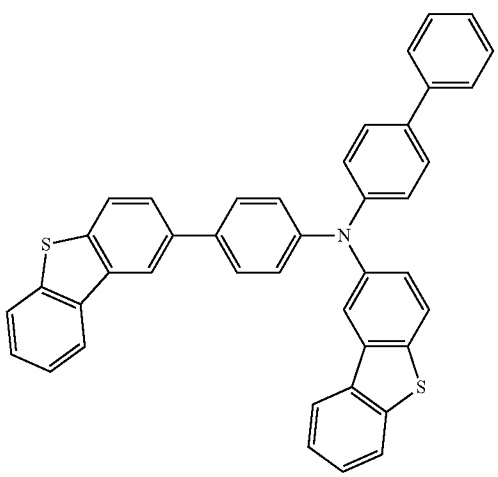
[A-329]
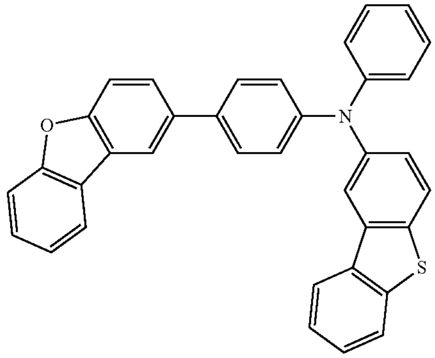
-continued
[A-330]
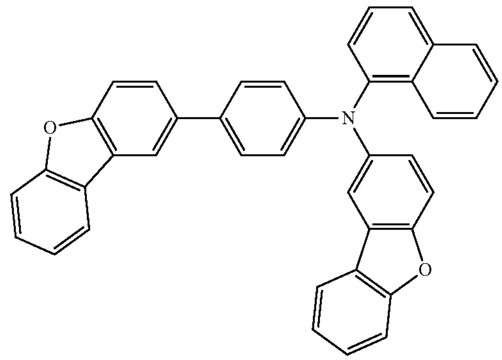
[A-331]
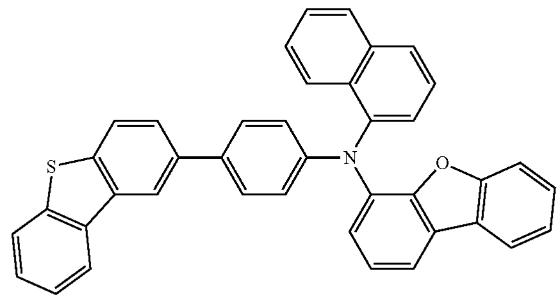
[A-332]
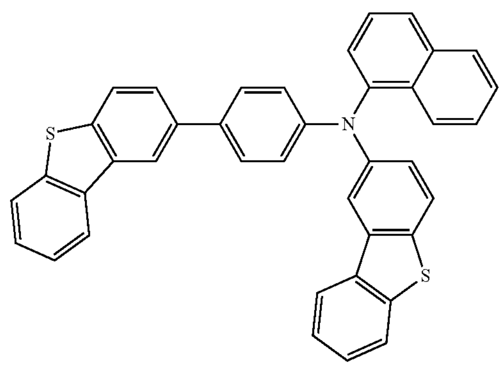
[A-333]
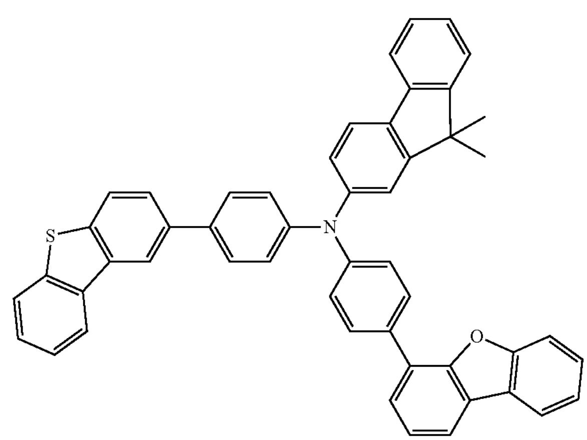

-continued
[A-334]
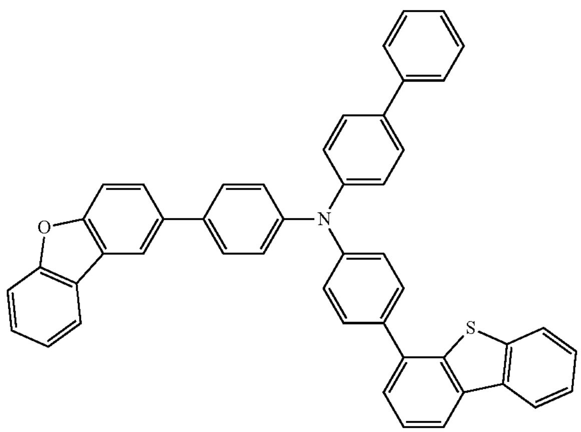
[A-335]
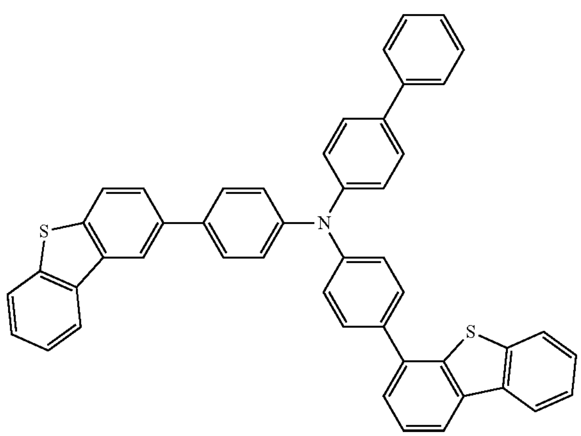
[A-336]
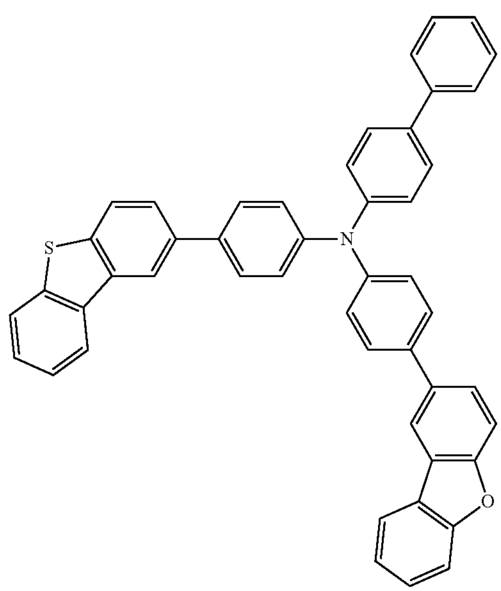
-continued
[A-337]
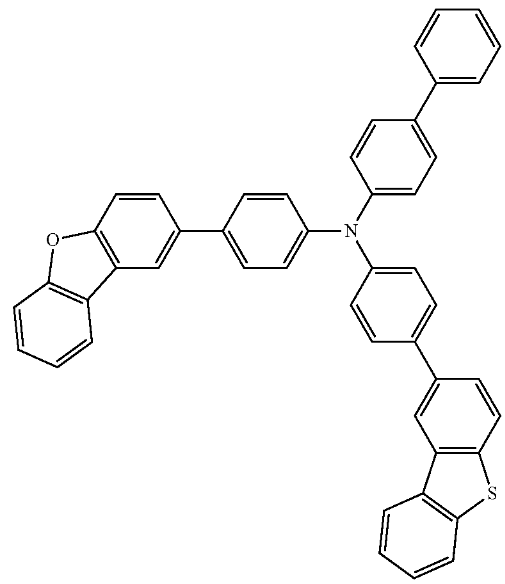
[A-338]
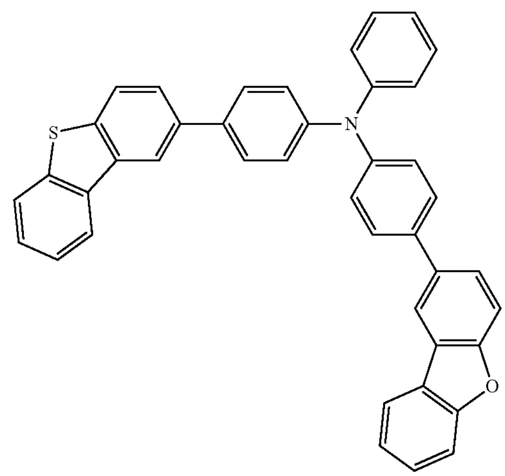
[A-339]
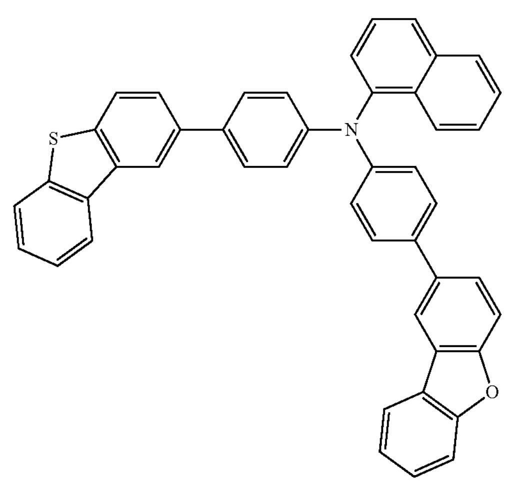

-continued
[A-340]
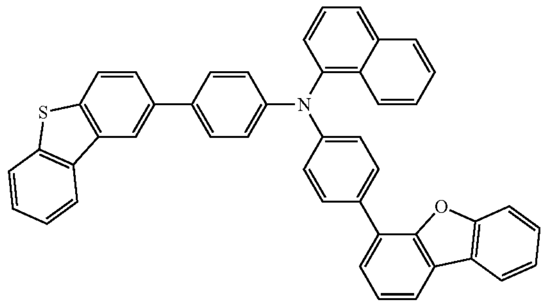
[A-341]
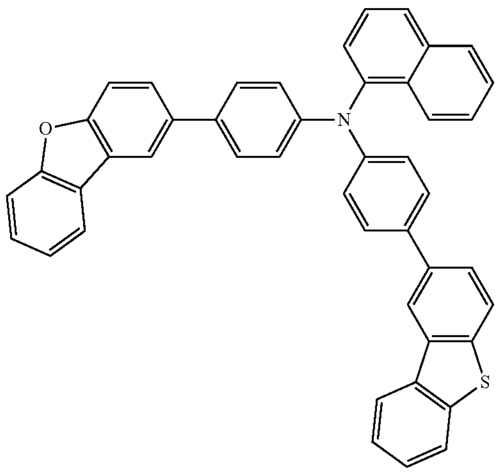
[A-342]
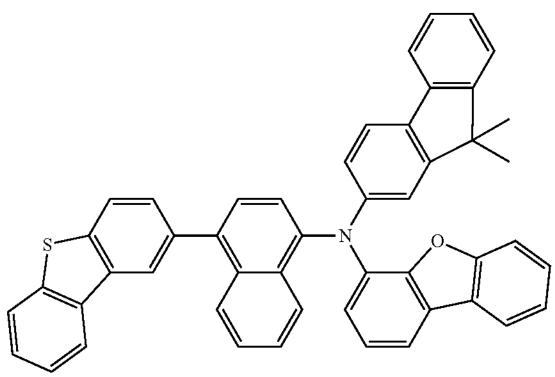
[A-343]
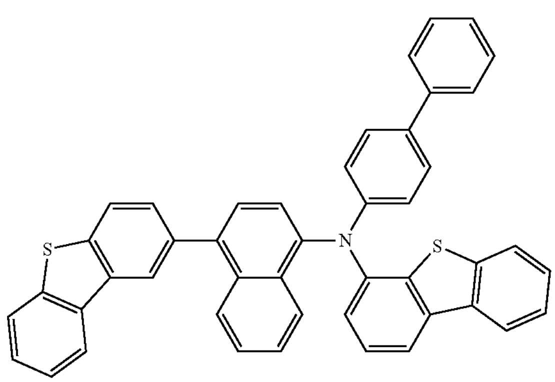
-continued
[A-344]
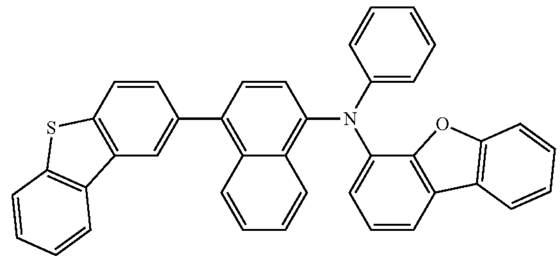
[A-345]
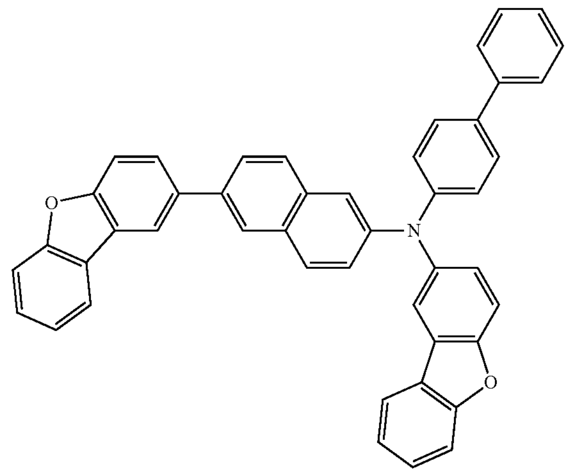
[A-346]
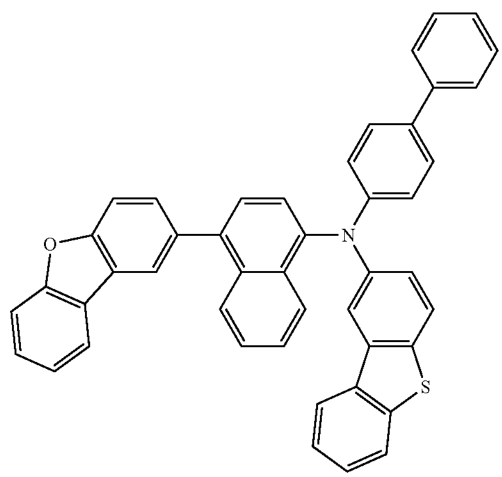
[A-347]
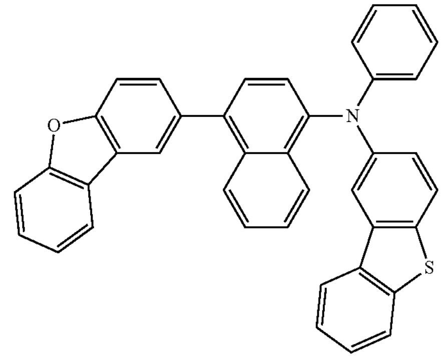

-continued
[A-348]
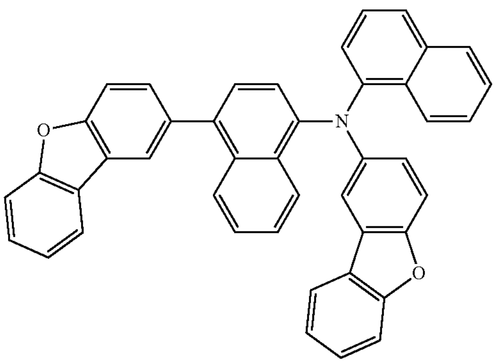
[A-349]
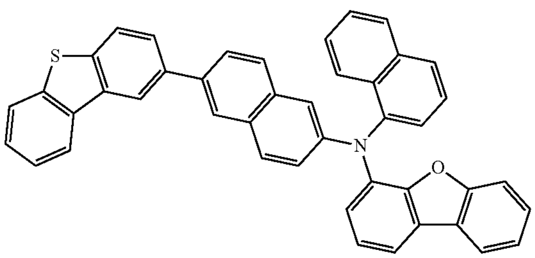
[A-350]
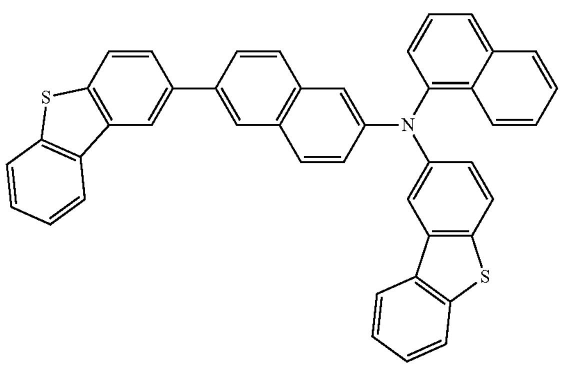
[A-351]
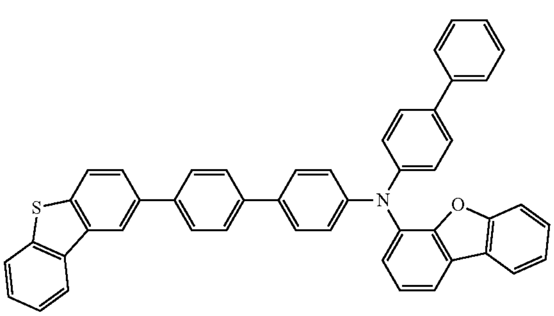
-continued
[A-352]
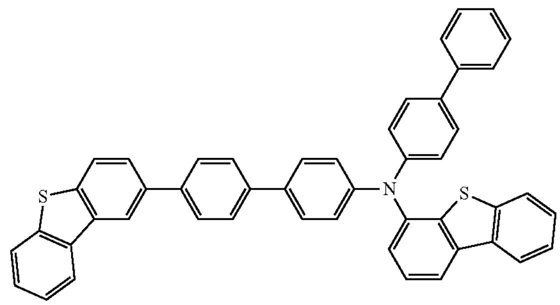
[A-353]
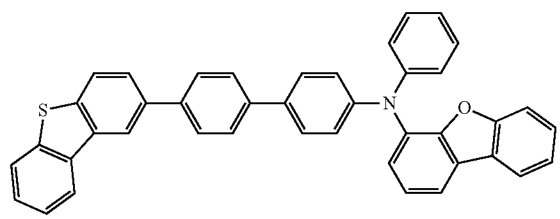
[A-354]
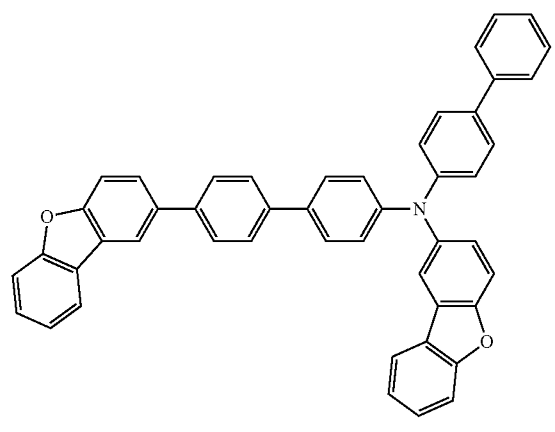
[A-355]
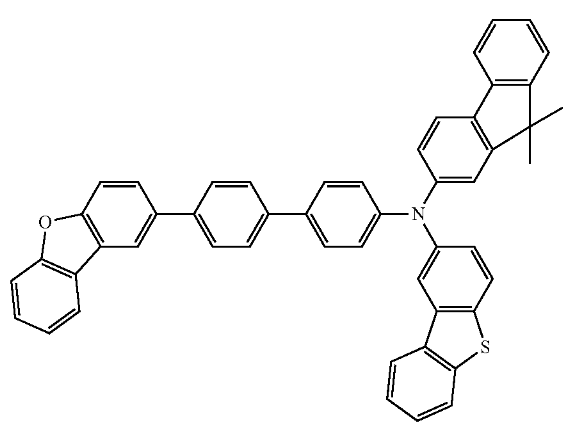

-continued
[A-356]
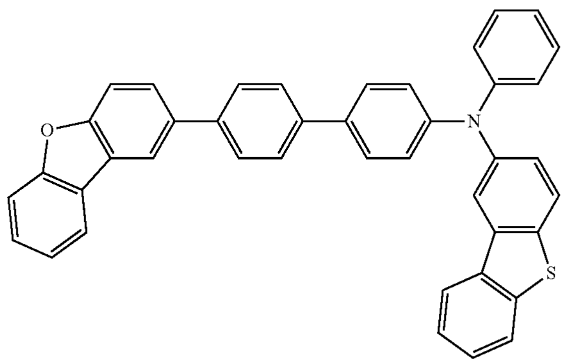
[A-357]
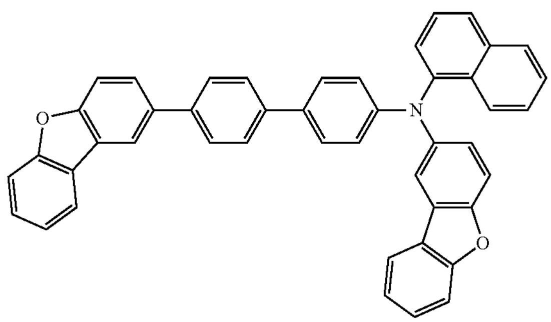
[A-358]
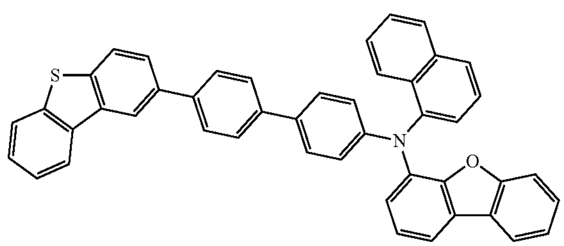
[A-359]
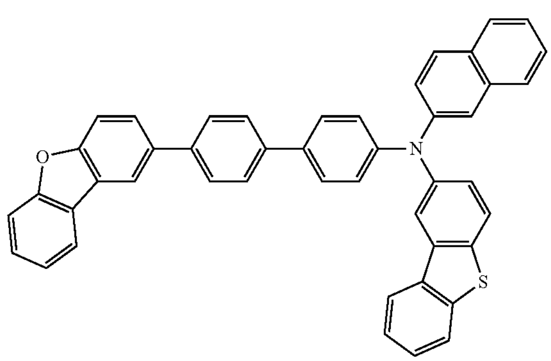
-continued
[A-360]
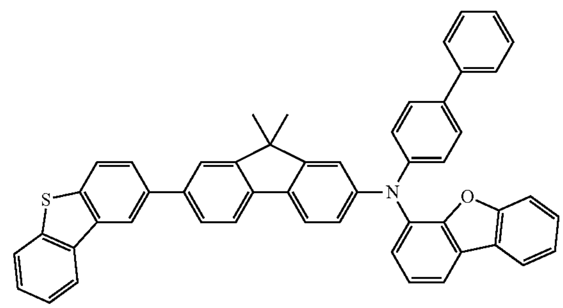
[A-361]
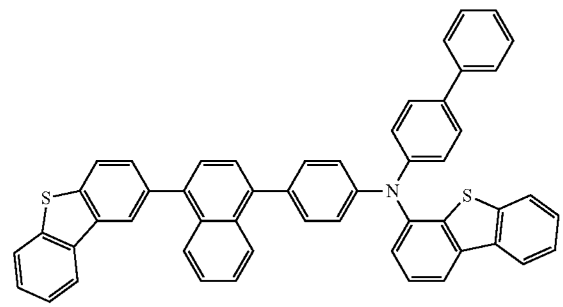
[A-362]
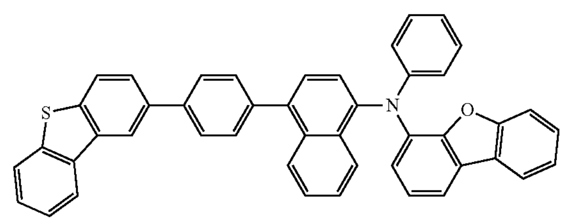
[A-363]
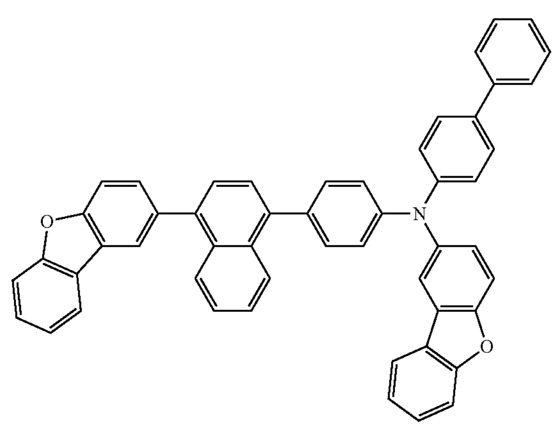

-continued
[A-364]
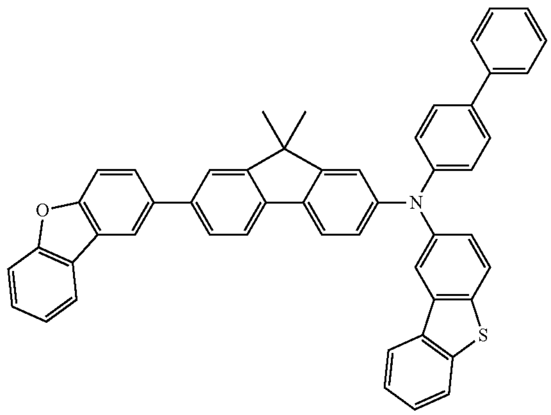
[A-365]
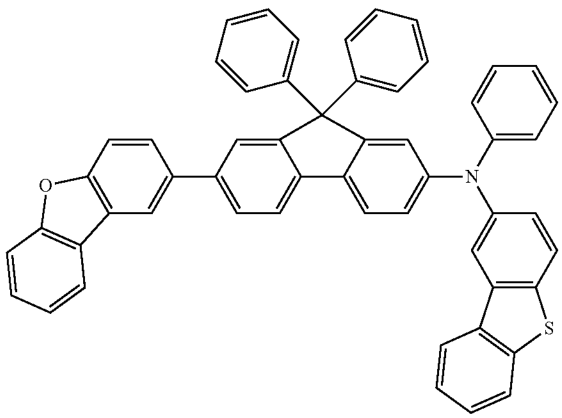
[A-366]
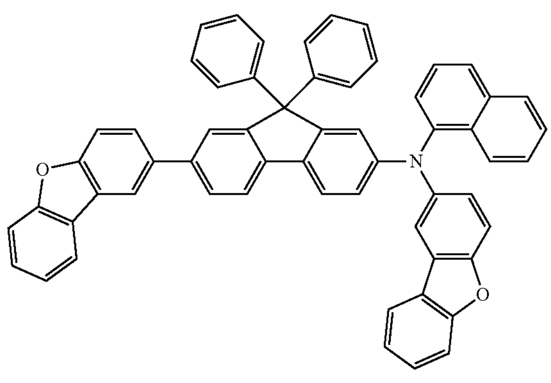
[A-367]
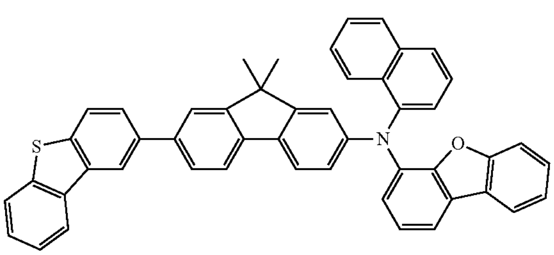
-continued
[A-368]
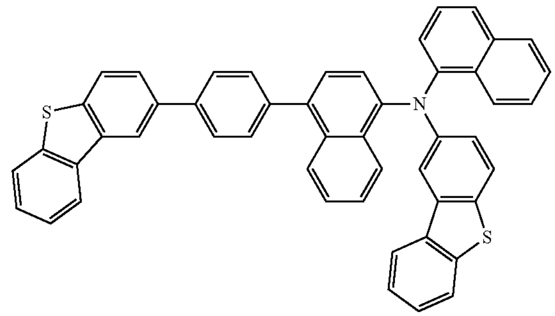
[A-369]
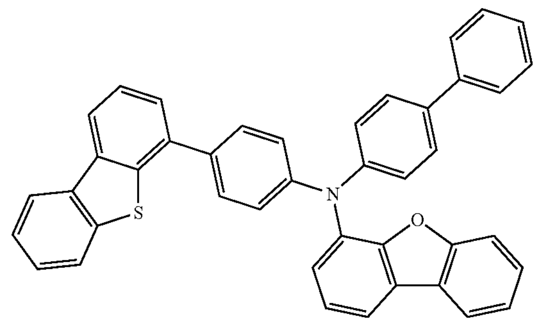
[A-370]
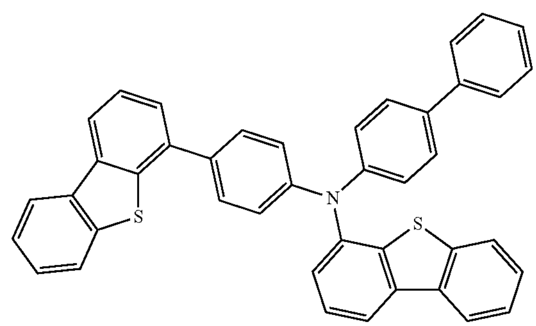
[A-371]
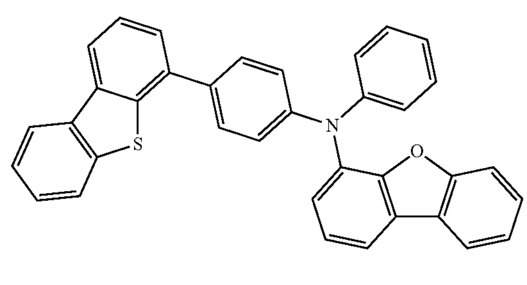

-continued
[A-372]
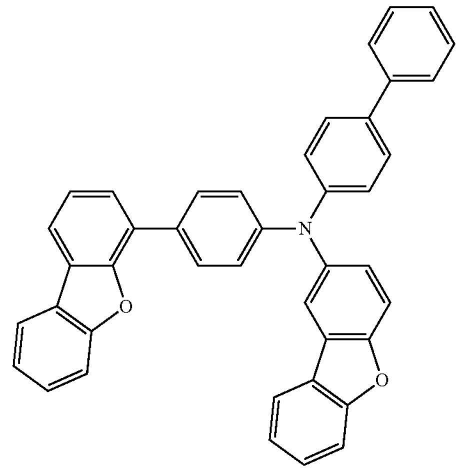
[A-373]
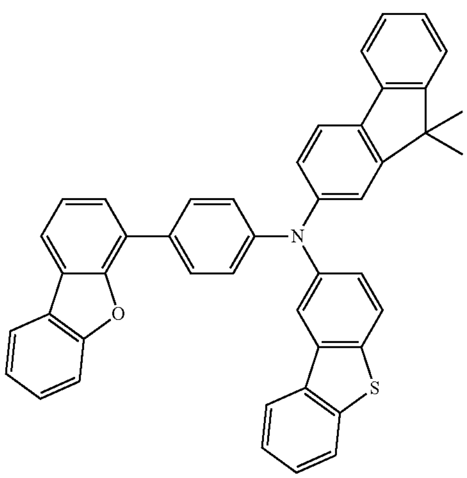
[A-374]
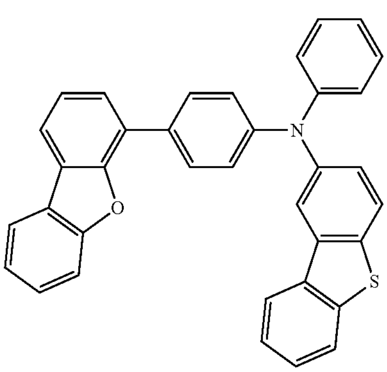
-continued
[A-375]
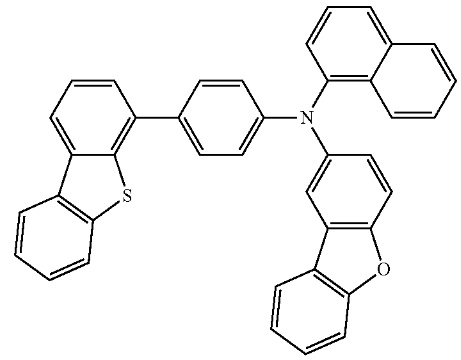
[A-376]
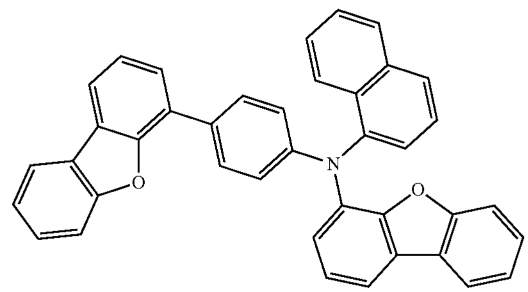
[A-377]
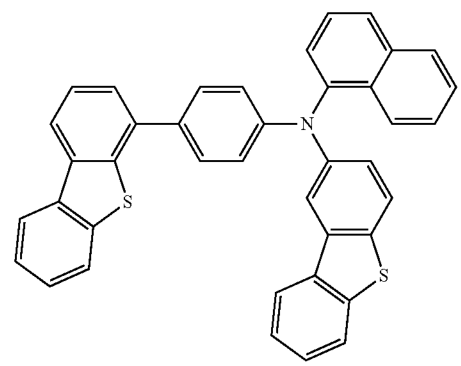
[A-378]
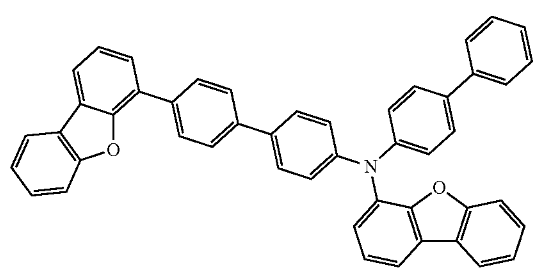
[A-379]
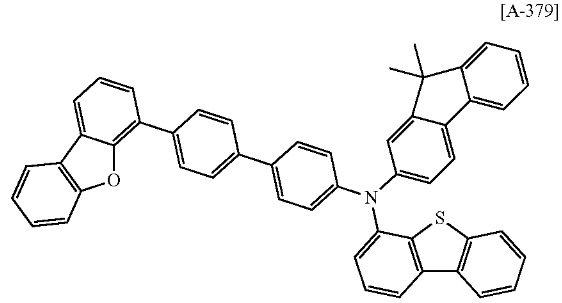

[A-380]
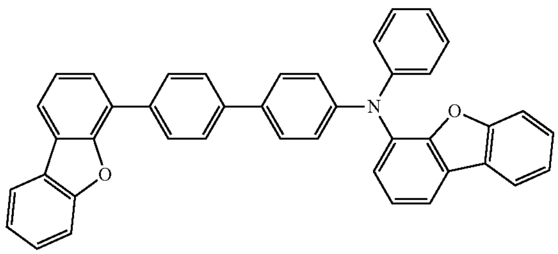
[A-381]
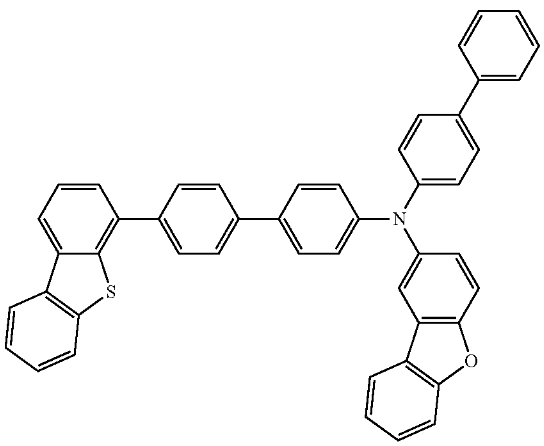
[A-382]
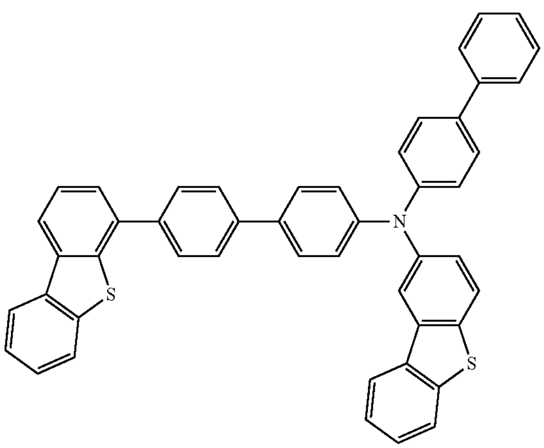
[A-383]
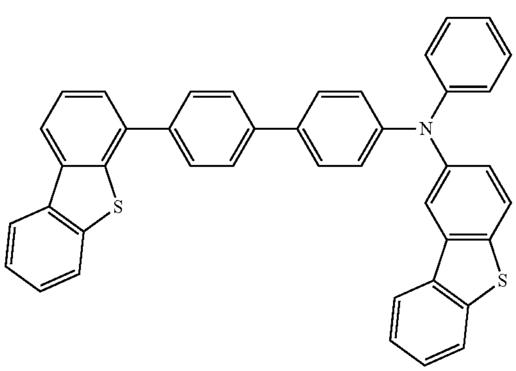
[A-384]
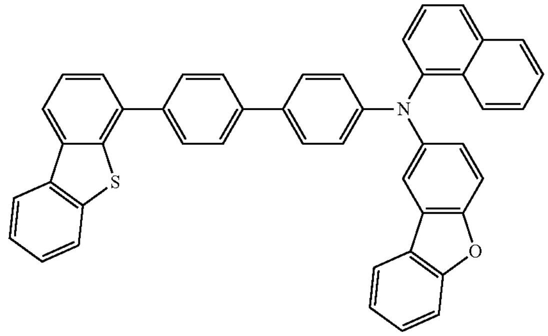
[A-385]
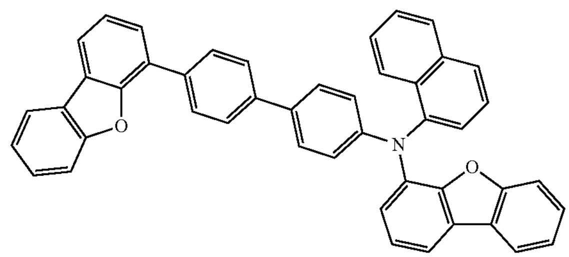
[A-386]
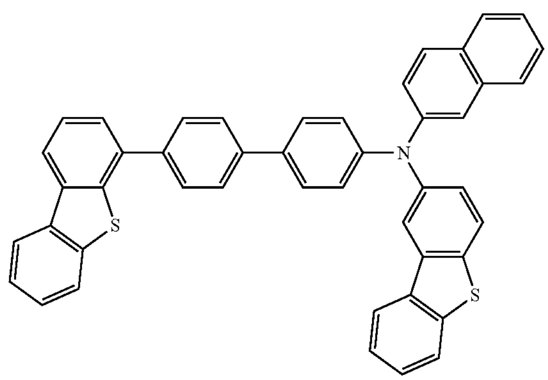
[A-387]
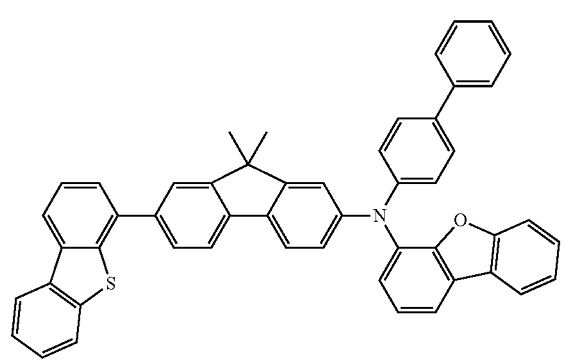

-continued
[A-388]
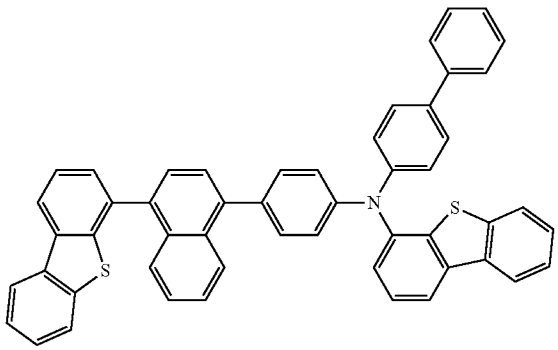
[A-389]
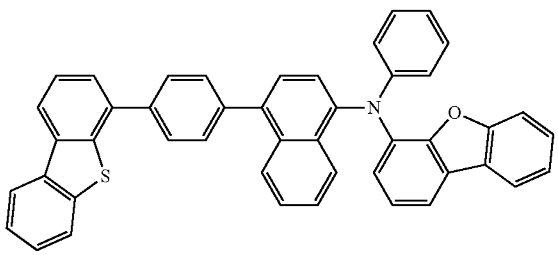
[A-390]
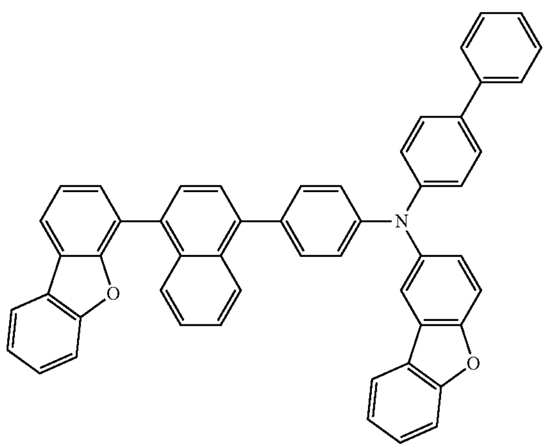
[A-391]
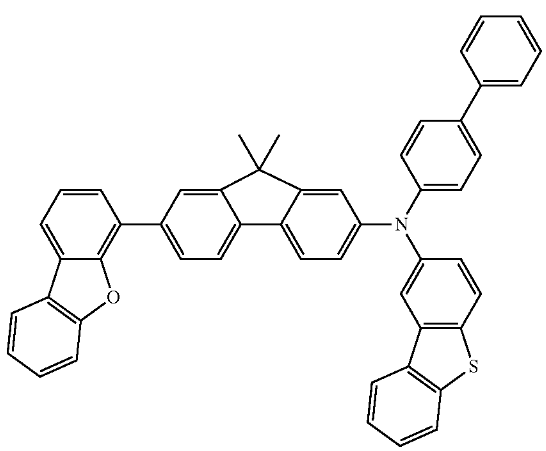
-continued
[A-392]
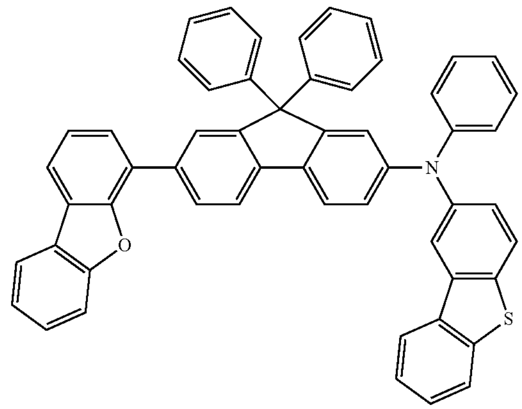
[A-393]
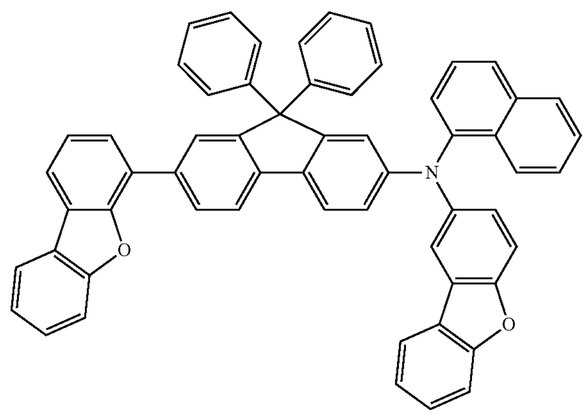
[A-394]
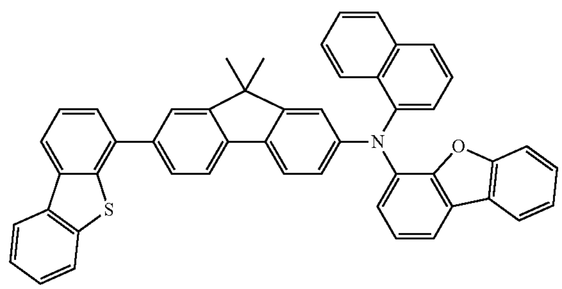
[A-395]
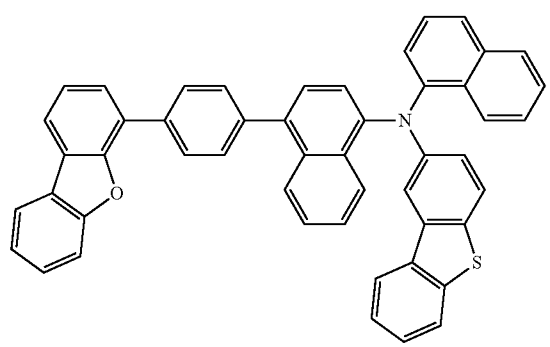
13. The compound as claimed in claim 1, wherein the compound being represented by one of the following Chemical Formulae A-306 to A-323:

-continued
[A-306]
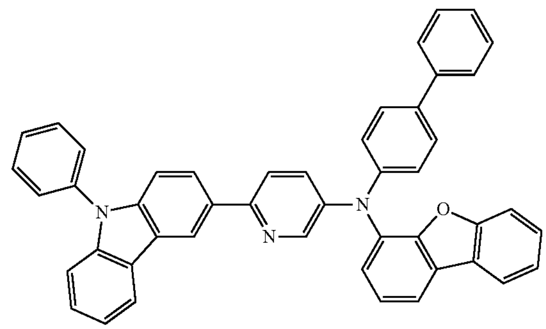
[A-307]
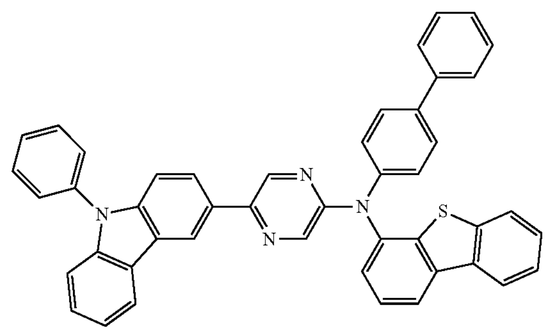
[A-308]
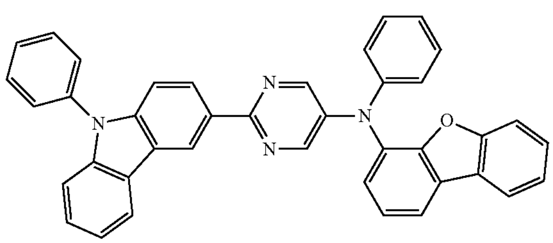
[A-309]
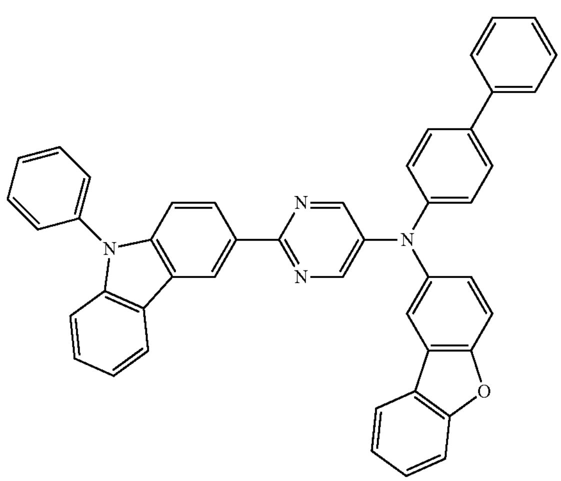
[A-310]
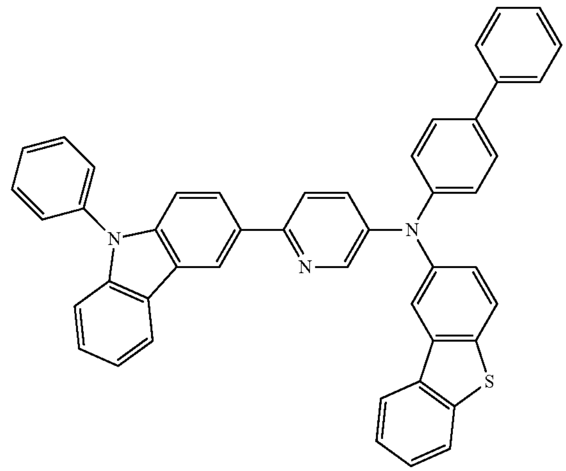
[A-311]
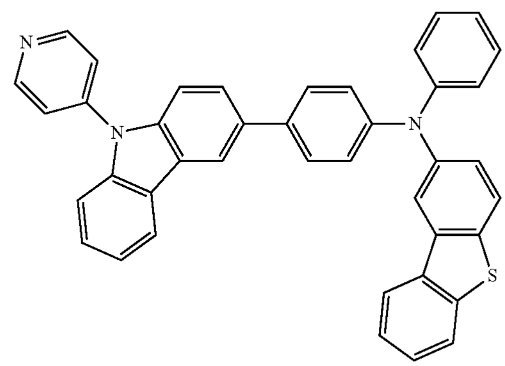
[A-312]
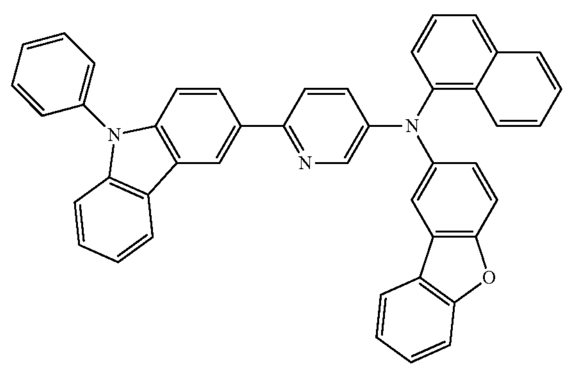
[A-313]
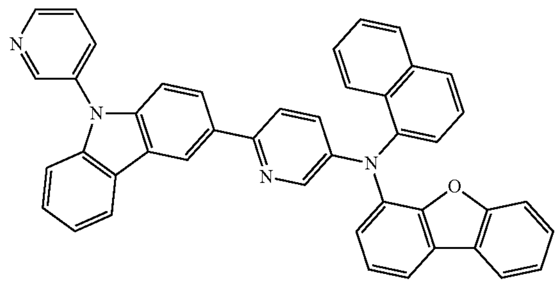

-continued
[A-314]
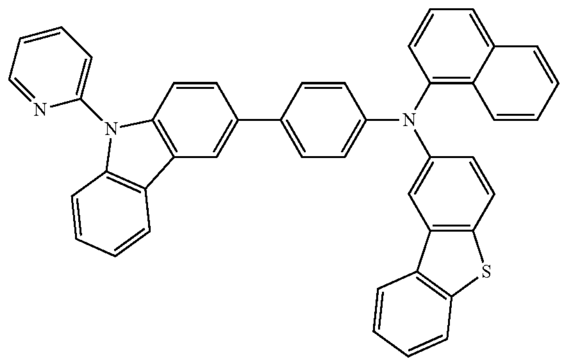
[A-315]
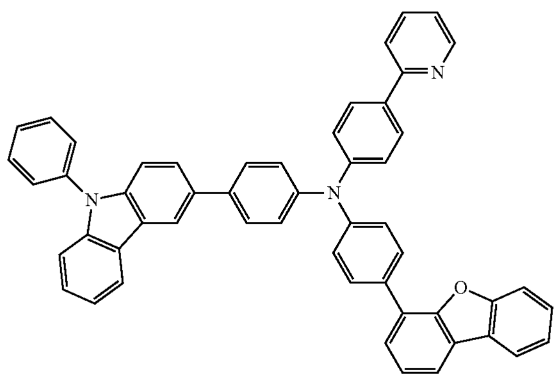
[A-316]
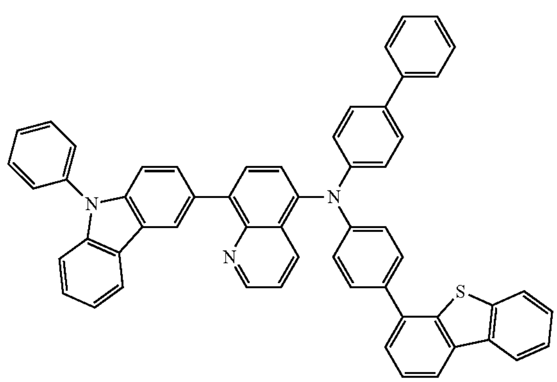
[A-317]
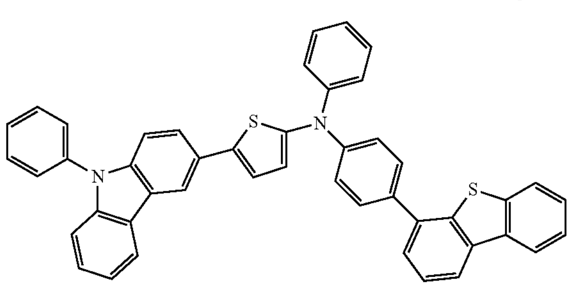
-continued
[A-318]
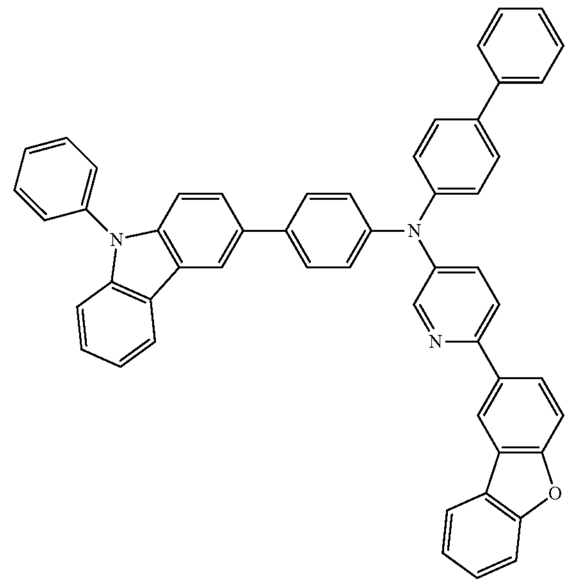
[A-319]
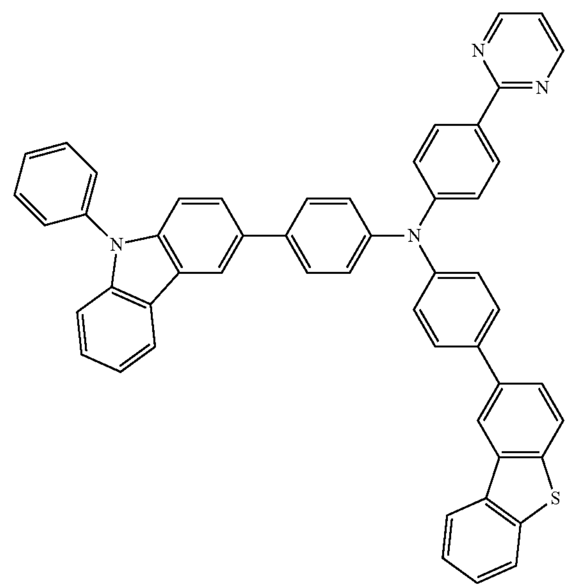
[A-320]
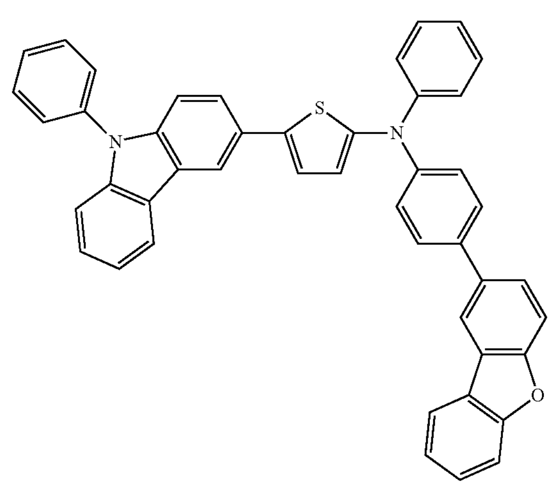

-continued
[A-321]
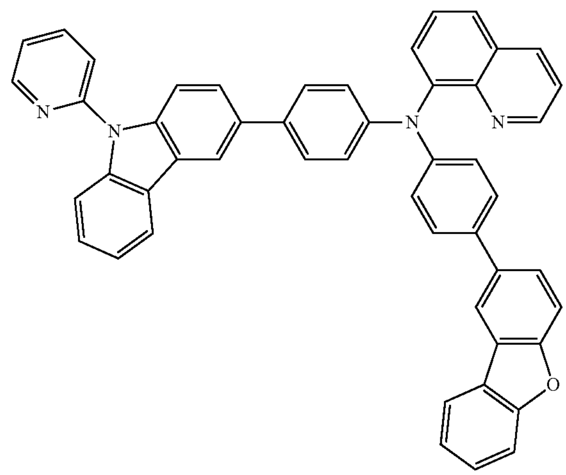
[A-322]
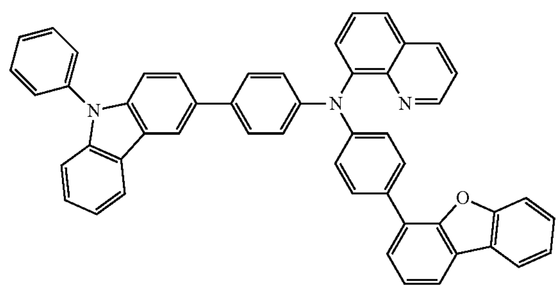
[A-323]
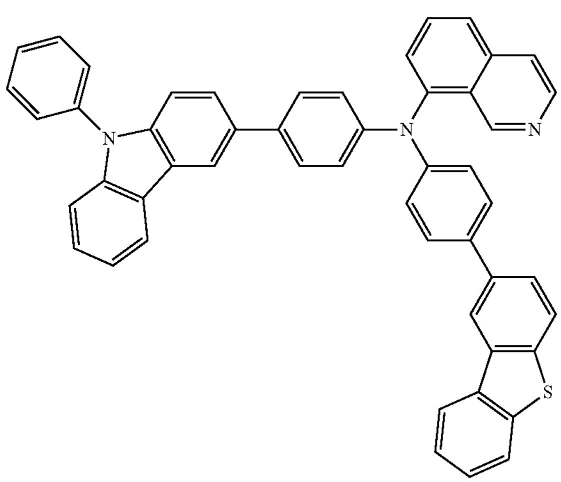
14. The compound as claimed in claim 1, wherein the compound being represented by one of the following Chemical Formulae A-396 to A-413:
[A-396]
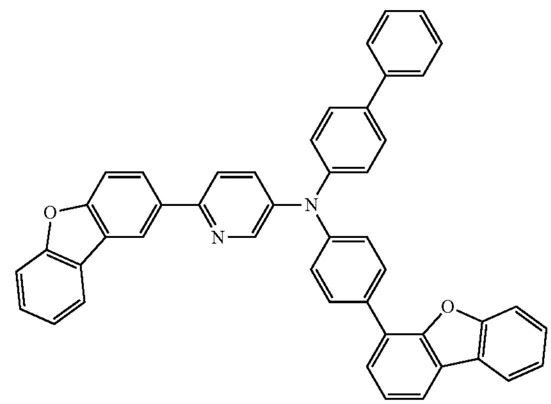
[A-397]
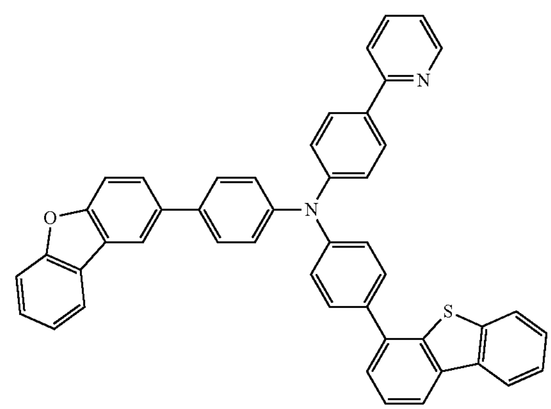
[A-398]
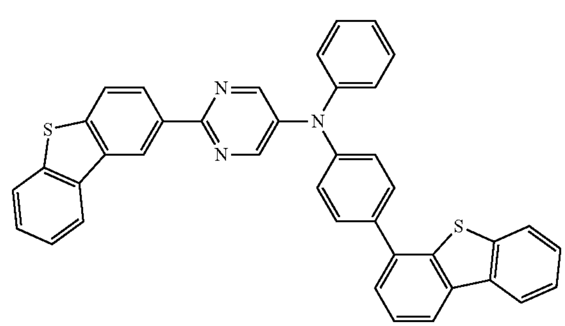

-continued
[A-399]
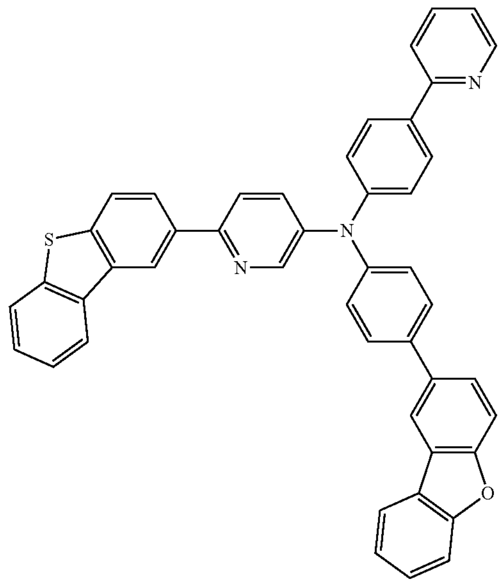
[A-400]
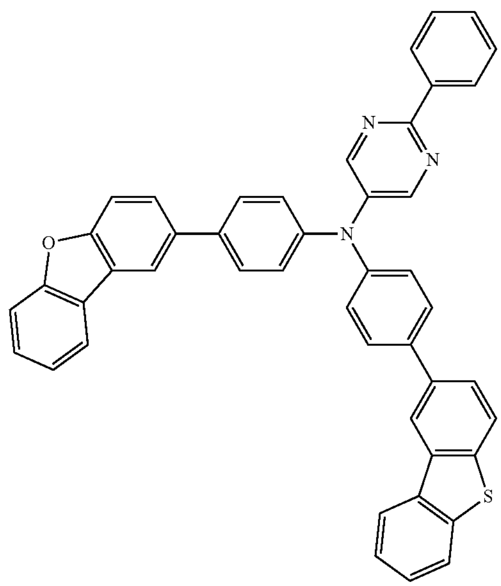
[A-401]
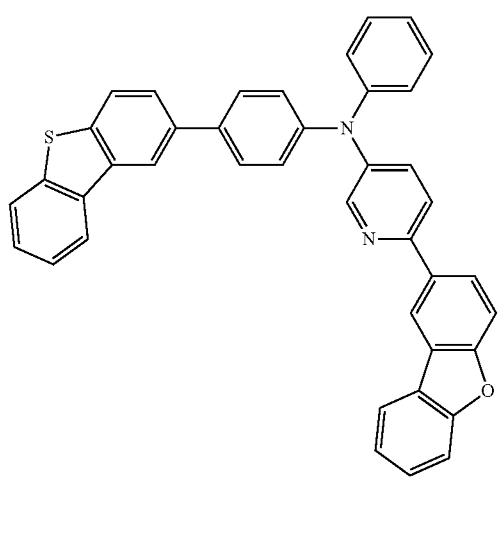
-continued
[A-402]
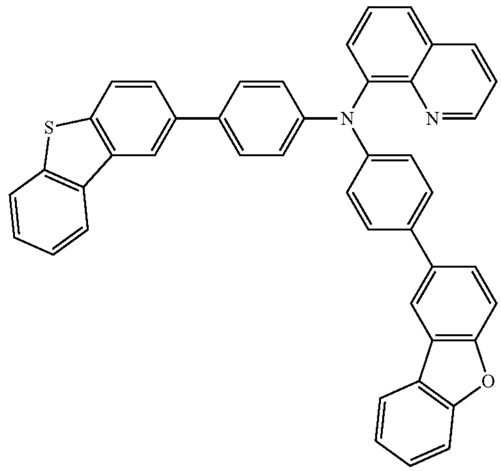
[A-403]
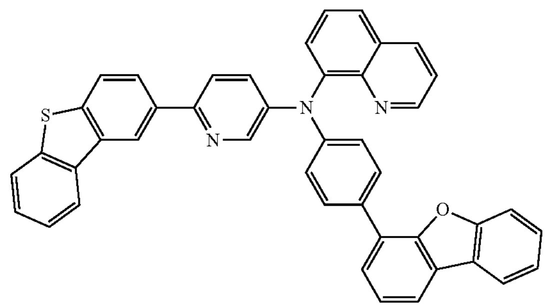
[A-404
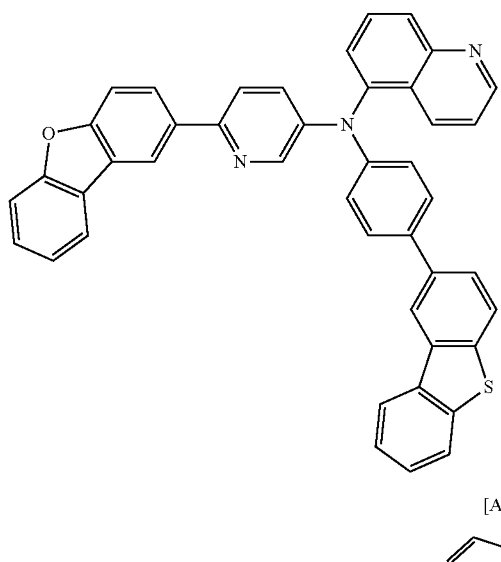
[A-405]
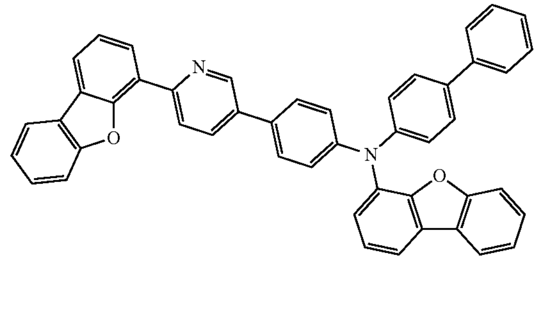

-continued
[A-406]
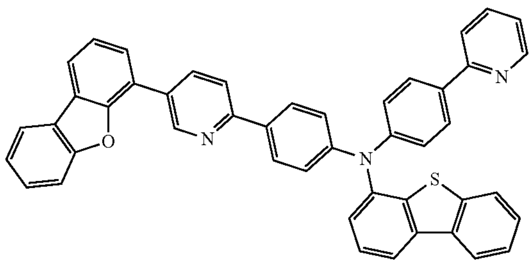
[A-407]
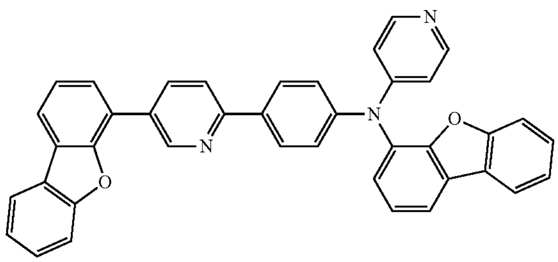
[A-408]
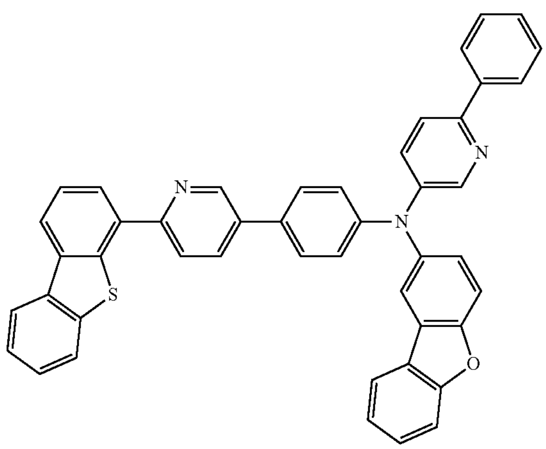
[A-409]
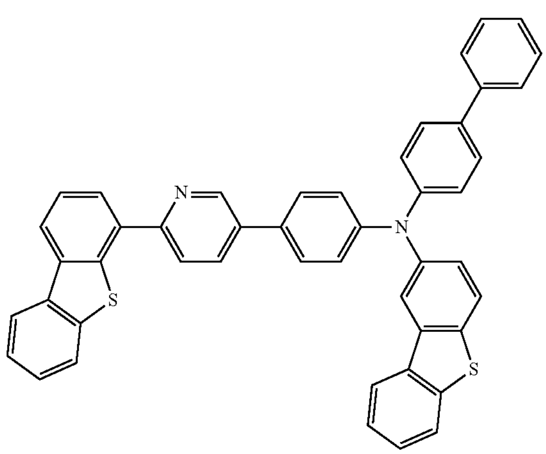
-continued
[A-410]
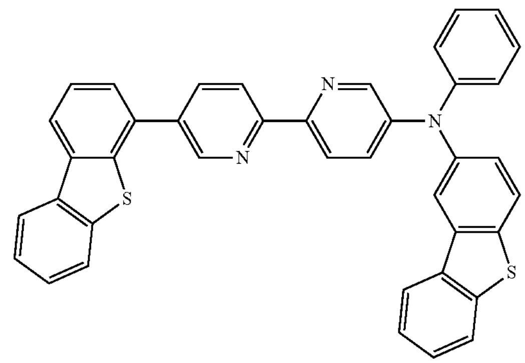
[A-411]
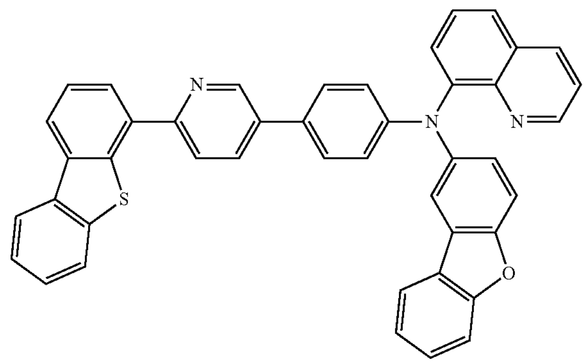
[A-412]
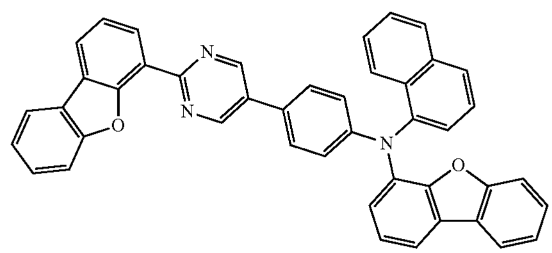
[A-413]
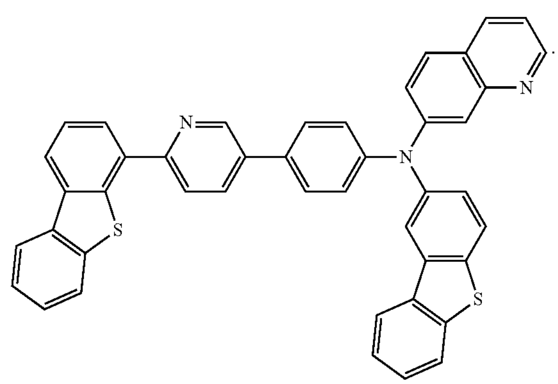
15. An organic light emitting diode, comprising:
an anode,
a cathode, and
at least one organic thin film between the anode and the cathode, the at least one organic thin film including the compound for an optoelectronic device as claimed in claim 1.

16. The organic light emitting diode as claimed in claim 15, wherein the at least one organic thin film including the compound for an optoelectronic device includes an emission layer, a hole transport layer (HTL), a hole injection layer (HIL), an electron transport layer (ETL), an electron injection layer (EIL), a hole blocking layer, or a combination thereof.

17. The organic light emitting diode as claimed in claim 15, wherein the at least one organic thin film including the compound for an optoelectronic device includes a hole transport layer (HTL), a hole injection layer (HIL), an electron transport layer (ETL), or an electron injection layer (EIL).

18. The organic light emitting diode as claimed in claim 15, wherein the at least one organic thin film including the compound for an optoelectronic device includes an emission layer.

19. The organic light emitting diode as claimed in claim 15, wherein:

the at least one organic thin film including the compound for an organic photoelectric device is an emission layer, and the compound for an optoelectronic device is a phosphorescent or fluorescent host material in the emission layer.

20. A display device comprising the organic light emitting diode as claimed in claim 15.

* * * * *

US008890126C1

(12) EX PARTE REEXAMINATION CERTIFICATE (10764th)
United States Patent
Ryu et al.

(10) Number: US 8,890,126 C1
(45) Certificate Issued: Nov. 13, 2015

(54) COMPOUND FOR OPTOELECTRONIC DEVICE, ORGANIC LIGHT EMITTING DIODE INCLUDING THE SAME, AND DISPLAY INCLUDING THE ORGANIC LIGHT EMITTING DIODE

(71) Applicants: Dong-Wan Ryu, Uiwang-si (KR); Sung-Hyun Jung, Uiwang-si (KR); Dal-Ho Huh, Uiwang-si (KR); Kyoung-Mi Lee, Uiwang-si (KR); Nam-Heon Lee, Uiwang-si (KR); Mi-Young Chae, Uiwang-si (KR)

(72) Inventors: Dong-Wan Ryu, Uiwang-si (KR); Sung-Hyun Jung, Uiwang-si (KR); Dal-Ho Huh, Uiwang-si (KR); Kyoung-Mi Lee, Uiwang-si (KR); Nam-Heon Lee, Uiwang-si (KR); Mi-Young Chae, Uiwang-si (KR)

(73) Assignee: CHEIL INDUSTRIES, INC., Gumi-Si, Kyeongsangbuk-Do (KR)

Reexamination Request:
No. 90/013,408, Dec. 31, 2014

Reexamination Certificate for:

| | |
|---|---|
| Patent No.: | **8,890,126** |
| Issued: | **Nov. 18, 2014** |
| Appl. No.: | **13/658,081** |
| Filed: | **Oct. 23, 2012** |

Related U.S. Application Data

(63) Continuation of application No. PCT/KR2011/003003, filed on Apr. 25, 2011.

(60) Provisional application No. 61/344,433, filed on Jul. 22, 2010.

(30) Foreign Application Priority Data

Apr. 23, 2010 (KR) ........................ 10-2010-0038169

(51) Int. Cl.

| | |
|---|---|
| ***H01L 35/24*** | (2006.01) |
| ***H01L 51/00*** | (2006.01) |
| ***H05B 33/14*** | (2006.01) |
| ***C09B 57/00*** | (2006.01) |
| ***C09K 11/06*** | (2006.01) |
| *H01L 51/50* | (2006.01) |

(52) U.S. Cl.
CPC ............ *H01L 51/0074* (2013.01); *C09B 57/00* (2013.01); *C09B 57/008* (2013.01); *C09K 11/06* (2013.01); *H01L 51/0061* (2013.01); *H01L 51/0072* (2013.01); *H01L 51/0073* (2013.01); *H01L 51/50* (2013.01); *H05B 33/14* (2013.01); *C09K 2211/1022* (2013.01); *C09K 2211/1029* (2013.01); *C09K 2211/1088* (2013.01); *C09K 2211/1092* (2013.01); *H01L 51/0067* (2013.01); *H01L 51/5012* (2013.01); *H01L 51/5048* (2013.01); *H01L 51/5088* (2013.01); *H01L 51/5092* (2013.01); *H01L 51/5096* (2013.01); *Y02E 10/549* (2013.01)

(58) Field of Classification Search
None
See application file for complete search history.

(56) References Cited

To view the complete listing of prior art documents cited during the proceeding for Reexamination Control Number 90/013,408, please refer to the USPTO's public Patent Application Information Retrieval (PAIR) system under the Display References tab.

*Primary Examiner* — Ling Xu

(57) ABSTRACT

A compound for an optoelectronic device, an organic light emitting diode, and a display device, the compound for an optoelectronic device being represented by the following Chemical Formula 1:

[Chemical Formula 1]

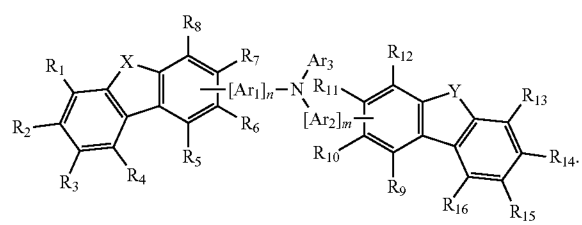

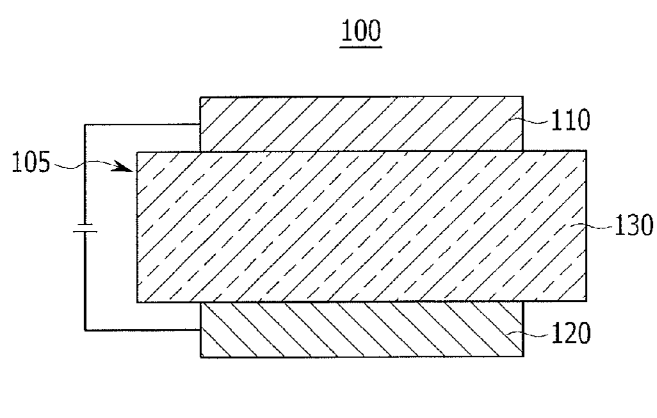

EX PARTE REEXAMINATION CERTIFICATE

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 2-6 and 10-11 are cancelled.

Claims 1 and 12-14 are determined to be patentable as amended.

Claims 7-9 and 15-20, dependent on an amended claim, are determined to be patentable.

1. A compound for an optoelectronic device, the compound being represented by [the following Chemical Formula 1:]

[ [Chemical Formula 1] ]

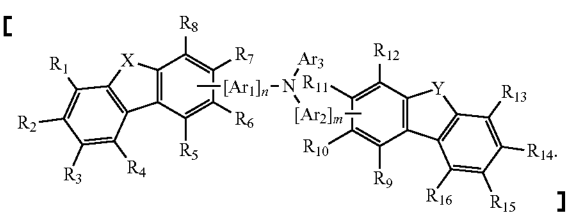

[wherein in Chemical Formula 1] *one of the following Chemical Formulae 4 and 7,*

*Chemical Formula 4*

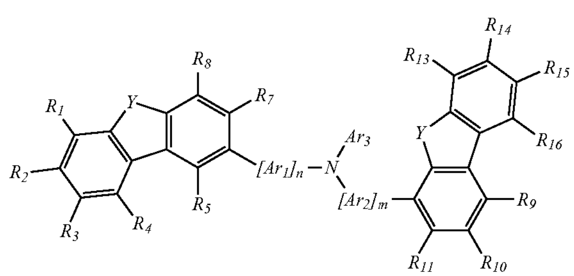

*Chemical Formula 7*

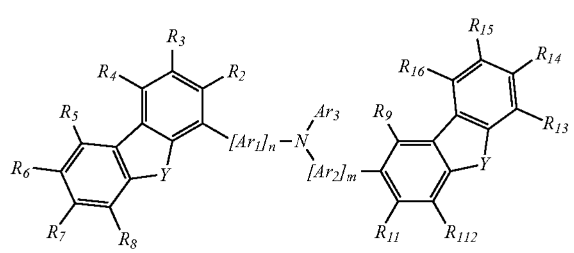

*wherein, in Chemical Formulae 4 and 7,*

$R_1$ to $R_{16}$ are each independently selected from the group of hydrogen, deuterium, a single bond, a halogen, a cyano group, a hydroxyl group, an amino group, a substituted or unsubstituted C1 to C20 amine group, a nitro group, a carboxyl group, a ferrocenyl group, a substituted or unsubstituted C1 to C20 alkyl group, a substituted or unsubstituted C6 to C30 aryl group, a substituted or unsubstituted C2 to C30 heteroaryl group, a substituted or unsubstituted C1 to C20 alkoxy group, a substituted or unsubstituted C6 to C20 aryloxy group, a substituted or unsubstituted C3 to C40 silyloxy group, a substituted or unsubstituted C1 to C20 acyl group, a substituted or unsubstituted C2 to C20 alkoxycarbonyl group, a substituted or unsubstituted C2 to C20 acyloxy group, a substituted or unsubstituted C2 to C20 acylamino group, a substituted or unsubstituted C2 to C20 alkoxycarbonyl amino group, a substituted or unsubstituted C7 to C20 aryloxycarbonyl amino group, a substituted or unsubstituted C1 to C20 sulfamoyl amino group, a substituted or unsubstituted C1 to C20 sulfonyl group, a substituted or unsubstituted C1 to C20 alkylthiol group, a substituted or unsubstituted C6 to C20 arylthiol group, a substituted or unsubstituted C1 to C20 heterocyclothiol group, a substituted or unsubstituted C1 to C20 ureide group, and a substituted or unsubstituted C3 to C40 silyl group,

[at least one of $R_1$ to $R_8$ represents a bond with $Ar_1$, at least one of $R_9$ to $R_{16}$ represents a bond with $Ar_2$ or the central N atom of Chemical Formula 1, at least one of $R_1$ to $R_8$ is bound to $Ar_1$ through a sigma bond, or at least one of $R_9$ to $R_{16}$ is bound to $Ar_2$ or the central N atom of Chemical Formula 1 through a sigma bond,]

[X is selected from $NR_{17}$, O, S, and $SO_2$ (O=S=O), wherein $R_{17}$ is a substituted or unsubstituted C1 to C20 alkyl group, a substituted or unsubstituted C6 to C30 aryl group, or a substituted or unsubstituted C2 to C30 heteroaryl group,]

Y is selected from O[,] *and* S, [and $SO_2$ (O=S=O),]

$Ar_1$ and $Ar_2$ are each independently a substituted or unsubstituted C6 to C30 aryl group or a substituted or unsubstituted C2 to C30 heteroaryl group, n is an integer ranging from 1 to 4, m is an integer ranging from 0 to 4, and $Ar_3$ is [a substituted or unsubstituted C6 to C30 aryl group or a substituted or unsubstituted C2 to C30 heteroaryl group, provided that $Ar_3$ is not a substituted or unsubstituted carbazolyl group, a substituted or unsubstituted dibenzofuranyl group, or a substituted or unsubstituted dibenzothiophenyl group, and when X is $NR_{17}$, $Ar_3$ is not a fluorenyl group] *selected from the group of a substituted or unsubstituted phenyl group, a substituted or unsubstituted naphthyl group, a substituted or unsubstituted anthracenyl group, a substituted or unsubstituted phenanthryl group, a substituted or unsubstituted naphthacenyl group, a substituted or unsubstituted pyrenyl group, a substituted or unsubstituted biphenylyl group, a substituted or unsubstituted p-terphenyl group, a substituted or unsubstituted m-terphenyl group, a substituted or unsubstituted chrysenyl group, a substituted or unsubstituted triperylenyl group, a substituted or unsubstituted perylenyl group, a substituted or unsubstituted indenyl group, a substituted or unsubstituted pyridyl group, and a substituted or unsubstituted pyrimidinyl group, and*

*the term "substituted" refers to one substituted with deuterium, a halogen, a hydroxy group, a substituted or unsubstituted C3 to C40 silyl group, a C1 to C30 alkyl group, a C1 to C10 alkylsilyl group, a C3 to C30 cyclo alkyl group, a C6 to C30 aryl group, a C1 to C20 alkoxy group, a C1 to C10 trifluoro alkyl group, or a cyano group, instead of hydrogen.*

12. The compound as claimed in claim 1, wherein the compound [being] *is* represented by one of the following Chemical Formulae A-324 to A-*326 A-331, A-334, A-335, A-340, A-343, A-344, A-349, A-351 to A-353, A-358, A-360 to A-362, A-367, A-372, A-374, A-375, A-377, A-381 to A-384, A-386, A-390 to A-393, and* A-395:
[A-324]
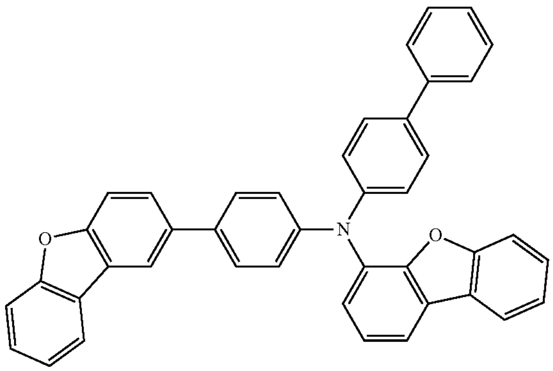
[A-325]
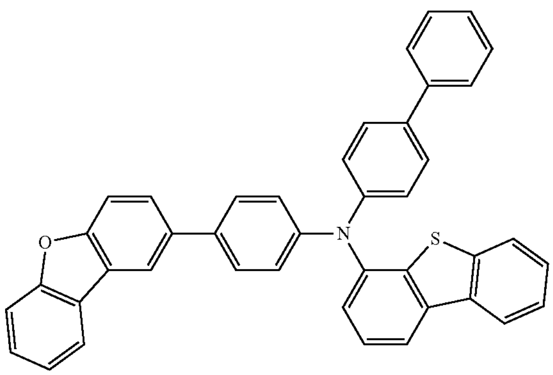
[A-326]
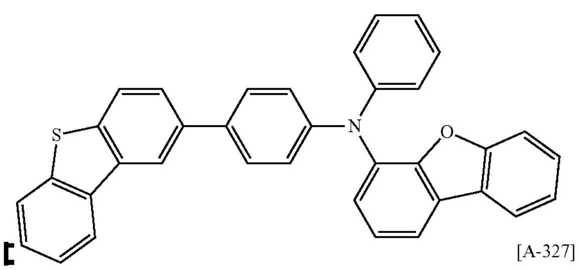
[
[A-327]
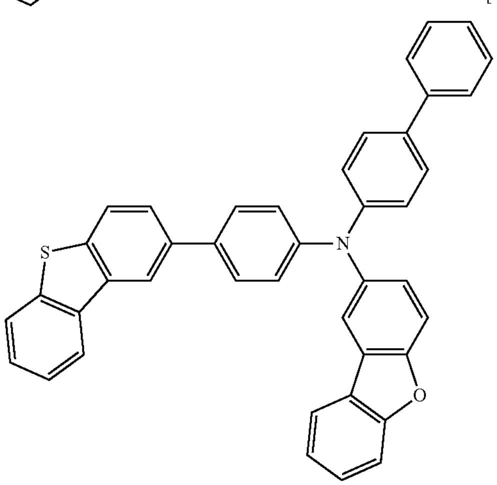
-continued
[A-328]
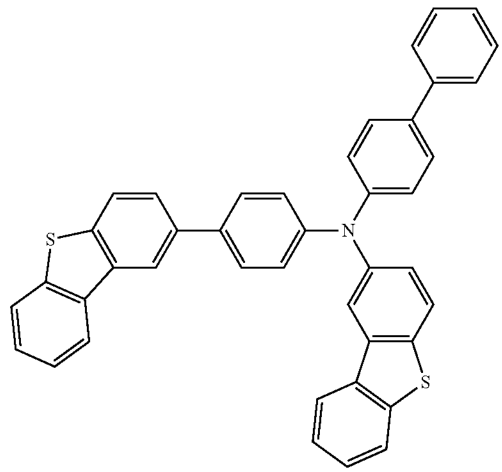
[A-329]
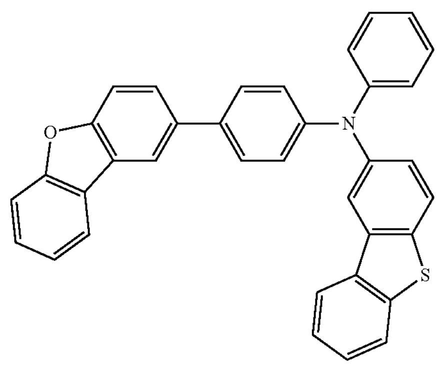
[A-330]
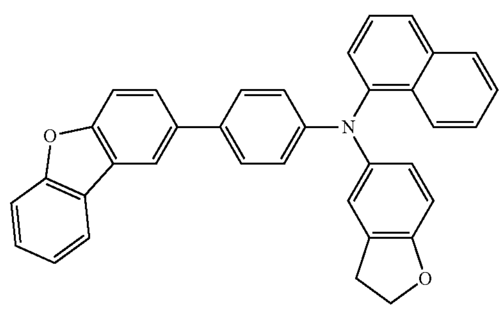
]
[A-331]
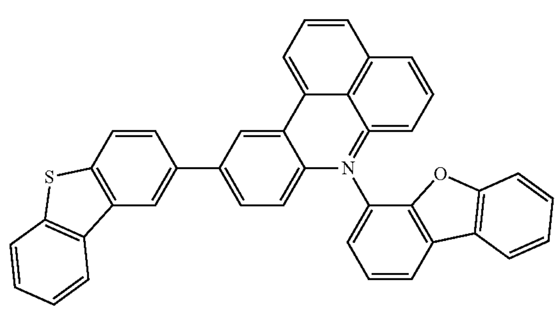

[A-332]
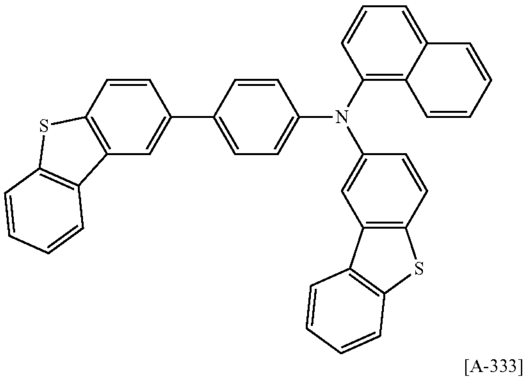
[A-333]
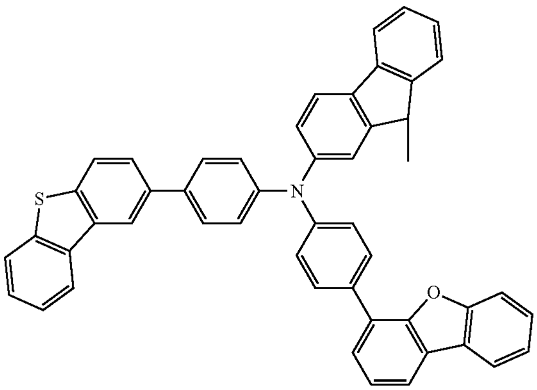
[A-334]
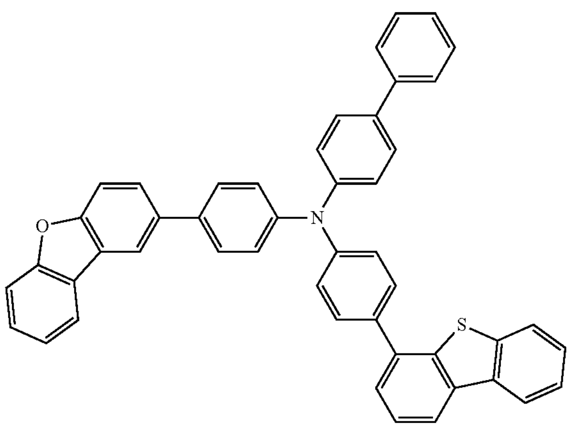
[A-335]
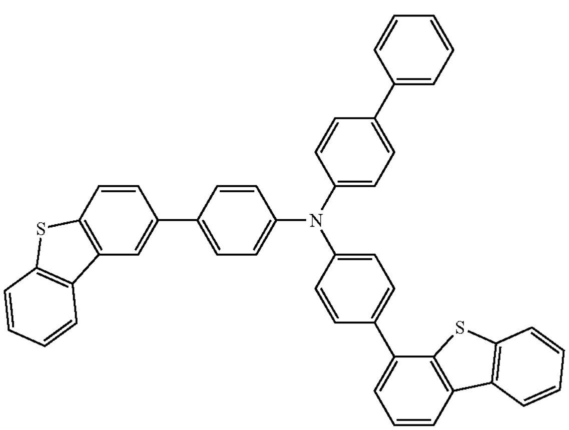
[A-336]
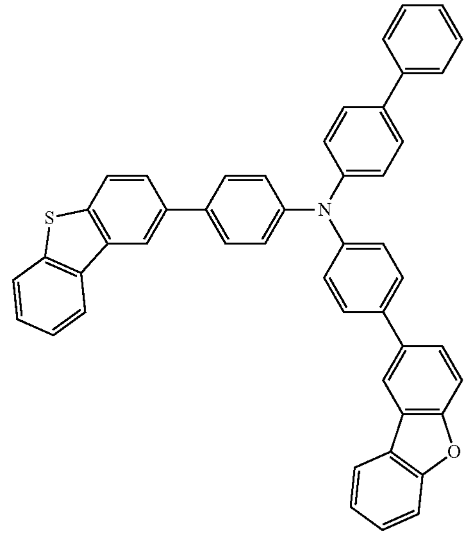
[A-337]
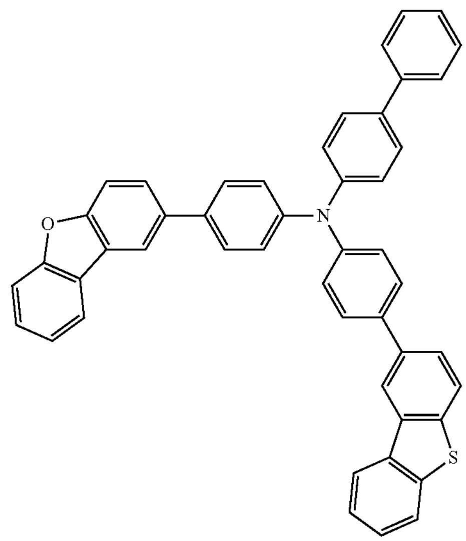
[A-338]
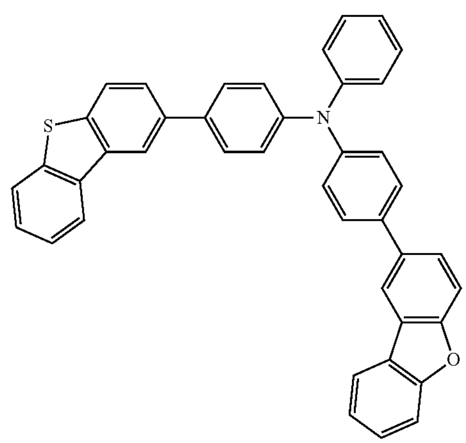

-continued
[A-339]
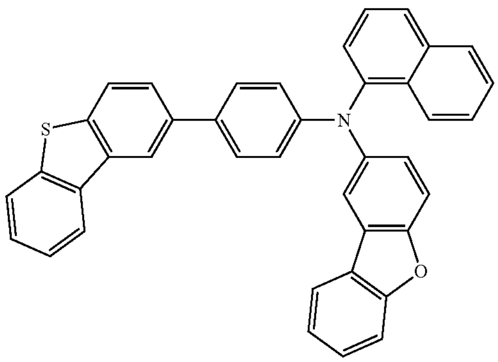
]
[A-340]
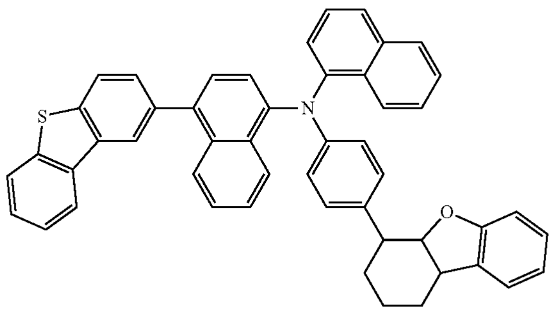
[
[A-341]
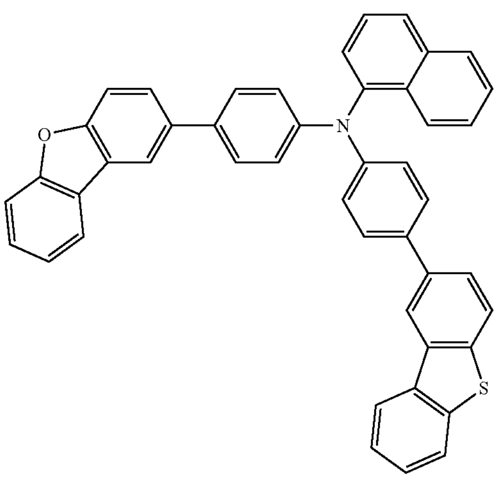
[A-342]
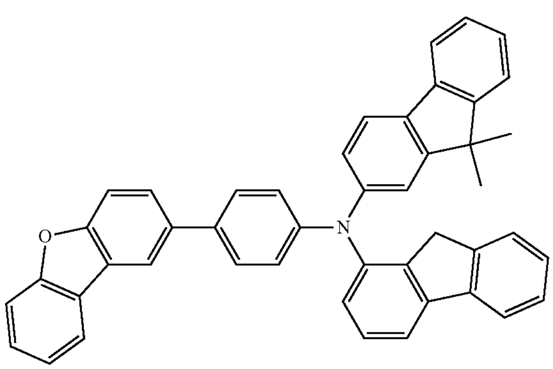
]
-continued
[A-343]
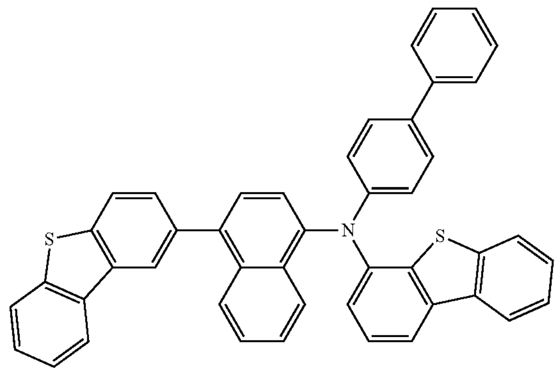
[A-344]
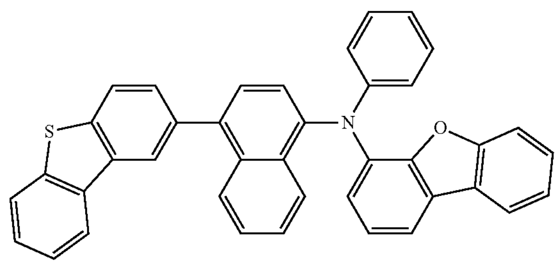
[
[A-345]
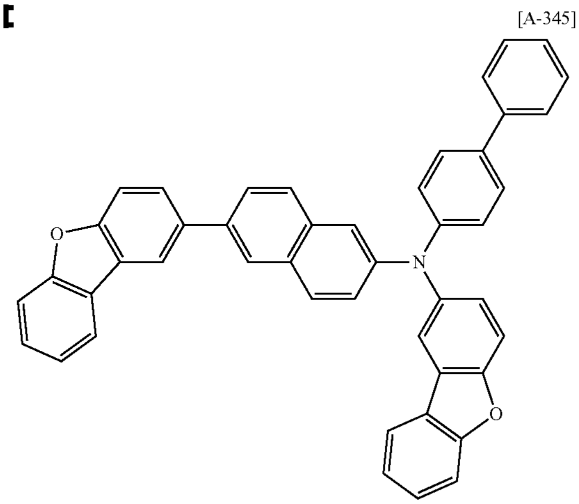
[A-346]
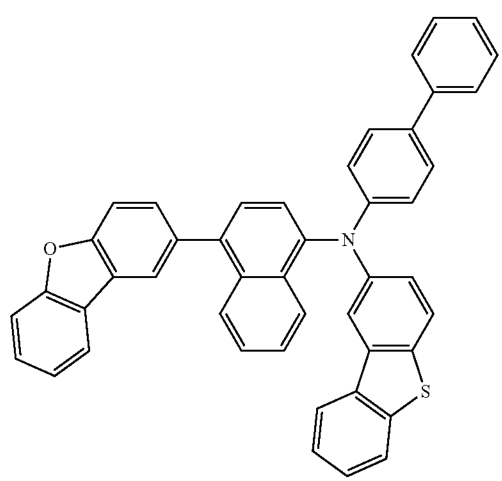

[A-347]
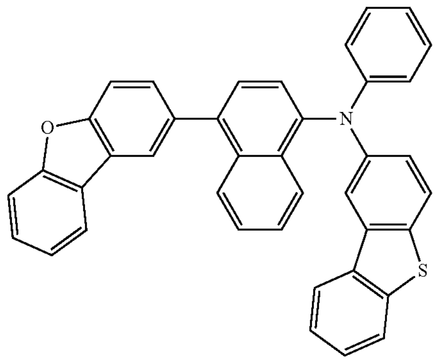
[A-348]
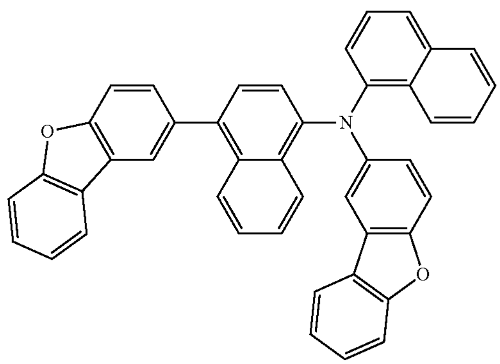
[A-349]
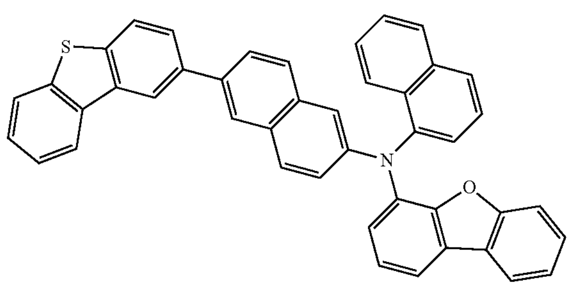
[A-350]
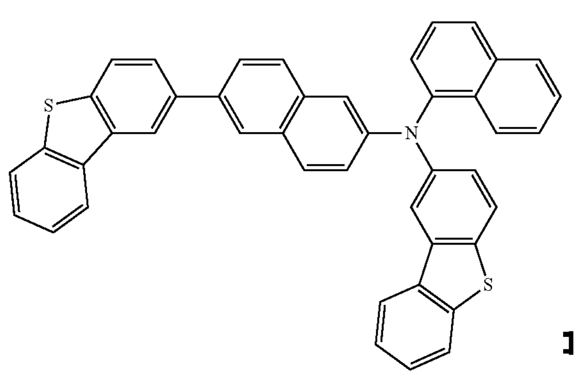
[A-351]
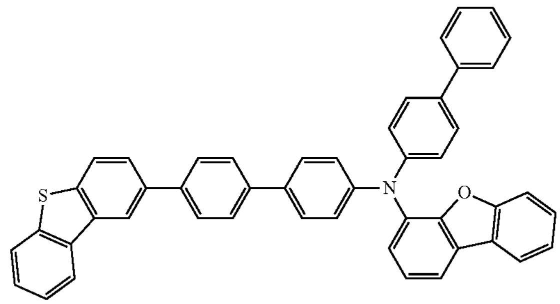
[A-352]
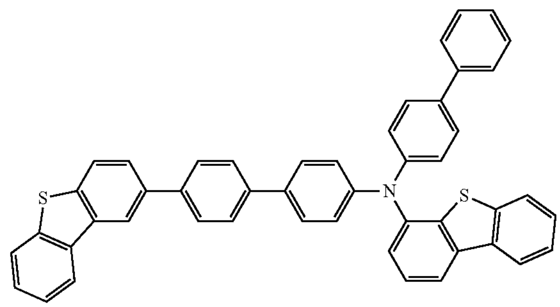
[A-353]
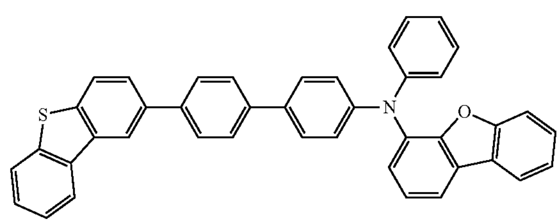
[A-354]
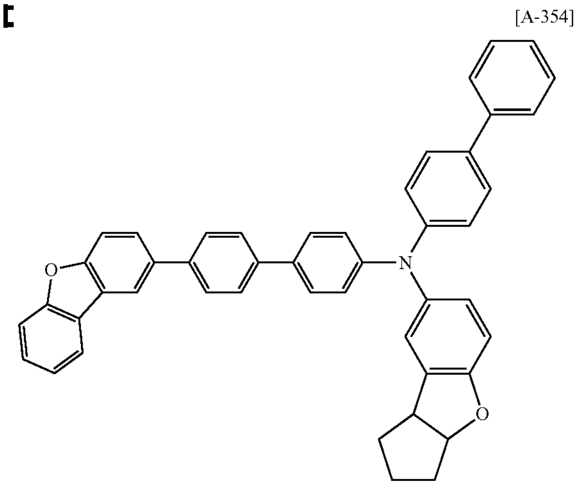

-continued
[A-355]
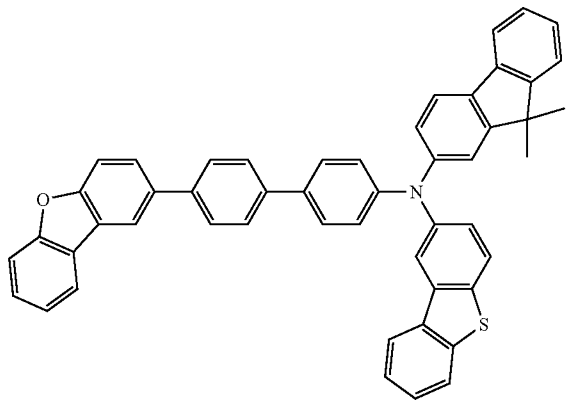
[A-356]
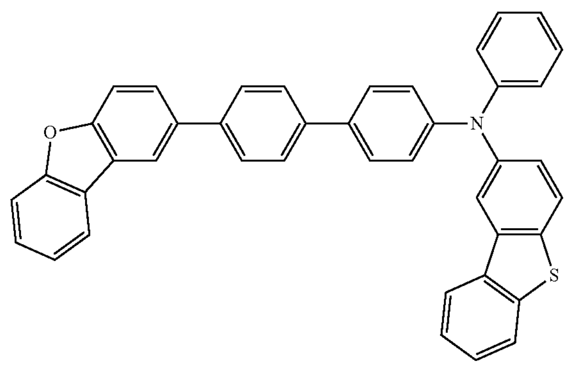
[A-357]
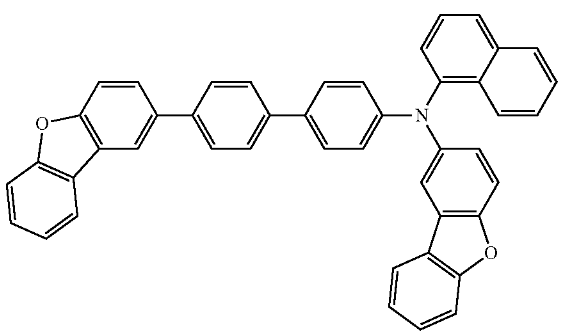
[A-358]
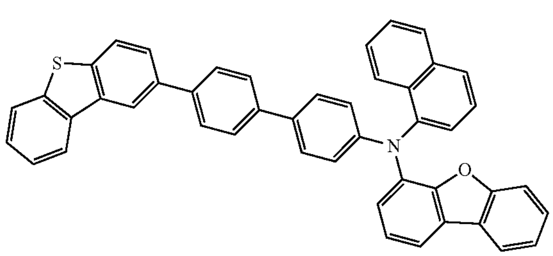
-continued
[A-359]
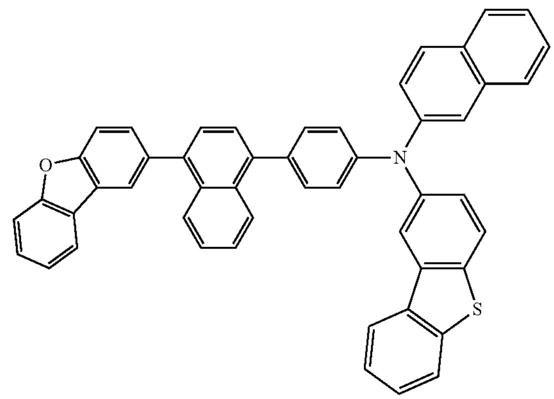
[A-360]
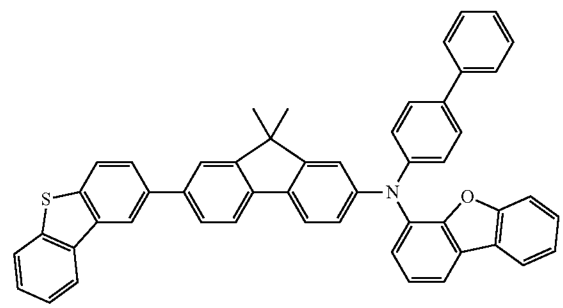
[A-361]
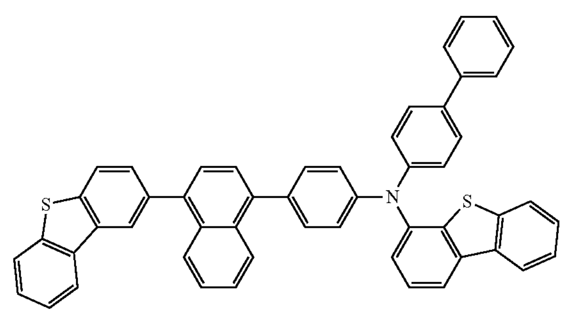
[A-362]
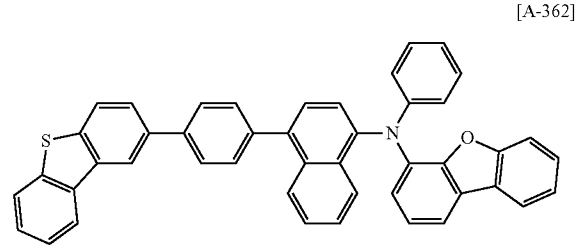

-continued
[A-363]
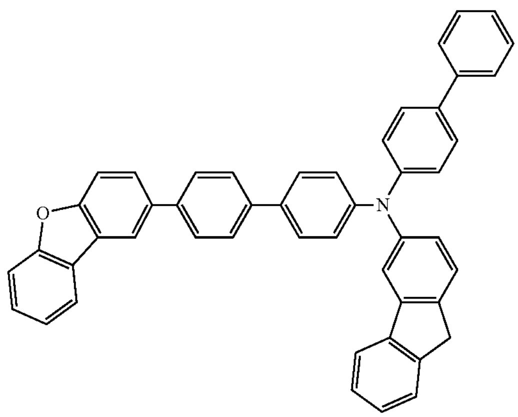
[A-364]
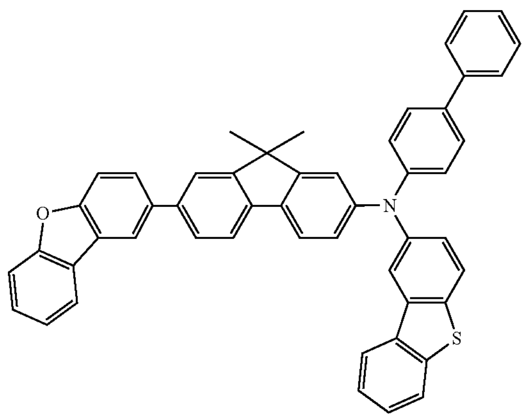
[A-365]
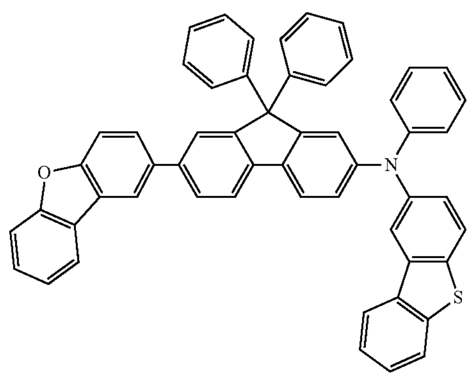
[A-366]
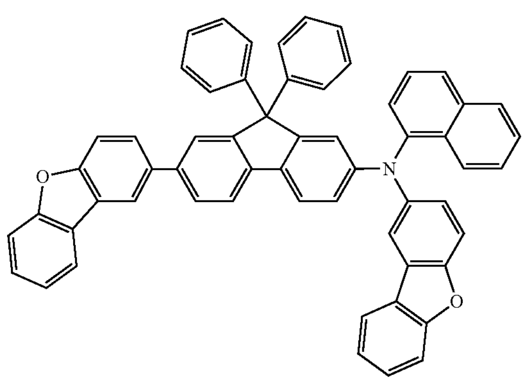
-continued
[A-367]
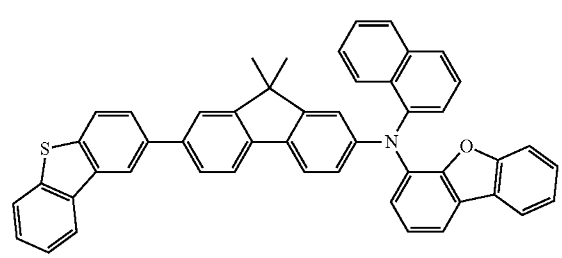
[A-368]
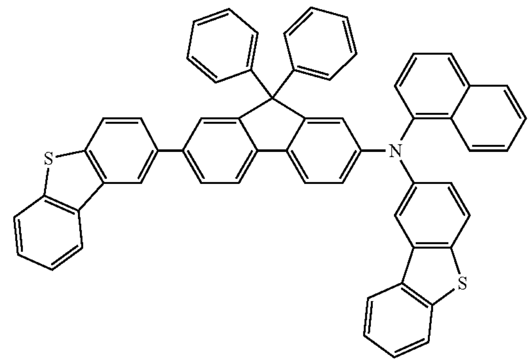
[A-369]
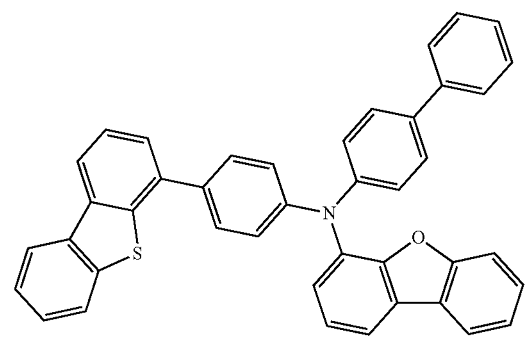
[A-370]
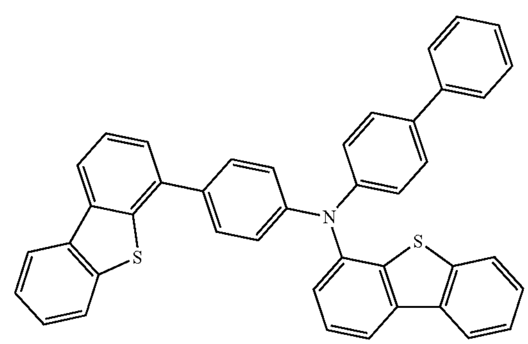
[A-371]
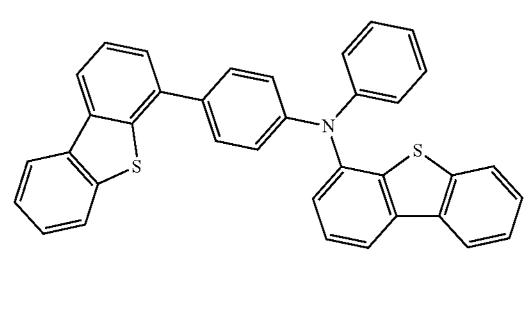

-continued
[A-372]
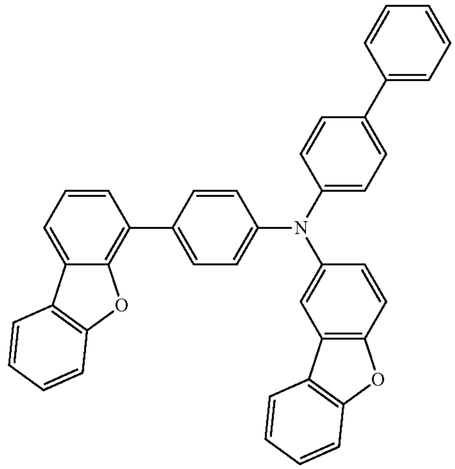
[A-373]
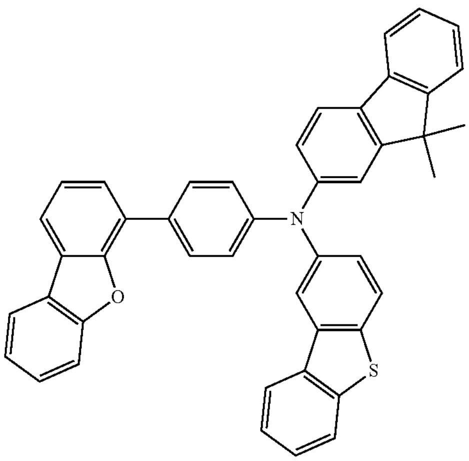
[A-374]
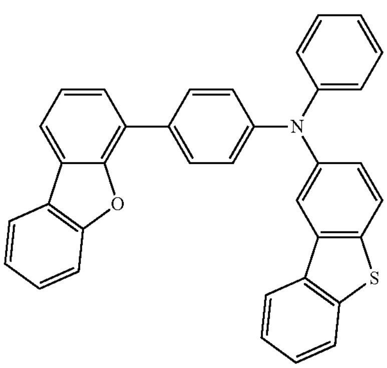
[A-375]
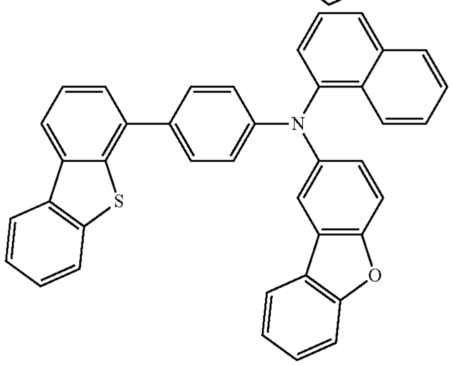
-continued
[A-376]
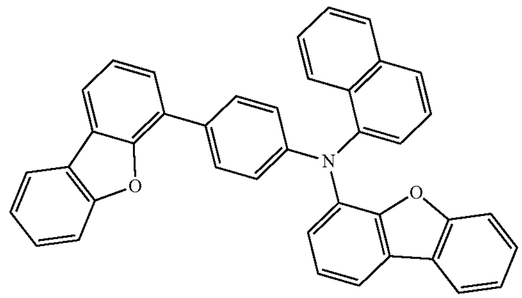
[A-377]
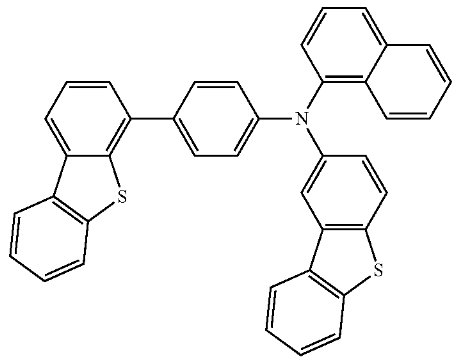
[A-378]
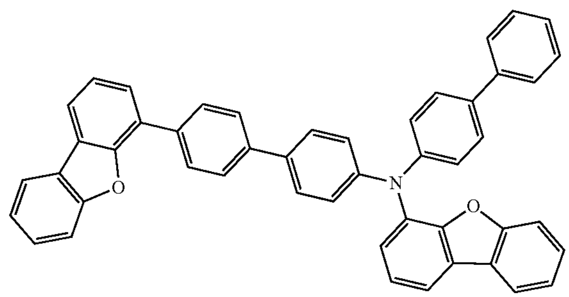
[A-379]
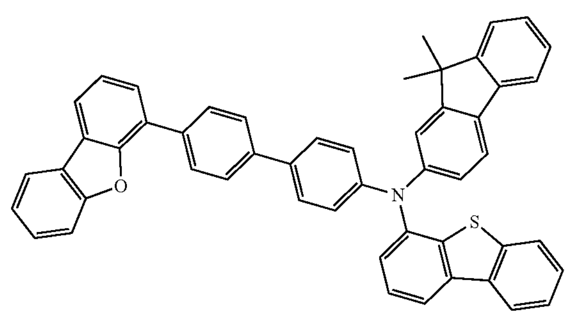
[A-380]
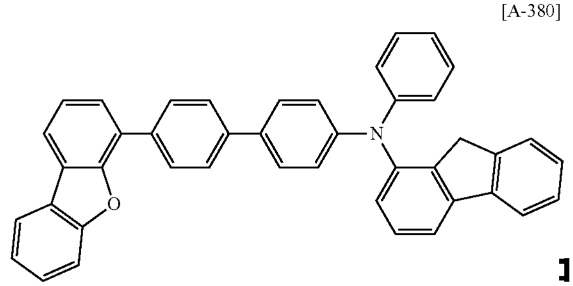

-continued
[A-381]
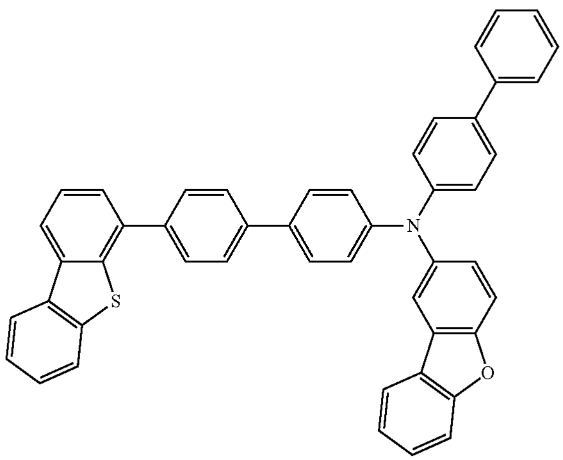
[A-382]
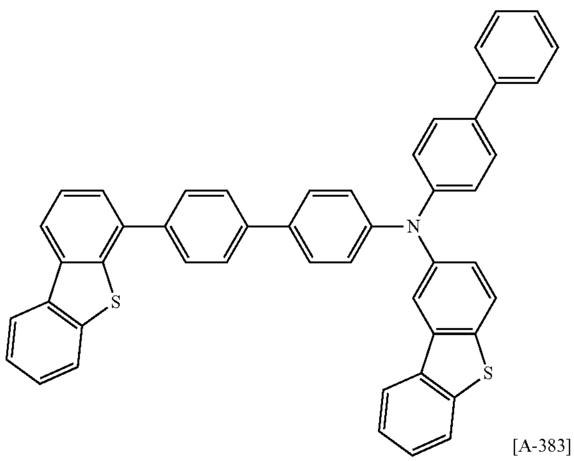
[A-383]
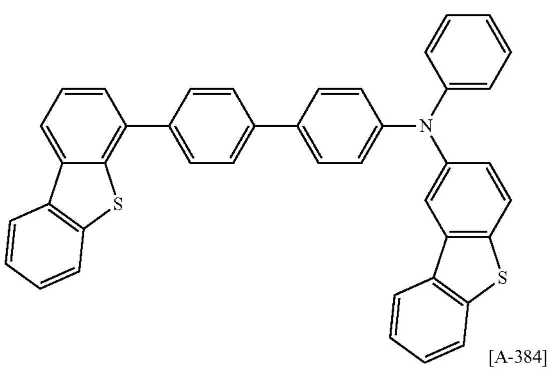
[A-384]
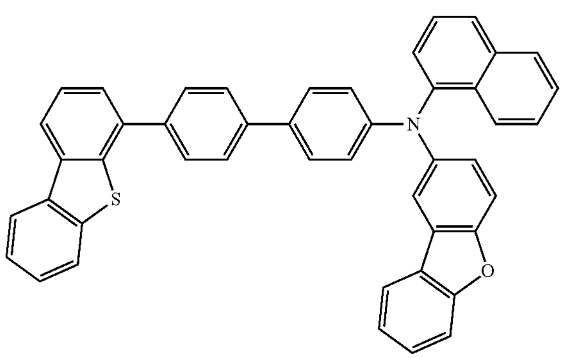
-continued
[A-385]
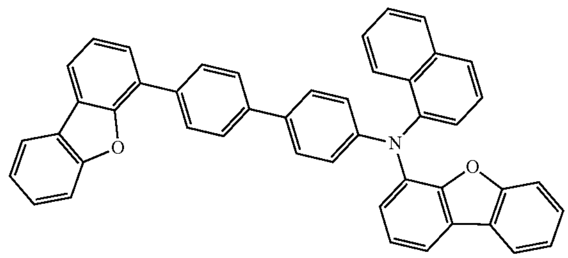
[A-386]
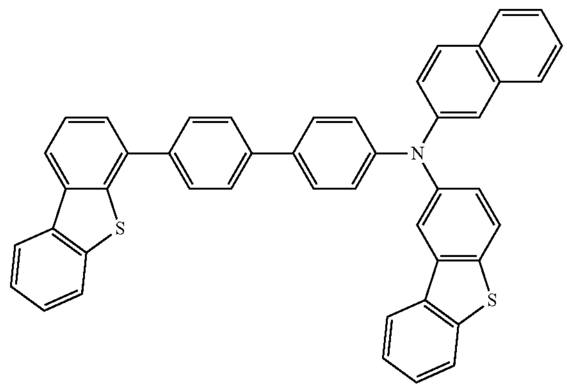
[A-387]
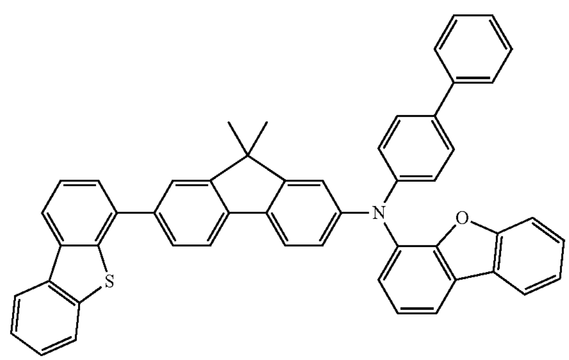
[A-388]
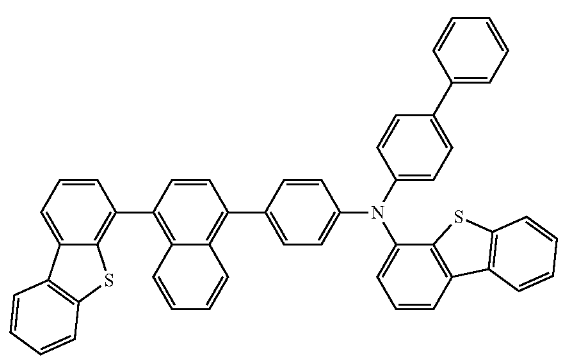

-continued
[A-389]
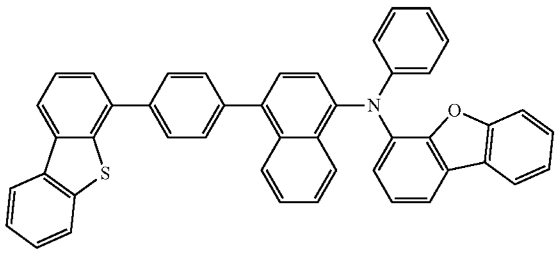
]
[A-390]
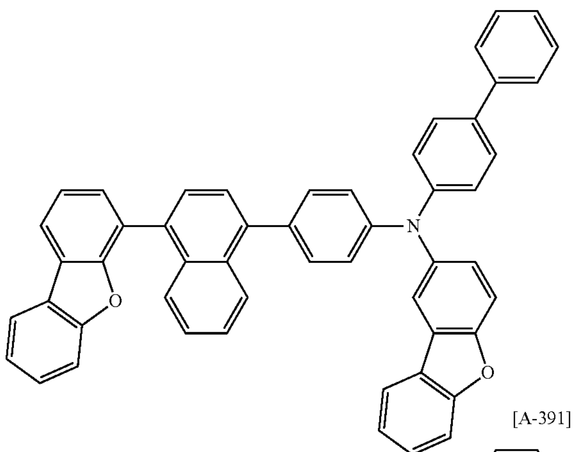
[A-391]
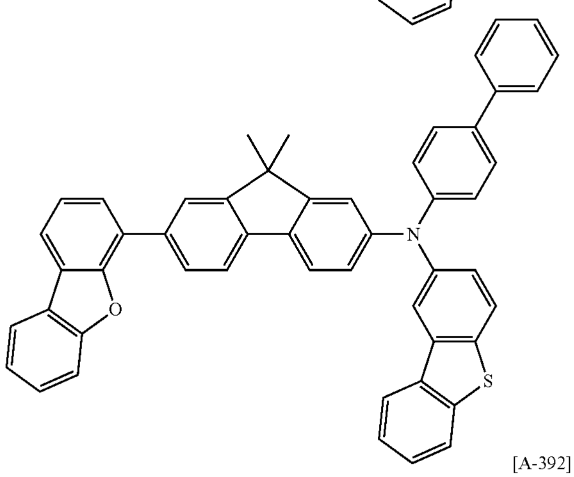
[A-392]
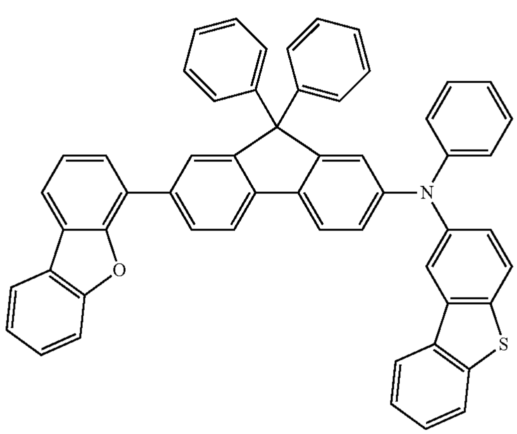
-continued
[A-393]
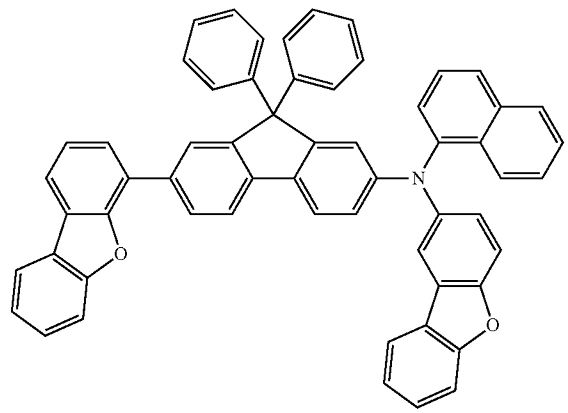
[
[A-394]
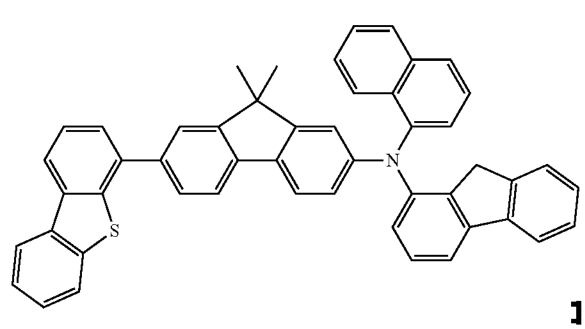
]
[A-395]
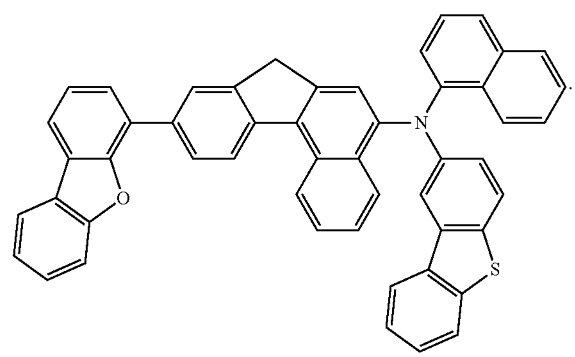
13. [The] *A* compound [as claimed in claim 1, wherein] *for an optoelectronic device,* the compound being represented by one of the following Chemical Formulae A-306 to [A-323:] *A-314, A-316 to A-318, and A-320:*
[A-306]
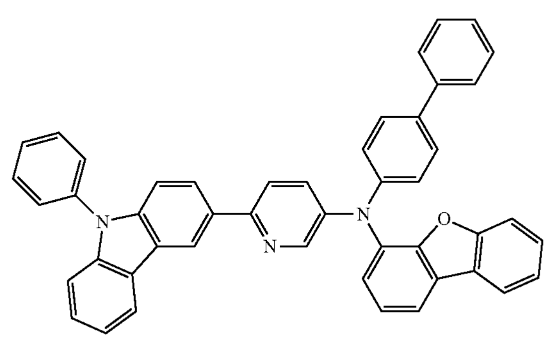

-continued
[A-307]
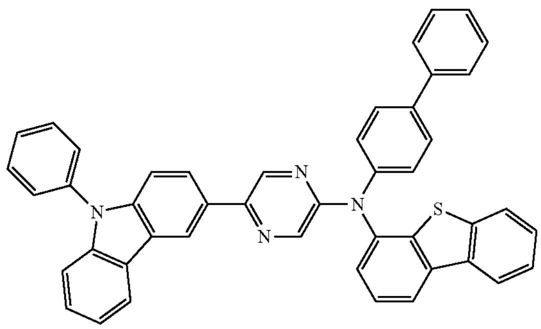
[A-308]
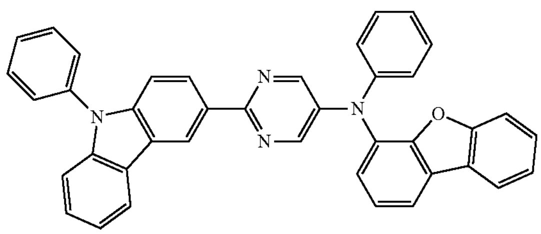
[A-309]
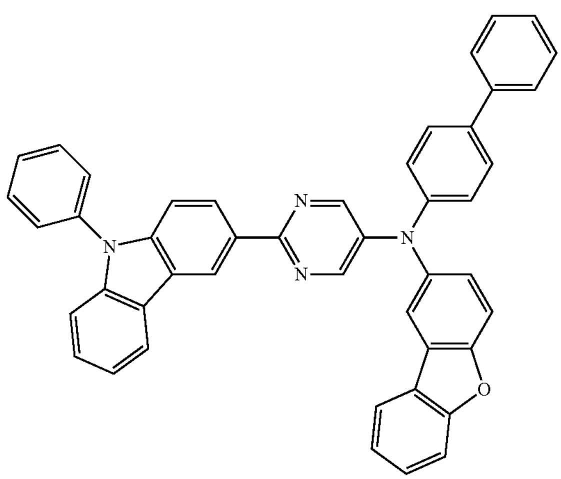
[A-310]
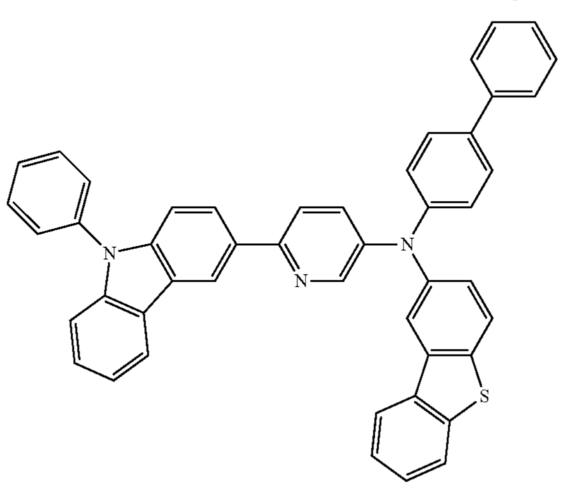
-continued
[A-311]
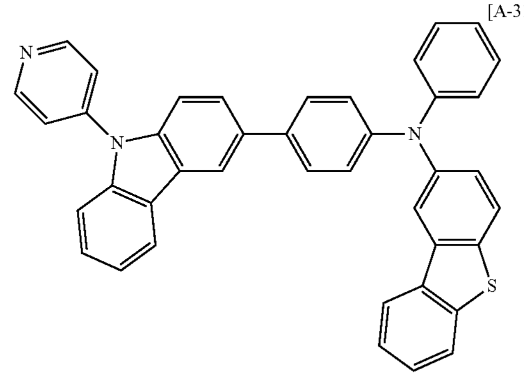
[A-312]
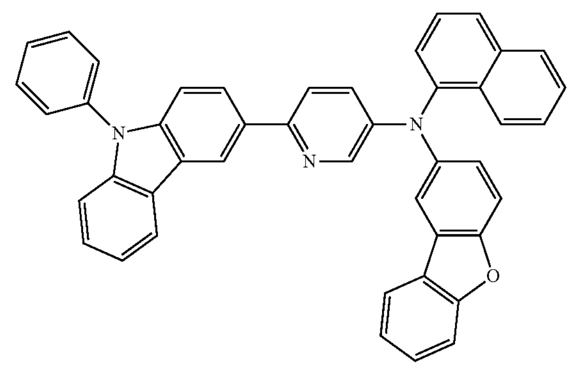
[A-313]
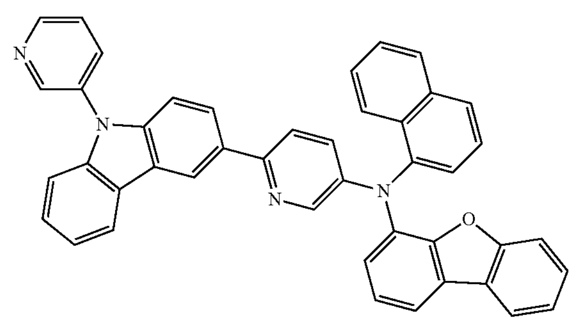
[A-314]
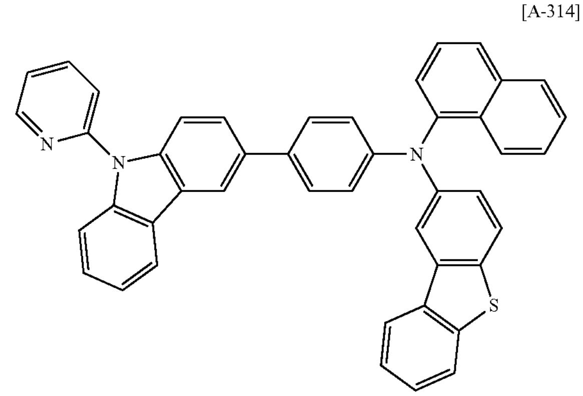

-continued
[A-315]
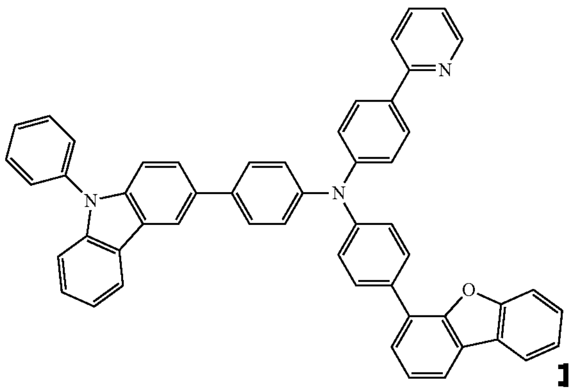
[A-316]
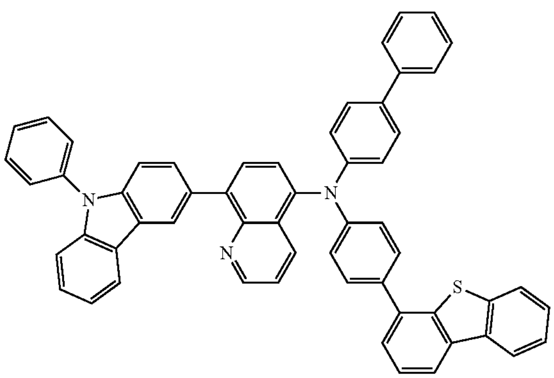
[A-317]
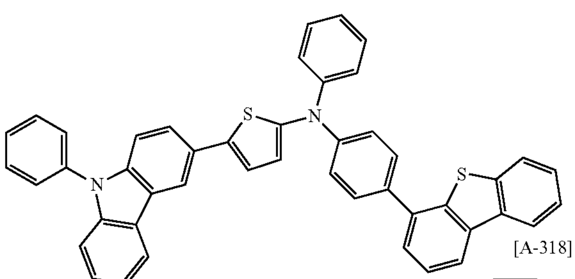
[A-318]
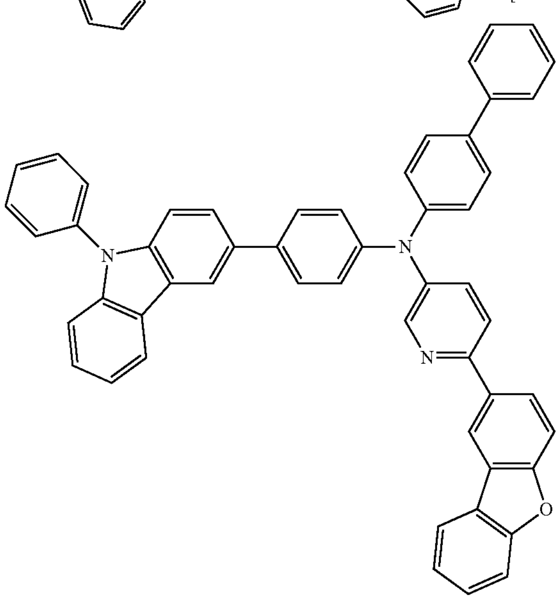
-continued
[A-319]
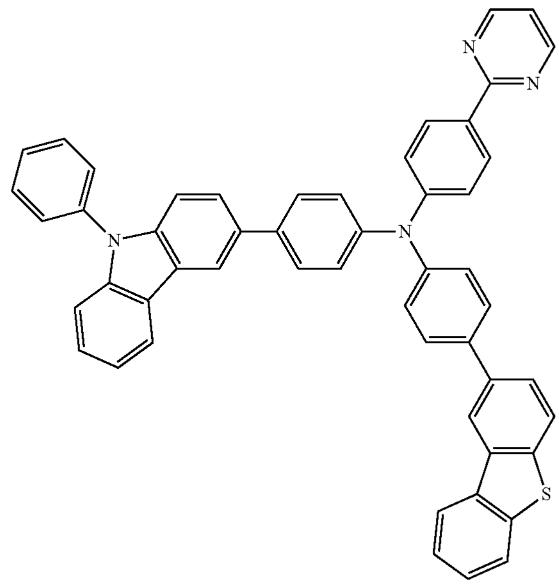
[A-320]
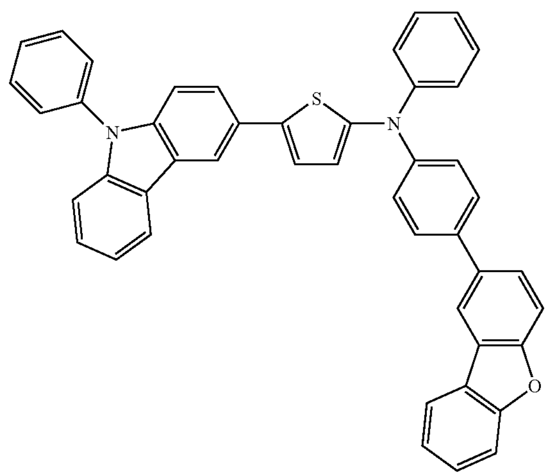
[A-321]
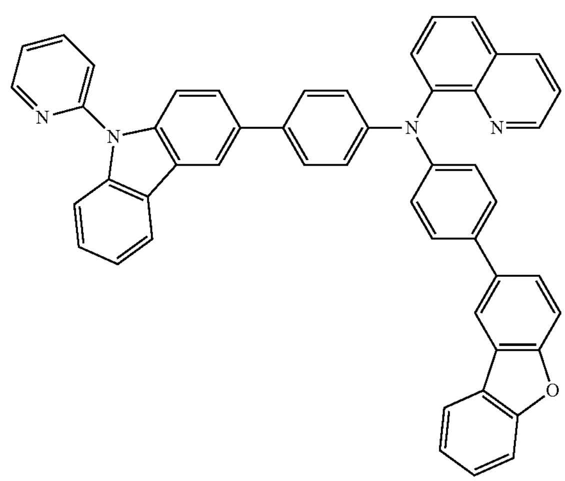

-continued
[A-322]
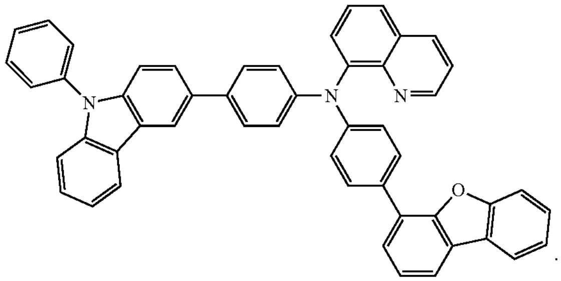
[A-323]
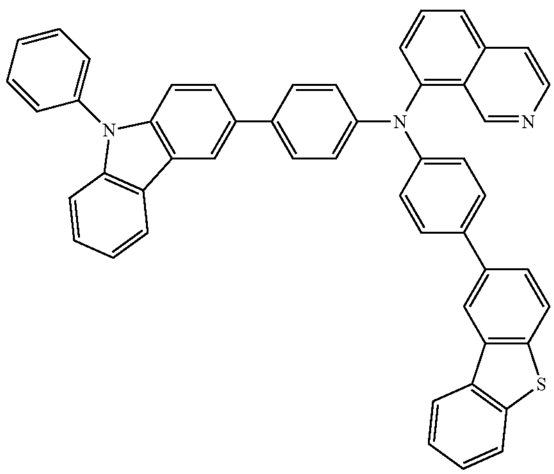
]
14. The compound as claimed in claim 1, wherein the compound [being] *is* represented by one of the following Chemical Formulae A-396 [to A-413:], *A-398, A-408, A-409, A-410:*
[A-396]
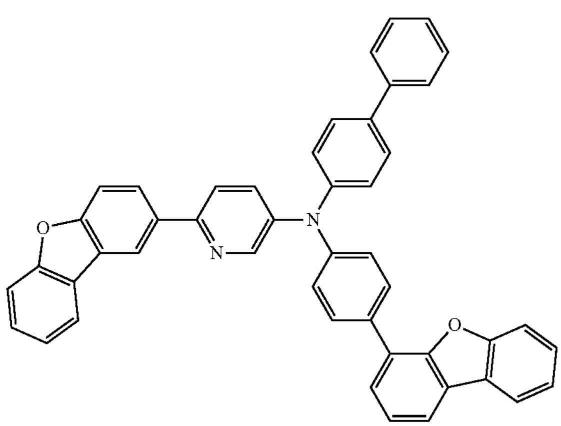
-continued
[
[A-397]
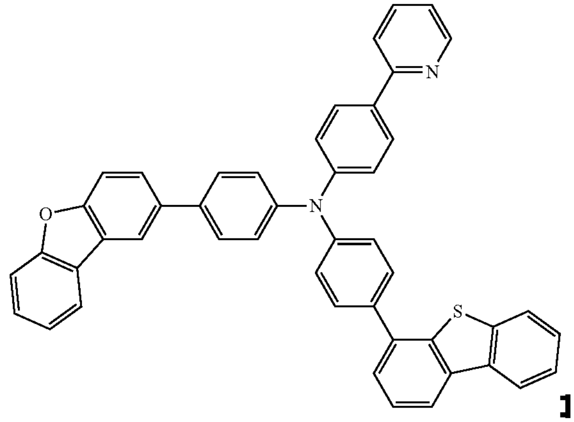
]
[A-398]
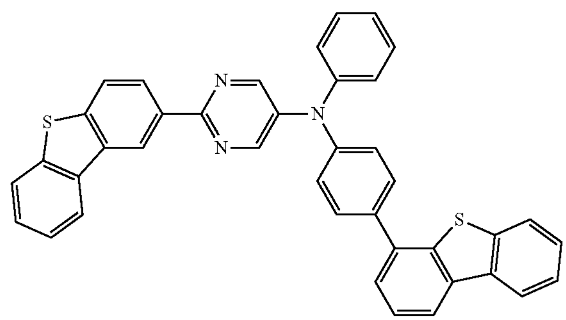
[
{A-399]
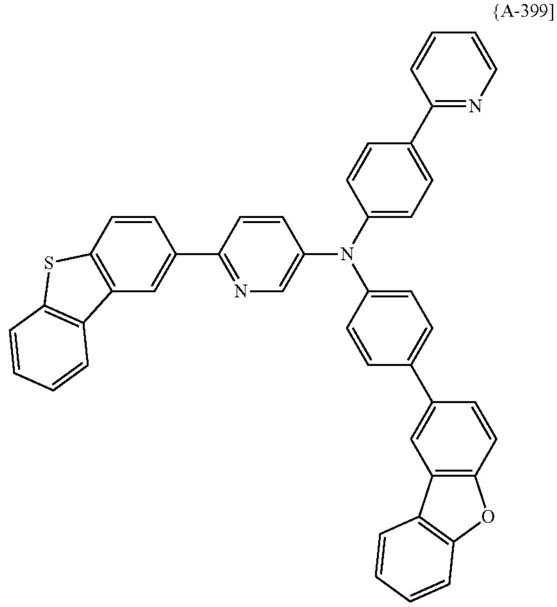

-continued
[A-400]
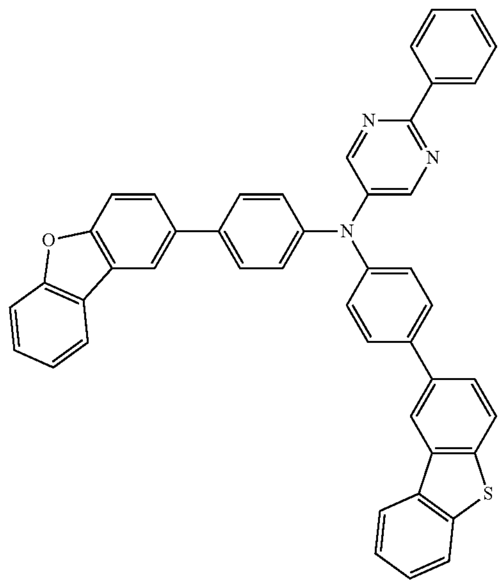
[A-401]
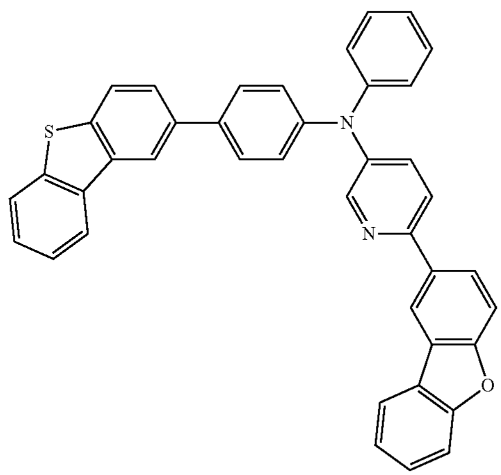
[A-402]
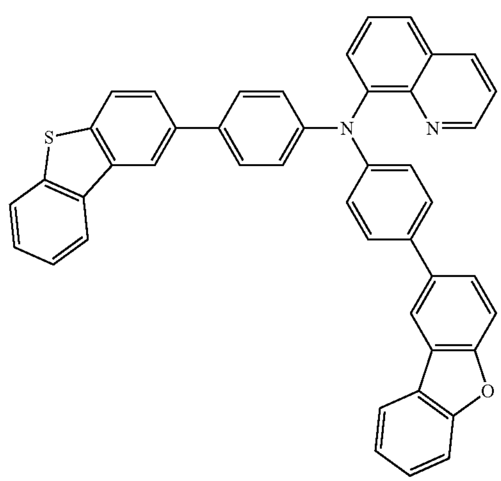
-continued
[A-403]
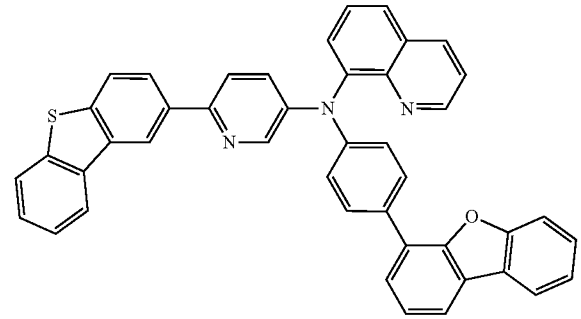
[A-404]
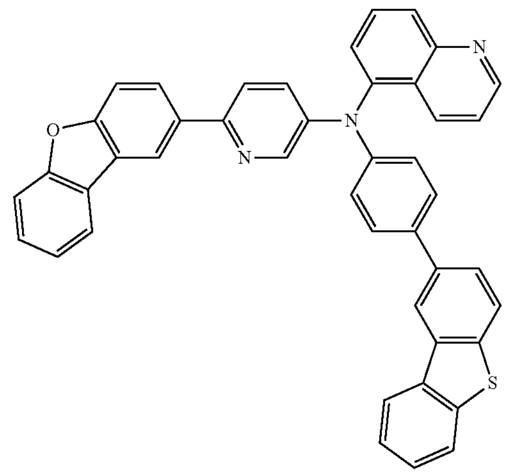
[A-405]
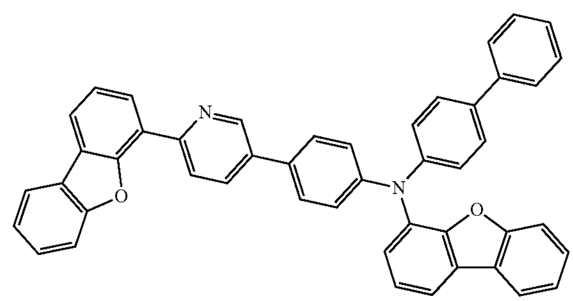
[A-406]
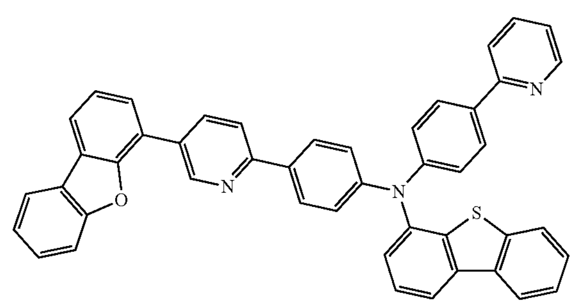

-continued
[A-407]
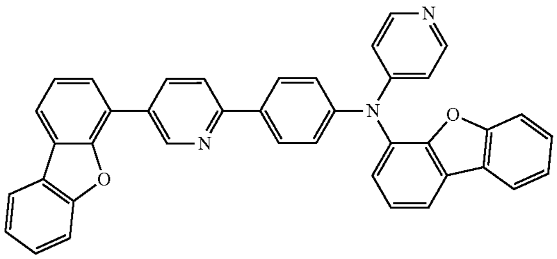
]
[A-408]
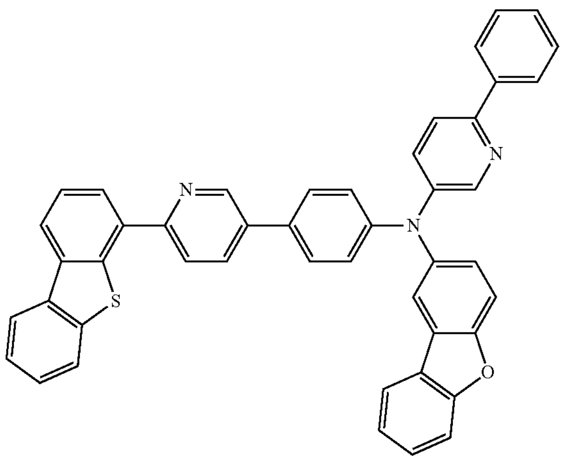
[A-409]
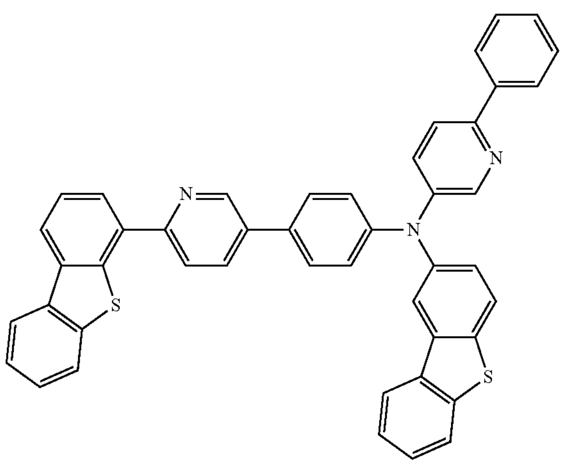
-continued
[A-410]
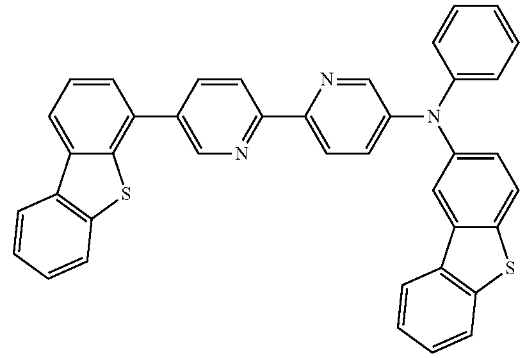
[
[A-411]
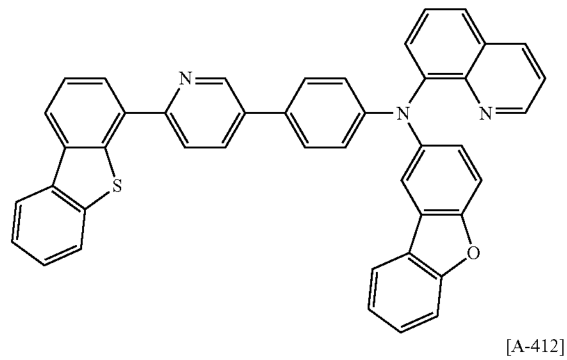
[A-412]
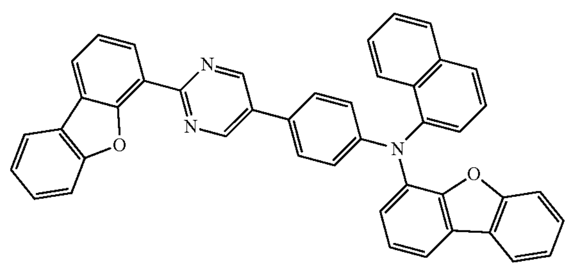
[A-413]
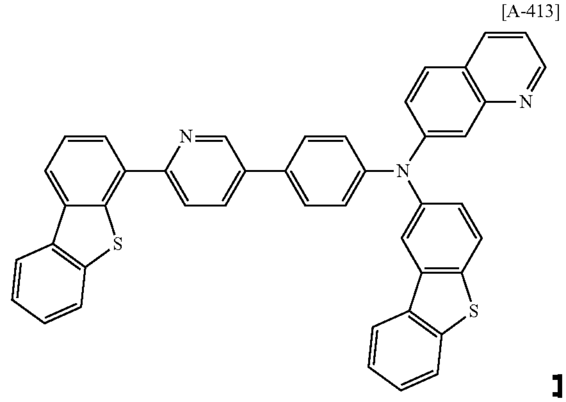
].
* * * * *